US005777942A

United States Patent [19]

Dosaka et al.

[11] Patent Number: 5,777,942

[45] Date of Patent: Jul. 7, 1998

[54] SEMICONDUCTOR MEMORY DEVICE INCLUDING DYNAMIC TYPE MEMORY AND STATIC TYPE MEMORY FORMED ON THE COMMON CHIP AND AN OPERATING METHOD THEREOF

[75] Inventors: Katsumi Dosaka; Toshiyuki Omoto; Masaki Kumanoya, all of Hyogo, Japan

[73] Assignee: Mitsubishi Denki Kabushiki Kaisha, Tokyo, Japan

[21] Appl. No.: 149,680

[22] Filed: Nov. 8, 1993

[30] Foreign Application Priority Data

| | | | |
|---|---|---|---|
| Nov. 6, 1992 | [JP] | Japan | 4-322656 |
| Jun. 4, 1993 | [JP] | Japan | 5-160265 |

[51] Int. Cl.[6] ..... G11C 8/00

[52] U.S. Cl. ..... 365/230.03; 365/230.08; 365/230.01; 365/189.05; 365/49

[58] Field of Search ..... 365/230.03, 189.05, 365/230.08, 230.09, 49

[56] References Cited

U.S. PATENT DOCUMENTS

| | | |
|---|---|---|
| 4,608,666 | 8/1986 | Uchida . |
| 4,894,770 | 1/1990 | Ward et al. . |
| 4,926,385 | 5/1990 | Fujishima et al. . |

FOREIGN PATENT DOCUMENTS

| | | |
|---|---|---|
| 62-38590 | 2/1987 | Japan . |
| 1-146187 | 6/1989 | Japan . |
| 2 235 314 | 7/1990 | United Kingdom . |

OTHER PUBLICATIONS

"Integrated Cached Dram Lets Data Flow at 100 MHz" Dave Bursky, Electronic Design, Feb. 20, 1992, pp. 142, 144, 146.

"A Circuit Design of Intelligent Cache Dram with Automatic Write-Back Capability", by Kazutami Arimoto et al., IEEE Journal of Solid-State Circuits, vol. 26, No. 4, Apr. 1991, pp. 560–565.

"A 60-NS 3.3-V-Only 16-MBIT Dram with Multipurpose Register" by Kazutami Arimoto et al., IEEE Journal of Solid-State Circuits, vol. 24, No. 5, Oct. 1989, pp. 1184–1190.

"Writing to a Port", Intel Corp.: Embedded Controller Handbook 1988, pp. 6-4, 6-5.

"Open-Collector-Bus", Farber, G.: Bussysteme, 2nd edit., Munchen: R. Oldenbourg Verlag, 1987, pp. 36–37.

*Primary Examiner*—David C. Nelms
*Assistant Examiner*—Huan Hoang
*Attorney, Agent, or Firm*—Lowe, Price, LeBlanc & Becker

[57] ABSTRACT

A semiconductor memory device which is applicable not only to a cache system but to the field of graphic processing is provided. The semiconductor memory device includes a DRAM portion, an SRAM portion and a bidirectional data transfer circuit 106 which carries out data transfer between a DRAM array included in the DRAM portion and an SRAM array included in the SRAM portion as well as data input/output with the outside of the device. Driving of the DRAM array and data transfer operation between the DRAM array and the bidirectional data transfer circuit are controlled by a DRAM control circuit. Driving of the SRAM array, data transfer between the SRAM array and the bidirectional data transfer circuit, and the data input/output operation are controlled by the SRAM control circuit. The address to the DRAM array is applied to a DRAM array buffer 108, while an address for selecting a memory cell in the SRAM array is applied to the SRAM address buffer.

25 Claims, 191 Drawing Sheets

F I G. 1
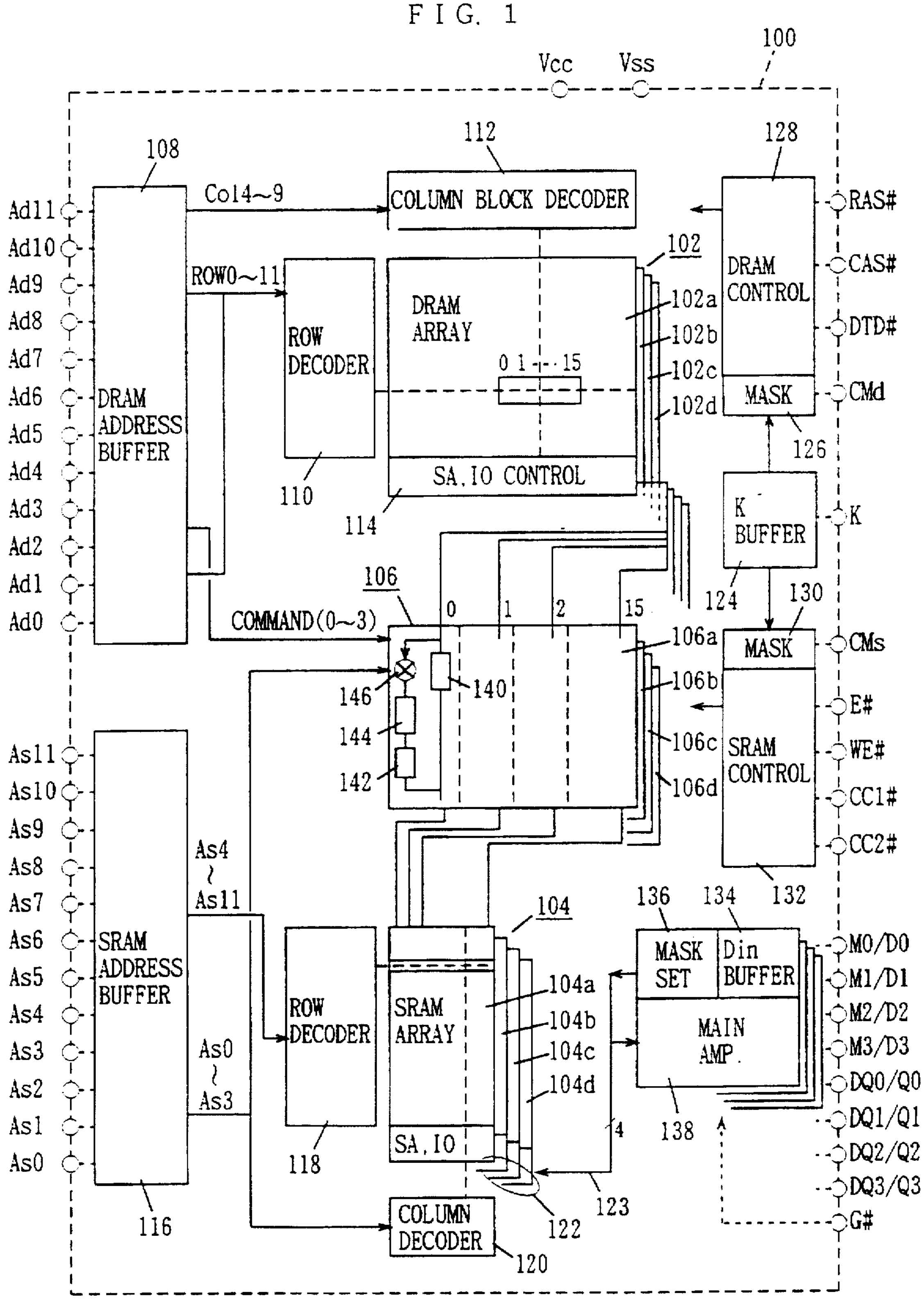

F I G. 2

| NAMES OF CYCLES | CMs | E# | WE# | CC1# | CC2# | As | CMd | RAS# | CAS# | DTD# | Ad |
|---|---|---|---|---|---|---|---|---|---|---|---|
| SRAM POWER DOWN | H | × | × | × | × | × | × | × | × | × | × |
| DESELECT SRAM | L | H | × | × | × | × | × | × | × | × | × |
| SRAM READ | L | L | H | H | H | SRAM ADDRESS | × | × | × | × | × |
| SRAM WRITE | L | L | L | H | H | SRAM ADDRESS | × | × | × | × | × |
| BUFFER READ TRANSFER | L | L | H | H | L | SRAM ROW ADDRESS | × | × | × | × | × |
| BUFFER WRITE TRANSFER | L | L | L | H | L | SRAM ROW ADDRESS | × | × | × | × | × |
| BUFFER READ TRANSFER & READ | L | L | H | L | H | SRAM ADDRESS | × | × | × | × | × |
| BUFFER WRITE TRANSFER & WRITE | L | L | L | L | H | SRAM ADDRESS | × | × | × | × | × |
| BUFFER READ | L | L | H | L | L | BLOCK ADDRESS | × | × | × | × | × |
| BUFFER WRITE | L | L | L | L | L | BLOCK ADDRESS | × | × | × | × | × |

SRAM POWER DOWN

F I G. 4
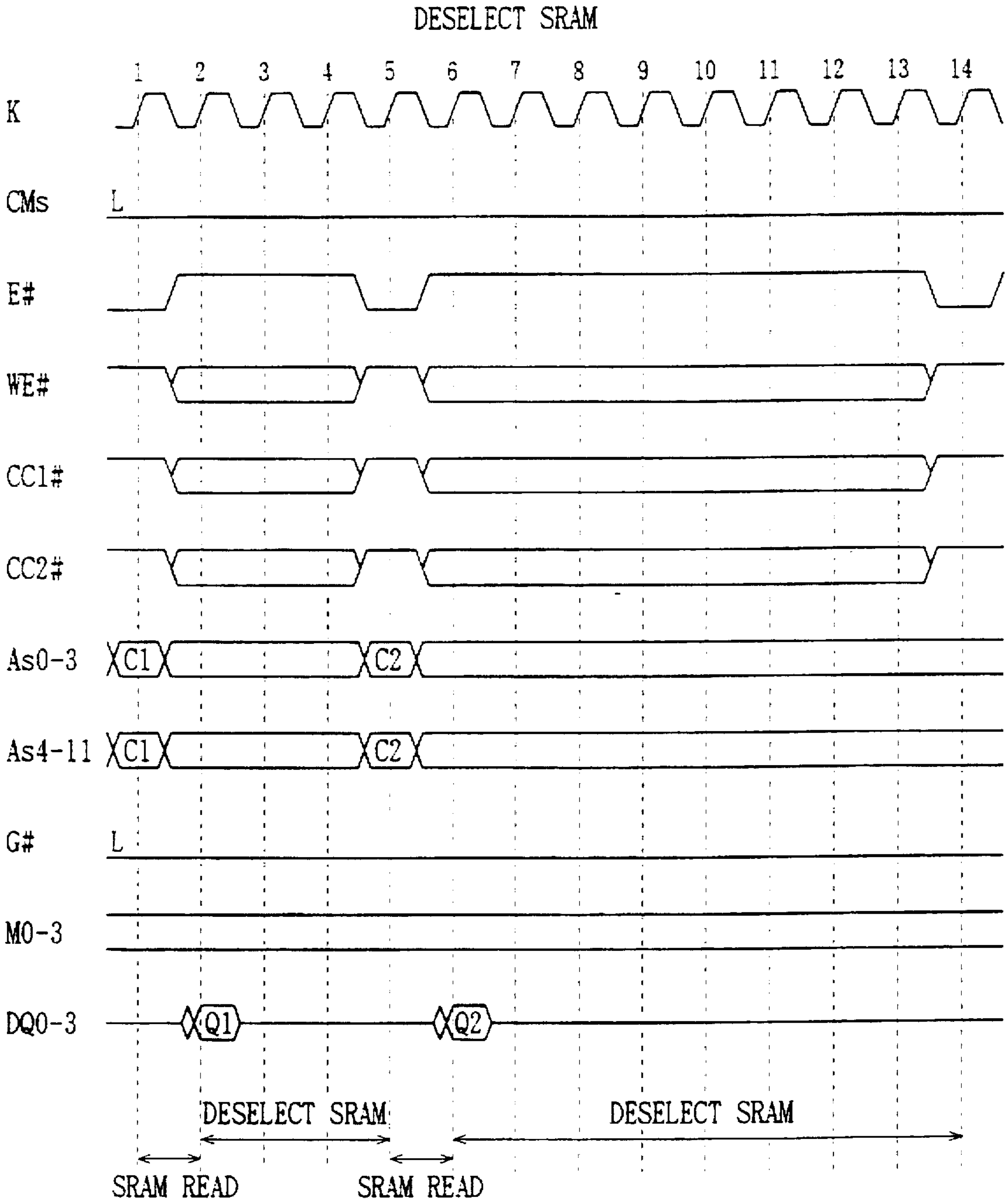

F I G. 5
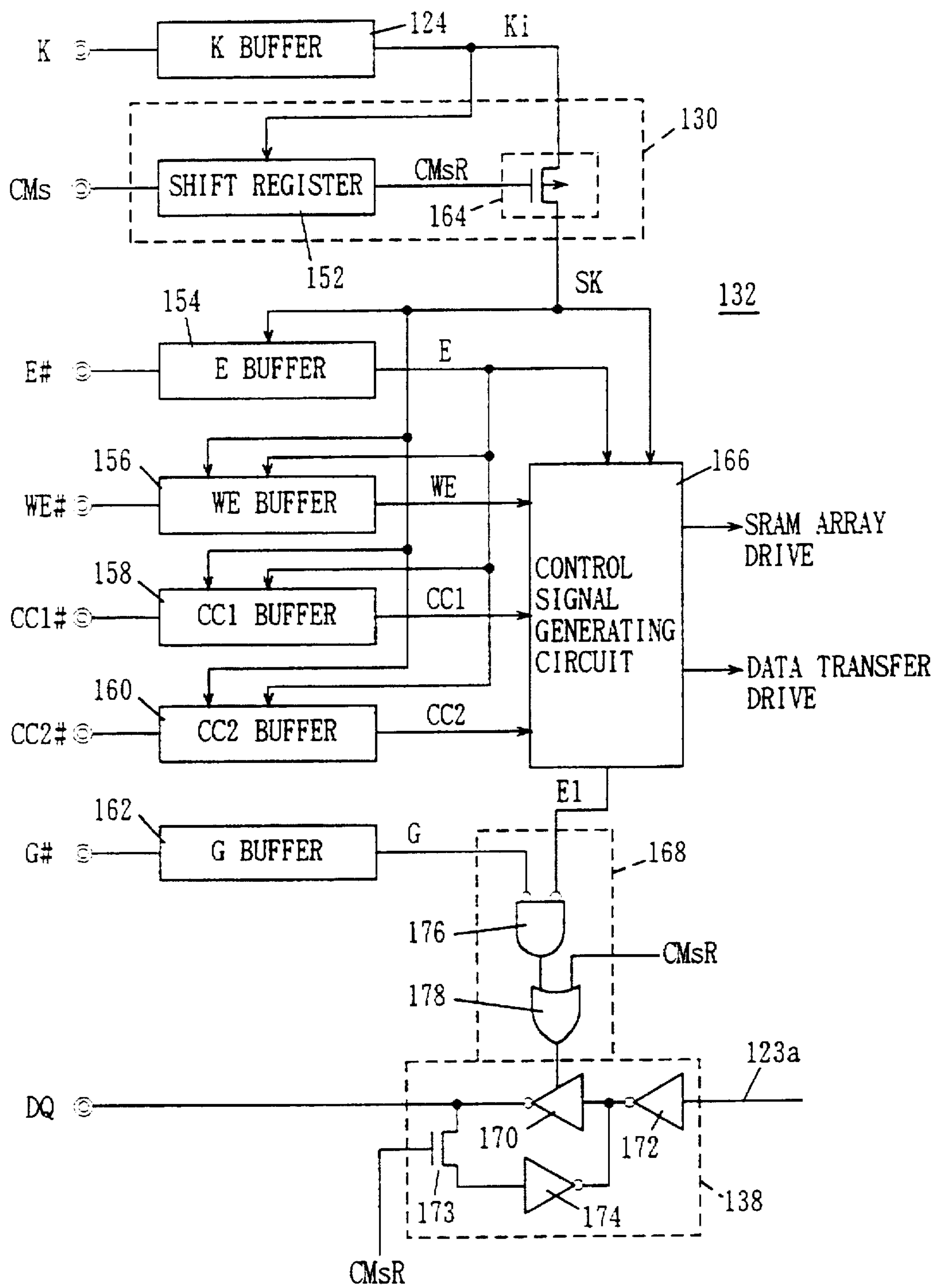

F I G. 6
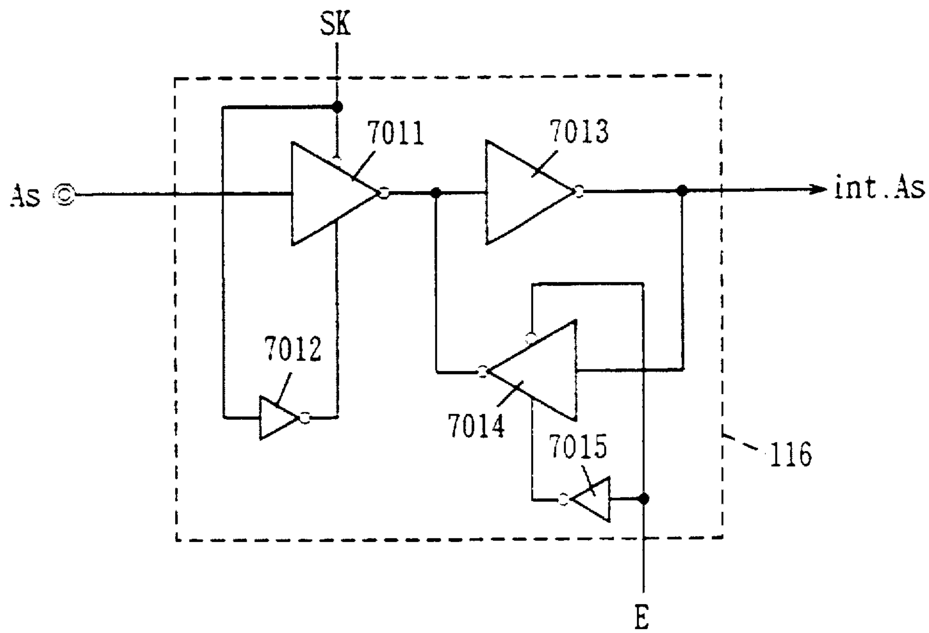
F I G. 7
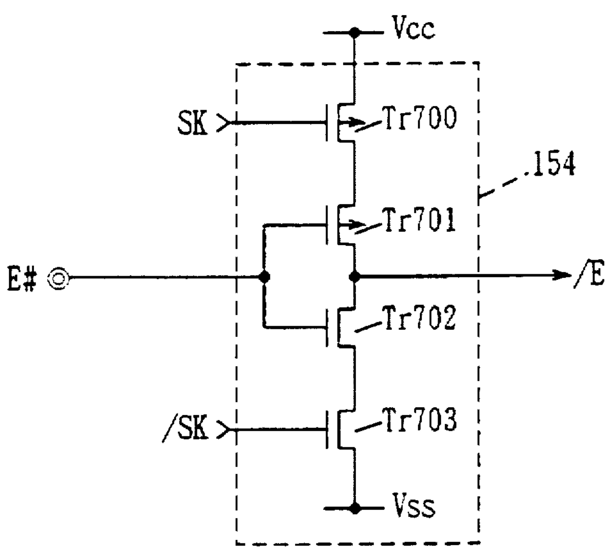

SRAM READ

SRAM WRITE

BUFFER READ TRANSFER (DTBR → SRAM)

F I G. 1 3
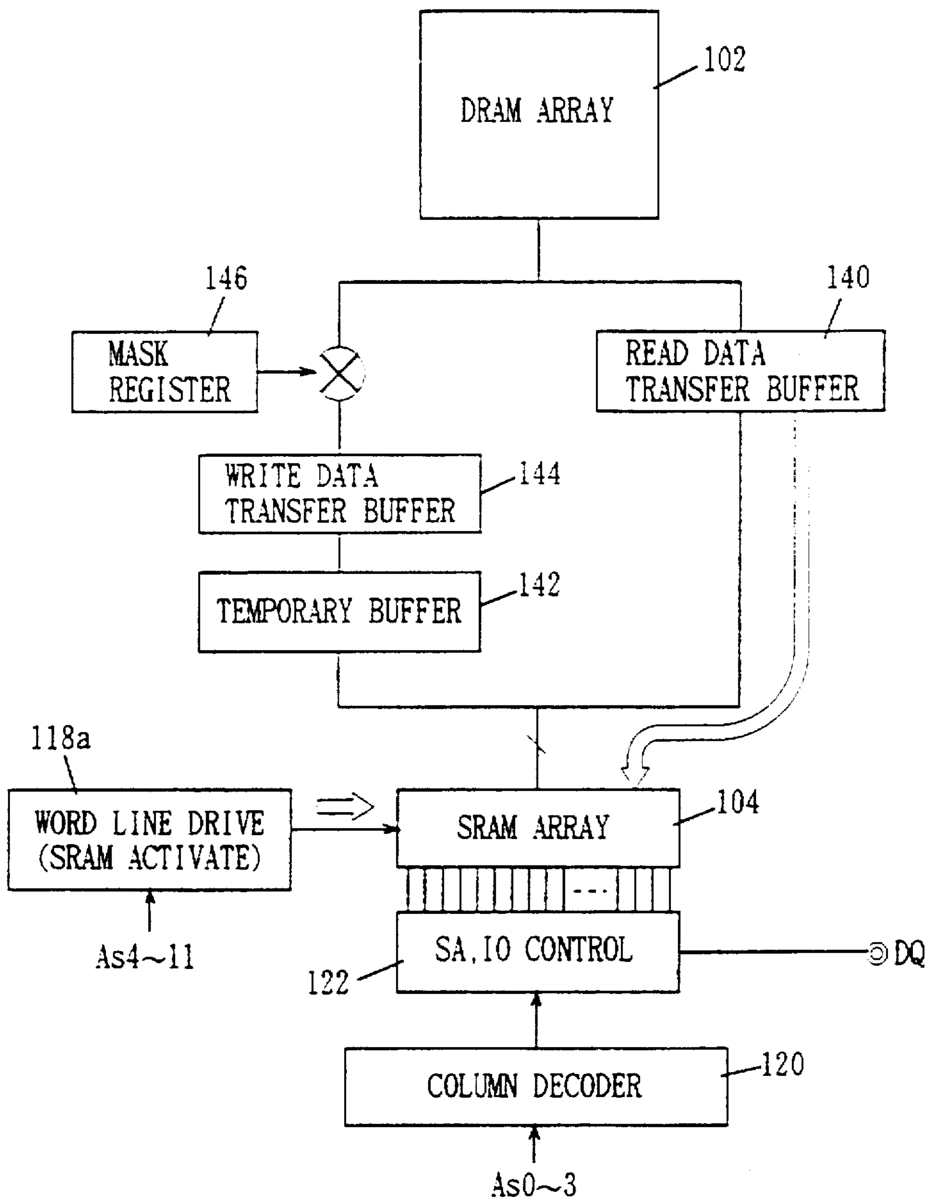

BUFFER WRITE TRANSFER (SRAM → DTBW)

BUFFER READ TRANSFER & SRAM READ (DTBR → SRAM → OUTPUT)

F I G. 1 7
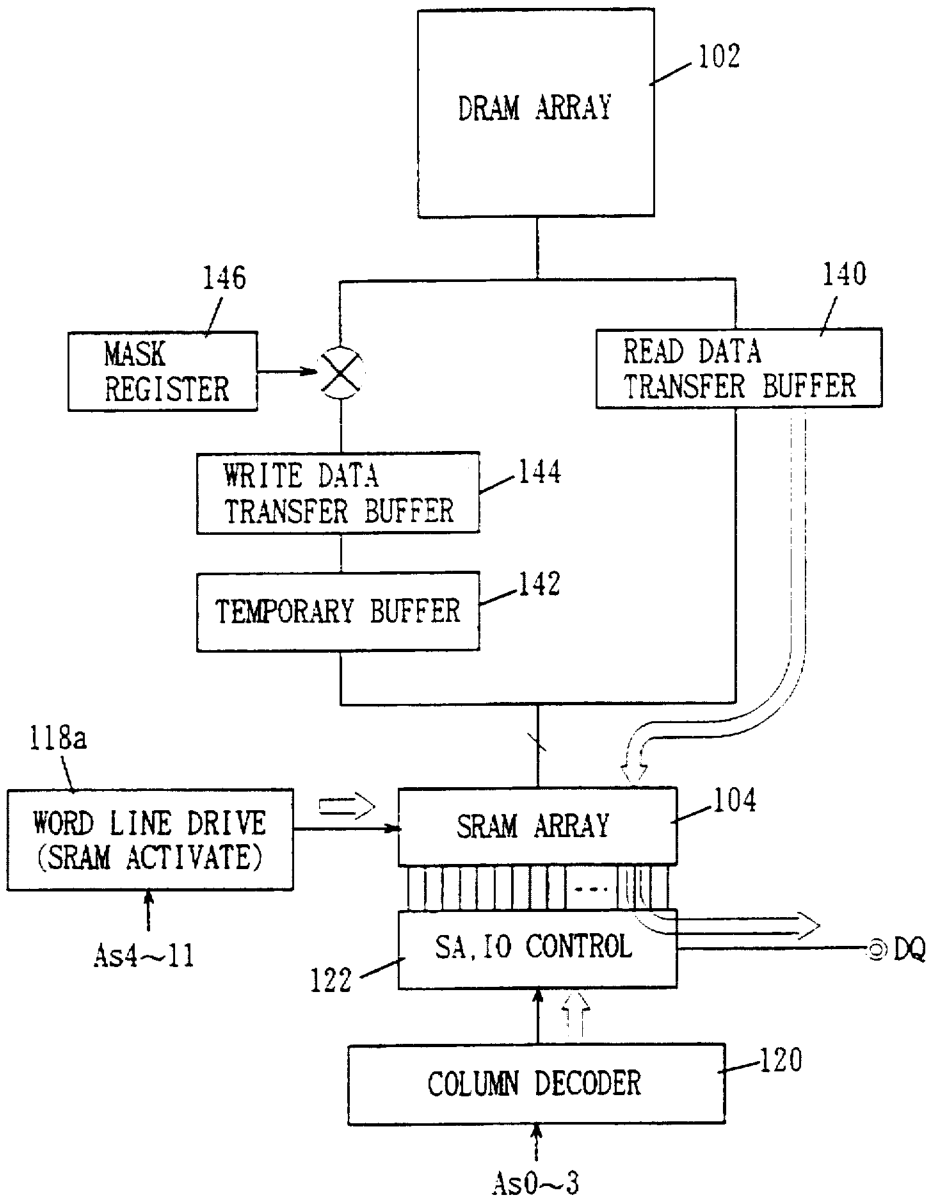

BUFFER WRITE TRANSFER & SRAM WRITE (INPUT → SRAM → DTBW)

F I G. 2 0
BUFFER READ (DTBR → OUTPUT)
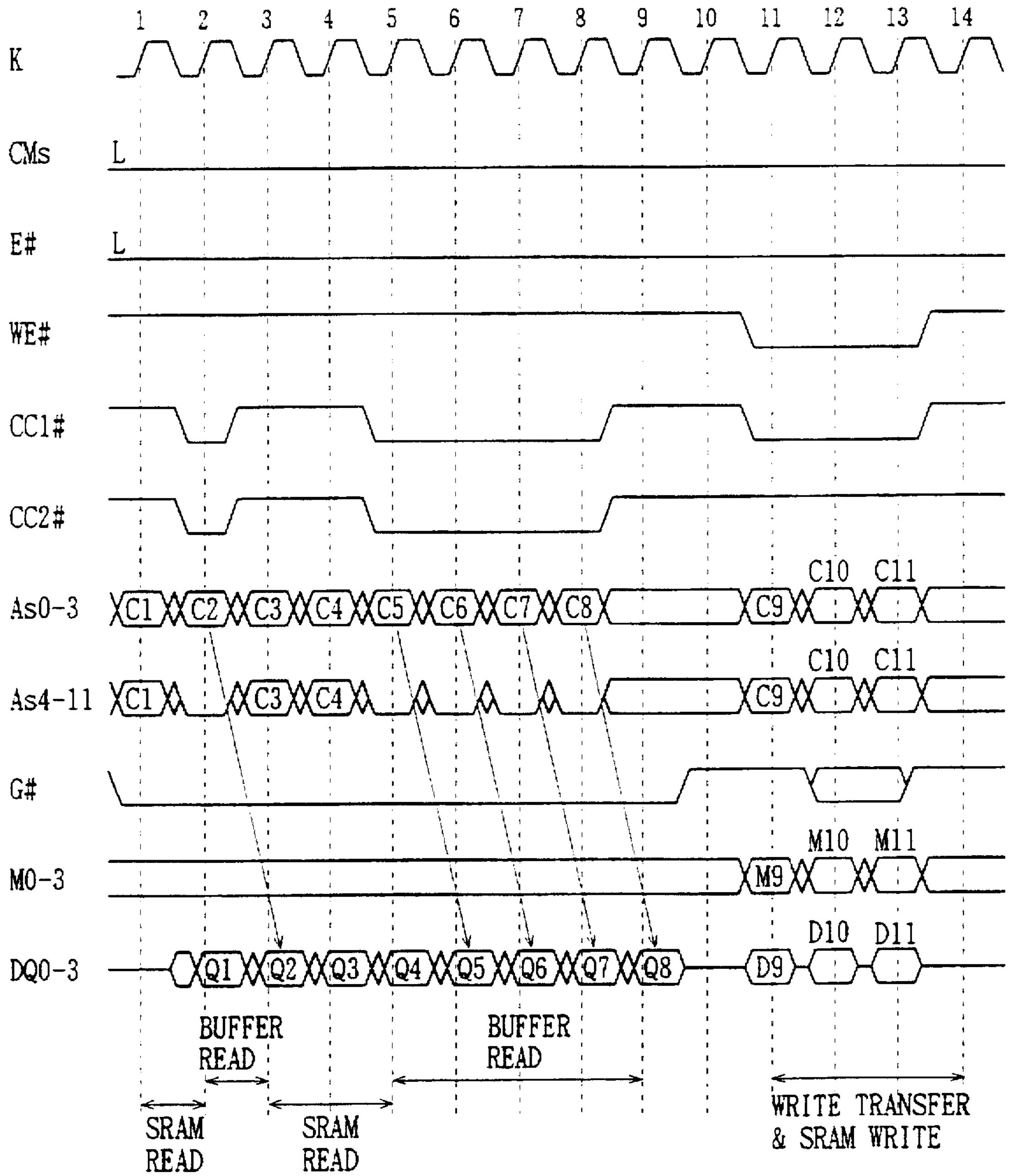

BUFFER WRITE (INPUT → DTBW)

F I G. 24

| NAMES OF CYCLES | CMs | E# | WE# | CC1# | CC2# | As | CMd | RAS# | CAS# | DTD# | Ad |
|---|---|---|---|---|---|---|---|---|---|---|---|
| DRAM POWER DOWN | × | × | × | × | × | × | H | × | × | × | × |
| DRAM NOP | × | × | × | × | × | × | L | H | H | × | × |
| DRAM ACTIVATE | × | × | × | × | × | × | L | L | H | H | DRAM ROW ADDRESS |
| DRAM READ TRANSFER | × | × | × | × | × | × | L | H | L | H | DRAM COLUMN ADDRESS |
| DRAM WRITE TRANSFER | × | × | × | × | × | × | L | H | L | L | DRAM COLUMN ADDRESS |
| DRAM PRECHARGE | × | × | × | × | × | × | L | L | H | L | × |
| DRAM AUTO REFRESH | × | × | × | × | × | × | L | L | L | H | × |
| SET COMMAND REGISTER | × | × | × | × | × | × | L | L | L | L | COMMAND REGISTER ADDRESS |

F I G. 2 6
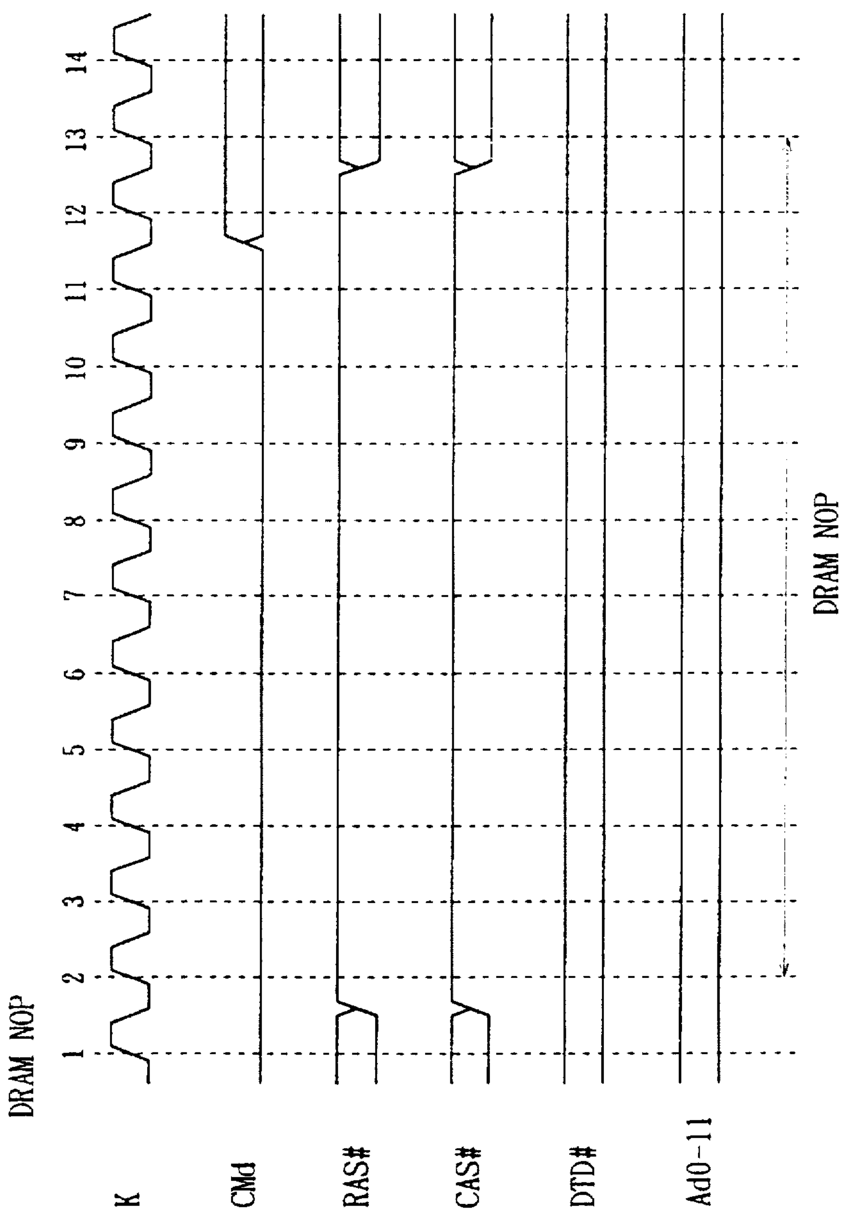

F I G. 28
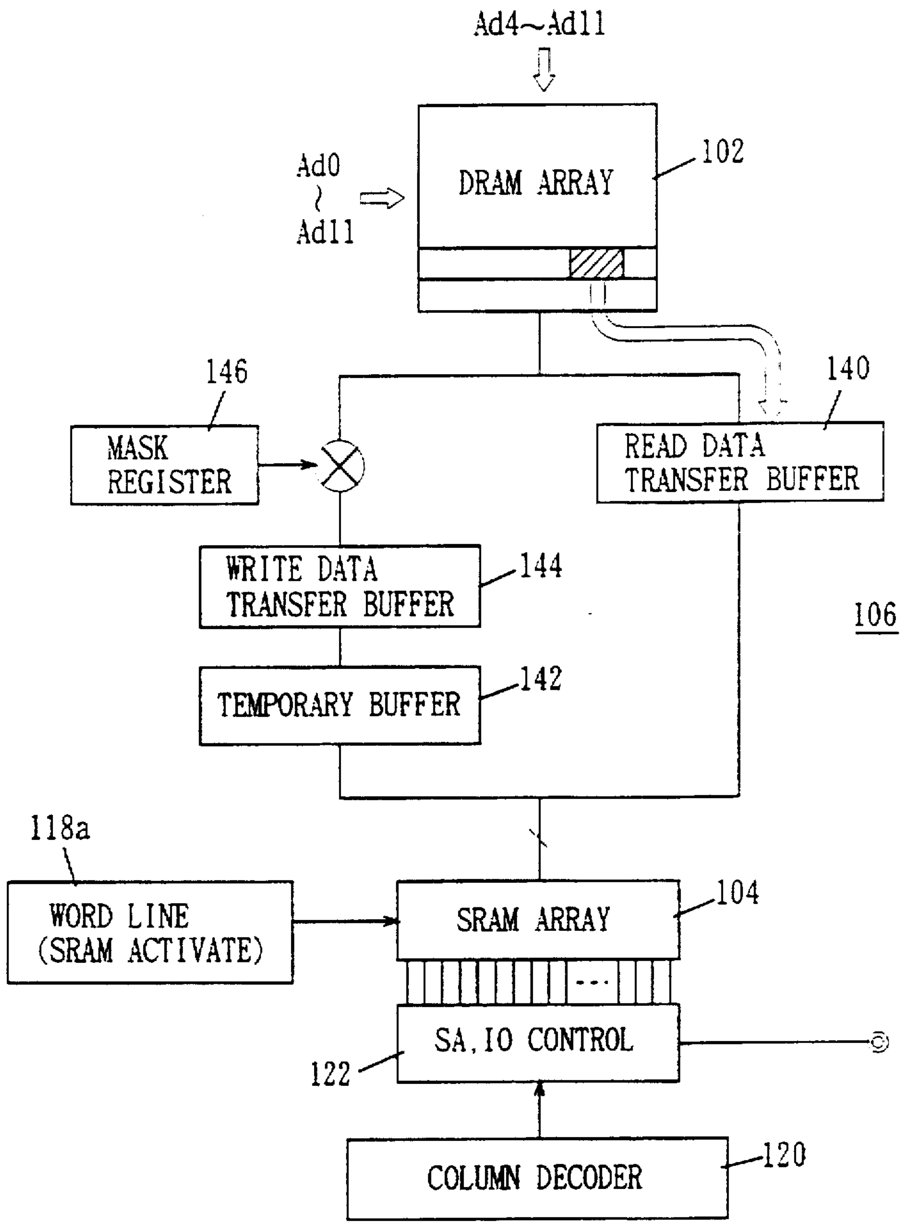

F I G. 41
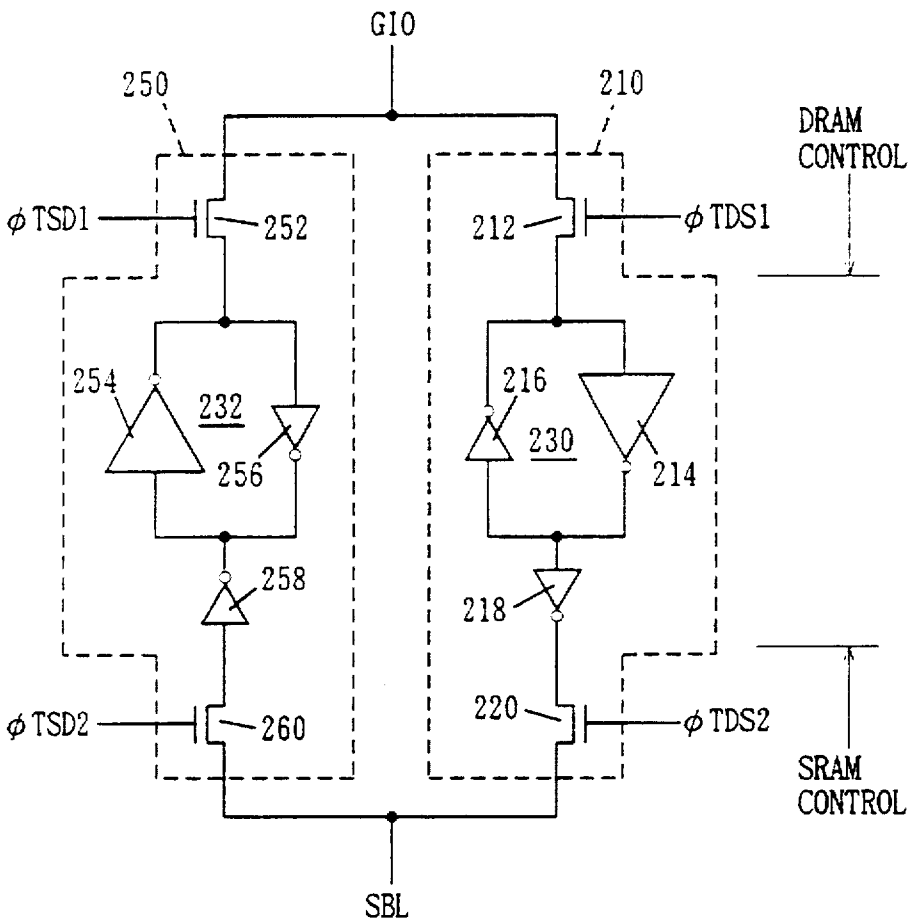

F I G. 4 2
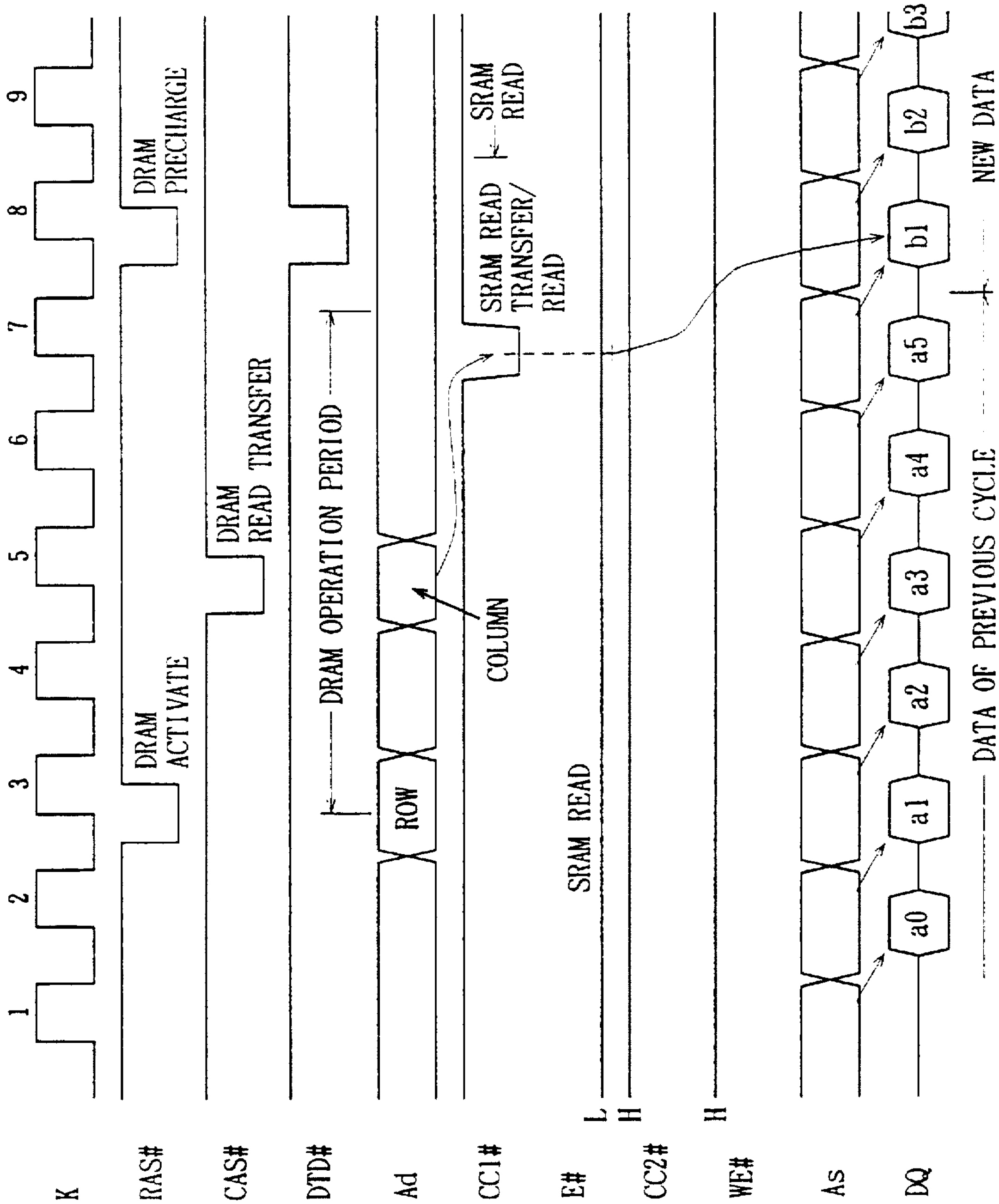

F I G. 4 3 A
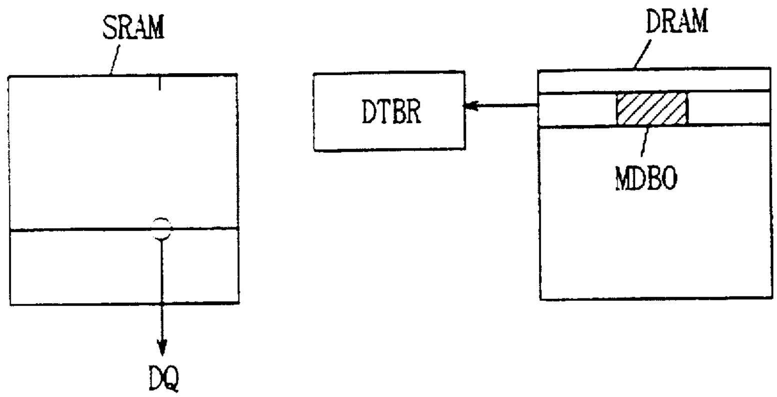
F I G. 4 3 B
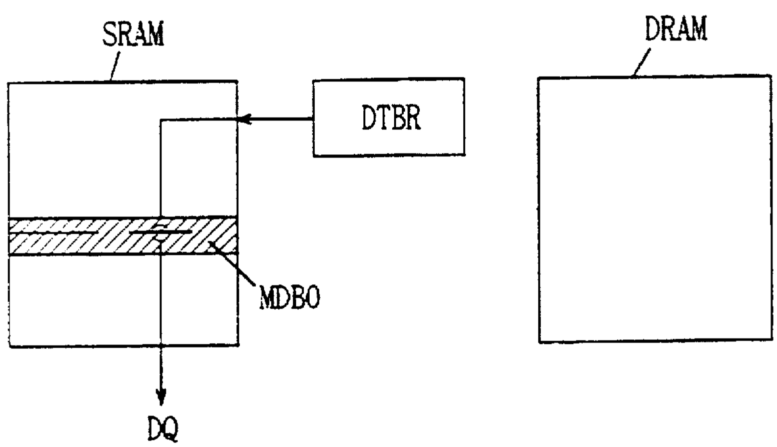

F I G. 4 4
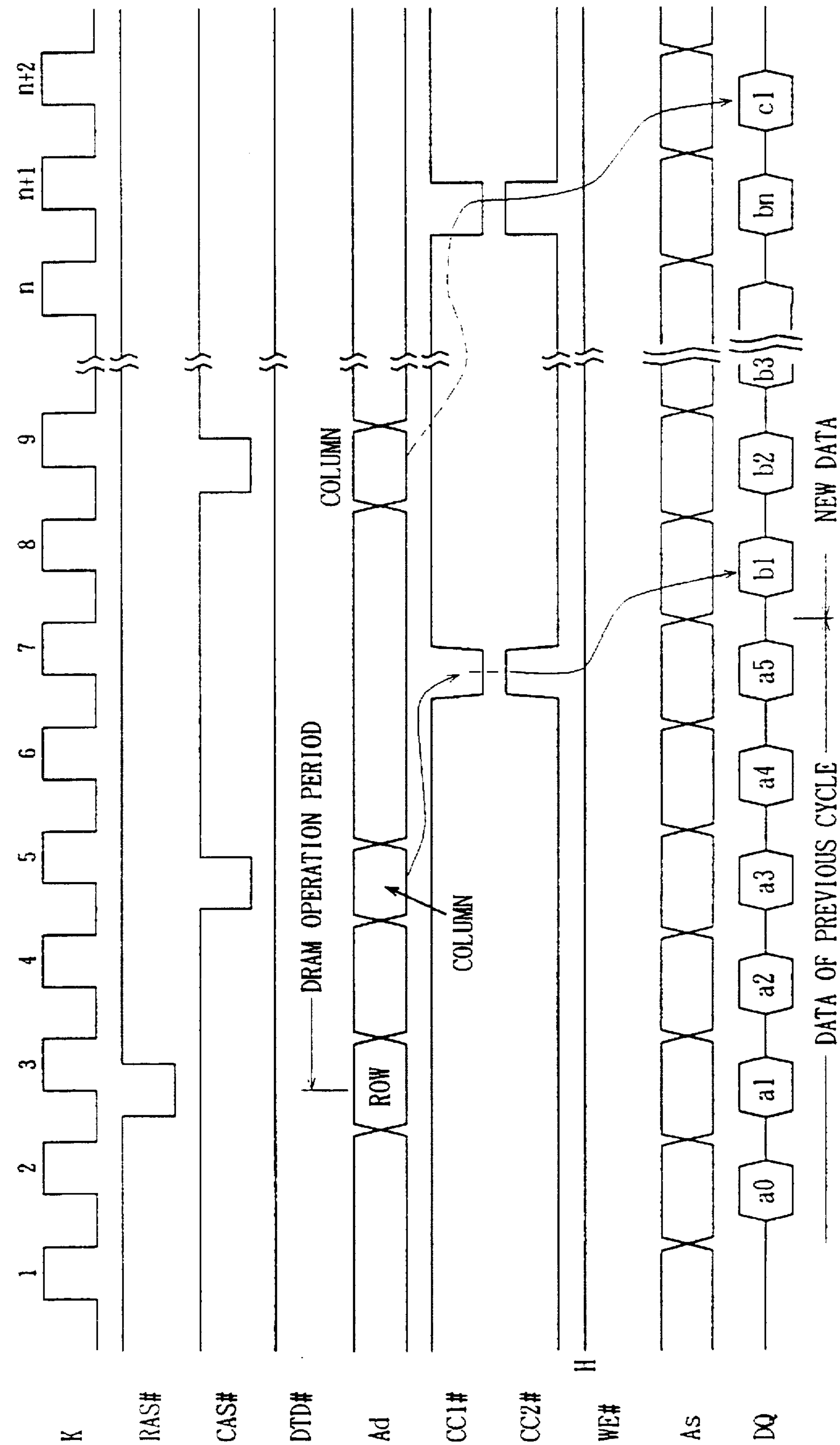

F I G. 45
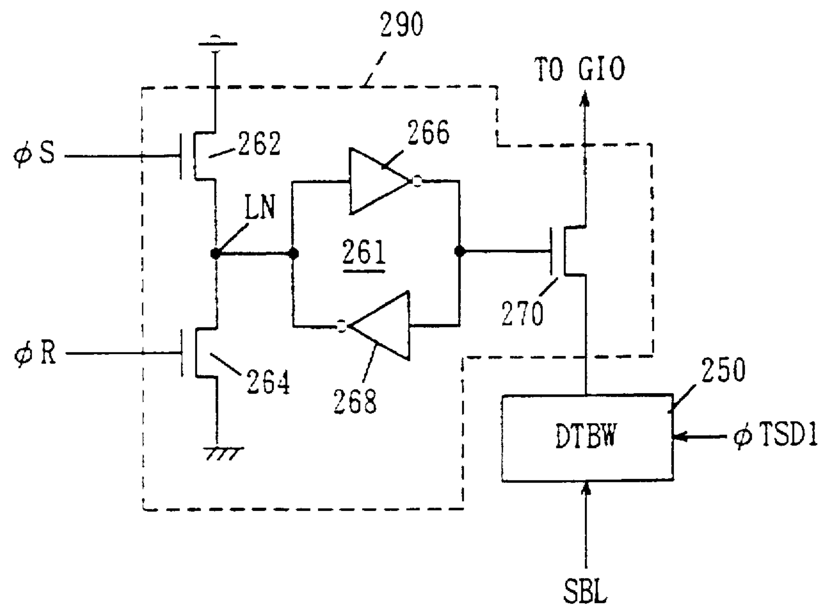
F I G. 46
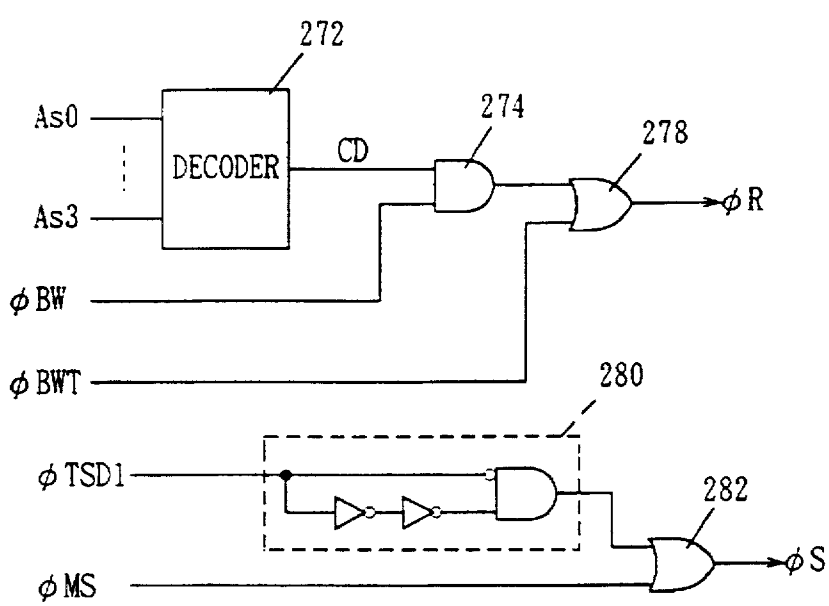

F I G. 48
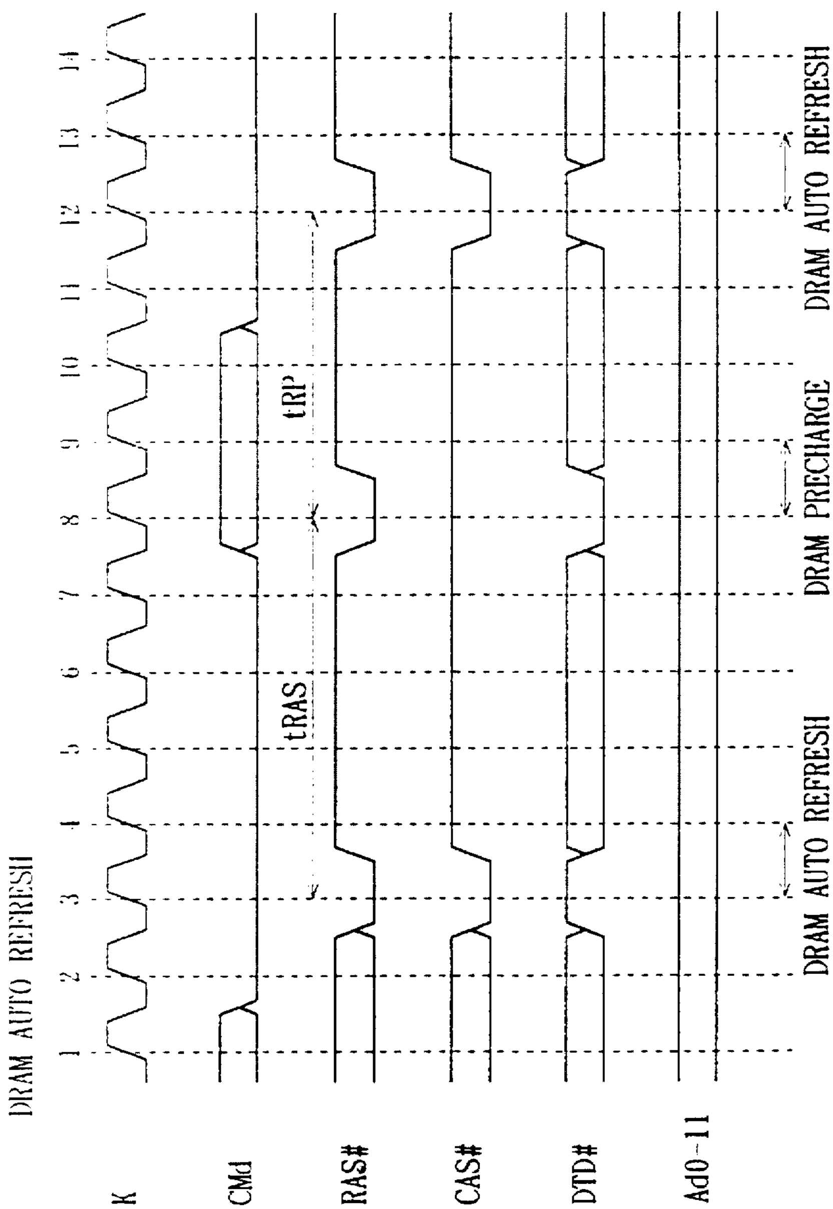

FIG. 50

| RESERVE | | | | | ACCESS LATENCY | | | OUTPUT MODE | | I/O | MASK REGISTER | COMMAND |
|---|---|---|---|---|---|---|---|---|---|---|---|---|
| Ad11 | Ad10 | Ad9 | Ad8 | Ad7 | Ad6 | Ad5 | Ad4 | Ad3 | Ad2 | Ad1 | Ad0 | |
| L | L | L | L | L | L | L | L | × | × | × | × | ACCESS LATENCY 1 |
| L | L | L | L | L | L | L | H | × | × | × | × | ACCESS LATENCY 2 |
| L | L | L | L | L | L | H | L | × | × | × | × | ACCESS LATENCY 3 |
| L | L | L | L | L | L | H | H | × | × | × | × | ACCESS LATENCY 4 |
| L | L | L | L | L | × | × | × | L | L | × | × | TRANSPARENT I |
| L | L | L | L | L | × | × | × | L | H | × | × | LATCH |
| L | L | L | L | L | × | × | × | H | L | × | × | REGISTER |
| L | L | L | L | L | × | × | × | × | × | L | × | COMMON |
| L | L | L | L | L | × | × | × | × | × | H | × | SEPARATE |
| L | L | L | L | L | × | × | × | × | × | × | L | NO CHANGE |
| L | L | L | L | L | × | × | × | × | × | × | H | ALL MASK SET |
| L | L | L | L | L | × | × | × | H | H | × | × | TRANSPARENT II |

F I G. 5 3
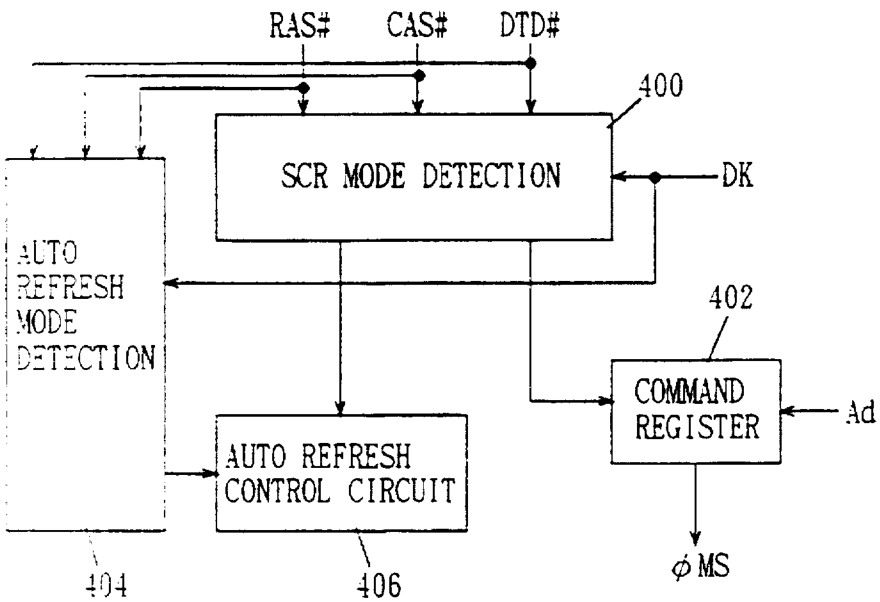
F I G. 5 4
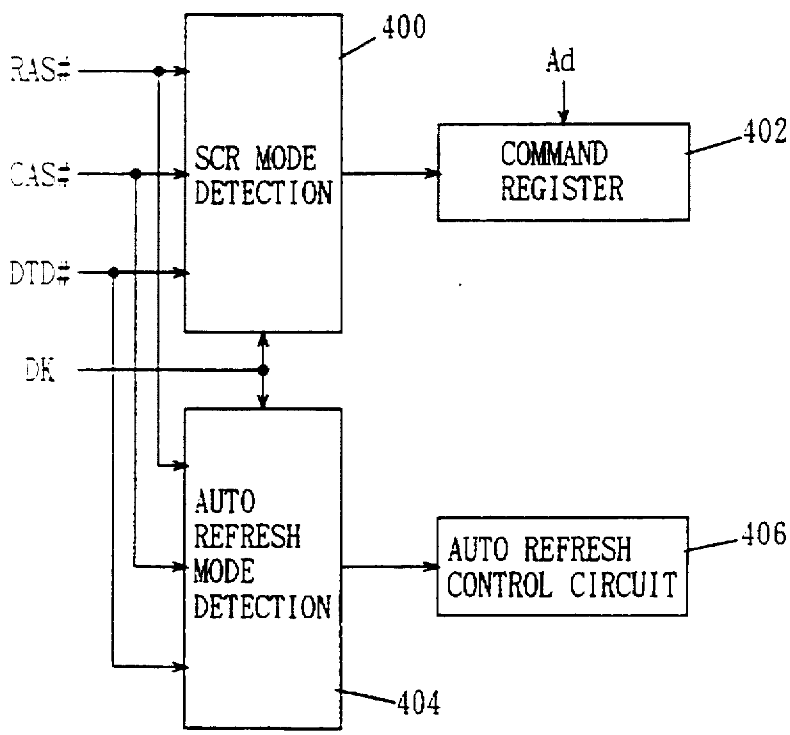

F I G. 58
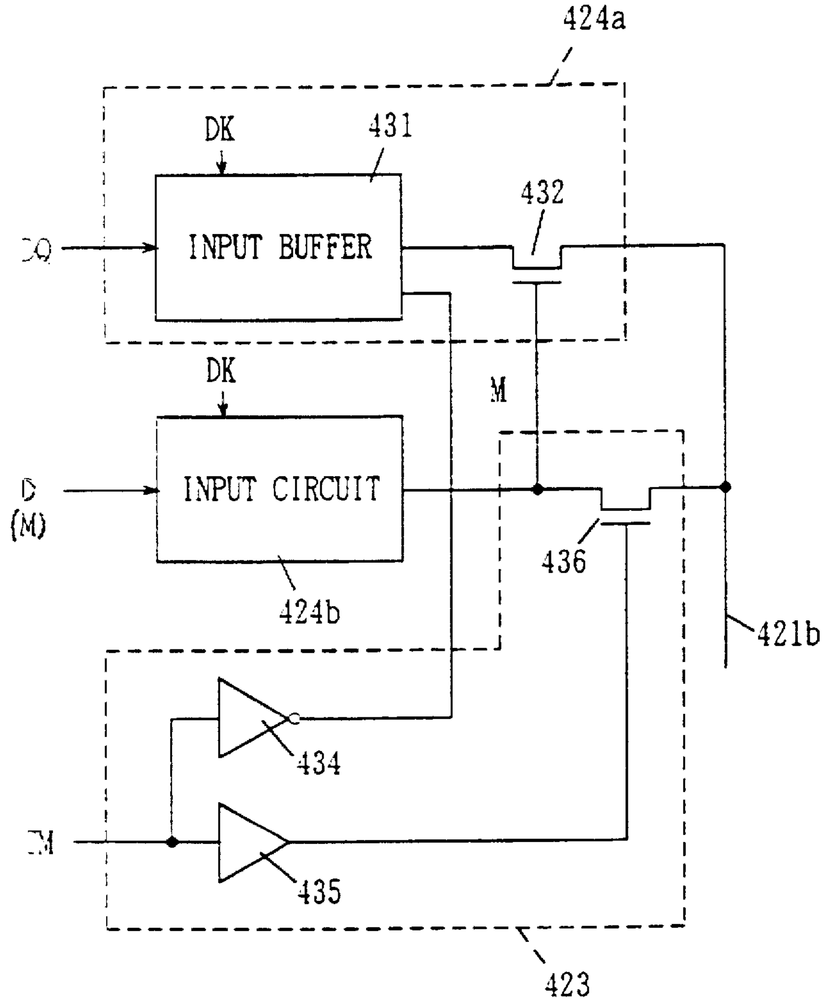
Ad1 = "H" → CM = "H"
(DQ SEPARATION)
Ad1 = "L" → CM = "L"
(COMMON DQ)

F I G. 6 4 A
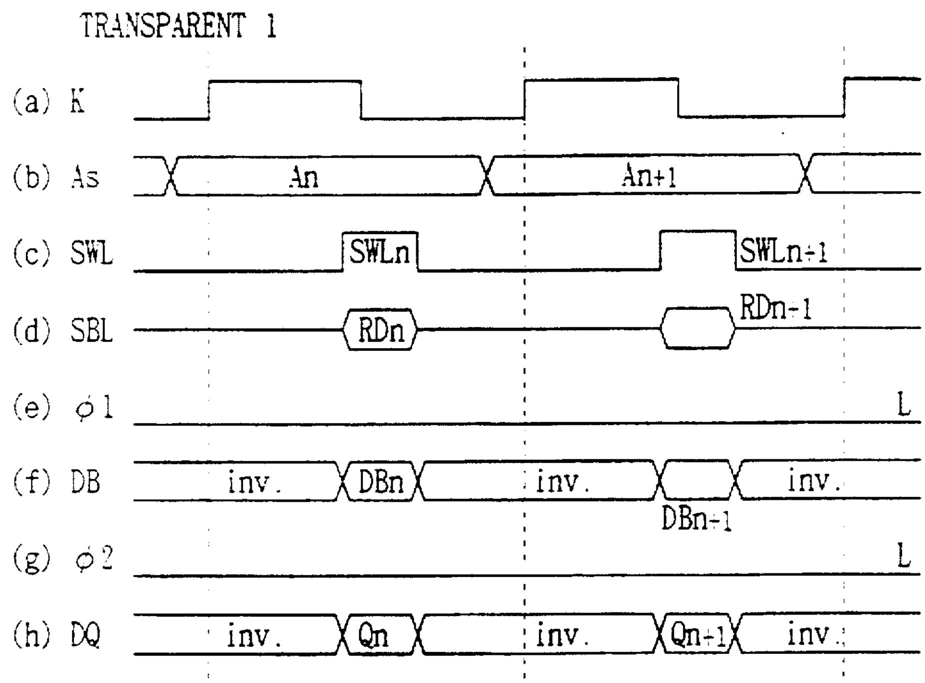
F I G. 6 4 B
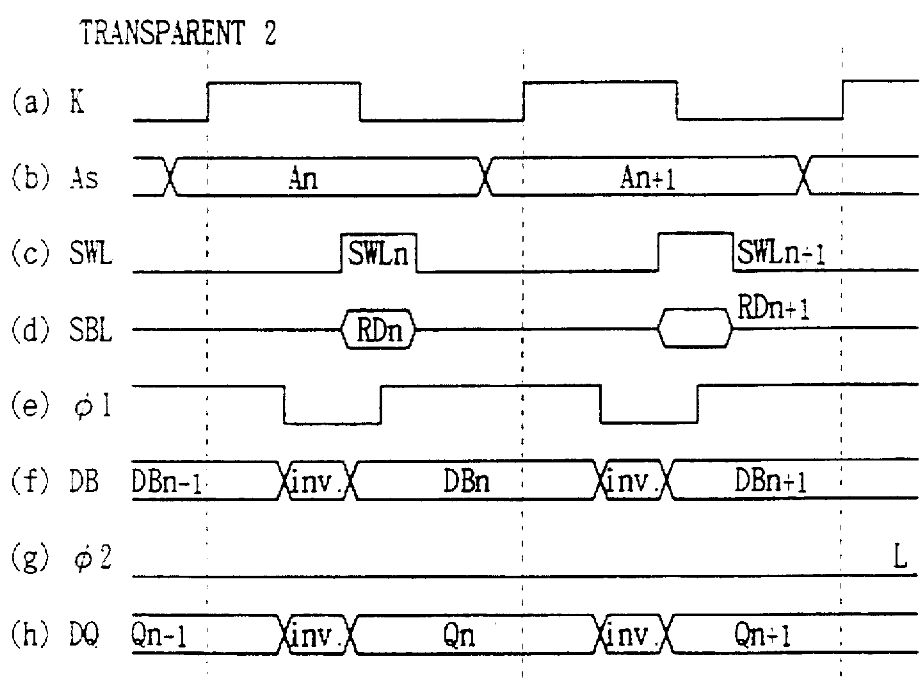

F I G. 6 6 A
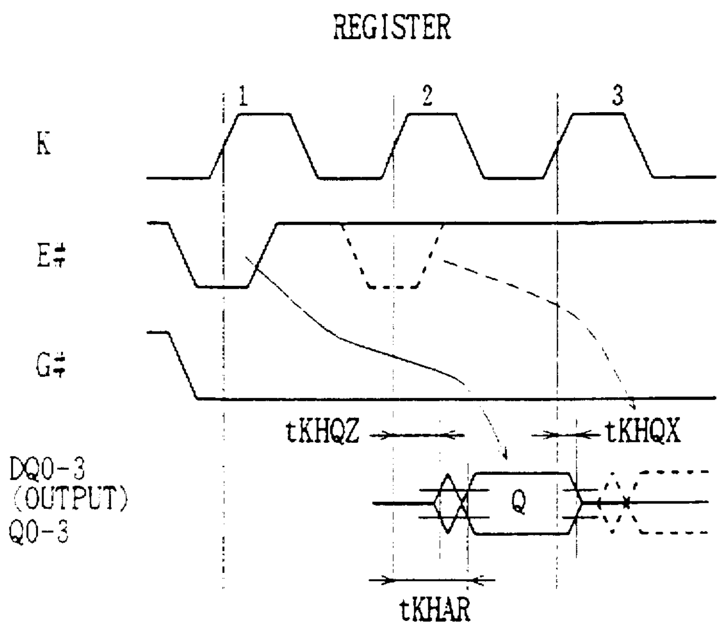
F I G. 6 6 B
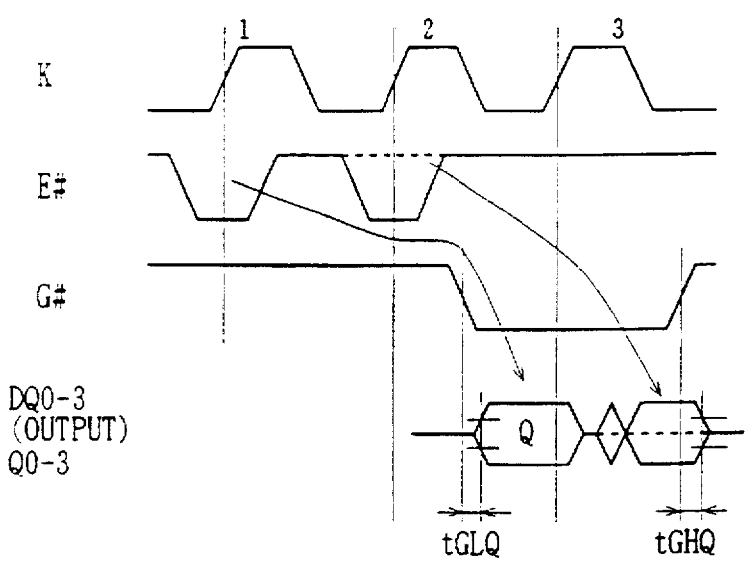

F I G. 6 7 A
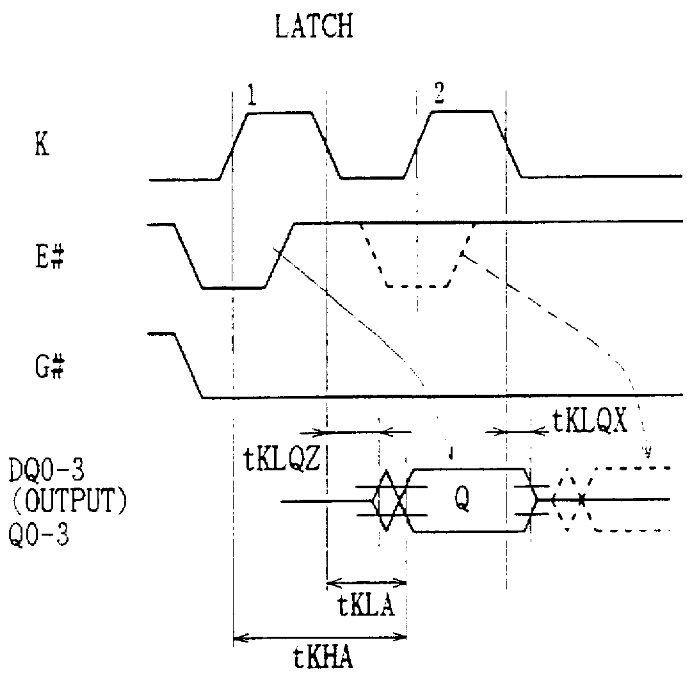
F I G. 6 7 B
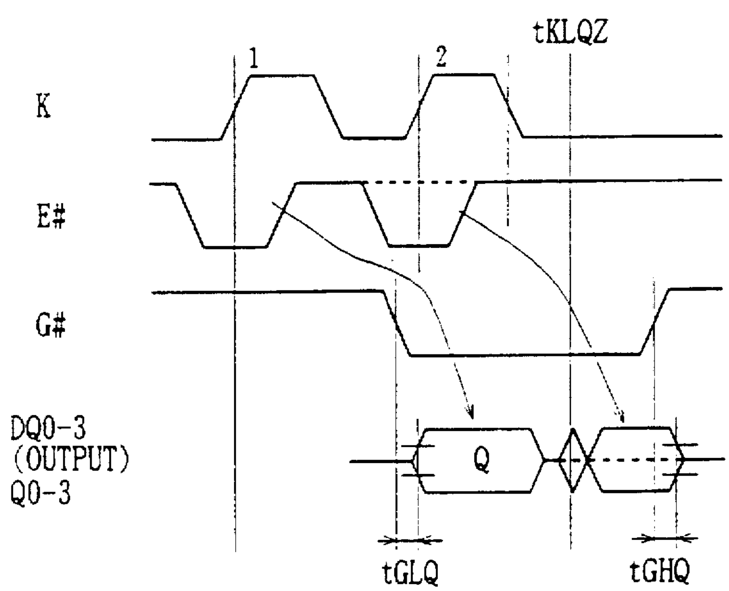

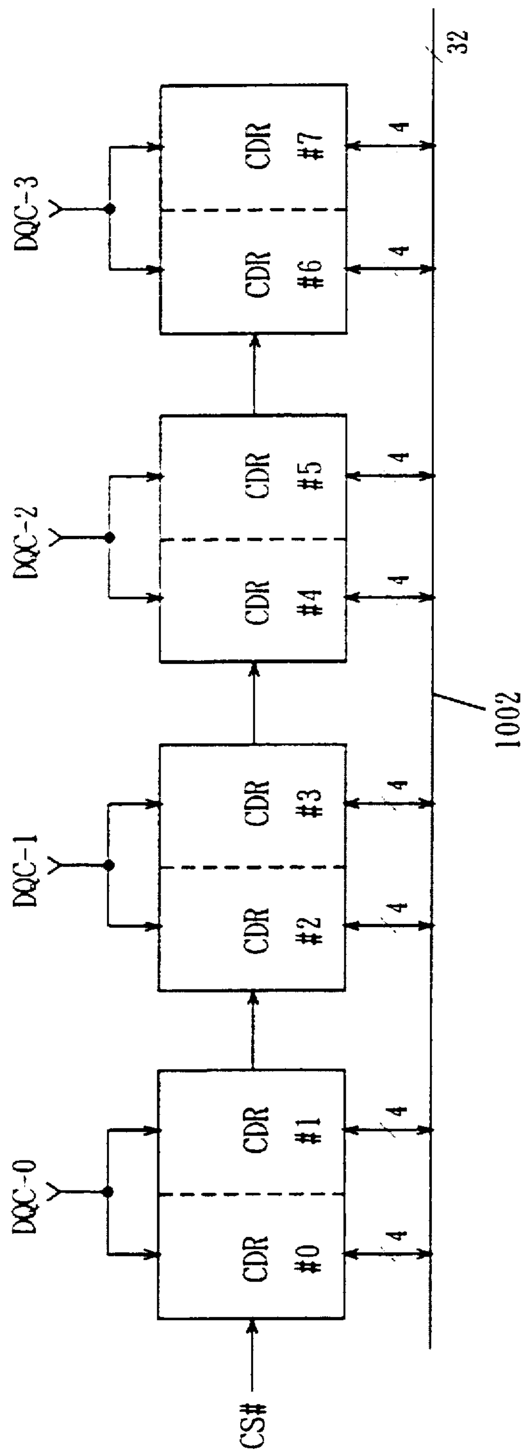
F I G. 7 5

F I G. 7 8
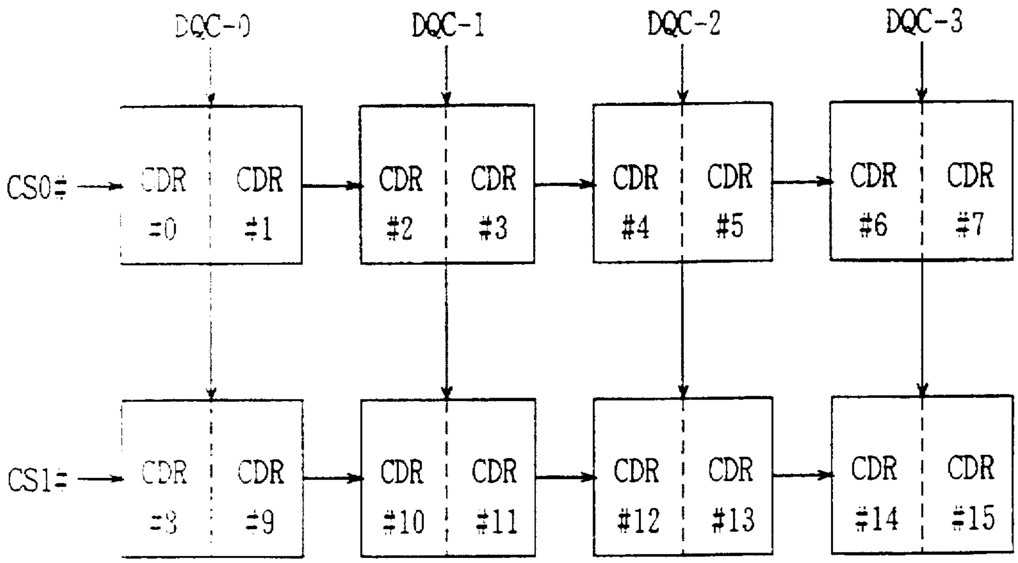
F I G. 7 9
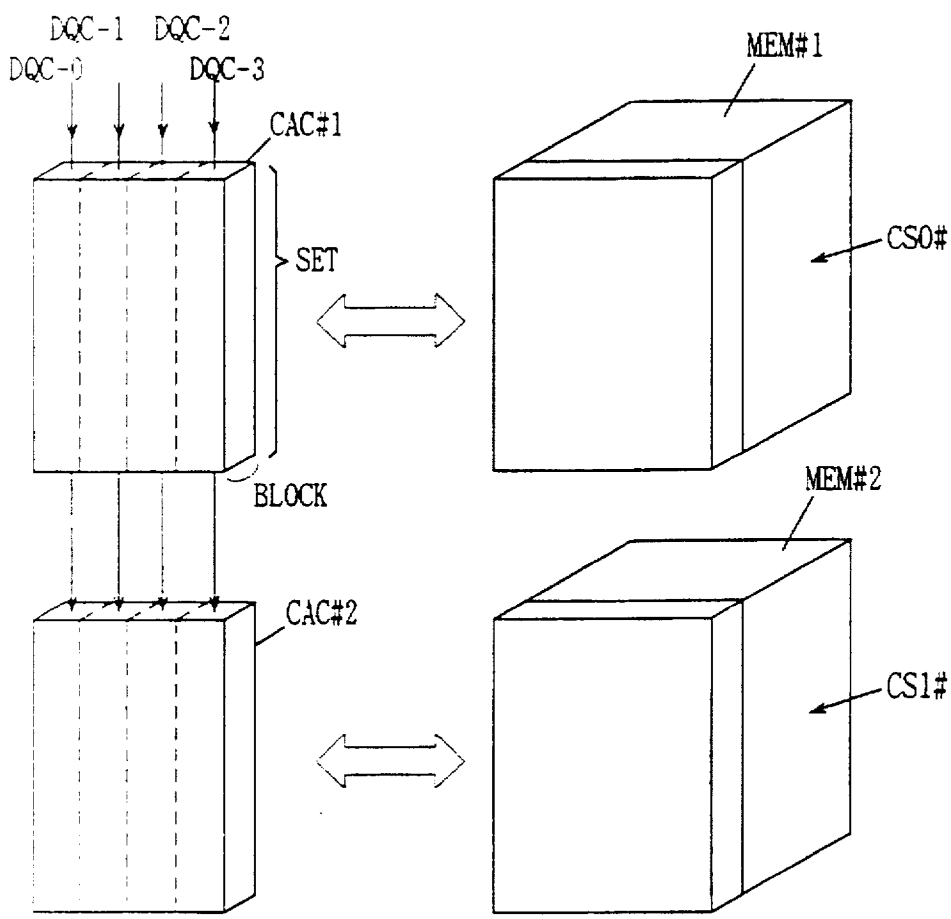

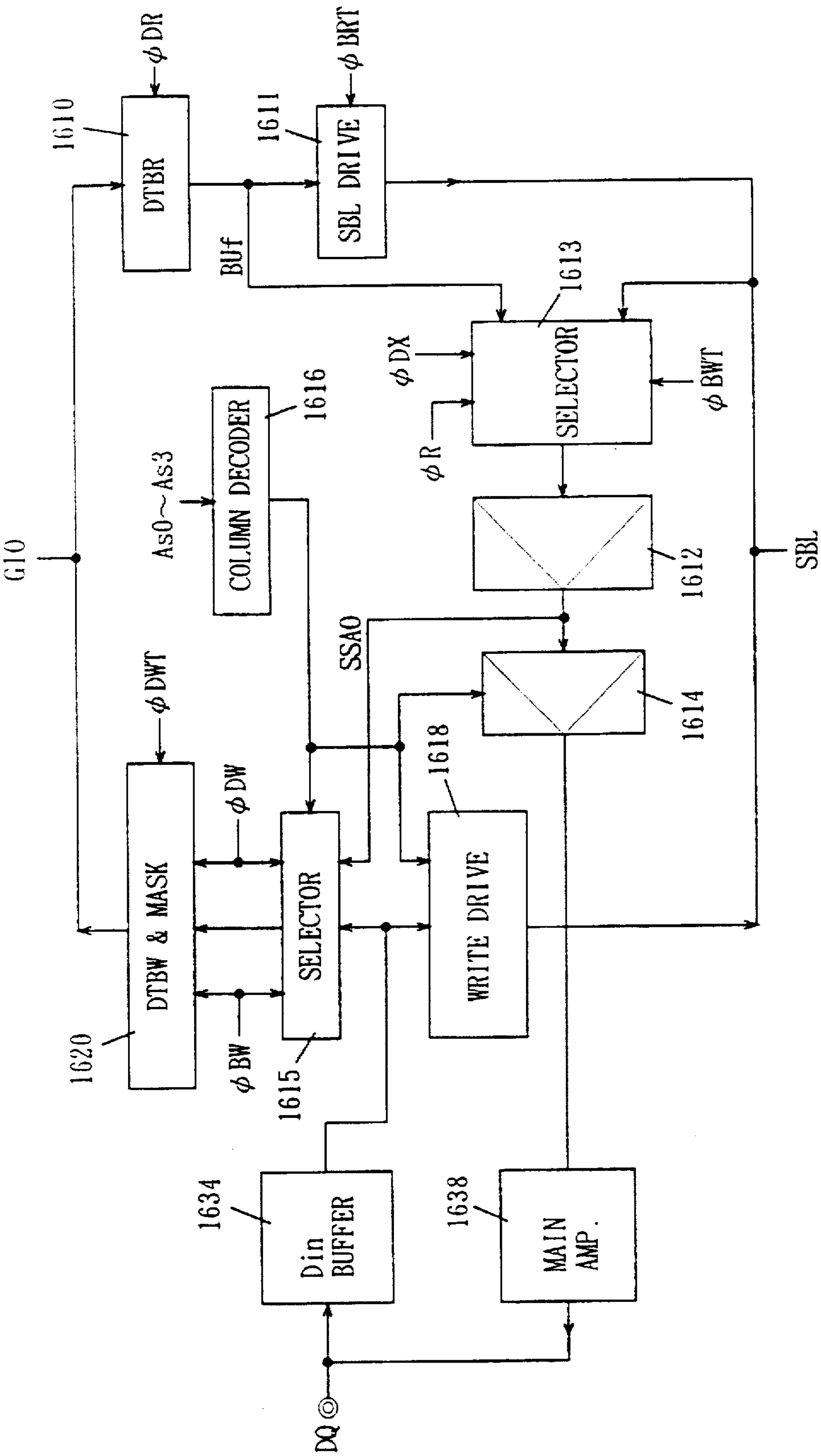
F I G. 8 4

F I G. 85

| | | SRAM | | | | | As (SRAM ADDRESS) | DATA TRANSFER BUFFER | | | | | DQ PIN | | | FUNCTION | |
|---|---|---|---|---|---|---|---|---|---|---|---|---|---|---|---|---|---|
| | | | | | | | | DTBW | | TRANSFER MASK | | DTBR | | | | | |
| | CS# | CMs# | CC0# | CC1# | WE# | DQC | As0-11 | TEMPORARY | DTBW | TEMPORARY | TRANSFER MASK | | WRITE MASK | DIN | DOUT | | |
| NOR | H | × | × | × | × | × | × | - | - | - | - | - | - | - | Hi-Z | NO OPERATION | |
| SPD | × | L | × | × | × | × | × | - | - | - | - | - | - | - | SUSPEND | SRAM POWER DOWN DATA SUSPEND | |
| DES | L | H | H | H | × | × | × | - | - | - | - | - | - | - | Hi-Z | DESELECT SRAM | |
| SR | L | H | H | L | H | H | As0-11 | - | - | - | - | - | - | - | VALID | SRAM READ | SRAM →DQ |
| SW | L | H | H | L | L | H | As0-11 | - | - | - | - | - | LOAD /USE | VALID | Hi-Z | SRAM WRITE | DIN →SRAM |
| BRT | L | H | L | H | H | L | As4-11 | - | - | - | - | USE | - | - | Hi-Z | BUFFER READ TRANSFER | DTBR→ SRAM |
| BWT | L | H | L | H | L | L | As4-11 | LOAD | - | ALL MASK RESET | - | - | LOAD /USE | - | Hi-Z | BUFFER WRITE TRANSFER | SRAM→ DTBW |
| BRTR | L | H | L | H | H | H | As0-11 | - | - | - | - | USE | - | - | VALID | BUFFER READ TRANSFER READ | DTBR→ SRAM→DQ |
| BWTW | L | H | L | H | L | H | As0-11 | LOAD | - | ALL MASK RESET | - | - | LOAD /USE | VALID | Hi-Z | BUFFER WRITE TRANSFER WRITE | DIN→SRAM →DTBW |
| BR | L | H | L | L | H | H | As0-3 | - | - | - | - | USE | - | - | VALID | BUFFER READ | DTBR →DQ |
| BW | L | H | L | L | L | H | As0-3 | LOAD | - | 1 BIT RESET | - | - | LOAD /USE | VALID | Hi-Z | BUFFER WRITE | DIN→ DTBW |

F I G. 88
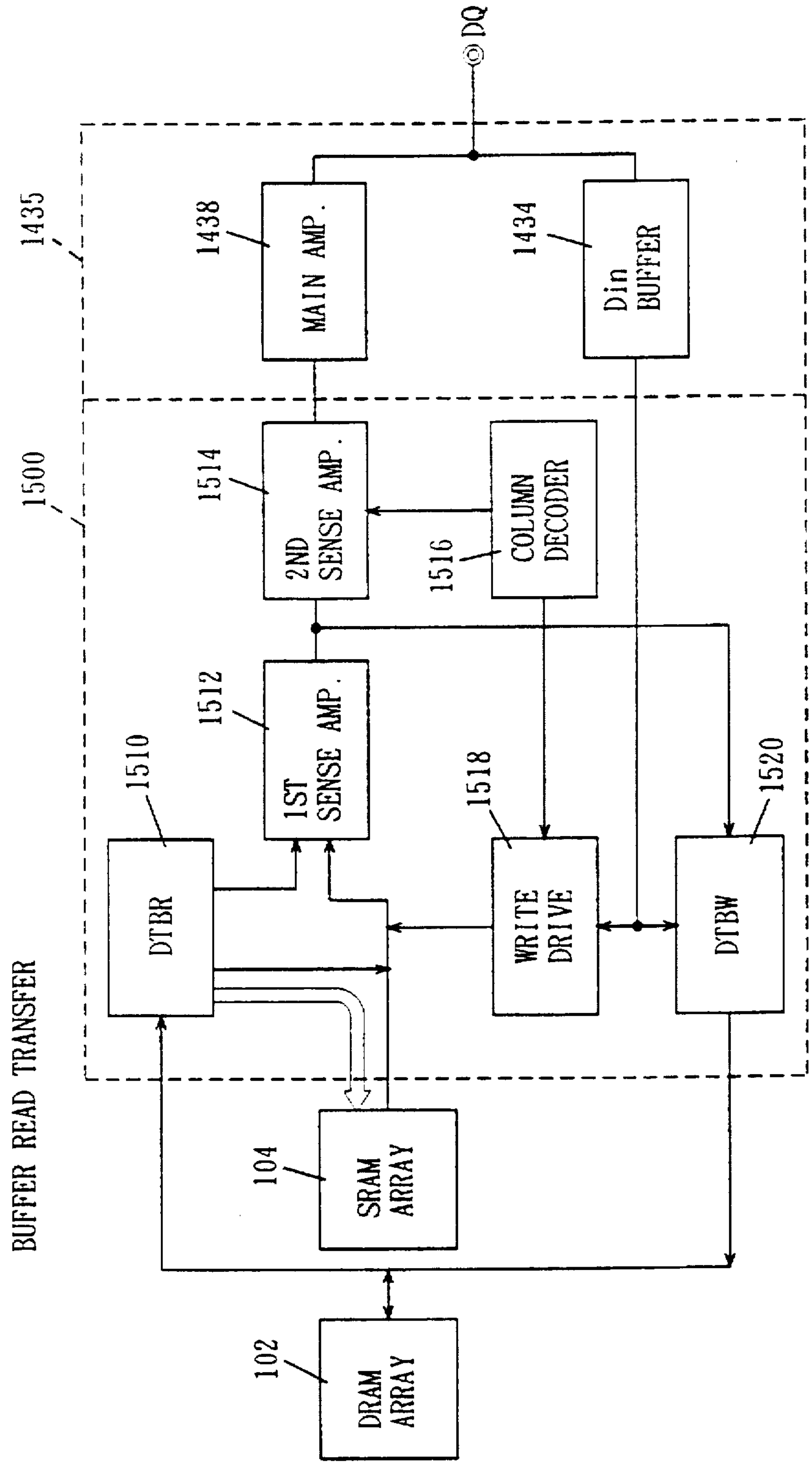

F I G. 9 1
BUFFER WRITE TRANSFER & WRITE
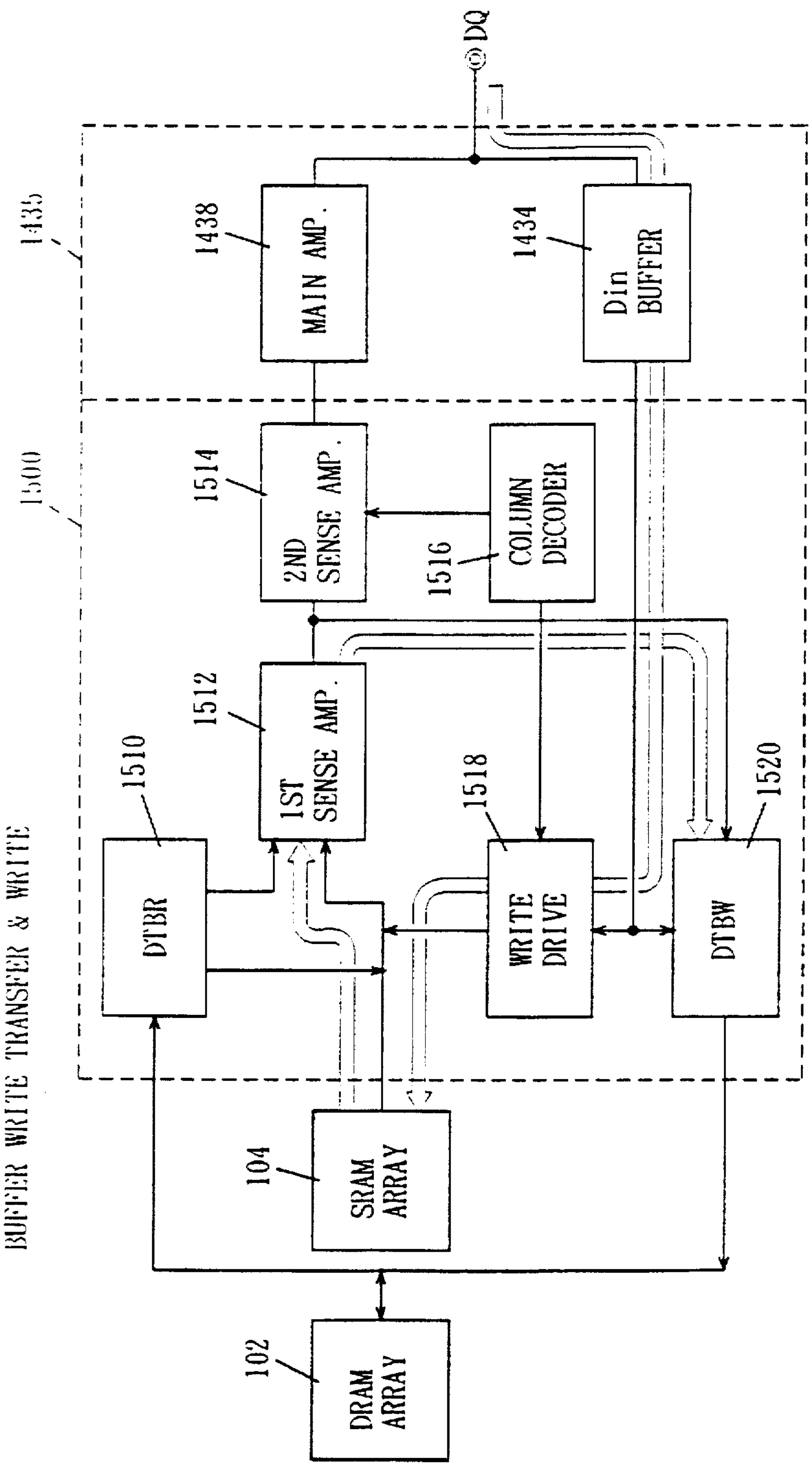

F I G. 94

| | CS# | DRAM | | | | Ad (DRAM ADDRESS) | | | DATA TRANSFER BUFFER | | | | | FUNCTION | |
|---|---|---|---|---|---|---|---|---|---|---|---|---|---|---|---|
| | | | | | | | | | DTBW | | TRANSFER MASK | | | | |
| | | CMd# | RAS# | CAS# | DTD# | Ad0-11 | Ad0 | Ad1 | TEMPORARY | DTBW | TEMPORARY | TRANSFER MASK | DTBR | | |
| DPD | × | L | × | × | × | × | | | - | - | - | - | - | DRAM POWER DOWN | |
| DNOP | L | H | H | H | × | × | | | - | - | - | - | - | DRAM NO OPERATION | |
| DRT | L | H | H | L | H | Ad4-9 (COLUMN BLOCK) | | | - | - | - | - | LOAD | DRAM READ TRANSFER | DRAM →DTBR |
| DWT1 | L | H | H | L | L | Ad4-9 (COLUMN BLOCK) | 0 | 0 | - | LOAD /USE | ALL BIT SET | LOAD /USE | - | DRAM WRITE TRANSFER 1 | DTBW →DRAM |
| DWT1R | L | H | H | L | L | Ad4-9 (COLUMN BLOCK) | 1 | 0 | - | LOAD /USE | ALL BIT SET | LOAD /USE | LOAD | DRAM WRITE TRANSFER 1·READ | DTBW→DRAM →DTBR |
| DWT2 | L | H | H | L | L | Ad4-9 (COLUMN BLOCK) | 0 | 1 | - | USE | - | USE | - | DRAM WRITE TRANSFER 2 | DTBW →DRAM |
| DWT2R | L | H | H | L | L | Ad4-9 (COLUMN BLOCK) | 1 | 1 | - | USE | - | USE | LOAD | DRAM WRITE TRANSFER 2·READ | DTBW→DRAM →DTBR |
| ACT | L | H | L | H | H | Ad0-11 (ROW ADDRESS) | | | - | - | - | - | - | DRAM ACTIVATE | |
| PCG | L | H | L | H | L | × | | | - | - | - | - | - | DRAM PRECHARGE | |
| ARF | L | H | L | L | H | × | | | - | - | - | - | - | AUTO REFRESH | |
| SCR | L | H | L | L | L | | | | - | - | - | - | - | SET COMMAND REGISTER | |

DRAM WRITE TRANSFER 1

F I G. 9 9
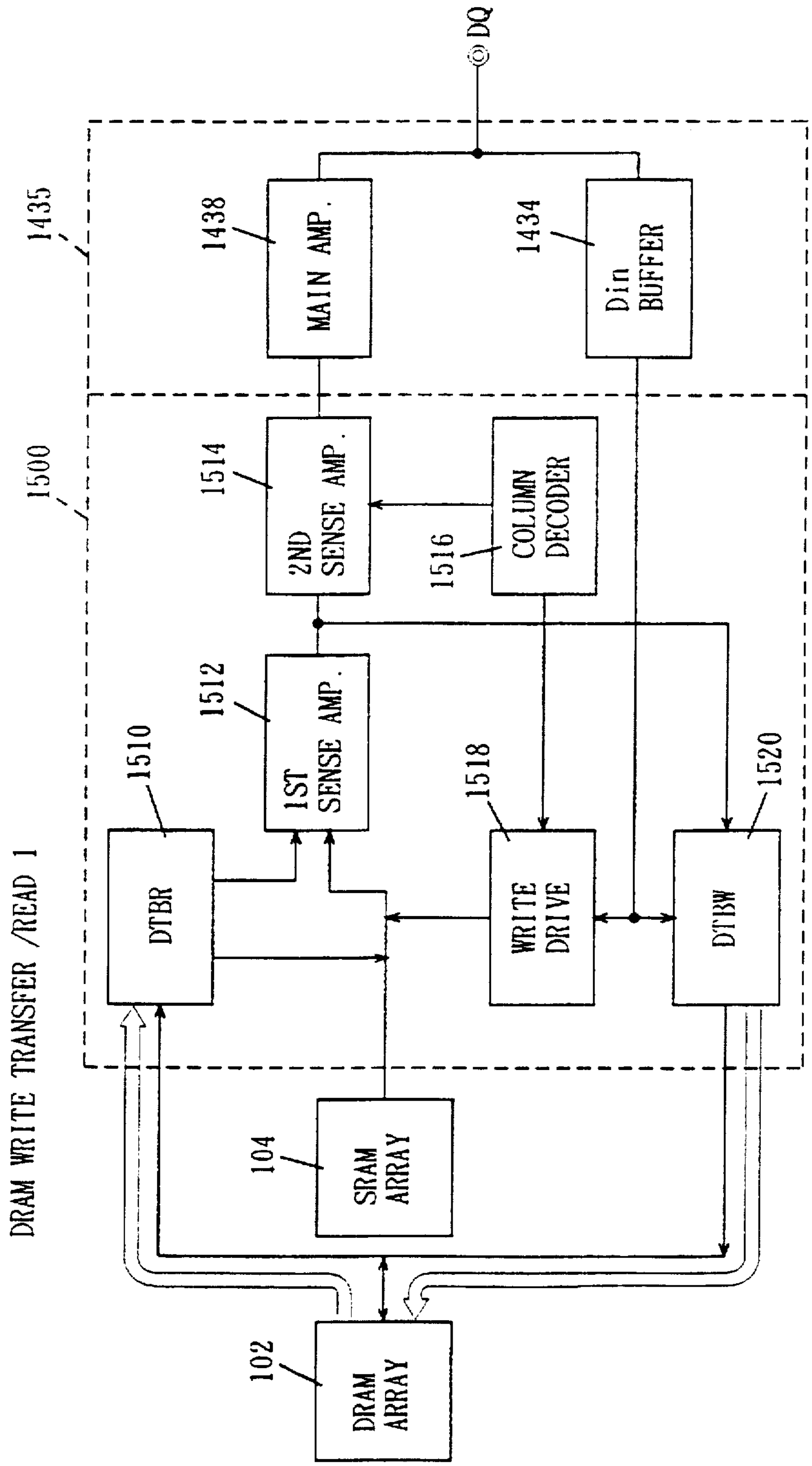

DRAM READ TRANSFER

F I G. 1 0 3
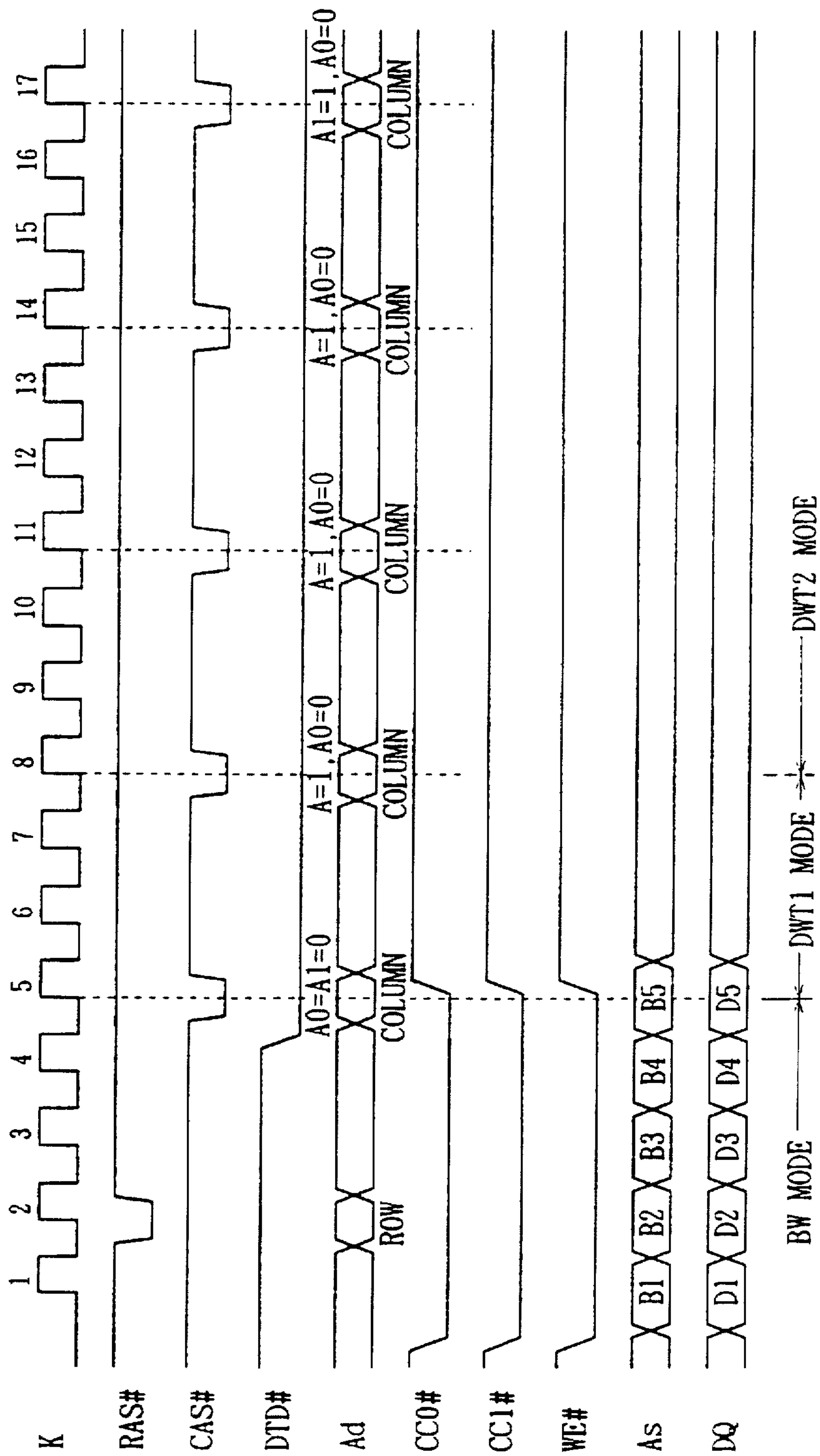

| Ad11 | Ad10 | Ad9 | MODE |
|---|---|---|---|
| 1 | 0 | 0 | DWT1 |
| 1 | 0 | 1 | DWT1R |
| 1 | 1 | 0 | DWT2 |
| 1 | 1 | 1 | DWT2R |
| 0 | × | × | TEST MODE RESET |

F I G. 1 1 8
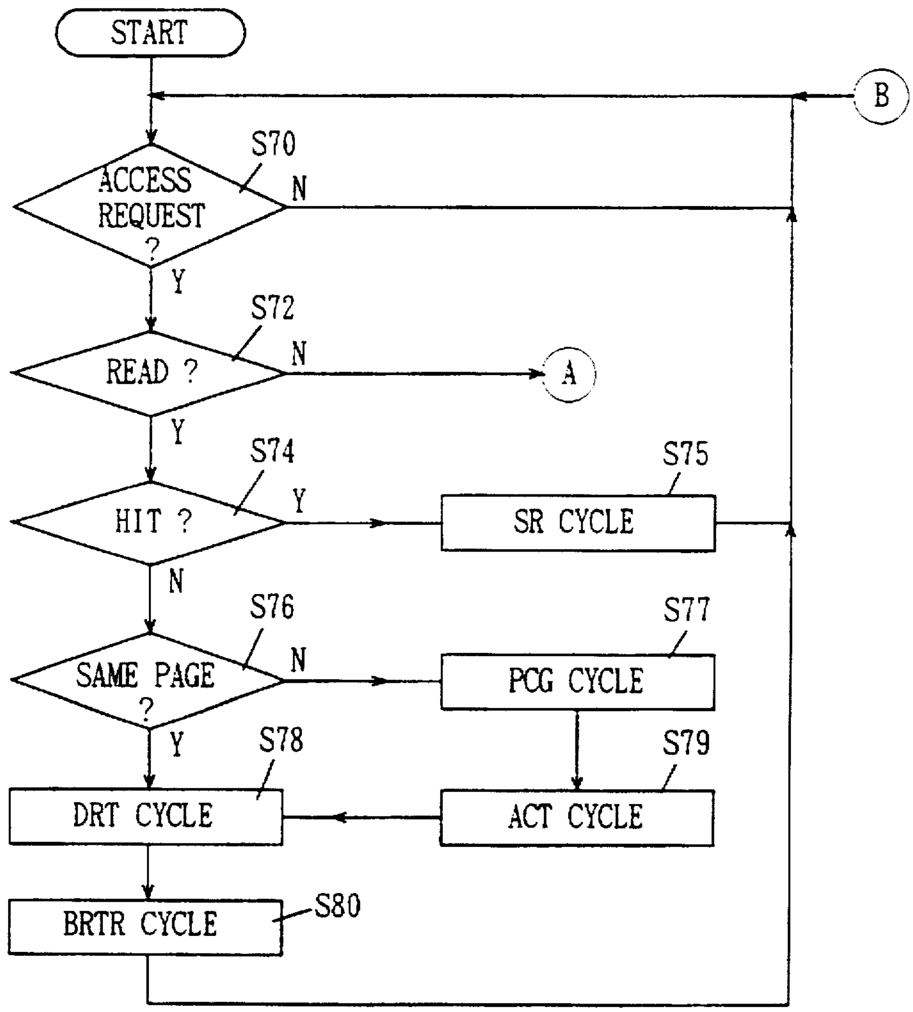

F I G. 127
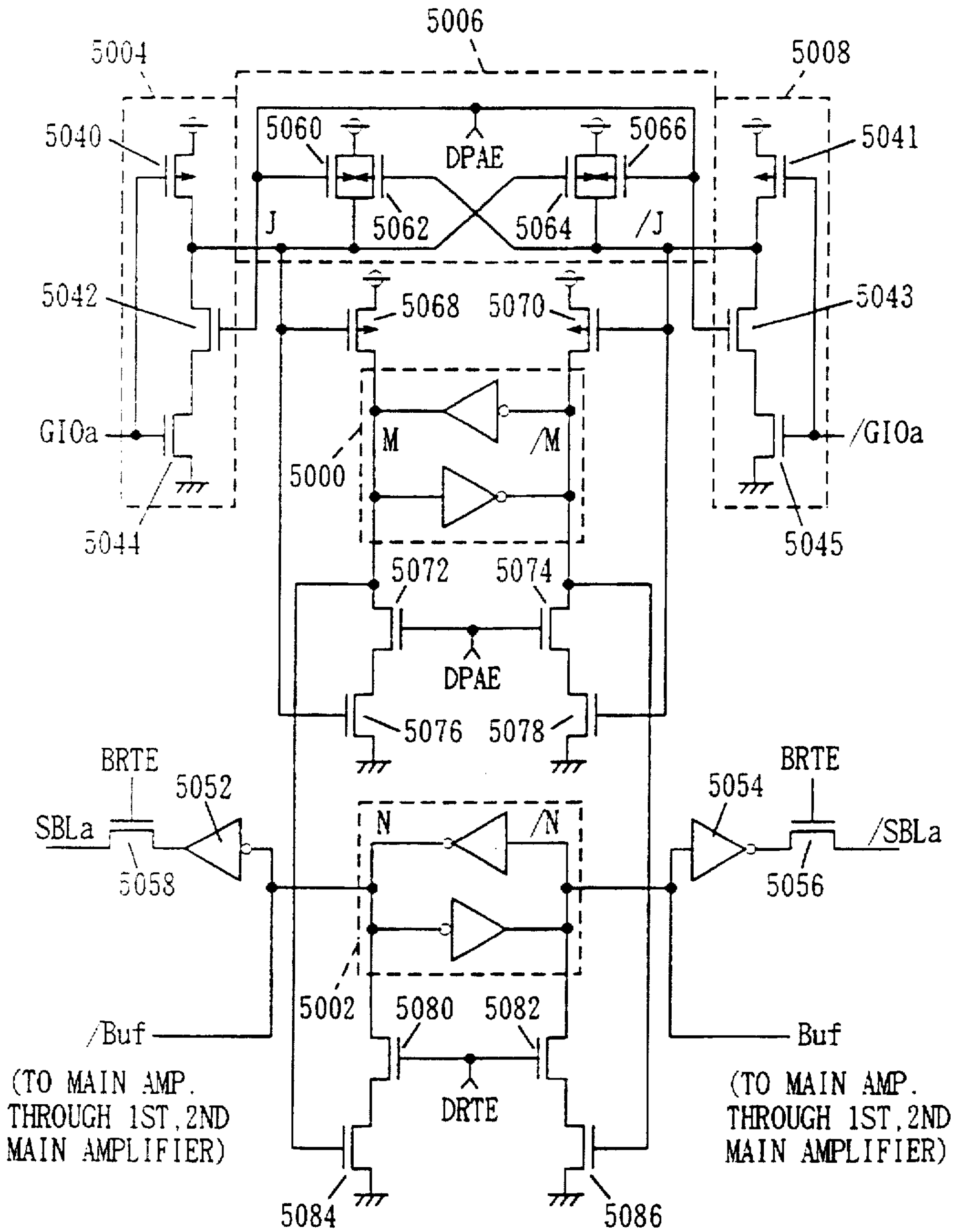

F I G. 1 3 0
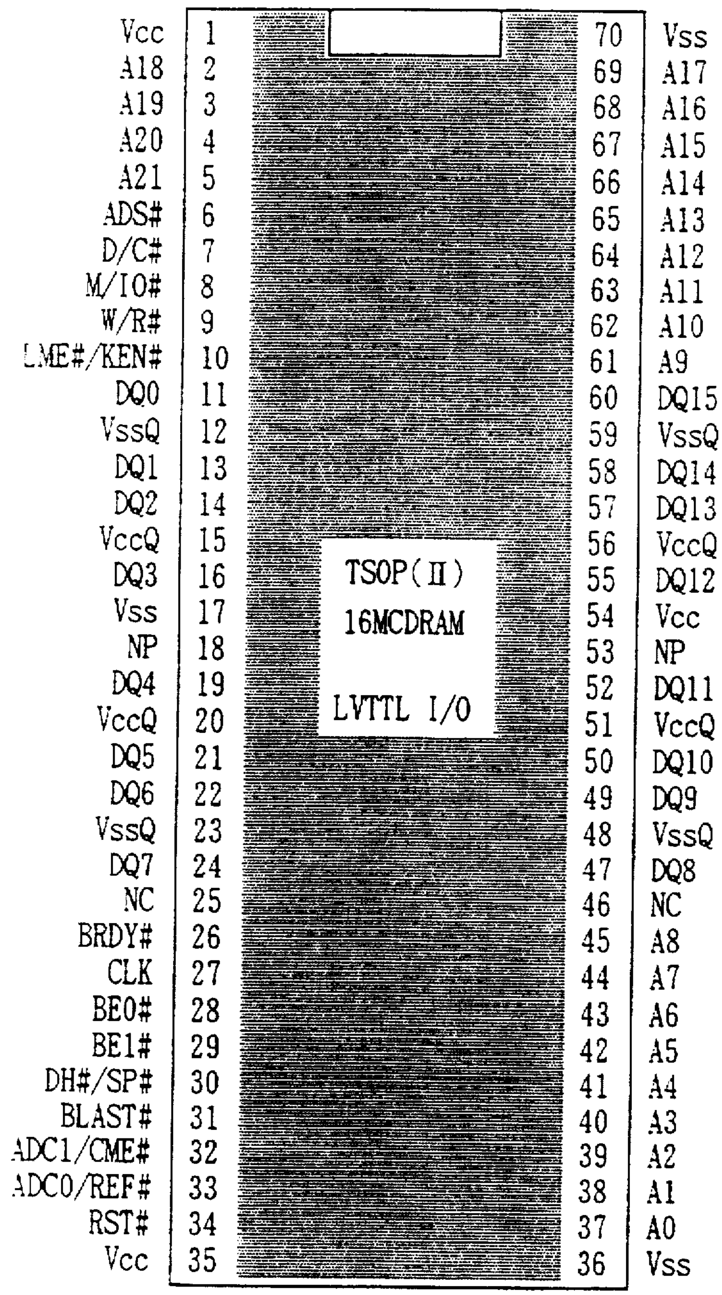

FIG. 132

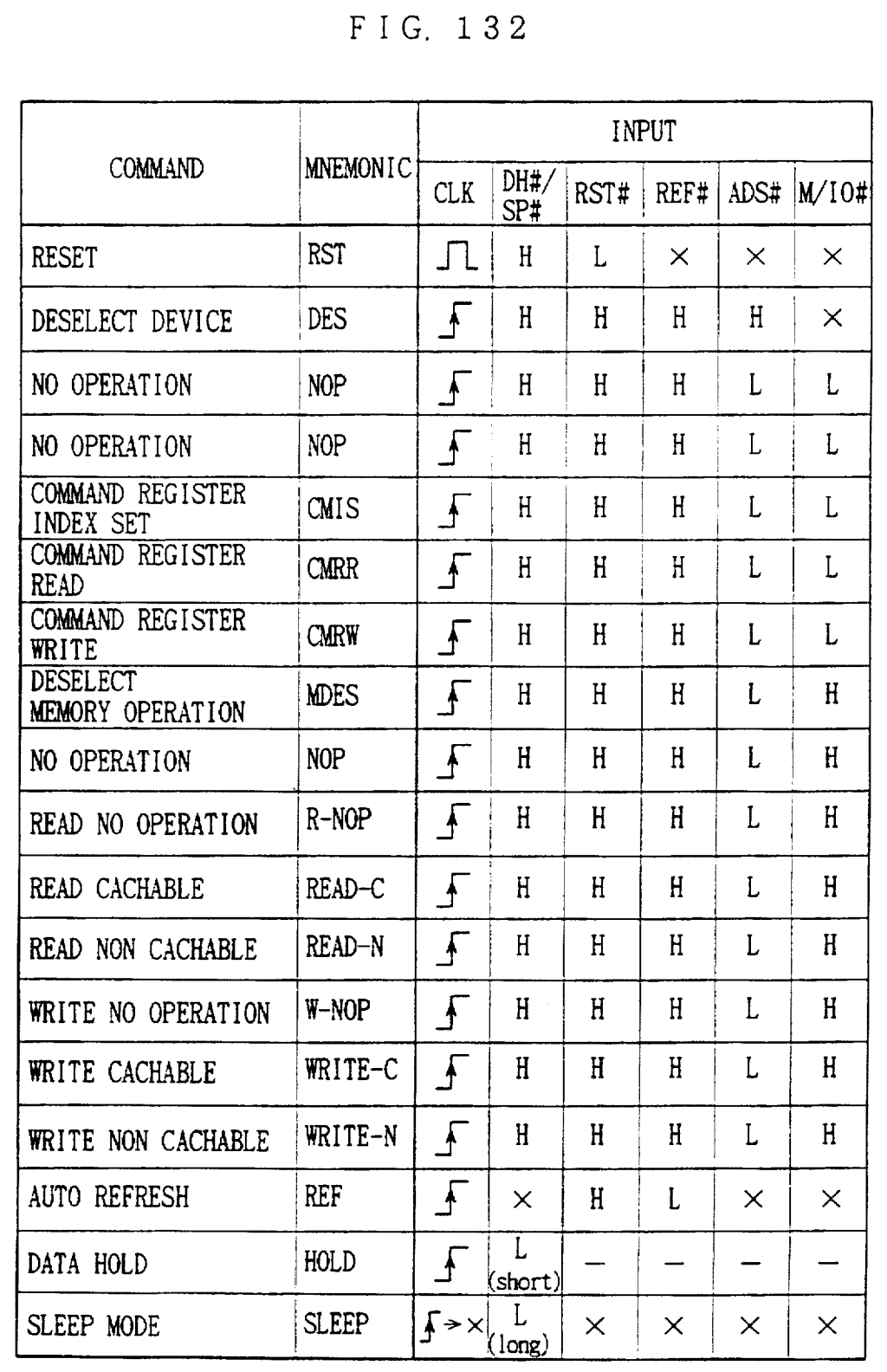

| COMMAND | MNEMONIC | INPUT | | | | | |
|---|---|---|---|---|---|---|---|
| | | CLK | DH#/SP# | RST# | REF# | ADS# | M/IO# |
| RESET | RST | ⎍ | H | L | × | × | × |
| DESELECT DEVICE | DES | ↑ | H | H | H | H | × |
| NO OPERATION | NOP | ↑ | H | H | H | L | L |
| NO OPERATION | NOP | ↑ | H | H | H | L | L |
| COMMAND REGISTER INDEX SET | CMIS | ↑ | H | H | H | L | L |
| COMMAND REGISTER READ | CMRR | ↑ | H | H | H | L | L |
| COMMAND REGISTER WRITE | CMRW | ↑ | H | H | H | L | L |
| DESELECT MEMORY OPERATION | MDES | ↑ | H | H | H | L | H |
| NO OPERATION | NOP | ↑ | H | H | H | L | H |
| READ NO OPERATION | R-NOP | ↑ | H | H | H | L | H |
| READ CACHABLE | READ-C | ↑ | H | H | H | L | H |
| READ NON CACHABLE | READ-N | ↑ | H | H | H | L | H |
| WRITE NO OPERATION | W-NOP | ↑ | H | H | H | L | H |
| WRITE CACHABLE | WRITE-C | ↑ | H | H | H | L | H |
| WRITE NON CACHABLE | WRITE-N | ↑ | H | H | H | L | H |
| AUTO REFRESH | REF | ↑ | × | H | L | × | × |
| DATA HOLD | HOLD | ↑ | L (short) | — | — | — | — |
| SLEEP MODE | SLEEP | ↑→× | L (long) | × | × | × | × |

FIG. 133

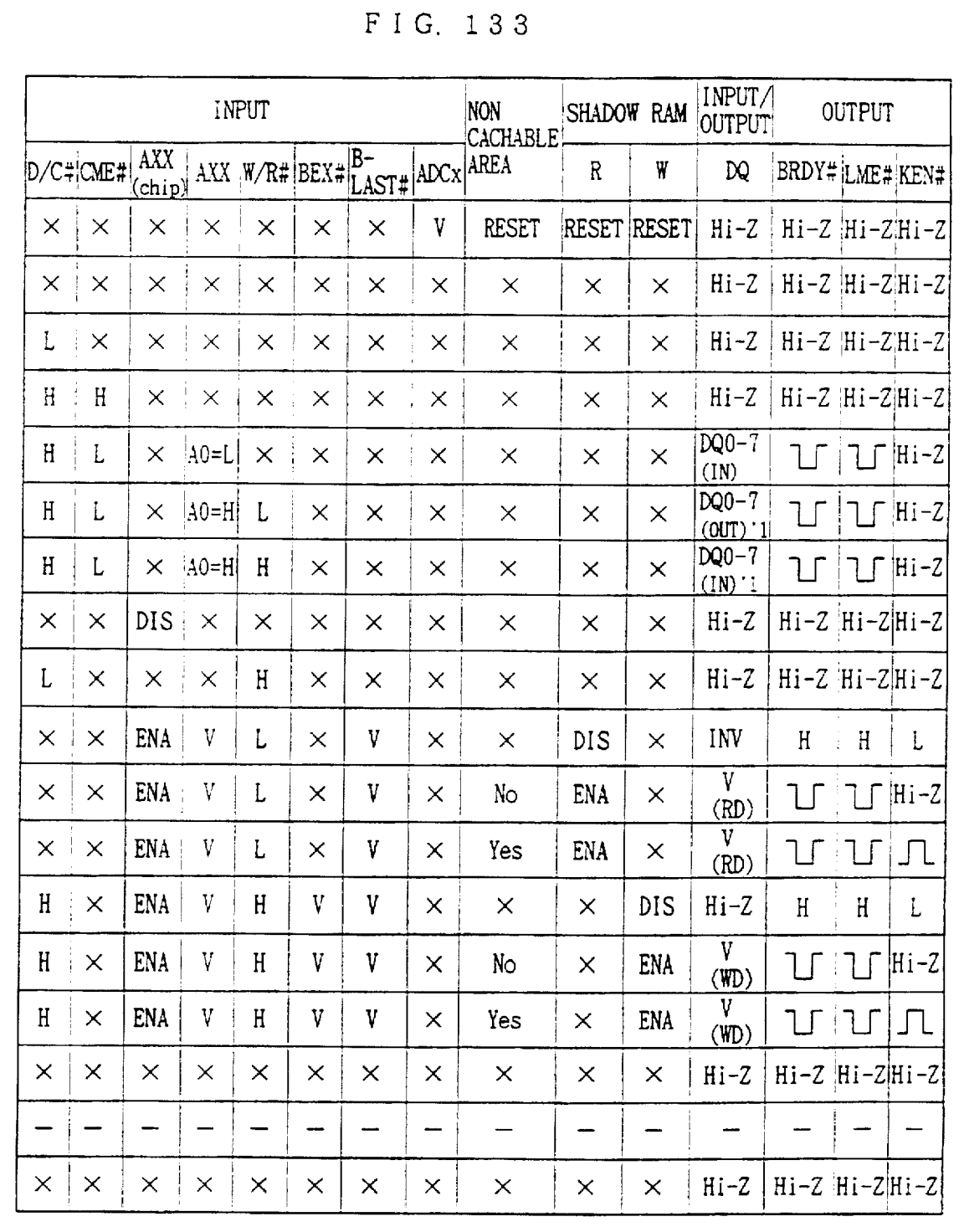

| INPUT | | | | | | | | NON CACHABLE AREA | SHADOW RAM | | INPUT/OUTPUT | OUTPUT | | |
|---|---|---|---|---|---|---|---|---|---|---|---|---|---|---|
| D/C# | CME# | AXX (chip) | AXX | W/R# | BEX# | B-LAST# | ADCx | | R | W | DQ | BRDY# | LME# | KEN# |
| × | × | × | × | × | × | × | V | RESET | RESET | RESET | Hi-Z | Hi-Z | Hi-Z | Hi-Z |
| × | × | × | × | × | × | × | × | × | × | × | Hi-Z | Hi-Z | Hi-Z | Hi-Z |
| L | × | × | × | × | × | × | × | × | × | × | Hi-Z | Hi-Z | Hi-Z | Hi-Z |
| H | H | × | × | × | × | × | × | × | × | × | Hi-Z | Hi-Z | Hi-Z | Hi-Z |
| H | L | × | A0=L | × | × | × | × | × | × | × | DQ0-7 (IN) | ⊔ | ⊔ | Hi-Z |
| H | L | × | A0=H | L | × | × | × | × | × | × | DQ0-7 (OUT)*1 | ⊔ | ⊔ | Hi-Z |
| H | L | × | A0=H | H | × | × | × | × | × | × | DQ0-7 (IN)*1 | ⊔ | ⊔ | Hi-Z |
| × | × | DIS | × | × | × | × | × | × | × | × | Hi-Z | Hi-Z | Hi-Z | Hi-Z |
| L | × | × | × | H | × | × | × | × | × | × | Hi-Z | Hi-Z | Hi-Z | Hi-Z |
| × | × | ENA | V | L | × | V | × | × | DIS | × | INV | H | H | L |
| × | × | ENA | V | L | × | V | × | No | ENA | × | V (RD) | ⊔ | ⊔ | Hi-Z |
| × | × | ENA | V | L | × | V | × | Yes | ENA | × | V (RD) | ⊔ | ⊔ | ⊓ |
| H | × | ENA | V | H | V | V | × | × | × | DIS | Hi-Z | H | H | L |
| H | × | ENA | V | H | V | V | × | No | × | ENA | V (WD) | ⊔ | ⊔ | Hi-Z |
| H | × | ENA | V | H | V | V | × | Yes | × | ENA | V (WD) | ⊔ | ⊔ | ⊓ |
| × | × | × | × | × | × | × | × | × | × | × | Hi-Z | Hi-Z | Hi-Z | Hi-Z |
| — | — | — | — | — | — | — | — | — | — | — | — | — | — | — |
| × | × | × | × | × | × | × | × | × | × | × | Hi-Z | Hi-Z | Hi-Z | Hi-Z |

READ (BURST/CACHABLE)

F I G. 1 3 5
READ (BURST/NON CACHABLE)
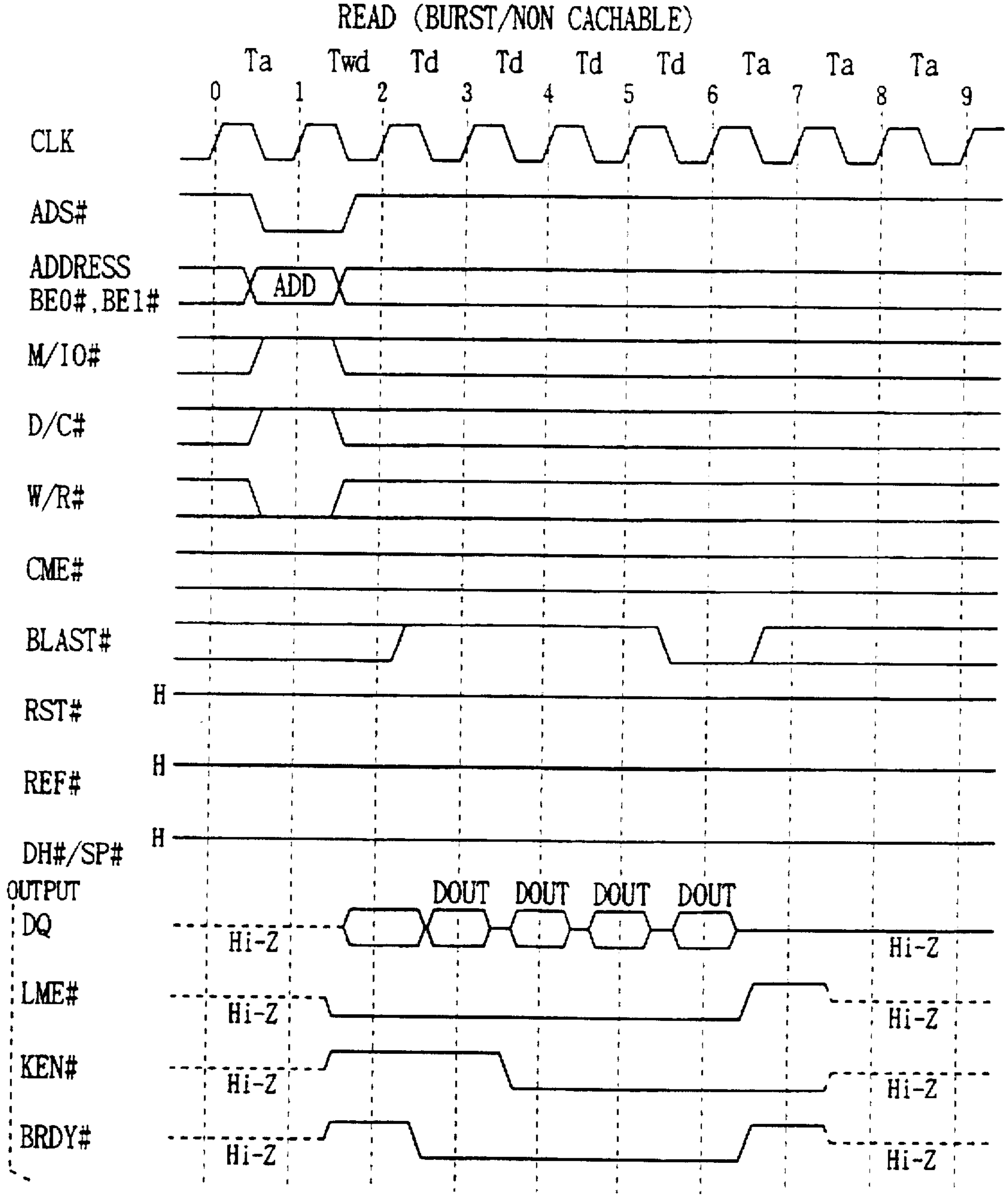

F I G. 1 3 6
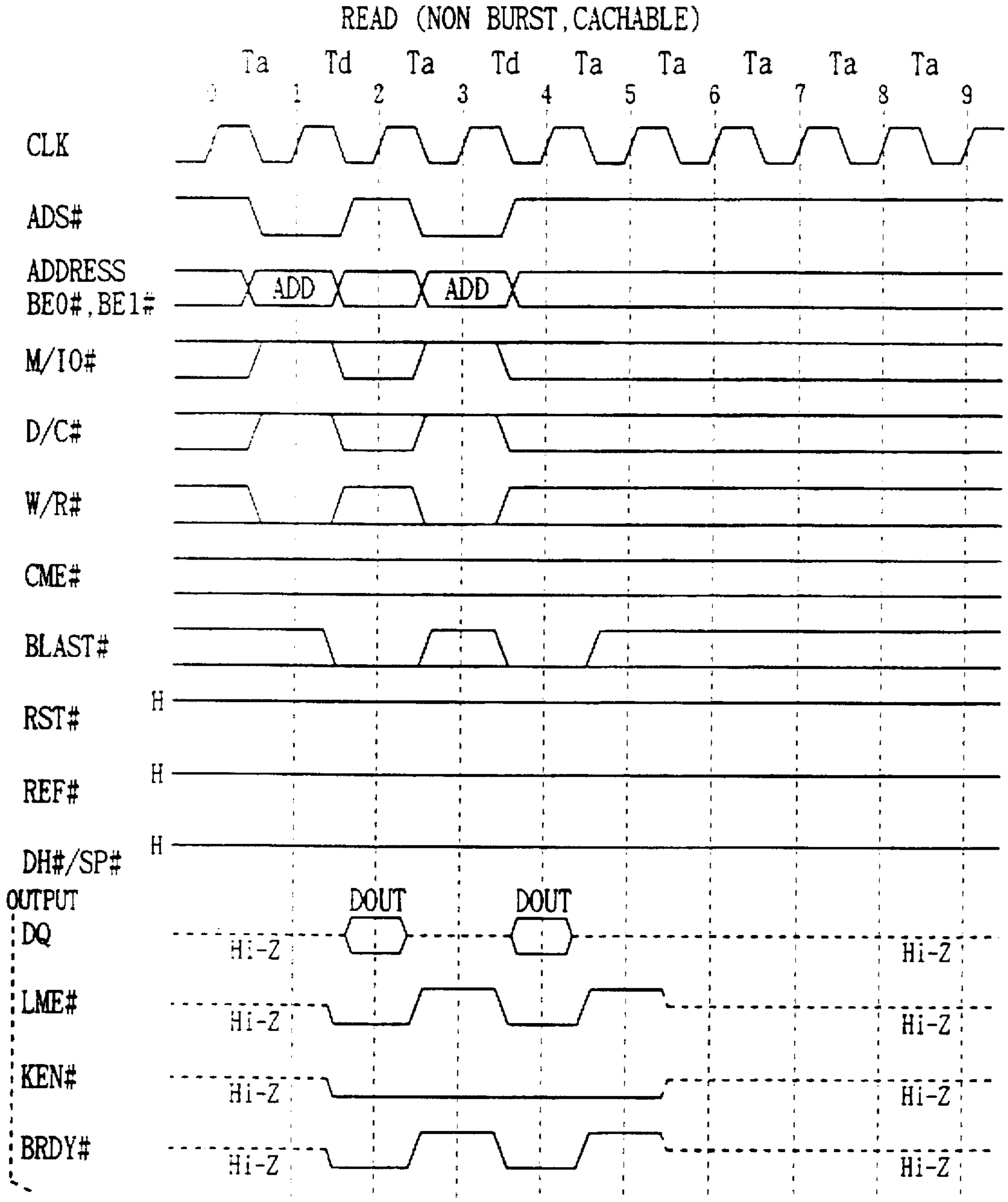

READ (NON BURST, CACHABLE, DATA HOLD)

READ (NON BURST, NON CACHABLE)

MISS READ (BURST, CACHABLE)

MISS READ (NON BURST,CACHABLE)

MISS READ (NON BURST, CACHABLE, HOLD)

WRITE (BURST)

WRITE (NON BURST)

MISS WRITE (BURST)

MISS WRITE (NON BURST)

F I G. 1 4 7
POWER ON
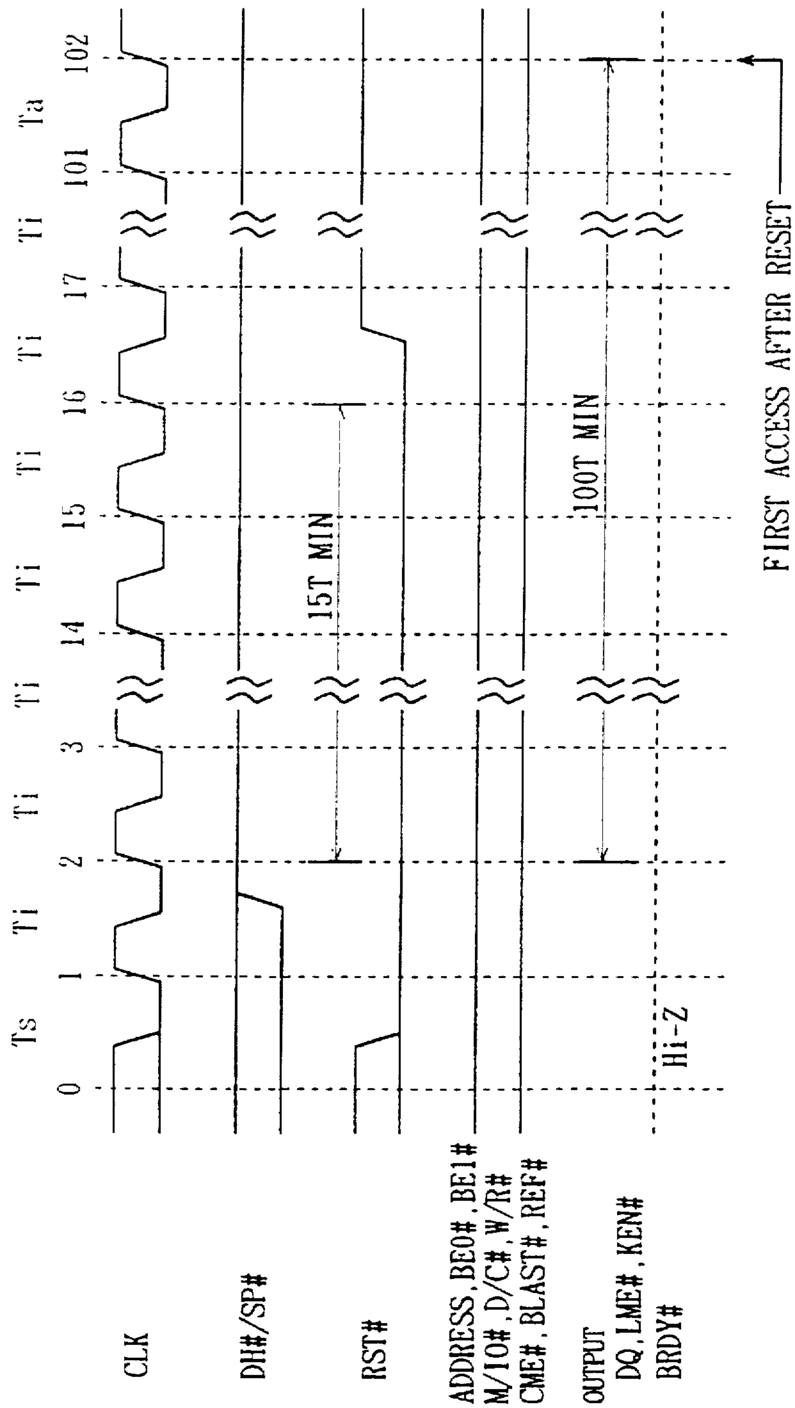

F I G. 1 4 8
CPU RESET (CDRAM IS NOT RESET)
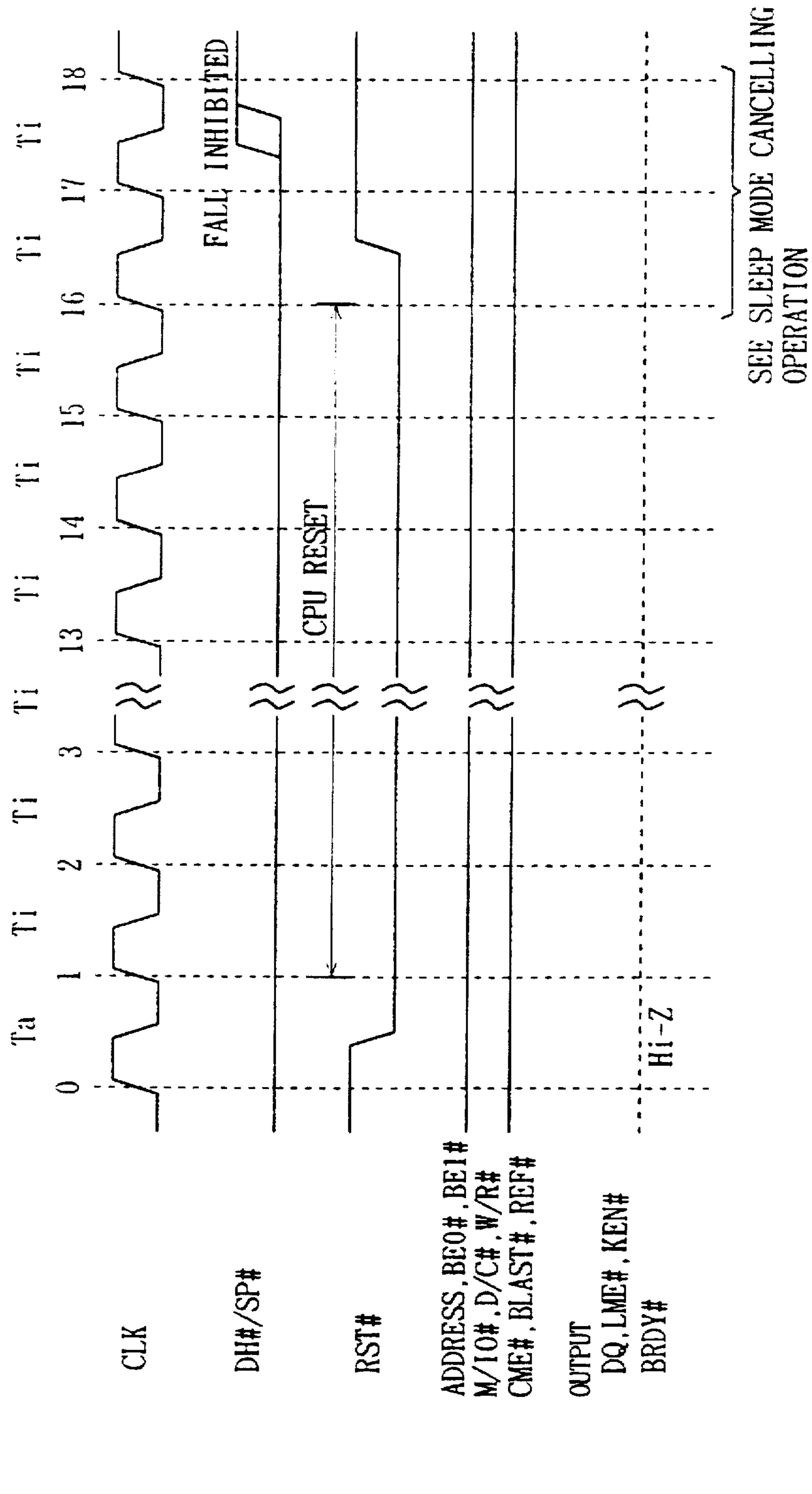

F I G. 1 4 9
SLEEP MODE (SET)
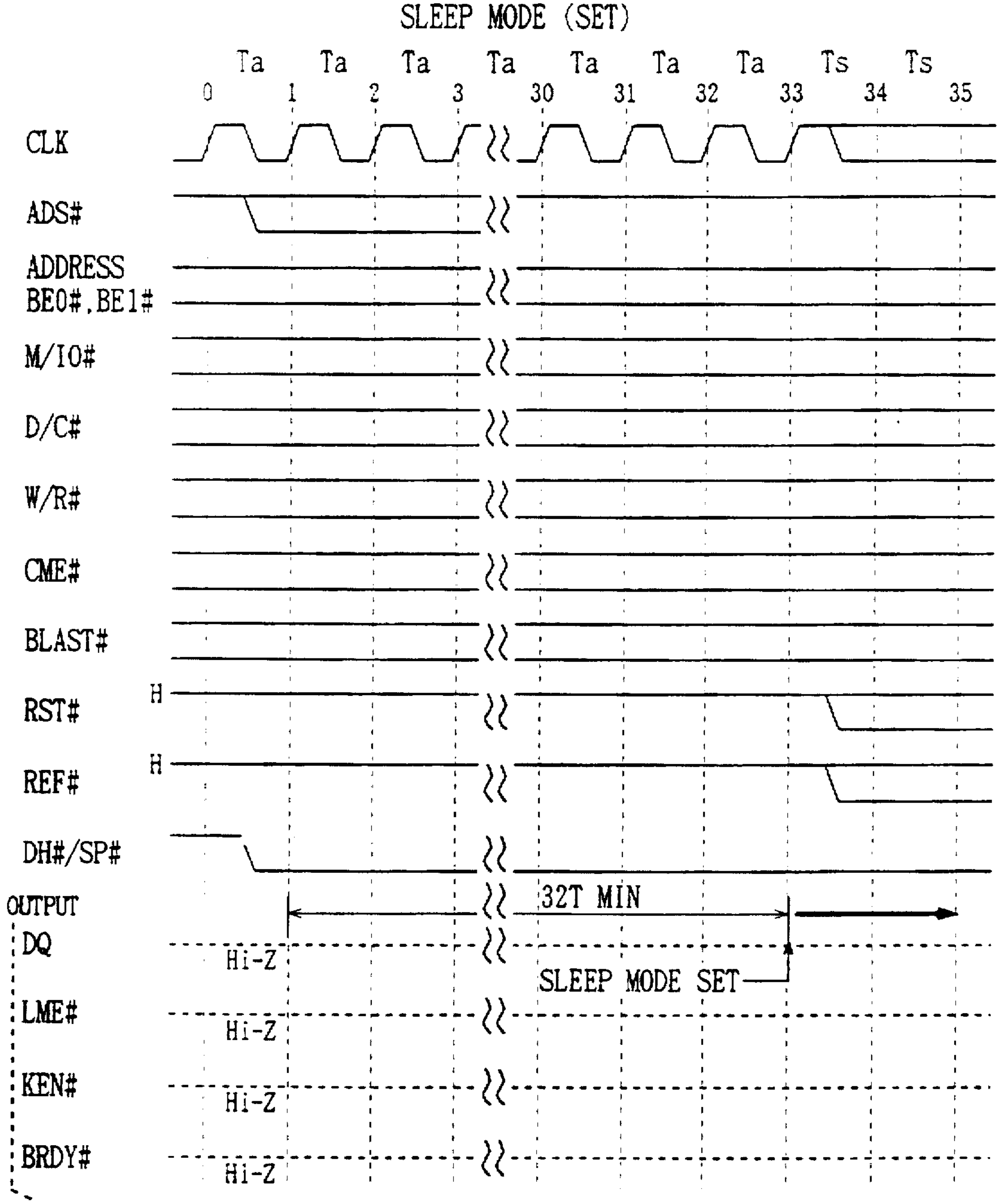

SLEEP MODE (CANCEL)

COMMAND REGISTER READ/WRITE

F I G. 1 5 3 A

TRUTH TABLE FOR READ/WRITE OF COMMAND REGISTERS

| M/IO# | D/C# | W/R# | CME# | A0 | OPERATION |
|---|---|---|---|---|---|
| 0 | 1 | × | 0 | 0 | SET COMMAND REGISTER INDEX (CMIS) |
| 0 | 1 | 0 | 0 | 1 | READ OF COMMAND REGISTER (CMRR) |
| 0 | 1 | 1 | 0 | 1 | WRITE TO COMMAND REGISTER (CMRW) |
| 0 | 1 | × | 1 | × | NO OPERATION |

×:Don't care("0" or "1")

F I G. 1 5 3 B

| FUNCTION | OPERATION COMMAND | OPERATION |
|---|---|---|
| WRITE TO COMMAND REGISTER | (1)SET COMMAND REGISTER INDEX (CMIS) | SELECT FROM COMMAND REGISTER INDEXES 00h-1Ch |
| | (2)WRITE TO COMMAND REGISTER (CMRW) | SET DATA DQ0-7 TO SELECTED INDEX |
| | … CONTINUE THE ABOVE OPERATIONS … | |
| READ OF COMMAND REGISTER | (1)SET COMMAND REGISTER INDEX (CMIS) | SELECT FROM COMMAND REGISTER INDEXES 00h-1Ch |
| | (2)READ OF COMMAND REGISTER (CMRR) | READ DATA OF SELECTED INDEX |
| | … CONTINUE THE ABOVE OPERATIONS … | |

F I G. 1 5 4

INDEX 00h

| BIT | FUNCTION | DEFAULT |
|---|---|---|
| 7 | CONTROL DIRECTION OF REF# PIN<br>0 :INPUT PIN<br>1 :OUTPUT PIN<br>WHEN THIS BIT IS "1",STATE OF REF# PIN IS CONTROLLED BY int.REF TIMER. | 0 |
| 6 | CACHE OPERATION AT HIT WRITE<br>0 :WRITE BACK<br>1 :RESERVED | 0 |
| 5 | CACHE OPERATION AT MISS WRITE<br>0 :NON ALLOCATE WRITE<br>1 :RESERVED | 0 |
| 4-3 | REFRESH INTERVAL<br>00 : 64ms(NORMAL) 10 :256ms<br>01 :128ms 11 :NOT DETERMINED | 00 |
| 2 | BUS SIZE(USED FOR DETERMINING COMMAND REGISTER ADDRESS AND SHADOW RAM ADDRESS)<br>0 :32 BIT BUS<br>1 :64 BIT BUS | 0 |
| 1-0 | NUMBER OF MEMORY BANKS<br>00 : 1<br>01 : 2<br>10 : 4<br>11 : RESERVED | 00 |

F I G. 1 5 5

INDEX 01h

| BIT | FUNCTION | DEFAULT |
|---|---|---|
| 7-5 | MASTER CLOCK FREQUENCY<br>000 :33MHz<br>001 :40MHz<br>010 :50MHz<br>011 :66MHz<br>1xx :NOT DETERMINED | 000 |
| 4-2 | WAIT CONTROL(0: NO WAIT 1: 1 WAIT)<br>BIT 4 :READ CYCLE<br>BIT 3 :WRITE CYCLE<br>BIT 2 :BURST CYCLE | 000 |
| 1-0 | BURST LENGTH 1 TYPE<br><BURST LENGTH> <BURST TYPE><br>00 : 4 INTERLEAVE<br>01 : 4 SEQUENTIAL<br>10 : NOT DETERMINED<br>11 : NOT DETERMINED | 00 |

FIG. 156

INDEX 02-03h (NON CACHABLE AREA 0)

| INDEX | BIT | FUNCTION | CDRAM ADDRESS | | DEFAULT |
|---|---|---|---|---|---|
| | | | BUS SIZE 32 | BUS SIZE 64 | |
| 02h | 7 | CPU ADDRESS AREA (0C0000-0C7FFFh)<br>0 :NON CACHABLE<br>1 :CACHABLE | A21-18=A11"0"<br>A17-13=11000<br>A12- 0=× | A21-17=A11"0"<br>A16-12=11000<br>A11- 0=× | 0 |
| 02h | 6-4 | SIZE OF NON CACHABLE MEMORY BLOCK<br>000 :DISABLE<br>100 : 64kB<br>101 :128kB(NEGLECT BIT 0 OF INDEX 3h)<br>110 :256kB(NEGLECT BITS 0,1 OF INDEX 3h)<br>111 :512kB(NEGLECT BITS 0-2 OF INDEX 3h)<br>OTHERS :NOT DETERMINED | ——— | ——— | 000 |
| 02h | 3-0 | START ADDRESS OF NON CACHABLE MEMORY BLOCK | Don't care | BIT 3-1 :×<br>BIT 0 :A21 | 0000 |
| 03h | 7-0 | | A21-14 | A20-13 | A11"0" |

× :Don't care

FIG. 157

INDEX 04-05h (NON CACHABLE AREA 1)

| INDEX | BIT | FUNCTION | CDRAM ADDRESS | | DEFAULT |
|---|---|---|---|---|---|
| | | | BUS SIZE 32 | BUS SIZE 64 | |
| 04h | 7 | NOT DETERMINED<br>SET TO "0" | ——— | ——— | 0 |
| 04h | 6-4 | SIZE OF NON CACHABLE MEMORY BLOCK<br>000 :DISABLE<br>100 : 64kB<br>101 :128kB(NEGLECT BIT 0 OF INDEX 5h)<br>110 :256kB(NEGLECT BITS 0,1 OF INDEX 5h)<br>111 :512kB(NEGLECT BITS 0-2 OF INDEX 5h)<br>OTHERS :NOT DETERMINED | ——— | ——— | 000 |
| 04h | 3-0 | START ADDRESS OF NON CACHABLE MEMORY BLOCK | Don't care | BIT 3-1 :×<br>BIT 0 :A21 | 0000 |
| 05h | 7-0 | START ADDRESS OF NON CACHABLE MEMORY BLOCK | A21-14 | A20-13 | All"0" |

× :Don't care

F I G. 158

06h-07h (TEST MODE)

| INDEX | BIT | FUNCTION | DEFAULT |
|---|---|---|---|
| 06h | 7-2 | NOT DETERMINED<br>SET TO "0" | All"0" |
| | 1 | REFRESH COUNTER TEST<br>0 :DISABLE<br>1 :ENABLE | 0 |
| | 0 | ALL ADDRESS AREA MADE NON-CACHE (BYPASS SRAM CACHE)<br>0 :DISABLE<br>1 :ENABLE | 0 |
| 07h | 7-0 | NOT DETERMINED<br>SET TO "0" | All"0" |

FIG. 159

INDEX 10h-16h (SHADOW RAM CONTROL)

| COMMAND REGISER INDEX | BIT | | CDRAM ADDRESS(Axx)AREA | | | | | | | | | | BUS SIZE | CPU ADDRESS AREA |
|---|---|---|---|---|---|---|---|---|---|---|---|---|---|---|
| | | | 21-18 | 17 | 16 | 15 | 14 | 13 | 12 | 11 | 10 | 9-0 | 32 BITS | |
| | R | W | 21-17 | 16 | 15 | 14 | 13 | 12 | 11 | 10 | 9 | 8-0 | 64 BITS | |
| 10h | 7 | 6 | All"0" | 1 | 1 | 0 | 0 | 0 | 0 | 0 | 0 | × | | 0C0000-0C0FFFh |
| | 5 | 4 | All"0" | 1 | 1 | 0 | 0 | 0 | 0 | 0 | 1 | × | | 0C1000-0C1FFFh |
| | 3 | 2 | All"0" | 1 | 1 | 0 | 0 | 0 | 0 | 1 | 0 | × | | 0C2000-0C2FFFh |
| | 1 | 0 | All"0" | 1 | 1 | 0 | 0 | 0 | 0 | 1 | 1 | × | | 0C3000-0C3FFFh |
| 11h | 7 | 6 | All"0" | 1 | 1 | 0 | 0 | 0 | 1 | 0 | 0 | × | | 0C4000-0C4FFFh |
| | 5 | 4 | All"0" | 1 | 1 | 0 | 0 | 0 | 1 | 0 | 1 | × | | 0C5000-0C5FFFh |
| | 3 | 2 | All"0" | 1 | 1 | 0 | 0 | 0 | 1 | 1 | 0 | × | | 0C6000-0C6FFFh |
| | 1 | 0 | All"0" | 1 | 1 | 0 | 0 | 0 | 1 | 1 | 1 | × | | 0C7000-0C7FFFh |
| 12h | 7 | 6 | All"0" | 1 | 1 | 0 | 0 | 1 | 0 | 0 | 0 | × | | 0C8000-0C8FFFh |
| | 5 | 4 | All"0" | 1 | 1 | 0 | 0 | 1 | 0 | 0 | 1 | × | | 0C9000-0C9FFFh |
| | 3 | 2 | All"0" | 1 | 1 | 0 | 0 | 1 | 0 | 1 | 0 | × | | 0CA000-0CAFFFh |
| | 1 | 0 | All"0" | 1 | 1 | 0 | 0 | 1 | 0 | 1 | 1 | × | | 0CB000-0CBFFFh |
| 13h | 7 | 6 | All"0" | 1 | 1 | 0 | 0 | 1 | 1 | 0 | 0 | × | | 0CC000-0CCFFFh |
| | 5 | 4 | All"0" | 1 | 1 | 0 | 0 | 1 | 1 | 0 | 1 | × | | 0CD000-0CDFFFh |
| | 3 | 2 | All"0" | 1 | 1 | 0 | 0 | 1 | 1 | 1 | 0 | × | | 0CE000-0CEFFFh |
| | 1 | 0 | All"0" | 1 | 1 | 0 | 0 | 1 | 1 | 1 | 1 | × | | 0CF000-0CFFFFh |
| 14h | 7 | 6 | All"0" | 1 | 1 | 0 | 1 | 0 | 0 | 0 | 0 | × | | 0D0000-0D0FFFh |
| | 5 | 4 | All"0" | 1 | 1 | 0 | 1 | 0 | 0 | 0 | 1 | × | | 0D1000-0D1FFFh |
| | 3 | 2 | All"0" | 1 | 1 | 0 | 1 | 0 | 0 | 1 | 0 | × | | 0D2000-0D2FFFh |
| | 1 | 0 | All"0" | 1 | 1 | 0 | 1 | 0 | 0 | 1 | 1 | × | | 0D3000-0D3FFFh |
| 15h | 7 | 6 | All"0" | 1 | 1 | 0 | 1 | 0 | 1 | 0 | 0 | × | | 0D4000-0D4FFFh |
| | 5 | 4 | All"0" | 1 | 1 | 0 | 1 | 0 | 1 | 0 | 1 | × | | 0D5000-0D5FFFh |
| | 3 | 2 | All"0" | 1 | 1 | 0 | 1 | 0 | 1 | 1 | 0 | × | | 0D6000-0D6FFFh |
| | 1 | 0 | All"0" | 1 | 1 | 0 | 1 | 0 | 1 | 1 | 1 | × | | 0D7000-0D7FFFh |
| 16h | 7 | 6 | All"0" | 1 | 1 | 0 | 1 | 1 | 0 | 0 | 0 | × | | 0D8000-0D8FFFh |
| | 5 | 4 | All"0" | 1 | 1 | 0 | 1 | 1 | 0 | 0 | 1 | × | | 0D9000-0D9FFFh |
| | 3 | 2 | All"0" | 1 | 1 | 0 | 1 | 1 | 0 | 1 | 0 | × | | 0DA000-0DAFFFh |
| | 1 | 0 | All"0" | 1 | 1 | 0 | 1 | 1 | 0 | 1 | 1 | × | | 0DB000-0DBFFFh |

F I G. 1 6 0

INDEX 17h-1Ch (SHADOW RAM CONTROL)

| COMMAND REGISER INDEX | BIT | | CDRAM ADDRESS(Axx)AREA | | | | | | | | | BUS SIZE | CPU ADDRESS AREA |
|---|---|---|---|---|---|---|---|---|---|---|---|---|---|
| | | | 21-18 | 17 | 16 | 15 | 14 | 13 | 12 | 11 | 10 | 9-0 | 32 BITS |
| | R | W | 21-17 | 16 | 15 | 14 | 13 | 12 | 11 | 10 | 9 | 8-0 | 64 BITS |
| 17h | 7 | 6 | All"0" | 1 | 1 | 0 | 1 | 1 | 1 | 0 | 0 | × | 0DC000-0DCFFFh |
| | 5 | 4 | All"0" | 1 | 1 | 0 | 1 | 1 | 1 | 0 | 1 | × | 0DD000-0DDFFFh |
| | 3 | 2 | All"0" | 1 | 1 | 0 | 1 | 1 | 1 | 1 | 0 | × | 0DE000-0DEFFFh |
| | 1 | 0 | All"0" | 1 | 1 | 0 | 1 | 1 | 1 | 1 | 1 | × | 0DF000-0DFFFFh |
| 18h | 7 | 6 | All"0" | 1 | 1 | 1 | 0 | 0 | 0 | 0 | 0 | × | 0E0000-0E0FFFh |
| | 5 | 4 | All"0" | 1 | 1 | 1 | 0 | 0 | 0 | 0 | 1 | × | 0E1000-0E1FFFh |
| | 3 | 2 | All"0" | 1 | 1 | 1 | 0 | 0 | 0 | 1 | 0 | × | 0E2000-0E2FFFh |
| | 1 | 0 | All"0" | 1 | 1 | 1 | 0 | 0 | 0 | 1 | 1 | × | 0E3000-0E3FFFh |
| 19h | 7 | 6 | All"0" | 1 | 1 | 1 | 0 | 0 | 1 | 0 | 0 | × | 0E4000-0E4FFFh |
| | 5 | 4 | All"0" | 1 | 1 | 1 | 0 | 0 | 1 | 0 | 1 | × | 0E5000-0E5FFFh |
| | 3 | 2 | All"0" | 1 | 1 | 1 | 0 | 0 | 1 | 1 | 0 | × | 0E6000-0E6FFFh |
| | 1 | 0 | All"0" | 1 | 1 | 1 | 0 | 0 | 1 | 1 | 1 | × | 0E7000-0E7FFFh |
| 1Ah | 7 | 6 | All"0" | 1 | 1 | 1 | 0 | 1 | 0 | 0 | 0 | × | 0E8000-0E8FFFh |
| | 5 | 4 | All"0" | 1 | 1 | 1 | 0 | 1 | 0 | 0 | 1 | × | 0E9000-0E9FFFh |
| | 3 | 2 | All"0" | 1 | 1 | 1 | 0 | 1 | 0 | 1 | 0 | × | 0EA000-0EAFFFh |
| | 1 | 0 | All"0" | 1 | 1 | 1 | 0 | 1 | 0 | 1 | 1 | × | 0EB000-0EBFFFh |
| 1Bh | 7 | 6 | All"0" | 1 | 1 | 1 | 1 | 1 | 1 | 0 | 0 | × | 0EC000-0ECFFFh |
| | 5 | 4 | All"0" | 1 | 1 | 1 | 1 | 1 | 1 | 0 | 1 | × | 0ED000-0EDFFFh |
| | 3 | 2 | All"0" | 1 | 1 | 1 | 1 | 1 | 1 | 1 | 0 | × | 0EE000-0D3EEFh |
| | 1 | 0 | All"0" | 1 | 1 | 1 | 1 | 1 | 1 | 1 | 1 | × | 0EF000-0EFFFFh |
| 1Ch | 7 | 6 | All"0" | 1 | 0 | 1 | 0 | × | × | × | × | × | 0A0000-0AFFFFh |
| | 5 | 4 | All"0" | 1 | 0 | 1 | 1 | × | × | × | × | × | 0B0000-0BFFFFh |
| | 3 | 2 | All"0" | 1 | 1 | 1 | 1 | × | × | × | × | × | 0F0000-0FFFFFh |
| | 1 | 0 | | | | | | | | | | | |

MOST SIGNIFICANT 3BITS:"Don't Care". (DQ7-5)

| BIT | | FUNCTION | |
|---|---|---|---|
| R | W | READ | WRITE |
| 0 | 0 | DISABLE | DISABLE |
| 0 | 1 | DISABLE | ENABLE |
| 1 | 0 | ENABLE | DISABLE |
| 1 | 1 | ENABLE | ENABLE |

- ×:Don't care
- DEFAULT VALUES OF SHADOW RAM ARE ALL"0"

FIG. 161

READ/WRITE LATENCY

| | | | FREQUENCY COMMAND | | | |
|---|---|---|---|---|---|---|
| | | | 66MHz | 50MHz | 40MHz | 33MHz |
| HIT READ | | | 2-1-1-1 | 2-1-1-1 | 2-1-1-1 | 2-1-1-1 |
| MISS READ | NON DIRTY | PAGE HIT | 5-1-1-1 | 4-1-1-1 | 4-1-1-1 | 4-1-1-1 |
| | | PAGE MISS | 10-1-1-1 | 8-1-1-1 | 8-1-1-1 | 7-1-1-1 |
| | DIRTY | PAGE HIT | 5-1-1-1 | 4-1-1-1 | 4-1-1-1 | 4-1-1-1 |
| | | | (14) | (9) | (8) | (8) |
| | | PAGE MISS | 10-1-1-1 | 8-1-1-1 | 8-1-1-1 | 7-1-1-1 |
| | | | (19) | (14) | (11) | (11) |
| HIT WRITE | | | 2 | 2 | 2 | 2 |
| MISS WRITE (NON ALLOCATE WRITE) | NON DIRTY | PAGE HIT | 2 | 2 | 2 | 2 |
| | | PAGE MISS | 2 | 2 | 2 | 2 |
| | | | (8) | (6) | (5) | (5) |

F I G. 1 6 4
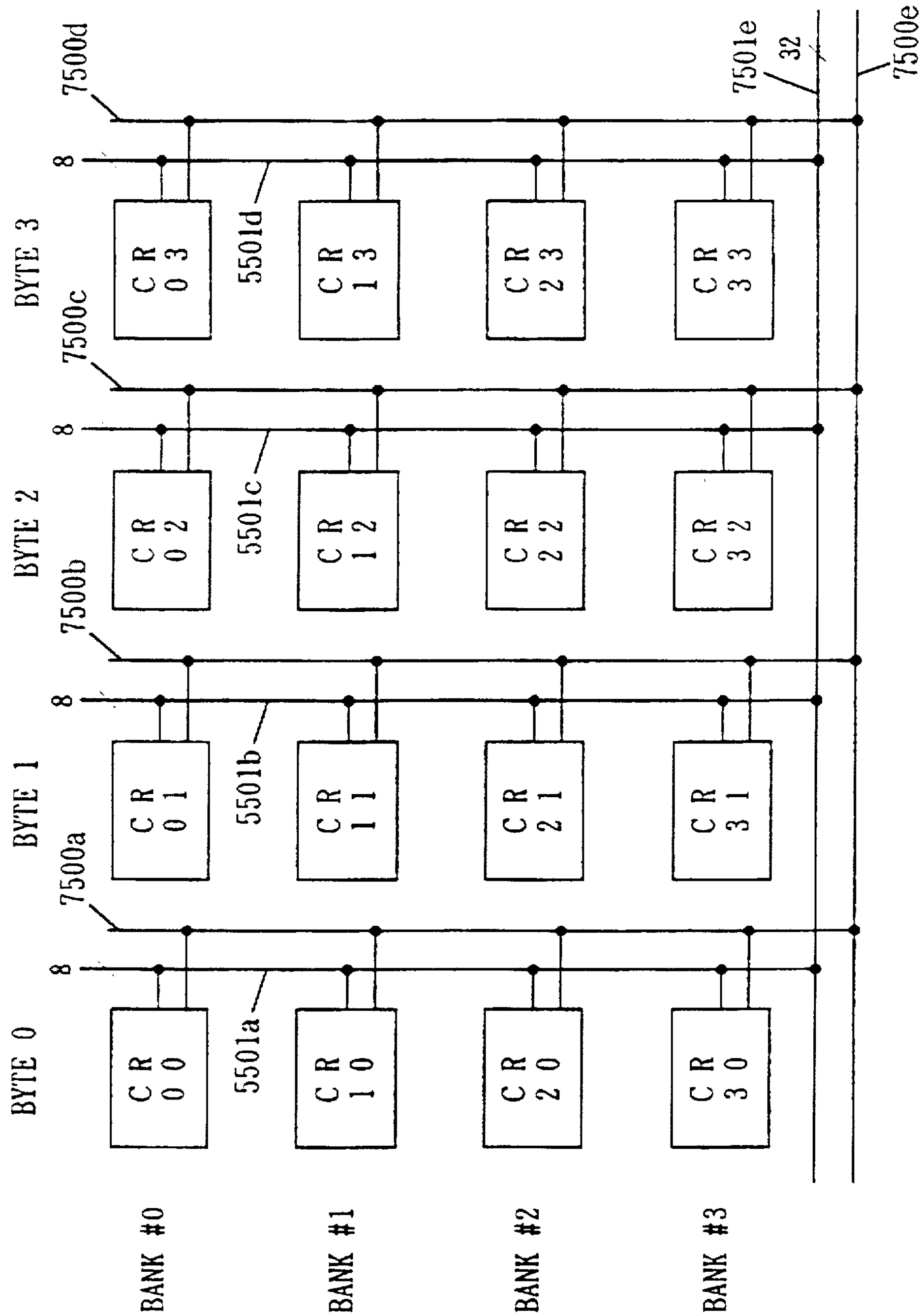

F I G. 1 6 8
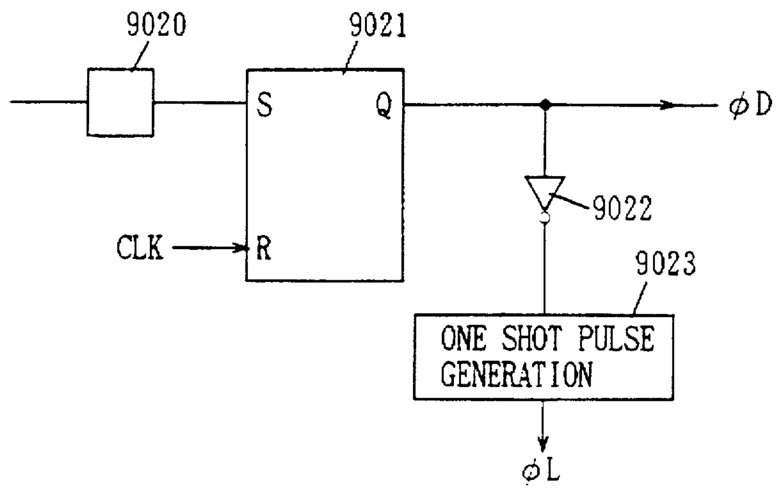
F I G. 1 6 9
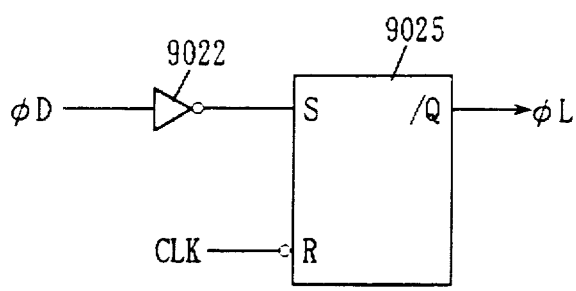
F I G. 1 7 0
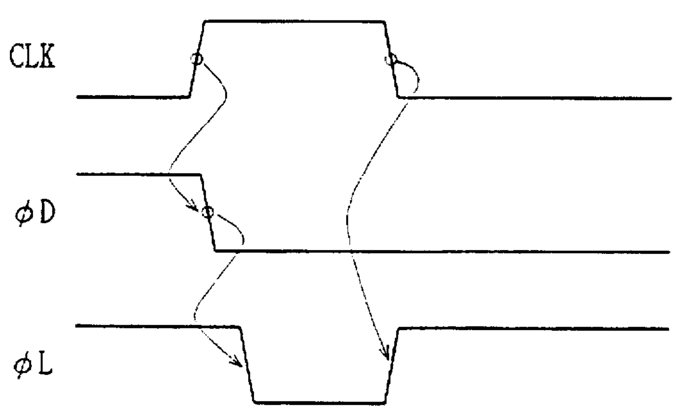

F I G. 1 7 7
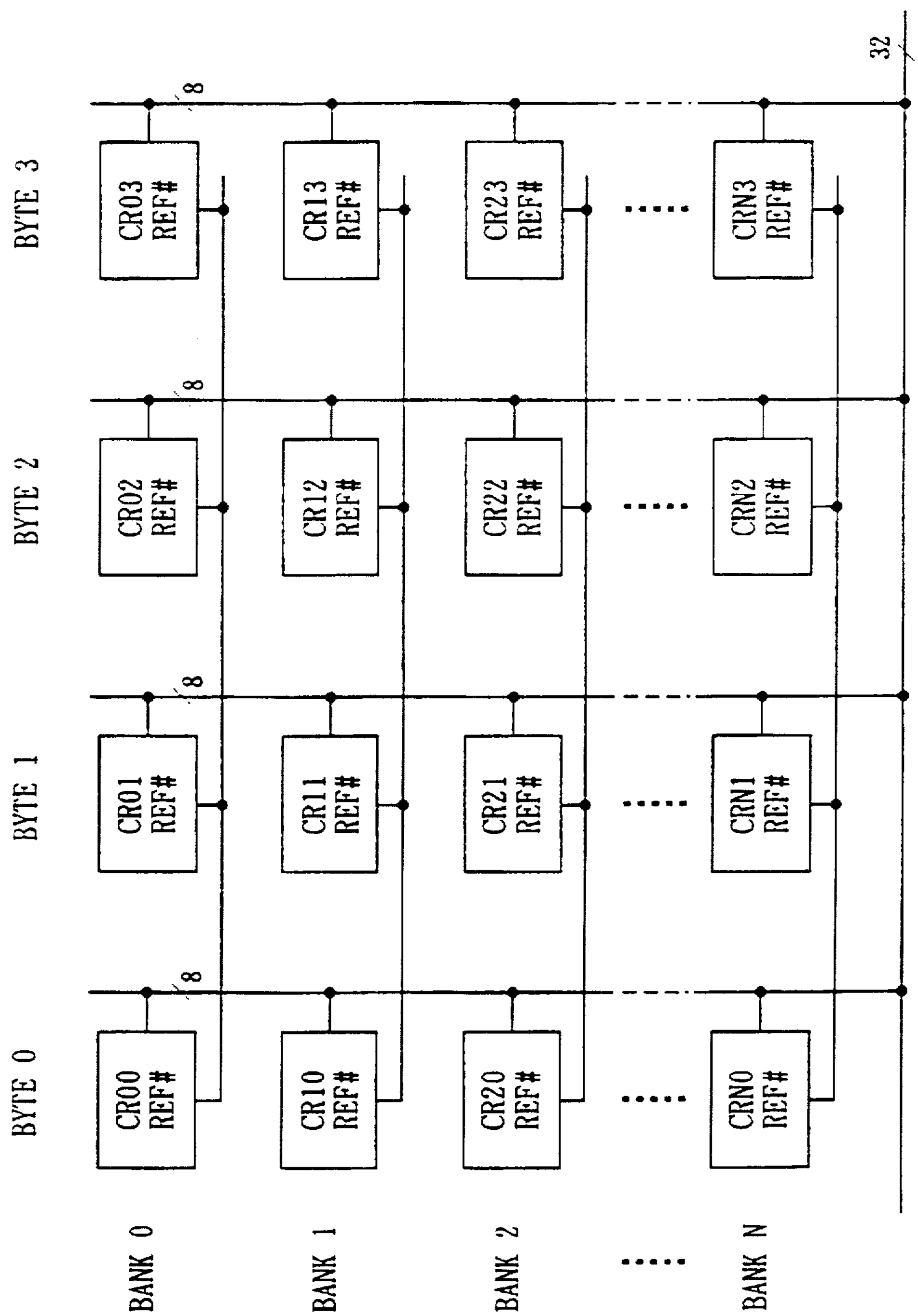

F I G. 1 8 1
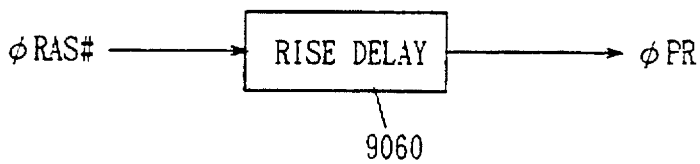
F I G. 1 8 2
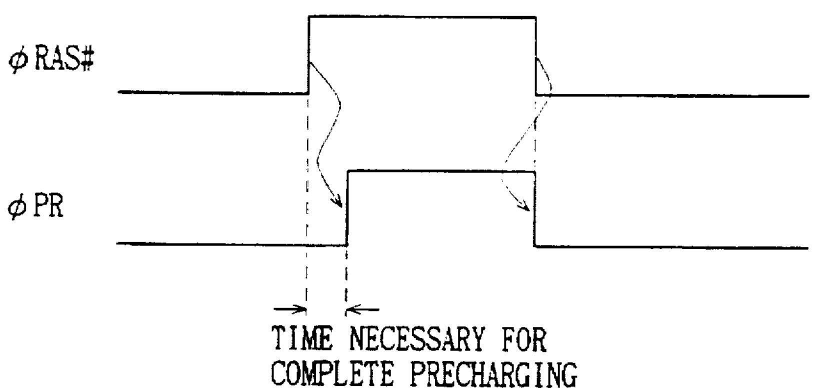
F I G. 1 8 3
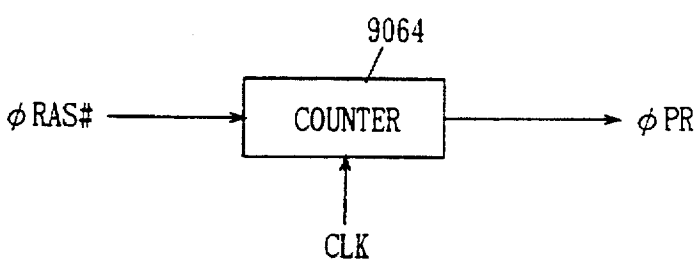

F I G. 188
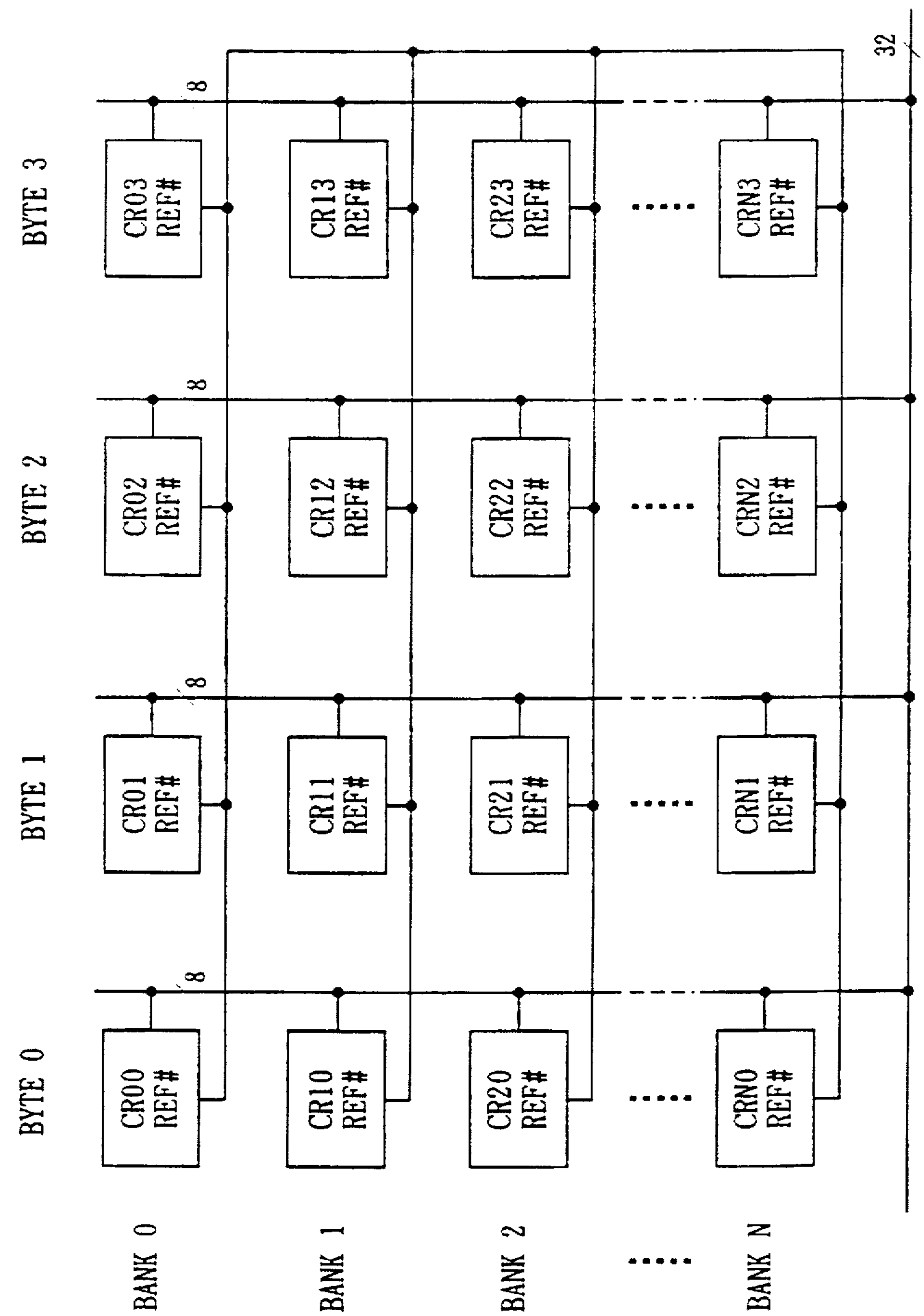

DRAM : DNOP
SRAM : BRTR (TRANSFER TO A1)

DRAM : DRT2
SRAM : * (COMMANDS EXCEPT BWT, BWTW)

DRAM : DNOP
SRAM : *

DRAM : DNOP
SRAM : BRT (TRANSFER TO A2)

F I G. 1 9 5
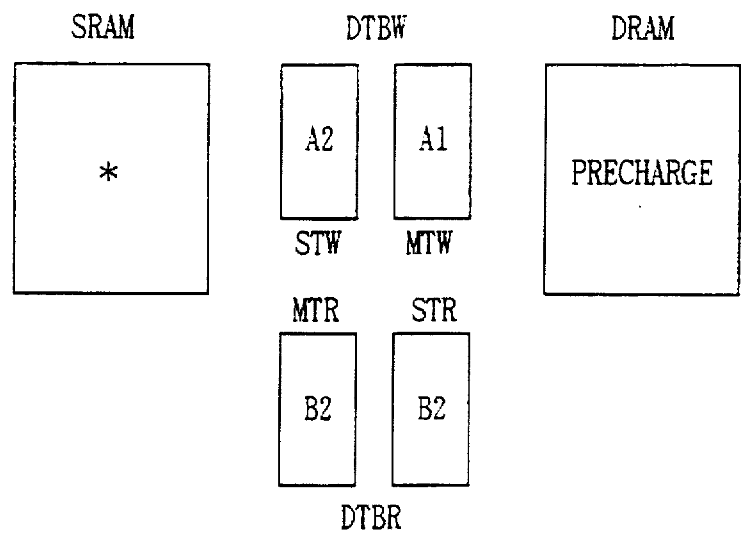
DRAM : PCG
SRAM : *
F I G. 1 9 6
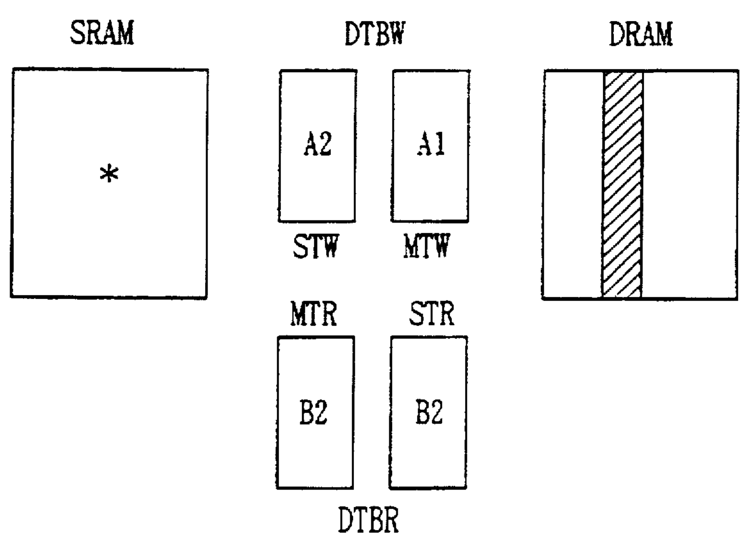
DRAM : ACT
SRAM : *

DRAM : DWT1
SRAM : *

DRAM : DNOP → PCG
SRAM : Don't Care

F I G. 2 0 1
MISS READ (DIRTY BIT ON), MISS WRITE (66MHz)
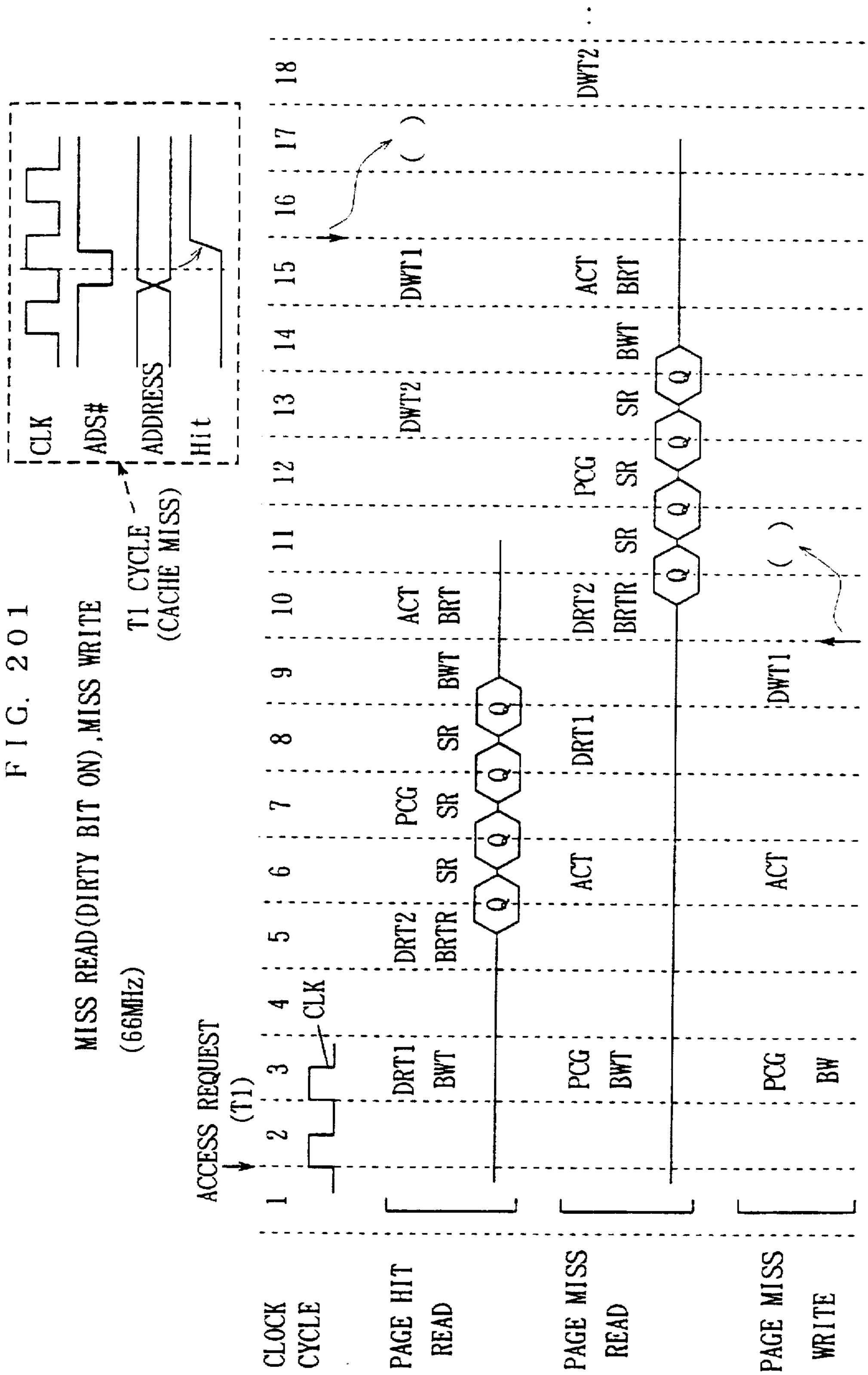

F I G. 2 0 2
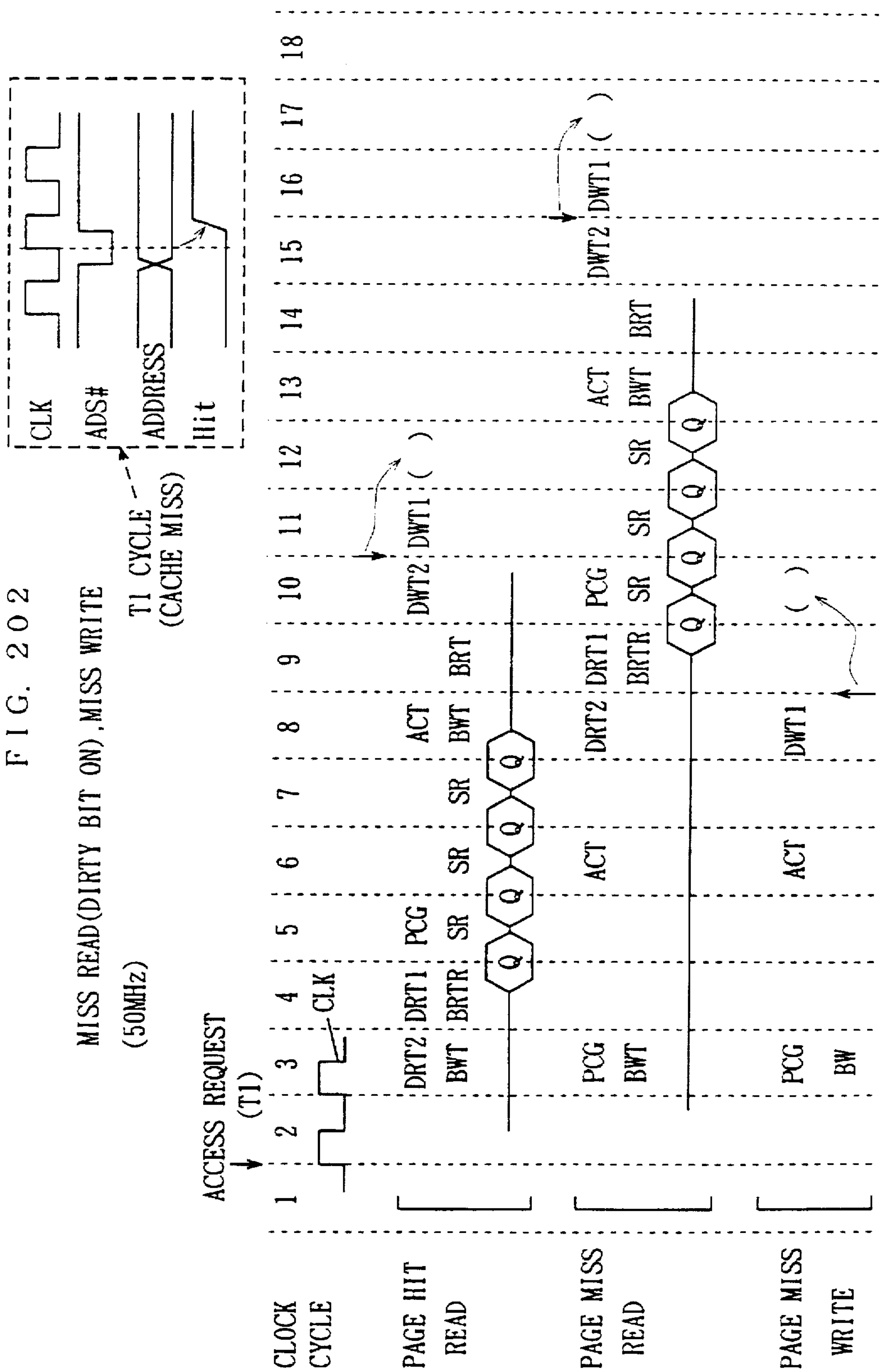

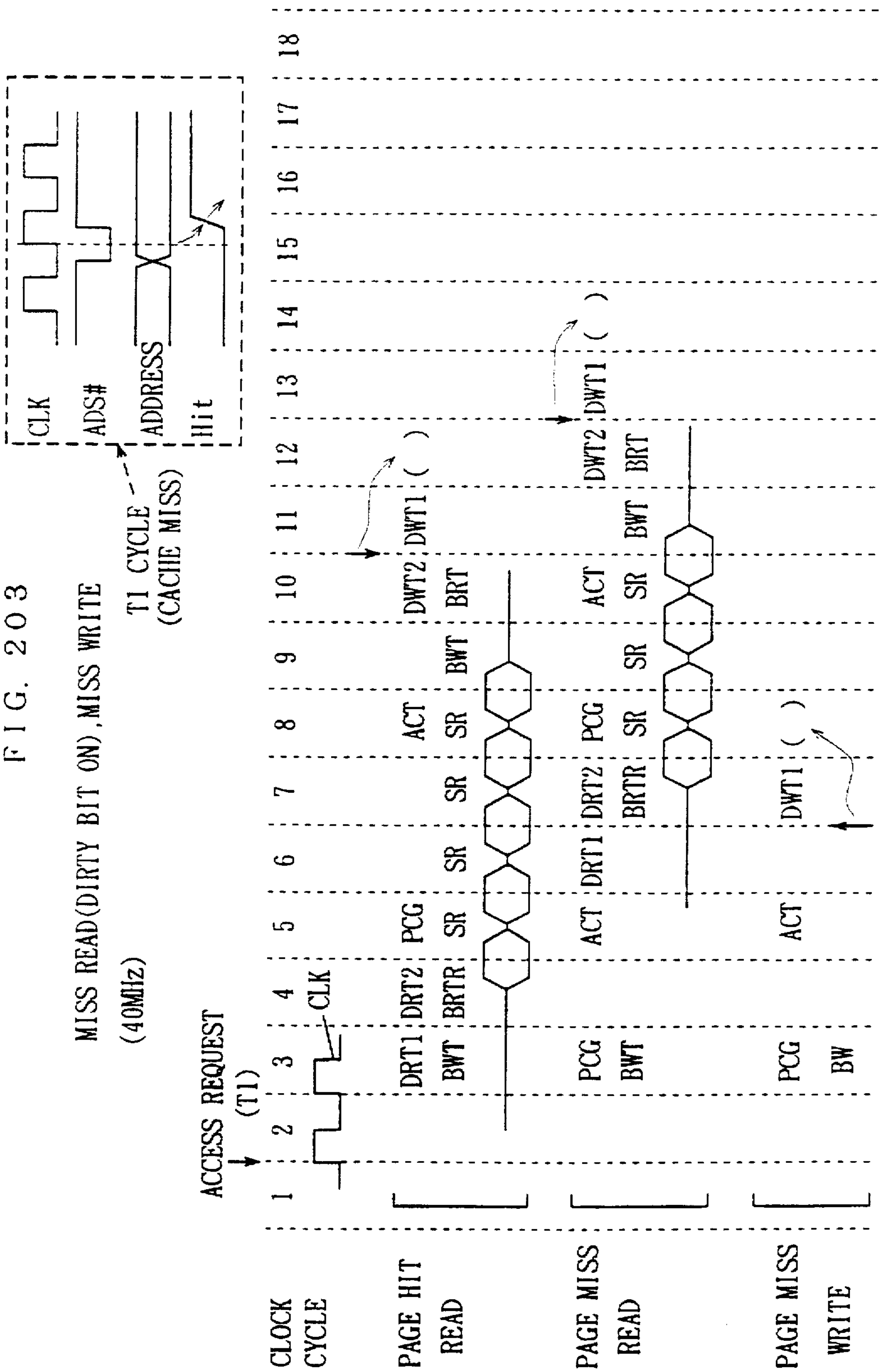
F I G. 2 0 3
MISS READ (DIRTY BIT ON), MISS WRITE (40MHz)

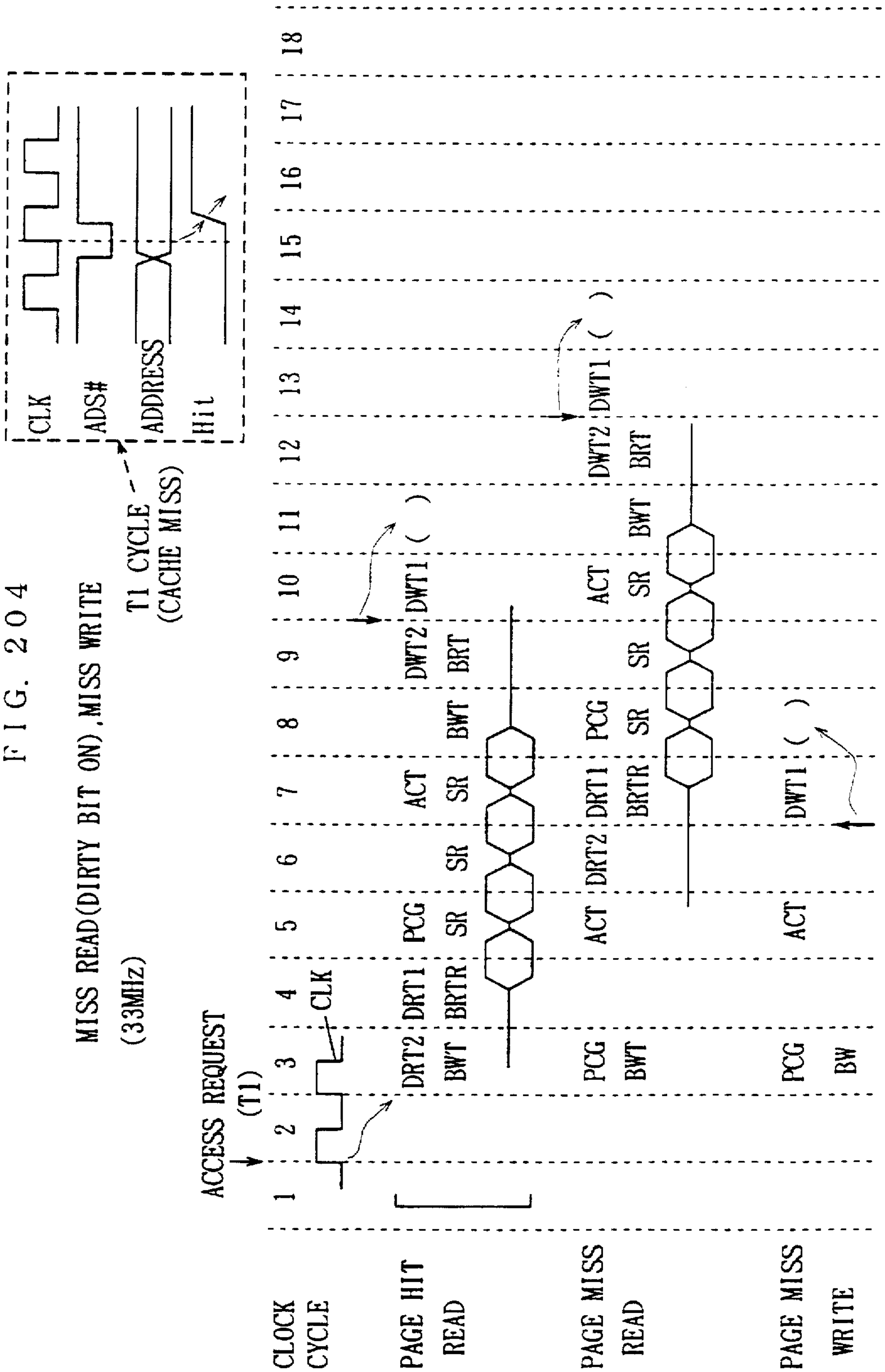
F I G. 2 0 4
MISS READ(DIRTY BIT ON), MISS WRITE
(33MHz)

| RAS# | CAS# | DTD# | FUNCTION |
|---|---|---|---|
| H | H | H | DNOP |
| H | L | H | DRT1 |
| H | H | L | DRT2 |

CMd# = "H"

BURST READ (3-1-1-1)

BURST READ (3-1-1-1)

SDRAM

CDRAM

SEMICONDUCTOR MEMORY DEVICE INCLUDING DYNAMIC TYPE MEMORY AND STATIC TYPE MEMORY FORMED ON THE COMMON CHIP AND AN OPERATING METHOD THEREOF

BACKGROUND OF THE INVENTION

1. Field of the Invention

The present invention relates to a semiconductor memory device, and more specifically, to a semiconductor memory device having a main memory with a large storage capacity and a high speed cache memory with a small storage capacity integrated on the same chip. More specifically, the present invention relates to a semiconductor memory device containing a cache having a Dynamic Random Access Memory (DRAM) and a Static Random Access Memory (SRAM) integrated on the same chip.

2. Description of the Background Art (i) Usage of standard DRAM as a main memory Operation speed of recent microprocessing unit (MPU) has been so much increased as to have operation clock frequency as high as 25 MHz or higher. In a data processing system, a standard DRAM (Dynamic Random Access Memory) is often used as a main memory having large storage capacity, since cost per bit is low. Although access time in the standard DRAM has been reduced, the speed of operation of the MPU has been increased much faster than that of the standard DRAM. Consequently, in a data processing system using the standard DRAM as a main memory, increase of wait state is inevitable. The gap in speed of operation between MPU and the standard DRAM is inevitable because the standard DRAM has the following characteristics.

(1) A row address and a column address are time divisionally multiplexed and applied to the same address pin terminals. The row address is taken in the device at a falling edge of a row address strobe signal/RAS. The column address is taken in the device at a falling edge of a column address strobe signal/CAS. The row address strobe signal/RAS defines start of a memory cycle and activates row selecting circuitry. The column address strobe signal/CAS activates column selecting circuitry. Since a prescribed time period called "RAS-CAS delay time (tRCD)" is necessary from the time the signal/RAS is set to an active state to the time the signal/CAS is set to the active state, there is a limit in reducing the access time, namely, there is a limit derived from address multiplexing.

(2) When the row address strobe signal/RAS is once raised to set the DRAM to a standby state, the row address strobe signal/RAS cannot fall to "L" again until a time period called a RAS precharge time (tRP) has lapsed. The RAS precharge time is necessary for surely precharging various signal lines in the DRAM to predetermined potentials. Due to the RAS precharge time tRP, the cycle time of DRAM cannot be reduced. In addition, when the cycle time of the DRAM is reduced, the number of charging/discharging of signal lines in the DRAM is increased, which increases current consumption.

(3) The higher speed of operation of the DRAM can be realized by circuit technique such as improvement of layout, increase of degree of integration of circuits, development in process technique and by applicational improvement such as improvement in the method of driving. However, the speed of operation of the MPU is increased at much faster rate than DRAM. The speed of operation of semiconductor memories is hierarchical. For example, there are high speed bipolar RAMs using bipolar transistors such as ECLRAMs (Emitter Coupled RAM) and Static RAM, and relatively low speed DRAMs using MOS transistors (insulated gate type field effect transistors). It is very difficult to expect the operation speed (cycle time) as fast as several tens ns (nano seconds) in a standard DRAM formed of MOS transistors.

There have been various applicational improvements to stop the gap between speed of operations of the MPU and the standard DRAM. Such improvements mainly comprise the following two approaches.

(1) Use of high speed mode of the DRAM and interleave method (2) External provision of a high speed cache memory (SRAM).

The first approach (1) includes a method of using a high speed mode such as a static column mode or a page mode, and a method of combining the high speed mode and the interleave method. In the static column mode, one word line (one row) is selected, and thereafter only the column address is changed successively, to successively access memory cells of this row. In the page mode, one word line is selected, and then column addresses are successively taken by toggling the signal/CAS to successively access memory cells connected to the selected one word line. In either of these modes, memory cells can be accessed without toggling the signal/RAS, enabling higher speed accessing than the normal access using the signals/RAS and/CAS.

In the interleave method, a plurality of memories are provided in parallel to a data bus, and by alternately or successively accessing the plurality of memories, the access time is reduced in effect. The use of high speed mode of the DRAM and combination of the high speed mode and the interleave method have been known as a method of using the standard DRAM as EL high speed DRAM in a simple and relatively effective manner.

The second approach (2) has been widely used in a main frame art. A high speed cache memory is expensive. However, in the field of personal computers in which high performance as well as low cost are desired, this approach is employed in some parts of the field with a sacrifice of cost. There are three possible ways to provide the high speed cache memory. Namely, (a) the high speed cache memory is contained in the MPU itself;

(b) the high speed cache memory is provided outside the MPU; and (c) the high speed cache memory is not separately provided but the high speed mode supported in the standard DRAM is used as a cache (the high speed mode is used as a pseudo cache memory). When a cache hit occurs, the standard DRAM is accessed in the high speed mode, and at the time of a cache miss, the standard DRAM is accessed in the normal mode.

The above mentioned three ways (a) to (c) have been employed in the data processing systems in some way or other. In most MPU systems, the memories are organized in a bank structure and interleaving is carried out on bank by bank basis in order to conceal the RAS precharge time (tRP) which is inevitable in the DRAM, in view of cost. By this method, the cycle time of the DRAM can be substantially one half that of the specification value.

The method of interleave is effective only when memories are sequentially accessed. When the same memory bank is to be continuously accessed, it is ineffective. Further, substantial improvement of the access time of the DRAM itself cannot be realized. The minimum unit of the memory must be at least 2 banks.

When the high speed mode such as the page mode or the static column mode is used, the access time can be reduced effectively only when the MPU successively accesses a certain page (data of a designated one row). This method is effective to some extent when the number of banks is comparatively large, for example 2 to 4, since different rows can be accessed in different banks. When the data of the memory requested by the MPU does not exist in the given page, it is called a "miss hit" (cache miss). Normally, a group of data are stored in adjacent addresses or sequential addresses. In the high speed mode, a row address, which is one half of the addresses, has been already designated, and therefore possibility of "miss hit" is high.

When the number of banks becomes as large as 30 to 40, data of different pages can be stored in different banks, and therefore the "miss hit" rate is remarkably reduced. However, it is not practical to provide 30 to 40 banks in a data processing system. In addition, if a "miss hit" occurs, the signal/RAS is raised and the DRAM must be returned to the precharge cycle in order to re-select the row address, which sacrifices the characteristic of the bank structure.

In the above described second method (2), a high speed cache memory is provided between the MPU and the standard DRAM. In this case, the standard DRAM may have relatively low speed of operation. Standard DRAMs having storage capacities as large as 4M bits or 16M bits have come to be used. In a small system such as a personal computer, the main memory thereof can be formed by one or several chips of standard DFaMs. External provision of the high speed cache memory is not so effective in such a small system in which the main memory can be formed of one standard DRAM. If the standard DRAM is used as the main memory, the data transfer speed between the high speed cache memory and the main memory is limited by the number of data input/output terminals of the standard DRAM, which constitutes a bottleneck in increasing the speed of the system.

When the high speed modLe is used as a pseudo cache memory, the speed of operation thereof is slower than the high speed cache memory, and it is difficult to realize the desired system performance.

Provision of the high speed cache memory (SRAM) in the DRAM is proposed as a method of forming a relatively inexpensive and small system, which can solve the problem of sacrifice of system performance when the interleave method or the high speed operation mode is used. More specifically, a single chip memory having a hierarchical structure of a DRAM serving as a main memory and a SRAM serving as a cache memory has been conceived. The one-chip memory having such a hierarchical structure is called a cache DRAM (CDRAM).

Normally in a CDRAM, a DRAM and an SRAM are integrated on the same chip. At the time of a cache hit SRAM is accessed, while at the time of a cache miss, the DRAM is accessed. Namely, the SRAM operating at high speed is used as a cache memory and the DRAM having a large storage capacity is used as a main memory.

The so called block size of the cache is considered to be the number of bits the contents of which are rewritten in one data transfer in SRAM. Generally, when the block size becomes larger, the hit rate is increased. However, if the cache memory has the same size, the number of sets is reduced in inverse proportion to the block size, and therefore the hit rate is decreased. For example, when the cache size is 4K bits and the block size is 1024, the number of sets is 4. However, if the block size is 32, the number of sets is 128. Therefore, in the conventional CDRAM structure, the block size is made too large, and the cache hit rate cannot be very much improved. A structure enabling reduction in block size is disclosed in, for example, Japanese Patent Laying-Open No. 1-146187.

FIG. 217 shows the whole structure of the conventional CDRAM disclosed in the aforementioned laid-open application. Referring to FIG. 217, the conventional CDRAM includes a memory array 1 including a plurality of dynamic memory cells arranged in a matrix of rows and columns. Memory array 1 is divided into a plurality of memory blocks B#1 to B#4 each including a plurality of columns. Memory blocks B#1 to B#4 share word lines.

The conventional CDRAM further includes a row address buffer 2 taking externally applied address signals A0 to An as a row address signal RA in response to an external row address strobe signal RAS and generating an internal row address signal; a column address buffer 4 taking address signals A0 to An as a column address signal CA in response to an external column address strobe signals /CAS for generating an internal column address signal; a row decoder 6 responsive to the internal row address signal from row address buffer 2 for generating a signal to select a corresponding row in memory cell array 1; a word driver 8 responsive to a row selecting signal from row decoder 6 for transmitting a driving signal to the selected row of memory cell array 1 to set a word line corresponding to the designated row to a selected state; a sense amplifier group 10 for sensing, amplifying and latching data of the memory cells connected to the selected row in memory cell array 1; a data register circuit 14 including a plurality of data registers provided corresponding to each column of the memory cell array 1; a transfer gate circuit 12 for transferring data between each column of memory cell array 1 and data register circuit 14; an IO gate 16 for decoding the internal column address signal from column address buffer 4 to select a corresponding column of memory cell array 1 or a corresponding data register in data register circuit 14; a block decoder 18 responsive to an externally applied cache hit/miss designating signal CH for selecting a corresponding block in memory cell array 1; an input buffer 24 and an output buffer 26 for inputting/outputting data from and to the outside of the device; a column decoder 20 for decoding the internal column address signal from column address buffer 4 for generating a signal for selecting and connecting the corresponding column of memory cell array 1 or the corresponding data register of data register circuit 14 through IO gate circuit 16 to input buffer 24 and output buffer 26; and a read/write control circuit 28 for controlling enabling/disabling of input buffer 24 and output buffer 26 in response to an externally applied write enable signals /WE and to the column strobe signal /CAS.

Transfer gate circuit 12 and data register circuit 14 are divided into blocks, respectively, corresponding to the blocks B#1 to B#4 of the memory cell array.

The CDRAM further includes a gate circuit 22 responsive to an externally applied cache hit/miss signal CH for transmitting a column address signal, which is, for example, lower 2 bits from column address buffer 4, as a block selecting signal to block decoder 18. Block decoder 18 is activated when cache hit/miss signal CH indicates a cache miss of "L", decodes the applied block address signal to select a corresponding memory cell block in the memory cell array 1, and drives block by block the transfer gate circuit 12 for transferring data between the selected memory cell array blocks and the data register corresponding to the selected memory cell array block.

FIG. 218 shows a structure of a main portion of the semiconductor memory device shown in FIG. 217. FIG. 218 shows a structure at the boundary region between two memory blocks B#1 and B#2.

Referring to FIG. 218, sense amplifier group 10 includes sense amplifiers SA#1 each provided corresponding to each bit line pair BL, /BL of memory block B#1 and sense amplifiers SA#2 each provided corresponding to each bit line pair BL, /BL of memory block B#2. Sense amplifiers SA#1 and SA#2 differentially amplify and latch the signals on the corresponding bit line pair BL, /BL when they are activated.

Transfer gate circuit 12 includes transfer gates DT#1 each provided for each bit line pair BL, /BL of memory block B#1 and transfer gates DT#2 each provided corresponding to each bit line pair BL /BL of memory block B#2. Transfer gates DT#1 provided for memory block B#1 are driven independent from transfer gates DT#2 provided for memory block B#2. More specifically, transfer gates DT#1 provided corresponding to memory block B#1 are driven by a block decoder circuit BD#1 provided for memory block B#1, while transfer gates DT#2 provided for memory block B#2 are driven by a block decoder circuit BD#2 provided for memory block B#2. Block decoder circuits BD#1 and BD#2 decode a block address transmitted at a time of cache miss from gate circuit 22 shown in FIG. 217, and drive a related transfer gate DT (#1 or #2) when the block address indicates a corresponding memory block.

A data register circuit 14 includes a register DR#1 provided corresponding to each bit line pair BL, /BL of memory block B#1 for latching data applied through transfer gate DT#1, and a register DR#2 receiving and storing data on the bit line pair BL, /BL of memory block B#2 through transfer gate DT#2. Data registers DR (#1 and #2) have a structure of an inverter latch circuit.

IO gate circuit 16 includes an IO gate TG provided for each of the bit line pairs BL, /BL of the memory blocks B#1 and B#2, responsive to a column selecting signal from column decoder 20 for connecting the corresponding bit line pair BL, /BL to an internal data transmitting line pair IO. IO gate TG connects the bit line pair BL, /BL of memory blocks B#1 and B#2 to internal data transmitting line pair IO through transfer gate circuit 12 and data register circuit 14. Therefore, when transfer gate circuit 12 is off (cut off state), IO gate TG connects the data register included in data register circuit 14 to internal data transmitting line pair IO. The operation of the semiconductor memory device shown in FIGS. 217 and 218 will be described with reference to the diagram of waveforms of FIG. 219.

The semiconductor memory device shown in FIG. 217 is used in a system including a CPU as an external processing device and a controller for controlling access to the semiconductor memory device in accordance with a request from the CPU. The controller includes a tag memory for storing tag addresses of data stored in data register circuit 14, a comparing circuit for determining coincidence/noncoincidence between a tag address stored in the tag memory and a portion of the address from the CPU (CPU address) corresponding to the tag address for generating a signal CH indicative of a cache hit/cache miss in accordance with the result of determination, and a control circuit (a state machine and an address multiplexer) for controlling address supply and access to the semiconductor memory device in accordance with the result of determination of the comparing circuit.

An address is supplied from the CPU in synchronization with the system clock. When the CPU address designates data stored in data register circuit 14, the externally provided controller sets the cache hit signal CH to "H" which corresponds to the active state. At this time, if the row address strobe signal /RAS is at active "L", the external controller toggles the column address strobe signal /CAS and extracts a column address CA from the CPU address and applies the same to the semiconductor memory device.

In the semiconductor memory device, the applied column address signal CA is taken by a column address buffer 4 which generates an internal column address signal and applies the same to column decoder 20. Since the cache hit signal CH is at "H", the output from gate circuit 22 is at "L", the block decoder 18 is at disabled state (or transmission of block address is inhibited), and block selecting operation is not carried out. In this case, column selecting operation is effected by column decoder 20, the corresponding data register is connected to the internal data line pair IO, and writing of data to or reading of data from the selected data register is carried out. Whether data is to be written or read depends on the write enable signal /WE.

While the data requested by the CPU is stored in data register circuit 14, the cache hit signal CH is at "H", and the corresponding data register of data register circuit 14 is selected in accordance with the column address signal CA.

When the CPU address does not designate the data stored in data register circuit 14 the cache hit signal CH is at the "L" state. At a time of a cache miss, the external controller once raises the signals /RAS and /CAS to "H", then lowers the row address strobe signal /RAS to "L", extracts row address signal RA from the CPU address and applies the same to the semiconductor memory device.

In the semiconductor memory device, row selecting operation in memory cell array 1 is carried out by row address buffer 2, row decoder 6 and word driver 8 in accordance with the applied row address signal RA, and the data of the memory cell connected to the selected row is detected, amplified and latched by sense amplifier group 10. In parallel with these operations, column address strobe signal /CAS is lowered to "L", and the column address signal CA is extracted from the CPU address and applied to the semiconductor memory device. In the semiconductor memory device, since the cache hit signal CH is at "L", block decoder 18 is activated and the block address signal of the applied column address signal is applied to the block decoder 18.

Block decoder 18 decodes the block address, and turns on all transfer gates provided corresponding to the memory block indicated by the block address. Consequently, in the selected memory block, data latched by the sense amplifier SA is transmitted to data register DR (#1 or #2). In parallel, column decoder 20 carries out column selecting operation, renders conductive the transfer gate TG included in IO gate circuit 16, and connects the data register DR to internal data transmission line pair IO.

Thereafter, if cache hit is continued with the row kept at the selected state in the memory array 1, data register DR (#1 or #2) is selected by the column decoder 20 to be accessed.

By dividing the memory array into blocks and driving the data registers block by block as described above, the data register can be used as a cache. In this case, as shown in FIG. 220, data registers TR#1 to TR#4 provided corresponding to the memory array blocks B#1 to B#4, respectively, can store data of different rows, thereby improving cache hit rate, and in addition, the block size of the cache can be made the same as the number of columns included in the memory block, realizing appropriate size of the cache block.

In the semiconductor memory device such as described above, the DRAM array is used as a main memory, and the data register circuit can be used as a cache. Since data transfer between the main memory and the cache is effected on block by block basis, data can be transferred at high speed.

An application of the semiconductor memory device as described above, that is, a CDRAM to graphic data processing will be discussed.

FIG. 221 shows a structure of a general graphic data processing system. Referring to FIG. 221, the system includes a CPU 30 as a processing device, a CDRAM 32, a CRT 34 as a display, and a CRT controller 36 for controlling data transfer between CDRAM 32 and CRT 34. CPU 30, CDRAM 32 and CRT 34 are connected to an internal data bus 38. Data transfer is carried out through internal data bus 38.

CDRAM 32 stores both graphic data to be displayed and data utilized by CPU 30 which are not displayed. When the graphic data is to be displayed on CRT 34, data transfer between CDRAM 32 and CRT 34 is carried out under the control of CRT controller 36. Data read from CDRAM 32 is applied to CRT 34 through data bus 38, and is displayed on a display screen of a display, not shown.

When data stored in CDRAM 32 is to be processed, CPU 30 accesses CDRAM 32. At that time, CPU 30 can access CDRAM 32 at high speed in accordance with the result of determination of cache hit/cache miss, and therefore data can be processed at high speed. The data accessed by the CPU 30 should preferably be stored in the cache region of CDRAM 32. Assume that CRT controller 36 reads data in the memory array 1 of CDRAM 32 and transmits the same to CRT 34 for display.

In such a case, it is necessary in the CDRAM having the above described structure that row selecting operation and the column selecting operation are carried out under the control by the CRT controller 36. Data in the memory array 1 is read through data register circuit 14. Therefore, in this case, data stored in the data register circuit to be used as a cache may be rewritten by data to be displayed on CRT 34. When image data generated from a video camera (not shown) or the like is to be written to CDRAM 32, cache data stored into data register circuit 14 is rewritten by the image data applied for writing to the main memory of the CDRAM 32, in this case also.

Therefore, in the above described CDRAM, writing and reading of data of the main memory cannot be carried out unless the data for the cache is changed. Accordingly, it is difficult to store both the graphic data and the data such as application programming which is not displayed, in the CDRAM.

In the conventional structure of the CDRAM, block division arrangement is employed when a DRAM main memory having large storage capacity is used. In that case, a block structure in which the memory array shown in FIG. 218 or 220 is used as one block is utilized. In the block division structure, only that block which includes a selected word line is activated, and other blocks are maintained at the inactive state. Accordingly, the number of available data registers is small correspondingly, which lowers the efficiency of use of the cache.

When there is only one row of data registers as in the structure of the CDRAM shown in FIG. 218, the mapping method which can be implemented is only the direct mapping method. In order to implement mapping of set associative method, it necessary to provide a plurality of rows of data registers. The direct mapping method and the set associative method cannot both be met. Only one of this mapping can be implemented.

In the CDRAM having the above described structure, access to 1 bit of data register can be carried out in parallel with data transfer from the DRAM array to the data register. However, unlike a common dual port video RAM, DRAM portion cannot be accessed in parallel with the access to the SRAM without affecting the access to the SRAM array by driving the DRAM portion and the SRAM portion independent from each other.

SUMMARY OF THE INVENTION

Therefore, an object of the present invention is to provide a CDRAM having a novel structure allowing data reading and writing at high speed.

Another object of the present invention is to provide a CDRAM which has particular applicability to graphic data processing.

A yet another object of the present invention is to provide a CDRAM allowing data writing and reading to and from the DRAM without affecting cache data.

The semiconductor memory device in accordance with the present invention includes a DRAM including a plurality of dynamic memory cells arranged in a matrix of rows and columns, an SRAM array including a plurality of static memory cells arranged in a matrix of rows and columns, and data transfer means for simultaneously carrying out data transfer between a plurality of selected memory cells of the DRAM and a plurality of selected memory cells of the SRAM array. The semiconductor memory device of the present invention further includes control means for independently effecting control of operation related to the DRAM array and control of operation related to the SRAM array, and means for externally and directly accessing the data transfer means.

Further, the semiconductor memory device of the present invention includes novel structure for realizing various characteristic functions.

Briefly stated, in the semiconductor memory device in accordance with the present invention, data transfer between the DRAM array and the SRAM array can be carried out by using a page mode of the DRAM in order to drive the DRAM array and the SRAM array independent from each other. Since direct access to the data transfer means is possible, in other words writing of data to and reading of data from the data transfer means can be carried out not through the SRAM array, writing and reading of data in the DRAM array can be carried out without any influence to the cache data stored in the SRAM array, and therefore the graphic data and the cache data can both be stored in the DRAM array.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a block diagram showing a whole structure of a semiconductor memory device in accordance with one embodiment of the present invention.

FIG. 4 is a diagram of signal waveforms showing the operation of a deselect SRAM mode of the semiconductor memory device shown in FIG. 1.

FIG. 5 shows a structure of a SRAM control portion of the semiconductor memory device shown in FIG. 1.

FIG. 6 shows an example of a structure of a buffer circuit receiving external signals in the semiconductor memory device shown in FIG. 1.

FIG. 7 shows a structure of a buffer circuit receiving a chip enable signal in the semiconductor memory device shown in FIG. 1.

FIG. 13 shows the flow of data in the buffer read transfer mode operation.

FIG. 17 shows the flow of data in the buffer read transfer and SRAM read mode operation.

FIG. 20 is a diagram of waveforms showing the buffer read mode operation.

FIG. 24 shows, in a table, the operations related to the DRAM of the semiconductor memory device shown in FIG. 1 and the states of control signals for implementing these operations.

FIG. 26 is a diagram of signal waveforms showing a DRAM NOP mode.

FIG. 28 shows the flow of data in the DRAM read transfer mode operation.

FIG. 41 shows an example of a specific structure of a bi-directional data transfer circuit in the semiconductor memory device in accordance with one embodiment of the present invention.

FIG. 42 shows an example of an operation sequence in the semiconductor memory device in accordance with one embodiment of the present invention.

FIGS. 43A and 43B schematically shows the operation represented by the diagram of signal waveforms of FIG. 42.

FIG. 44 shows another operation sequence of the semiconductor memory device in accordance with one embodiment of the present invention.

FIG. 45 shows an example of a structure of a mask circuit for masking a transfer gate transferring data to the DRAM array.

FIG. 46 shows an example of a circuit structure for generating set and reset signals shown in FIG. 45.

FIG. 48 is a diagram of waveforms showing a DRAM auto refresh mode operation.

FIG. 50 shows, in a table, command data set at the set command register mode shown in FIG. 49 and the contents set at that time.

FIG. 53 shows a structure of a portion related to set command register mode operation in the semiconductor memory device in accordance with one embodiment of the present invention.

FIG. 54 shows an example of another structure of the portion related to the set command registered mode in the semiconductor memory device in accordance with one embodiment of the present invention.

FIG. 58 shows an example of a structure of the input circuit and the input control circuit shown in FIG. 57.

FIGS. 64A and 64B are diagrams of signal waveforms showing a transparent output mode operation.

FIGS. 66A and 66B show output timings of output data in the registered output mode.

FIGS. 67A and 67B show data output timings in the latched output mode.

FIG. 75 shows an example of a structure of a memory system in the semiconductor memory device in accordance with another embodiment of the present invention.

FIG. 78 shows a structure when a memory system having a bank structure is formed by using the semiconductor memory device in accordance with another embodiment of the present invention.

FIG. 79 shows correspondence between the cache memory and the main memory in the memory system shown in FIG. 78.

FIG. 84 is a block diagram showing a structure of the bi-directional data transfer circuit in the semiconductor memory device in accordance with another embodiment of the present invention.

FIG. 85 shows, in a table, correspondence between states of control signals related to the SRAM portion of the semiconductor memory device and the operation realized at that time in accordance with another embodiment of the present invention.

FIG. 88 shows the flow of data in the buffer read transfer mode.

FIG. 91 shows the flow of data in the buffer write transfer and write mode operation.

FIG. 94 shows, in a table, correspondence between operations related to the DRAM array and the control signals realizing these operations.

FIG. 99 shows the flow of data in the DRAM write transfer 1/read mode operation.

FIG. 103 shows an example of an operation sequence of a semiconductor memory device in accordance with another embodiment of the present invention.

FIG. 118 is a flow chart showing the data reading operation sequence with the condition of no allocation in the write through mode of the semiconductor memory device in accordance with another embodiment of the present invention.

FIG. 120 shows an example of a structure of a bi-directional data transfer circuit in the semiconductor memory device in accordance with another embodiment of the present invention.

FIG. 121 shows the flow of data in the buffer write mode operation of the semiconductor memory device in accordance with another embodiment of the present invention.

FIG. 122 shows the flow of data in the DRAM write transfer mode operation of the semiconductor memory device in accordance with another embodiment of the present invention.

FIG. 123 is a diagram of signal waveform showing set and reset operations of the mask register in the semiconductor memory device in accordance with another embodiment of the present invention.

FIG. 124 is a diagram of signal waveform showing the set/reset operation of mask data of the mask register in the semiconductor memory device in accordance with another embodiment of the present invention.

FIG. 125 shows a specific structure of a write data transfer buffer circuit in the bi-directional data transfer circuit used in the semiconductor memory device in accordance with the present invention.

FIG. 126 is a diagram of signal waveforms showing the operation of the write data transfer buffer circuit shown in FIG. 125.

FIG. 127 shows a specific structure of a read data transfer buffer circuit in the bi-directional data transfer circuit used in the semiconductor memory device in accordance with another embodiment of the present invention.

FIG. 128 is a diagram of signal waveforms showing the operation of the read data transfer buffer circuit shown in FIG. 127.

FIG. 129 shows a structure for generation control signals used in the data transfer buffer circuits shown in FIGS. 125 and 127.

FIG. 130 shows chip arrangement of the CDRAM in accordance with a third embodiment of the present invention.

FIG. 131 shows internal functional structure of the CDRAM in accordance with the third embodiment of the present invention.

Figure 131:
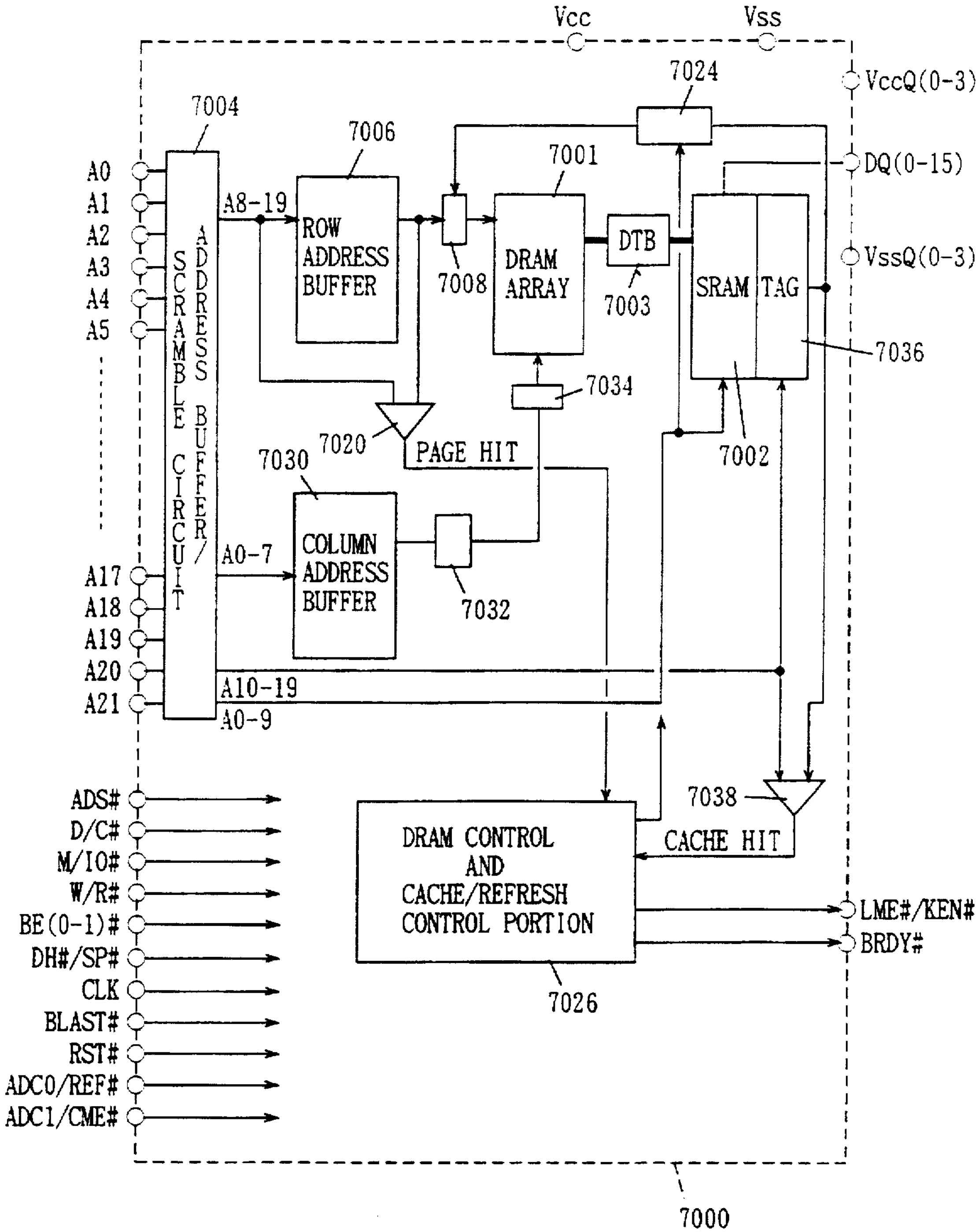

FIG. 132 shows, in a table, external control signals of the CDRAM shown in FIG. 131 and commands designated correspondingly.

FIG. 133 shows, in a table, external control signals of the CDRAM shown in FIG. 131 and operations carried out correspondingly.

Figure 134:
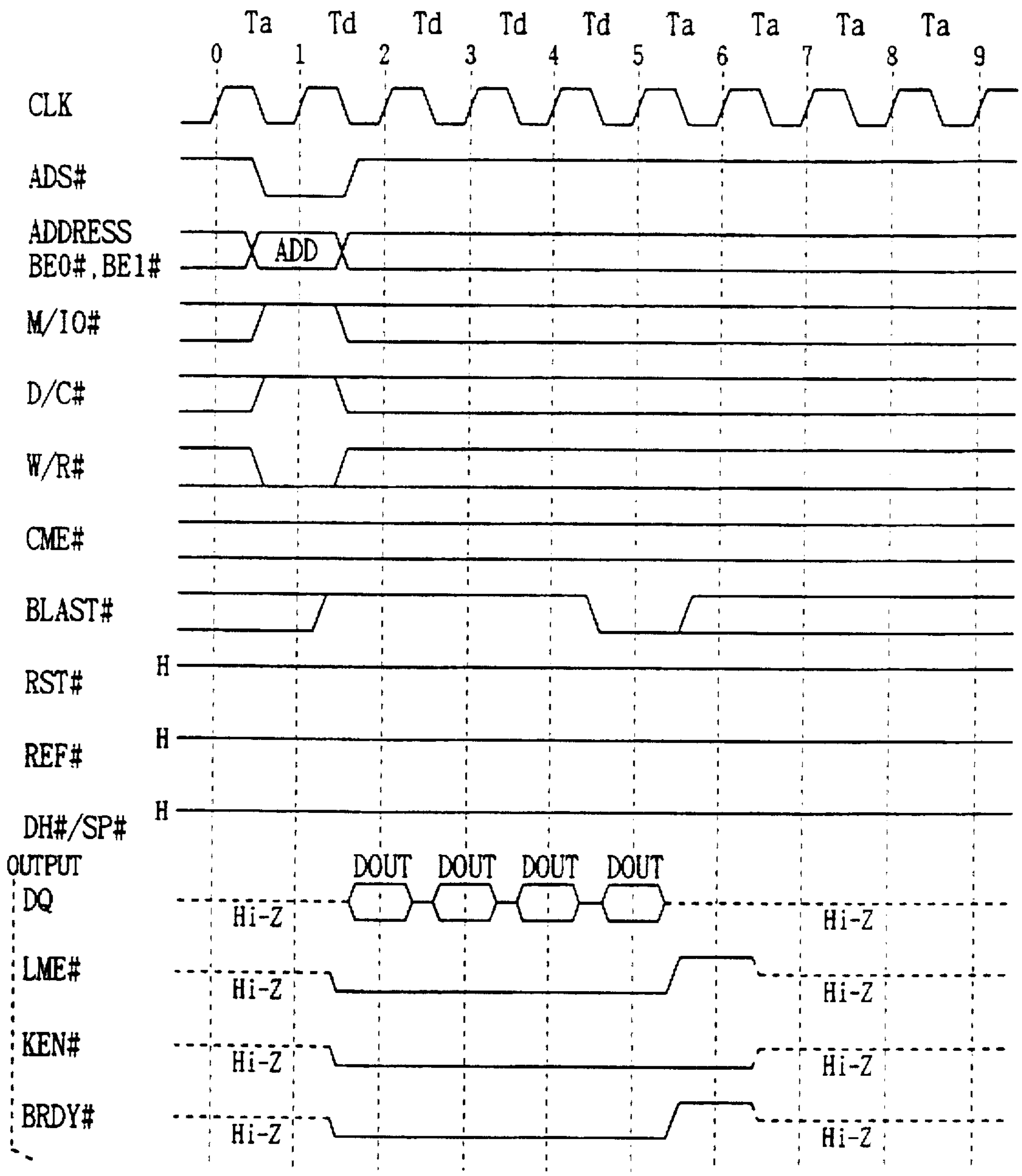

FIG. 134 is a timing chart showing the operation at a data reading of the CDRAM shown in FIG. 131.

FIG. 135 is a timing chart showing data reading operation of the CDRAM shown in Fia. 131.

FIG. 136 is a timing chart showing the operation at data reading of the CDRAM shown in FIG. 131.

Figure 137:
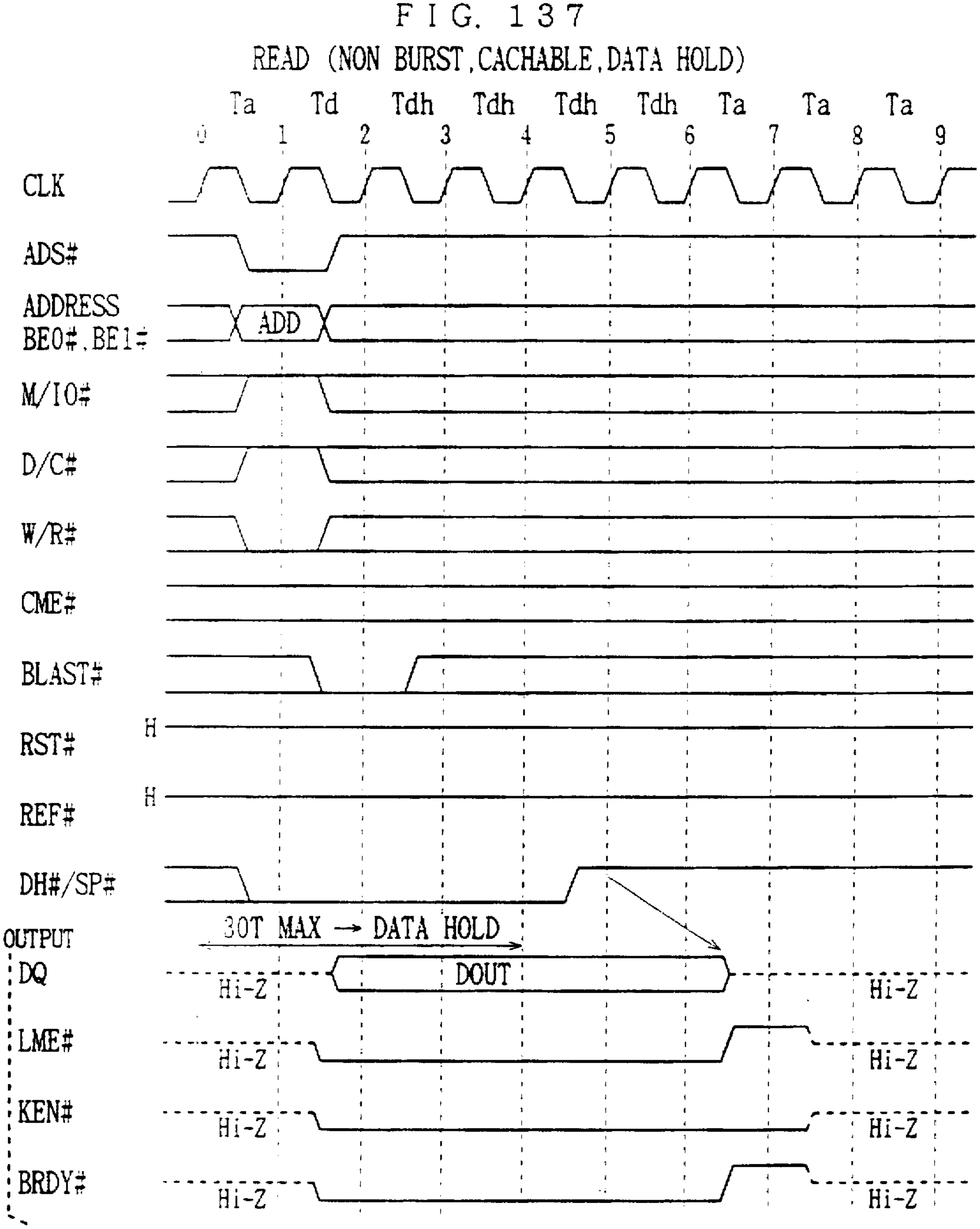

FIG. 137 is a timing chart showing data reading operation of the CDRAM shown in FIG. 131.

Figure 138:
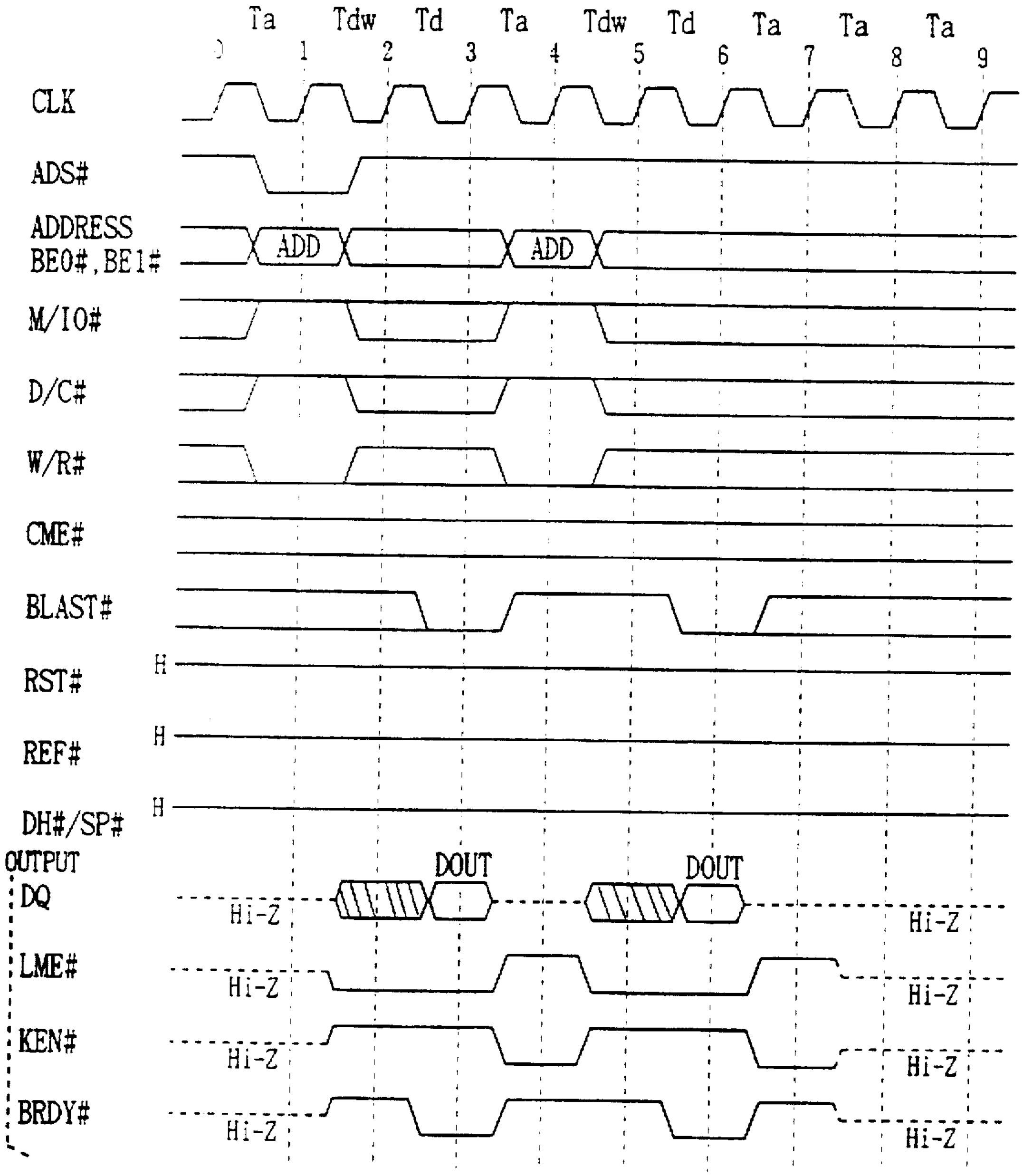

FIG. 138 is a timing chart showing data reading operation of the CDRAM shown in FIG. 131.

Figure 139:
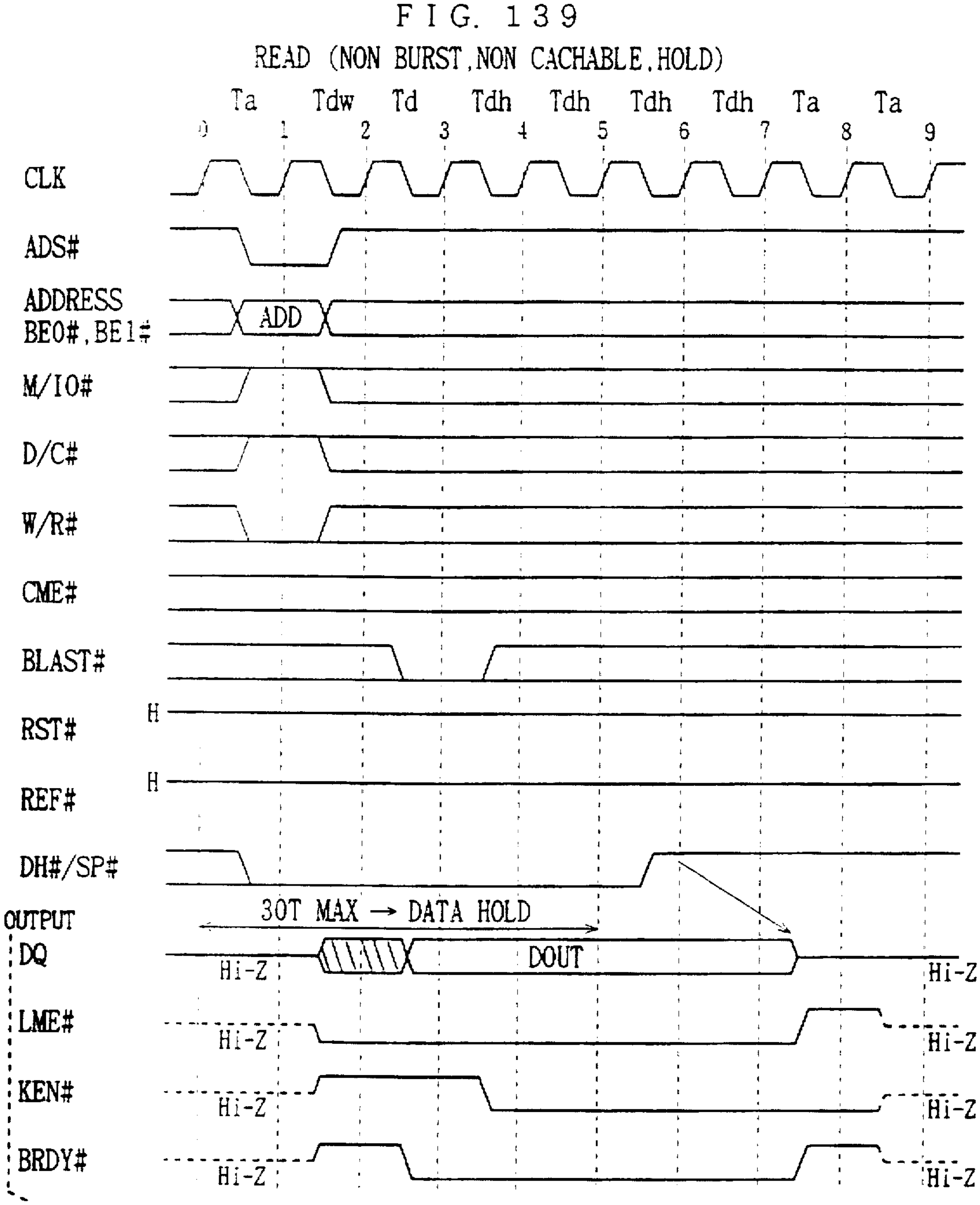

FIG. 139 is a timing chart showing data reading operation of the CDRAM shown in FIG. 131.

Figure 140:
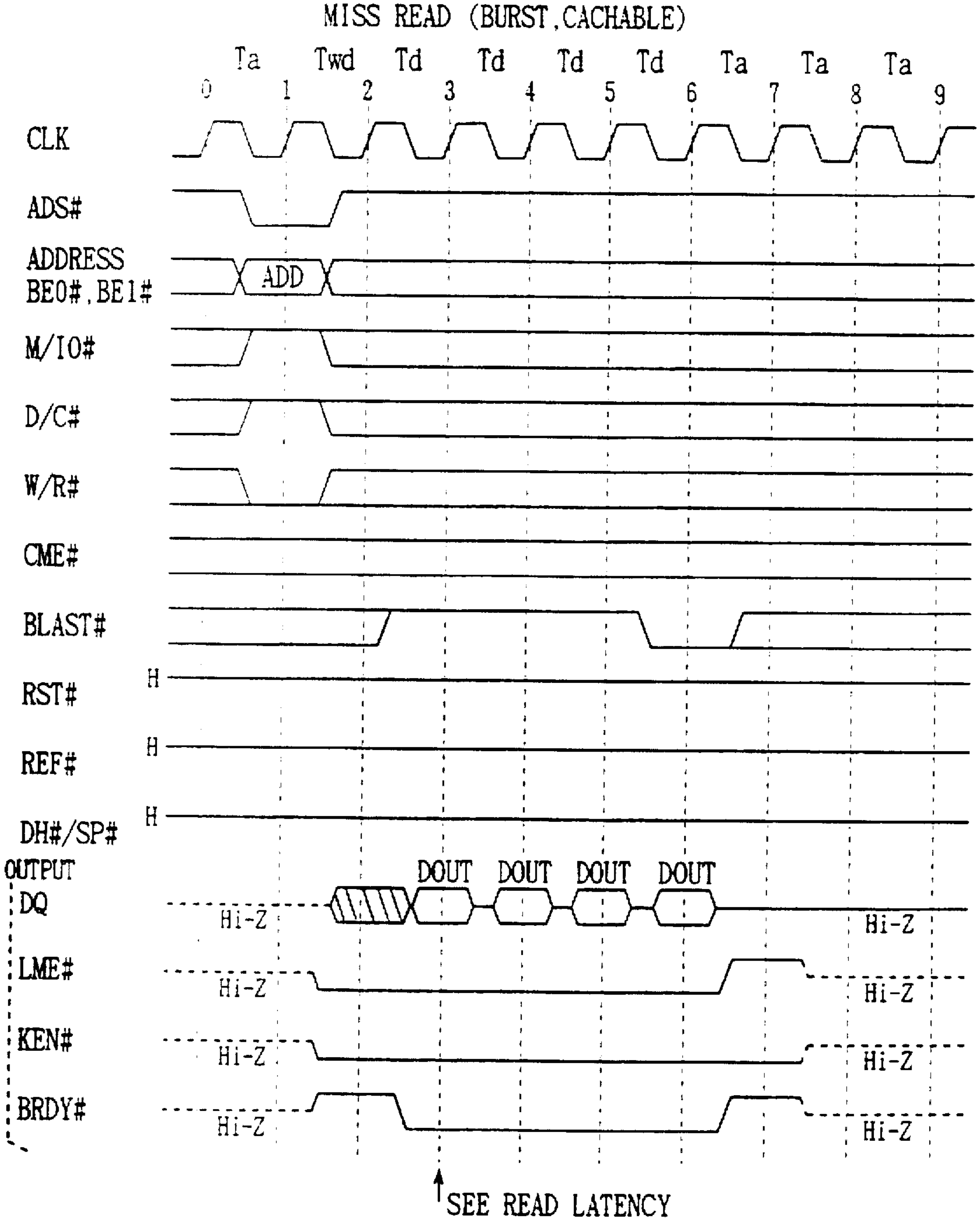

FIG. 140 is a timing chart showing data reading operation of the CDRAM shown in FIG. 131.

Figure 141:
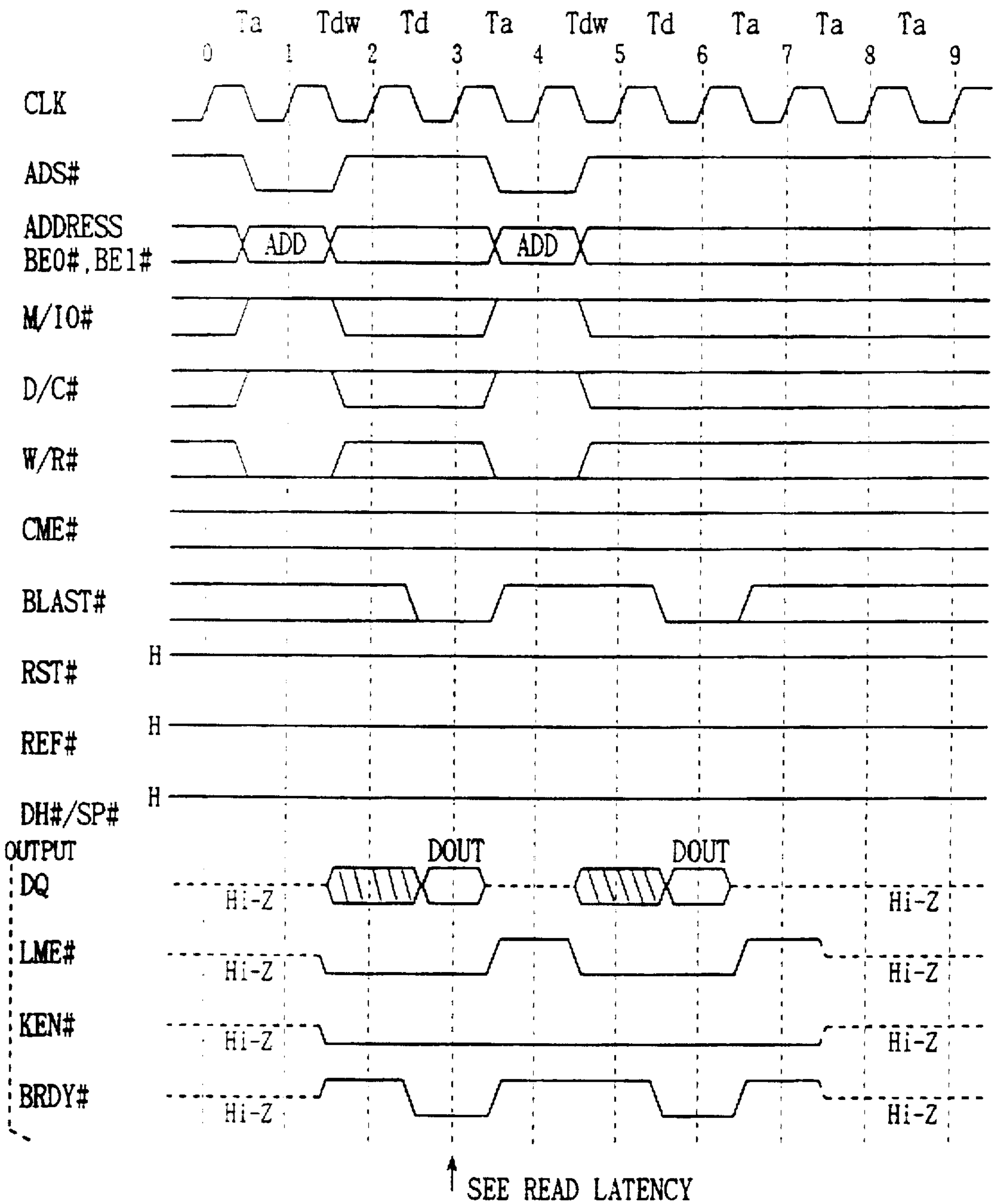

FIG. 141 is a timing chart showing data reading operation of the CDRAM shown in FIG. 131.

Figure 142:
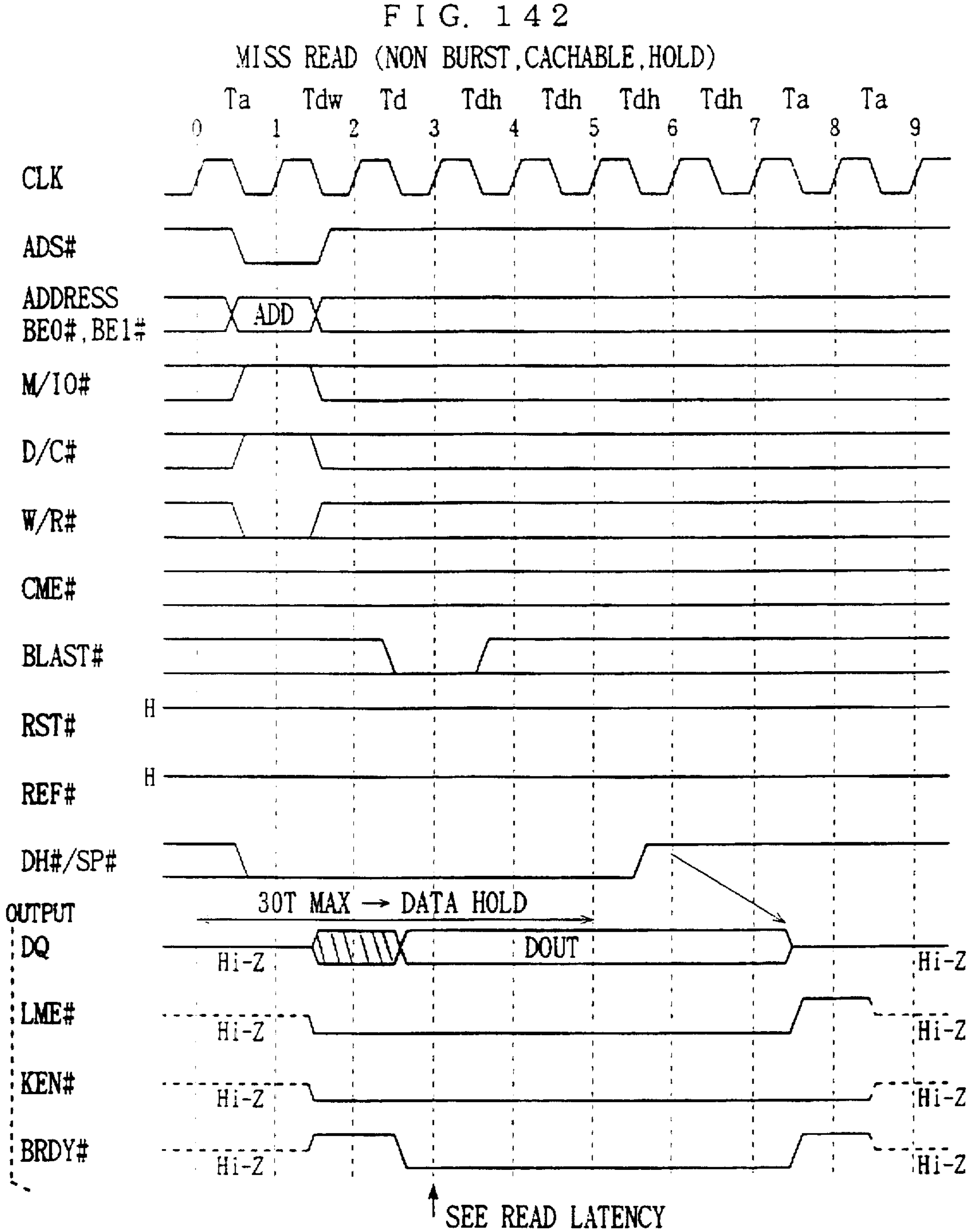

FIG. 142 is a timing chart showing data reading operation of the CDRAM shown in FIG. 131.

Figure 143:
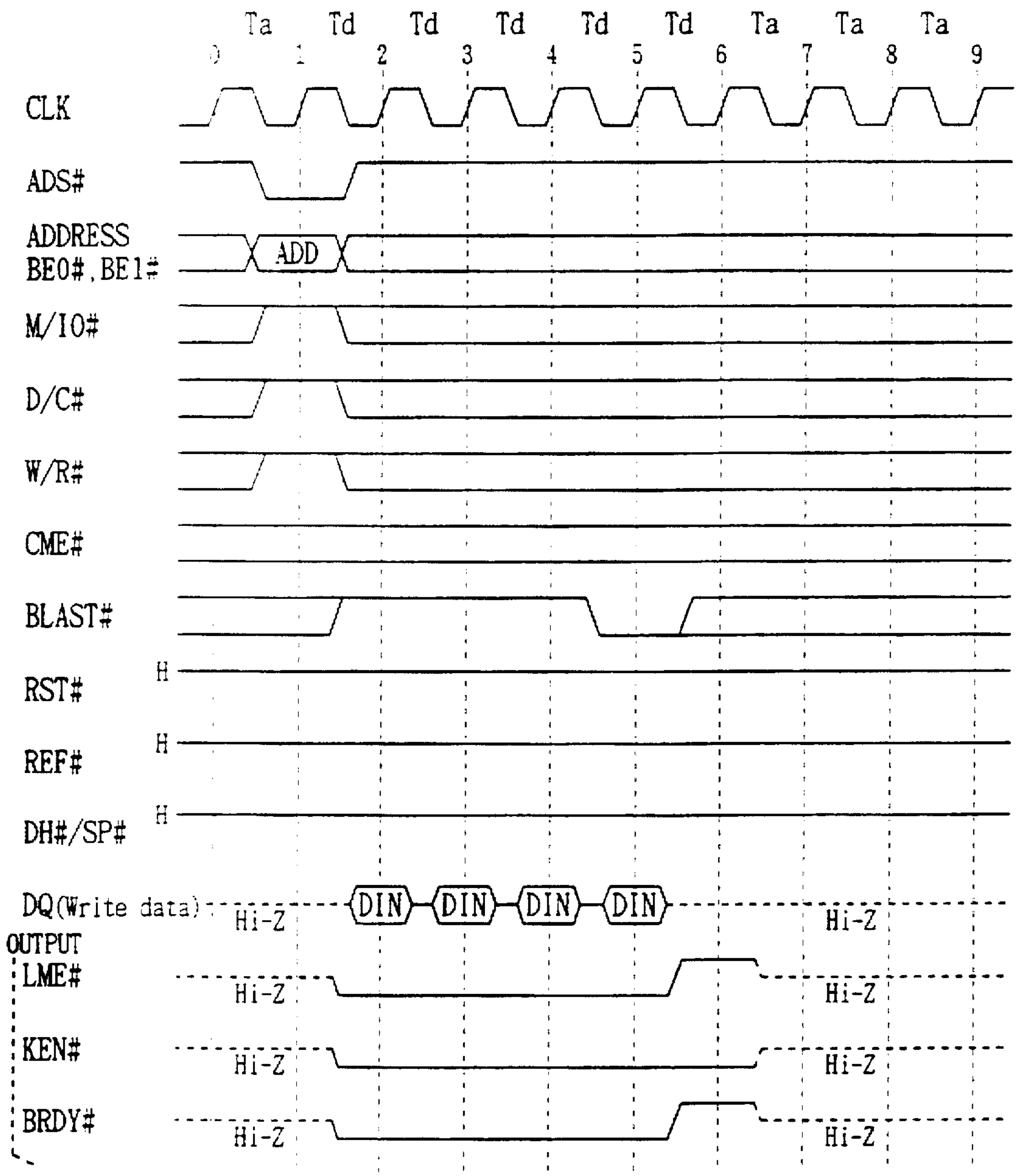

FIG. 143 is a timing chart showing data writing operation of the CDRAM shown in FIG. 131.

Figure 144:
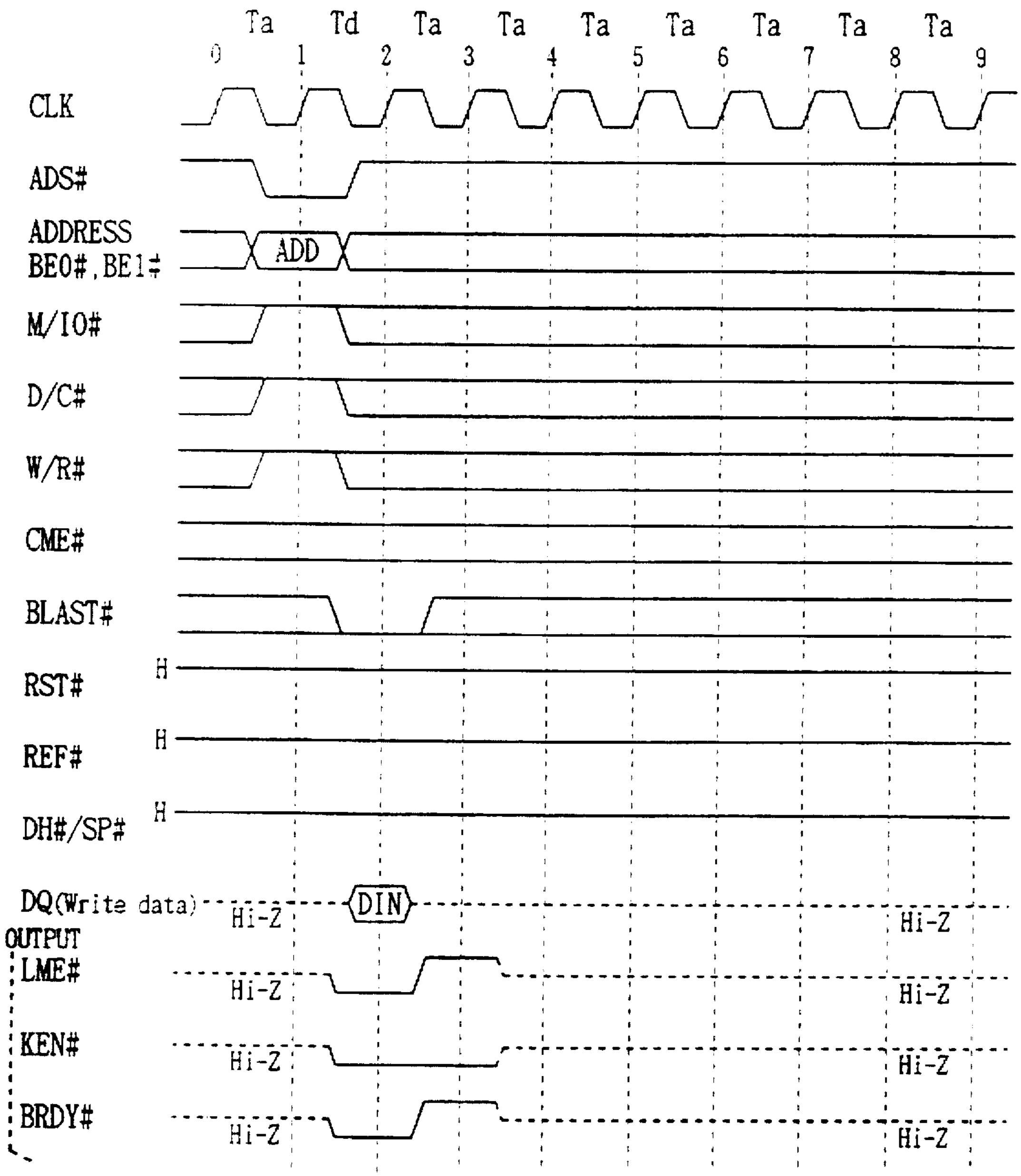

FIG. 144 is a timing chart showing data writing operation of the CDRAM shown in FIG. 131.

Figure 145:
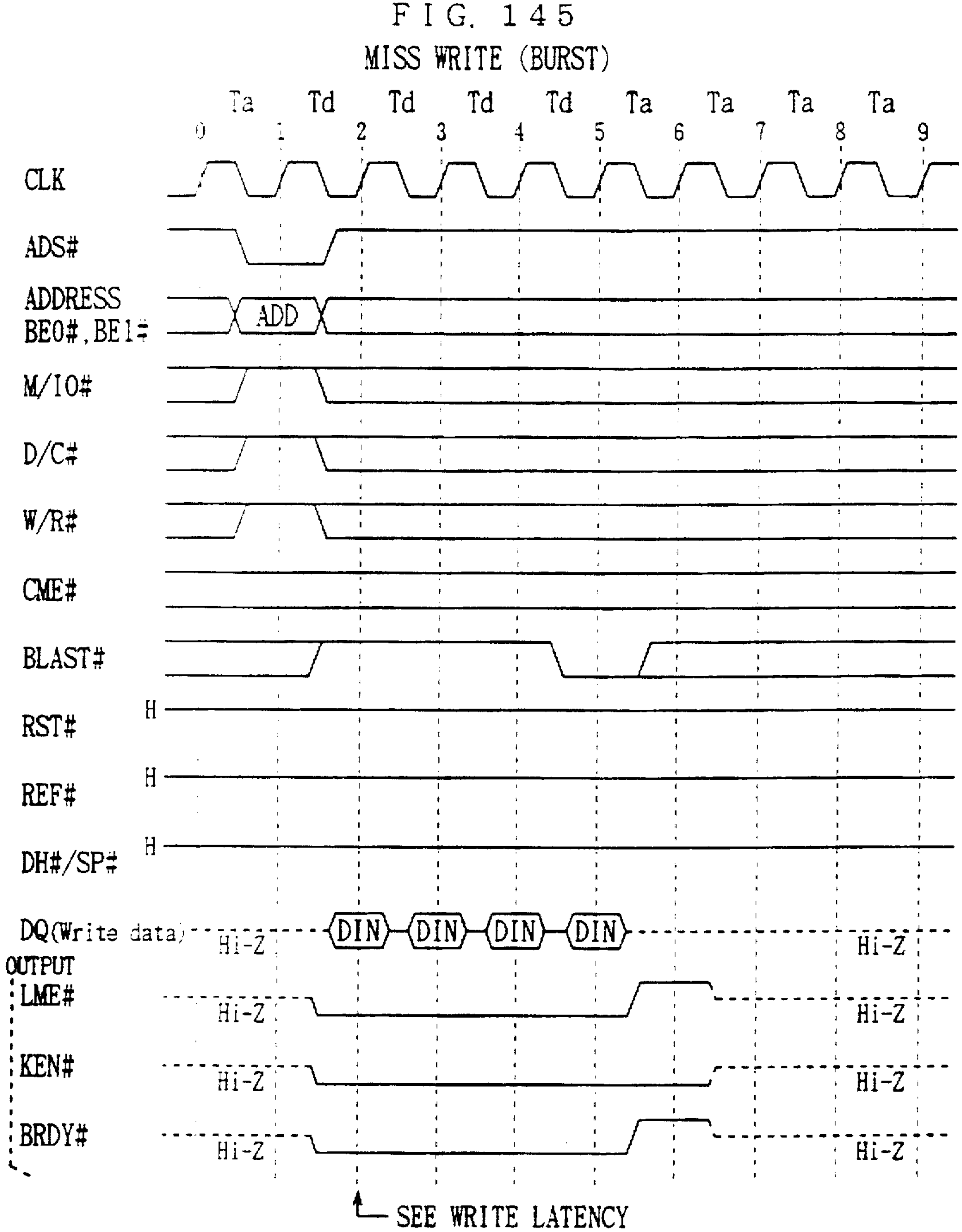

FIG. 145 is a timing chart showing data writing operation of the CDRAM shown in FIG. 131.

Figure 146:
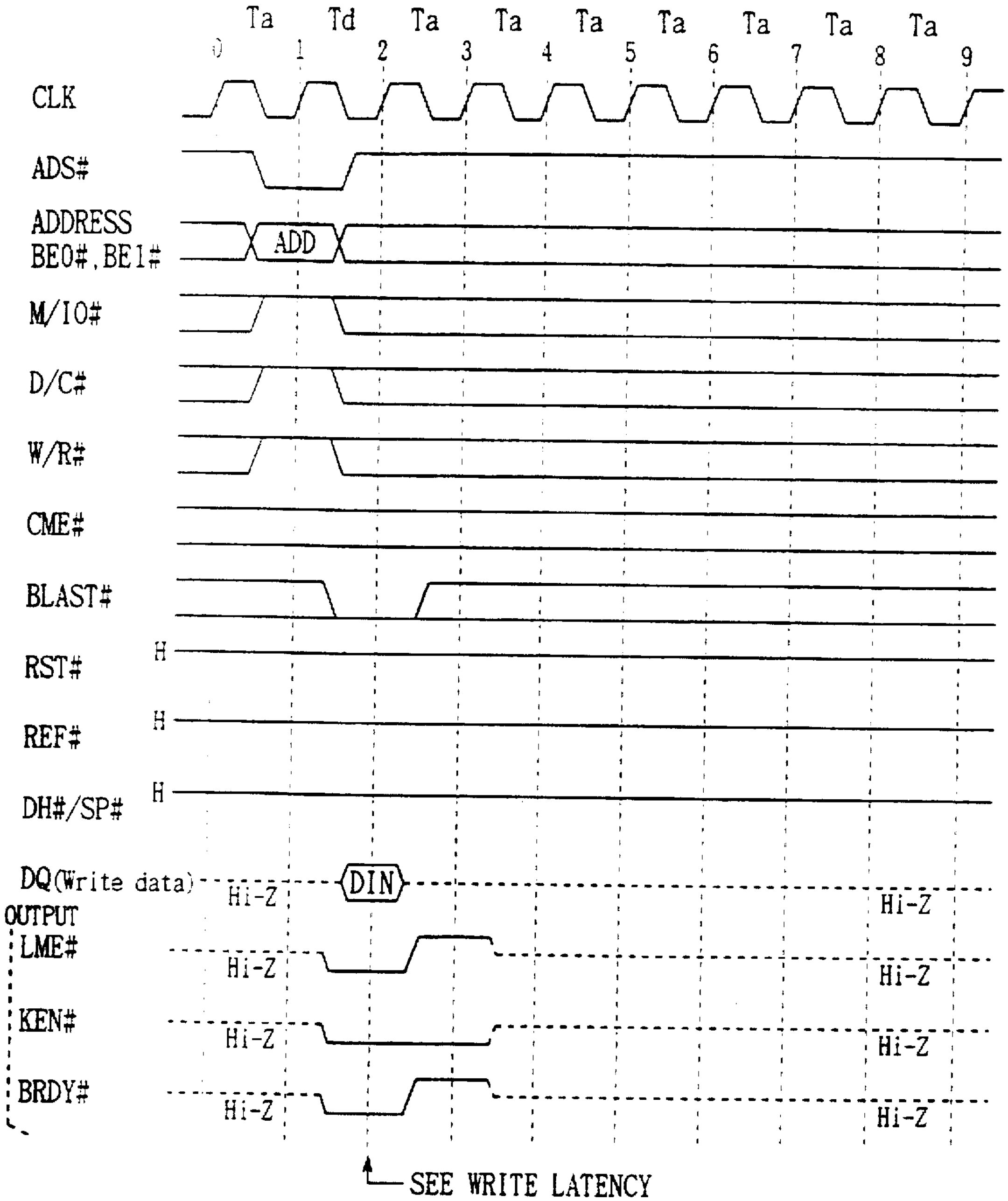

FIG. 146 is a timing chart showing data writing operation of the CDRAM shown in FIG. 131.

FIG. 147 is a timing chart showing operation sequence at the time of power on of the CDRAM shown in FIG. 131.

FIG. 148 is a timing chart showing an operation at the time of CPU reset of the CDRAM shown in FIG. 131.

FIG. 149 is a timing chart showing the operation in the sleep mode of the CDRAM shown in FIG. 131.

Figure 150:
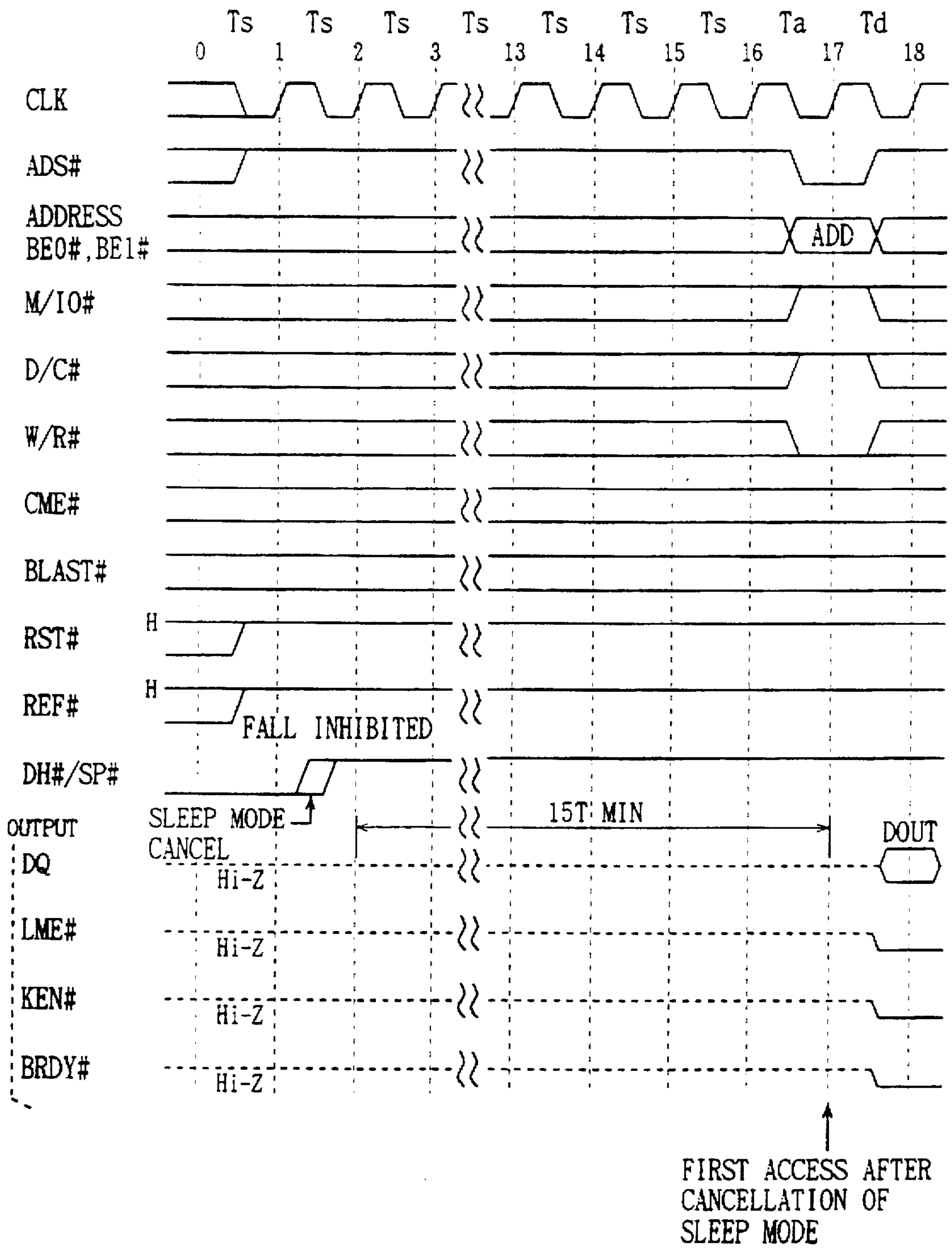

FIG. 150 is a timing chart showing the operation when the sleep mode is released in the CDRAM shown in FIG. 131.

Figure 151:
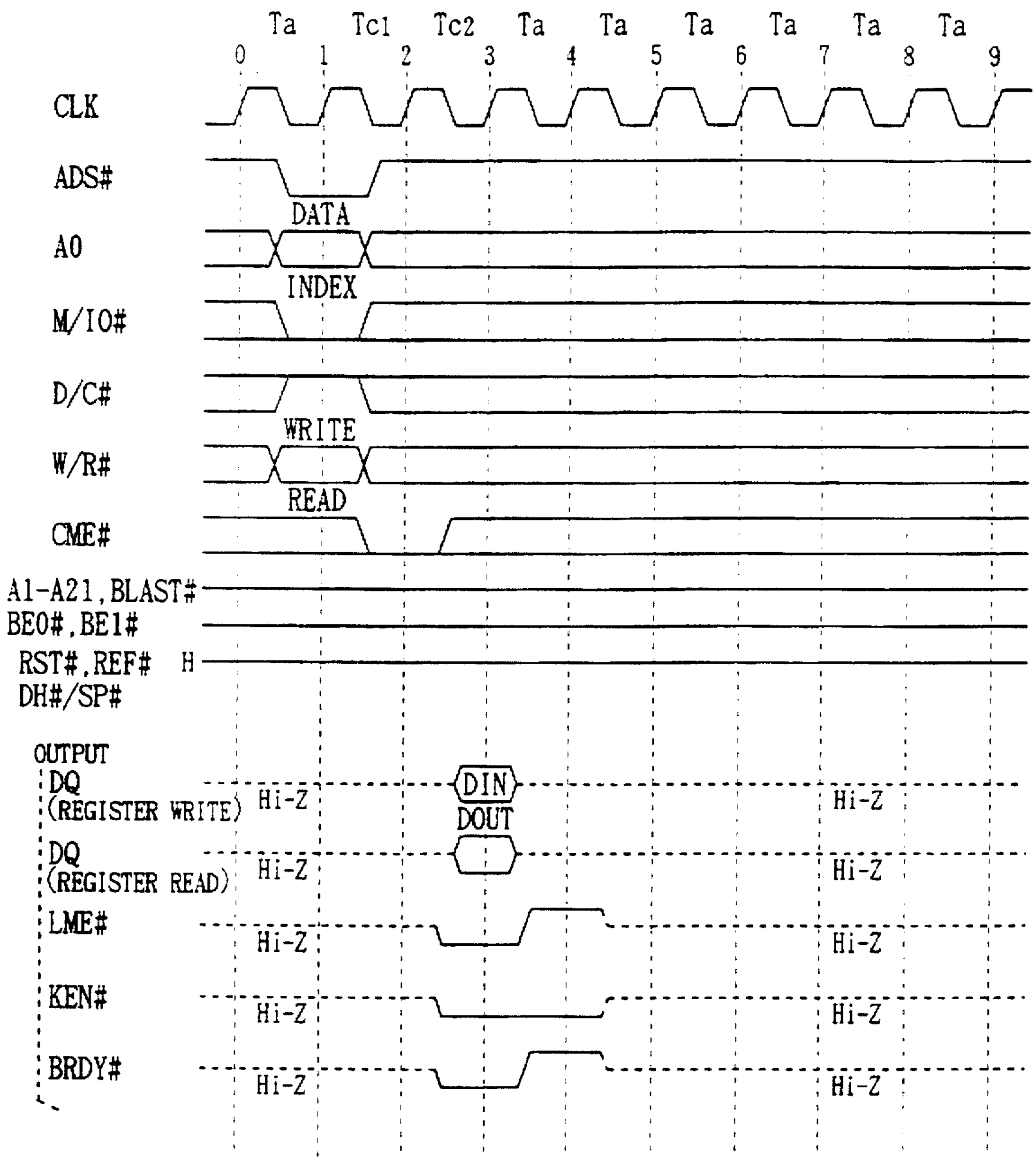

FIG. 151 is a timing chart showing command register read/write operation of the CDRAM shown in FIG. 131.

Figure 152:
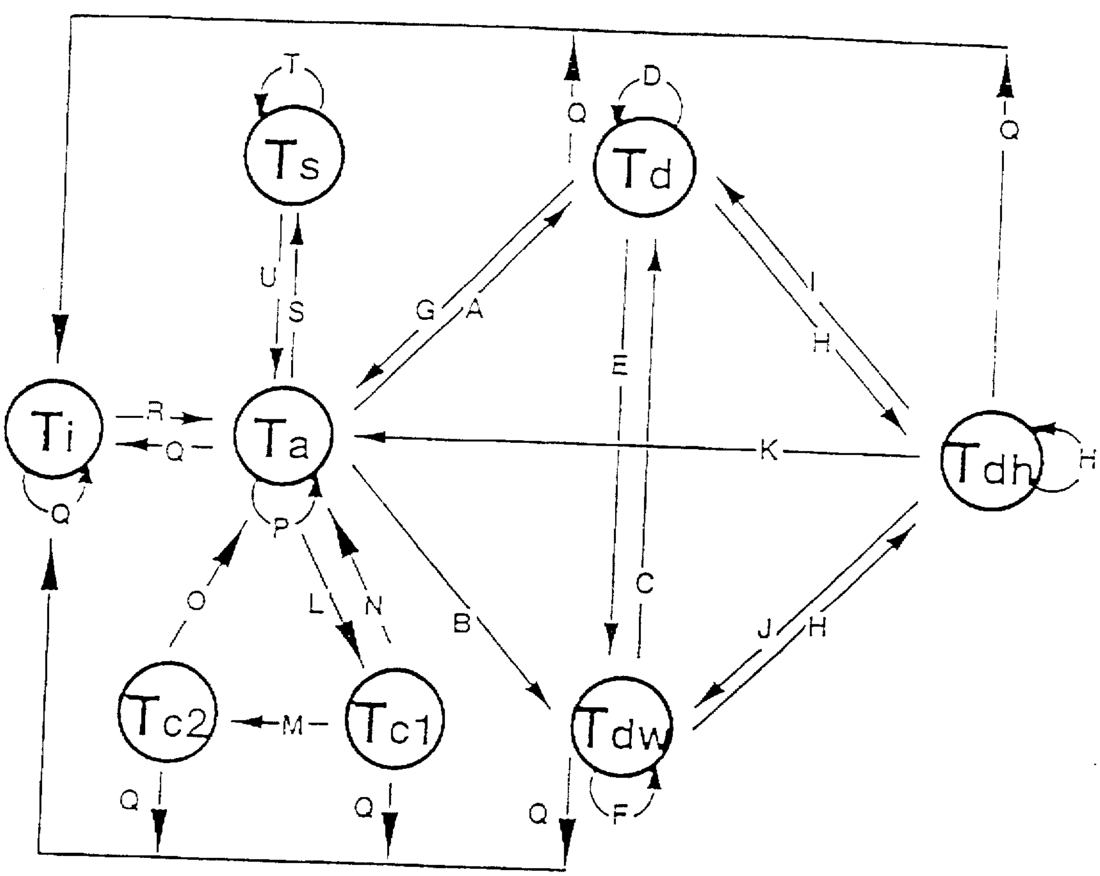

FIG. 152 shows state transition of the CDRAM shown in FIG. 131.

FIGS. 153A and 153B show a truth stable of external control signals for carrying out command register read/write of the CDRAM and the command register read/write operation of the CDRAM shown in FIG. 131.

FIG. 154 shows the function and structure of command register 00h.

FIG. 155 shows structure and function of command register 01h.

FIG. 156 shows structures and functions of command registers 02h and 03h.

FIG. 157 shows structures and functions of command registers 04h and 05h.

FIG. 158 shows structures and functions of command registers 06h and 07h.

FIG. 159 shows structures and functions of command registers 10h and 16h.

FIG. 160 shows structures and functions of command registers 17h and 1Ch.

FIG. 161 shows, in a table, latencies at the time of reading/writing of the CDRA shown in FIG. 131.

Figure 162:
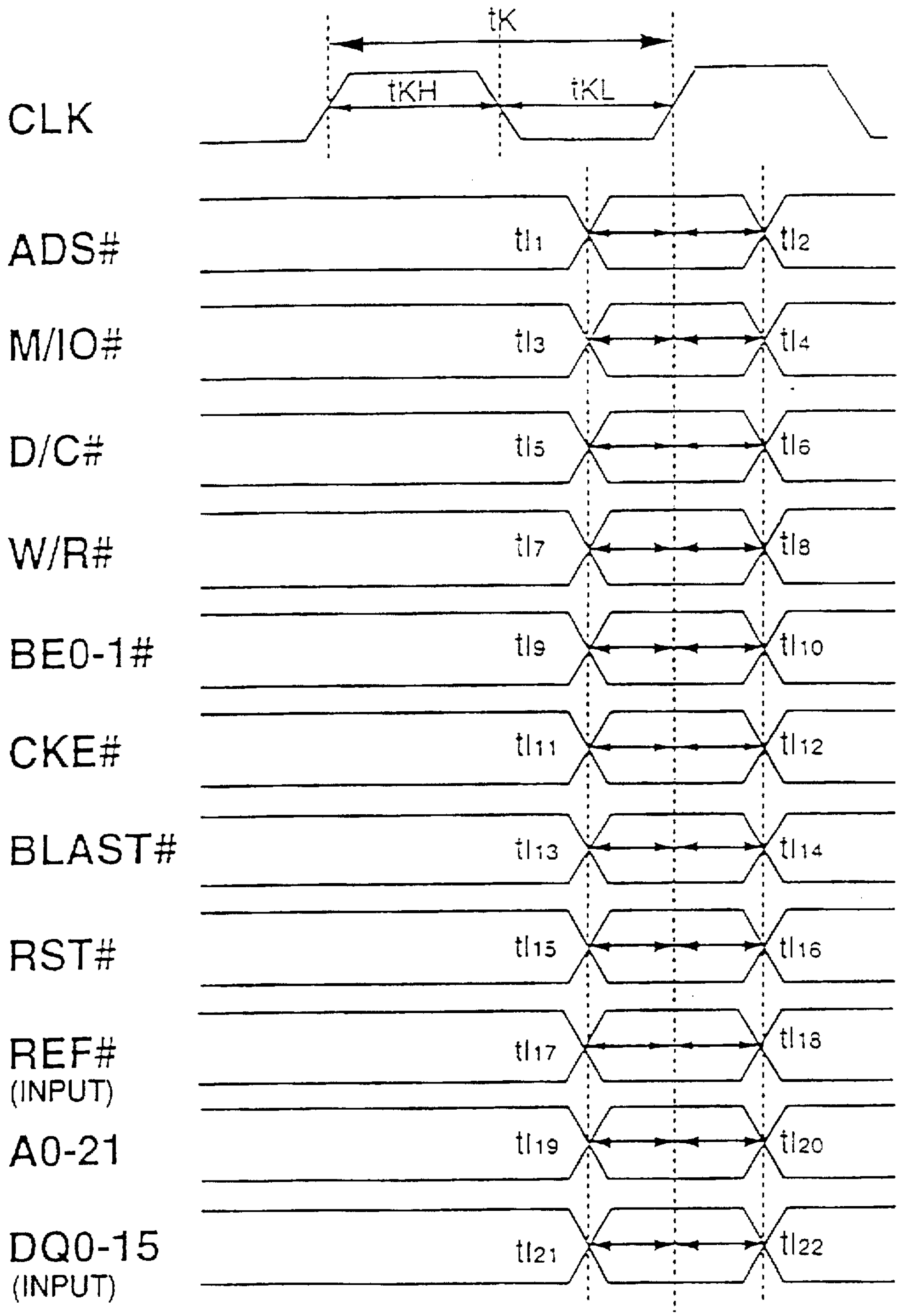

FIG. 162 shows various parameters of input signals to the CDRAM shown in FIG. 131.

Figure 163:
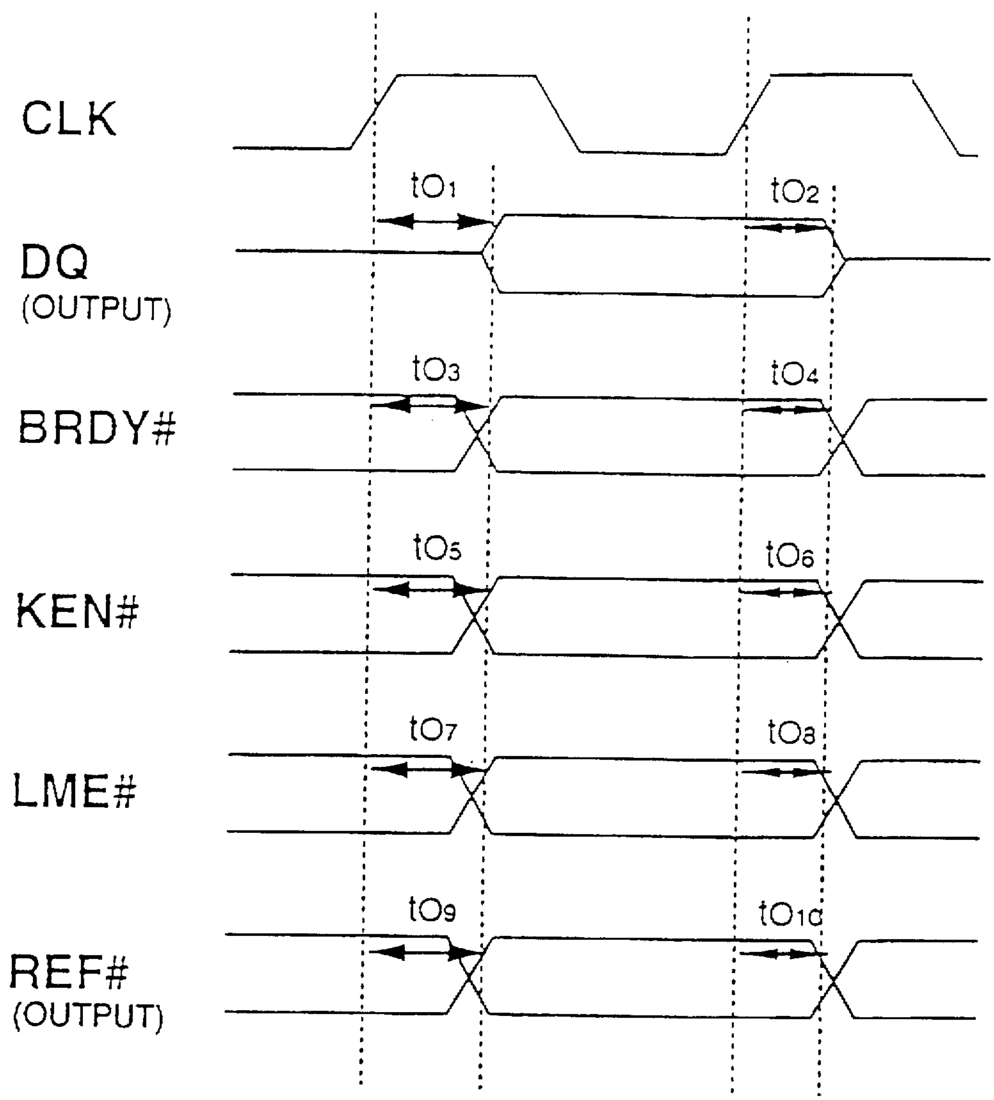

FIG. 163 shows various parameters of output signals of the CDRAM shown in FIG. 131.

FIG. 164 shows a structure of a memory system constituted by the CDRAM.

Figure 165A:
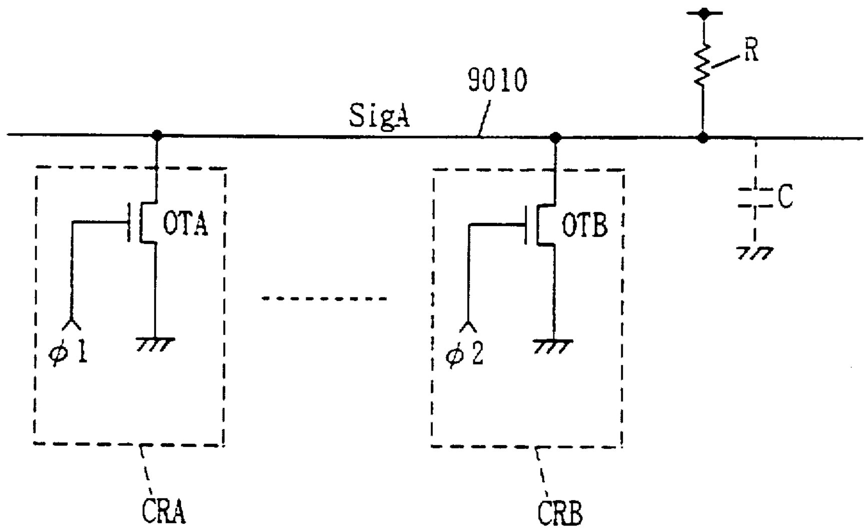
Figure 165B:
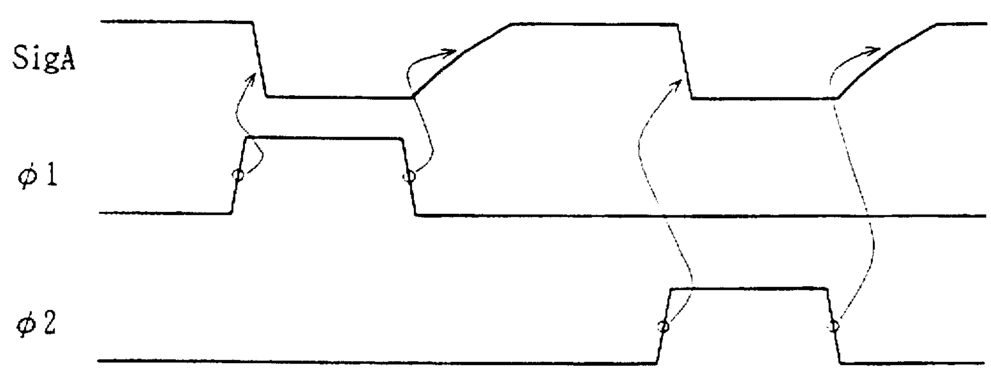

FIGS. 165A and 165B schematically shows the structure and operation of a data signal output portion of the CDRAM shown in FIG. 164.

Figure 166:
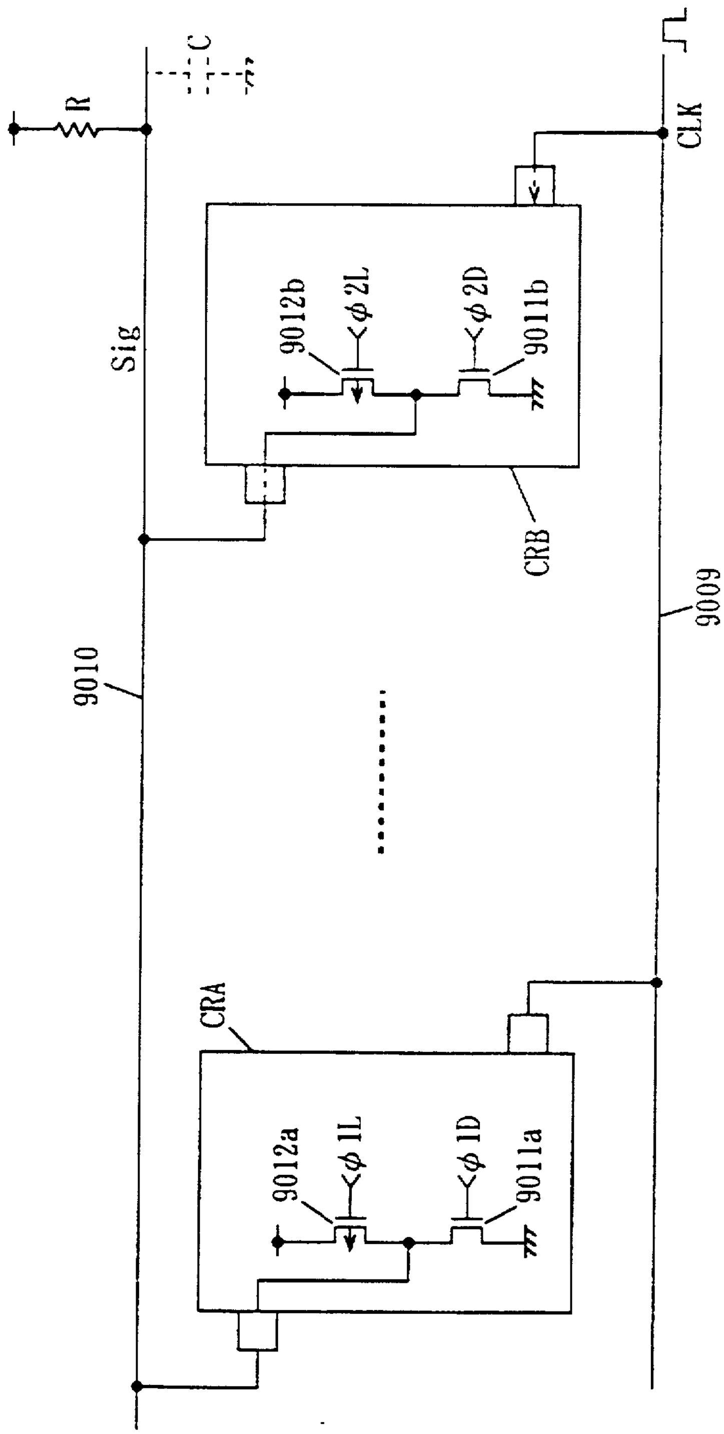

FIG. 166 shows a structure of an improved signal output portion of the present invention.

Figure 167:
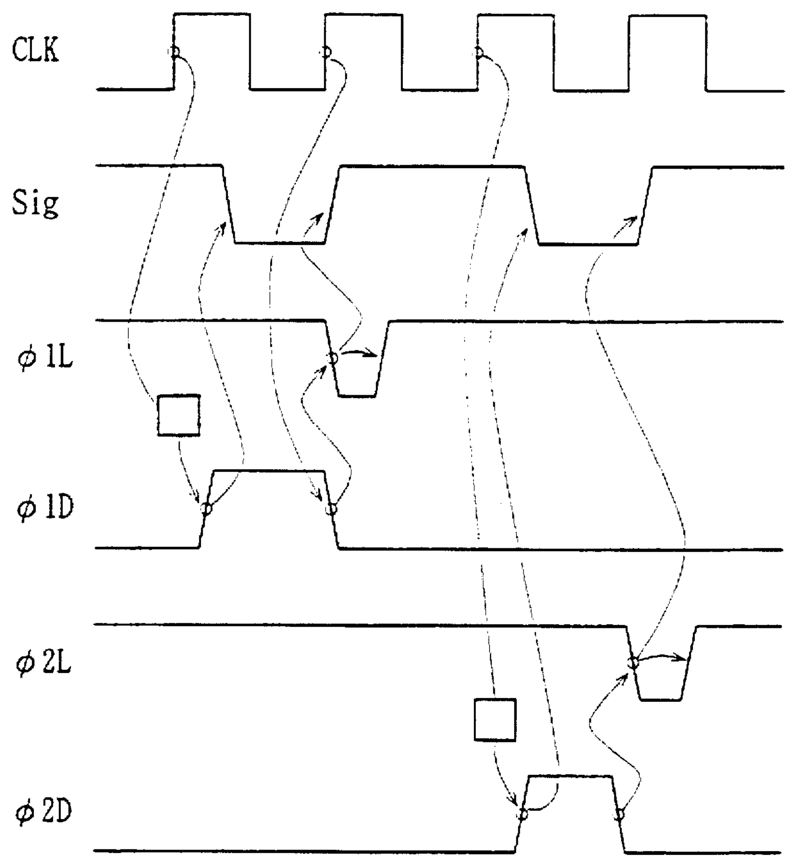

FIG. 167 is a diagram of signal waveforms showing the operation of the signal output portion shown in FIG. 166.

FIG. 168 shows a circuit structure for generating the control signals shown in FIG. 166.

FIG. 169 shows a modification of the circuit shown in FIG. 168.

FIG. 170 is a diagram of signal waveforms showing the operation of the circuit shown in FIG. 169.

Figure 171:
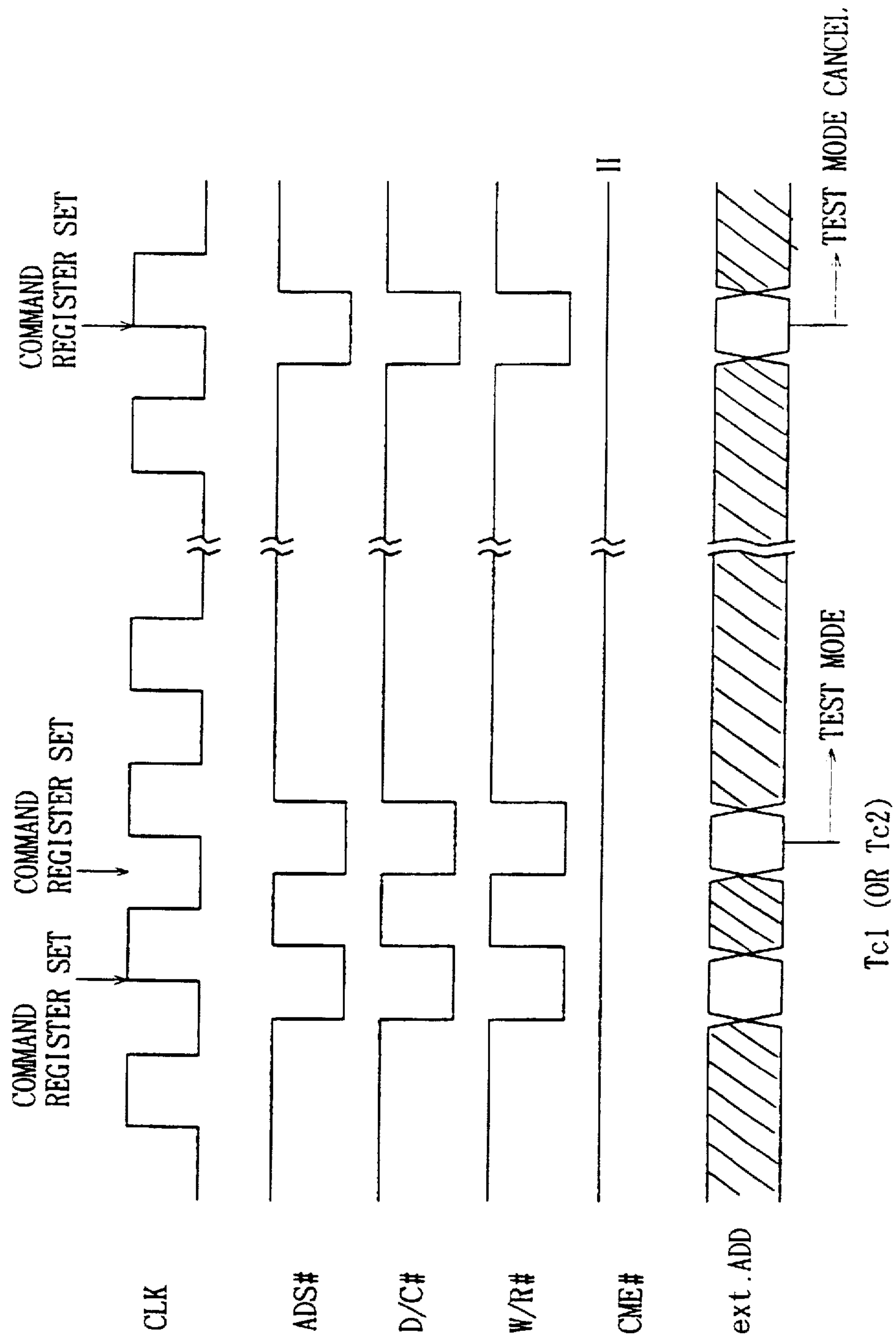

FIG. 171 is a timing chart showing the operation when a special mode is set.

Figure 172:
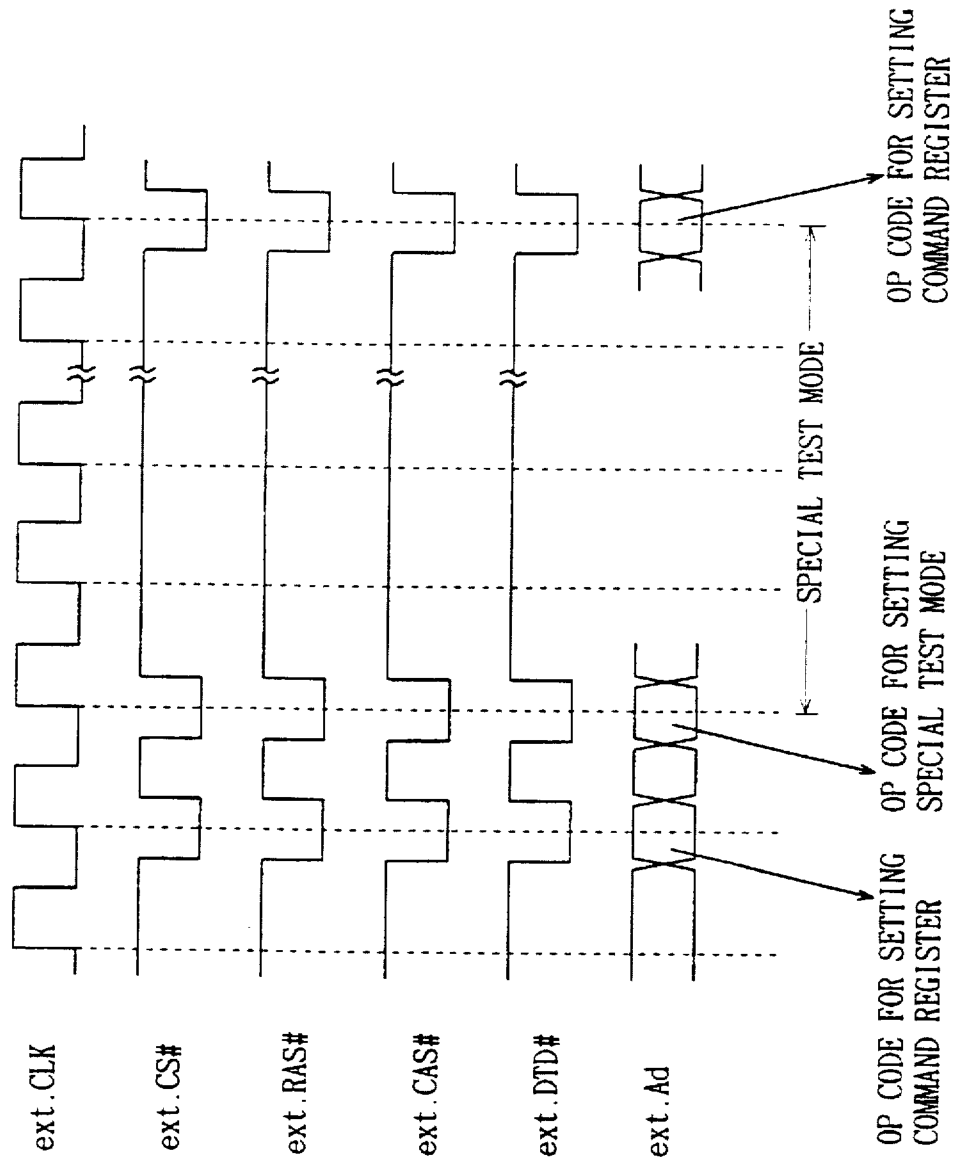

FIG. 172 is a timing chart showing the operation when a special mode is set.

Figure 173:
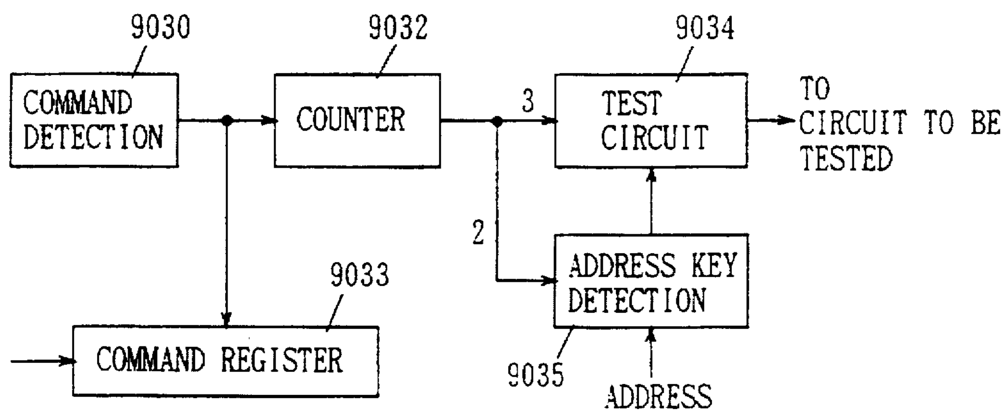

FIG. 173 shows a structure of a test mode setting circuit.

Figure 174:
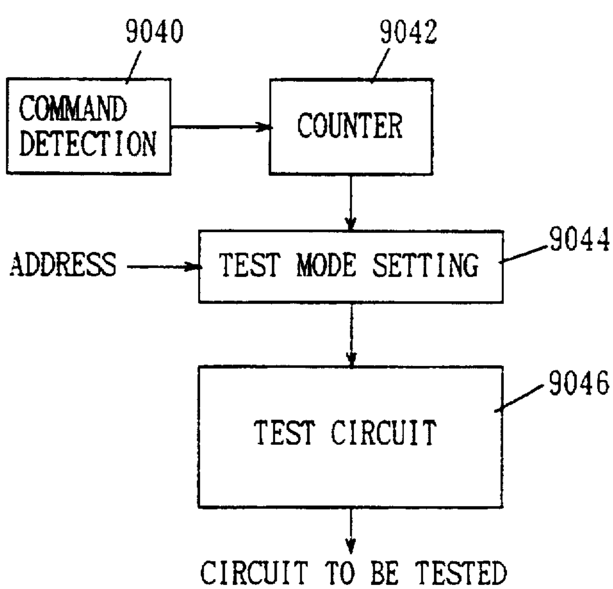

FIG. 174 shows another structure of the test mode setting circuit.

Figure 175:
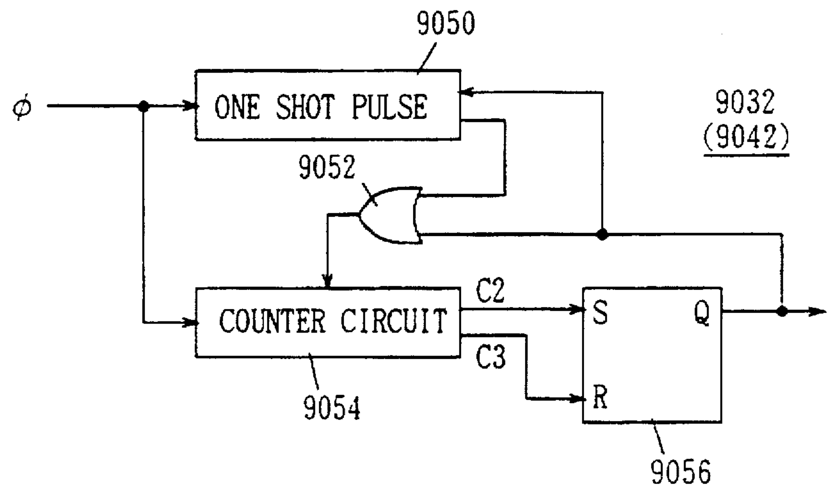

FIG. 175 shows an example of a structure of a counter shown in FIGS. 173 and 174.

Figure 176:
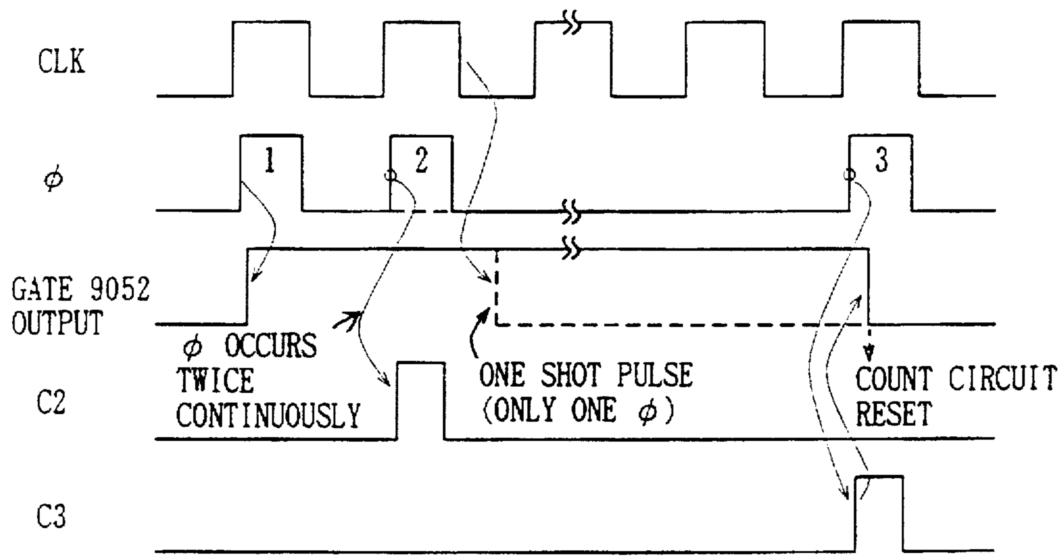

FIG. 176 is a timing chart showing the operation of the counter shown in FIG. 175.

FIG. 177 shows a structure of a memory system having a synchronous self refresh function in accordance with the present invention.

Figure 178:
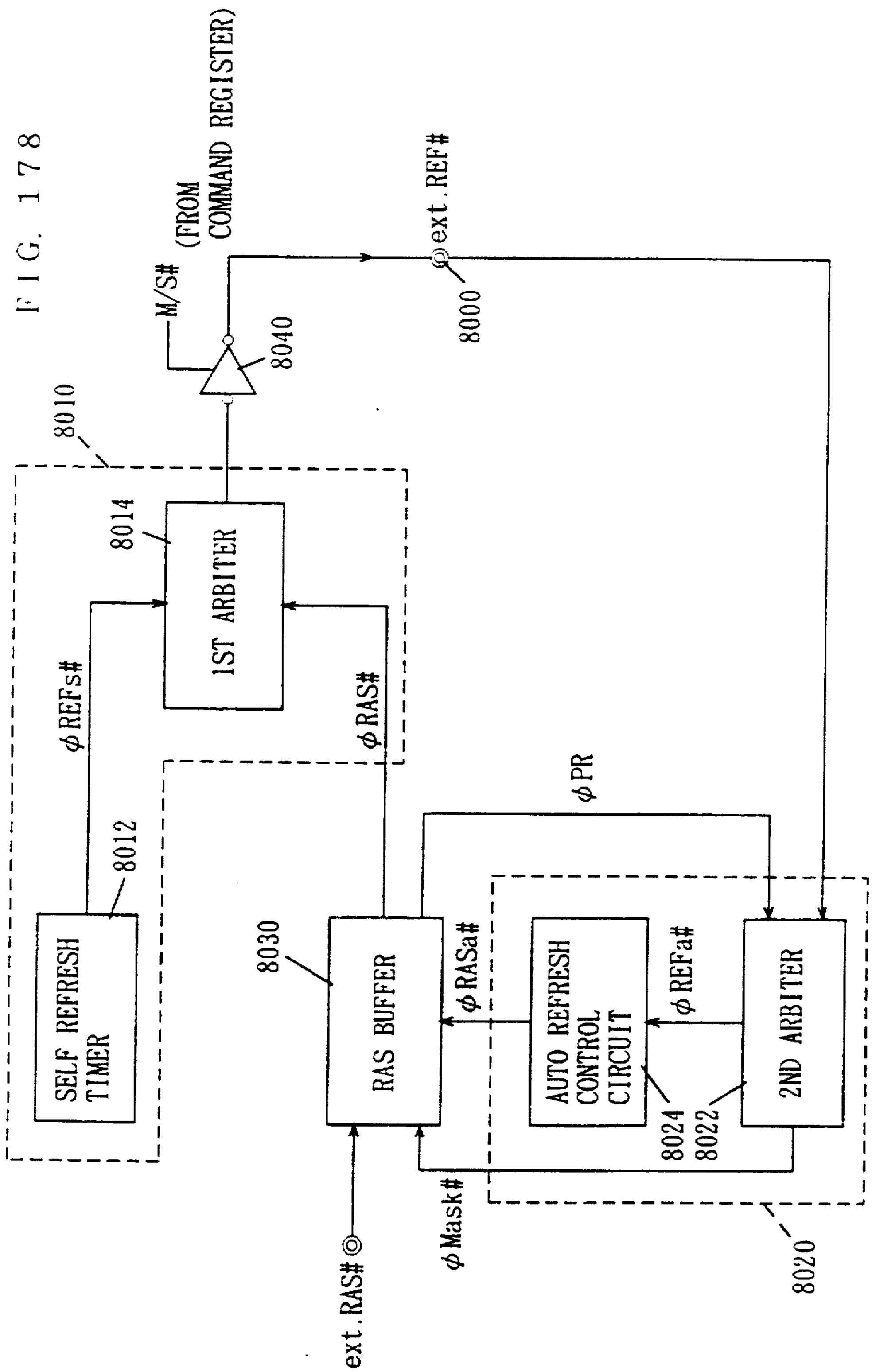

FIG. 178 shows structures of portions related to refreshing of the CDRAM shown in FIG. 177.

Figure 179:
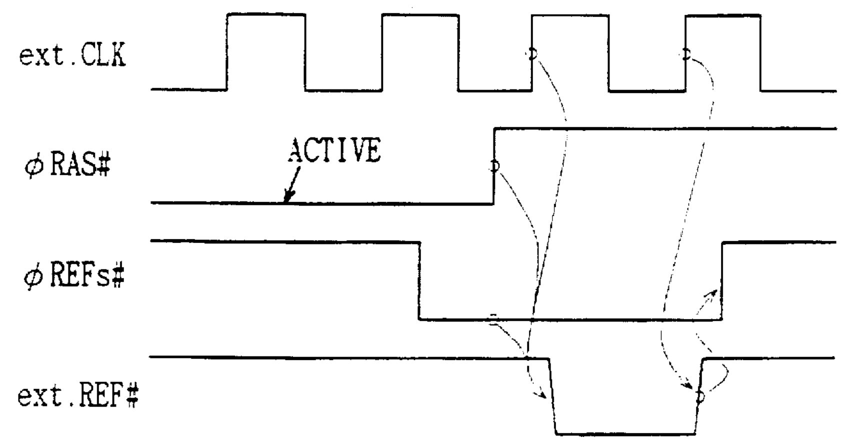

FIG. 179 is a diagram of signal waveforms showing the operation of the master portion of FIG. 178.

Figure 180:
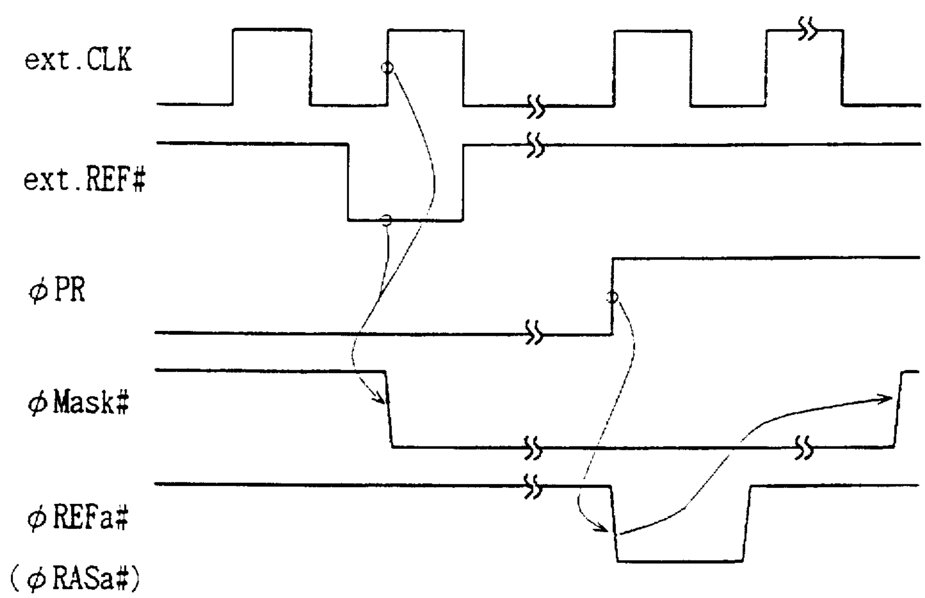

FIG. 180 is a diagram of signal waveforms showing the operation of the slave portion of FIG. 178.

FIG. 181 shows a structure for generating a precharge completion signal shown in FIG. 178.

FIG. 182 is a diagram of a signal waveforms showing the operation of the circuit shown FIG. 181.

FIG. 183 shows a modification of the circuit shown in FIG. 181.

Figure 184:
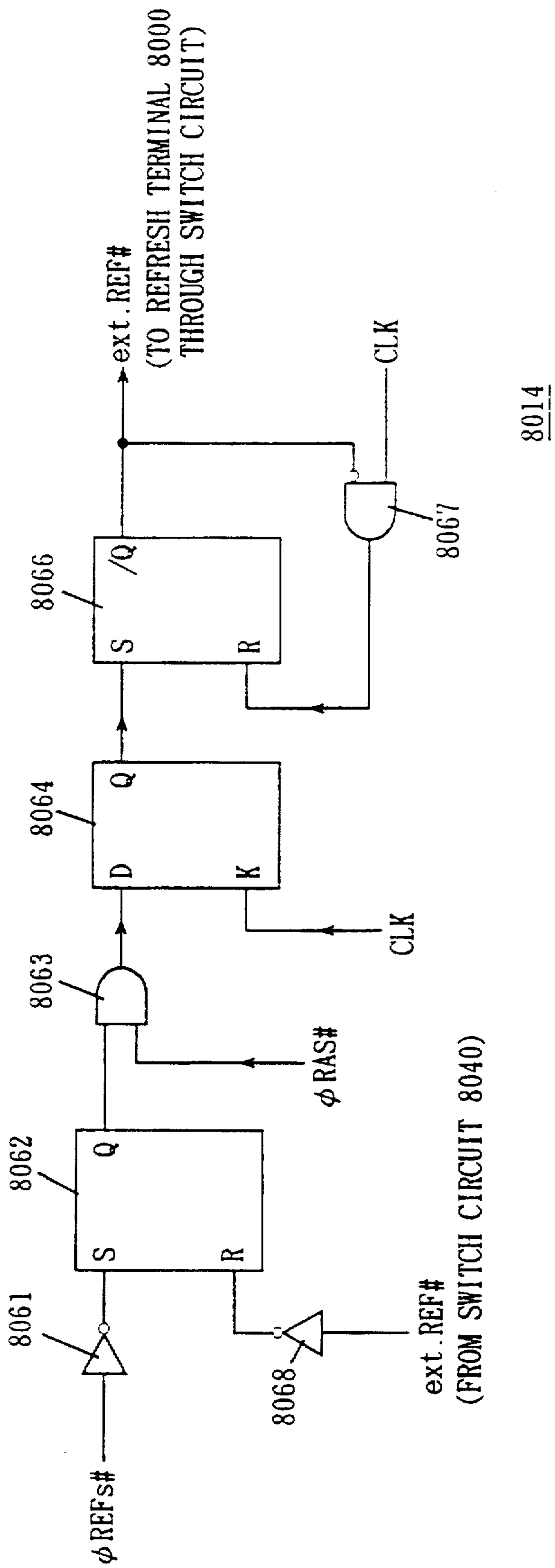

FIG. 184 shows an example of the first arbiter structure shown in FIG. 178.

Figure 185:
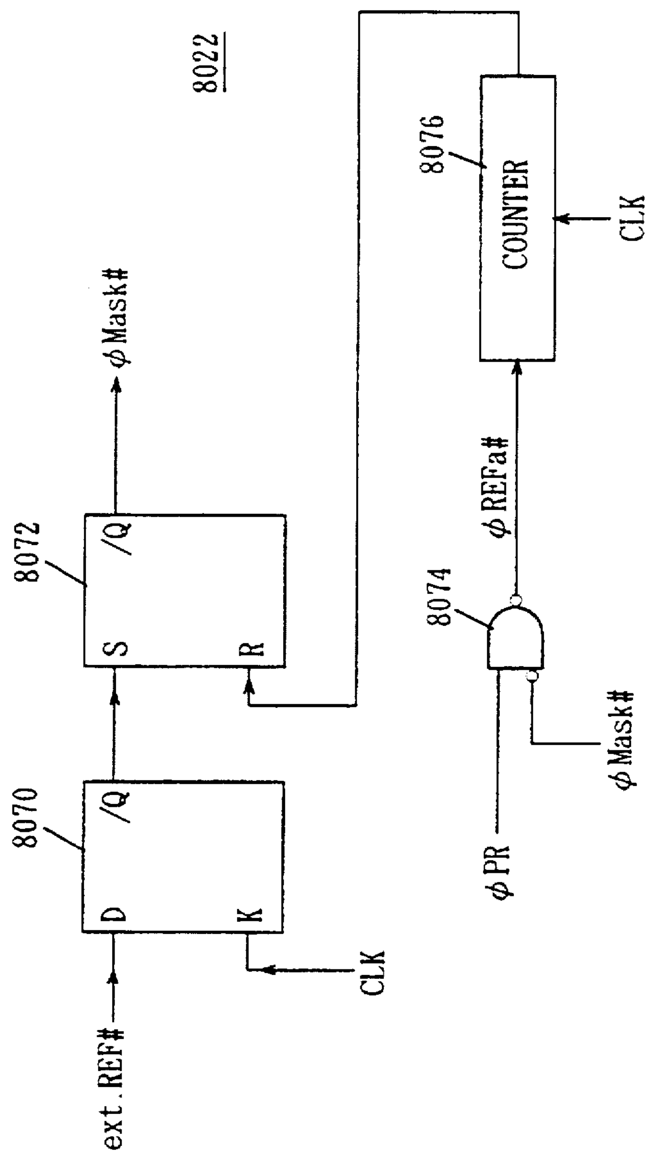

FIG. 185 shows an example of the second arbiter structure shown in FIG. 178.

Figure 186:
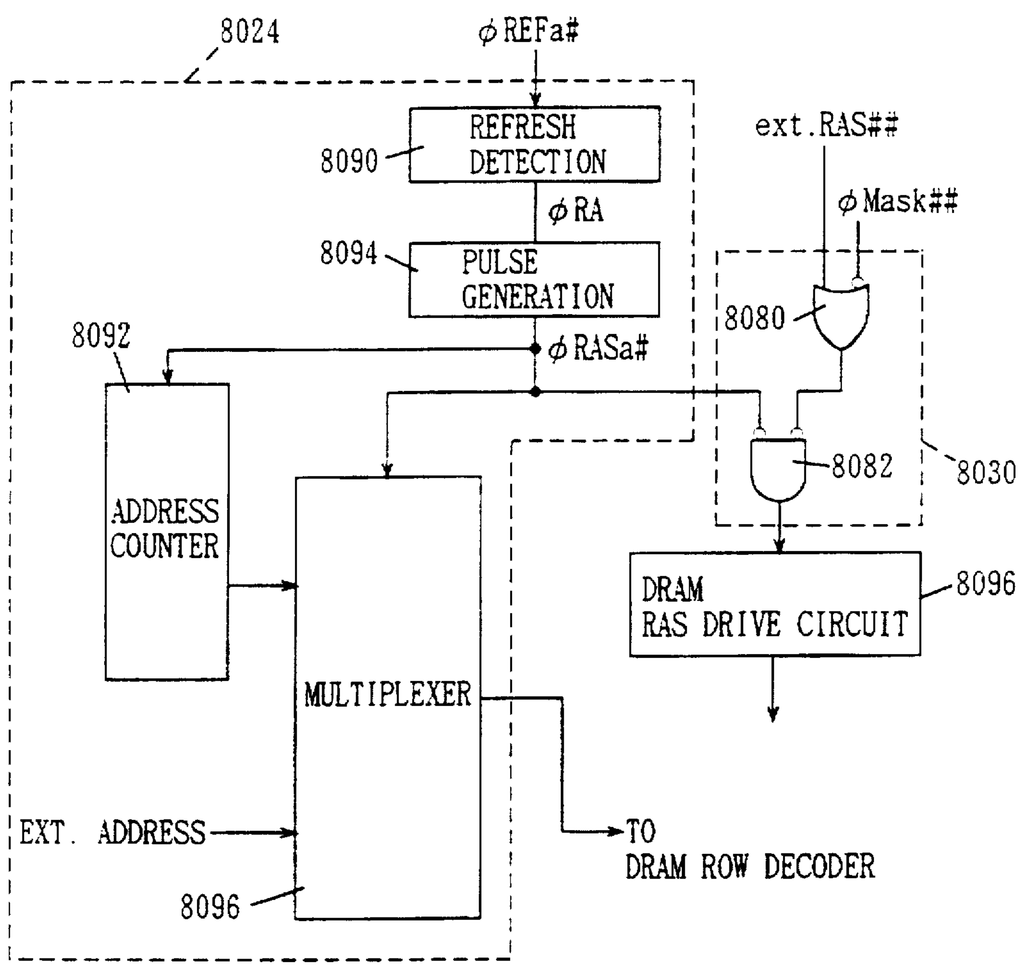

FIG. 186 shows an example of a structure of the RAS buffer and the refresh control circuit shown in FIG. 178.

Figure 187:
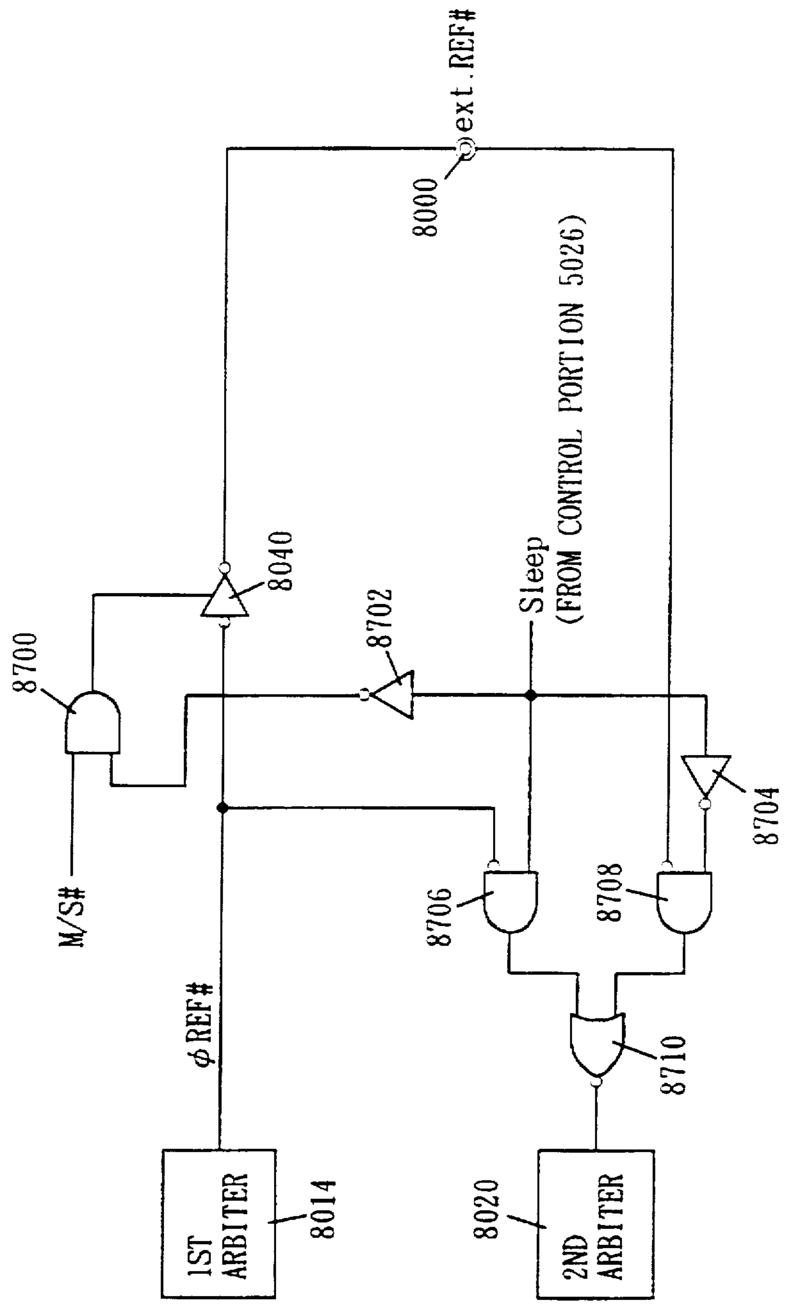

FIG. 187 shows a structure of another embodiment of the refresh control system.

FIG. 188 shows another example of the structure of the memory system having the synchronous self refresh function.

Figure 189:
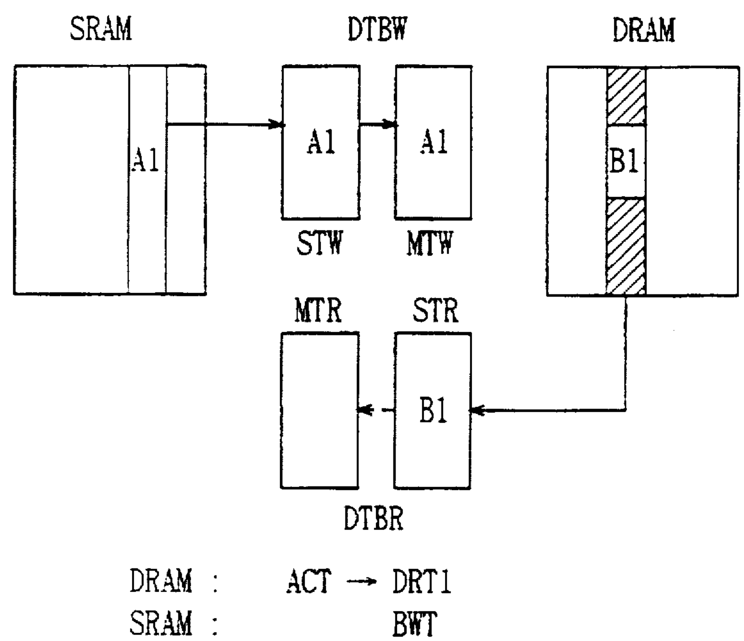

FIG. 189 shows an example of data transfer operation between the DRAM array and the SRAM array.

Figure 190:
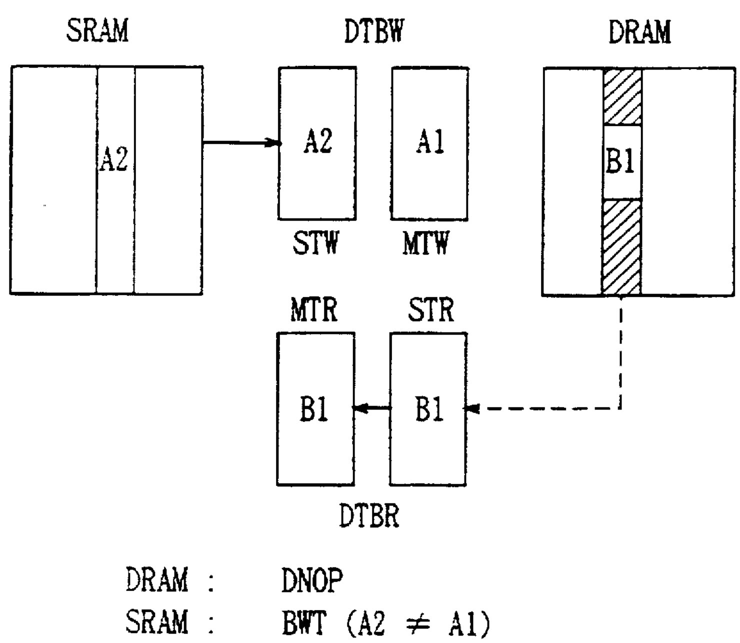

FIG. 190 shows a second step of data transfer operation between the DRAM array and the SRAM array.

Figure 191:
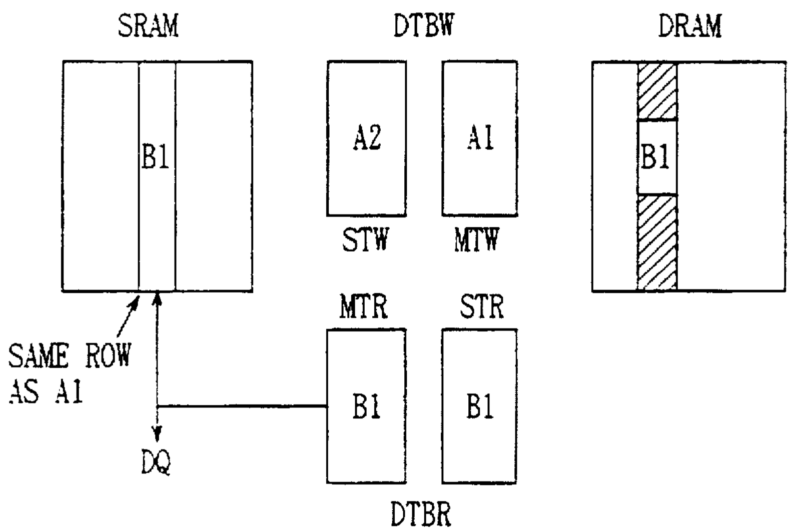

FIG. 191 shows a third step of data transfer operation between the DRAM array and the SRAM array.

Figure 192:
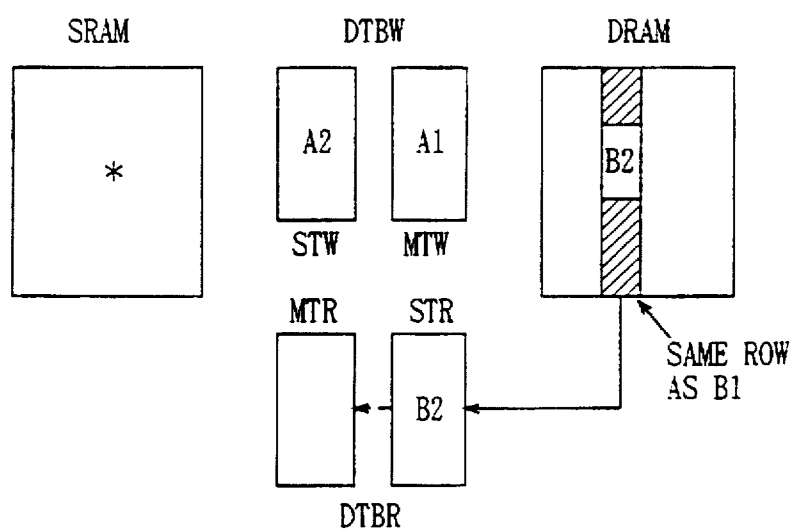

FIG. 192 shows the fourth step of data transfer operation between the DRAM array and the SRAM array.

Figure 193:
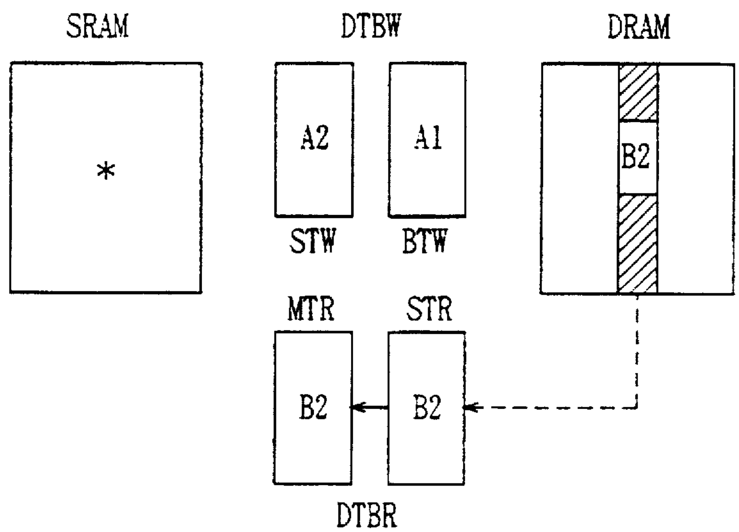

FIG. 193 shows the fifth step of data transfer operation between the DRAM array and the SRAM array.

Figure 194:
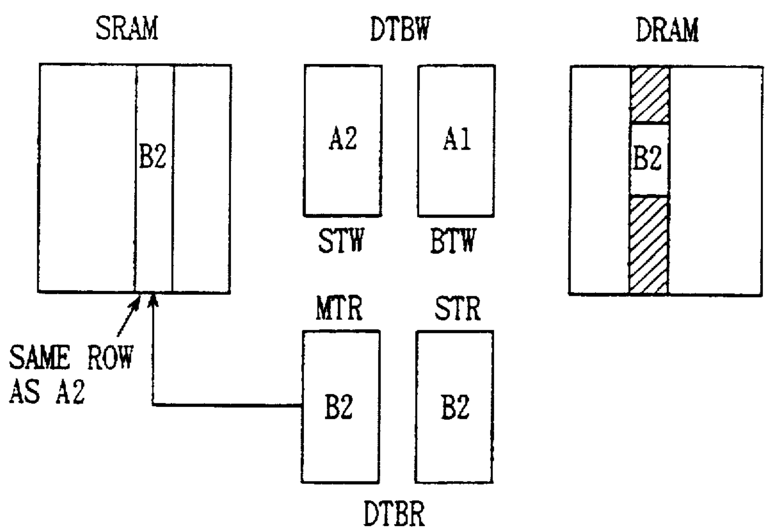

FIG. 194 shows a sixth step of data transfer operation between the DRAM array and the SRAM array.

FIG. 195 shows the seventh step of data transfer operation between the DRAM array and the SRAM array.

FIG. 196 shows the eighth step of data transfer operation between the DRAM array and the SRAM array.

Figure 197:
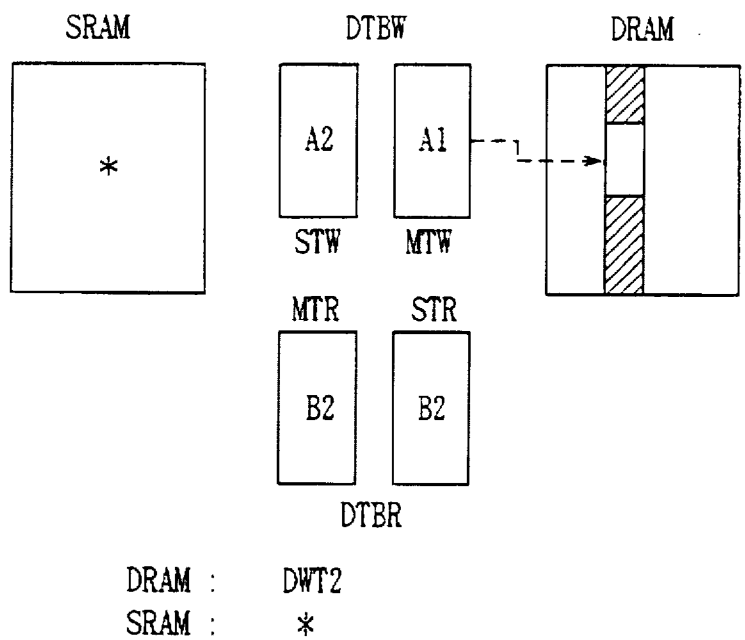

FIG. 197 shows the ninth step of data transfer operation between the DRAM array and the SRAM array.

Figure 198:
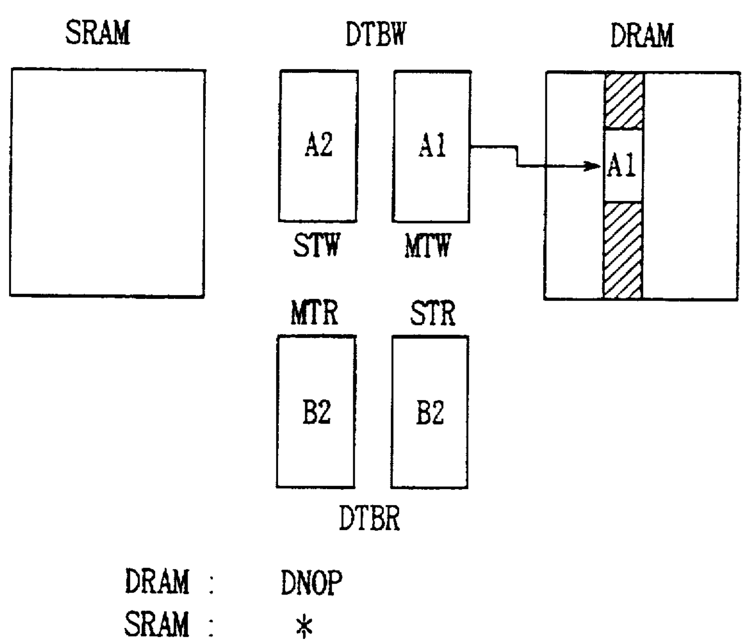

FIG. 198 shows the tenth step of data transfer operation between the DRAM1 array and the SRAM array.

Figure 199:
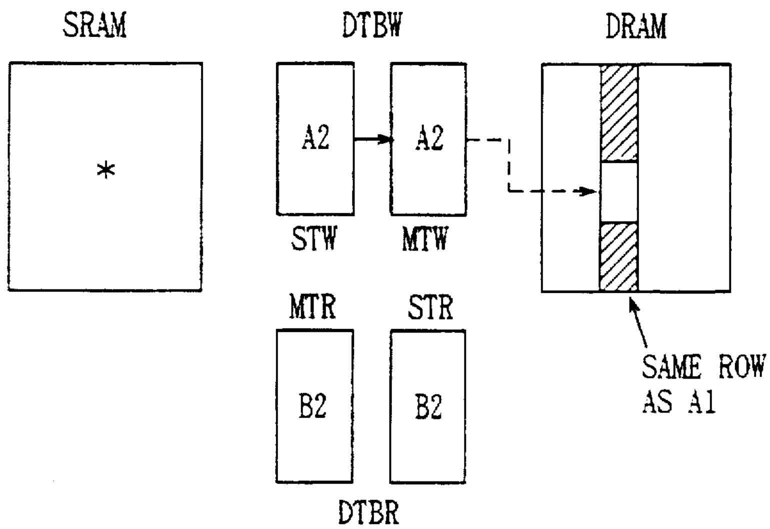

FIG. 199 shows the eleventh step of data transfer operation between the DRAM array and the SRAM array.

Figure 200:
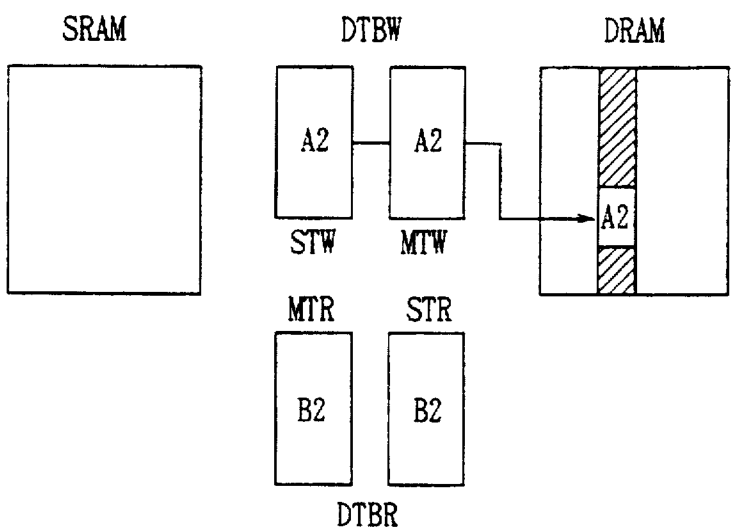

FIG. 200 shows the twelfth step of data transfer operation between the DRAM array and the SRAM array.

FIG. 201 is a timing chart showing data transfer sequence between the DRAM array and the SRAM array.

FIG. 202 shows data transfer sequence between the DRAM array and the SRAM array.

FIG. 203 is a timing chart of the data transfer operation sequence between the DRAM array and the SRAM array.

FIG. 204 is a timing chart showing data transfer operation sequence between the DRAM array and the SRAM array.

Figures 205, 206:
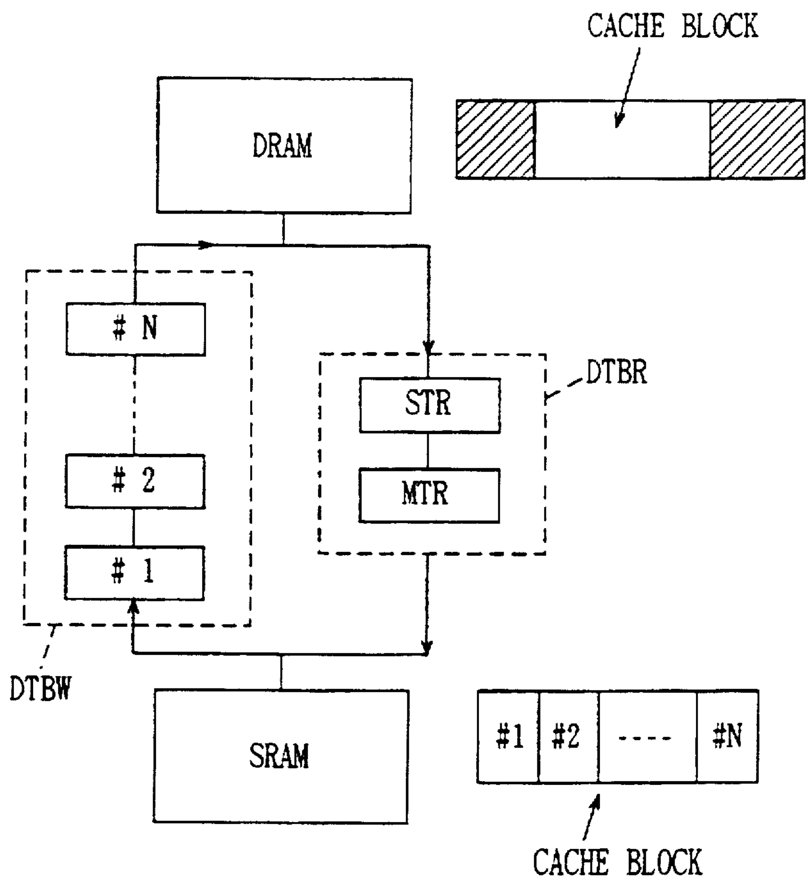

FIG. 205 shows an example of correspondence between the read transfer instruction and the external control signals.

FIG. 206 shows another example of the structure of the data transfer circuit from the SRAM array to the DRAM array.

Figure 207:
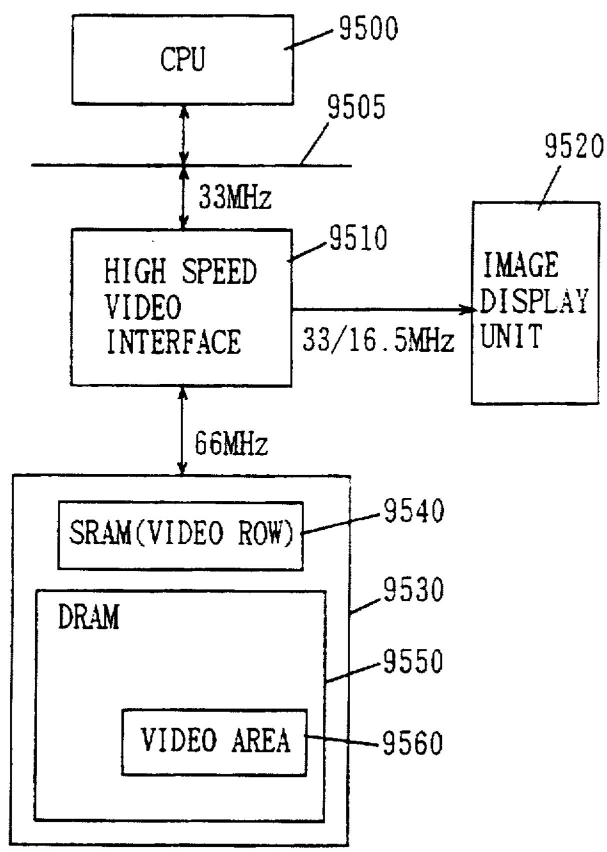

FIG. 207 shows an example of the image processing system employing the CDRAM in accordance with the present invention.

Figure 208:
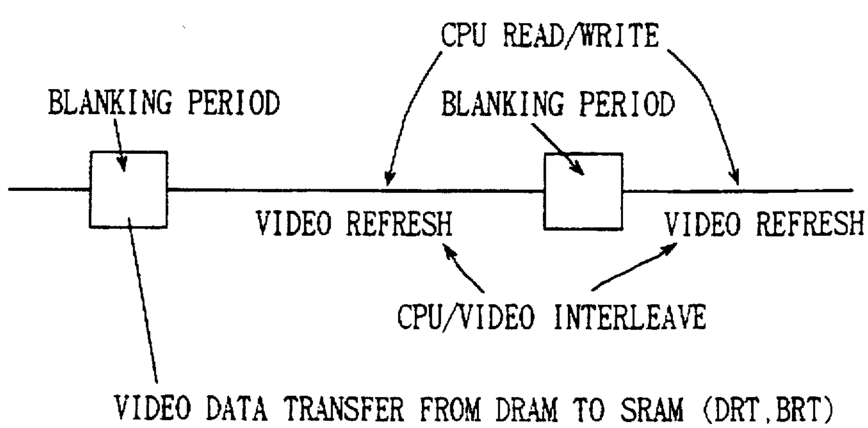

FIG. 208 schematically shows the operation of the image processing system shown in FIG. 207.

Figure 209:
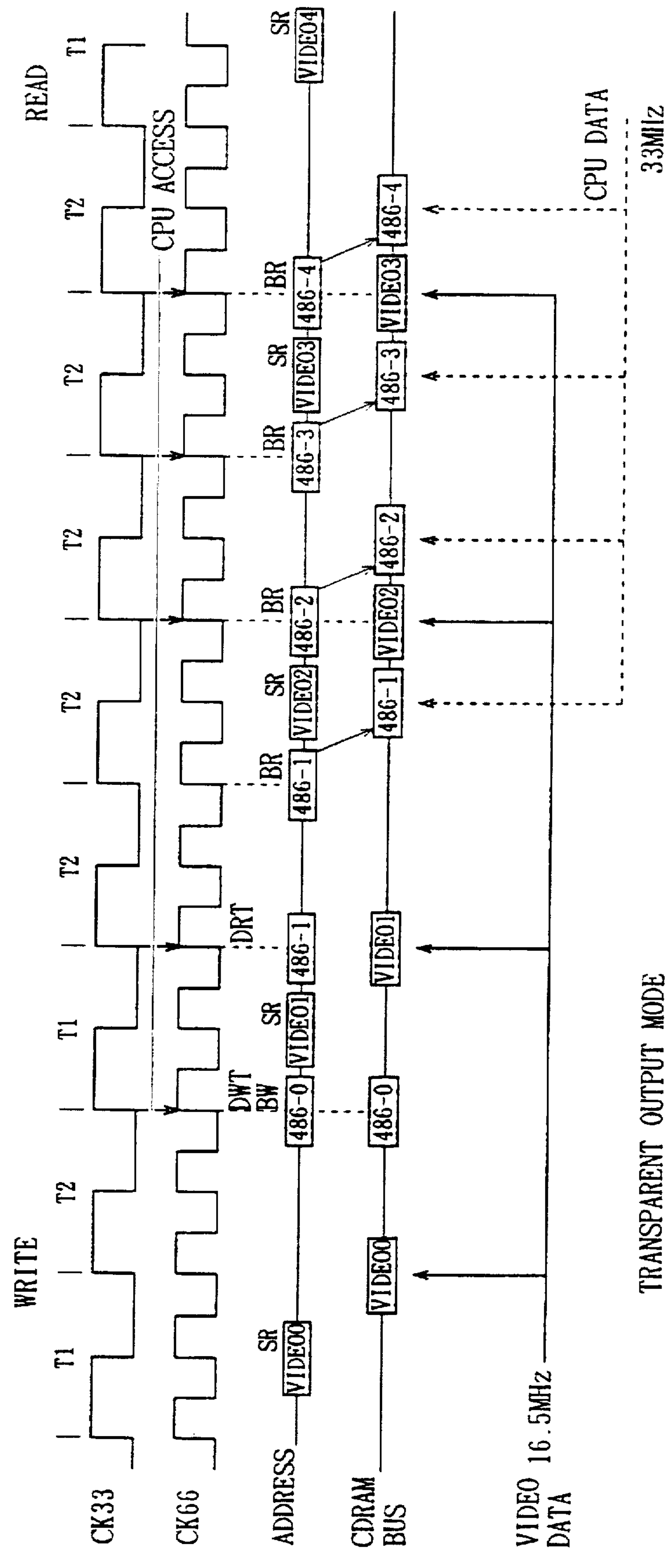

FIG. 209 is a timing chart showing the access sequence of the CDRAM in the image processing system shown in FIG. 207.

Figure 210:
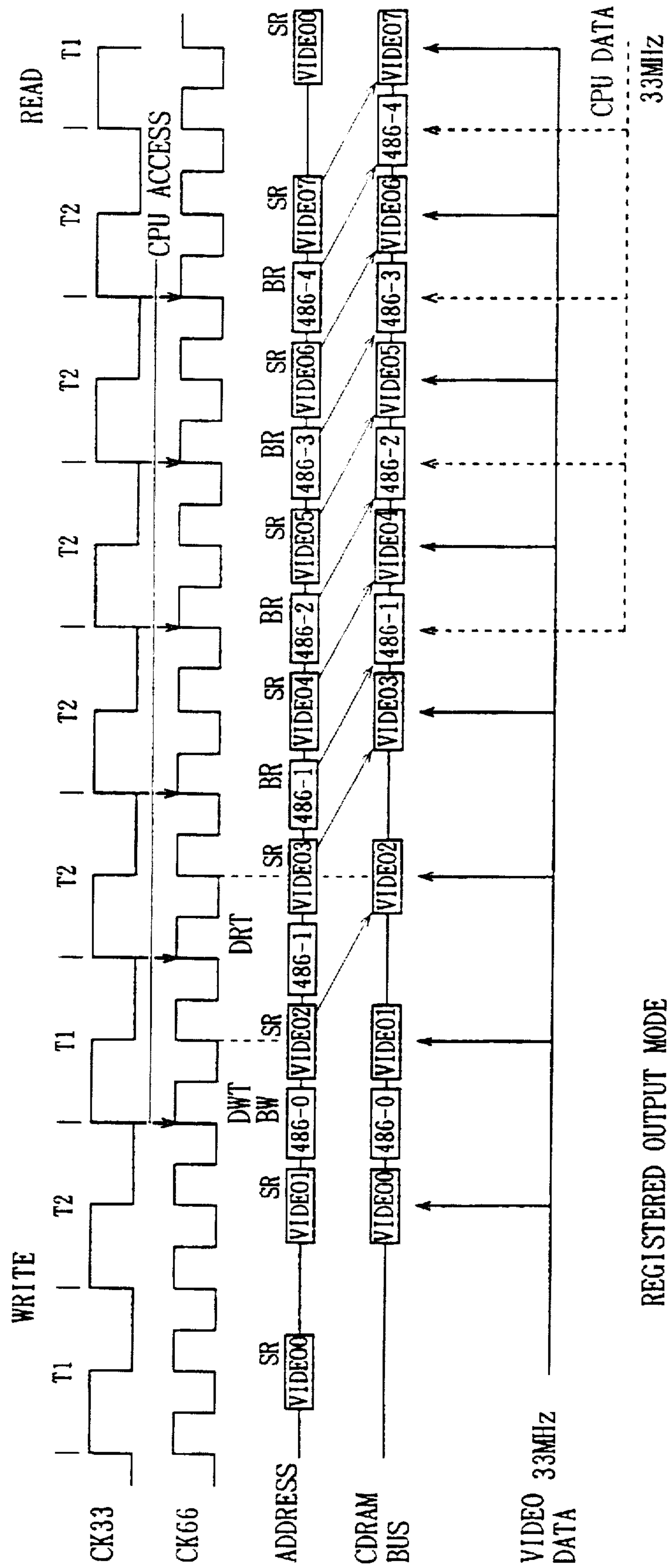

FIG. 210 is a timing chart showing the access sequence of the CDRAM in the image processing system shown in FIG. 207.

Figures 211A, 211B, 211C:
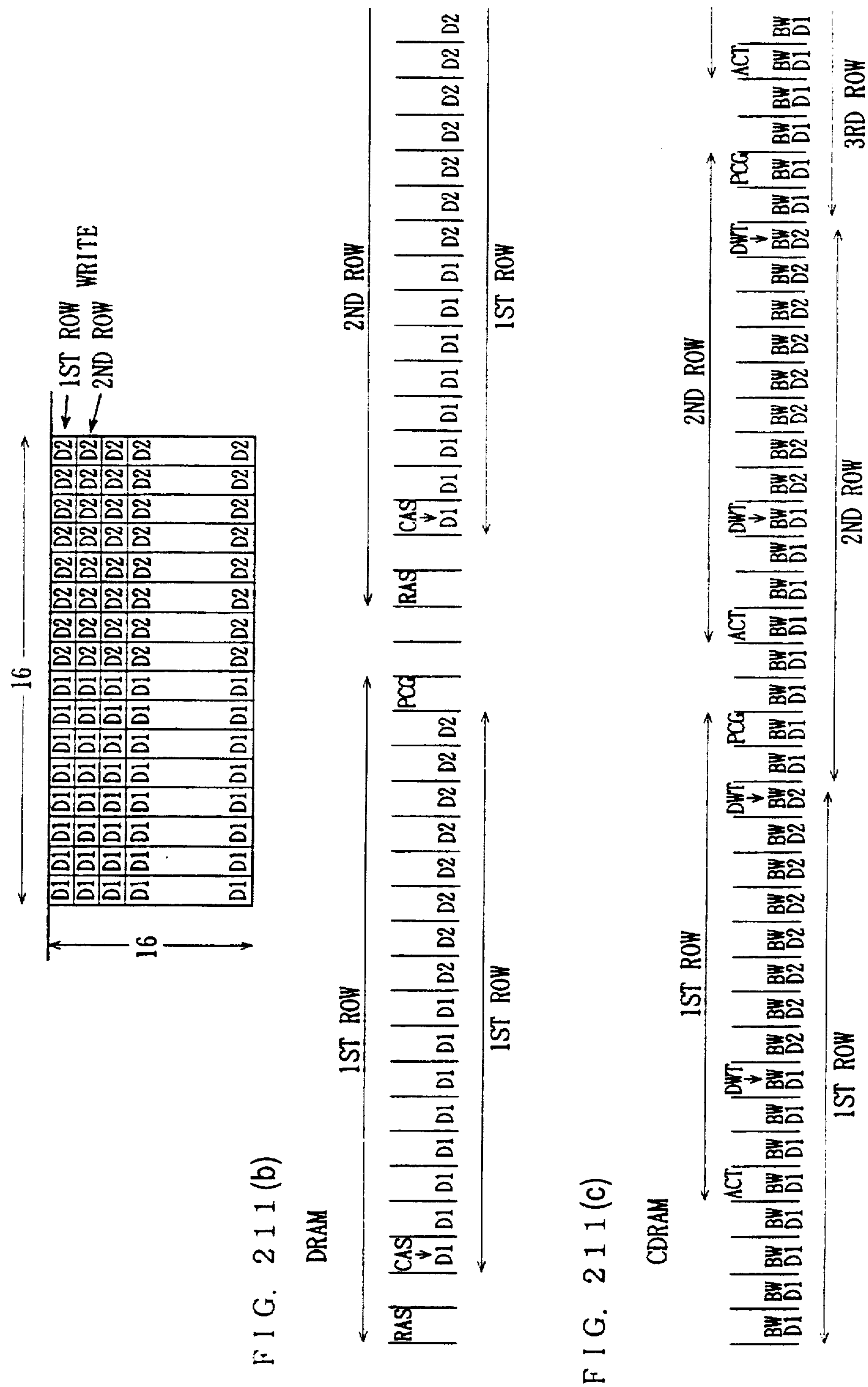

FIG. 211 is a timing chart showing an operation sequence of writing video data to the CDRAM.

Figures 212A, 212B, 212C:
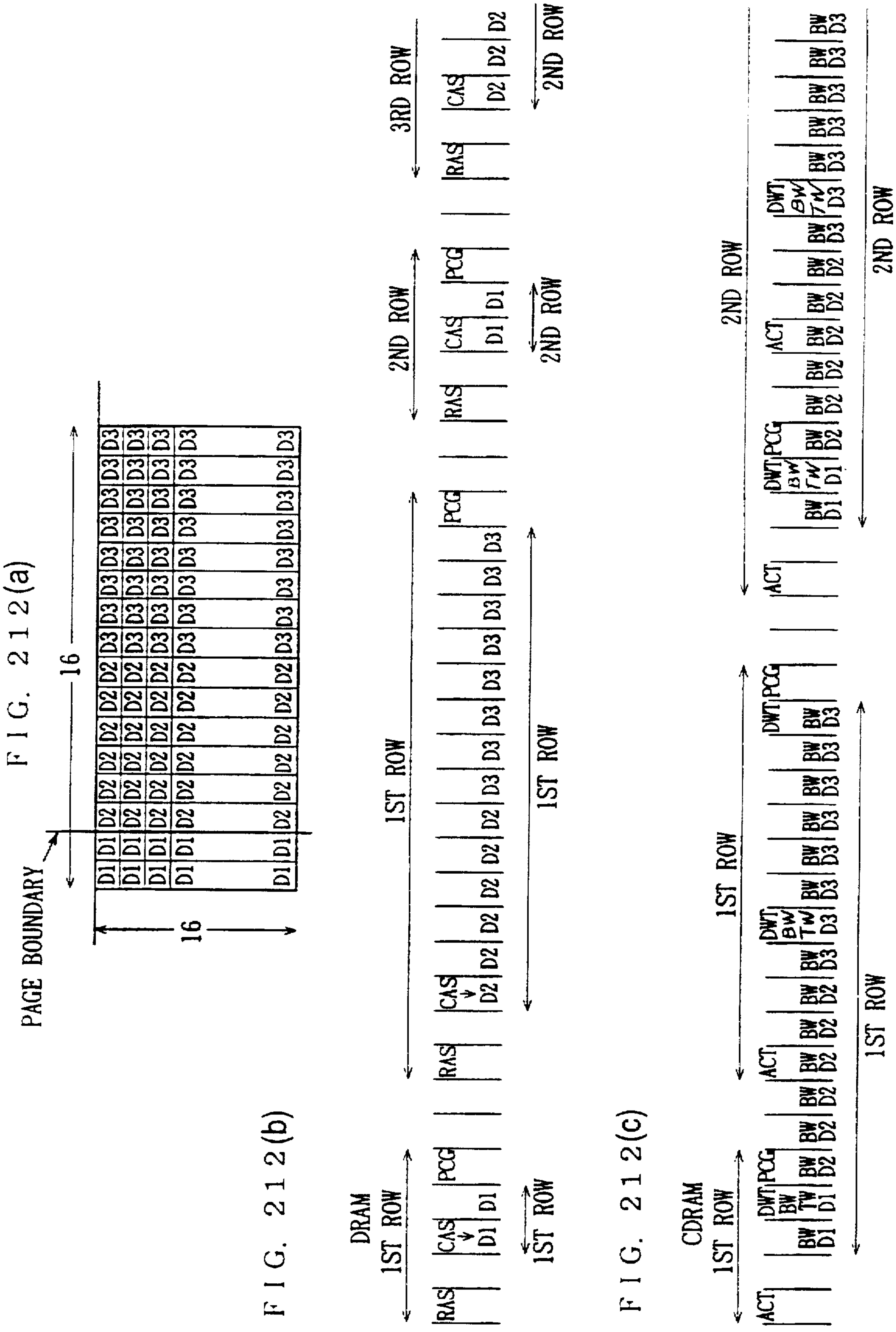

FIG. 212 is a timing chart showing video data writing operation to the CDRAM and the DRAM.

Figures 213A, 213B, 213C:
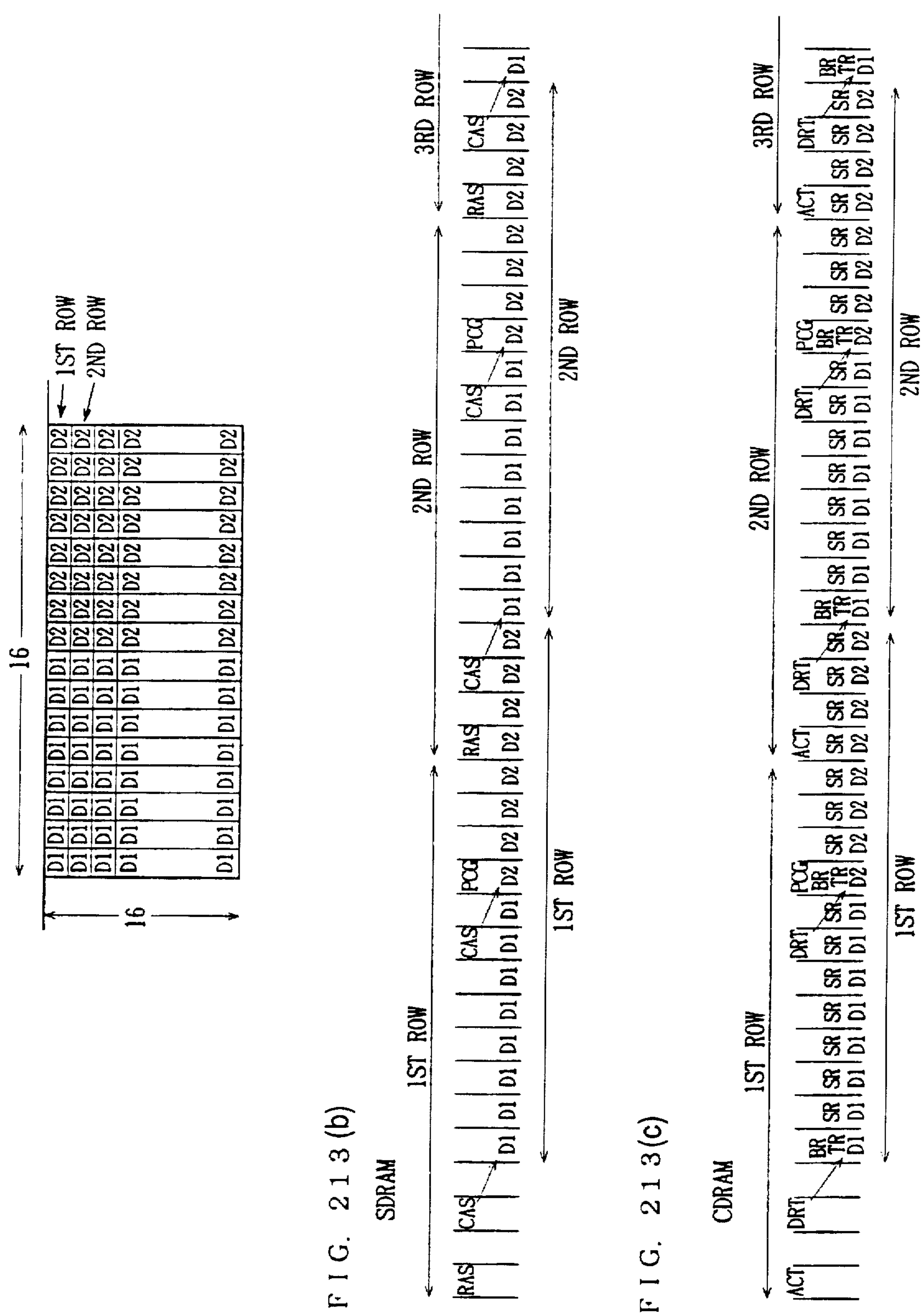

FIG. 213 is a timing chart showing an operation of reading video data of the SDRAM and CDRAM.

Figures 214A, 214B, 214C:
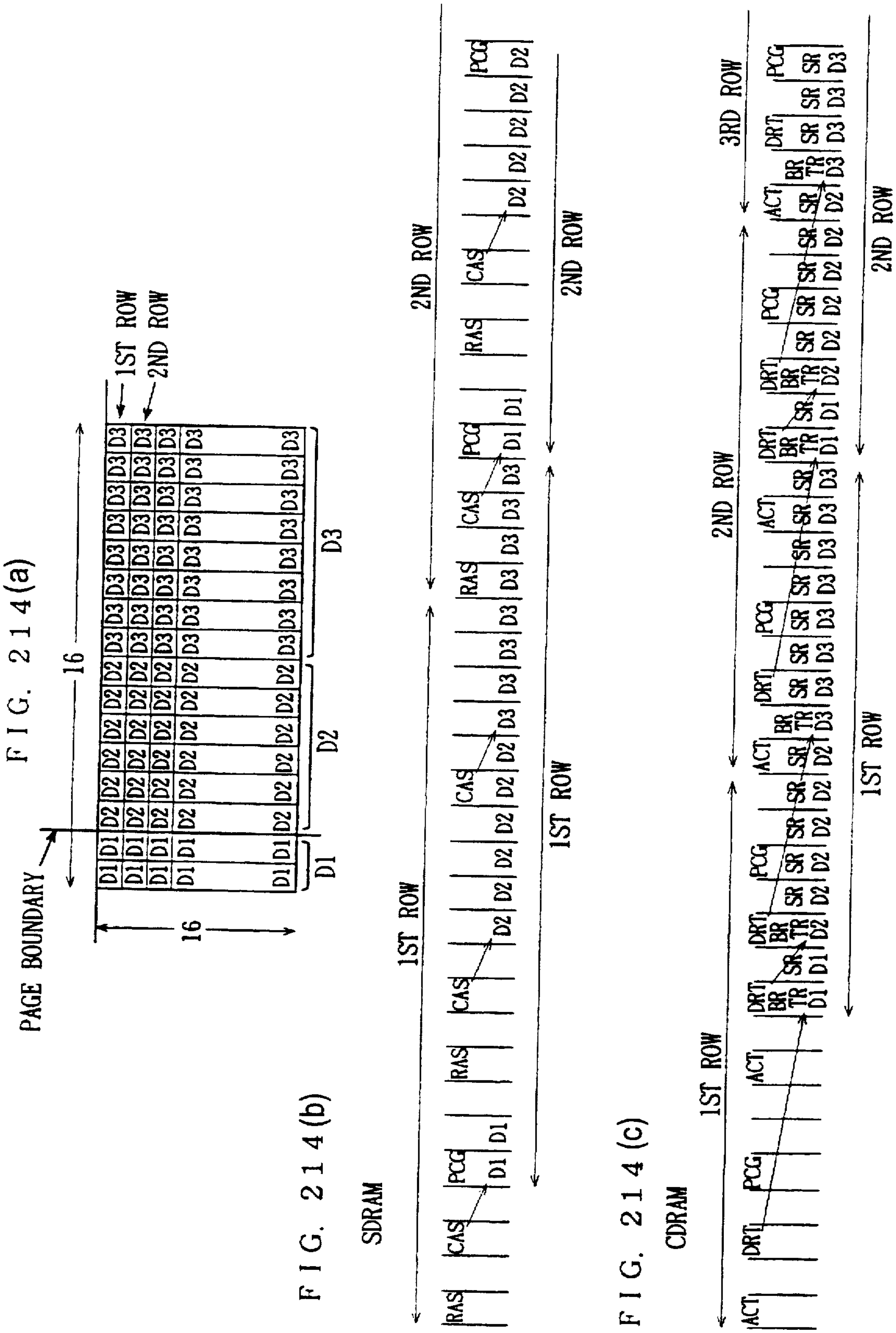

FIG. 214 is a timing chart showing an operation of video data writing to the SDRAM and CDRAM.

Figures 215A, 215B, 215C:
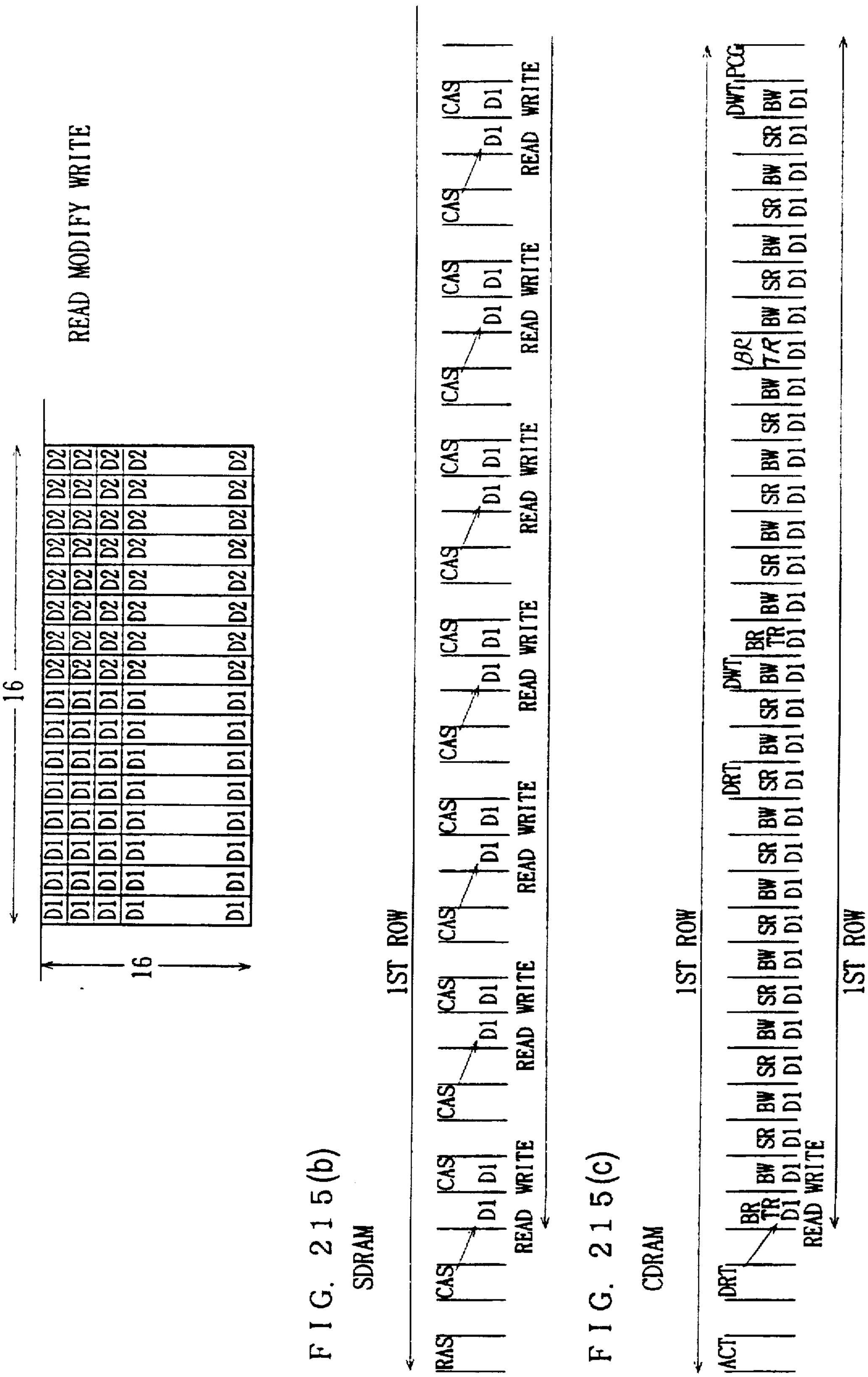

FIG. 215 is a timing chart showing read modify write operation on the video data of the SDRAM and CDRAM.

Figures 216A, 216B, 216C:
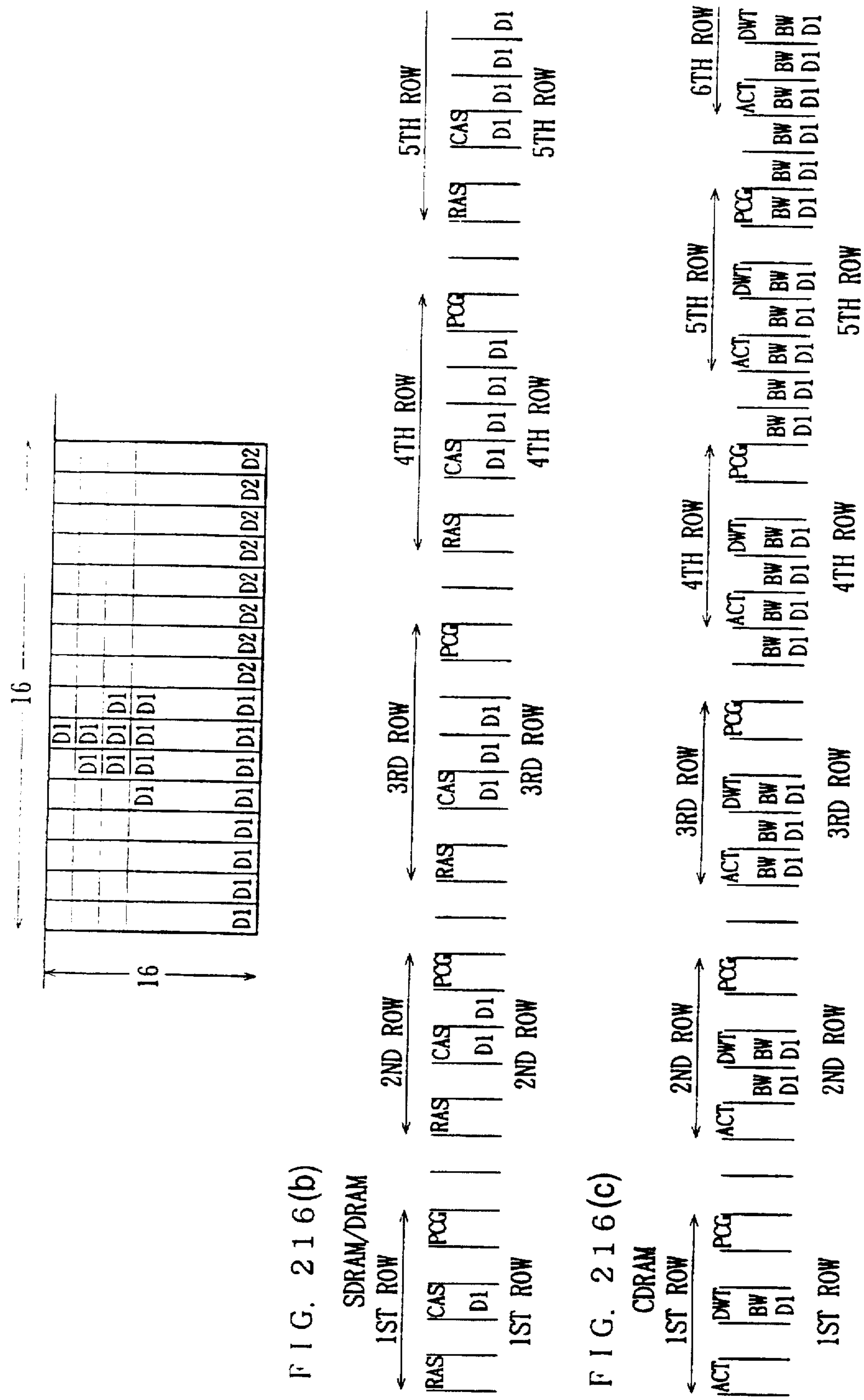

FIG. 216 is a timing chart showing operation of writing the video data to the SDRAM/DRAM and the CDRAM.

FIG. 217 shows a whole structure of a conventional semiconductor memory device containing a cache.

Figure 218:
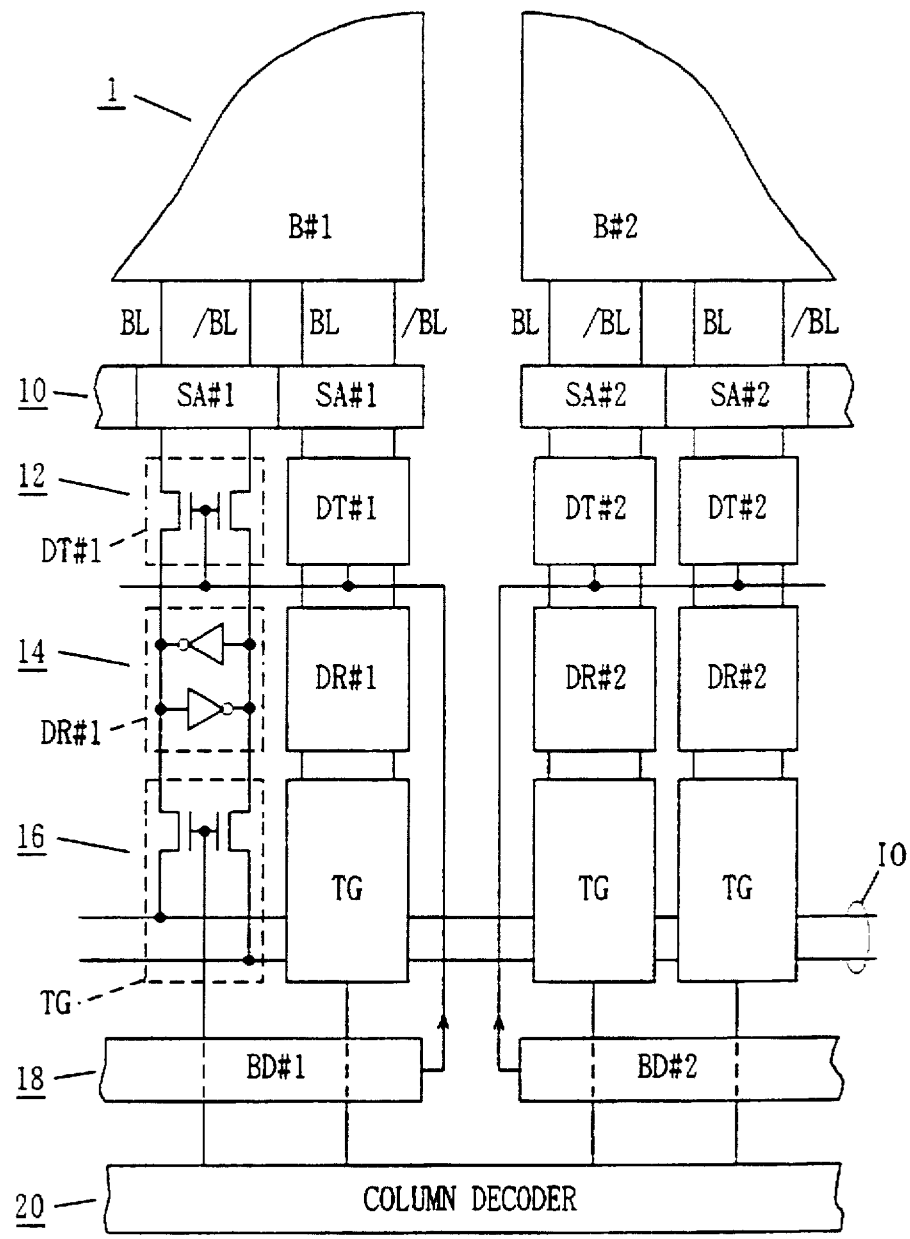

FIG. 218 shows a structure of a main portion of the semiconductor memory device shown in FIG. 217.

Figure 219:
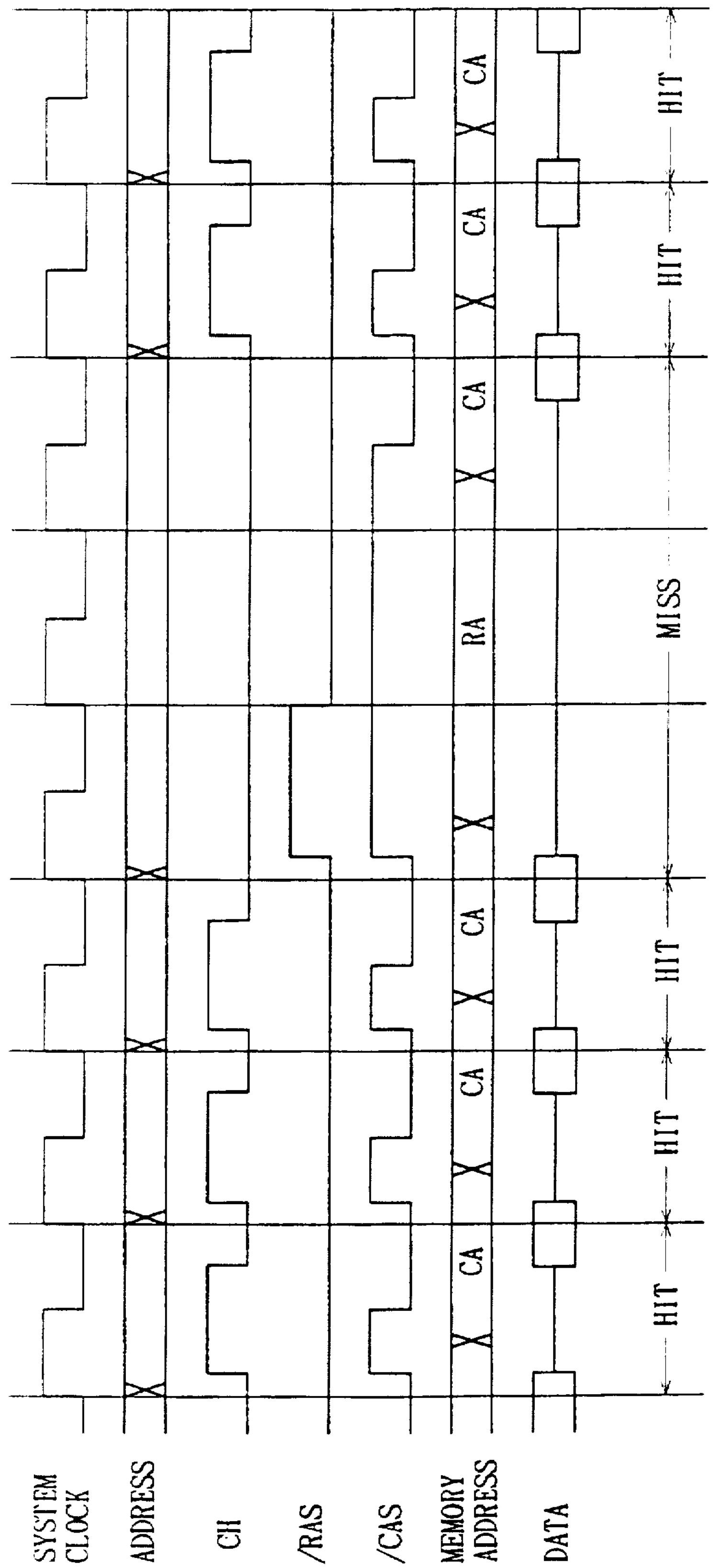

FIG. 219 is a diagram of waveform showing the operation sequence of the conventional semiconductor memory device containing a cache.

Figure 220:
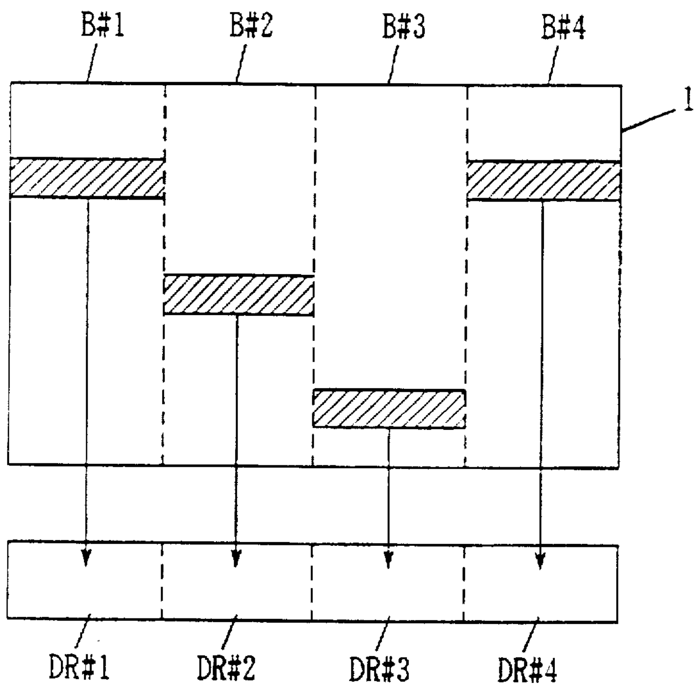

FIG. 220 schematically shows data transfer in the conventional semiconductor memory device containing a cache.

Figure 221:
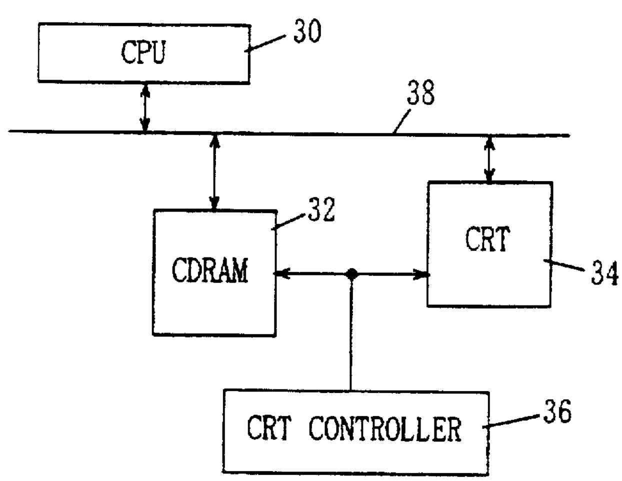

FIG. 221 shows an example of a structure of a data processing system including a display, using a semiconductor memory device containing a cache.

DESCRIPTION OF THE PREFERRED EMBODIMENTS

Embodiment 1

FIG. 1 is a block diagram showing a whole structure of a semiconductor memory device in accordance with one embodiment of the present invention. The semiconductor memory device includes a DRAM portion and an SRAM portion which SRAM portion is used as a cache memory, and therefore it will be referred to as a semiconductor memory device containing a cache (CDRAM) in the following description.

Referring to FIG. 1, a CDRAM 100 includes a DRAM array 102 including a plurality of dynamic memory cells arranged in a matrix of rows and columns, an SRAM array 104 including a plurality of static memory cells arranged in a matrix of rows and columns, and a data transfer circuit 106 for transferring data between DRAM array 102 and SRAM array 104. CDRAM 100 has a structure allowing input/output of data on 4 bits by 4 bits basis, and therefore DRAM array 102 includes four memory planes 102a, 102b, 102c and 102d. Memory planes 102a to 102d of the DRAM array correspond respectively to different bits of data bits which are input/output at one time.

SRAM array 104 similarly includes four memory planes 104a, 104b, 104c and 104d. Data transfer circuit 106 also includes four planes 106a, 106b, 106c and 106d in order to transfer data between the DRAM array memory planes 102a to 102d and the SRAM array memory planes 104a to 104d, plane by plane. CDRAM 100 includes a DRAM address buffer 108 receiving externally applied. DRAM addresses Ad0 to Ad11 for generating internal addresses, a row decoder 110 receiving internal row addresses ROW0 to ROW11 from DRAM address buffer 108 for selecting a corresponding row of the DRAM array 100, a column block decoder 112 receiving prescribed bits of the internal column address signals from the DRAM address buffer, that is, column block addresses Col4 to 9 for simultaneously selecting a plurality of columns (in this embodiment, 16 bits of memory cells) in the DRAM array, a sense amplifier for detecting and amplifying data of the memory cells selected in the DRAM array, and an IC) control for transferring data between the selected memory cell in the DRAM array 102 and the data transfer circuit, in order to drive the DRAM array. In FIG. 1, the sense amplifier and the IO control are represented by one block 114 in FIG. 1.

DRAM address buffer 108 receives in multiplexed manner the row and column addresses. 4 bits of data of the addresses Ad0 to Ad3 are used as commands for designating data transfer mode in the data transfer circuit and for designating set/reset of mask data when masking is to be effected.

CDRAM 100 further includes an SRAM address buffer 116 receiving externally applied SRAM address signals As0 to As11 for generating internal addresses; a row decoder 118 decoding addresses As4 to As11 from SRKAM address buffer 116 for selecting a corresponding row of SRAM array 104; a column decoder 120 for decoding column addresses As0 to As3 from SRAM address buffer 116 for selecting a corresponding column of SRAM array 104 and for selecting a corresponding transfer gate of data transfer circuit 106; and an IO circuit for detecting and amplifying data of the selected memory cell of SRAM array 104 and for connecting the selected column of the SRAM array 104 and the selected gate to internal data bus by an output from column decoder 120.

The sense amplifier and IO circuit for the SRAM is shown by a block 122. One row of SRAM array 104 includes 16 bits. Data transfer is simultaneously carried out between 16 bits of one selected row of the SRAM array and data transfer circuit 106 including 16 transfer gates. Namely, in the CDRAM, transfer of 16 bits of data is carried out for one memory plane, and therefore a total of 64 bits of data can be transferred simultaneously.

CDRAM further includes a K buffer 124 for receiving an externally applied clock K which is, for example, a system clock for generating an internal clock; a clock mask circuit 126 for providing a mask in accordance with an externally applied mask signal CMd on the internal clock from K buffer 124; a I)RAM control circuit 128 taking in externally applied control signals RAS#, CAS# and DTD# in synchronization with the clock signal from clock mask circuit 126 for generating necessary control signals in accordance with the states of respective signals; a clock mask circuit 130 for providing a mask on the internal clock signal from K buffer 124 in accordance with an externally applied control signal CMs; an SRAM control circuit 132 for taking in external control signals E#, WE#, CC1# and CC2# in accordance with the internal clock signal from clock mask circuit 130 for generating a control signal for controlling operations of data transfer circuit 106, SRAM array 104 and an input/output portion, which will be described later, in accordance with the combinations of the states of respective control signals; a main amplifier circuit 130 which is activated in synchronization with an externally applied control signal G# for generating an external read data from data on internal data bus 123; a Din buffer circuit 134 for taking in external write data in synchronization with the clock signal under control of the SRAM control circuit 132 for generating internal write data; and a mask set circuit 136 for taking in externally applied mask data for providing a mask on transmission of write data from Din buffer circuit 134 to internal data line 123. Mask set circuit 136 further takes in the mask data in synchronization with the clock signal under the control of SRAM control circuit 132.

CDRAM 100 can change the structure of data input/output. It has a DQ separation structure in which input data (write data) D and output data Q are transmitted through separate pin terminals, and a mask write mode in which write data D and read data (output data) Q are transmitted through the same pin terminal. Masking of the write data is possible only in the mask write mode in which data input and data output are carried out through the same pin terminal. Pin terminals to which write data D0 to D3 are applied in DQ separation arrangement are used as pin terminals for receiving mask data (mask enable) M0 to M3 in the mask write mode. Though not explicitly shown in the drawings for the sake of simplicity, setting of pin terminals is effected by a command register, which will be described later.

[Definitions of External Control Signals]

In CDRAM 100 shown in FIG. 1, input of data and taking of external control signals are all carried out in synchronization with the external clock K. External control signals are all applied in the form of pulses. The operation mode is determined dependent on the combination of states of the external control signals at a rising edge of the external clock signal. Input of the external control signal G# only is carried out asynchronously with the clock K. Various external control signals will be described in the following.

Master clock K: the master clock K determines the basic timing, that is the timing for taking the input signals and operating clock frequency of the CDRAM 100. Timing parameters of each of the necessary external signals (except for G#, which will be described later) are defined using the rising or falling edge of the master clock K as a reference.

DRAM clock mask CMd: the DRAM clock mask CMd controls transmission of an internal DRAM master clock generated from K buffer 124. When DRAM clock mask is in an active state at a rising edge of external clock K, generation of the internal DRAM master clock in the next clock cycle is stopped. Accordingly, the operation for taking in control signals of the DRAM portion in the next cycle are stopped, thus reducing power consumption in the DRAM portion.

Row address strobe RAS#: the row address strobe RAS# is used with the master clock K (dependent on the states of signals CMd, CAS# and DTD# at that time) to activate the DRAM portion. More specifically, it triggers latching the DRAM row address, selecting a row in the DRAM 102, and starting a precharge cycle for setting the DRAM portion to the initial state, and it can also be used for transferring data between the DRAM and the data transfer circuit, setting of data in the command registers, starting the auto refresh cycle, generating a DRAM NOP cycle and stopping the operation (power down) of the DRAM portion. Namely, the row address strobe RAS# determines basic operation cycle in the DRAM portion.

Column address strobe CAS#: column address strobe CAS# is used together with the master clock K for latching the column address for the DRAM. When the row address strobe RAS# has been previously applied in the DRAM access cycle, data transfer from the data transfer circuit to the DRAM array or data transfer from the DRAM array to the data transfer circuit is carried out in accordance with a control signal DTD#, which will be described later, by the successively applied column address strobe CAS#.

Data transfer designation DTD#: data transfer designation DTD# determines data transfer and the direction thereof between the DRAM array 102 and data transfer circuit 106. If the row address strobe RAS# is at "L" in the preceding cycle, then a DRAM write transfer cycle in which data transfer from the data transfer circuit to the DRAM array is carried out when the column address strobe CAS# and the data transfer designation DTD# are both at "L" at the rising edge of the master clock K. If the data transfer designation DTD# is at "H", data transfer from the DRAM array to the data transfer circuit is carried out. When the data transfer designation DTD# falls to "L" in synchronization with the row address strobe RAS#, the DRAM enters the precharge mode, and access to every DRAM portion is inhibited until the completion of the precharge cycle.

DRAM address Ad0 to Ad11: DRAM array 102 has a storage capacity of 16M (mega) bits. One DRAM memory plane has a structure of 4K row×64 columns×16 blocks. One block includes 64 columns. DRAM address bits Ad0 to AD11 are applied as the DRAM row address and the DRAM column address in a multiplexed manner. When the row address strobe RAS# is at "L" at the rising edge of the master clock K, DRAM address bits Ad0 to Ad11 are taken as a row address, designating a row of the DRAM array. When the column address strobe CAS# is at "LI" at the rising edge of the master clock K, DRAM address bits Ad4 to Ad9 are used as a block address for designating 16 bits of memory cells (one bit from each of the 16 blocks) of the DRAM array. When the row address strobe RAS is at "L" at the rising edge of the master clock K, the refresh address when the refresh is instructed may be designated.

SRAM clock mask CMs: the SRAM clock mask controls transmission of an internal SRAM master clock (generated from a K buffer 124). When the SRAM clock mask is at an active state at the rising edge of the master clock K, the internal SRAM master clock is stopped in the next cycle, and the SRAM portion maintains the state of the previous cycle. The SRAM clock mask is also used for continuously maintaining the same input/output data.

Chip enable E#: chip enable E# controls the operation of the SRAM portion. When the chip enable E# is at "H" at the rising edge of the master clock K, the SRAM portion is set to the non-selected state (standby state) in that cycle. When the chip enable E# is at "L" at the rising edge of the master clock K (provided that the SRAM clock mask is "L" in the previous cycle), the SRAM portion is activated in that cycle. When the output enable (which will be described later) G# is at "L", chip enable E# controls the output impedance, and writing and reading of data in a common IO structure can be carried out.

Write enable WE#: write enable WE# controls data write and read operations in the SRAM portion and the data transfer circuit. When the chip enable E# is at "L" at the rising edge of the master clock K, reading of data from the data transfer circuit, and reading of data from the SRAM array and/or data transfer from the data transfer circuit to the SRAM array are carried out by the write enable WE# at "H" (determined dependent on the states of control signals CC1# and CC2#, which will be described later). When the write enable WE# is at "L" at this time, any of writing of data to the data transfer circuits, writing of data to the selected memory cells of the SRAM array, and transfer of data from the SRAM array to the data transfer circuit is carried out (determined by control signals CC1# and CC2#).

Control clocks CC1#, CC2#: these control clocks CC1# and CC2# control access to the SRAM portion and access to the data transfer circuit. When the chip enable E# is at "L" at the rising edge of the master clock K, the operation mode to be carried out is determined by the control clocks CC1# and CC2#. The operation mode will be briefly described below, and the details will be described later.

CC1#=CC2#="L"; a buffer read/write (WE#=H/L) cycle is carried out, and reading of data from the data transfer circuit/writing of data to the data transfer circuit is carried out.

CC1#="L" and CC2#="H"; a buffer read/write transfer and SRAM read/write cycle (WE#=H/L). In this cycle, data transfer is carried out between the data transfer circuit and the SRAM array, and reading or writing of data from or to SRAM array is carried out. Writing operation and reading operation are determined dependent on whether the write enable WE# is at "H" or "L".

CC1#="H", CC2#="L", buffer read/write transfer cycle (WE#=H/L) is carried out. Data transfer between the SRAM array and the data transfer circuit is carried out.

CC1#=CC2#="H"; SRAM read/write (WE#=H/L) cycle is carried out. Data reading/writing operation for the SRAM array is carried out.

SRAM addresses As0 to As11; SRAM array includes four memory planes each including memory cells arranged in 256 rows and 16 columns. When the SRAM array is used as a cache memory, the block size of the cache is 16×4 (4bits of IO). SRAM address bits As0 to As3 are used as a block address for selecting 1 bit in one cache block, while SRAM address As4 to As11 are used as a row address for selecting a row in the SRAM array.

Output enable G#: the output enable G# only is applied in non-synchronization with the master clock K. When the output enable G# attains "H", the output is set to a high impedance state both in the DQ separation mode and the common DQ mode.

Input/output DQ0 to DQ3: input/output DQ0 to DQ3 are the data of the CDRAM when the common DQ mode is selected by the command register. State of each data is controlled by output enable G# in non-synchronization with the master clock K. Output of data is carried out in any of the transparent mode, the latched mode and the registered mode, dependent on the content of the command register (which will be described later).

Inputs D0 to D3: These are input data when DQ separation mode is set by the command register. In data writing such as in the write buffer cycle or the write SRAM mode, input data D0 to D3 are latched at the rising edge of the master clock K.

Mask enable M0 to M3; These are enabled when the common DQ mode is set in the command register. Mask enable M0 to M3 correspond to input/output data DQ0 to DQ3, and determine whether or not the corresponding DQ bits are to be masked. Setting of the mask data is determined by the states of the mask enable M0 to M3 at the rising edge of the master clock K. Desired input data can be masked at the time of data writing to the data transfer circuit or to the SRAM array in the SRAM write cycle or in the buffer write cycle.

As is apparent from the above description of the control signals, control of operations related to the DRAM portion and control of the operations related to the SRAM portion of the CDRAM 100 are carried out independent from each other. Direct data writing and direct data reading to and from the data transfer circuit are possible. Therefore, the DRAM portion and the SRAM portion can be driven independent from each other to facilitate control. Data transfer utilizing a high speed mode such as the page mode of the DRAM can be implemented, access time can be reduced at the time of a cache miss, and the burst mode can be realized.

Since the data transfer circuit 106 can be externally access directly, the data stored in the SRAM array 104 is not influenced at all at the time of direct access from the outside to the data transfer circuit. Therefore, both graphic data and cache data (data used by the CPU, which is an external processing unit) can be stored in the DRAM array 102.

Referring again to FIG. 1, data transfer circuit 106 includes 16 transfer gates. Each transfer gate includes a read transfer buffer 104 for transferring data from the DRAM array 102 to the SRAM array or to an input/output portion; a temporary register 142 for storing write data on the SRAM array 104 or on the internal data bus 123; a write transfer buffer 144 for transferring data stored in the temporary register 142 to the DRAM array; and a mask register 146 for masking data transfer from the write transfer buffer 144 to the DRAM array.

In FIG. 1, CDRAM 100 receives the ground potential Vss and the supply potential Vcc. The supply potential Vcc may be utilized as an internal operational supply voltage of the CDRAM, or the supply voltage lowered internally may be used as the internal operational supply voltage. Various operations carried out by the CDRAM will be described in the following, followed by detailed description of the structures of various portions of the CDRAM.

Figure 2:
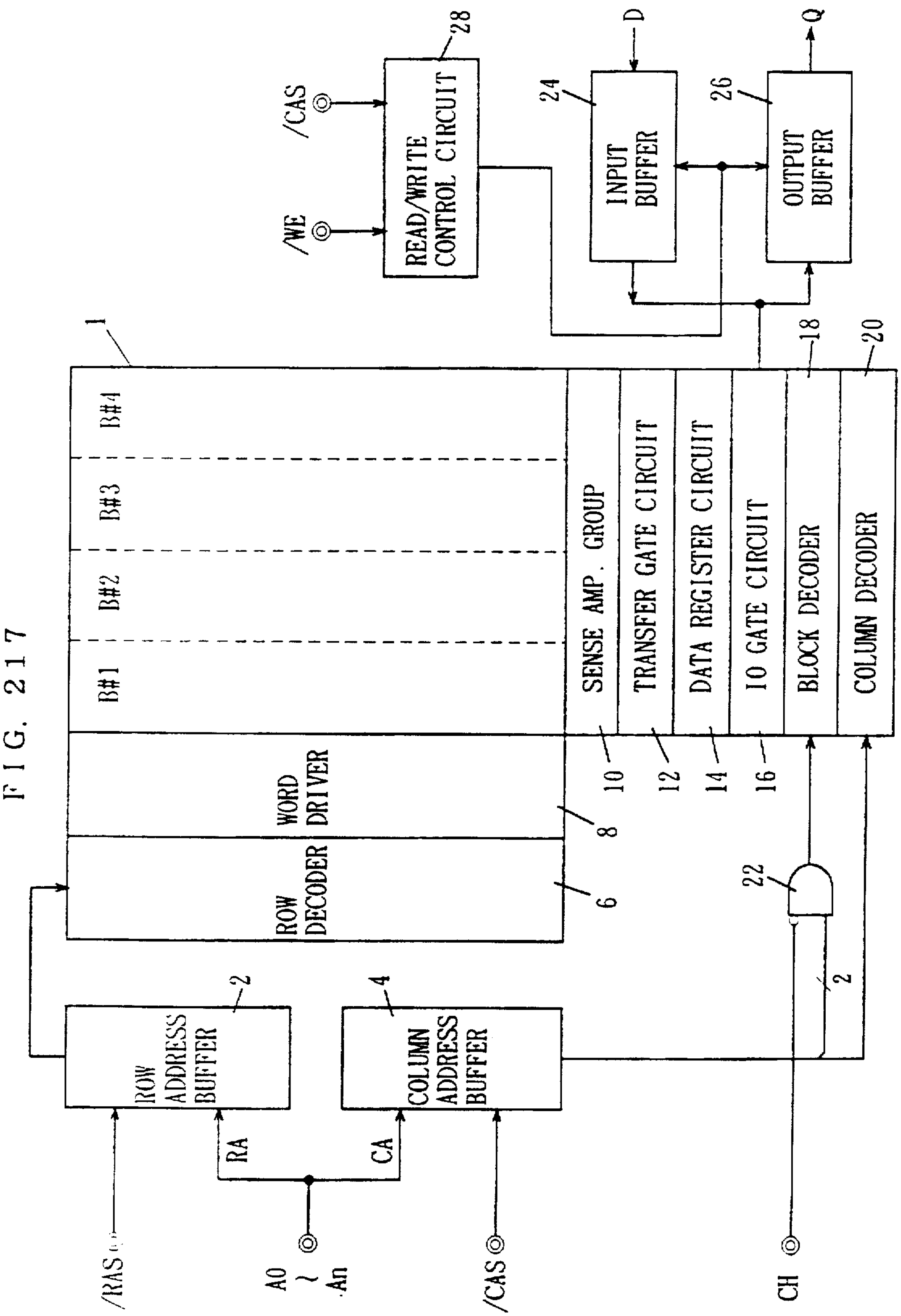
FIG. 2 shows, in a table, correspondence between the states of control signals of the semiconductor memory device and the operation modes carried out at that time.

FIG. 2 shows, in a tabLe, states of control signals for determining operations related to the SRAM portion. FIG. 2 shows states of various control signals at the rising edge of the master clock K and operation cycles (modes) carried out at that time. In FIG. 2, the reference character "X" shows an arbitrarily state. As is apparent from FIG. 2, when operation related to the SRAM array is to be controlled, the states of control signals CMd, RAS#, CAS#, and DTD# which control operations related to the DRAM array are not defined but arbitrarily set. The control of operations related to the SRAM array is effected by SRAM control circuit 132 shown in FIG. 1. The operation cycles related to the SRAM array includes an SRAM power down cycle for stopping 1 cycle of the SRAM master clock; a deselect SRAM cycle for setting the output portion at a high impedance state; an SRAM read cycle for reading data from the SRAM array; and an SRAM write cycle for writing data to the SRAM array.

The operations related to the SRAM portion further includes a buffer read transfer cycle, a buffer read transfer and read cycle and a buffer write transfer and write cycle for transferring data between the SRAM array and the data transfer circuit, a buffer read cycle and a buffer write cycle for directly accessing the data transfer circuit. Each of the operation cycles shown in the table of FIG. 2 will be described.

[SRAM System]

[SRAM Power Down]

In the SRAM power down cycle, the SRAM master clock is stopped for the period of 1 cycle. Taking of control signals in synchronization with the clock in the SRAM control circuit 132 is not carried out. The SRAM sense amplifier maintains the state of the previous cycle. The output buffer maintains the state at that time. Data can be continuously output.

For the SRAM power down cycle, the SRAM clock mask CMs is set to "H" at a rising edge of the master clock K. In the next clock cycle, the SRAM enters the SRAM power down cycle. When the SRAM clock mask CMs is at "L" at the rising edge of the master clock K and the chip enable E# is set to "L", and the write enable WE# and control clocks CC1# and CC2# are both set to "H" at the rising edge of the master clock K of the next cycle, the SRAM read mode is set. In this case, the data of the SRAM is read at the rising edge of the next master clock K. The data read at this time is continuously output when the SRAM power down mode is entered at that time.

Figure 3:
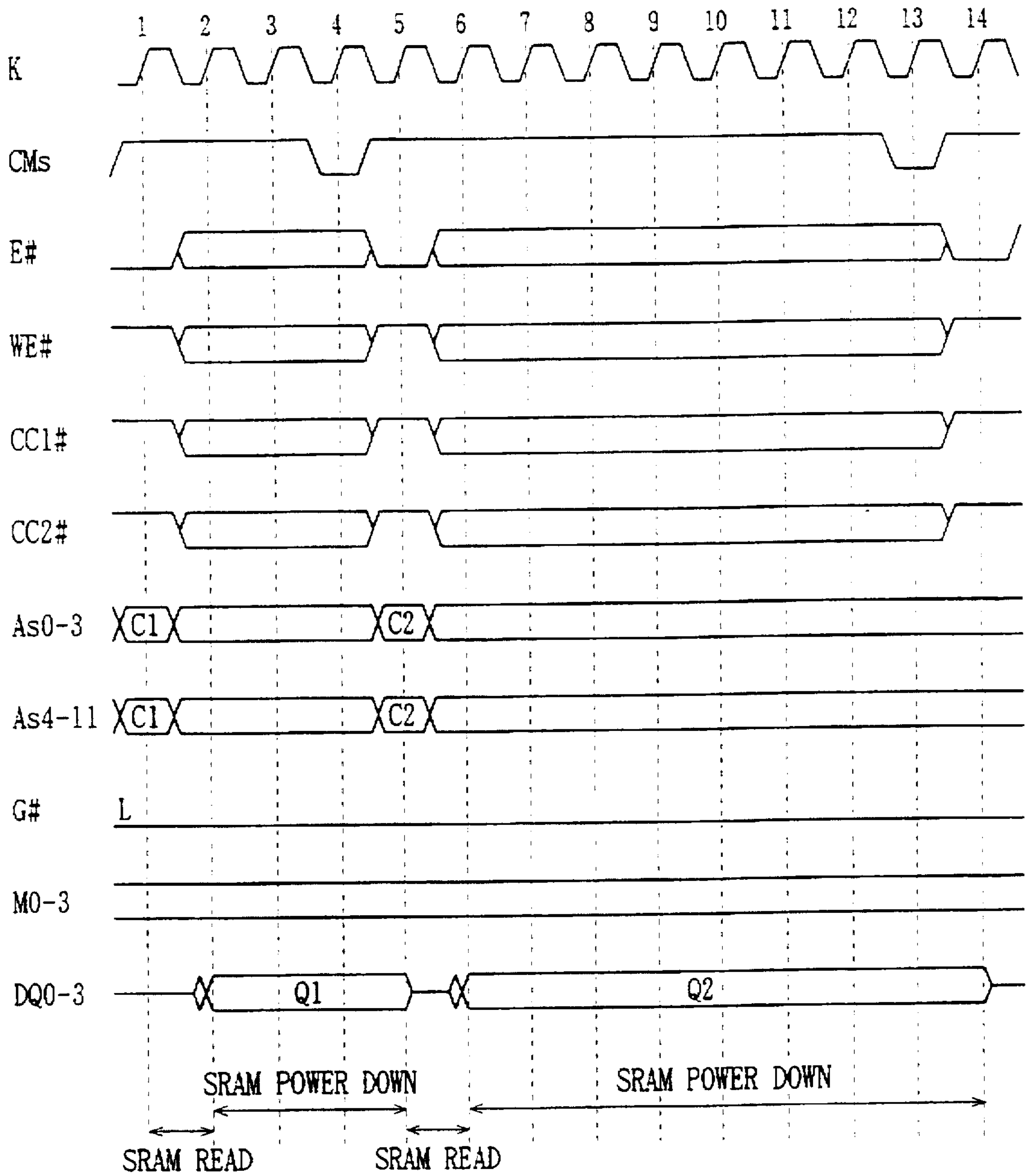
FIG. 3 is a diagram of waveforms showing the operation of a SRAM power down mode of the semiconductor memory device shown in FIG. 1.

More specifically, referring to FIG. 3, when the SRAM clock mask CMs is set to "H" in the first cycle of the master clock K, SRAM power clown mode starts from the second cycle of the master clock K. In the first cycle of the master clock K, the SRAM has not yet entered the power down mode, and therefore dependent on the combination of the chip enable signal E#, the write enable WE# and the control clocks CC1# and CC2# at that time, the SRAM read mode is designated, selection of the memory cell in the SRAM array is carried out in accordance with the SRAM address As0 to AS11 applied to the SRAM address buffer 116 at that time, and the data of the selected memory cell is established at the rising edge of the master clock K. Since the SRAM enters the power down mode from the second cycle of the master clock K and the SRAM master clock is not supplied, the internal operation is halted and the state thereof is maintained. The output buffer (main amplifier) maintains this state until the application of the next SRAM master clock, and therefore the data Q1 which has been established at the rising edge of the second cycle of the master clock K is continuously output.

By setting the SRAM clock mask CMs at "L", at the rising edge of the fourth cycle of the master clock K, the SRAM is released from the power down mode in the cycle starting from the rising edge of the fifth cycle of the next master clock K.

By the combination of the states of the chip enable E#, the write enable WE# and the control clocks CC1# and CC2# at the rising edge of the fifth cycle of the master clock K, the SRAM read cycle is designated again. Since it is released from the power down mode in the fifth cycle of the master clock K, the output buffer (the main amplifier in FIG. 1) which has continuously output the same data Q1 so far is once set to the output high impedance state by the application of the clock K. The timing of appearance of the output data will be described in detail later.

In accordance with the SRAM address As0 to AS11 applied in the fifth cycle of the master clock K, memory cells are selected in the SRAM array and data is read from the selected memory cells.

At the rising edge of the sixth cycle of the master clock K, the output data Q is set to an established state. At the rising edge of the fifth cycle of the master clock K, the SRAM clock mask CMs is at "H", and the cycle defined by the sixth cycle of the master clock K is subject to power down mode. Accordingly, the output data Q2 is continuously output. This state is kept as long as the SRAM clock mask CMs is at "H". By lowering the SRAM clock mask CMs to "L" at a rising edge of the 13th cycle of the master clock K, the 14th cycle of the master clock K is released from the power down mode. Thus the output data Q is set to the high impedance state.

As described above, by utilizing the SRAM power down mode, the operation of the SRAM portion can be stopped, and current consumption caused by the operation in synchronization with the clock K in the SRAM portion can be reduced.

[Deselect SRAM]

The deselect SRAM sets the output buffer (main amplifier 138 of FIG. 1) to the output high impedance state. For the deselect SRAM mode, the SRAM clock mask CMs is set to "L" at a rising edge of the master clock K, and the chip enable E# is set to "H" at the rising edge of the next master clock K. Thus it enters the deselect SRAM mode from the next cycle, data transfer and data input/output of the SRAM array are all disabled, and it is set to the output high impedance state. By the deselect SRAM mode, the output impedance can be set to the high impedance state with the SRAM portion being effectively at the non-selected state (inoperable state). Therefore, erroneous writing of data read in the previous cycle upon switching from data reading to the data writing operation to the SRAM can be prevented, and erroneous data writing caused by collision of newly applied write data and the read data can be prevented.

Referring to the diagram of operation waveforms shown in FIG. 4, the SRAM clock mask CMs is at "L" at the rising edge of the first cycle of the master clock K. At this time, the chip enable E# is at "L", the write enable WE# and the control clocks CC1# and CC2# are all at "H", and therefore the SRAM read mode is designated. The SRAM address bits As0 to As11 applied in the first cycle of the master clock K are taken in, and data Q1 of the memory cell corresponding to the address (represented as C1 in FIG. 4) is read.

When the chip enable E# is raised to "H" in the second cycle of the master clock K, the SRAM enters the deselect SRAM mode. In this state, the SRAM portion is set to non-selected state, and the output is set to high impedance state in the third clock of the mater clock K.

When the chip enable E# is lowered to "L", the deselect SRAM mode is released, the SRAM read mode is controlled in accordance with the states of other control signals WE#, CC1# and CC2# at that time, data is read in accordance with the SRAM address (C2 in FIG. 4) applied at that time, and output data Q2 is provided.

When E# attains "H" in the sixth cycle of the master clock K, the SRAM enters the deselect SRAM mode from the fifth cycle of the master clock K. The deselect SRAM mode is kept as long as the chip enable E# is at "H" (assuming that the SRAM clock mask CMs is at "L"), and the output high impedance state is maintained.

More specifically, in the deselect SRAM mode, the SRAM portion is set to the non-selected state for the period of 1 cycle of the master clock K.

FIG. 5 shows structures of portions related to the SRAM power down mode and the deselect SRAM mode. The structure shown in FIG. 5 corresponds to the structure of the SRAM control circuit 132 and the main amplifier 138 of the clock mask circuit 130 of the structure shown in FIG. 1. Referring to FIG. 5, SRAM control circuit 132 includes a K buffer 124 receiving the! master clock K and generating an internal clock Ki, and a mask circuit 130 responsive to the internal clock Ki and the SRAM clock mask CMs for generating an SRAM master clock SK.

Mask circuit 130 includes a shift register 152 responsive to the internal clock Ki for providing a delay of 1 clock cycle period to the SRAM clock mask CMs, and a gate circuit 164 responsive to the clock mask CMsR from shift register 152 for selectively passing the internal clock Ki. Gate circuit 164 is formed of, for example, a transfer gate including a p channel MOS transistor. When the clock mask SMsR is at "H", transmission of the internal clock Ki is inhibited. Gate circuit 164 may be formed by using a logic gate. The SRAM master clock SK is generated from mask circuit 130.

SRAM control circuit 132 includes an E buffer 154 responsive to the SRAM clock SK for latching the chip enable E#, a WE buffer 156 responsive to the SRAM master clock SK and the internal chip enable E from the E buffer for latching the write enable WE# and generating an internal write enable WE, and CC1 buffer 158 and a CC2 buffer 160 responsive to the internal chip enable E and the SRAM master clock SK for latching control clocks CC1# and CC2# for generating internal control clocks CC1 and CC2, respectively.

SRAM control circuit 132 further includes a control signal generating circuit 166 which is activated in response to the internal chip enable E from the E buffer 154, of which timing is defined by the SRAM master clock SK, for generating necessary control signals in accordance with combination of states of the write enable WE and the control clocks CC1 and CC2 applied from buffers 156, 158 and 160.

The control signal generating circuit 166 generates an SRAM array driving control signal for driving the SRAM array, and a data transfer drive control signal for driving the data transfer circuit. At the time of data transfer between the SRAM array and the data transfer circuit, the period of transfer is defined by the master clock, so as to surely transfer the data.

The CDRAM further includes a G buffer 162 receiving an output enable G# for generating an internal output enable G, and an output control circuit 168 responsive to the internal output enable G and a control signal from the control signal generating circuit 166 for controlling main amplifier 138. In the structure shown in FIG. 1, output control circuit 168 is included in the SRAM control circuit 132. Output control circuit 168 includes a gate circuit 176 receiving the internal output enable G from G buffer 162 and the enable signal E1 from the control signal generating circuit, and a gate circuit 178 receiving an output from gate circuit 176 and the clock mask CMSR from shift register 152. The gate circuit 176 generates a signal at "H" when signals applied to both input thereof are at "L". Gate circuit 178 generates a signal at "H" when at least one of the input thereof attains "H".

Main amplifier 138 includes an inverter circuit 172 for inverting a signal on an internal data bus 123*a* (1 bit data line of the internal data bus 123 being shown in FIG. 1), a 3-state inverter circuit 170 which is enabled in response to an output from output control circuit 168, an inverter circuit 174, and a connection gate 173 for connecting the output of inverter circuit 170 with the input of inverter circuit 174 in accordance with the internal clock mask CMsR. The output from inverter circuit 174 is applied to an input of 3-state inverter circuit 170. When the clock mask CMsR is at "H", inverter circuit 170 and inverter circuit 174 constitute a latch circuit.

The operation will be briefly stated. A clock mask CMsR delayed by one clock cycle is output from shift register 152. In response to this clock mask CMsR delayed by one clock cycle, gate circuit 164 passes the internal clock Ki. Accordingly, when the SRAM clock mask CMs is generated externally, transmission of the SRAM master clock SK to the SRAM control circuit 132 is inhibited in the next clock cycle. The control signal generating circuit 166 has its operation timing defined by the SRAM master clock SK and generates necessary internal control signals. Buffer circuits 154, 156, 158 and 160 are effecting latching of applied data in accordance with the internal chip enable E and the SRAM master clock SK. When there is no SRAM master clock SK applied, each buffer does not effect a new latching operation.

Similarly, when the chip enable E is not generated, the buffers do not operate. When the chip enable E is at "HH" indicating the non-selected state, buffers 156, 158 and 160 do not operate. At this time, the control signal generating circuit 166 does not operate, either.

The SRAM master clock SK is masked by the clock mask CMs from the next cycle from the generation of the mask clock CMs. Therefore, when the SRAM clock mask CMs is applied externally, the internal chip enable E and the SRAM master clock SK are generated in that cycle, and therefore an operation in accordance with the applied control signals is carried out. In the next cycle, internal control signal is not generated and control signal generating circuit 166 maintains the state of the previous cycle. Control signal generating circuit 166 delays chip enable E by a prescribed time period and generates an internal chip enable E1. Thus, the output timing can be accurately set (as the timing of generating is defined by SRAM master clock SK).

When clock mask CMsR is at "H", 3-state inverter circuit 170 is at the operative state, and connection gate 173 is also rendered conductive. Thus a latch circuit is formed by inverter circuits 170 and 174. While the output from G buffer 162 is at the active state, the output data DQ continues to hold the same data by the inverter circuit 170 and 174. When chip enable E# falls to "L", internal chip enable E also falls to "L", control signal generating circuit 166 initializes chip enable E1 to "H", and after a prescribed time period, lowers the same to "L". Therefore, when the clock mask CMsR is at "L", the inverter circuit 170 is set to the output high impedance state, and when the internal output enable G is at "L" after the lapse of a prescribed time period, the inverter circuit 170 is set to the operative state in accordance with the internal chip enable E1, resulting in appearance of a new output data.

As described above, the output impedance state can be set by the clock mask CMsR and the chip enable E#.

FIG. 6 shows an example of the structure of the buffer circuit shown in FIG. 5. FIG. 6 shows a structure of the SRAM address buffer which is not shown in FIG. 5. Buffers 156, 158 and 160 have the same structure as the buffer shown in FIG. 6. Referring to FIG. 6, a buffer 116 includes a 3-state inverter circuit 7011 the output state of which is determined by the SRAM master clock K; an inverter circuit 7013 receiving an output from inverter circuit 7011; and a 3-state inverter circuit 7014 which is set to the output enable state in response to the internal chip enable E. Inverter circuit 7013 has its output connected to an input of inverter circuit 7014. Inverter circuit 7014 has its output connected to an input of inverter circuit 7013. An internal address signal int.As is generated from inverter circuit 7013. The operation will be described briefly.

3-state inverter circuit 7011 is set to the active state when the internal SRAM master clock SK is at "L", and inverts an externally applied address As and passes the same. When the SRAM master clock SK is at "H", inverter circuit 7011 is set to the output high impedance state. Therefore, inverter circuit 7011 takes in the address As which has been applied by that time at the rising edge of the SRAM master clock SK.

Inverter circuit 7014 is set to the enable state when the internal chip enable E is at "L" indicating the chip selected state, while it is set to the output high impedance state when the chip enable E is at "H" indicating the chip non-selected state. Therefore, when the chip enable E is at "L" at the rising edge of the internal clock SK, the address As which has been applied to inverter circuit 7011 by that time is latched by inverter circuits 7013 and 7014, and an internal SRAM address is generated.

FIG. 7 shows a structure of the E buffer shown in FIG. 5. Referring to FIG. 7, the E buffer 154 includes a p channel MOS transistor Tr700 having its source connected to the supply potential Vcc, and receiving the SRAM master clock Sk at its gate, a p channel MOS transistor Tr701 having its source connected to the drain of p channel MOS transistor Tr700 and its gate receiving the chip enable E#, an N channel MOS transistor Tr702 having its gate receiving the chip enable E# and its drain connected to the drain of MOS transistor Tr701, and an n channel MOS transistor Tr703 having its drain connected to the source of MOS transistor Tr702, its source connected to the ground potential Vss and its gate receiving an inverted signal/SK of the SRAM master clock. The E buffer 154 is set to the high impedance state when the SRAM master clock SK is at "H" (transistors Tr700 and Tr703 are both off), and when the SRAM master clock SK is at "L", it inverts the chip enable E# and generates an inverted signal/E of the internal chip enable E. Therefore, the chip enable E# can be taken in accordance with the SRAM master clock SK.

By utilizing the structures of the SRAM control circuit and the main amplifier circuit 138 as described above, the SRAM power down mode and the deselect SRAM mode can be readily realized.

[SRAM Read]

Figure 8:
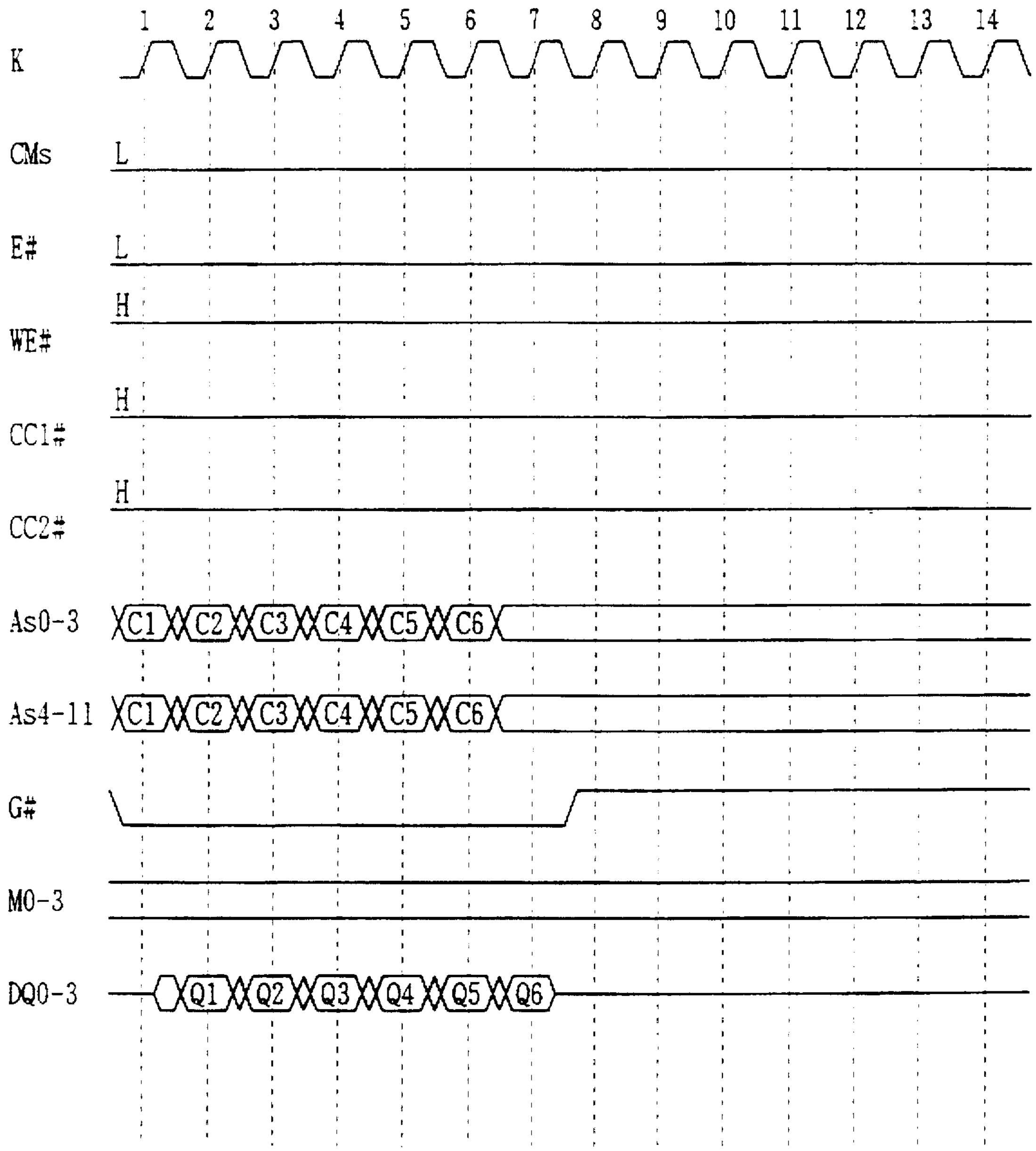
FIG. 8 is a diagram of signal waveforms showing an SRAM read mode of the semiconductor memory device shown in FIG. 1.

The SRAM read mode is an operation mode for reading data from the SRAM array. In this operation mode, as shown in FIG. 8, the chip enable E# is set to "L", and the write enable W# and the control clocks CC1# and CC2# are set to "H" at the rising edge of the master clock K. In the following description, it is assumed that the SRAM clock mask SMs is at "L". At this time, memory cell selecting operation is carried out under the control of SRAM control circuit 132 (see FIG. 1) in accordance with the simultaneously taken SRAM address bits As0 to As1, and the data of the selected memory cell of the SRAM array is transmitted to the internal data bus 123 (see FIG. 1). When the output enable G# is at "L" at this time, an established data is output at the rising edge of the next clock signal. The SRAM operates at high speed. Therefore, by setting the SRAM read mode at each rising edge of the master clock K, the established data can be output at the rising edge of the next clock cycle (provided that the output enable G# is at "L").

When the output enable G# is set to "H", main amplifier circuit 138 is set to the output high impedance state.

Figure 9:
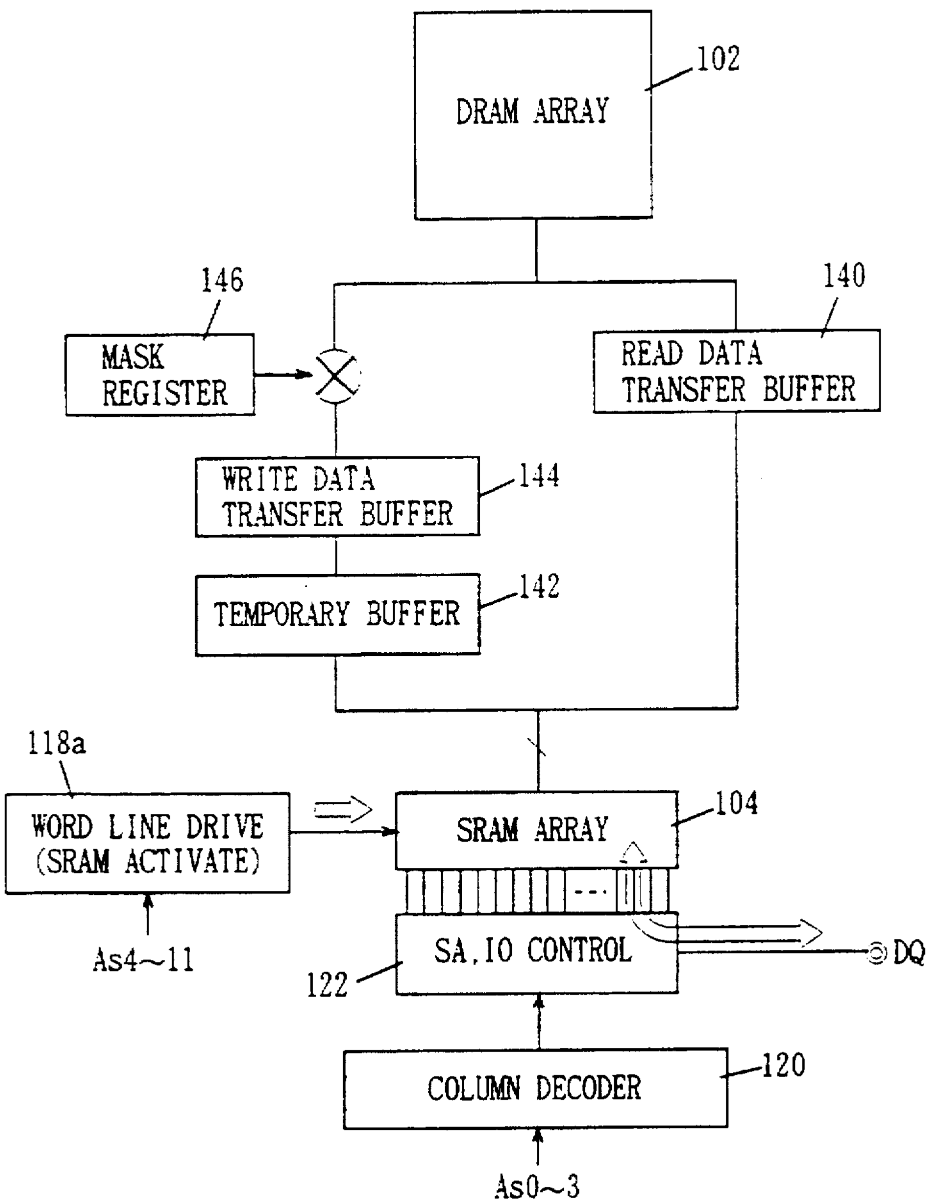
FIG. 9 shows data flow in the SRAM read mode operation.

FIG. 9 shows the data flow in the SRAM read mode. At this time, a drive 118*a* corresponding to the SRAM row decoder 118 shown in FIG. 1 decodes SRAM address bits As4 to As11 and selects one row in the SRAM array 104. In the SRAM array 104, 16 bits of memory cells are connected to one row. One of these 16 bits of memory cells is selected by a column decoder 120. Column decoder 120 decodes SRAM address bits As0 to S3 and selects one of the 16 bits of memory cells. An SA+IO control circuit 122 reads the data of the selected memory cell of the SRAM array 104.

[SRAM Write]

Figure 10:
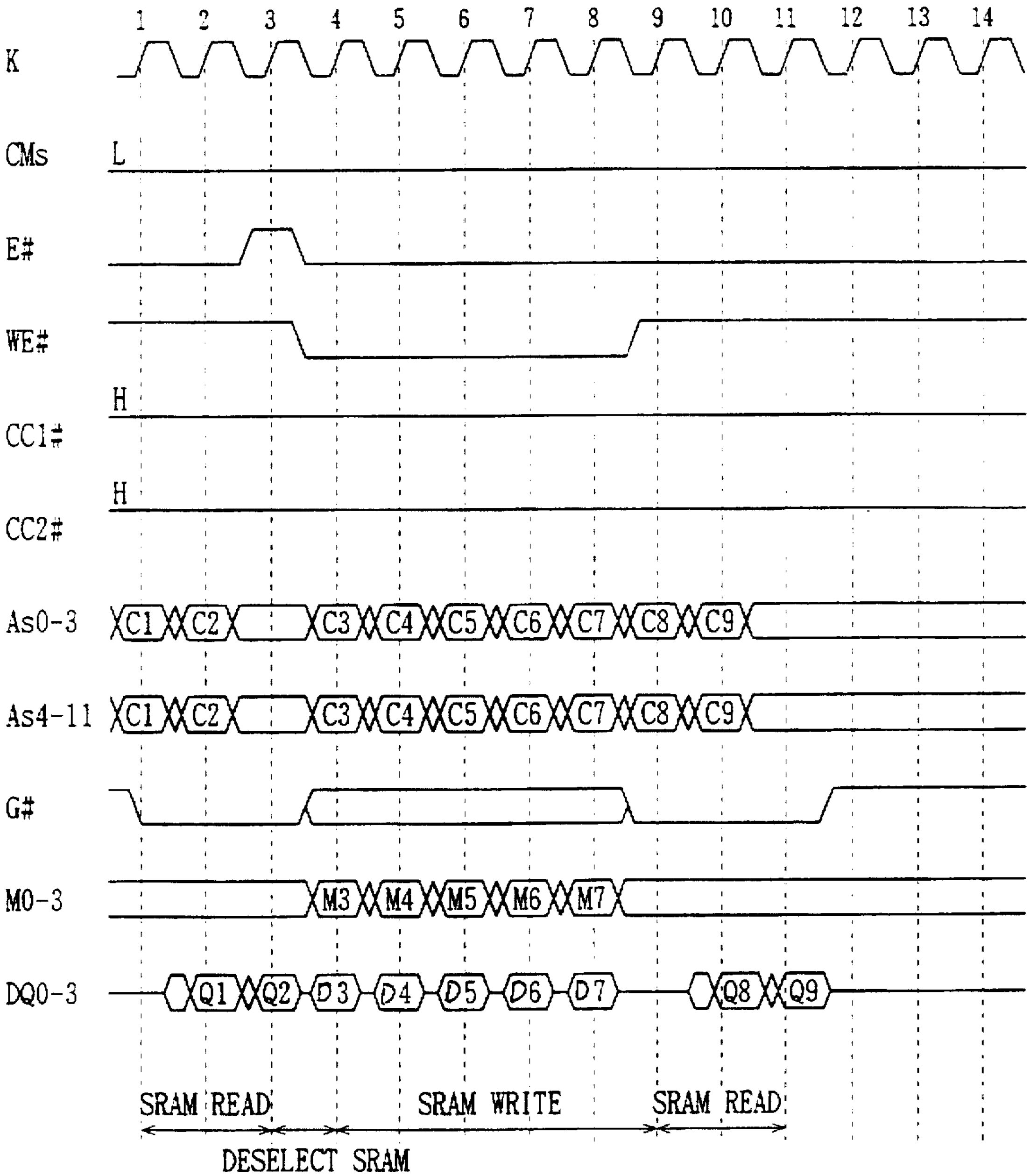
FIG. 10 is a diagram of signal waveforms showing an SRAM write mode operation.

The SRAM write mode is an operation mode for writing data to the memory cells of the SRAM array. For the SRAM write mode, the chip enable E# and the write enable WE# are both set to "L" and control clock CC1# and CC2# are both set to "H" at the rising edge of the master clock K as shown in FIG. 10. In this case also, the SRAM clock mask CMs is set at "L" in the previous cycle. This condition applies to the following descriptions, and it is assumed that the SRAM mask clock CMs is at "L" unless indicated otherwise. In FIG. 10, mask data M0 to M3 are used, and operation waveforms in the SRAM read mode and the SRAM write mode at the common DQ pin arrangement state are shown.

Referring to FIG. 10, when the chip enable E# is set to "L" and the write enable WE# and the control clocks CC1# and CC2# are set to "H" at the rising edge of the first cycle of the master clock K, the SRAM read mode is set. If the output enable G#3 is at "L", data is read at the rise of the next clock K.

In order to switch from the SRAM read mode to the SRAM write mode, the chip enable E# is raised to "H" at the rising edge of the third cycle of the master clock K. Consequently, deselect SRAM mode for the SRAM portion is set, and the SRAM memory cell data designated in the second cycle of the clock K is set to the established state at the rising edge of the third clock of the master clock K, and then set to the output high impedance state.

When the chip enable E# and the write enable WE# are both set to "L" and the control clocks CC1# and CC2# are set to "H" at the fourth cycle of the master clock K, the SRAM write mode is set. The SRAM address bits As0 to As11 applied at this time are taken in, and the mask data M0 to M3 (labeled as M3 in FIG. 10) and the internal write data D3 at this time are taken in. A prescribed bit of the write data D3 is masked for writing in accordance with the masked data M3. Thereafter, as long as the chip enable E# and the write enable WE# are at "L" and the control clocks CC1# and CC2# are at "H" at the rising edge of the master clock K, the SRAM write mode is repeated, write data D and mask data M are taken in at the rising edge of the clock K, and the data is written.

By setting the chip enable E# to the "L" and the write enable WE# and the control clocks CC1# and CC2# to "H" at the ninth cycle of the master clock K, the SRAM read mode is set. When the output enable G# is at "L", data Q8 and Q9 read in the SRAM read mode are respectively set to the established state at the rising edges of the tenth and eleventh cycles of the master clock K, if the output enable G# is at "L". When the output enable G# is set to "H" earlier than the rising edge of the master clock 12, the input/output pin DQ is set to the high impedance state provided that the write enable WE# is at "H".

As the access to the SRAM array is done at high speed as mentioned above, writing of data is completed in 1 cycle of the clock K.

As can be seen from FIG. 10, by utilizing the deselect SRAM mode, at the time of switching from the reading operation to the writing operation, writing of data can be surely carried out while the read data (Q2) does not affect the write data (D3) of the next cycle.

Figure 11:
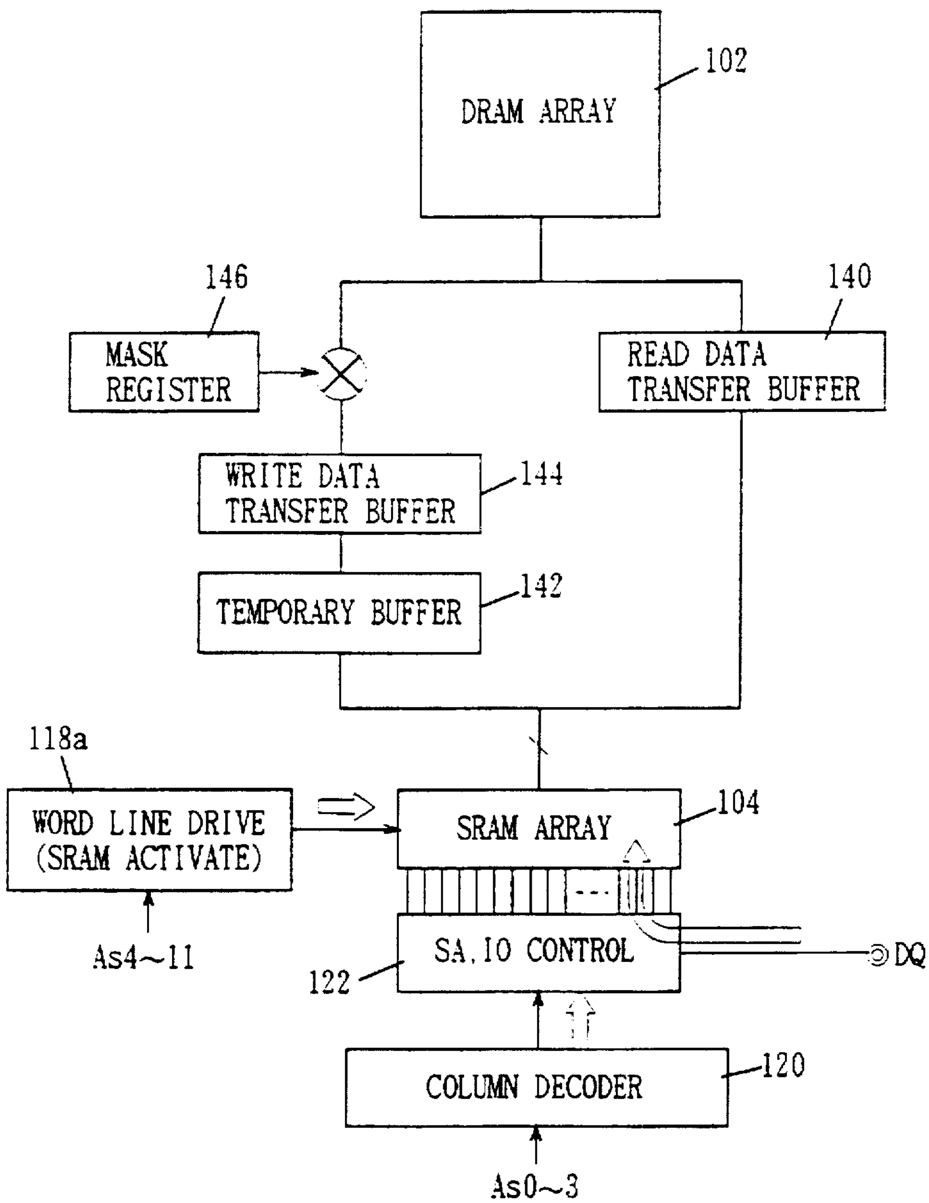
FIG. 11 shows the flow of data in the SRAM write mode operation.

FIG. 11 shows the data flow in the SRAM write mode. Referring to FIG. 11, a word line driving circuit 118*a* is driven to carry out the row selecting operation in the SRAM 109, and the column decoder 120 operates to select one memory cell of the SRAM array 104. Data is written to the selected memory cell of SRAM array 104 through a block 122.

As shown in FIGS. 9 and 11, in the SRAM read mode and the SRAM write mode, writing of data to the SRAM array and reading of data from the SRAM array are carried out regardless of the operation of the data transfer circuit and the DRAM array. Therefore, at the time of accessing to the SRAM array, data transfer between the data transfer circuit and the DRAM array can be carried out in parallel therewith. Such operation is possible since the DRAM control circuit 128 and the SRAM control circuit 132 are provided separately as shown in FIG. 1.

[Buffer Read Transfer]

Figure 12:
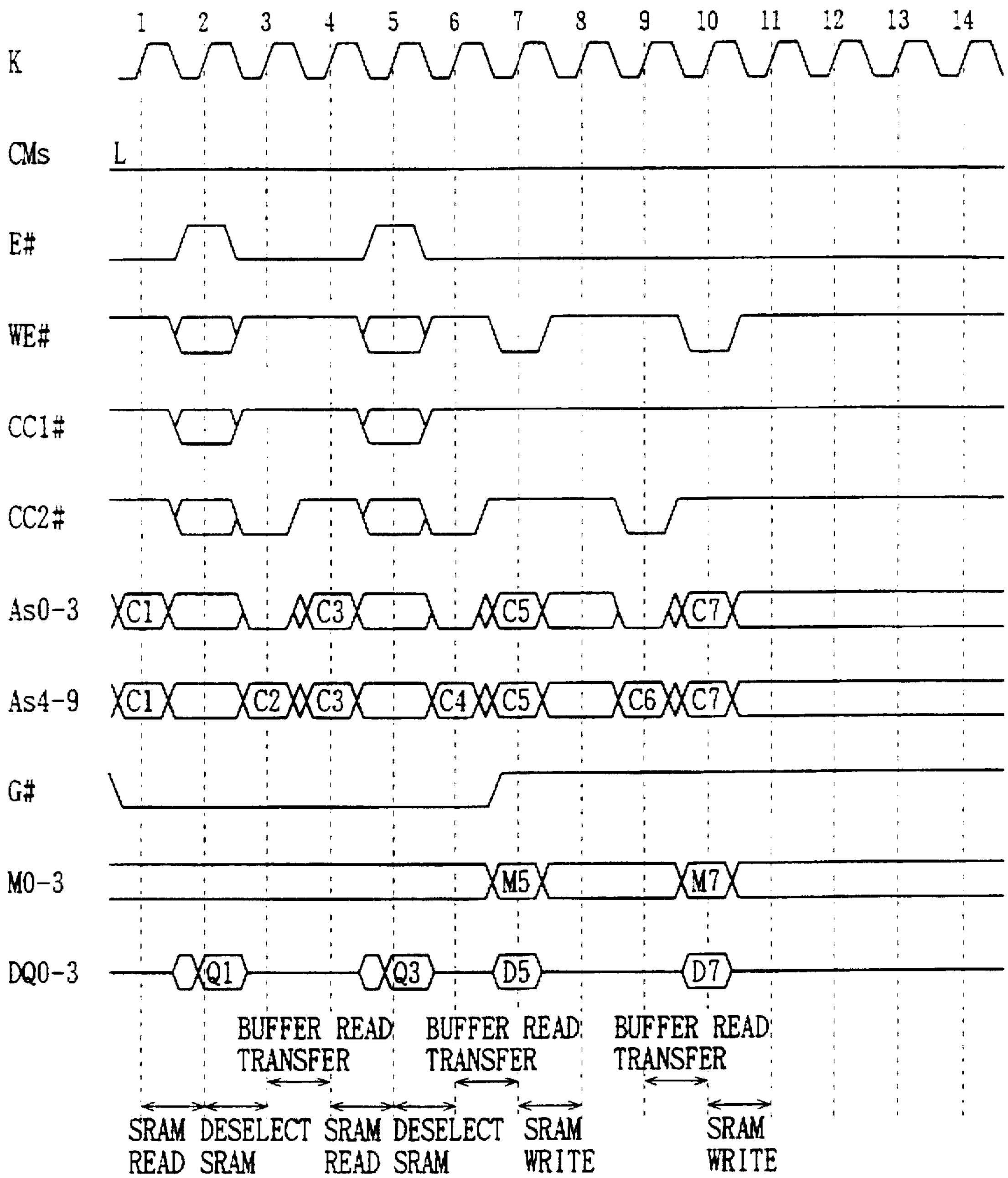
FIG. 12 is a diagram of signal waveforms showing a buffer read transfer mode operation.

The buffer read transfer mode is an operation mode for transferring data from the read transfer buffer to the SRAM. In this mode, 16 bits of data are simultaneously transferred from the data transfer circuit to the SRAM array. As shown in FIG. 12, the buffer read transfer mode is realized by setting the chip enable E# and the control clock CC2# to "L" and by setting the write enable WE# and the control clock CC1# to "H", at the rising edge of the master clock K. Other operation modes are also shown in FIG. 12.

In the buffer read transfer mode, the data transfer operation is ensured by setting the SRAM address bits As0 to As3 applied at this time to "L". By setting the SRAM column address bits As0 to As3 to "L", simultaneous data transfer operation of 16 bits is assured. The operation of the buffer read transfer mode as well as other operation modes will be described with reference to FIG. 12.

Referring to FIG. 12, the SRAM read mode is set at the rising edge of the first cycle of the master clock K. The SRAM reading operation is carried out in accordance with the SRAM address C1 applied at that time, and the output data Q1 is set to the established state as the rising edge of the second cycle of the master clock K. Since the chip enable E# is at "H" at the rising edge of the second cycle of the master clock K, the second cycle of the master clock K is in the deselect SRAM mode, and at the rise of the third clock of the master clock K, the output is at the high impedance state. At this time, the chip enable E# and the control clock CC2# are set to "L" while the write enable WE# and the control CC1# are set to "H" at the rising edge of the third cycle of the master clock K also. Consequently, the buffer read transfer mode is set. At this time, the ERAM address bits As0 to As3 are set to "L". A row selecting operation is carried out in the SRAM array in accordance with the SRAM address bits As4 to As11. 16 bits of SRAM memory cells are connected to one row. Data are simultaneously transferred from the read transfer buffer 140 to these 16 bits of connected SRAM memory cells.

The SRAM array does not: require such operation as bit line precharging. The SRAM array can be accessed immediately after the transfer of data from the read transfer buffer. In FIG. 12, at the rising edge of the fourth cycle of the master clock K, the chip enable E# is set to "L", the write enable WE# and the control clocks CC1# and CC2# are set to "H", and thus the SRAM read mode is set. Accordingly, data is read from the RAM memory cell at the rising edge of the fifth cycle of the master clock K.

Thereafter, by setting the chip enable E# to "H", at the rising edge of the fifth cycle of the master clock K, the deselect SRAM mode is set, the SRAM is set to a non-selected state in the fifth cycle and after the lapse of a prescribed time period, the output is set to the high impedance state.

At the rising edge of the master clock K in the sixth cycle, the chip enable E# and the control clock CC2# are both set to "L" and the write enable WE# and the control clock CC1# are set to "H", setting the buffer read mode. Consequently, 16 bits of memory cells are selected in the SRAM array, and data are transferred from the read transfer buffer 140 to the selected 16 bits of SRAM memory cells. Then, in the seventh cycle of the master clock K, the chip enable E# and the write enable WE# are set to "L" and the control clocks CC1# and CC2# are both set to "H", the SRAM write mode is set. Data D5 applied at that time is written to the selected memory cell of the SRAM in accordance with the mask data M5.

In the eighth cycle of the master clock K, the chip enable E# is set to "L", the write enable WE# and control clock CC1# and CC2# are all set to "H", and thus the SRAM read mode is set. However, since the output enable G# is at "H" at this time, output high impedance state is set outside the device.

In the ninth cycle of the master clock K, the buffer read transfer operation is again carried out, and data is transferred from the read transfer buffer to the SRAM array.

In the tenth cycle of the master clock K, the SRAM write mode is set, and data is written to the selected memory cells of the SRAM array in this tenth cycle.

By setting the buffer read transfer mode as described above, it becomes possible to transfer the cache block collectively to the SRAM array at high speed at the time of a cache miss, and therefore the access time can be significantly reduced at the time of a cache miss. The reason for this is that the SRAM array can be accessed at high speed after the data transfer to the SRAM array in accordance with the buffer read transfer mode.

FIG. 13 shows the data flow in the buffer read transfer mode. In the buffer read transfer mode, a word line driving circuit 118*a* selects one row of the SRAM array 104, and 16 bits of data are simultaneously transmitted to the selected one row (16 bits) from the read transfer buffer 140. Read data transfer buffer 140, which will be described in detail later, includes 16 buffers so as to allow simultaneous transfer of 16 bits of data.

[Buffer Write Transfer Mode]

Figure 14:
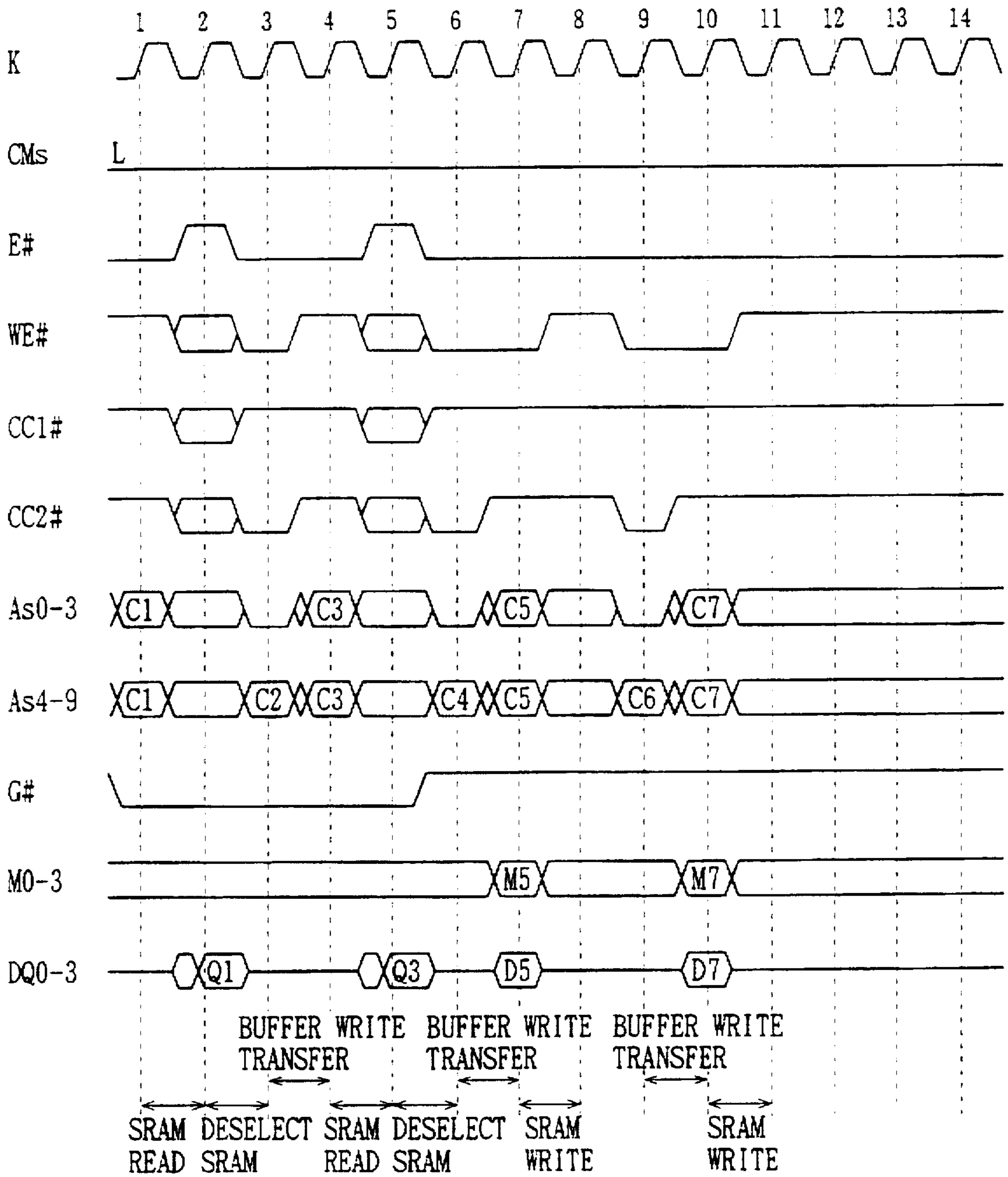
FIG. 14 is a diagram of waveforms showing a buffer write transfer mode operation.

The buffer write transfer mode is an operation mode for transferring data from the SRAM array to a write data transfer buffer (including a temporary buffer) included in the data transfer circuit. States of control signals in the buffer write transfer mode are shown in FIG. 14.

The buffer write transfer mode is designated by setting the chip enable E#, the write enable WE# and the control clock CC2# to "L" and by setting the control clock CC1# to "H" at the rising edge of the master clock K. In the buffer write transfer mode, the SRAM address bits As0 to As3 must be all set to "L" so as to fully carry out the data transfer operation. In the buffer write transfer mode, the mask bits (masked data) included in mask register 146 are all set to the reset state ("0" state). This is because it is necessary to transfer all the data which have been transferred from the SRAM array to the write transfer buffer 144 to the DRAM array.

The operation including the buffer write transfer mode will be described with reference to FIG. 14. Referring to FIG. 14, at the rising edge of the first cycle of the master clock K., the SRAM read mode is designated. Selection of a memory cell of the SRAM is carried out, and the data of the selected memory cell is established at the rising edge of the second cycle of the master clock K.

At the rising edge of the second cycle of the master clock K, the chip enable E# is raised to "H", the deselect SRAM mode is designated, the SRAM is set to the non-selected state and the output is set to the high impedance state. In the third cycle of the master clock K, the chip enable E#, the write enable WE# and the control clock CC2# are set to "L", while the control clock CC1# is set to "H", so that the buffer write transfer mode is designated. In the buffer write transfer mode, the SRAM address bits As0 to As3 are all set to "L". By using the remaining SRAM address bits As4 to As11, one row (16 bits) is selected in the SRAM array, and the data of the selected 16 bits of SRAM memory cells are simultaneously transferred to the write transfer buffer (latched in the temporary buffer).

In the fourth cycle of the master clock K, the SRAM read mode is designated, memory cell selecting operation in accordance with the SRAM address bits As0 to As11 is carried out, and the data of the selected memory cell is read. In the fifth cycle of the master clock K, the deselect SRAM mode is again designated, the SRAM is kept at the non-selected state in the fifth cycle of the master clock K, and the output is set to the high impedance state.

In the seventh cycle of the master clock K, the SRAM write mode is designated. At this time, the output enable G# is at "H", and writing of data in accordance with the mask data M5 (mask bits M0 to M3) is carried out for the SRAM array.

In the ninth cycle of the master clock K, the buffer write transfer mode is designated, one row of the SRAM array is selected, and data of the memory cells connected to the selected one row are transferred to the write data transfer buffer. In the tenth cycle of the master clock K, the SRAM write mode is designated, and writing of data to the SRAM array is carried out.

Figure 15:
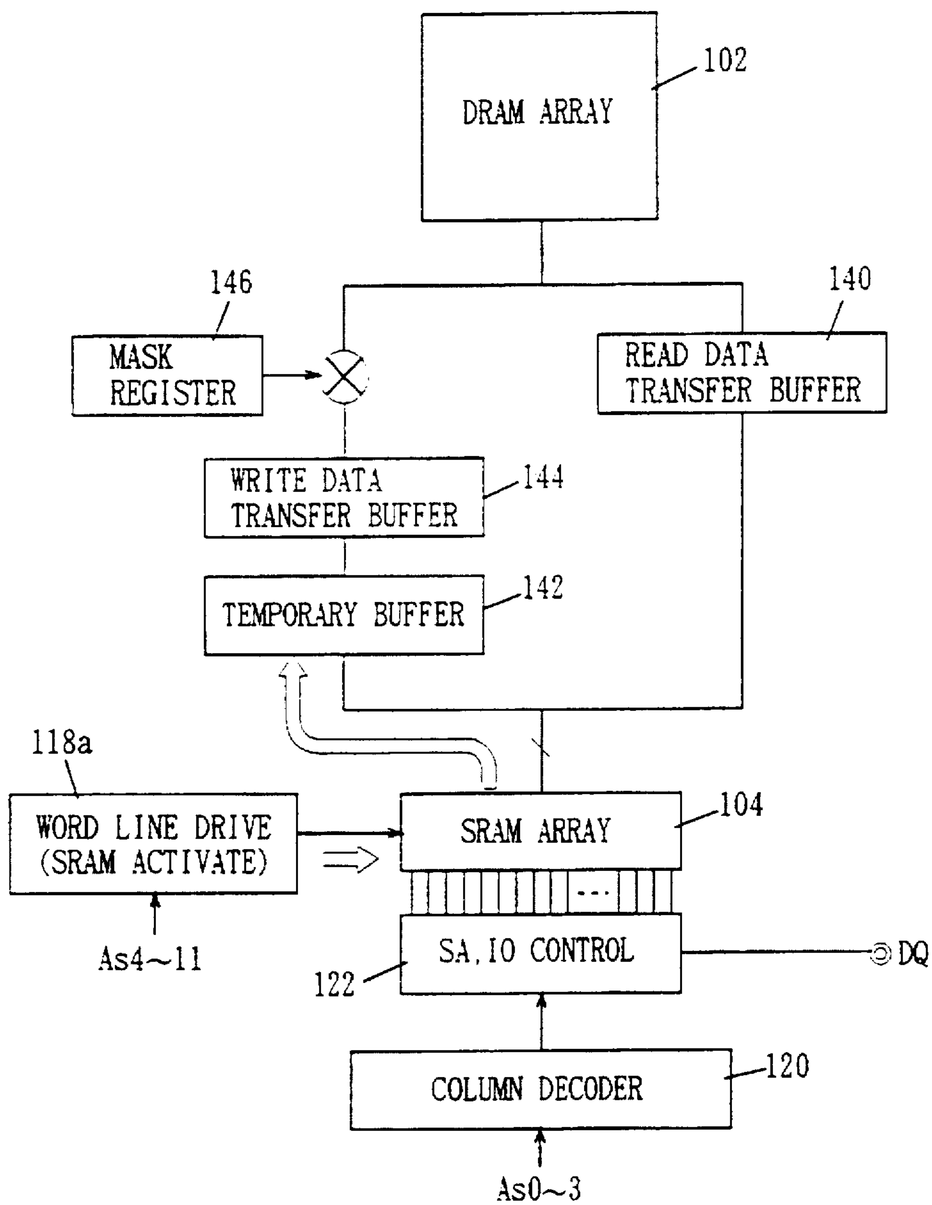
FIG. 15 shows the flow of data in the buffer write transfer mode.

FIG. 15 shows the data flow in the buffer write transfer mode. Referring to FIG. 15, the word line driving circuit 118*a* is driven, one row of the SRAM array 104 is selected, and data of the memory cells connected to the selected one row are transferred to the write data transfer buffer. Here, the write data transfer buffer includes a temporary buffer for temporarily storing applied data, and the data is actually latched in the temporary buffer 142. By this structure in which the data transferred from the SRAM array 104 is once latched by the temporary buffer 142, data can be retrieved from the SRAM array 104 (at the time of a cache miss) and in parallel therewith, the cache data can be transferred from the DRAM array through the read data transfer buffer 140. Therefore, data transfer at the time of a cache miss can be carried out at high speed, reducing the access time. In the following description also, the data transfer from the SRAM array to the write data transfer buffer corresponds to the state in which data is stored in the temporary buffer.

[Buffer Read Transfer/SRAM Read]

The buffer read transfer and SRAM read mode (hereinafter referred to as the buffer read transfer/SRAM read), data is transferred from the read data transfer buffer to the SRAM array and further, 1 bit (if the device has×4 bits structure, a total of 4 bits) of the transferred data is output from the SRAM array in accordance with the SRAM address.

The buffer read transfer/SRAM read mode is set by setting the chip enable E# and the control clock CC1# to "L" and setting the write enable WE# and the control clock CC2 to "H" at the rising edge of the master clock K. The state of control signals in an operation sequence including the buffer read transfer/SRAM read mode are shown in FIG. 16.

Figure 16:
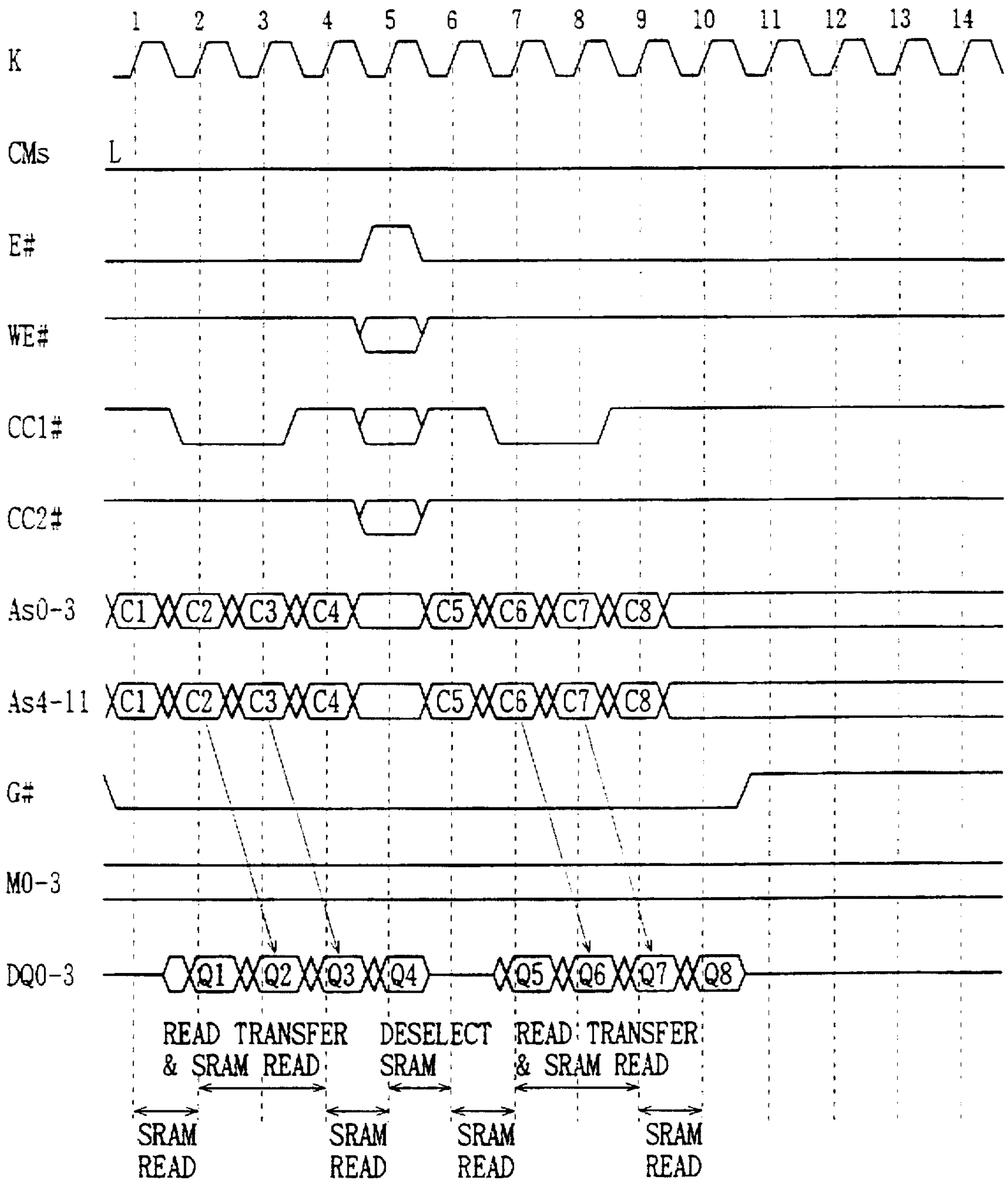
FIG. 16 is a diagram of signal waveforms showing a buffer read transfer/SRAM read mode operation.

Referring to FIG. 16, at the rising edge of the first cycle of the master clock K, the SRAM read mode is designated, memory cell selecting operation in the SRAM array is carried out, and the data of the selected SRAM memory cell is read.

At the rising edge of the second cycle of the master clock K, the chip enable E# and the control clock CC1# are set to the "L", while the write enable WE# and the control clock CC2# are set to "H". By this combination of the states of these control signals, the buffer read transfer/SRAM read mode is designated. In this operation mode, one row is selected in the SRAM array, and data are simultaneously transmitted from the read data transfer buffer (DTBR) to the selected one row of memory cells. After or in parallel with the data transmission, memory cell (column) selecting operation is carried out in accordance with the SRAM block address bits As0 to As3, and the data which have been transmitted to the selected memory cell is read.

In the third cycle of the master clock K, the buffer read transfer/SRAM read mode is designated again, data is transferred from the read data transfer buffer (DTBR) to the SRAM array, and 1 bit is selected from the transferred data (16 bits). The read buffer transfer/SRAM read mode is carried out in continuous cycles of the master clock K from the following reason. Namely, it is possible to carry out data transfer from the DRAM array to the read data transfer buffer at every clock cycle by using the page mode of the DRAM, which will be described later. The page mode of the DRAM is enabled since the control circuit portion for driving the DRAM array and the control portion for defining operations related to the SRAM array are provided independent from each other.

In the fifth cycle of the master clock K, the deselect SRAM mode is designated, the SRAM is set to the non-selected state in the fifth cycle, and the output high impedance state is set.

In the sixth cycle of the master clock K, the SRAM read mode is designated, the buffer read transfer/SRAM read mode is continuously carried out in the seventh and eighth cycles of the master clock K, and in the ninth cycle of the master clock K, the SRAM read mode is designated.

The SRAM read mode and the buffer read transfer/SRAM read mode are carried out continuously because, at the time of a cache hit, the SRAM read mode is carried out, while at the time of a cache miss, the latching function of the sense amplifier is utilized in the DRAM array and data of one row of memory cells has been latched in the DRAM array, as will be described in detail later. When the data required by an external device such as a CPU is not in the SRAM array but is latched by a sense amplifier in the DRAM array, the data latched by the DRAM sense amplifier can be transferred to the read data transfer buffer, then the data is transferred from the read data transfer buffer to the SRAM array, and thus the data can be read. The structure for enabling such operation mode will be described in detail later.

FIG. 17 shows the data flow in the buffer read transfer/SRAM read mode. Referring to FIG. 17, one row of the SRAM array 104 is selected by the word line driving circuit 118*a*. Data are simultaneously transmitted to the selected one row from the read data transfer buffer (DTBR) 140. Then, in accordance with a column selecting signal from column decoder 120, a memory cell is selected in SRAM array 104, and data of the selected memory cell is output through a sense amplifier/IO control block 122.

[Buffer Write Transfer/SRAM Write]

In the buffer write transfer and SRAM write (hereinafter referred to as the buffer write transfer/SRAM write) mode, data is written to the SRAM array while data of the row including the memory cell to which the data is written are transferred to the write data transfer buffer (temporary buffer) (DTBW). The transfer operation is completed in 1 clock cycle of the master clock K. In the buffer write transfer/SRAM write mode, the mask bits in the mask register are all reset, and all data are transferred from the write data transfer buffer (DTBW) to the DRAM array.

In the buffer write transfer/SRAM write mode, the chip enable E#, the write enable WE# and the control clock CC1# are all set to "L" and the control clock CC2# is set to "H" at the rising edge of the master clock K. Consequently, writing of data to the SRAM array and data transfer from the SRAM array to the write data transfer buffer is carried out. The states of external signals in operations including the buffer write transfer/SRAM write mode are shown in FIG. 18.

Figure 18:
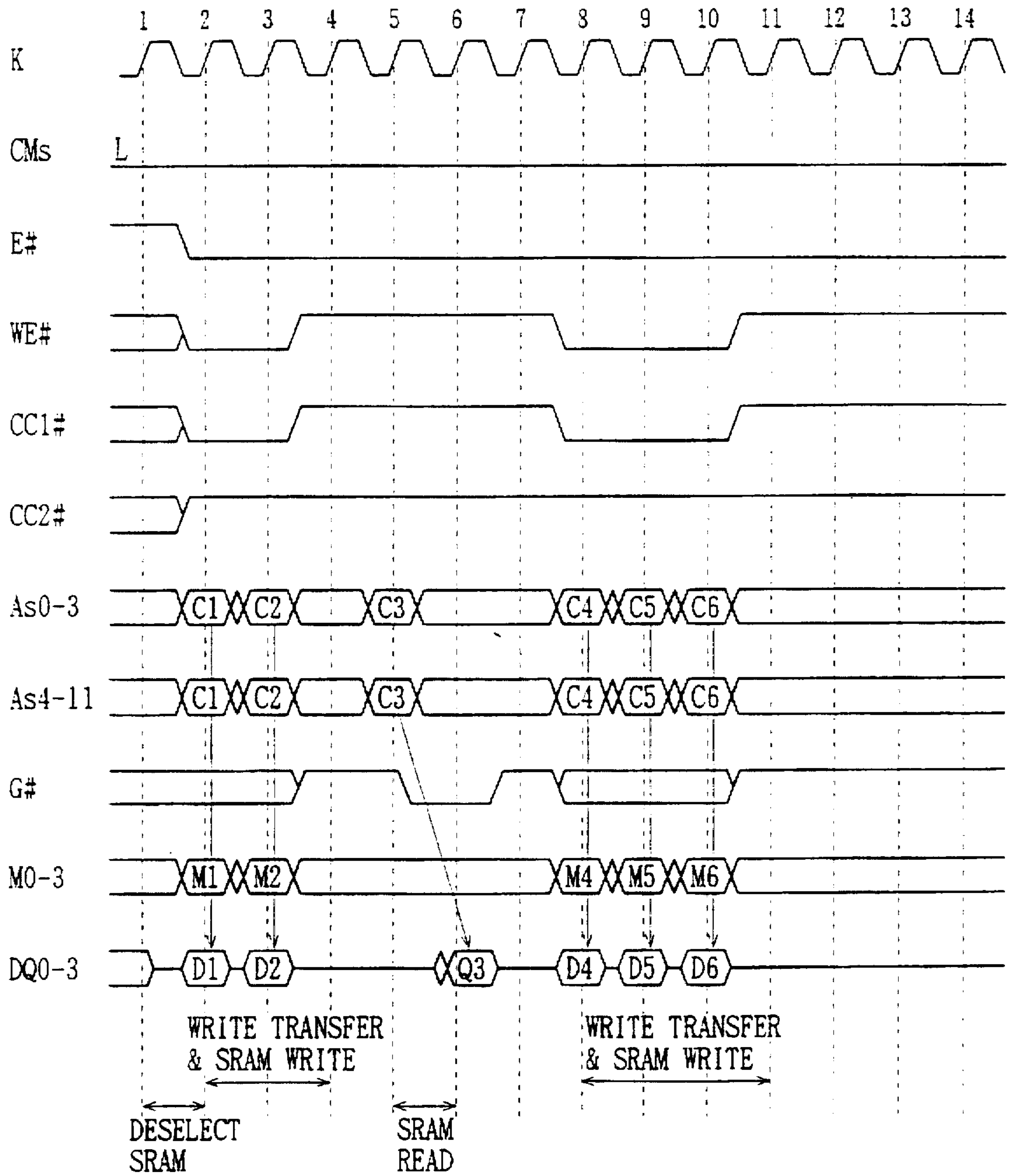
FIG. 18 is a diagram of waveforms showing the buffer write transfer and SRAM write operation mode.

Referring to FIG. 18, in the first cycle of the master clock K, the chip enable E# is at "H", and the SRAM is at the non-selected state (deselect SRAM mode). In the second cycle of the master clock K, the chip enable E#, the write enable WE# and the control clock CC1# are set to "L", and the control clock CC2# is set to "H". By these states of these signals, the buffer write transfer/SRAM write mode is designated. In this mode, the SRAM address bits As0 to As11 applied at that time are all taken in, row and column selection in the SRAM array is carried out and data is externally written to the selected SRAM memory cell. Here, after the completion of writing or in parallel to writing, data of the memory cells connected to the selected one row of the SRAM array are transferred to the write data transfer buffer (DTBW) (more accurately, the temporary buffer). In the third cycle of the master clock K, the buffer write transfer/SRAM write mode is carried out in the similar manner.

In the fourth cycle of the master clock K, the SRAM read mode is designated. However, since the output enable G# is at "H", the output is set to the high impedance state.

At the fifth cycle of the master clock K, the SRAM read mode is designated, and data is read from the SRAM array. The output enable G# is at "L", and the data Q3 read in this cycle is output.

In the seventh cycle of the master clock K, the output enable G# is set to "H" so as to set the output at the high impedance state. By doing so, the data read in the sixth cycle of the master clock K is prevented from affecting the succeeding data writing operation.

In the eighth through tenth cycles of the master clock K, the chip enable E#, the write enable WE# and the control clock CC1# are at "L", the control clock CC2# is set to "H", and in these cycles, the operation in accordance with the buffer write transfer/SRAM write mode is carried out. By carrying out the operation of the buffer write transfer/SRAM write mode, the write through operation at the time of a cache hit (in which the data written in the SRAM array is directly transferred to the DRAM array) is realized.

Figure 19:
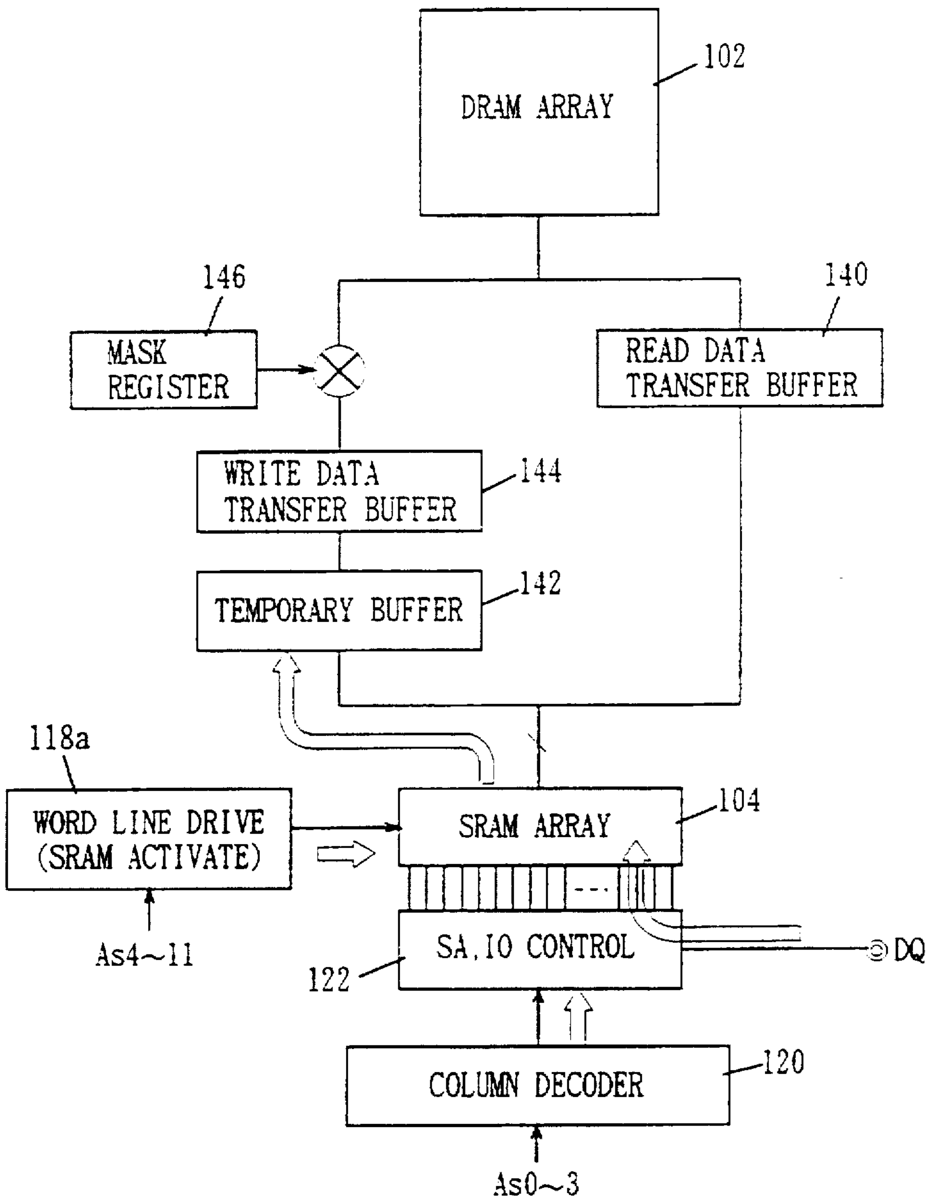
FIG. 19 shows the flow of data at the buffer write transfer and the SRAM write operation mode.

FIG. 19 shows the data flow at the time of the buffer write transfer/SRAM write mode operation. Referring to FIG. 19, one row of the SRAM array 104 is selected by word line driving circuit 118*a*. One column of the SRAM array 104 is selected by the column decoder 120. By this selected column, write data is transmitted through SA+IO control block 122. After the transfer of the write data, data of one row of memory cells selected by word line driving circuit 118*a* in SRAM array 104 are transferred to the write data transfer buffer (DTBW) 144, or more accurately, transferred to the temporary buffer 142.

[Buffer Read]

In the buffer read mode, data is directly output from the read data transfer buffer. Rewriting of the content by the data transfer to the SRAM array is not carried out. By carrying the buffer read mode, the data can be read without affecting the cache data stored in the SRAM array.

For the buffer read mode, the chip enable E# and the control clocks CC1# and CC2# are set to "L" and the write enable WE# is set to "H" at the rising edge of the master clock K. In the buffer read mode, data is transmitted from the read data transfer buffer (DTBR) to the input/output pin DQ. In the buffer read mode, the address bits As4 to As11 for selecting a row of the SRAM are all set to "L" in order to ensure the buffer read mode operation and to surely prevent change of data of the SRAM array. The SRAM address bits As0 to As3 are used for selecting one buffer of the read data transfer buffer (DTBR). An example of the operation sequence including the buffer read mode operation is shown in FIG. 20.

Referring to FIG. 20, the SRAM read mode is designated in the first cycle of the master clock K, and data is read from the SRAM array. Then, in the second cycle of the master clock K, the chip enable E# and the control clocks CC1# and CC2# are set to "L", and the write enable WE# is set to "H", thereby setting the buffer read mode. In the buffer read mode, the data of the read data transfer buffer (DTBR) is transmitted through the SRAM array (which is at the non-selected state) to the data input/output pins DQ0 to DQ3. For selecting a buffer in the read data transfer buffer (DTBR), SRAM block address bits As0 to As3 are utilized.

The buffer read cycle is completed in 1 cycle of the master clock K.

In the third and fourth cycles of the master clock K, the SRAM read mode is designated and data is read from the SRAM array. Though the SRAM read mode is designated in the tenth cycle of the master clock K, the output enable G# is at "H" and the output is at the high impedance state. In the eleventh through thirteenth cycles of the master clock K, the buffer write transfer/SRAM write mode operation is carried out. By the buffer read mode, graphic data can be displayed on a CRT display unit at high speed. In the SRAM read mode, the CPU reads necessary data from the SRAK array and processes the data, and then by the buffer write mode and the DRAM write transfer mode operation, the processed data is written to the DRAM array. By this operation, the CDRAM can be efficiently used as a video memory in the field of graphics.

Figure 21:
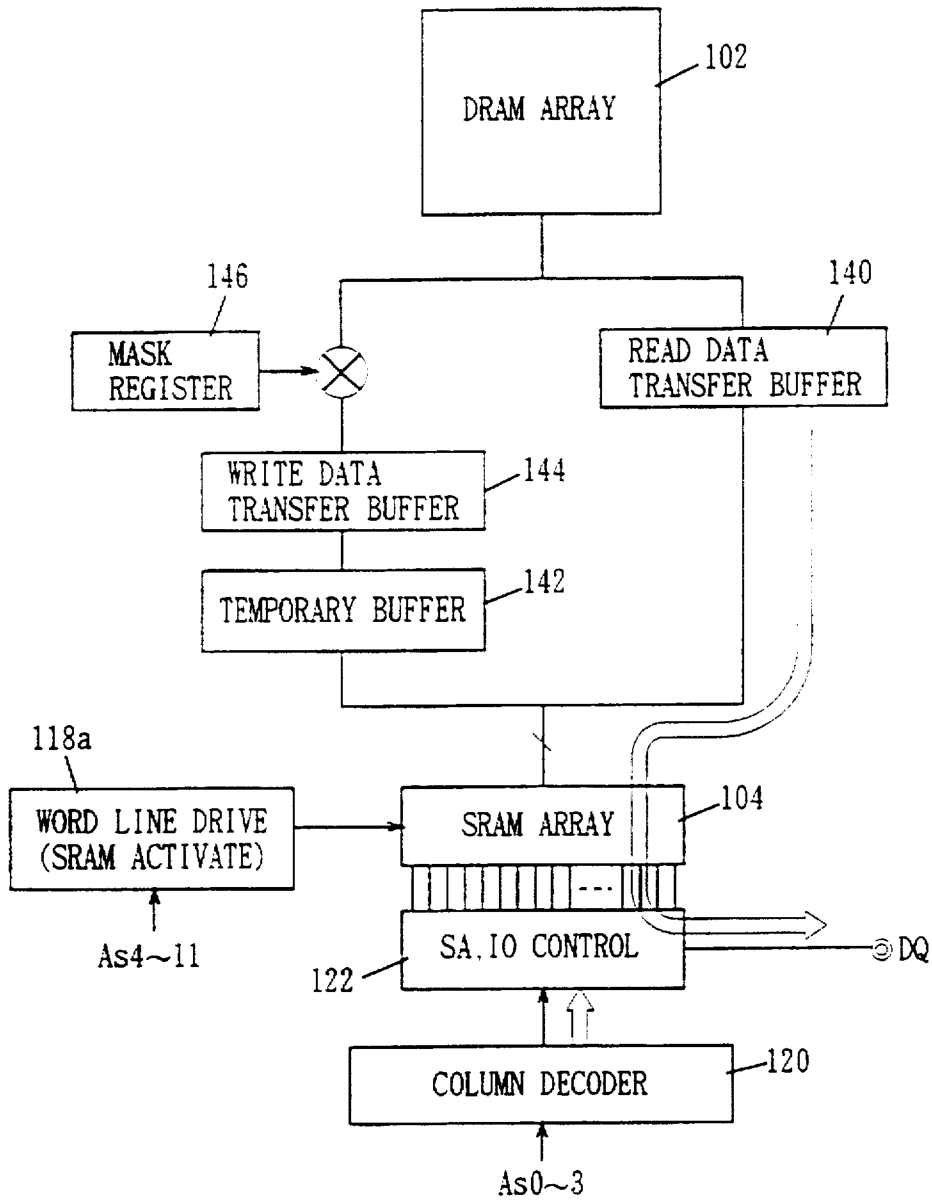
FIG. 21 shows the flow of data in the buffer read mode operation.

FIG. 21 shows the data flow in the buffer read mode. Referring to FIG. 21, in the buffer read mode operation, word line driving circuit 118*a* does not operate. The SRAM array 104 is maintained at the non-selected, precharge state. Data from read data transfer buffer 140 passes through the SRAM array 104. A column of the SRAM array 104 is selected by column decoder 120 and SA+IO control block 122 and the data is transmitted to the data input/output pin DQ. In this structure also, the SRAM array 104 is at the precharge state or the non-selected state (though the bit line potential changes by the transfer data), the data transferred from read data transfer buffer 140 does not, influence to the data stored in the SRAM array 104 at all.

[Buffer Write]

The buffer write mode is an operation mode in which externally applied write data is written not to the SRAM memory cells but to the write data transfer buffer (DTBW). For the buffer write mode, the chip enable E#, the write enable WE# and the control clocks CC1# and CC2# are all set to "L". When the control signals are at this state, row selecting operation in the SRAM array is not carried out. It is required to ensure the buffer write mode operation that the SRAM address bits As4 to As11 are all set to "L". The states of control signals of the series of operation sequences including the buffer write mode operation are shown in FIG. 22.

Figure 22:
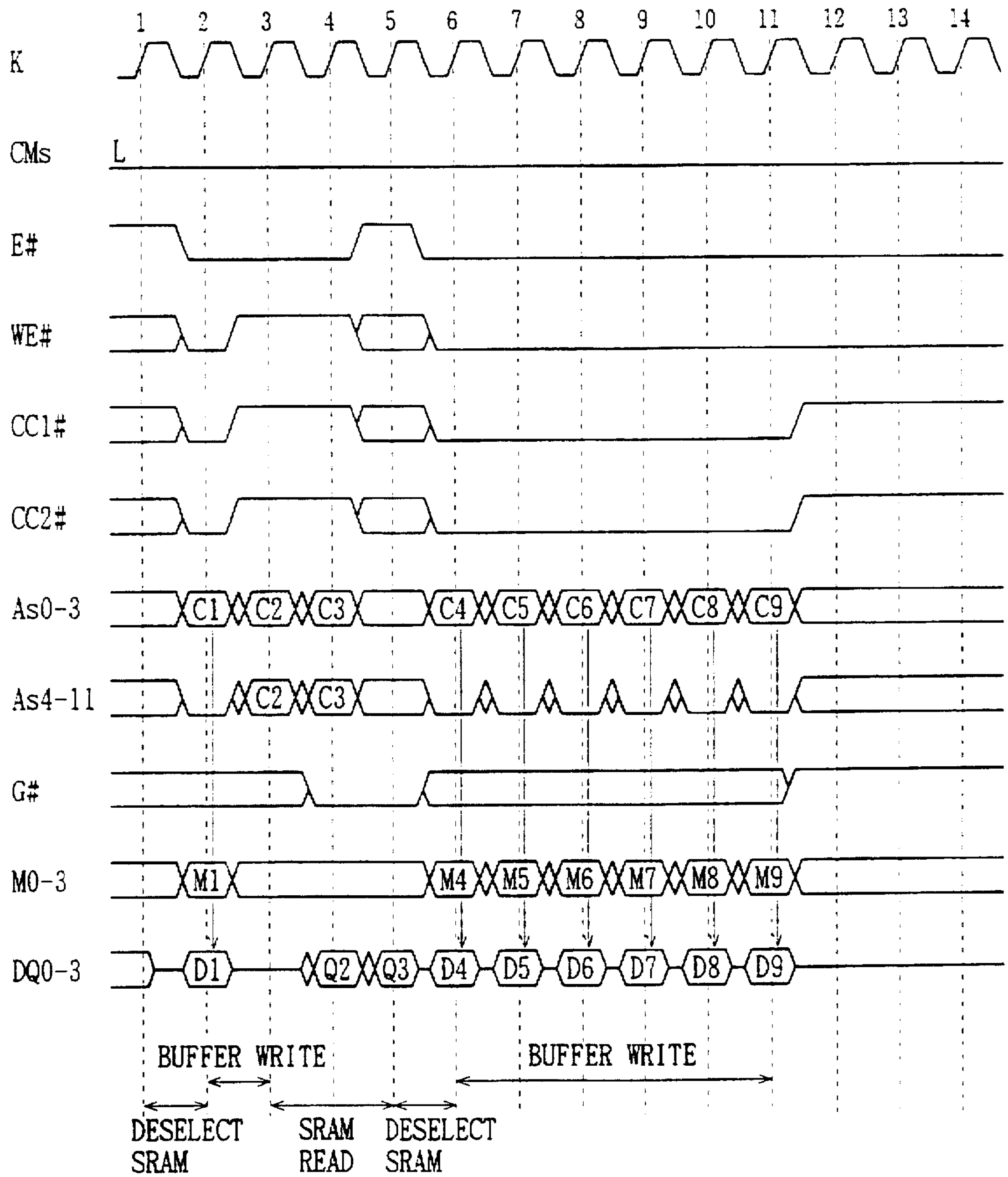
FIG. 22 is a diagram of signal waveforms showing the buffer write mode operation.

Referring to FIG. 22, at the rising edge of the first cycle of the master clock K, the chip enable E# is at "H" and the SRAM is at the non-selected state (deselect SRAM mode). At the rising edge of the second cycle of the master clock K, the chip enable E#, the write enable WE# and the control clocks CC1# and CC2# are all set to "L", and thus the buffer write mode is designated.

In this state, the SRAM array is not driven and externally applied data (D1) is written to the write data transfer buffer (DTBW). Address bits As4 to As11 are set to "L". The write data transfer data (DTBW) is selected in accordance with the SRAM block address bits As0 to As3, and data is written to the selected write data transfer buffer (DTBW). When the buffer write mode is designated, mask data of the mask register is modified in accordance with the external mask data M0 to M3 at that time. If any of the mask data M0 to M3 is "0" indicating writing, the corresponding bit of the mask register is reset indicating that the mask is released. Only the mask bit of the mask register corresponding to the transfer buffer to which data writing is carried out is reset.

In the third and fourth cycles of the master clock K, the SRAM read mode is designated, and data is read from the SRAM array. In the fifth cycle of the master clock K, the chip enable E# is set to "H" and the deselect SRAM mode is designated.

In the sixth to eleventh cycle of the master clock K, the chip enable E#, the write enable WE# and the control clocks CC1# and CC2# are all set to "L", and the buffer write mode is designated. Thus data is written to the write data transfer buffer (DTBW) in each clock cycle.

By carrying out the buffer write mode operation, data can be written to the write data transfer buffer (DTBW) without affecting the data stored in the SRAM array, since memory cell is not selected in the SRAM array. Thereafter, by transferring data from the write data transfer buffer (DTBW) to the DRAM array, data can be written to the DRAM array without affecting the data (cache data) stored in the SRAM array. Thus writing of the graphic data can be carried out at high speed.

Figure 23:
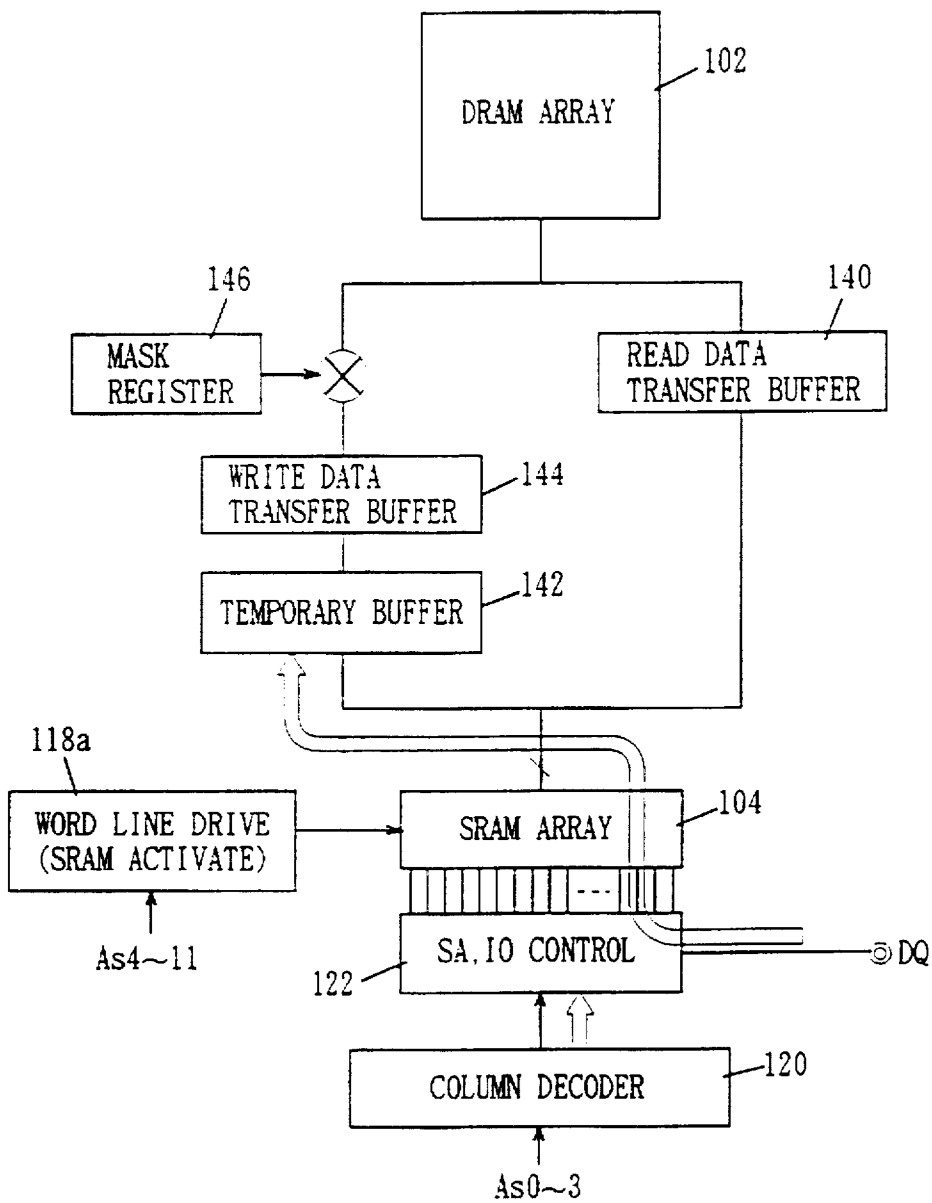
FIG. 23 shows the flow of data in the buffer write mode operation.

FIG. 23 shows the flow of data in the buffer write mode. In the buffer write mode, the word line driving circuit 118a is not driven. By column decoder 120, a corresponding buffer in temporary buffer 142 is selected, and data is written to the selected buffer. The operation of the portion driving the DRAM array will be described.

[DRAM System]

FIG. 24 shows, in a table, operation modes related to the DRAM array and the states of control signals for realizing respective operation modes. As shown in FIG. 24, the operations related to the DRAM array includes a DRAM power down mode in which transmission of clocks to the DRAM portion is inhibited to effectively make longer the operation cycle of the DRAM array; an DRAM NOP mode for inhibiting operation of the DRAM; a DRAM activate mode for driving the DRAM array; a DRAM read transfer mode for transferring data from the DRAM array to the read data transfer buffer; a DRAM write transfer mode for transferring data from the write data transfer buffer to the DRAM array; a DRAM precharge mode for setting the DRAM to a precharge state; and a DRAM auto refresh mode for carrying out auto refresh of the DRAM array. The portion for driving the DRAM array further includes a special mode for the CDRAM, and a command register set mode for setting command data for determining arrangement of data input/output pin and the like in a command register (not shown in FIG. 1). The operation mode will be described.

[DRAM Power Down]

In the DRAM power down mode, master clock is not applied to the DRAM portion. The speed of operation of the DRAM is slower than that of the SRAM. It takes several clock cycles to select a row and to access the DRAM array. It is the same in the data transfer mode. Therefore, in each operation, the duration and the timing for generating control signals are determined in accordance with the master clock K. Accordingly, if the master clock is not applied to the DRAM control circuit (128 in FIG. 1) in this DRAM power down mode, the state of the previous clock cycle is maintained.

Figure 25:
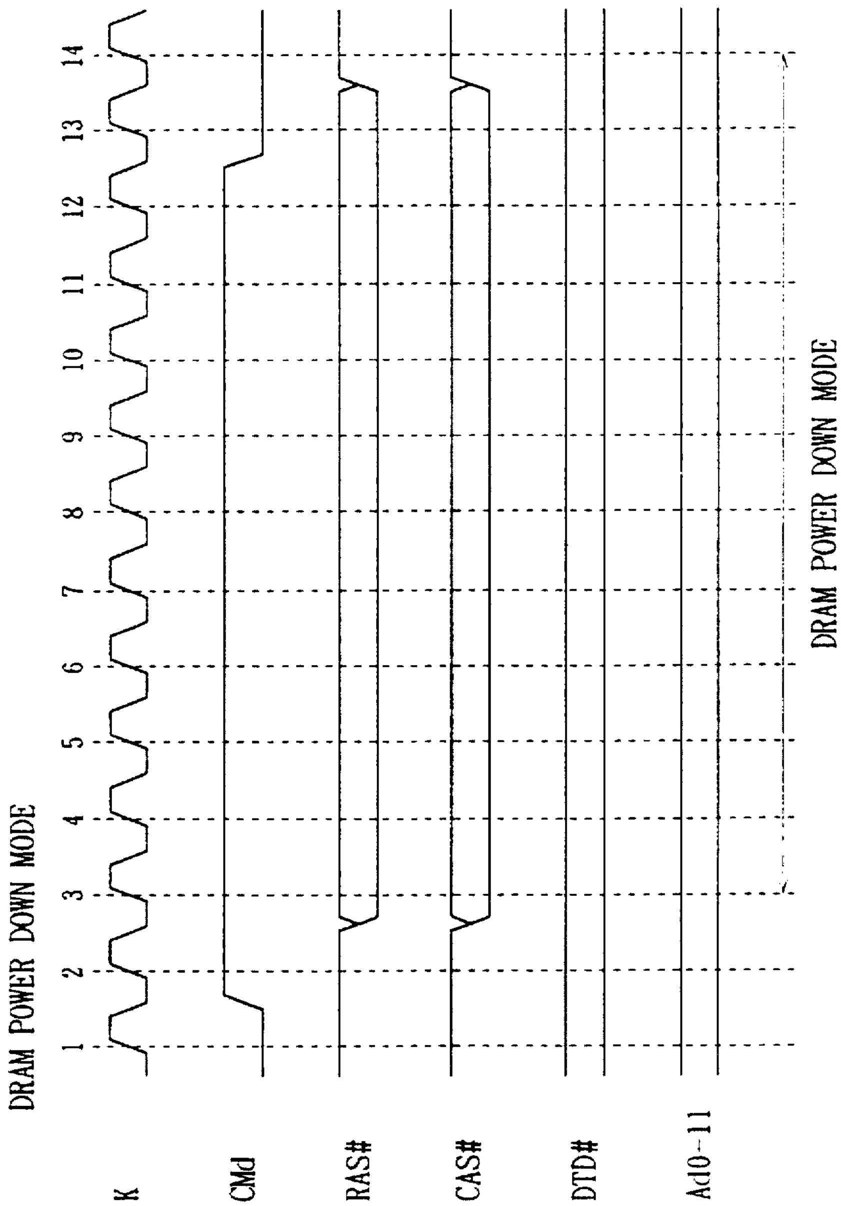
FIG. 25 is a diagram of waveforms showing a DRAM power down mode operation.

As shown in FIG. 25, for the DRAM power down mode, the DRAM clock mask CMd is set to "H" at a rising edge of the master clock K, and the DRAM enters the power down mode from the next cycle. In FIG. 25, the DRAM clock mask CMd is set to "H" at a rising edge of the second cycle of the master clock K and the DRAM power down mode starts after the third clock cycle of the master clock K. By stopping the operation of the DRAM, power consumption is reduced.

[DRAM NOP]

The DRAM NOP mode is an operation mode in which new operation of the DRAM is inhibited. The DRAM portion maintains the precharge state or active state of the previous cycle.

Referring to FIG. 26, for the DRAM NOP mode, the DRAM clock mask CMd is set to "L" at a rising edge of the master clock K, and in the next cycle, the row address strobe RAS# and the column address strobe CAS# are both raised to "H" at the rising edge of the master clock K. As the row address strobe RkS# and the column address strobe CAS# are both "H", the DRAM portion maintains the non-selected state, that is, the precharge state of the standby (when the precharge state is set in the previous cycle).

In the operations related to the DRAM, states of control signals related to the operation of the SRAM array are arbitrary as shown in the table of FIG. 24. Therefore, the operation of the SRAM can be carried out independent from the operation of the DRAM. This is the same in other operations related to the DRAM array which will be described in the following. The DRAM array clock mask CMd allows transmission of the master clock K in the next clock cycle when it is "L". When DRAM clock mask CMd is at "H", transmission of the master clock K to the DRAM control circuit in the next clock cycle is inhibited. If the DRAM NOP mode is designated, the DRAM maintains the precharge state when the precharge state has been designated in the previous cycle, and maintains the active state when active state has been designated. The DRAM NOP ensures that the DRAM portion does not enter a new operation mode.

[DRAM Activate]

In the DRAM activate mode, the DRAM array is activated. For designating the DRAM activate mode, when the DRAM clock mask CMd is at "L" in the previous clock cycle, the row address strobe RAS# is set to "L", and the column address strobe CAS# and the data transfer designation DTD# are set to "H" at the rising edge of the master clock K of the next clock cycle. In this state, the DRAM address Ad is taken as a row address for designating a row of the DRAM array, and row selecting operation, and detection, amplification and latching of the memory cell data by the sense amplifier are executed.

[DRAM Precharge]

In the DRAM precharge mode, the DRAM is set to a standby state or the precharge state. By carrying out the precharge mode, the DRAM activate mode can be terminated. For the DRAM precharge mode, the DRAM mask clock CMd is set to "L" at a rising edge of the master clock K, and the row address strobe RAS# and the data transfer designation DTD# are both set to "L" and the column address strobe CAS# is set to "H" at the rising edge of the master clock K of the next clock cycle. When the DRAM precharge mode is designated, the DRAM is returned to the precharge state. More specifically, a row (selected row) which has been at the active state in the DRAM array is set to the non-selected state to be ready for the next activation cycle. When a different row is to be selected in the DRAM array, it is necessary to terminate the DRAM activate mode once by the DRAM precharge cycle and to carry out the DRAM activate mode newly.

[DRAM Read Transfer]

The DRAM read transfer mode is an operation mode in which data is transferred from the DRAM array to the read data transfer buffer (DTBR). The data transfer from the DRAM array to the read data transfer buffer (DTBR) and data transfer from the read data transfer buffer to the SRAM array and the data input/output circuit are carried out by separate control system.

For the DRAM read transfer mode, the row address strobe RAS# is set to "L", the data transfer designation DTD# is set to "H" and the column address strobe CAS# is set to "L" at the rising edge of the master clock K while the DRAM activate mode is designated. At this time, the column block decoder 112 shown in FIG. 1 operates with the DRAM address inputs Ad4 to Ad11 used as column address, a corresponding column block (data block) of the memory cells connected to the selected row of the DRAM array is selected, and the memory cell data included in the selected data block is transferred to the read data transfer buffer (DTBR).

In order to ensure this operation, it is necessary to set address bits Ad0 to Ad3 to "L". When the DRAM read transfer mode is set, other operations are all inhibited during a prescribed time period. After the lapse of a prescribed clock time from the designation of the DRAM read transfer mode, the data in the read transfer buffer (DTBR) are established. The time required from the designation of the DRAM read transfer mode to the establishment of the data in the read data transfer buffer (DTBR) by the new data is referred to as a latency, which is determined by a command data set in a command register, which will be described later. The read data transfer buffer (DTBR) has latch function and holds the data of the previous cycle. By setting the latency and by determining the data transfer timing by the master clock K, the content of the read transfer buffer (DTBR) can be surely re-written by the new data and data can be accurately transferred/read. As access is inhibited at the time of change of the data in the read data transfer buffer (DTBR), storage or reading of erroneous data to or from the read transfer buffer (DTBR) can be prevented.

Figure 27:
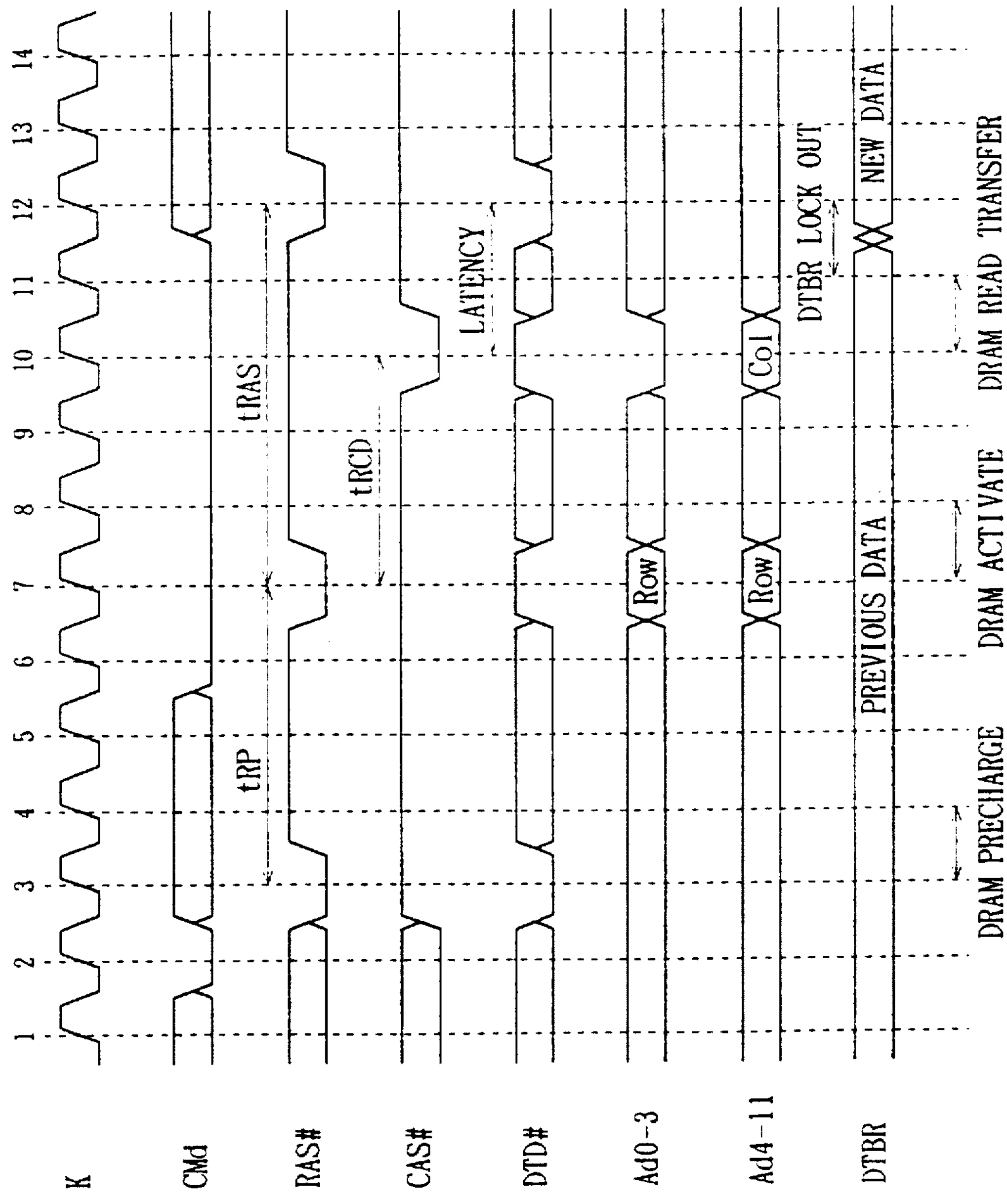
FIG. 27 is a diagram of signal waveforms showing the DRAM read transfer mode operation.

FIG. 27 shows states of the external control signals and the states of data held in the read data transfer buffer when the DRAM precharge mode, the DRAM activate mode and the DRAM read transfer mode are designated. The operation sequence of the DRAM will be described with reference to FIG. 27.

Referring to FIG. 27, at the rising edge of the second cycle of the master clock K, the DRAM clock mask CMd, attains "L", and transmission of the master clock K to the DRAM control circuit (128 in FIG. 1) is permitted.

At the rising edge of the third cycle of the master clock K, row address strobe RAS# and data transfer designation DTD# are both set to "L" and column address strobe CAS# is set to "H". The DRAM precharge mode is designated.

After the lapse of the RAS precharge time tRP (the minimum time necessary for precharging each signal line in the DRAM portion), row address strobe RAS# is set to "L", column address strobe CAS# and DTD# are both set to "H" in the seventh cycle of master clock K, and thus the DRAM activate mode is designated. Here, the DRAM clock mask CMd has fallen to "L" in the previous cycle (sixth cycle). In the following description, the DRAM clock mask CMd in the previous cycle of operation mode designation is always "L", and therefore it is not described except for cases requiring specific description.

When the DRAM activate mode is designated, the DRAM address Ad0 to Ad11 applied at that time are taken in as a row address for designating a row in the DRAM array, and the data of the selected memory cell is sensed, amplified and latched by a sense amplifier.

After the lapse of the RAS-CAS delay time tRCD, in the tenth cycle of master clock K, row address strobe RAS# and data transfer designation DTD# are both set to "H" and column address strobe CAS# is set to "L". Thus the DRAM read transfer mode is designated. By the DRAM activate mode, among the memory cells connected to the selected row, a memory cell block is selected in accordance with the DRAM address AD4 to Ad11 applied at that time, and after the lapse of a prescribed time period (the latency of 2 clocks in FIG. 27), data of the read data transfer buffer (DTBR) is replaced by a new data.

If latency includes n clock cycles at the time of designation of the DRAM read transfer mode, designation of a new operation mode in the (n−1)th clock cycle from the cycle in which the DRAM read transfer starts is inhibited. At the time of data transfer from the DRAM array to the read data transfer buffer (DTBR), the read data transfer buffer is in the lock out state. During this period, buffer read operation (that is, an operation of reading data from the read data transfer buffer (DTBR)) is inhibited. The reason for this is that the data in the read data transfer buffer (DTBR) is unstable.

Designation of a new operation mode becomes possible after the lapse of the clock cycles determined by the latency. In the 12th cycle of master clock K, row address strobe RAS# and data transfer designation DTD# both attain to "L" and column address strobe CAS# attains to "H", and thus the DRAM precharge mode is designated. Consequently, the DRAM array returns to the precharge state to be ready for the next access.

FIG. 28 shows the flow of data in the DRAM read transfer mode. Referring to FIG. 28, in the DRAM read transfer mode, a block of a prescribed number of memory cells of the selected row in the DRAM array 102 is selected, and the data of the selected memory cell block is transferred to the read data transfer buffer 140. In order to ensure the DRAM read transfer mode operation, DRAM address bits Ad0 to Ad3 are all set to "L". In the operation of the DRAM array portion, the operation related to the SRAM array can be arbitrarily carried out except in the DTBR lock out period. Accordingly, data writing or reading by accessing to the SRAM in parallel with the data transfer from the DRAM array to the read data transfer buffer (DTBR) can be carried out, and writing of data to the write data transfer buffer (DTBW) is also possible. What is important is that the data transfer to the read data transfer buffer (DTBR) is not influenced.

[DRAM Write Transfer]

Figure 29:
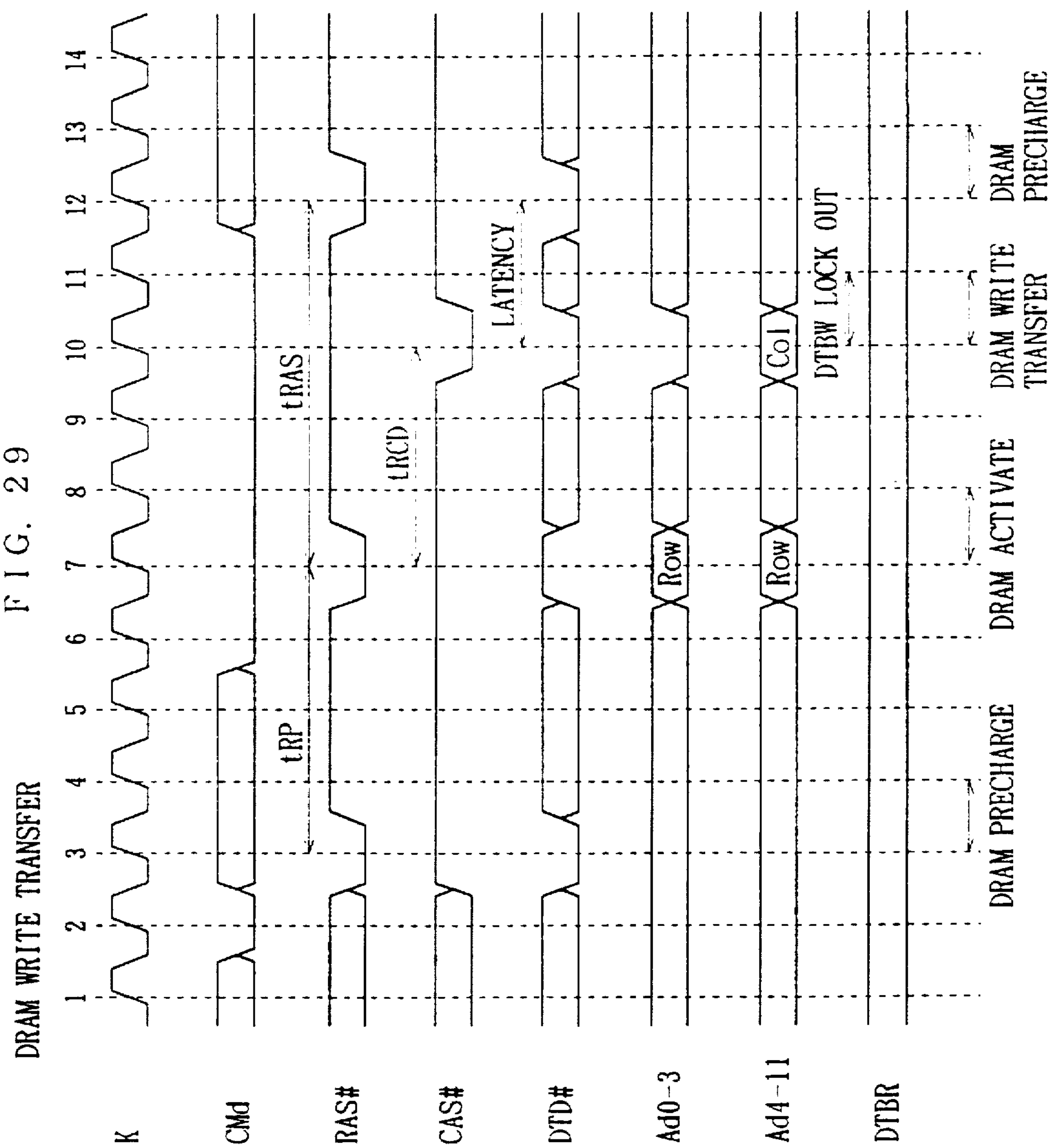
FIG. 29 is a diagram of signal waveforms showing the DRAM write transfer mode operation.

In the DRAM write transfer mode, data held in the write data transfer buffer (DTBW) is written to the selected memory cell block of the DRAM array in accordance with the mask data held by the mask register. Referring to FIG. 29, at a rising edge of the master clock K after the lapse of a prescribed time period (after the lapse of RAS-CAS delay time tRCD) from the execution of the DRAM activate cycle, row address strobe RAS# is set to "H", and column address strobe CAS# and data transfer designation DTD# are both set to "L". Thus the DRAM write transfer mode is designated. The DRAM address bits Ad4 to Ad11 applied at that time are taken as an address Col for selecting a column block (memory cell block), and operation of selecting a block of memory cells is carried out. Data are simultaneously transferred from the write data transfer buffer (DTBW) to the selected memory cell block. In order to ensure the operation of the DRAM write transfer mode, the DRAM address bits Ad0 to Ad3 must be set to "L". In the first 1 clock cycle at the designation of the DRAM write transfer mode (the 10th clock cycle of FIG. 29), any new operation for the DRAM array is inhibited.

In the cycle next to the first cycle after the designation of the DRAM write transfer mode, the mask data of the masked register are all set to the set state (inhibiting data transfer), in order to prevent erroneous overwriting of the next data.

Referring to FIG. 29, after the lapse of the RAS cycle period tRAS, in the 12th cycle of the master clock K, row address strobe RAS# and data transfer designation DTD# are both set to "L", column address strobe CAS# is set to "H" and the DRAM precharge mode is designated. In the first 1 clock cycle at the designation of the DRAM write transfer mode, the write data transfer buffer (DTBW) is set to the lock out state. More specifically, access to the write data transfer buffer is inhibited in this cycle. The operations related to the SRAM array can be freely set and executed.

Figure 30:
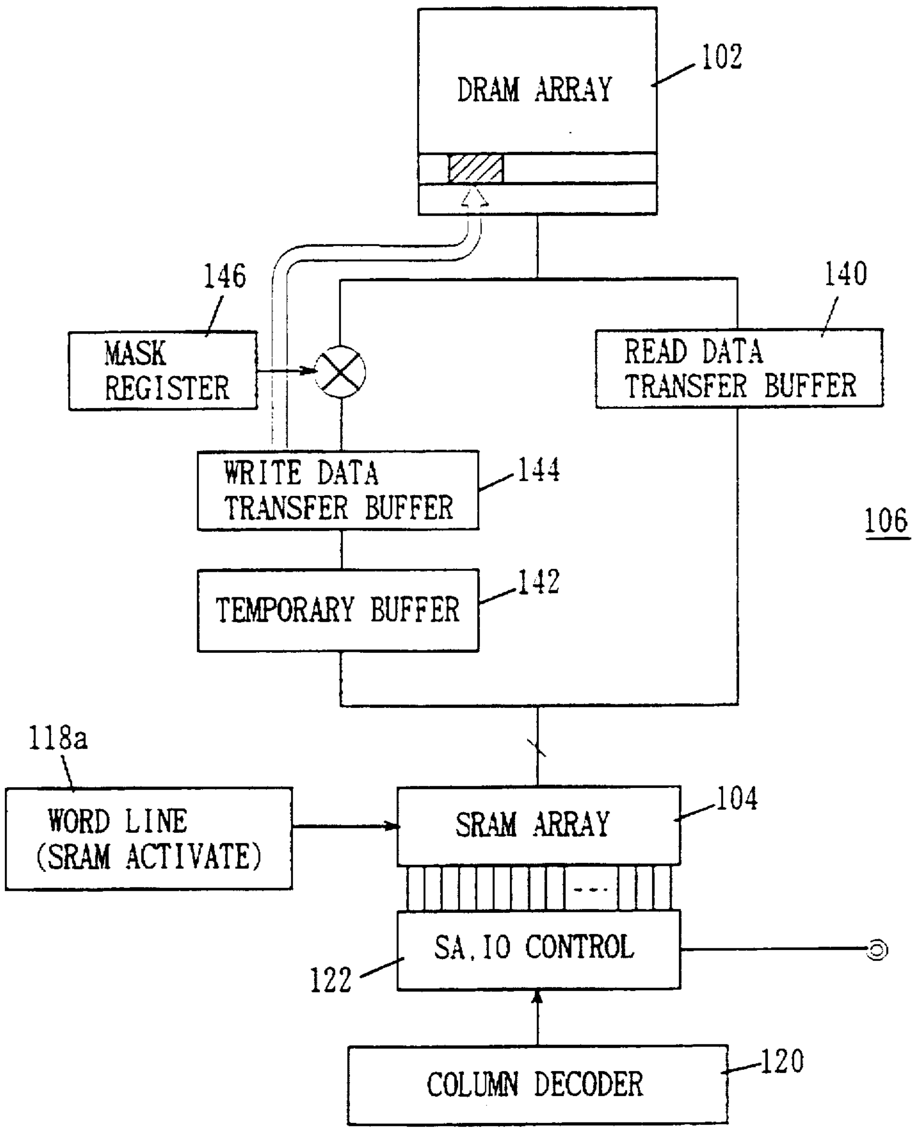
FIG. 30 shows the flow of data in the DRAM write transfer mode operation.

FIG. 30 shows the flow of data at the DRAM write transfer mode. Referring to FIG. 30, the data stored in the write data transfer buffer 144 are transferred to the DRAM array 102 in accordance with the mask data set in the mask register 146. In the DRAM array 102, a row has already been selected, and in the DRAM write transfer mode, a block of a plurality of memory cells of the selected row is selected. Data is transferred from the write data transfer buffer 144 to the selected block of a plurality of memory cells. As is apparent from FIG. 30, the SRAM array 104 can be accessed in this period, and the read data transfer 140 can be also externally accessed.

A specific structure of the DRAM portion will be described.

Figure 31:
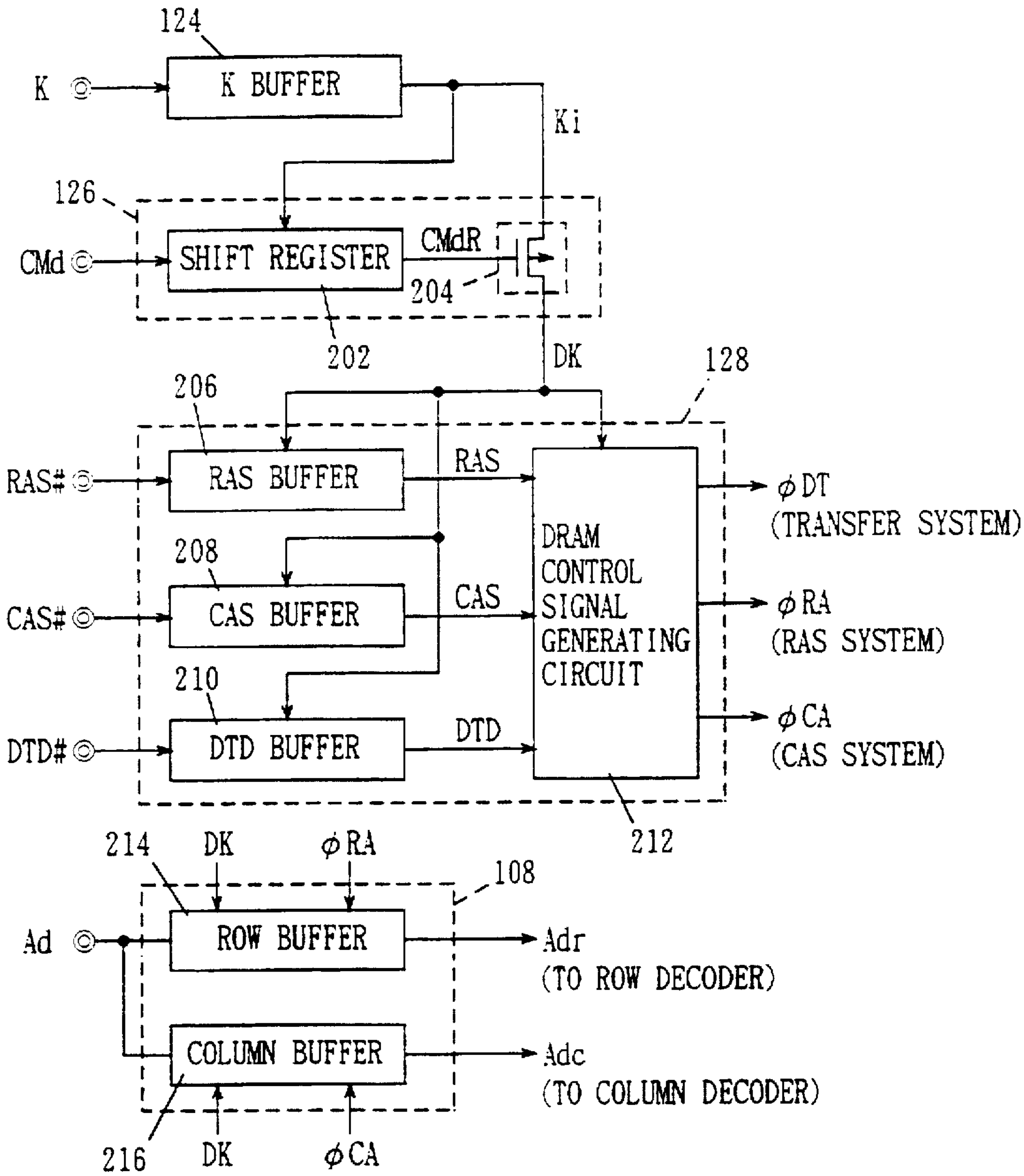
FIG. 31 shows a structure for controlling operations related to the DRAM portion in the semiconductor memory device shown in FIG. 1.

FIG. 31 shows an example of the structures of the DRAM control circuit and the mask circuit shown in FIG. 1. Referring to FIG. 31, a K buffer 124 receives an external clock K and generates an internal master clock Ki.

A mask circuit 126 includes a shift register 202 for delaying the DRAM clock mask CMd for one clock period of the internal clock Ki from K buffer 124, and a gate circuit 204 for passing the internal master clock Ki in accordance with the delayed clock mask CMdR from shift register 202. Referring to FIG. 31, gate circuit 204 is represented by a p channel MOS (insulated gate type field effect) transistor inhibiting transmission of the internal master clock Ki when the delayed clock mask CMdR is at "H". When the clock mask CMd is set to "H" state in a certain cycle, transmission of the internal master clock Ki is inhibited in the next cycle, and therefore generation of the DRAM master clock DK is stopped.

DRAM control circuit 128 includes a RAS buffer 206 taking the row address strobe RAS# at a rising edge of the DRAM master clock DK for generating an internal row address strobe RAS#, a CAS buffer 208 latching the column address strobe CAS# at a rising edge of the DRAM master clock DK for generating an internal column address strobe CASr, a DTD buffer 210 responsive to the DRAM master clock DK for taking the data transfer designation DTD# at the rising edge thereof for generating an internal transfer designation DTD, and a DRAM control signal generating circuit 212 taking the internal control signals RAS, CAS and DTD at a rising edge of the DRAM master clock DK for determining the mode designated by the states of the signals, and generating necessary control signals in accordance with the determined operation mode.

DRAM control signal generating circuit 212 also carries out monitoring of latency period necessary for data transfer, in accordance with the DRAM master clock DK. DRAM control signal generating circuit 212 generates various control signals necessary for driving the DRAM array portion and for data transfer operation between the data transfer circuit (read data transfer buffer and write data transfer buffer) and the DRAM array. In FIG. 31, a transfer control signal ϕDT for controlling the operation of the transferring circuits, a RAS control signal ϕRA for controlling operations of the circuits related to the signal RAS (such as row selecting operation in the DRAM array and a control signal ϕCA for controlling the operations of circuit portions related to the CAS signal (such as selection of a column) are shown as representatives.

Address buffer 108 includes a row buffer 214 responsive to the DRAM master clock DK and RAS control signal ϕRA for taking an external DRAM address Ad and for generating a DRAM row address Adr, and a column buffer 216 responsive to the DRAM master clock DK and CAS control signal ϕCA for latching the DRAM address Ad and for generating a DRAM column address Adc. The row address Adr is applied to row decoder 110 shown in FIG. 1, and a prescribed higher bit of the column address from column buffer 216 is applied to column block decoder 112 shown in FIG. 1. As will be described later, the column address Adc or Adr is utilized as command data to the command register in some operation modes. The column address Adc is also used to designate the type of the data transfer mode (which will be described later).

As described above, DRAM control circuit 128 controls only the operation of the DRAM array and data transfer operation between the DRAM array and the data transfer circuit. It is independent from the operation of the SRAM array portion. Therefore, as mentioned above, driving of the DRAM array and data transfer between the DRAM array and the data transfer circuit can be carried out regardless of the states of control signals applied to the SRAM control circuit 132.

[Chip Layout]

Figure 32:
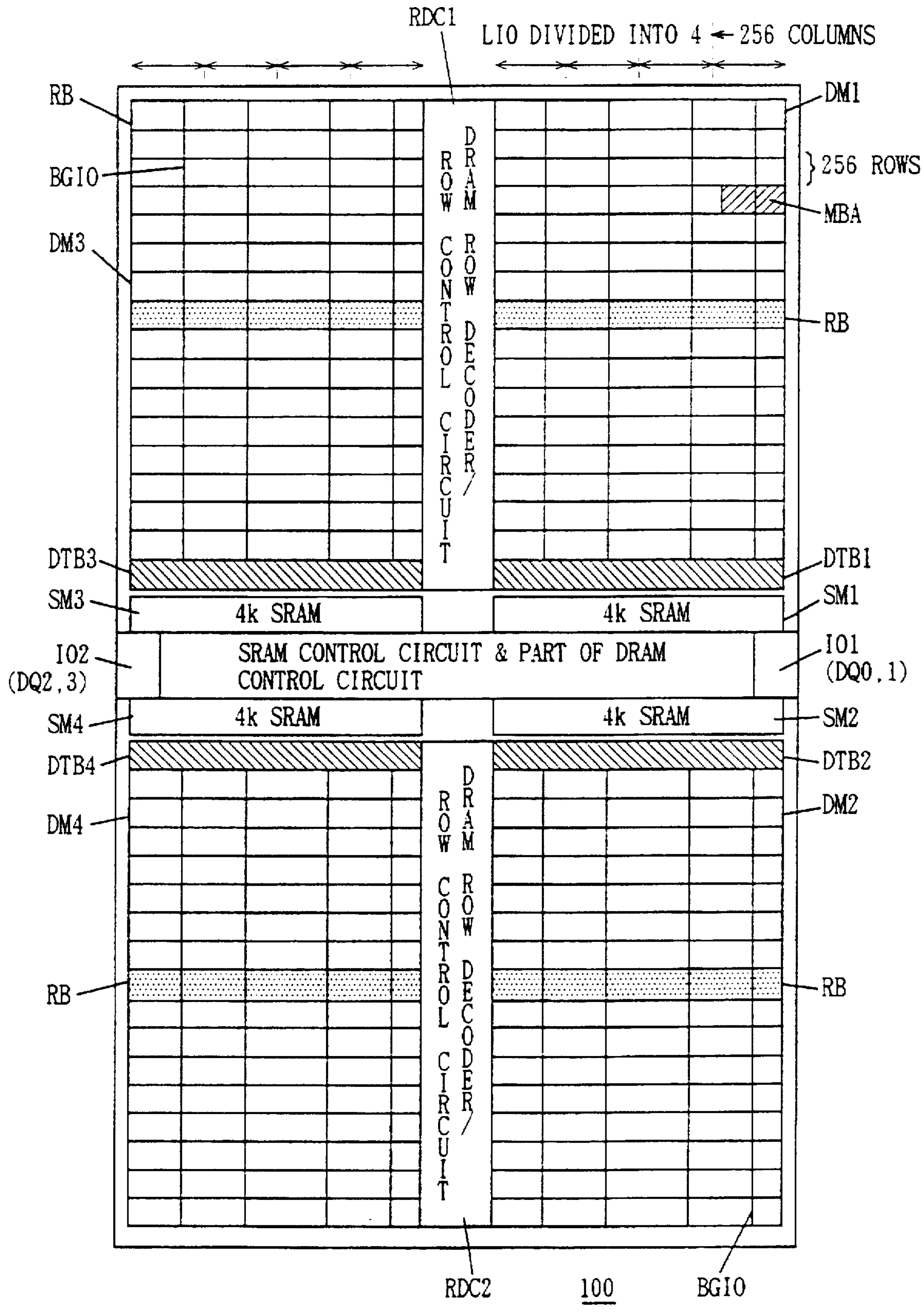
FIG. 32 shows a chip layout of the semiconductor memory device in accordance with one embodiment of the present invention.

FIG. 32 shows a specific layout of the CDRAM array. Referring to FIG. 32, the CDRAM 100 is arranged on a rectangular chip. CDRAM 100 includes four DRAM memory mats DM1, DM2, DM3 and DM4 each having the storage capacity of 4M bits, SRAM memory mats SM1, SM2, SM3 and SM4 arranged at the central portion of the chip corresponding to the DRAM memory mats, each having the storage capacity of 4K bits, and data transfer circuits DTB1, DTB2, DTB3 and DTB4 arranged between the DRAM memory mats DM1 to DM4 and SRAM memory mats SM1 to SM4, respectively.

Each of the DRAM memory mats DM1 to DM4 is shown divided into 4×16=64 memory blocks MBA. The memory block MBA includes memory cells arranged in 256 rows by 256 columns. DRAM memory mats DM1 to DM4 each include 16 pairs of IO lines arranged to traverse all the row blocks RB shown in the figure. Referring to FIG. 32, a big global IO line pair BGIO each including four pairs of global IO line is shown. One global IO line corresponds to 64 columns of the DRAM array. One of the 64 columns is connected to one global IO line pair. In one DRAM memory mat, 16 columns are selected simultaneously. Four columns are selected simultaneously in the memory block MBA.

Four pairs of local IO lines are provided for connecting the simultaneously selected four columns to the global IO line pair. The local IO line pair is utilized only in the corresponding memory block MBA. In each of the DRAM memory mats DM1 to DM4, only the memory block including the selected row (word line) is activated, and other memory blocks are kept at the precharge state. Driving by this partial activation method (block dividing method), power consumption can be reduced.

Among the memory cells connected to the selected row of the DRAM, 16 columns of memory cells are selected, the data of the selected 16 bits of memory cells are transmitted to the local IO line pair, and then to the global IO line pair. In FIG. 32, the words "the LIO divided into four" indicates that four pairs of local IO lines LIO are provided in this divided block and respectively connected to the big global IO line pair BGIO (four pairs of global IO lines) provided in the corresponding block.

16 data transfer circuits in each of data transfer blocks DTB1 to DTB4 are provided corresponding to the global 10 line pairs. SRAM memory mats SM1 to SM4 each include static memory cells arranged in 256 rows by 16 columns. At the time of data transfer, one row is selected in each of the SRAM memory mats SM1 to SM4, and data transfer is carried out between 16 bits of static memory cells connected to this one row and the data transfer circuits.

Along the short side direction of the CDRAM 100, DRAM row decoder and row control circuit are arranged between adjacent memory mats. A DRAM row decoder/row control circuit RDC1 is provided between DRAM memory mats DM1 and DM3, while a row decoder/row control circuit RDC2 is provided between DRAM memory mat DM2 and DM4. The DRAM row decoder/row control circuit carries out row selecting operation in the corresponding DRAM memory mat, drives sense amplifier for sensing and amplifying the data of the selected memory cell, precharge the bit lines and so on.

SRAM control circuitry and some of the DRAM control circuits are arranged at the central portion of the CDRAM 100. The DRAM control circuits includes a column block decoder for selecting a column in the DRAM memory mat, a circuit for controlling the column selecting operation and various peripheral circuits. The SRAM control circuitry includes an SRAM row decoder, an SRAM column decoder and the SRAM control circuit shown in FIG. 1.

At the central portion of the CDRAM, input/output circuits IO1 and IO2 are provided. Input/output circuit IO1 is for data input/output of DRAM memory mats DM1 and DM2 as well as the SRAM memory mats SM1 and SM2, which input/output the input/output data DQ0 and DQ1. The input/output circuit IO2 carries out input/output of input/output data DQ2 and DQ3 to and from the DRAM memory mats DM3 and DM4 as well as the SRAM memory mats SM3 and SM4.

Since data input/output: is carried out at the central portion of the chip of CDRAM 100, signal lines for carrying out data input/output can be made shorter, enabling high speed data input/output. Since the SRAM memory mat is arranged at the center of the chip, the interconnections for data input/output for the SRAM memory mat can be made shorter, enabling high speed access to the SRAM.

[Array Structure]

Figure 33:
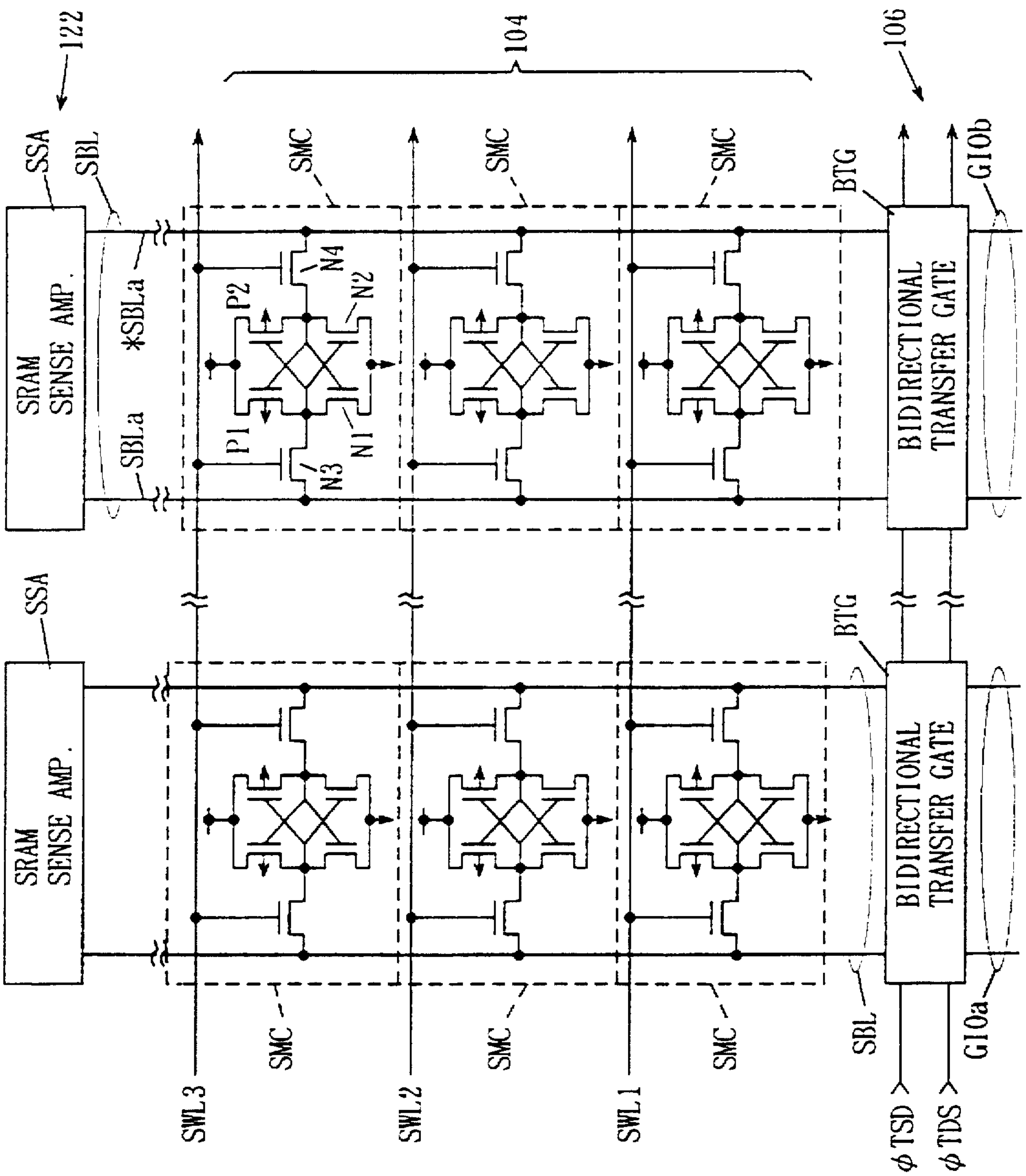
FIG. 33 shows a structure of the SRAM array portion of the semiconductor memory device in accordance with one embodiment of the present invention.

FIG. 33 shows a structure of the SRAM array (the SRAM memory mat shown in FIG. 32 or the SRAM array shown in FIG. 1). The SRAM array 104 includes static memory cells SMC arranged in a matrix of rows and columns. One row of static memory cells SMC is connected to one SRAM word line SWL, while a column of static memory cells SMC is connected to one SRAM bit line pair SBL. In FIG. 33, three SRAM word lines SWL1 to SWL3 are shown as representatives.

A static type memory cell SMC includes cross coupled p channel MOS transistors P1 and P2 as well as cross coupled n channel MOS transistors N1 and N2. Transistors P1 and N1 constitute a first inverter, while transistors P2 and N2 constitute a second inverter. The first and second inverters have their inputs and outputs cross connected to form an inverter latch circuit.

The static memory cell SMC further includes an n channel MOS transistor N3 responsive to a signal potential on the SRAM word line for connecting a connection node of transistors P1 and N1 to a SRAM bit line SBLa, and an n channel MOS transistor N4 responsive to the signal potential on SRAM word line SWL for connecting a connection node of transistors P2 and N2 to a SRAM bit line *SBLa.

For each of the SRAM bit line pair SBL, a SRAM sense amplifier SSA and a bidirectional transfer gate BTG are provided. The bidirectional transfer gate BTG is connected to a global IO line pair GIOa or GIOb which extends from the DRAM array, as will be described later. Transfer control signals represented as φTSD and φTDS are applied to the bidirectional transfer gate BTG.

In the structure of FIG. 33, SRAM word lines SWL1 to SWL3 are respectively connected to memory cells the number of which is equal to the number of data bits transferred by one data transfer operation between the DRAM array and the SRAM array (in this embodiment, 16 bits).

Figure 34:
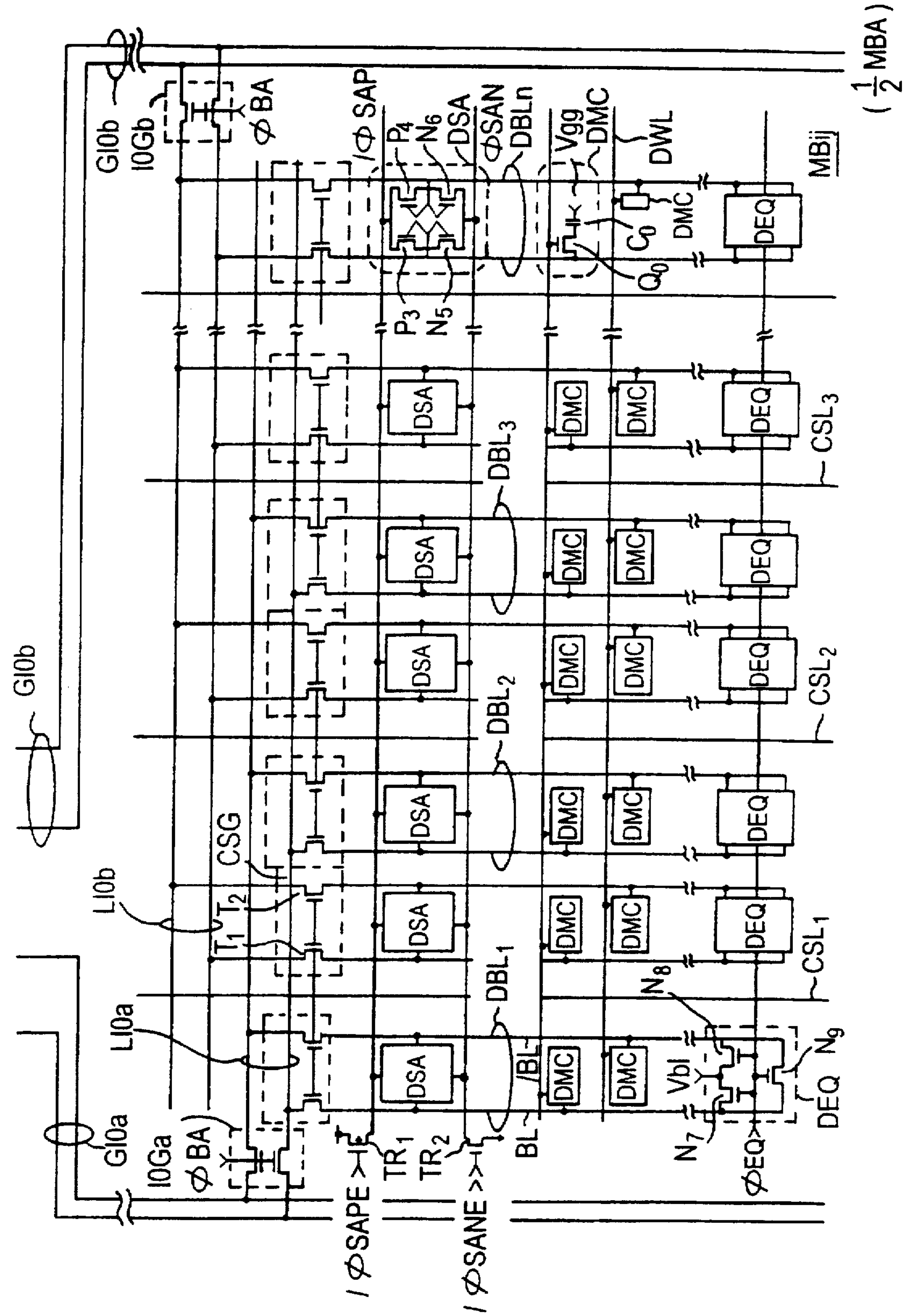
FIG. 34 shows a structure of the DRAM array portion of the semiconductor memory device in accordance with one embodiment of the present invention.

FIG. 34 shows an arrangement of the DRAM array. FIG. 34 shows a portion corresponding to one half of the memory block MBA of FIG. 32. More specifically, two pairs of global IO lines GIOa and GIOb and two pairs of local IO lines LIOa and LIOb are arranged. A DRAM memory block MBij includes a plurality of dynamic memory cells DMC arranged in a matrix. A dynamic memory cell DMC includes one memory transistor Q0 and one memory capacitor C0. A prescribed potential Vgg (normally an intermediate potential of Vcc/2) is applied to one electrode (cell plate) of memory capacitor C0.

The memory block MBij includes DRAM word lines DWLs to each of which one row of DRAM cells (dynamic memory cells) DMCs are connected, and DRAM bit line pairs DBL to each of which a column of DRAM cells DMCs are connected. The DRAM bit line pair DBL includes complementary bit lines BL and /BL. The DRAM cell DMC is arranged at each intersection between the DRAM word line DWL and DRAM bit line pair DBL.

For each DRAM bit line pair, a DRAM sense amplifier DSA for sensing and amplifying potential difference on the corresponding bit line pair is provided. The DRAM sense amplifier DSA includes a P channel sense amplifier portion including cross coupled p channel MOS transistors P3 and P4, and an n channel sense amplifier portion including cross coupled n channel MOS transistors N5 and N6.

DRAM sense amplifier DSA has its operation controlled by sense amplifier driving signals /φSAB and φSAN provided from p channel MOS transistor TR1 and n channel MOS transistor TR2 in response to a sense amplifier activating signal /φSAPE and φSANE.

The p channel sense amplifier portion raises the potential on a higher potential bit line to the level of operational supply potential Vcc in response to a sense amplifier driving signal /φSAP. The n channel sense amplifier portion discharges the potential of a lower potential bit line to the level of, for example, the ground potential Vss in response to a sense amplifier driving signal φSAN.

When a sense amplifier activating signal φSAPE attains "L", the p channel MOS transistor TR1 generates the sense amplifier driving signal φSAPE of the level of the supply potential Vcc and transmit this to one power supply node of the DRAM sense amplifier DSA. When the sense amplifier activating signal φSANE attains "H", the n channel MOS transistor TR1 transmits the sense amplifier driving signal φSAN which is at the level of the ground Vss to the other supply node of the DRAM sense amplifier.

Here, the driving signal lines on which sense amplifier driving signals φSAN and /SAP are transmitted are precharged to the intermediate potential Vcc/2 in the standby state. However, for simplicity of the drawing, the circuit for precharging the sense amplifier driving signal lines is not shown.

A precharge/equalize circuit DEQ which is activated in response to a precharge/equalize signal φEQ for precharging each bit line of the corresponding bit line pair to a prescribed precharge potential Vb1 and for equalizing the precharge potential of the bit line BL and /BL is provided for each of the DRAM bit line pairs DBL. The precharge/equalize circuit DEQ includes n channel MOS transistors N7 and N8 for transmitting the precharge potential Vb1 to bit lines BL and /BL and an n channel MOS transistor N9 for equalizing the potentials of the bit lines BL and /BL.

The DRAM memory block MBij further includes a DRAM column selecting gate CSG provided corresponding to each of the DRAM bit line pairs DBL, which is rendered conductive in response to a signal potential on a column selecting line CSL for connecting the corresponding DRAM bit line pair DBL to the local IO line pair LIO. The column selecting line CSL is provided common to two pairs of DRAM bit lines, and then two DRAM bit line pairs DBL are selected simultaneously. A pair of local IO line pairs LIOa and LIOb receive data from the two pairs of DRAM bit lines selected simultaneously. A precharge/equalize circuit similar to the bit line equalize/precharge circuit DEQ is provided for each of the local IO line pairs LIOa and LIOb. For simplicity of drawings, the precharge/equalize circuit is not shown, either.

The memory block MBij further includes DRAM IO gates IOGa and IOGb for connecting the local IO line pairs LIOa and LIOb to global IO line pairs GIOa and GIOb, in response to a block activating signal φBA, respectively. In the CDRAM, only that block which includes a selected row (word line) is set to the selected state. Only for that block which has been selected, the DRAM IO gates IOGa and IOGb are rendered conductive. The control signal φBA for selecting the block is generated by most significant 4 bits of the DRAM row address used for selecting the word line, for example (in a structure in which only one row block is set to the selected state out of 16 row blocks (each including 256 rows)).

[Data Transfer Operation: Page Mode Transfer]

The data transfer operation between the DRAM array and the SRAM array will be described. In the following, the data transfer gate is simplified for the purpose of facilitating understanding of the data transfer operation between the arrays.

Figure 35:
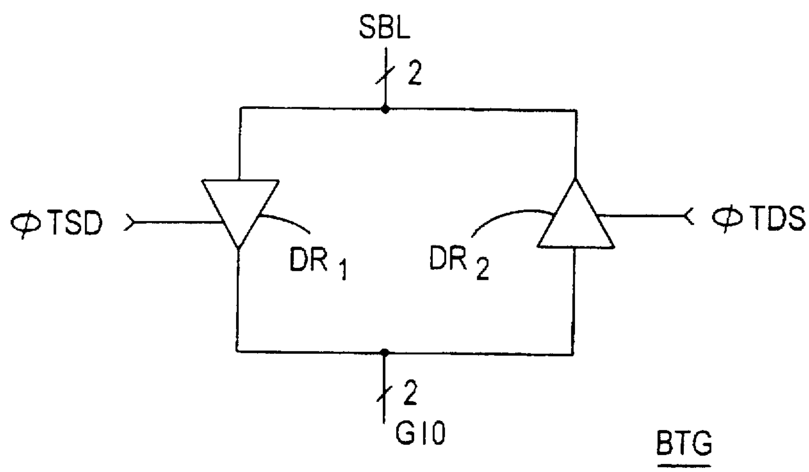
FIG. 35 shows a principle structure of a bi-directional data transfer circuit.

FIG. 35 shows a principle structure of the bidirectional transfer gate BTG. Referring to FIG. 35, the bidirection transfer gate BTG includes a 3-state buffer DRI responsive to a transfer designating signal φTSD for transmitting data on the SRAM bit line pair SBL to the global IO line pair GIO, and a 3-state buffer DR2 which is activated in response to the transfer designating signal φTDS for transferring data on the global IO line pair GIO to the SRAM bit line pair SBL. The buffers DR1 and DR2 have, as actual function, latch function. The details of the bi-directional transfer gate will be described later. First, data transfer operation from the DRAM array to the SRAM array will be described with reference to this figure as well as to the operational waveform diagram of FIG. 36.

Before time t1, the SFUM array and the DRAM array are both at the standby state (precharge state).

While the precharge designating signal φEQ is at active "H", the DRAM precharge/equalize circuit DEQ is at an active state, precharging the DRAM bit line pair DBL at a prescribed precharge potential Vb1 nand equalizing the potentials of the bit lines BL and /BL. Similarly, the potentials of the local IO line pair LIOa and a global IO line pair GIO are precharged at an intermediate potential (the circuit structure thereof is not shown).

At time t1, when the precharge designating signal φEQ falls to "L", the precharge/equalize circuit DEQ is rendered inactive, and the DRAM bit line pair DBL is set to an electrically floating state at a prescribed precharge potential. Similarly, the signal line transmitting the sense amplifier driving signals φSAN and /φSAP is also set to the floating state at the intermediate potential of Vcc/2. Thereafter, row selecting operation by the DRAM row decoder is carried out in accordance with the applied DRAM address signal.

Figure 36:
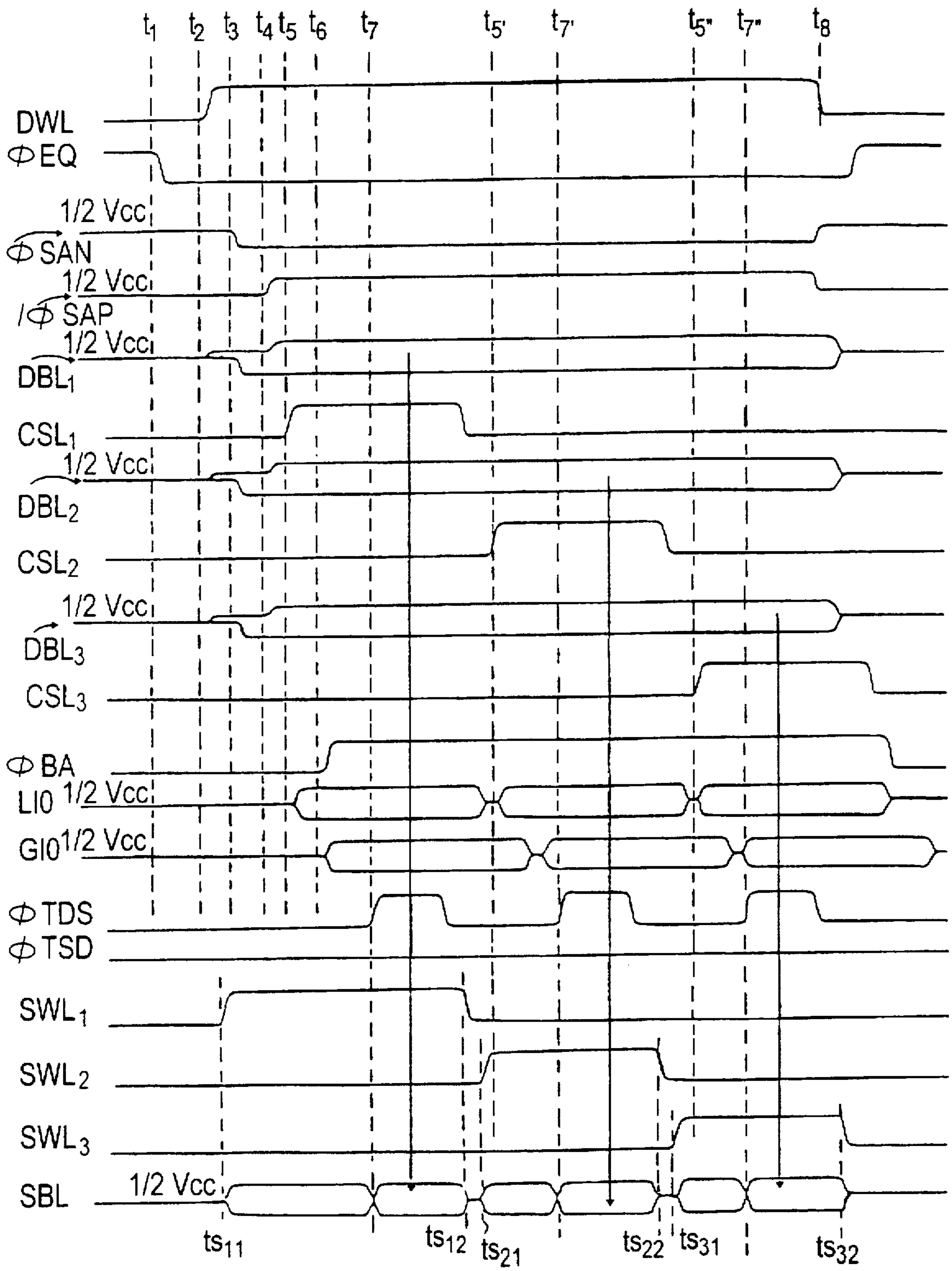
FIG. 36 is a diagram of waveforms showing the principle of data transfer operation from the DRAM array to the SRAM array in the semiconductor memory device shown in FIG. 1.
Figure 37A:
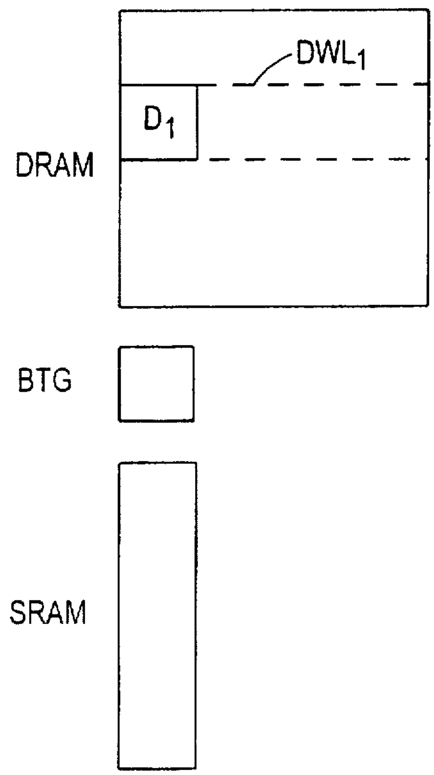
FIGS. 37A–37D schematically show data transfer operation from the DRAM array to the SRAM array in the semiconductor memory device in accordance with one embodiment of the present invention.
Figure 37B:
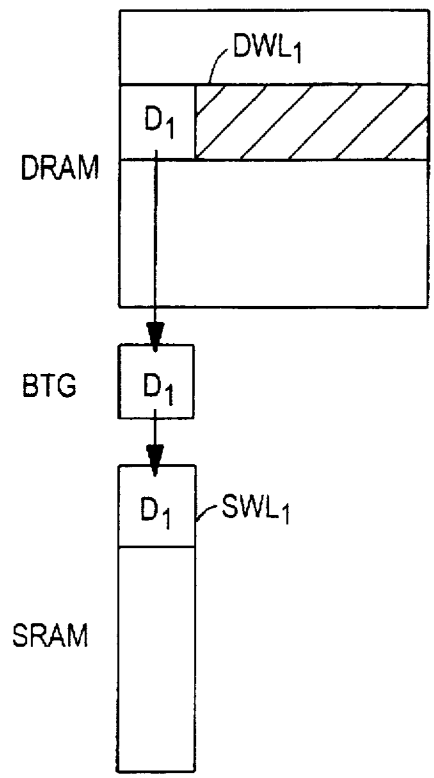
Figure 37C:
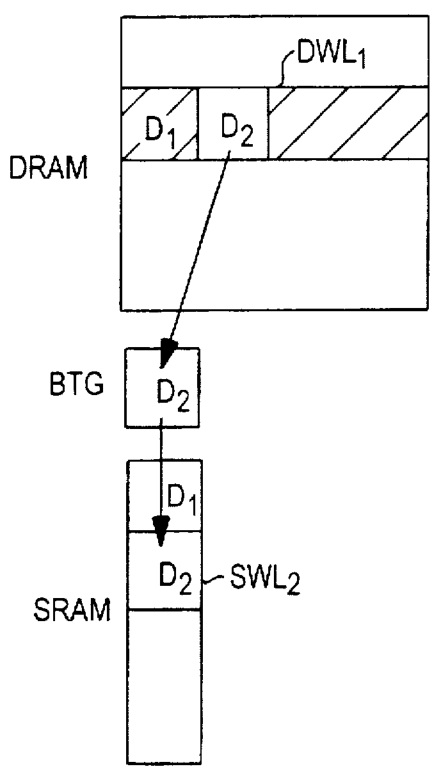
Figure 37D:
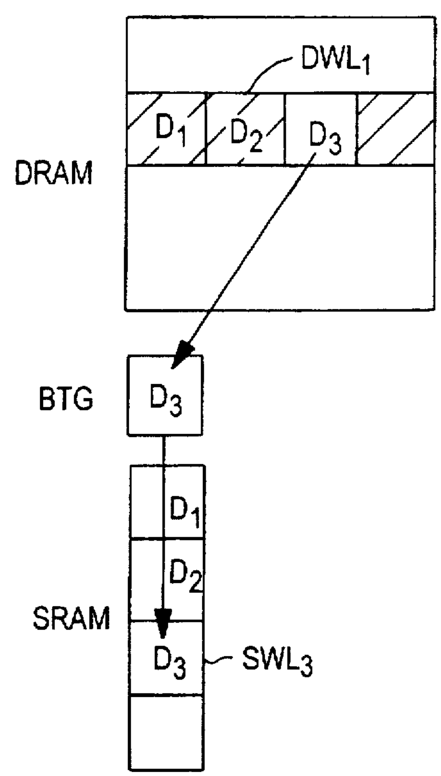

At time t2, one DRAM word line DWL is selected in the DRAM array, and the potential of the selected word line DWL rises. The selected DRAM word line extends commonly in all the memory blocks MBA (MBij) included in one row block. One row of memory cells connected to the selected DRAM word line DWL are connected to the corresponding DRAM bit line pairs DBL (the DRAM bit line BL or /BL) (the memory transistor Q0 is rendered conductive), and the potential of the DRAM bit line pair DBL is changed in accordance with the data of the memory cell connected thereto. Referring to FIG. 36, in three pairs of DRAM bit lines DBL1, DBL2 and DBL3, memory cells storing the data "1" are selected, and the associated bit lines BL (or /BL) are shown with the potential raised.

At time t3, the sense amplifier activating signal φSANE rises to "H", and the sense amplifier driving signal φSAN lowers from the intermediate potential Vcc/2 to "L" of the ground potential level Vss. Thus the n channel sense amplifier portion included in the DRAM sense amplifier DSA is activated, and the potential of the bit line having lower potential of the DRAM bit line pair DBL lowers to the level of the ground potential Vss.

At time t4, the sense amplifier activating signal /φSAPE falls to "L", and the sense amplifier driving signal /φSAP rises from the intermediate potential Vcc/2 to the operational supply potential Vcc level. Thus the p channel sense amplifier portion included in the DRAM sense amplifier DSA is activated, and the potential of the bit line having the higher potential of the DRAM bit line pair rises to the level of the supply potential Vcc.

At time t5, a column selecting line CSL is selected in accordance with a column selecting signal from the DRAM column block decoder, and the potential of the selected column selecting line CSL1 rises to "H". Consequently, in one memory block MBij, two pairs of DRAM bit line pair DBL (four pairs of DRAM bit lines in the memory block MBA) are connected to the local IO line pairs LIOa and LIOb through the DRAM column selecting gate CSG. The potentials of the local IO line pairs LIOa and LIOB (generically denoted by the character LIO in FIG. 36) changes from the precharge potential Vcc/2 in accordance with the data transmitted from the selected DRAM bit line pair DBL.

At time t6, the block activating signal φBA rises to "H" only for the block including the selected word line, and the DRAM IO gate IOG (generically refers to the gates IOGa and IOGb) is rendered conductive. Consequently, the signal potential on the local IO line pair LIOa is transmitted to the global IO line pair GIO. Designation of the selected memory block (the block including the selected word line) is carried out by decoding higher bits of the row address signal used for selecting the DRAM word line.

In the remaining non-selected memory blocks, sensing operation is not carried out and precharged state is maintained. By the above described series of operations, only one memory block MBA out of 16 memory blocks MBAs arranged vertically in FIG. 32 is connected to the bidirectional transfer gate circuit (that is, connected to four bidirectional transfer gates BTGs).

In the SRAM, at time ts11, row selecting operation by the SRAM row decoder is carried out, one SRAM word line SWL is selected in the SRAM array (a total of four SRAM word lines), and the potential of the selected SRAM word line SWL (in FIG. 36, the SFM word line SW1) rises to "H". The row selecting operation in the DRAM portion and the row selecting operation in the SRAM portion are carried out in non-synchronous manner, since designation of the buffer read transfer mode operation in the SRAM is carried independent from the DRAM read transfer mode in the DRAM.

Respective data of the SRAM cells connected to the SRAM word line SWL are transmitted to the corresponding SRAM bit line pair SBL. The potential of the SRAM bit line pair SBL changes from the precharge potential (or equalize potential) Vcc/2 in accordance with the information stored in the corresponding SRAM cell. In FIG. 33, circuit structure for equalizing the potential of the SRAM bit line pair SBL is not shown. In the CDRAM, when an access cycle to the SRAM is designated (that is, access to the SRAM array is designated at a rising edge of the master clock K), a one shot pulse signal may be generated to equalize the SRAM bit line pair SBL.

At time t7, the data transfer designating signal φTDS rises for a prescribed time period to "H". On the global IO line pair GIO, the data of the DRAM cell has been already transmitted, and the SRAM bit line pair SBL is connected to the SRAM cell. In response to the data transfer designating signal φTDS, the bidirectional transfer gate BTG is activated, and the signal potential on the global IO line pair GIO is transmitted to the corresponding SRAM bit line pair SBL. Consequently, data transfer from the DRAM cell to the SRAM cell is effected. As described above, 2 bits of DRAM memory cells are selected in one memory block MBij, and memory cell data are connected to 16 pairs of global IO line pairs GIO. Therefore, a total of 16 bits of data of the DRAM cells are transmitted through the data transfer circuit at one time to the SRAM cells.

Provided that the time t7 at which the data transfer designating signal φTDS is activated is after the time t6 at which the block activating signal φBA rises and after the time ts11, at which the SRAM word line SWL is selected, the timing relation between the times ts11, t1 and t6 may be set arbitrarily. The signal φTSD designating data transfer from the SRAM array to the data array is, in this cycle, maintained at inactive "L".

At time ts12, word line selecting operation in the SRAM array 2 is completed. Thus data transfer of 16 bits of memory cells is completed. Then, at time ts21, the SRAM word line SWL in the SRAM array is again set to the selected state.

In the DRAM array, the DRAM word line DWL is maintained at the selected state (since the DRAM precharge mode is not designated). At time t5', when the DRAM read transfer mode is designated again, the column selecting line CSL1 is set to the non--selected state, and at time t5' the next column selecting line CS2 is set to the selected state. This operation is normally known as the page mode. By selecting a new column selecting line CSL2 at time t5', the local IO line pair LIO has its potential changed in accordance with the data of the memory cell selected by the column selecting line CSL2. Alternatively, a structure in which the potentials of the local IO line pair LIO and the global IO line pair GIO are once returned to the precharge state after non-selection of the column selecting line CSL may be used. During this period, the block selecting signal φBA is maintained at "H". The new data on the local IO line pair LIO is transmitted to the global IC line pair GIO. The active period of the column selecting line may be determined by the latency.

At time t7', the data transfer signal φTDS is again generated. At time t7', the potential of the global IO line pair GIO has been already set to the stable state, and in the SRAM array, the data of the memory cells newly connected to the SRAM word line SWL2 have been already transmitted to the SRAM bit line pair SBL and are at stable state similarly. 16 bits of data on the global IO line pair GIO are transferred at one time to the 16 bits of memory cells connected to the SRAM word line SWL through the bidirection transfer gate BTG.

At time TS22, the operation of selecting the word line SWL2 in the SRAM array is completed, and a new SRAM word line SWL3 is selected at time ts31. Selection/non-selection of the word line SWL in the SRAM array is determined by the combination of states of the signals E#, WE# and CC1# and CC2#. Since the SRAM can operate at high speed, it can operate faster than the operation in the high speed mode of the DRAM. Further, at the time of data transfer, in the SRAM, the next new word line can be surely set to the selected state.

In the DRAM array, at time t6', a new column selecting line CSL3 is set to the selected state, and in response, the potentials on the local IO line pair LIO and the global IO line pair GIO change. At time t7', the data transfer designating signal φTDS is generated, and data on the DRAM bit line pair DBL3 is transmitted to the SRAM bit line pair SBL.

At time t1, the DRAM word line DWL is set to the non-selected state, the data transfer cycle is completed, and the DRAM array returns to the standby state (execution of the DRAM precharge mode operation).

In the SRAM array, the potential of the SRAM word line SWL3 falls to the potential of "L" at time TS32, and the potential of the SRAM bit line pair SBL returns to the precharge potential. Here the potential of the SRAM bit line pair SBL is shown precharged to the intermediate potential at the standby state. It may be precharged to the level of the supply potential by means of a clamp transistor.

The DRAM block decoder simultaneously selects 8 column selecting lines CSL. One column selecting line CSL selects two pairs of DRAM bit line pairs DBL. Data transfer from the DRAM array to the SRAM array is carried out in parallel to the global IO line pair. Therefore, 16 bits of data are transferred collectively. By repeating the data transfer cycle plural times, the amount of data to be transferred can be increased from 16 bits to 32 bits, 48 bits, and so on.

In the above description, data transfer from the DRAM array to the SRAM array is carried out in one step. In the CDRAM of the present invention, the data transfer operation from the DRAM array to the data transfer circuit and the data transfer operation from the bidirectional data transfer circuit to the SRAM array can be carried out independently. However, the principle of the operation is similar to the above, and by utilizing the DRAM sense amplifier in the DRAM array as latch means, a large amount of data can be transferred at high speed to the SRAM array, utilizing the page mode of the DRAM.

The SRAM array portion can be accessed externally after the time ts32. Meanwhile, in the DRAM, the DRAM array can not be accessed from time t8 until the lapse of the RAS precharge time tRP. By this structure, a large amount of data can be transferred at high speed from the DRAM array to the SRAM array, and the transferred data in the SRAM can be accessed externally at high speed. Therefore, at a time of a cache miss operation, for example, the data transferred from the DRAM array can be read immediately after the completion of this data transfer.

By repeatedly effecting the DRAM read transfer mode and the buffer read transfer mode of the SRAM, it becomes possible to transfer a plurality of data blocks from the DRAM array to the SRAM array.

FIG. 37 schematically shows the data transfer operation from the DRAM array to the SRAM array. The data transfer operation will be described with reference to FIG. 37.

In FIG. 37, in the DRAM array, the DRAM word line DWL1 is set to the selected state. The data block D1 includes a plural bits of memory cells (in this embodiment, 16 bits of memory cells) which are transferred by one transfer operation. In the SRAM array, the SRAM word line may have been selected by this time. What is important is that the selecting operation should be completed before the transfer operation from the DRAM array to the SRAM array (more particularly, before the data transfer operation from the bidirectional transfer gate to the SRAM array).

Referring to FIG. 37, the data block D1 of the DRAM word line DWL1 in the DRAM array is collectively transferred to the selected memory cells of the SRAM word line SWL1 of the SRAM array through the bidirectional transfer gate BTG.

Referring to FIG. 37, the data block D1 is set to the non-selected state, and in the SRAM array, the next word line SW2 is set to the selected state. In this state, the data block D2 newly selected in the DRAM array is transmitted through the bidirectional transfer gate BTG to the memory cells of the SRAM word line SWL2. Thereafter, the data block D2 is set to the non-selected state, and the SRAM word line SWL2 is set to the non-selected state.

Referring to FIG. 37, a high speed mode (DRAM read transfer mode) is executed, the next data block D3 on the DRAM word line DWL1 is selected, and the data is transmitted to the memory cells connected to the newly selected another SRAM word Line SWL3 in the SRAM array through the bidirectional transfer gate BTG.

As described above, by utilizing the high speed (page mode) of the DRAM, a large amount of data can be transferred at high speed to the SRAM array.

In this embodiment, more exactly, the data transfer operation of the bidirectional transfer gate is carried out in two steps. More specifically, it includes the first step of data transfer from the DRAM array to the bidirectional transfer gate, and the second step of data transfer from the bidirectional transfer gate to the SRAM array. These data transfer operations are carried out under control of separate control systems. The bidirectional transfer gate can be directly accessed from the outside by designating buffer read or buffer write mode. Therefore, it is possible to carry out not only the data transfer between the SRAM array and the DRAM but the burst write mode in which data are successively written from the outside. The SRAM array is in the non-selected state, and therefore the data stored therein is not affected (provided that the operation is in the buffer read or buffer write mode).

Figure 38:
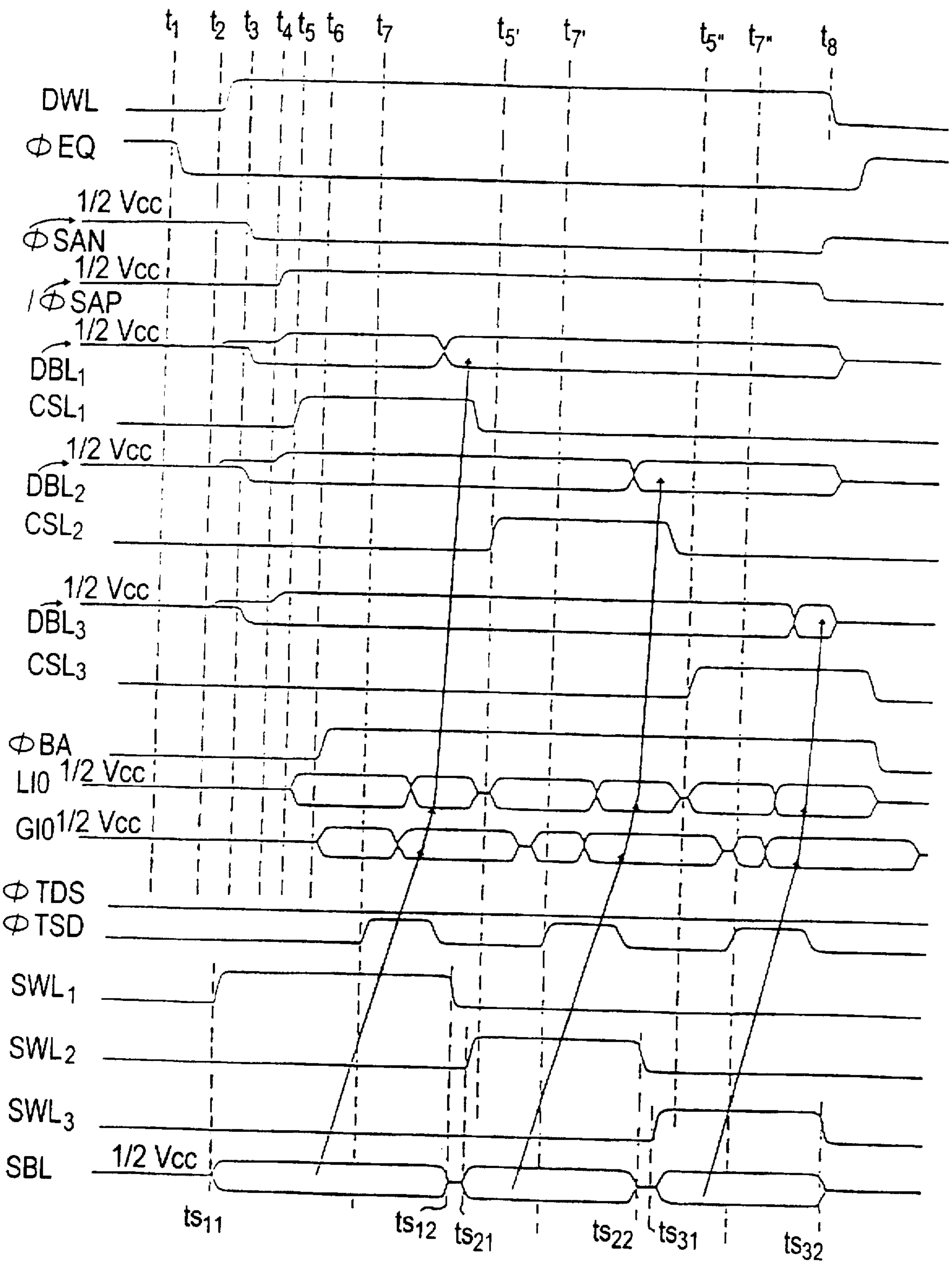
FIG. 38 is a diagram of signal waveforms showing data transfer operation from the SRAM array to the DRAM array in the semiconductor memory device in accordance with one embodiment of the present invention.
Figure 39A:
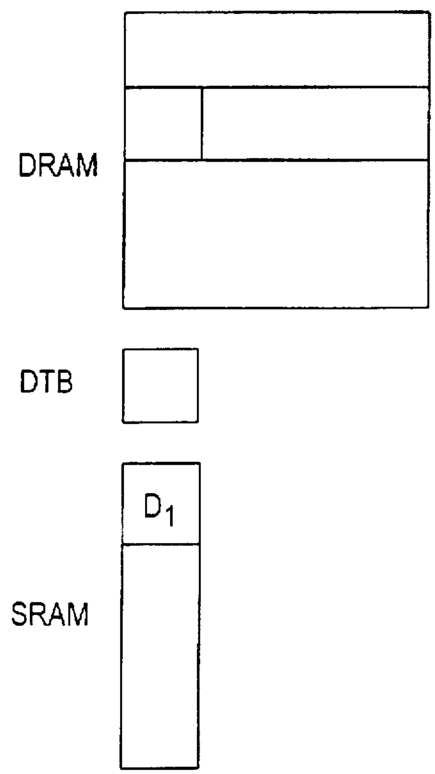
FIGS. 39A–39D schematically show data transfer operation from the SRAM array to the DRAM array in the semiconductor memory device in accordance with one embodiment of the present invention.
Figure 39B:
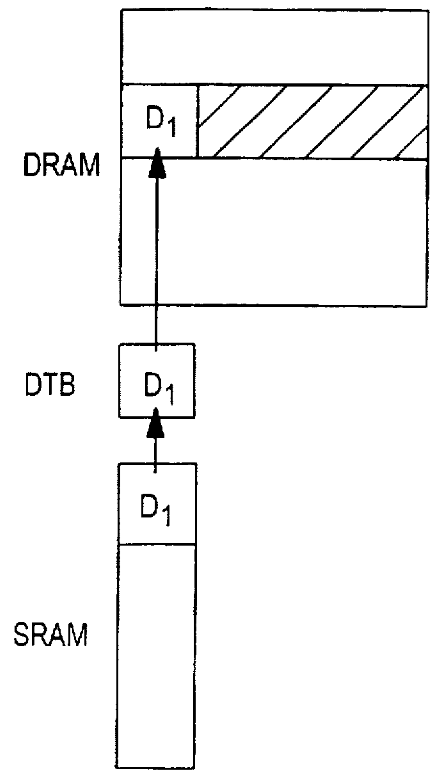
Figure 39C:
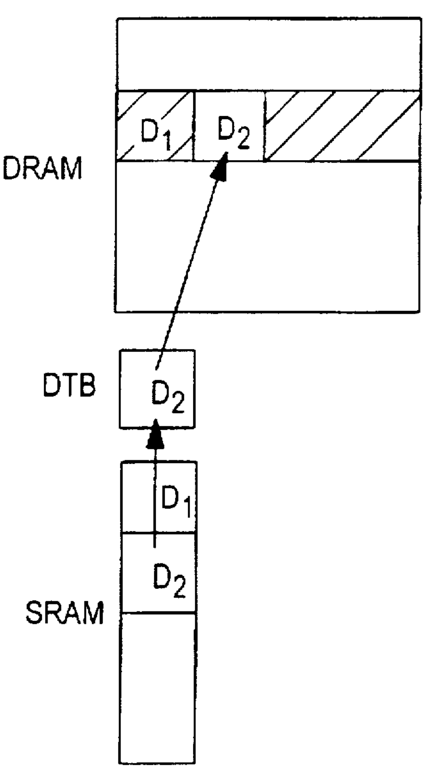
Figure 39D:
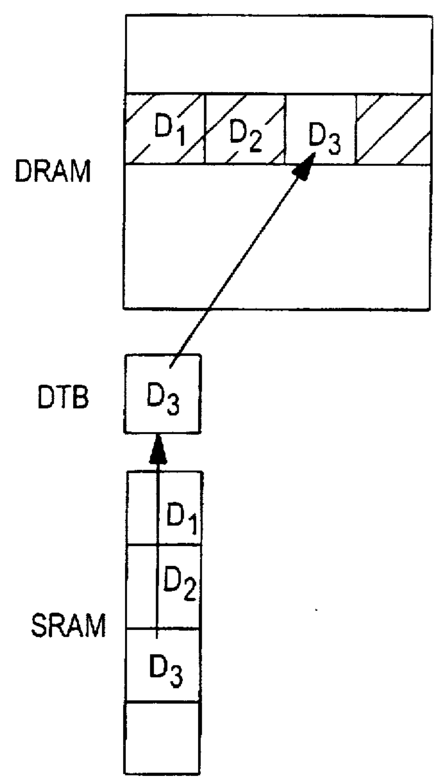

FIG. 38 is a diagram of signal waveforms showing data transfer operation from the SRAM array to the DRAM array. The operation waveforms shown in FIG. 38 are the same as those of FIG. 36 except that data transfer designating signal ϕTSD is generated instead of the data transfer designating signal ϕTDS, the direction of the data transfer is from SRAM array to the DRAM array, and that the potential of the DRAM array bit line pair DBL changes corresponding to the data transmitted from the SRAM array. In this case, an operation similar to that at the time of data transfer from the DRAM array to the SRAM array is carried out in the DRAM array and the SRAM array, except that the designated operation mode is different. More specifically, in the SRAM array portion, the buffer write transfer mode or the buffer write transfer/write mode is designated, and in the DRAM, the DRAM write transfer mode is designated. Therefore, detailed description of the operation is not repeated.

FIG. 39 schematically shows data transfer operation from the SRAM array to the DRAM array. In this case also, the only difference is that the direction of data block transfer is different from that shown in the schematic diagram of FIG. 37, and detailed description is not repeated. By using this mode, not only high speed data transfer from the SRAM array to the DRAM array but also the burst write mode can be implemented (since data can be directly written to the bidirectional transfer gate from the outside).

[IO Portion]

Figure 40:
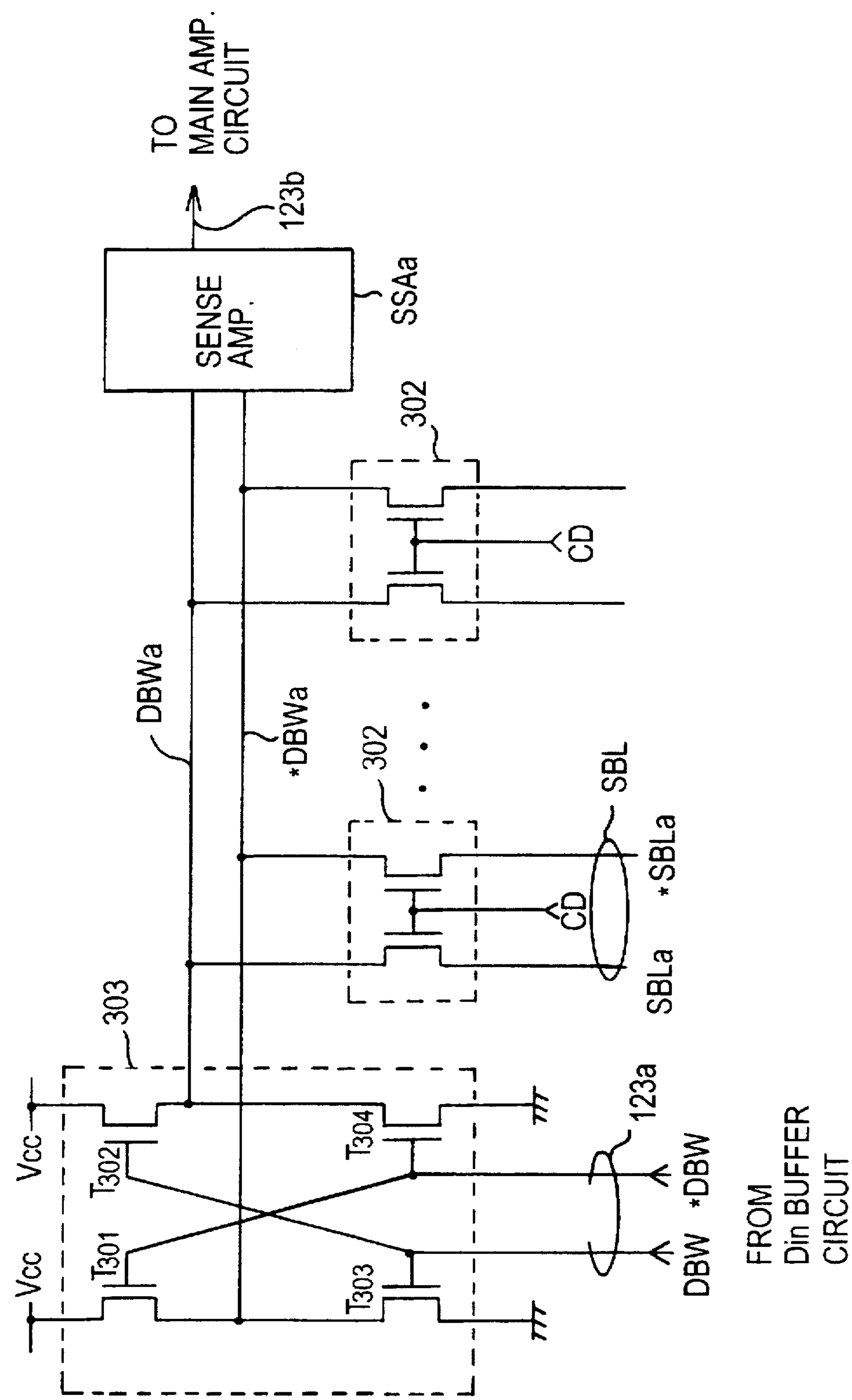
FIG. 40 shows a structure of an IO portion of the semiconductor memory device in accordance with one embodiment of the present invention.

FIG. 40 shows a structure of the IO portion of the SRAM portion. In the structure shown in FIG. 1, when the bi-directional transfer gate is externally accessed, writing and reading of data are carried out through the SRAM array. The SRAM array must be maintained at the non-selected state. The structure of the input/output portion at that time is shown. Though the SRAM sense amplifier SSA provided for each of the SRAM bit line pair SBL is not shown, one is provided for each SRAM bit line pair. A SRAM column selecting gate 302 is provided for each of the SRAM bit line pairs SBL. A column selecting signal CD from the column decoder (120 in FIG. 1) is applied to the column selecting gate 302. Thus a pair of SRAM bit lines is selected from 16 bits of SRAM bit line pairs SBL.

An internal data bus 123 (see FIG. 1) includes an external write data line pair **123*a* for transmitting write data, and a read data transmission line 123*b* for transmitting read data to the main amplifier circuit. The read data transmitting line 123**b may be formed of a pair of signal lines.

The internal write data transmission line pair **123*a*** includes write data lines DBW and *DBW for transmitting complimentary data generated from the Din buffer circuit (input buffer circuit). Internal write data line pair **123*a* is connected to write circuit 303. Write circuit 303 amplifies the internal write data from internal write data line pair 123*a*** and transmits the amplified data to internal data lines DBWa and *DBWa.

Write circuit 303 includes n channel MOS transistors T301, T302, T303 and T304. Transistors T302 and T303 have their gates connected to internal write data line DBW, and transistors T301 and T304 have their gates connected to internal write data line *DBW. Connecting portion of transistors T302 and T304 is connected to internal data line DBWa, and connecting portion of transistors T301 and T303 is connected to internal data line *DBWa.

Transistors T301 and T302 transmit a signal at the level of the operational supply potential Vcc when they are conductive. Transistors T303 and T304 transmit the ground potential Vss when they are conductive. A sense amplifier SSAa for amplifying the applied data is provided for the internal data lines DBWa and *DBWa. Data of the sense amplifier SSAa is transmitted to the main amplifier circuit. The operation will be briefly described.

Assume that the data of "H" is transmitted to internal write data line DBW. Data of "L" is transmitted to internal write data line *DBW. Transistors T302 and T303 are rendered conductive. Consequently, data of "H" is transmitted from write circuit 303 through transistor T302 to internal data line DBWa while "L" level data is transmitted through transistor T303 to the other internal data line *DBWa.

In data reading, data of "L" is transmitted to both internal write data lines DBW and *DBW from the input buffer circuit (Din buffer circuit). The output from write circuit 303 attains to the high impedance state. The SRAM sense amplifier SSAa is activated. The SRAM bit line pair SBL is connected through the selected column selecting gate circuit 302 to internal data lines DBWa and *DBWa. The data transmitted to the internal data lines DBWa and *DBWa is amplified by the SRAM sense amplifier SSAa and then transmitted to the main amplifier circuit through data transmission line 123*b*.

By using the structure of FIG. 40, data can be directly written to the data transfer buffer (bidirectional transfer gate circuit) through the SRAM array. However, when the bidirectional transfer gate BTG (or buffer circuit) is to be accessed through the SRAM array, it is necessary to connect the SRAM array to the transfer gate so as to release the equalized state of the SRAM bit line pair SBL in the SRAM array. The SRAM word line is set to the non-selected state. Consequently, the bidirectional transfer buffer (bidirectional transfer gate circuit) can be externally accessed through the SRAM array without affecting the data stored in the SRAM array. This is because the bidirectional transfer gate or the bidirectional transfer buffer is provided for each of the SRAM bit line pairs.

Since the write data transmission line 123*a* and the read data transmission line 123 are separately provided as internal data line 123, the input/output circuit layout can be easily designed as compared with a structure in which writing and reading of data is carried out through a common internal data bus.

[Data Transfer Buffer Circuit]

In the description of operation utilizing the page mode operation above, the bidirectional transfer gate BTG is described as a tri-state buffer for the purpose of simplicity of description. The bidirectional transfer gate has latch function. An operation mode realized by the provision of the latch function for the bidirectional transfer gate will be described in the following.

FIG. 41 shows more specific structure of the bidirectional transfer gate. The bidirectional transfer gate includes a read transfer buffer 210 for receiving data from the DRAM array, that is, the data on the global IO line pair GIO, and a write transfer buffer 250 for receiving data from the SRAM array (data stored in the SRAM array or data externally applied).

Read transfer buffer 210 includes a gate 212 which is rendered conductive in response to a data transfer designating signal φTDS1, a latch circuit 230 for latching the data applied through the gate 212, an inverter circuit 218 for inverting the latched data of latch circuit 230, and a gate 220 which is rendered conductive in response to a transfer designating signal φTDS2 for transmitting the output data from inverter circuit 218 to the SRAM bit line pair SBL. Latch circuit 230 includes an inverter circuit 214 having large driving capability and an inverter circuit 216 having smaller driving capability. The inverter circuit 214 has its output connected to the input of inverter circuit 216, and inverter circuit 216 has its output connected to the input of inverter circuit 214. As the driving capabilities of the inverter circuits 214 and 216 differ from each other, the function of latching data is enabled and, in addition, data transfer to one direction can be carried out at high speed.

Write transfer buffer 250 includes a gate 260 which is rendered conductive in response to transfer designating signal φTSD2 for transmitting data on the SRAM bit line pair SBL, an inverter circuit 258 for inverting data applied through gate 260, a latch circuit 232 for latching the output from inverter circuit 258, and a gate 252 responsive to transfer designating signal φTSD1 for transmitting the output from latch circuit 232 to the global IO line pair GIO. Latch circuit 232 includes an inverter circuit 254 having large driving capability and an inverter circuit 256 having smaller driving capability. The inverter circuit 254 has its output connected to the input of inverter circuit 256, and inverter circuit 256 has its output connected to the input of inverter circuit 254.

Transf er des ignating signals φTDS1 and φTSD1 are generated from the DRAM co ntrol circuit shown in FIG. 1 in accordance with row address strobe RAS#, column address strobe CAS# and data transfer designation DTD#.

Transfer designating signals TDS2 and φTSD2 are generated from the SRAM control circuit 132 shown in FIG. 1 in accordance with chip enable E#, write enable WE# and control clocks CC1# an d CC2#. The operation of the bidirectional transfer buffer shown in FIG. 41 will be described with reference to FIG. 42, which is a diagram of operation waveforms.

As described above, the DRAM array and the SRAM ar ray can be independently driven. Referring to FIG. 42, for the SRAM portion, the chip enable E# is at "L" and write enable WE# and control clocks CC1# and CC2# are all at "H" from the firs t to six th cycles of the master clock K, designating the SRAM read mode, so that a static memory cell is selected in accordance with the SRAM address As applied at the rising edge of the master clock K, and the data of the selected memory is read.

In the DRAM portion, the row address strobe RAS# falls to "L" at the third clock of the master clock K. Thus the DRAM activate mode is designated, the DRAM address Ad applied at that time is taken as the row address, and row selecting operation is carried out. After the lapse of the RAS-CAS delay time tRCD, column address strobe CAS# falls to "L". Transfer designation DTG# is at "H". Consequently, the DRAM read transfer mode is designated, the DRAM address Ad applied at that time is taken as a block address, a memory block is selected in the DRAM array, and the data of the selected memory cell is transmitted to the read transfer buffer (the transfer control signal φTDS1 attains "H", in FIG. 41).

After the lapse of the DTBR lock out period (which period is determined by the latency), the control clock CC1# falls to "L" in the SRAM portion, and buffer read transfer/read mode is designated. Consequently, the transfer control signal φTDS2 shown in FIG. 41 attains "H", and the data which has been latched in latch circuit 230 is transmitted to the SFAM bit line pair SBL. The data transmitted to the SRAM bit line pair is further selected in accordance with the SRAM address As applied at the time of designation of the SRAM read transfer/read mode, and thus data is read. More specifically, from the eighth cycle of the master clock in FIG. 42, new data b1 . . . transferred from the DRAM array is read continuously.

In the eighth cycle of the master clock K, the row address strobe RAS# and transfer direction designation DTD# both attain "L", the DRAM precharge mode is designated, and the DRAM returns to the precharge state.

FIG. 43 schematically shows the parallel operation of the DRAM and the SRAM. Referring to FIG. 43A, in the SRAM array, data reading is carried out in accordance with externally applied SRAM address As. In parallel to the data reading operation in the SRAM array, selection of a row and a memory cell block MDB0 is carried out in the DRAM, the selected memory cell block MDB0 is transferred to transfer buffer DTBR and held therein.

In FIG. 43B, the buffer read transfer/read operation is carried out, data arranged in the read transfer buffer DTBR is transferred to the SRAM array, and 1 bit of data is simultaneously read from the memory cell data block MDB0 (16 bits). By repeating this operation, high speed access becomes possible.

Especially for graphic application, the address to be accessed next time can be known previously. More specifically, on the CRT display, data on one scanning line is successively accessed. The address of data displayed on the CRT is continuous. Therefore, the address to be accessed next time can be always known. By utilizing the CDRAM for graphic application, graphic data can be processed at high speed by pre-selecting data to be accessed next time in the DRAM array and by latching the data in the read transfer buffer.

As will be described later, by utilizing this operation mode, the sense amplifiers in the DRAM array can be used as an auxiliary cache, enabling reduction of penalty at the time of a cache miss. This operation will be described in detail later.

FIG. 44 shows another manner of operation when the DRAM array and the SRAM array are driven in parallel. Different from the operation of FIG. 42, in the operation of FIG. 44, the DRAM read transfer mode is designated again in the tenth cycle of master clock K. Consequently, data of another memory cell block of the DRAM row which is selected at present is transferred to the read transfer buffer.

In the (n+1)th cycle of the master clock K, control clock CC1# is set to "L" and control clock CC2# is set to "H". Consequently, the buffer read transfer/read mode is designated, data stored in the read transfer buffer DTBR is transferred to the SRAM array, and data of the transferred memory cell data block is further selected and read. By repeating this operation, a large amount of data can be read at high speed.

By using this operation mode, that is, the high speed mode (page mode) of the DRAM, data transfer operation can be carried out at high speed. More specifically, the operation shown in FIGS. 43A and 43B is repeatedly carried out. The data transfer from the DRAM array to the SRAM array can be carried out in accordance with the page mode operation until the precharge mode of the DRAM array is designated. At this time, data block can be transferred in the reverse direction from the SRAM array to the DRAM array in accordance with the page mode. Since data can be directly written from the outside to the write data transfer buffer circuit, by carrying out the buffer write mode and thereafter designating the DRAM write transfer mode, data can be written in accordance with the page mode to the DRAM array.

[Mask Register]

As shown in FIG. 1, a mask register is provided for the write data transfer buffer. This is because transfer of unnecessary data to the DRAM array must be prevented when the data is externally written to the write data transfer buffer in the buffer write mode. The function of the mask register will be briefly described, and the detailed structure will be described together with detailed structure of the bidirectional transfer gate, later.

FIG. 45 shows an example of a structure of the mask register corresponding to 1 bit write data buffer circuit. Referring to FIG. 45, a mask register 290 includes a latch circuit 261 consisting of inverter circuits 266 and 268, a gate 262 responsive to a set designating signal ϕS for transmitting a signal of the level of the supply potential Vcc to the latch node LN, a gate 264 responsive to a reset designation signal ϕR for transmitting a signal at the level of the ground potential Vss to the latch node LN, and a gate 270 for selectively transmitting the output data from the write data transfer buffer (DTBW) 250 to the global IO line pair GIO in accordance with the latch data of the latch circuit 261. When the set designating signal ϕS is applied, mask register 290 stores mask set data, and inhibits transfer of write data from the write data transfer buffer (DTBW) 250. When the reset designating signal ϕR is applied, mask register 290 passes data output from write data transfer buffer (DTBW).

FIG. 46 shows an example of a structure of a control circuit for generating the mask data set and reset designating signals. The mask data set/reset designating signal generating circuit includes a decoder 272 for decoding SRAM block address bits As0 to As3, an AND circuit 274 receiving the column selecting signal CD of decoder 272 and the buffer write mode designating signal ϕBW, an OR circuit 278 receiving an output from AND circuit 274 and the buffer write transfer mode (including buffer write transfer/write mode) designating signal ϕBWT, a pulse generating circuit responsive to a fall of the signal ϕTSD1 for generating a one shot pulse, and an OR circuit 282 receiving an output from circuit 280 and the mask data set designating signal ϕMS. The mask data reset signal ϕR is generated from OR circuit 278, while mask data set signal ϕS is generated from OR circuit 282.

More specifically, when the buffer write mode is designated, the mask data is reset only for that write data transfer buffer to which the data is written. When data transfer from the SRAM array is designated, the mask data for every bit is reset. When the mask data set signal ϕMS (which is generated from the command register, described later) is generated, the mask register is set. When mask enable M0 to M3 are utilized, a structure in which the output from gate circuit 274 is set to "L" when the mask enable M0 to M3 are active is used.

Figure 47A:
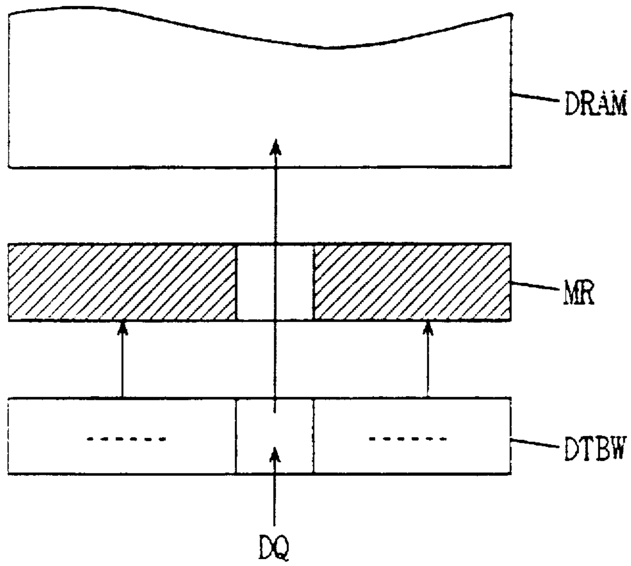
FIG. 47A–47B schematically shows the operation of the mask circuit shown in FIG. 45.

FIG. 47 schematically shows the function of the mask register. Referring to FIG. 47A, when external write data (DQ) is written to the write data transfer buffer (DTBW) in the mask register MR, only that mask data which corresponds to the written write transfer buffer is reset. Therefore, in the DRAM write transfer mode for transferring data to the DRAM array (DRAM), only the data from the transfer buffer which has been written in the write data transfer buffer DTBW is transmitted.

Figure 47B:
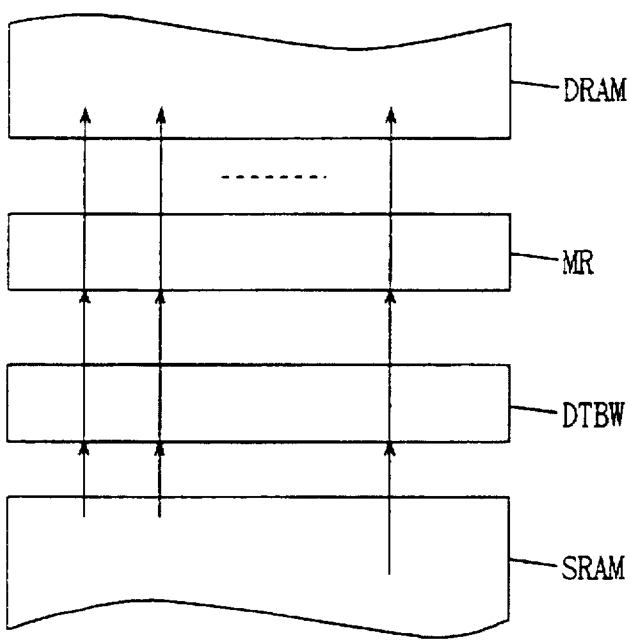

In FIG. 47B, data is transferred from the SRAM array to the write data transfer buffer DTBW. In this state, all mask data in the mask register MR are reset. Therefore, the data transmitted from the SRAM array are all transmitted to the DRAM array.

As described above, by the provision of the mask register for the write data transfer buffer (DTBW), only the necessary data can be written to the DRAM array when data is written directly to the write data transfer buffer from the outside.

As described above, by providing a mask register for the write data transfer buffer, the CDRAM can be readily used not only as the main memory of the CPU but also as a storage for graphic data.

As shown in FIG. 41, since the read transfer buffer and the write transfer buffer are provided separately, it is possible to store data in the write data transfer buffer (from the SRAM array or from the outside) prior to the transmission of data to be read from the DRAM array to the read transfer buffer, enabling high speed access.

Since the mask register is provided, only the necessary data can be rewritten in the DRAM array (as the mask data can be reset), and therefore it is not necessary to read data once from the DRAM array by the read modify write operation and to externally rewrite the data of the memory cell which have been subjected to data reading. Therefore, necessary data can be rewritten at high speed.

In the structure of the bidirectional data transfer buffer circuit, shown in FIG. 1 the write data transfer buffer is provided with a temporary register, in order to surely transfer necessary data only to the DRAM array. Generally, when the DRAM write transfer mode is designated and the DRAM array is active, the data of the write data transfer buffer is written to the designated memory cell block of the DRAM array. At that time, mask against writing is provided by the mask r egister. Writing is not effected on the bit to which mask register has been set. Data transfer between the write data transfer buffer (144 of FIG. 1) and the temporary register (142 of FIG. 1) is controlled by using the least significant 2 bits of the DRAM address Ad. The data transfer between the register 142 and the buffer 144 is completed in a cycle in which the RAS# latency has passed after the issuance of the DRAM activate command and CAS# latency has passed after the designation of the DRAM write transfer mode. When DRAM address Ad0 is at "0", data transfer between registers 142 and 144 is not carried out, and data transfer is performed when it is "1".

[DRAM Auto Refresh]

The memory cells of the DRAM array must be refreshed periodically. For this purpose, auto refresh mode is provided. FIG. 48 shows states of various control signals at the time of the auto refresh mode. Referring to FIG. 48, for the DRAM auto refresh mode, the row address strobe RAS# and column address strobe CAS# are set to "L" and the data transfer designation DTD# is set to "H", at the rising edge of the master clock K. In the DRAM auto refresh mode, an output from an internally provided address counter is used as a row address and row selecting operation and refresh operation are effected. At the completion of the refresh cycle, the value of the address counter is incremented by one. Though the structure for performing the DRAM auto refresh mode is not explicitly shown, it is included in DRAM control circuit 128 shown in FIG. 1. In order to carry out operation mode for driving the DRAM array after the DRAM auto refresh mode, once the DRAM precharge mode operation must be carried out. This mode is similar to the CAS before RAS (CBR) refresh mode in a standard DRAM. In this refresh mode, by carrying out the DRAM precharge mode, a row which is at an active state is set to the non-selected state, thus completing the refresh operation.

The structure for carrying out the DRAM auto refresh mode is provided in DRAM control circuit 128 shown in FIG. 1. A structure may be used in which states of signals RAS#, CAS# and DTD# at the rising edge of the master clock K are monitored, when the prescribed states are set, it is determined that the DRAM auto refresh mode is designated, and in accordance with the result of determination, the count value of the address counter is applied as a row address instead of the externally applied DRAM address Ad. More specifically, a state determining circuit for determining the states of control signals RAS#, CAS# and DTD# may be used at the CBR mode detecting portion of a common standard DRAM.

Alternatively, an externally applied DRAM address may be used as a refresh address.

[Set Command Register]

The CDRAM includes a command register (not shown in FIG. 1) for determining arrangement of input/output pins (designation of mask enable IO separation), setting of the latency in the DRAM read transfer mode and the latency of the DRAM write transfer mode, designation of output modes (latch, transparent and registered mode), and so on.

Figure 49:
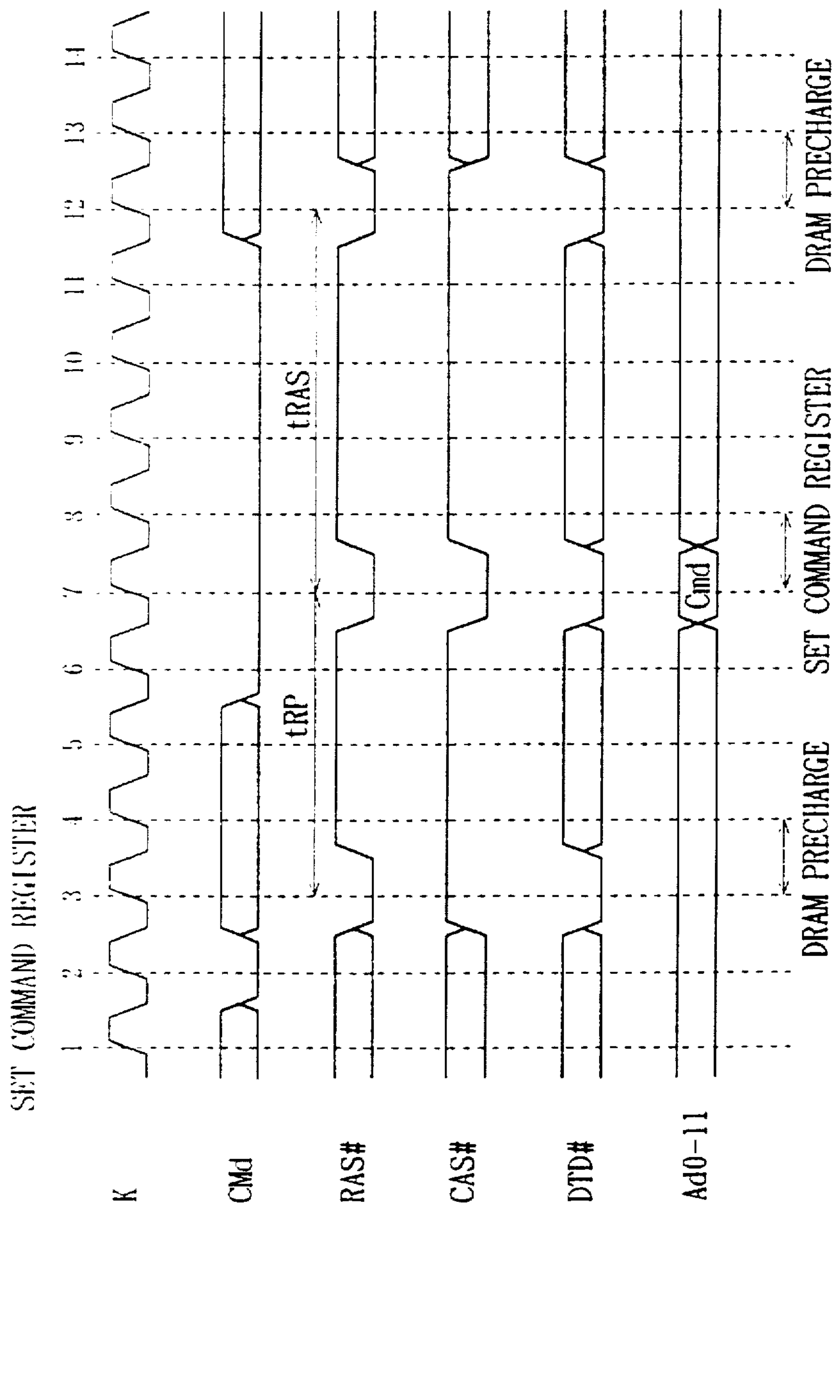
FIG. 49 is a diagram of waveforms showing a set command register mode operation.

For the set command register mode (SCR mode), the row address strobe RAS#, the column address strobe CAS# and data transfer designation DTID# are all set to "L" at the rising edge of the master clock K as shown in FIG. 49. At this time, DRAM address bits Ad0 to Ad11 are taken in as command data Cmd, and necessary internal mode is designated.

Referring to FIG. 49, the DRAM precharge mode is designated in the third clock of the master clock K, and after the lapse of the RAS precharge time tRP, in the seventh cycle of the master clock K, row address strobe RAS#, column address strobe CAS# and data transfer designation DTD# are all set to "L", designating the set command register mode. At the rising edge of the master clock K of the seventh cycle, DRAM address bits Ad0 to AD11 are taken in as set command data, and setting of the internal state is carried out. In the set command register mode, auto refreshing of the DRAM array is carried out simultaneously. At the time of an access to the DRAM array, it is necessary to raise a word line in the DRAM array as soon as possible from the rising edge of the master clock K. For this purpose, the number of mode determination should be as small as possible (in order to reduce time necessary for mode determination). Therefore, in the DRAM array, auto refreshing is carried out in the set command register mode. Thus, in order to cancel auto refreshing, precharge mode operation is carried out in the 12th cycle of the master clock K.

However, it may be structured such that setting of data to the command register only is effected in this mode and the operation of the DRAM is not influenced at all. This can be readily implemented when a structure in which the command register directly receives the DRAM address Ad0 to Ad11 not through the DRAM address buffer in the SCR (set command register) mode is used.

FIG. 50 shows, in a table, correspondence between the command data and contents designated at that time. Referring to FIG. 50, the DRAM address bits Ad11 to Ad7 are reserved for future extension. Address bits Ad4 to Ad6 are used for setting the access latency (the latency in the DRAM read transfer mode and the DRAM write transfer mode, that is, the number of clocks determining the transfer timing in the data transfer buffer). Four different access latencies are prepared corresponding to the speed (number of cycles) of the clock K.

Address bits Ad2 and Ad3 are used for determining the output mode. When the address bits Ad2 and Ad3 are both "L", the transparent output mode is designated. When the address bit Ad2 is at "H" and the address bit Ad3 is at "L", the latched output mode is designated. When the address bit Ad2 is "L" and the address bit Ad3 is at "H", the registered output mode is designated.

The address bit Ad1 is used for designating the output pin arrangement. When the address bit Ad1 is at "L", DQ common arrangement is designated. In this state, mask enable (mask data) for masking external write data can be input. When address bit Ad1 is at "H", the DQ separation mode is set. Input/output of data are carried out through separate pin terminals.

Address bit Ad0 is used for setting the mask data of the mask register. When address bit Ad0 is at "L", the mask data of the mask register is not changed. When address bit Ad0 is at "H", all mask data are designated to the set-state. At the time of power on, the state of the mask data is not stable. Therefore, when buffer write mode is carried out in the dummy cycle and thereafter data is transferred to the DRAM array, it is possible that the DRAM write transfer mode is carried out with the mask data being instable and the mask provided at the initial cycle being instable. In order to prevent such state, the mask data of the mask register are all set designated to the set state after power on. This operation will be described in the following.

Figure 51:
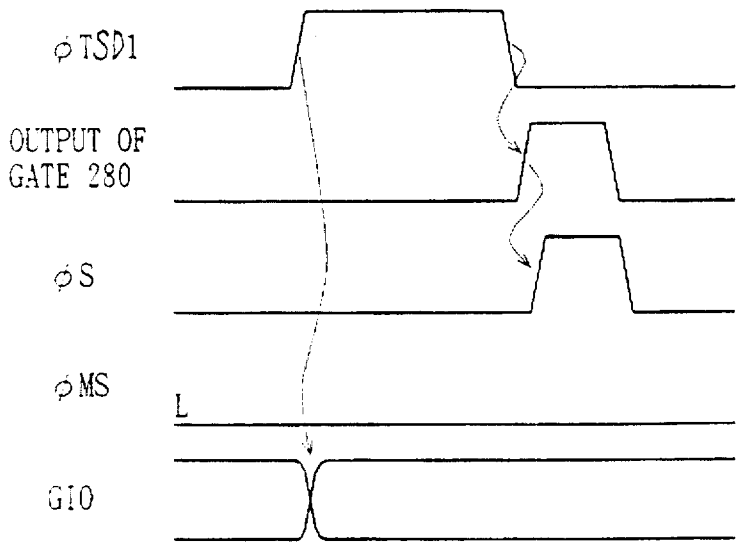
FIG. 51 is a diagram of signal waveforms showing the operation of the mask circuit shown in FIG. 45.

FIG. 51 shows the structure of the mask register data control system shown in FIG. 46. As shown in FIG. 51, when transfer designating signal ϕTSD1 for the write data transfer buffer DTBW rises for a prescribed time period (which period is determined by the latency) and when the mask data of the mask register 290 (see FIG. 45) is at the reset state, data to the corresponding global IO line pair GIO changes in accordance with the potential transferred from the write data transfer buffer. When transfer operation of the write data transfer buffer is completed, a one shot pulse is generated from a pulse generating circuit 280, a set signal ϕS is generated and the data stored in the mask register is set.

In the initial state after the power on, when data are written to the write data transfer buffer in accordance with the buffer write mode and then the written data are to be transferred to the DRAM array, the mask data must be accurately set. Therefore, it is necessary to designate the mask data of the mask register to the set state before the execution of the buffer write mode, at the initial state. In order to implement this operation, one mask data of the mask register is designated to the set state by a command.

Figure 52:
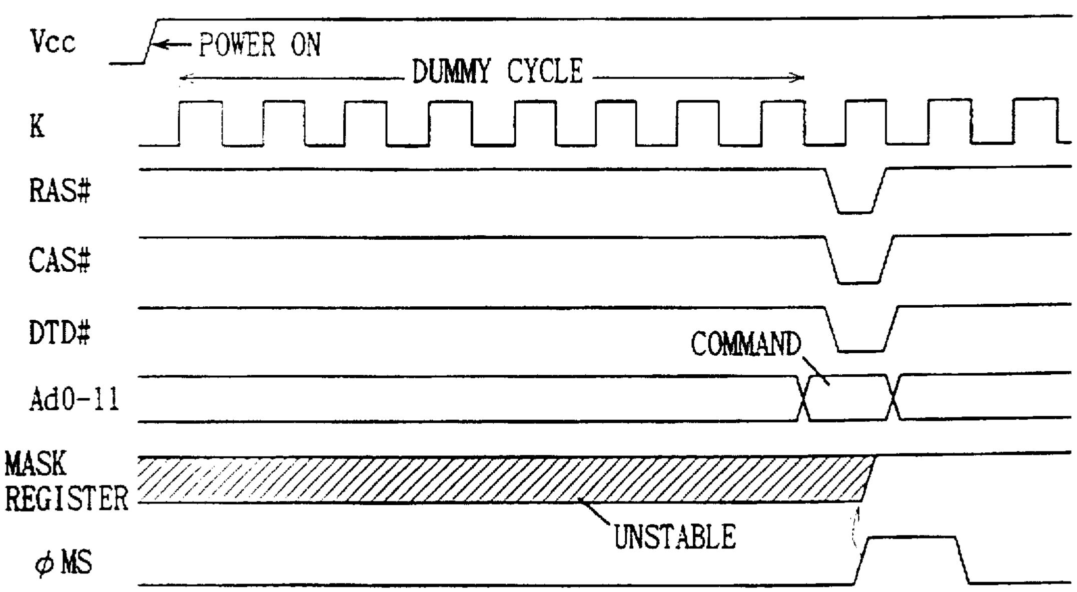
FIG. 52 is a diagram of waveforms showing the operation at the time of power on of the semiconductor memory device in accordance with one embodiment of the present invention.

As shown in FIG. 52, after the application of the supply voltage to the CDRAM, a prescribed number of master clocks K are transmitted to the DRAM portion. At this time, the dummy cycle is executed. The row address strobe RAS#, the column address strobe CAS# and data transfer designation DTD# are all at "H", and thus the DRAM enters the DRAM NOP mode. The DRAM master clock DK is transmitted to the peripheral circuitry, operation in accordance with applied master clock DK is carried out, and the peripheral circuitry is initialized. This is the same as the initializing operation of a standard DRAM. In this state, mask data in the mask register is instable.

When the DRAM write transfer mode is carried out in this dummy cycle, the mask register can be surely set to the set state. However, in the DRAM write transfer mode, data transfer from the write data transfer buffer to the DRAM array is carried out. Data in the transfer buffer is the instable data, so that the state of the DRAM array becomes instable. Therefore, setting of the mask data of the mask register in the dummy cycle by using such DRAM write transfer mode is not preferable.

Accordingly, after the completion of the dummy cycle, row address strobe RAS#, column address strobe CAS# and data transfer designation DTD# are set to "L" so as to execute the set command register mode. By this structure, the mask set signal ϕMS for the mask register rises to "H", and the data of the mask register is surely designated to the set state (see FIG. 45).

FIG. 53 shows a structure of a portion related to the SCR mode operation. Referring to FIG. 53, the circuitry related to the SCR mode includes an SCR mode detecting circuit 400 responsive to the states of the row address strobe RAS#, the column address strobe CAS# and the data transfer designation DTD# at the rising edge of the DRAM master clock DK for detecting the designation of the SCR mode; a command register 402 responsive to the SCR mode detection signal from SCR mode detecting circuit 400 for taking the address Ad applied at that time as a command data for generating a necessary signal; an auto refresh mode detecting circuit 404 for detecting in accordance with the combination of states of the row address strobe RAS#, the column address strobe CAS# and the data transfer designation DTD# at the rise of the DRAM master clock DK, the designation of the auto refresh mode; and an auto refresh control circuit 406 responsive to the auto refresh detection signal from auto refresh mode detecting circuit 404 for executing the auto refresh operation.

Auto refresh control circuit 406 includes an address counter, and a multiplex circuit for multiplexing the output of the address counter with an external address to apply the result to the address buffer or to the DRAM row decoder. Referring to FIG. 53, when the SCR mode is detected, auto refresh control circuit 406 also executes the auto refreshing of the DRAM in response to the SCR mode detection signal from the SCR mode detecting circuit 400.

FIG. 54 shows another example of the structure of the portion related to the SCR mode. In the structure shown in FIG. 54, when the SCR mode is designated, only the command register 402 is driven. Auto refresh control circuit 406 is driven only when the auto refresh mode is designated. The reason why the auto refresh of the DRAM array is executed when the SCR mode is designated is to reduce the number of operation modes to be determined and to select the word line in the DRAM array as soon as possible in the preceding embodiment. As shown in FIG. 54, when it is structured to drive only the command register when the SCR mode is designated, the command data can be set to the command register even during the page mode operation and the precharge operation of the DRAM array. Therefore, in the operation cycle of the DRAM array, command data can be selectively changed.

Figure 55:
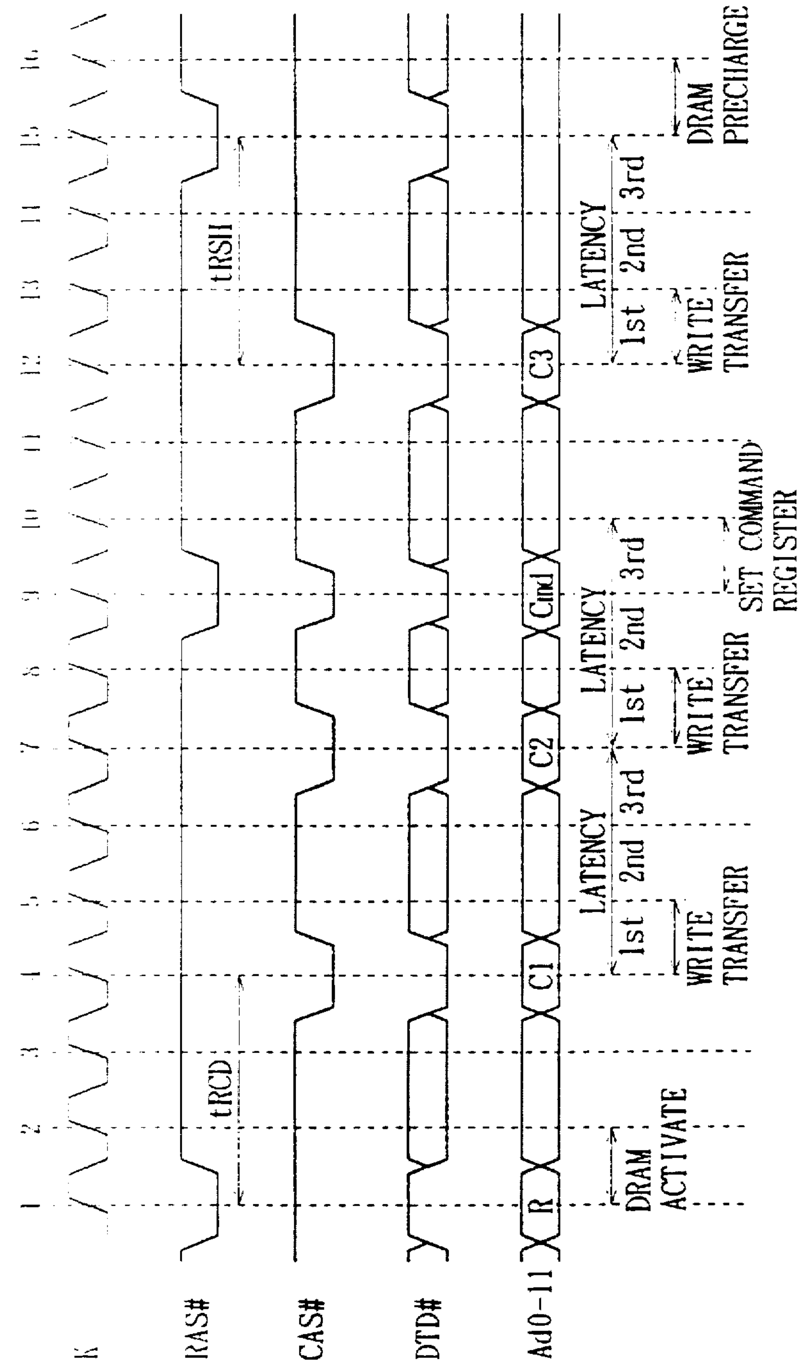
FIG. 55 shows an example of an operation sequence of the semiconductor memory device utilizing the circuit structure shown in FIG. 54.

FIG. 55 shows an example of an operation sequence of the DRAM array including a set command register mode for setting the command register. Referring to FIG. 55, the DRAM activate mode is designated in the first cycle of the master clock K, and row selecting operation in the DRAM array is carried out.

In the fourth cycle of the master clock K, the DRAM write transfer mode is designated, a block of memory cells of the DRAM array is selected, and the data which have been stored in the write transfer buffer are transferred to the selected memory cell block. After a prescribed time period (in the shown example, the latency is 3), again in the seventh cycle of the master clock K, the DRAM write transfer mode is designated. In the second write transfer mode, in the 9th cycle of the master clock K during data transfer, the set command register mode is designated, that is, RAS#, CAS# and DTD# all attain to "L". The address applied at this time is taken as the command data and set in the command register.

In the 12th cycle, the DRAM write transfer mode is again designated, and data transfer from the write data transfer buffer to the DRAM array is carried out. In the 15th cycle of the master clock K, DRAM precharge mode is designated, and the DRAM array returns to the precharge state.

As shown in FIG. 55, since the setting of data for the command register only is carried out in the set command register mode, the command data can be changed without affecting the operation of the DRAM array.

In order to implement this structure, the address bits Ad0 to Ad11 applied to the DRAM array must be divided to those used for selecting the row and column of the DRAM array and those used for setting in the command register. This is shown in FIG. 56.

Figure 56:
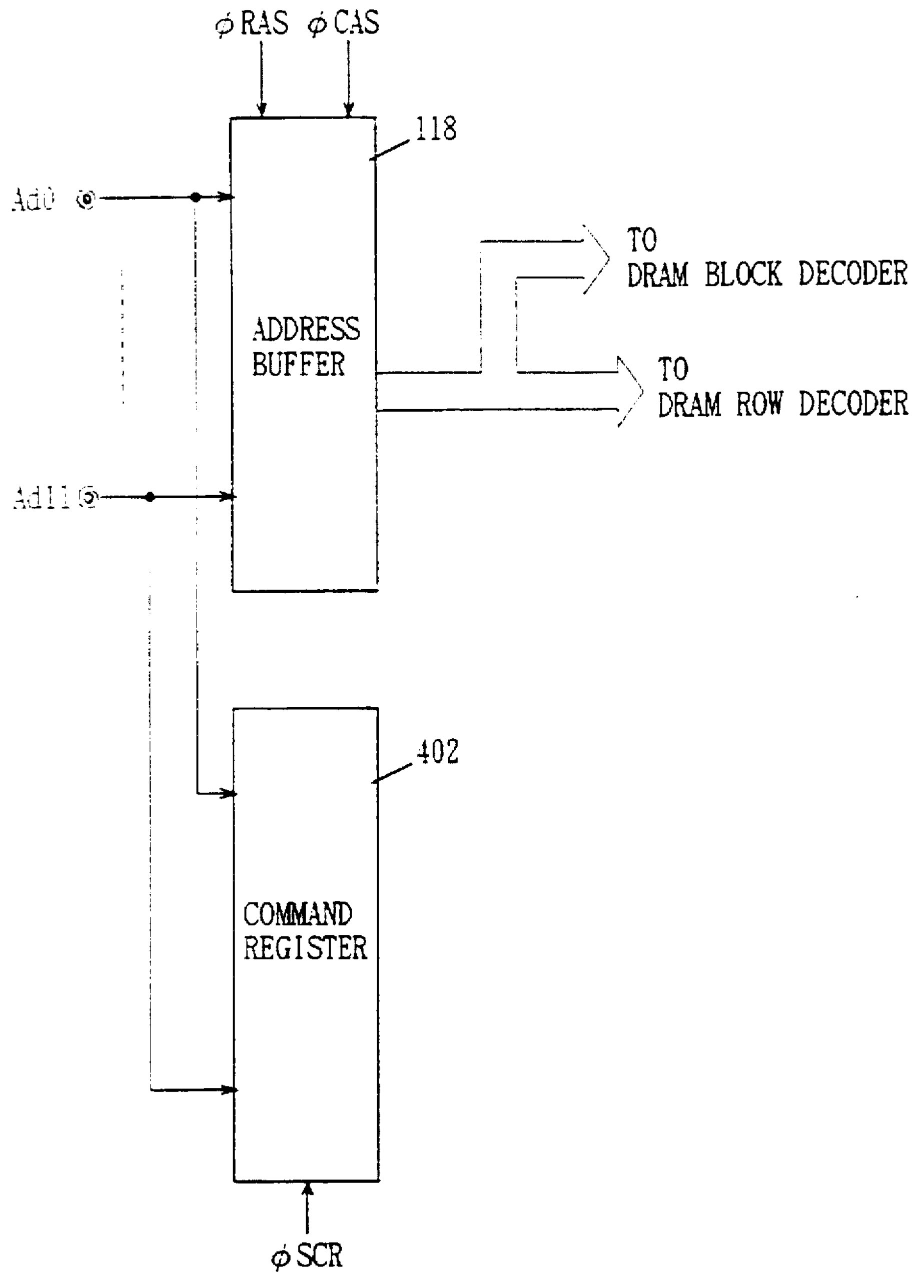
FIG. 56 shows an example of a manner of distribution of addresses and command data to the command register and the address buffer in the semiconductor memory device in accordance with one embodiment of the present invention.

Referring to FIG. 56, an address buffer 108 receiving DRAM address bits Ad0 to Ad11 generates internal row and column addresses, latches the applied address bits AD0 to Ad11 as the row address and the column address and applies the same to the DRAM row decoder and the DRAM column block decoder, respectively, in response to the row address latch designating signal φRAS and the column address latch designating signal φCAS. Command register 402 takes, in response to the set command register mode detection signal φSCR, the DRAM address bits Ad0 to Ad11 as command data. Since the DRAM address bits Ad0 to Ad11 are separately applied to the address buffer 108 and command register 402, the command data can be set without affecting the operation of the DRAM array when the set command register mode is designated.

[Input/Output Control by Command Register]

Figure 57:
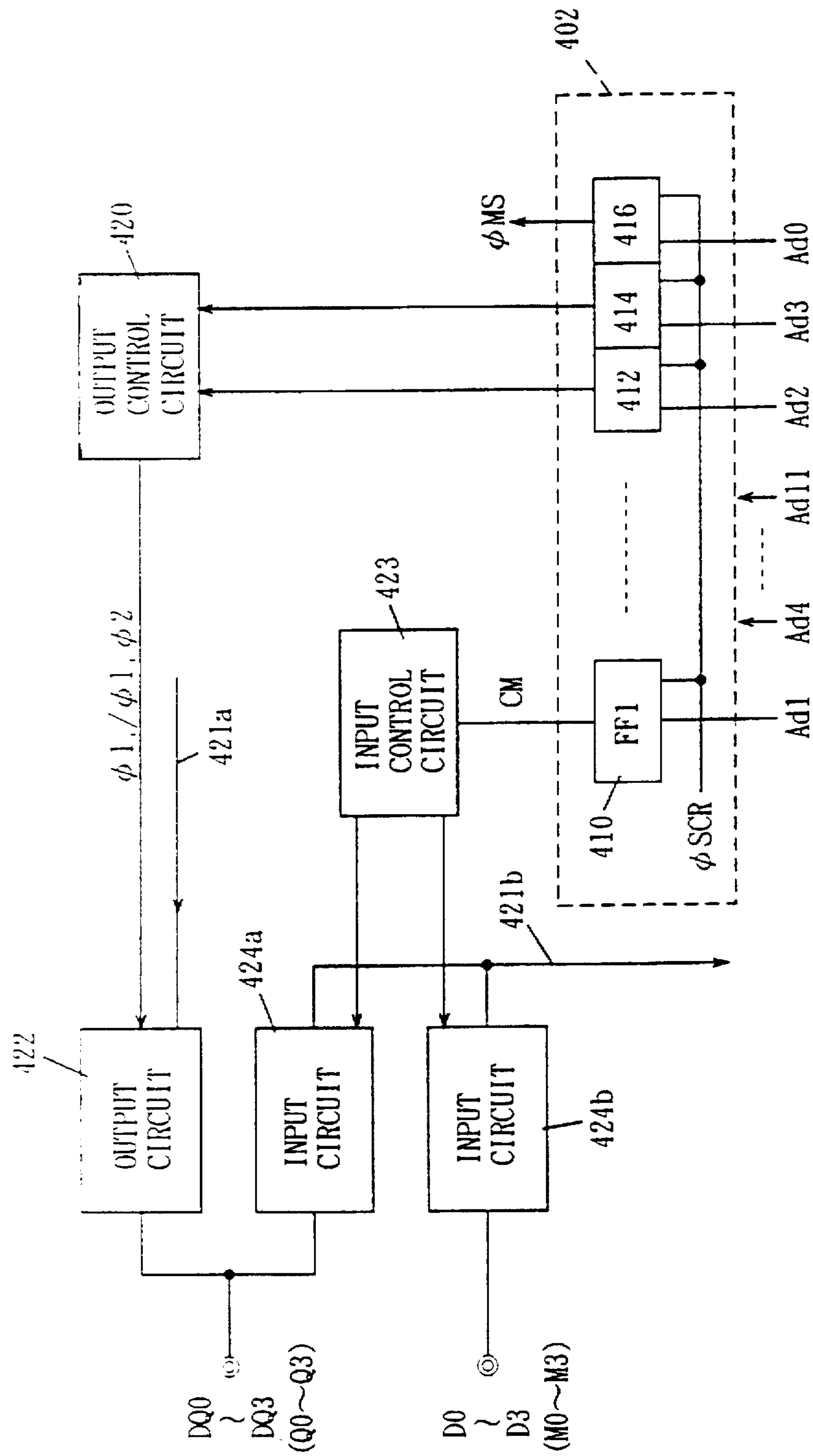
FIG. 57 shows an example of a structure of a data input/output portion in a semiconductor memory device in accordance with one embodiment of the present invention.

FIG. 57 shows a structure for controlling input/output by the command data. Referring to FIG. 57, command register 402 includes latch circuits 410, 412, 414 and 416 responsive to the set command register mode detecting signal φSCR for latching applied DRAM address bits Ad1 to Ad0. 12 latch circuits are provided corresponding to the DRAM address bits Ad0 to Ad11, and four latch circuits there among are shown as representatives. Latch circuit 410 latches DRAM address Ad1, and latch circuits 412 and 414 latch DRAM addresses Ad2 and Ad3, respectively.

Input/output portion includes an input circuit 424*b* connected to input data pins D0 to D3, an input circuit 424*a* connected to data input/output pins DQ0 to DQ3 (Q0 to Q3), and an output circuit 422 connected to data input/output pins DQ0 to DQ3. Enable/disable of one the input circuits 424*a* and 424*b* is carried out by an input control circuit 423. Input control circuit 423 enables one of input circuits 424*a* and 424*b* in accordance with a signal from latch circuit 410 included in command register 402.

Output circuit 422 outputs data transmitted to internal data output line 421*a* at a prescribed timing in accordance with control signals φ1, /φ1 and φ2 from output control circuit 420. Data output mode includes a transparent mode 1, a transparent mode 2, a latched mode and a registered mode. Output control circuit 420 selects the output mode in accordance with DRAM address bits Ad2 and Ad3 applied from latch circuits 412 and 414 of command register 402. The operation of the input control circuit will be described.

FIG. 58 shows a structure of the input control circuit and the input circuits. Referring to FIG. 58, input control circuit 423 includes a buffer 435 receiving a command CM from a command register 402, an inverter buffer 434 for inverting the command CM, and a gate 436 responsive to an output from buffer 435 for transmitting the output from input circuit 424*b* to internal write data line 421*b*.

Input circuit 424*a* includes an input buffer 431 for taking in the input DQ applied in response to DRAM clock DK, and a gate circuit 432 for transmitting the output of input buffer 431 selectively to internal write data line 421*b* in response to an output from input circuit 424*b*. Input buffer 431 is disabled (set to the output high impedance state) when the output of inverter circuit 434 included in input control circuit 423 is at "L".

The command CM attains to "H" when address bit Ad1 is at "H". This state indicates that the DQ separation state has been designated. More specifically, input buffer 431 is disabled and write data D is transmitted from input circuit 424*b* to internal write data transmitting line 421*b*. Input circuit 424*b* takes in the applied data D in response to the DRAM master clock DK and generates an internal write data. When address bit Ad1 is at "L", the command CM attains to "L". This state indicates that the common DQ mode, that is, the mask enable mode has been designated. In the input control circuit 423, the gate 436 is set to the shut off state. The output of input circuit 424*b* is not transmitted to internal write data line 421*b*. Mask data M is output from input circuit 424*b*. Input buffer 431 takes in the data in accordance with the DRAM master clock DK, and in accordance with the mask data M, transmits the internal write data to internal write data transmitting line 421*b* selectively through the gate 432. Thus mask can be provided during data writing.

Figure 59:
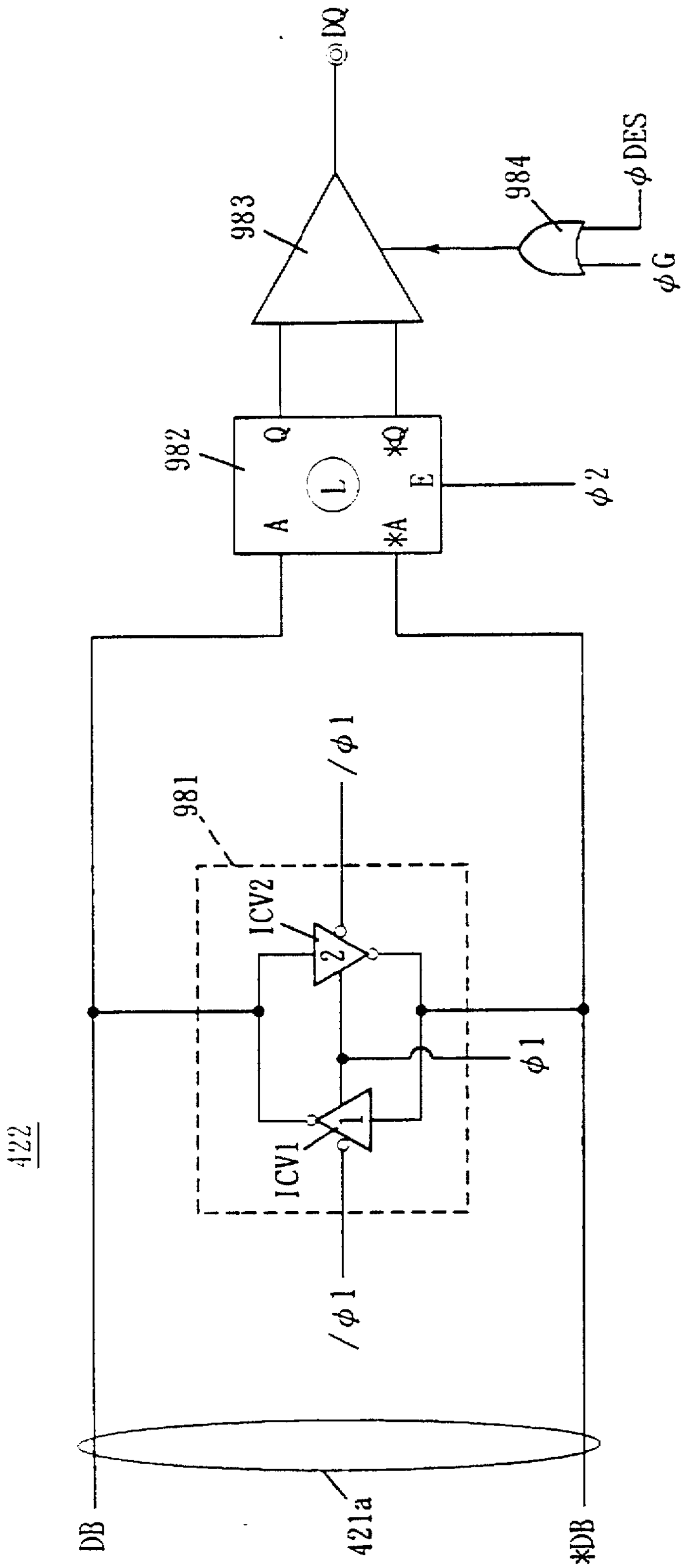
FIG. 59 shows an example of the structure of the output circuit shown in FIG. 57.

FIG. 59 shows an example of a specific structure of the output circuit. Referring to FIG. 59, output circuit 422 includes a first output latch 981 responsive to control signals φ1 and /φ1 from output control circuit 420 for latching data on read data buses DB and *DB (data line 421*a*), a second output latch 982 responsive to a clock signal φ2 for passing latch data of the first output latch 981 or data on data buses DB and *DB, and an output buffer 983 receiving data from output latch 982 and in response to an output from gate circuit 984 for transmitting the data as output data to external pin DQ. Gate circuit 984 receives a signal φDES indicative of the deselect SRAM mode and an output enable signal φG generated in synchronization with the output enable G#. When the output of gate circuit 984 is at "H", the output buffer 983 is set to the output high impedance state.

The first output latch 981 includes clock inverters ICV1 and ICV2 which are activated in response to clock signals φ1 and /φ1. The clock inverter ICV1 has its input and output connected to the output and input of clock inverter ICV2. When clock signal φ1 is at "H", clock inverters ICV1 and ICV2 are enabled, and thus the first output latch 981 is set to the latch state. When clock signal φ1 is at "L", clock inverters ICV1 and ICV2 are disabled, and therefore the first output latch 981 does not carry out latching operation.

When clocks signal φ2 is at "L", the second output latch 982 latches data applied to its inputs A and *A, and provides the same from outputs Q and *Q. When clock signal φ2 is at "H", the second output latch 982 outputs the data which have been latched when the clock signal φ2 is at "L" from outputs Q and *Q, regardless of the signal states at inputs A and *A thereof. The clock signals φ1, /φ1 and φ2 controlling the latching operation are signals synchronized with the master clock K (DRAM master clock DK) and the timings of generation thereof are controlled by output control circuit 420.

Figure 60:
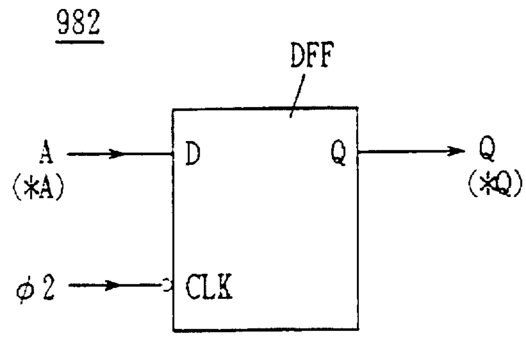
FIG. 60 shows a specific example of the structure of the latch circuit shown in FIG. 59.

FIG. 60 shows an example of a specific structure of the second output latch 982. Referring to FIG. 60, the second output latch 982 includes a D type flipflop DEF receiving at its D input the signal applied to input A (*A) and at its clock input CLK, the clock signal φ2. From the output Q of D type flipflop DFF, an output Q (*Q) of the second output latch 982 is provided. The D type flipflop DFF is of the down edge trigger type, and it takes the signal applied to input A at a timing of fall of clock signal φ2 to "L", and continuously outputs the taken input A as long as the clock signal φ2 is at "L".

When clocks signal φ2 is at "H", it continuously outputs the previously latched data regardless of the state of input signal A applied to its input terminal D. D type flipflops DFF are provided respectively for inputs A and *A. The second output latch 982 may have other structures and any circuit structure may be used provided that it can realize the latch state and the through state in response to the clock signal φ2.

Figure 61:
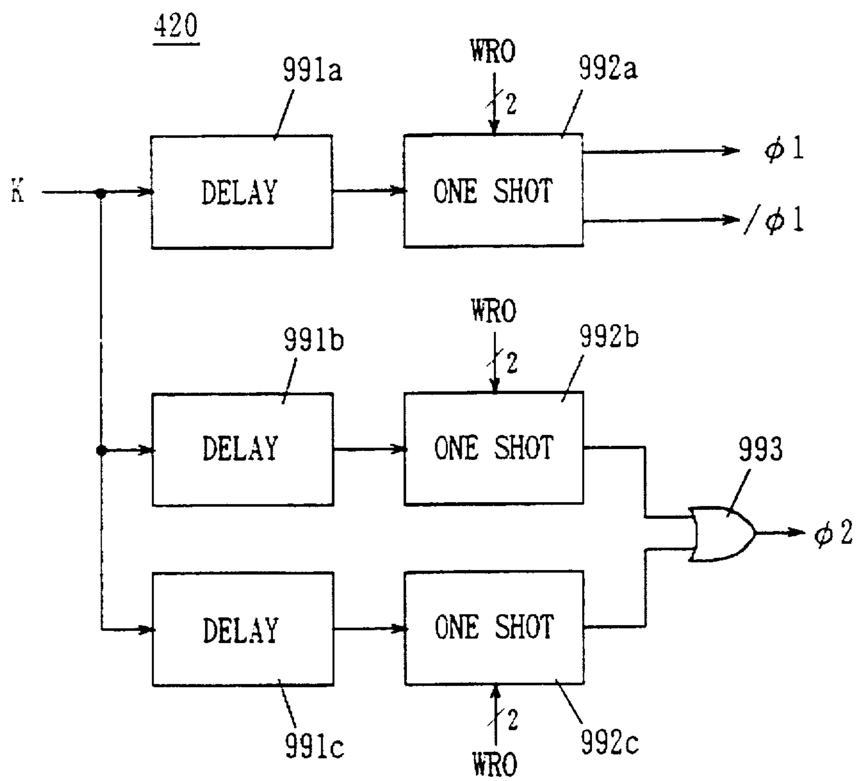
FIG. 61 shows an example of the structure of the output control circuit shown in FIG. 57.

FIG. 61 shows an example of a specific structure of output control circuit 420. Output control circuit 420 includes delay circuits 981*a*, 981*b* and 981*c* for providing a delay of a prescribed time period to master clock K, a one shot pulse generating circuit 982*a* responsive to the output from delay circuit 981*a* for generating a one shot pulse signal having a prescribed pulse width, a one shot pulse generating circuit 982*b* responsive to an output of delay circuit 981 for generating a one shot pulse signal having a prescribed pulse width and a one shot pulse generating circuit 982 responsive to an output from delay circuit 981*c* for generating a one shot pulse signal having a prescribed pulse width. Clock signals φ1 and φ1 are generated from one shot pulse generating circuit 982*a*.

The outputs from one shot pulse generating circuits 992*b* and 992*c* are applied to an OR circuit 993. The clock signal φ2 is generated from OR circuit 993. The delay time provided by delay circuit 991*b* is shorter than that of delay circuit 991*c*. One shot pulse generating circuits 992*a* to 992*c* are enabled/disabled in accordance with a command data generated from 2 bits of address bits Ad2 and Ad3 applied from the command register. When these 2 bits of command data (addresses Ad2 and Ad3) indicate the latch mode as the output mode, one shot pulse generating circuits 992*a* and 992*c* are enabled, and the one shot pulse generating circuit 992*b* is disabled. The operation of the data output circuit will be described with reference to FIGS. 59 to 61.

(i) Latch Output Mode

Figure 62:
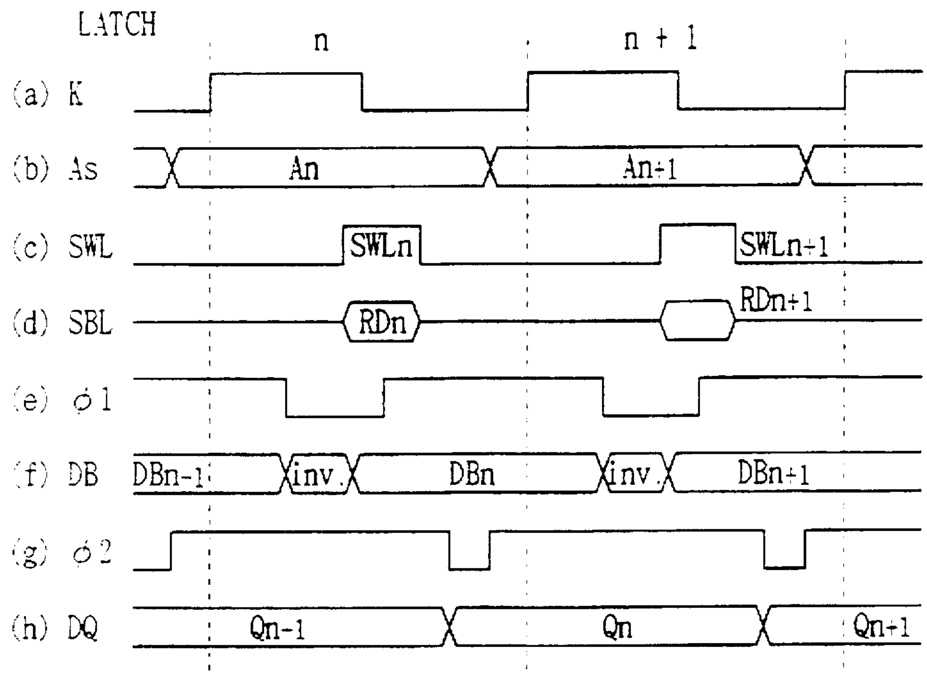
FIG. 62 is a diagram of waveforms showing a latched output mode operation.

First, the operation waveforms in the latch output mode are shown in FIG. 62. The latch output mode is set by setting the address bit Ad3 to "L" and address bit Ad2 to "H" in the set command register mode. At this time, one shot pulse generating circuits 992*a* and 992*c* are enabled. Assume that output enable signal G# is at active "L" indicating data output, and that gate circuit 994 of FIG. 59 is enabling main amplifier 993. It is also assumed that the SRAM read mode has been designated as the output mode.

At a rising edge of master clock K, the SRAM address As (An) is taken in the address buffer, a corresponding SRAM word line SWLn is selected in the SRAM array, and data RDn appears on the SRAM bit line pair SBL.

One shot pulse generating circuit 992*a* generates a one shot pulse which is kept at "L" for a prescribed period at a prescribed timing in response to the rise of master clock K. When clock signal φ1 falls to "L", the latching operation of the first output latch 981 is inhibited. At this time, clock signal φ2 is at "H", and the second output latch 982 maintains the latch state, latching and outputting the data Qn−1 which has been read in the previous cycle.

From 64 bits (16×4) of data RDn on SRAM bit line pairs SBL selected in accordance with the external address As, 4 bits of data selected in accordance with the block address are transmitted to internal output data buses DD and *DD. Clock signal φ1 rises to "H" with the data DBn on data buses DB and *DB being established. Thus, the first output latch 981 is set to the latch state, latching the established data DBn.

Thereafter, a one shot pulse is generated from one shot pulse generating circuit 992*c*, and signal φ2 falls to "L". The second output latch 982 newly takes the data DBn which has been latched by the first output latch 981, in response to the fall of the signal φ2 and transmits the data to output terminal DQ through the output buffer 983.

Generation of the clock signal φ2 is carried out in synchronization with the fall of the master clock K, and in response to the fall of master clock K, the data DBn selected in this cycle is output as output data Qn. Clock signal φ2 rises to "H" by the next rise of master clock K. The second output latch 982 continuously outputs the established data DBn regardless of the data on internal output data buses DB and *DB.

Thereafter, clock signal φ1 falls to "L", and releases the latch state of the first output latch 981 to be ready for the next cycle, that is, the latching operation of the next established data. By repeating the above described operations, data read in the previous cycle is output successively as established data in response to the rise of the master clock K.

(ii) Registered Output Mode

Figure 63:
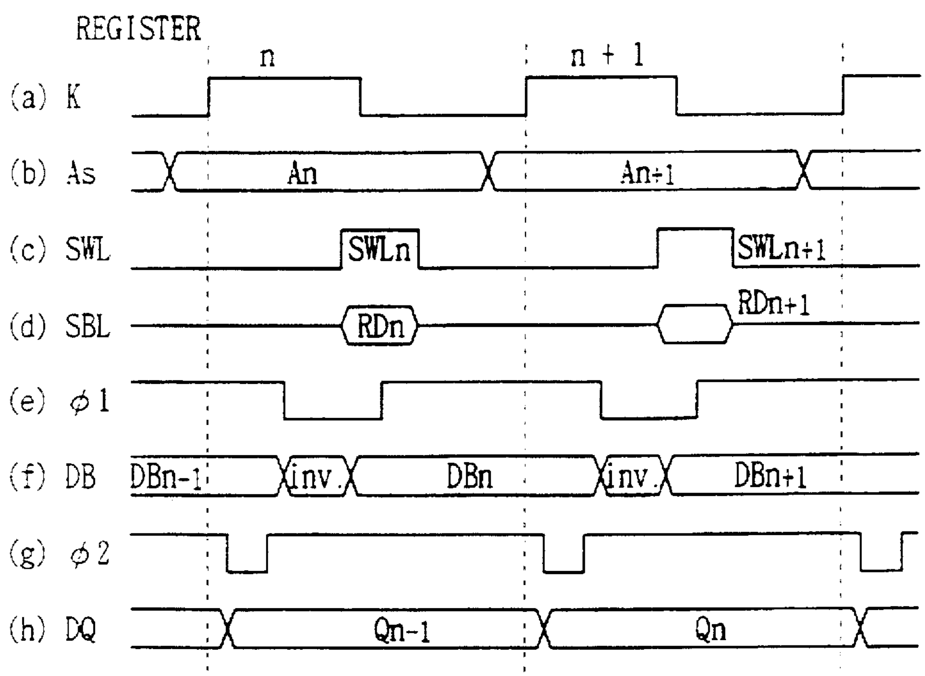
FIG. 63 is a diagram of waveforms showing a registered output mode operation.

The registered output mode will be described with reference to FIG. 63. The registered output mode is set by setting the address bit Ad3 to "H" and the address bit Ad2 to "L" in the set command register mode. In the registered output mode, one shot pulse generating circuit 992*b* is enabled and one shot pulse generating circuit 992*c* is disabled. In this case, a one shot pulse which falls "L" is generated from one shot pulse generating circuit 992*b* in response to the rise of master clock K. Since clock signal φ1 is at "H", data DBn-1 read in the previous cycle is latched by the second output latch 992.

In the registered output mode, the timing of fall of the clock signal φ to "L" is determined in response to the rise of the master clock K. Therefore, in the (n+1)th cycle of the master clock K, the data DBn of the n-th clock cycle is output as output data Qn at the output pin terminal DQ. More specifically, what is different between the latched output mode and the registered mode is only the timing of activation, that is, timing of transition to "L" of clock signal φ2. Therefore, the latch output mode in which data read in the very preceding cycle is output and then data read in the present cycle is output, as well as the registered output mode in which the data read in the n-th cycle is output in the (n+1)th cycle are both realized.

(iii) Transparent Output Mode

The transparent output mode will be described with reference to FIG. 64. First, referring to FIG. 64A, the first transparent output mode will be described. The first transparent output mode is designated by setting the address bits Ad2 and Ad3 both to "L". In the first transparent output mode, clock signals φ1 and φ2 are kept at "L". At this time, the first output latch 981 is released from the latching operation, and the internal output latch 982 is also at the through state. Therefore, in this case, the read data DBn which has been transmitted to internal data buses DB and *DB is not latched but directly output as output data Qn. Therefore, if the data of the SRAM bit line SBL is invalid (INV), invalid data INV appears at the output pin DQ.

The second transparent output mode (transparent 2) is designated by setting the address bits Ad2 and Ad3 both to "H". As shown in FIG. 64B, when the second transparent output mode is designated, clock signal φ1 is generated. While the clock signal φ1 is at "H" the first output latch 981 carries out the latching operation. Therefore, even if the data RDn on the SRAM bit line pair SBL is at the invalid state, the data on the data buses DB and *DB is latched as valid data by the first output latch 981 and output for a prescribed period (as long as the clock signal φ1 is at "H"), and therefore the period in which invalid data INV is provided is made shorter. In the second transparent output mode also, the clock signal φ2 is kept at "L".

In the above described structure, a down edge trigger type D type flipflop is used as the second output latch 982. An up edge trigger type latch circuit may be used if the polarity of the clock signal φ2 is changed. The first output latch 981 may be implemented by other latch circuits.

In the diagrams of operation waveforms of FIGS. 62 to 64B, chip enable E# and the output enable G# are both at active "L", indicating that the output high impedance is not set in each clock cycle. The setting of the output high impedance state by the chip enable E# and the output enable G# will be described.

[Data Output Timing]

[Transparent Output Mode]

Figure 65A:
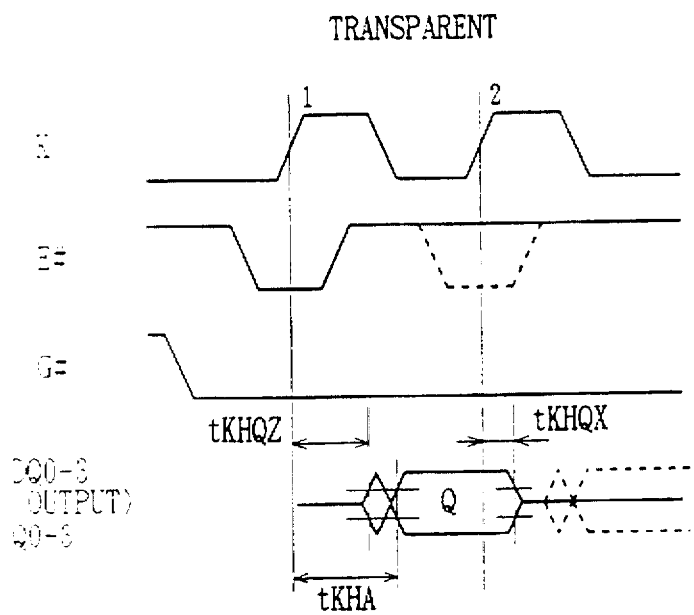
FIGS. 65A and 65B show output timings of output data in the transparent output mode.
Figure 65B:
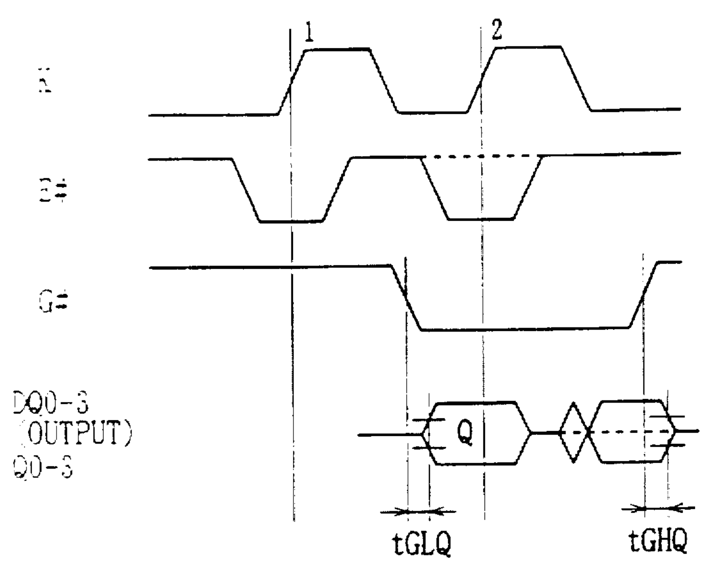

FIGS. 65A and 65B show the relation between output data and the chip enable E# as well as the output enable G# in the transparent output mode. In the transparent output mode, data on the internal data buses DB and *DB are transmitted directly to the output buffer. When the chip enable E# is at "H" at the rising edge of the master clock K, it enters the deselect SRAM mode, and the output high impedance is set. When the output enable G# is at "H", the output high impedance is set.

Assume that the output enable G# is already active "L" as shown in FIG. 65A. En this state, if the chip enable E# is at "L" at the rising edge of master clock K, data reading is carried out in that cycle. After the lapse of time tKHQZ from the rising edge of master clock K, the output high impedance state is released and read data is transmitted. After the lapse of time tKHA from the rising edge of master clock K, valid data is provided.

When the chip enable E# is at "H" at the rising edge of the master clock K, the output high impedance state is set after the lapse of time tKHQX from the rising edge of the master clock K.

When data reading operation is carried out with the chip enable E# lowered to "L" at the rising edge of master clock K as shown in FIG. 65B, this cycle becomes a data reading cycle. If the output enable G# falls to "L" later than chip enable E#, data read in this cycle (cycle 1 in FIG. 65B) is provided as valid data after the lapse of time tGLQ from the fall of the output enable G#. When the chip enable E# is set to "L" in the similar manner at the rise of the master clock K, the data read in this cycle (cycle 2) is provided in the similar state as shown in FIG. 65A. If the output enable G# is raised to "H" in this cycle, the output high impedance state is set after the lapse of time tGHQ.

The states of signals indicated by the dotted lines in FIGS. 65A and 65B show that when the state of the chip enable E# indicated by the dotted line is set, the output data indicated by the dotted line appears.

[Registered Output Mode]

This is an output mode in which an output register is provided between the output buffer and the internal data buses DB and *DB. Data is provided with a delay of 1 cycle. More specifically, referring to FIG. 66A, if the chip enable E# is lowered to "L" in the first cycle of the clock K while the output enable G# is at "L", the first cycle of the master clock K will be a read mode. The data read in cycle 1 is read in the next cycle 2. Namely, the read data is output after the lapse of time tKHQZ from the rising edge of the next master clock, and after the lapse of time tKHAR, valid data is provided. After the lapse of time tKHQX from the rising edge of the master clock K in the next clock cycle 3, the output high impedance state is set. If the chip enable E# is again at "L" in cycle 2, valid data is provided in cycle 3, as shown by the dotted line in FIG. 66A.

Meanwhile, assume that data reading operation is carried out by lowering the chip enable E# to "L" in the output high impedance state in which the output enable G# is at "H". Referring to FIG. 66B, in this state, data read in cycle 1 is provided as valid data after the lapse of time tGLQ from the fall of the output enable G# in cycle 2. If the chip enable E# is at "L" in the second cycle, valid data is provided in cycle 3. When the output enable G# is raised to "H" in clock cycle 3, the output high impedance state is set after the lapse of time tGHQ.

[Latched Output Mode]

The latched output mode is an output mode in which an output latch circuit is provided between the output buffer and the internal data buses DB and *DB. Assume that data reading operation is carried out by lowering the chip enable E# to "L" in the first cycle of the master clock K as shown in FIG. 67A. In that case, data is provided after the lapse of time tKLQZ from the falling edge of the master clock K in the first cycle, and valid data is provided after the lapse of time tKLA from this falling edge. The data is set to the output high impedance state after the lapse of time tKLQX from the falling edge of the clock of the next clock cycle (cycle 2). If the chip enable E# has been lowered to "L" in cycle 2, data is provided after the lapse of time of tKLQZ from the fall of the master clock K (as shown by the dotted line). In the operation shown in FIG. 67A, the output enable G# is already at "L".

Then, referring to FIG. 67B, assume that the output enable G# falLs to "Lϕlater. When data reading is carried out by lowering the chip enable E# in the first cycle of the master clock K and the output enable G# is lowered to "L'in this first cycle of the master clock K, data read in cycle 1 is provided after the lapse of time tGLQ from the falling edge of the output enable G#. If data reading is carried out again in cycle 2, the data read in this cycle 2 is provided after the lapse of time tKLQZ from the falling edge of the master clock K in cycle 2. If the output enable G# is raised to "H" thereafter (provided that the output control by chip enable E# is not carried out), the output high impedance state is set after the lapse of time tGHQ from the rising edge of the output enable G#.

In the transparent output mode, the period in which the output data is valid is only that period in which valid data is appearing on the internal buses. In the latched output mode, read data is latched to the output, and therefore valid data is provided externally even during the period in which invalid data is appearing on the internal data buses. Accordingly, time necessary for the CPU or the like as an external processing unit to take in the output data can be sufficiently provided. In the registered output mode, data of the previous cycle is provided with a delay of one cycle. In this case, a so called pipeline operation can be implemented, realizing high speed data reading. By setting the above described output modes in accordance with the command data in the command register, a user can select an output mode which is suitable for the system.

[Signal Parameters]

Figure 68:
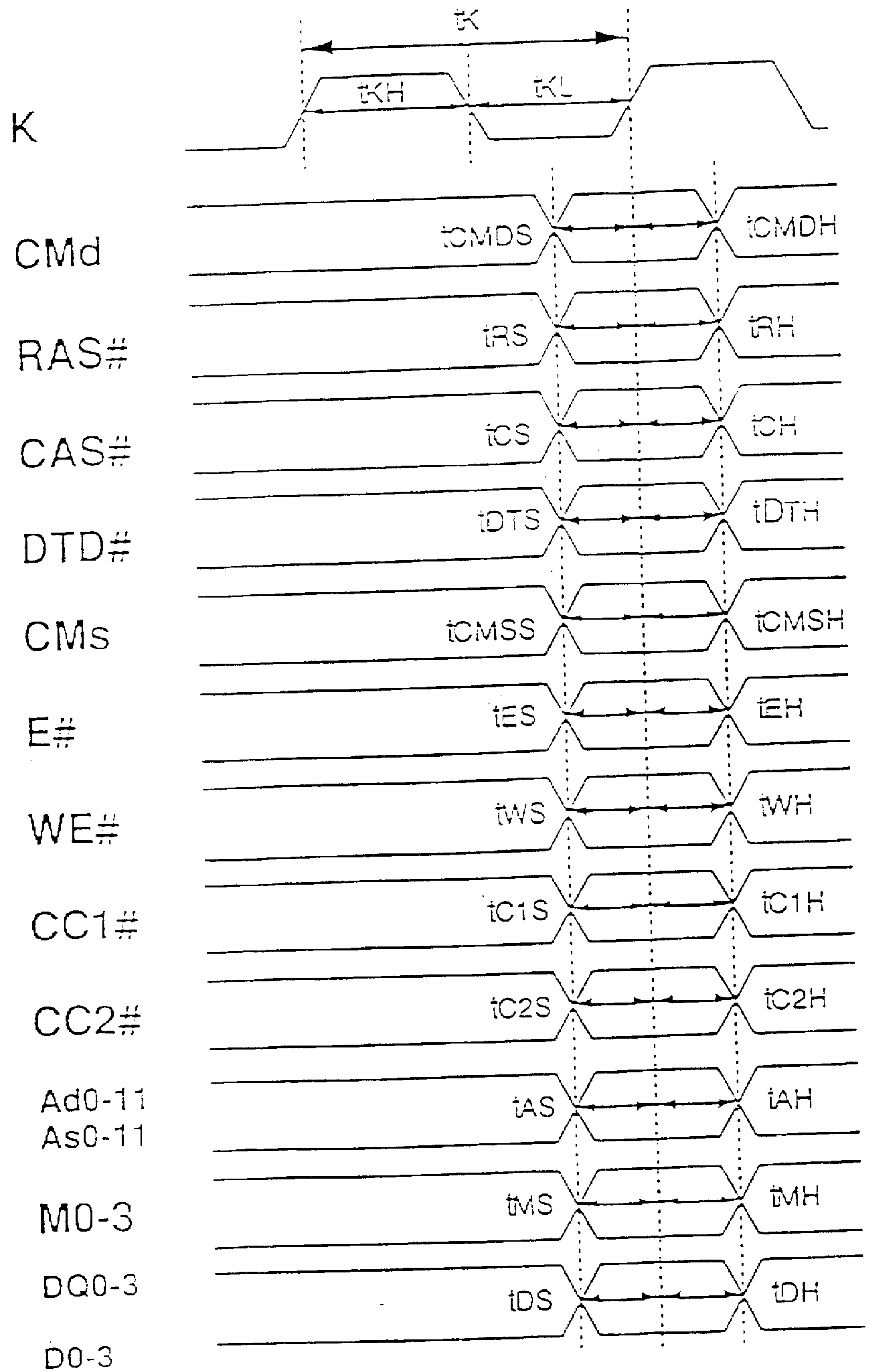
FIG. 68 shows required conditions of external signals of the semiconductor memory device in accordance with one embodiment of the present invention.

FIG. 68 shows, in a table, set up and hold times required for respective signals. The operation mode of the CDRAM is determined by the combination of states of the control signals at the rising edge of the master clock K, and the CDRAM carries out the designated operation in accordance with the determined operation mode. Externally applied signals are all applied in the form of pulses. The set up time required for the external signals (the time necessary for setting the signal to an established state by the rise of the master clock K) and the hold time (time necessary for maintaining the established state of the signal after the rise of the master clock K) are the same for all the external signals. Therefore, an external device can easily determine the timing of signal generation, since the timing for generating signals and the timing for setting the signals to an established state can be made the same for all the signals.

The minimum clock cycle time of the master clock K is 8 ns and the maximum clock cycle time is 100 ns. The master clock K has an "H" period tKH and a "L" period tKL. The DRAM clock mask CMd has a set up time tCMDS and a hold time tCMDH. The row address strobe RAS# has a set up period tRS and a hold time tRH. The column address strobe CAS# includes a set up time tCS and a hold time tCH. The data transfer designation DTD# includes a set up time tDTS and a hold time tDTH. The SRAM clock mask CMs includes a set up time tCMSS and a hold time tCMSH. The chip enable E# has a set up time tES and a hold time tHE.

The write enable WE# has a set up time tWS and a hold time tWH. The control clock CC1# includes a set up time tC1S and a hold time tC1H. The control clock CC2# includes a set up time tC2S and a hold time tC2H. The DRAM address bits Ad0 to Ad11 and the SRAM address bits As0 to As11 include set up time tAS and hold time tAH. The mask enables M0 to M3 include a set up time tMS and a hold time tMH. Input data DQ0 to DQ3 or D0 to D3 have a set up time tDS and a hold tDH. The set up time is, at minimum, 2 to 3 ns, while the hold time is, at minimum, 3 to 4 ns. The rise/fall time of the internal signal is 2 ns (when it changes in the range of 0 V to 3 V).

|Pin Arrangement|

Figure 69:
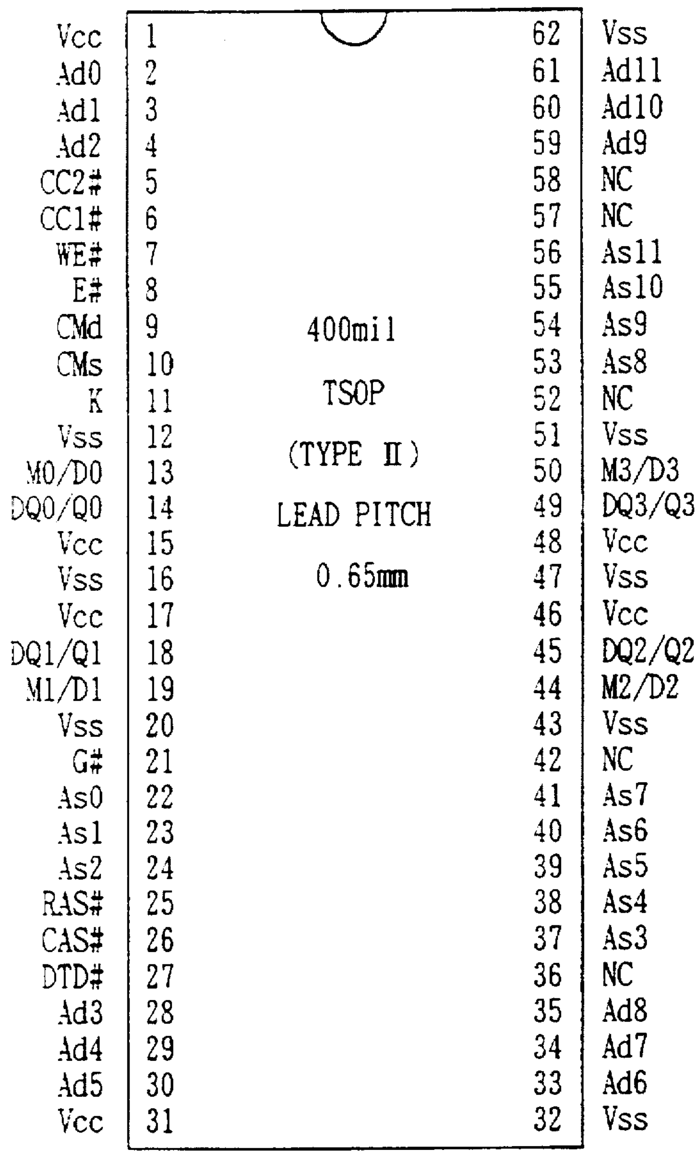
FIG. 69 shows an appearance and pin arrangement of a package accommodating the semiconductor memory device in accordance with one embodiment of the present invention.

FIG. 69 shows an appearance of a package accommodating the CDRAM in accordance with the present invention and the pin arrangement. The CDRAM is accommodated in type II of a TSOP (Thin•Small•Outline Package) having the lead pitch of 0.65 mm and 400 mil thickness.

A supply voltage Vcc is applied to pin terminals of the numbers 1, 15, 17, 31, 46, and 48. The ground potential Vss is applied to pin terminals of the numbers 12, 16, 20, 32, 43 and 47, 51 and 62. DRAM address bits Ad0 to Ad11 are applied to pin terminals of the numbers 2 to 4, 28 to 30, 33 to 35 and 59 to 61. SRAM address bits As0 to As11 are applied to pin terminals of the numbers 22 to 24, 37 to 41 and 53 to 56. The control clock CC2# and CC1# are applied to pin terminals of the pin numbers 5 and 6. The write enable WE# and the chip enable E# are respectively applied to the pin terminals of the numbers 7 and 8. The DRAM clock mask CMd and the SRAM clock mask CMs are applied to the pin terminals of the numbers 9 and 10, respectively.

The master clock K is applied to the pin terminal of the number 11. The row address strobe RAS#, the column address strobe CAS# and the data transfer designation DTD# are respectively applied to the pin terminals of the numbers 25 to 27. Input data D0 to D3 or mask enables M0 to M3 are respectively applied to the pin terminals of the numbers 13, 19, 44 and 50. The pin terminals of the numbers 14, 18, 45 and 49 are used to receive output data Q0 to Q3 or used as input/output data pin terminals DQ0 to DQ3.

The pins of the numbers 36, 42, 52, 57 and 58 are at the non-connected state (NC).

In the pin arrangement shown in FIG. 69, the supply voltage Vcc and the ground potential Vss arranged at the central portion of the package are used for the data input/output portions. The ground potential Vss and the supply voltage Vcc applied respectively to the pin terminals of the numbers 12 and 15 are used for driving data M0/D0 and DQ0/Q0 appearing on the pin terminals of the numbers 13 and 14. The supply voltage Vcc and the ground potential Vss applied to the pin terminals of the numbers 17 and 20 are used for the circuit driving data DQ1/Q1 and M1/D1 appearing on the pin terminals of the numbers 18 and 19. The ground potential Vss and the supply voltage Vcc applied to the pin terminals of the numbers 43 and 46 are used for the circuit for driving the data M2/D2 and DQ2/Q2 appearing on the pin terminals of the numbers 44 and 45. The supply voltage Vcc and the ground potential Vss applied to the pin terminals of the numbers 48 and 51 are used for the circuit for driving data DQ3/Q3 and M3/D3 appearing on the pin terminals of the number 49 and 50. The supply voltage and the ground potential are distributed to respective circuits so as to reduce the influence of internal noise.

In the above described embodiment, data input/output is carried out through the bit lines of the SRAM array. Data input/output may be carried out not through the bit lines of the SRAM array but the data can be input/output through the connecting portion of the SRAM array and the bidirectional transfer gate. In that case, a sense amplifier+IO block 122 and the SRAM column decoder 120 may be arranged between the SRAM array 104 and the bidirectional data transfer circuit 106 of the structure of FIG. 1.

With respect to the structure shown in FIG. 1, 4 bits of commands (command (0) to (3)) applied from the DRAM address buffer 108 to the bidirectional data transfer circuit 106 have not described yet. These are used for designating the type of operation in the data transfer circuit, and they are used similarly in the second embodiment. Therefore, details will be described later.

Embodiment 2

Figure 70:
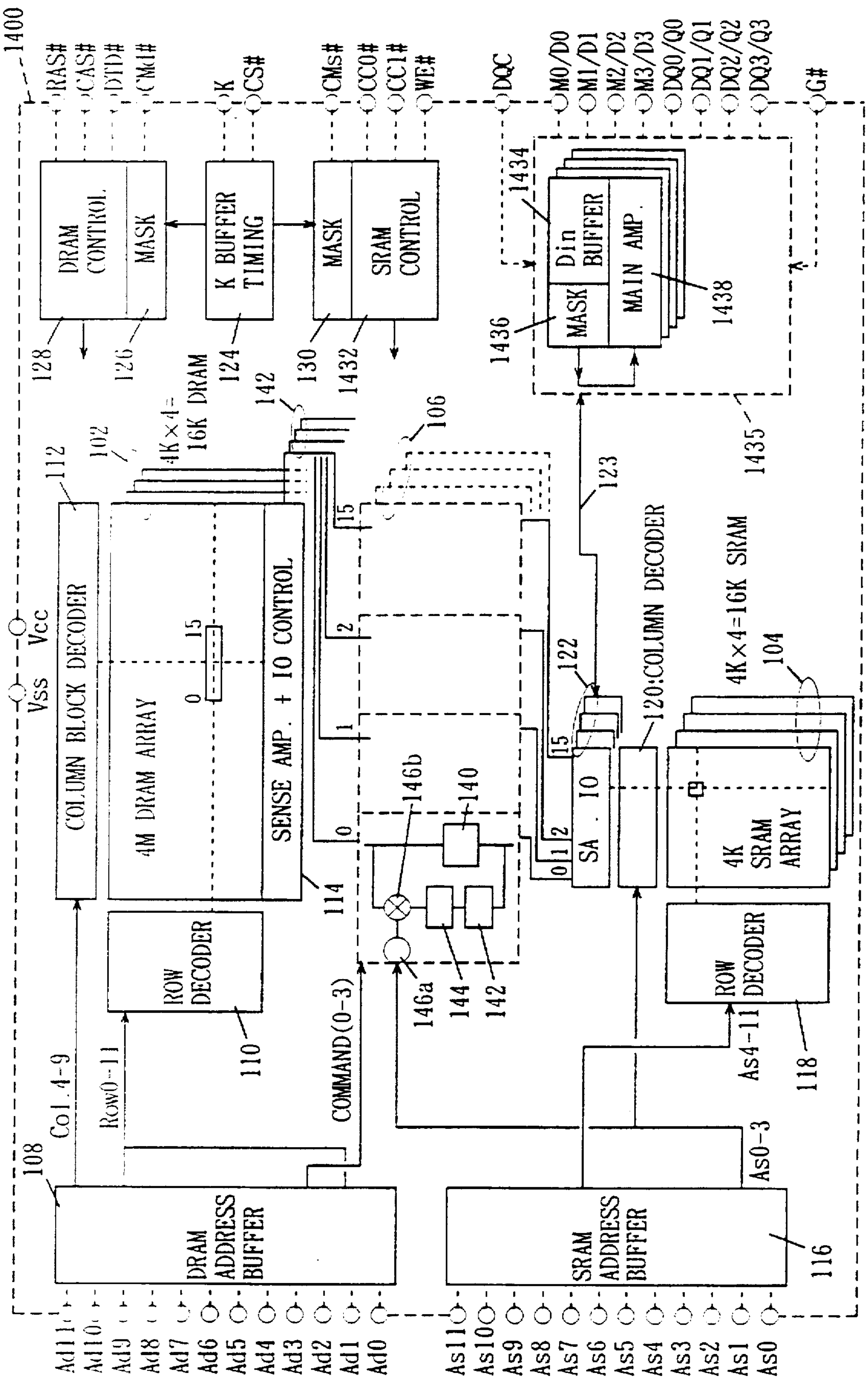
FIG. 70 shows a whole structure of a semiconductor memory device in accordance with another embodiment of the present invention.

FIG. 70 shows a whole structure of a CDRAM in accordance with a second embodiment of the present invention. In FIG. 70, portions corresponding to the components of the CDRAM shown in FIG. 1 are denoted by the same reference characters and the detailed description thereof is not repeated.

In the CDRAM shown in FIG. 70, a column decoder 120 and a sense amplifier+IO block 122 are provided between the bidirectional data transfer circuit 106 and the SRAM array 104. This arrangement: allows direct access to each buffer of the bidirectional data transfer circuit 106 from the outside.

The CDRAM shown in FIG. 70 includes a mask circuit 1436 and a Din buffer 1434 receiving external data DQ0 to DQ3 and M0 to M3 (or D0 to D3) at an input/output circuit 1435, as well as a maim amplifier circuit 1438 for outputting data to terminals DQ0 to DQ3 (or Q0 to Q3). The data output timing to the main amplifier circuit 1438 from the input/output circuit 1435 is determined by the external output enable G#, and the data input/output timing is determined by a DQ control DQC.

The DQ control DQC controls only the activation/inactivation of the input/output circuit 1435. When DQ control DQC is at "H", the input/output circuit is rendered active. When the DQ control DQC is at "L", the Din buffer 1434, the mask circuit 1436 and the main amplifier circuit 1438 are rendered inactive. In the common DQ arrangement, it is determined by the write enable WE# whether the Din buffer circuit 1434 or the main amplifier circuit 1438 is to be activated.

In the CDRAM shown in FIG. 70, the chip select CS# is applied to a K buffer timing circuit 1424. The K buffer timing generating circuit 1424 also receives an external master clock K. The chip select CS# controls only the operation of the DRAM array, the operation of the SRAM array, data transfer between the DRAM array and the SRAM array, data transfer between the data transfer circuit and the DRAM array, and data transfer operation between the data transfer circuit 106 and the SRAM array. Other structures are essentially the same as those shown in FIG. 1. However, the control clock applied to the SRAM control circuit 143 is changed to be referred to as control clocks CC0# and CC1#. As the indication of these signals are changed, the types of data transfer operations increased. The data transfer operation will be described in detail later.

In the CDRAM shown in FIG. 70 also, memory cell blocks (16 bits) are selected at one time in a DRAM array 102 (one memory mat) by the column block decoder 112. In the SRAM array 104, 16 bits of memory cells are connected to one row. Correspondingly, the bidirectional data transfer circuit includes transfer gate buffers of 16 bits. The function of the DQ control DQC will be described.

[DQ Control]

Figure 71:
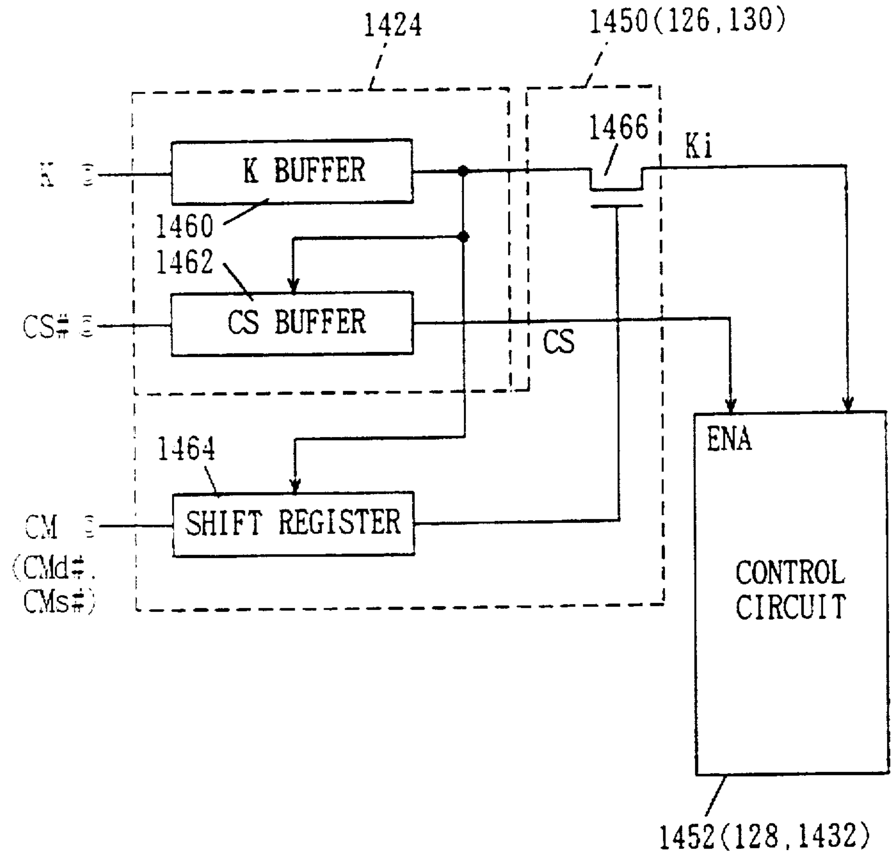
FIG. 71 shows a structure of the K buffer and the mask circuit shown in FIG. 70.

FIG. 71 shows a specific structure of the K buffer timing circuit and the mask circuit shown in FIG. 70. In the CDRAM shown in FIG. 70, the DRAM control circuit 128 and the SRAM control circuit 432 have their activation/inactivation controlled by chip select CS#. In the CDRAM shown in FIG. 1, only the SRAM control circuit 132 is controlled by the chip enable E#. Therefore, the control clock buffer (a circuit for latching external control signals) included in. the DRAM control circuit 128 only operates in response to the DRAM master clock DK, as shown in FIG. 31. In the DFAM shown in FIG. 70, both the DRAM control circuit and the SRAM control circuit take in the data applied in accordance with the master clock K and the chip select CS#. In FIG. 71, the SRAM control circuit and the DRAM control circuit are shown as a control circuit 1452.

Referring to FIG. 71, the K buffer timing circuit 1424 includes a K buffer 1460 receiving the master clock K for generating an internal clock, and a CS buffer 1462 responsive to an internal clock from the K buffer for taking in the chip select CS#. The mask circuit 1450 (generically refers to the mask circuits 126 and 130 shown in FIG. 70) includes a shift: register 1464 responsive to the internal clock from the K buffer 1460 for providing the clock mask CM with a delay of one clock cycle, and a selection gate 1466 for selectively passing the internal clock K buffer 1460 for generating the master clock Ki in accordance with the mask data from the shift register 1464. In this second embodiment, when mask data CM is at "L", generation of the internal master clock Ki is inhibited.

The control circuit 1452 is rendered active when it receives the internal chip select CS from CS buffer 1462 at its enable input ENA. Control circuit 1452 operates in accordance with the master clock Ki applied from the mask circuit 1450 when it is in the active state. Therefore, when the chip select CS is at inactive "H", the CDRAM is at a non-selected state, and the control circuit 1452 is inactive.

Figure 72:
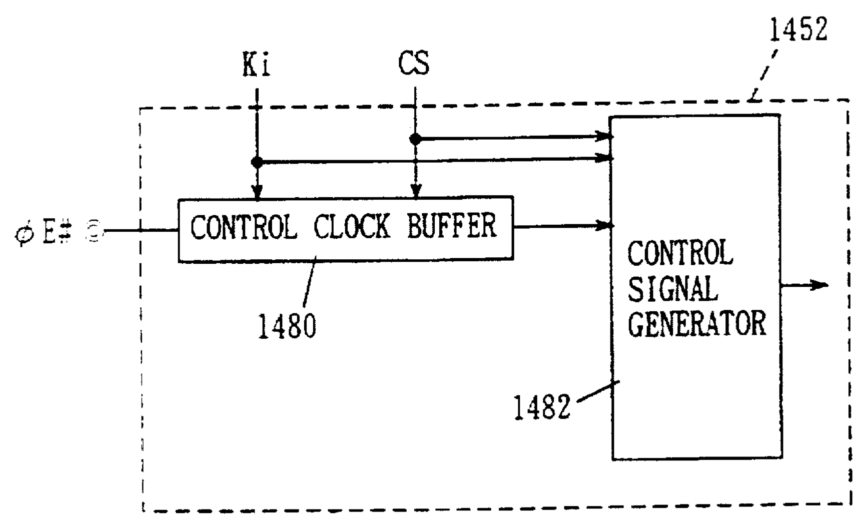
FIG. 72 shows an example of a structure of the DRAM control circuit and the SRAM control circuit shown in FIG. 70.

FIG. 72 shows a structure of control circuit 1452. The output enable G# is generated asynchronously with the master clock K. At this time, the DQ control DQC may be generated non-synchronous with the master clock K.

The DRAM control circuit and the SRAM control circuit 432 have their activation/inactivation controlled by the chip select CS. External control clocks RAS#, CAS#, DTD#, CC0#, CC1#, DQC and WE# are taken inside in accordance with the master clock K and the chip select CS. Therefore, the structure of the buffer circuit taking in the external control clocks are the same as those of FIG. 6. Therefore, the control clock buffer 1480 is shown representing buffers for taking the external control clocks. The control clock φE# represents the external control signals.

Referring to FIG. 72, control circuit 1452 includes a control clock buffer 1480 responsive to the master clock Ki and the chip select CS# for taking in the external control clock φE, and a control signal generating circuit 1482 responsive to the chip select CS and the master clock Ki for generating necessary control signals in accordance with the combination of states of the control clocks applied from control clock buffer 1480.

The DRAM address buffer 108 has the same structure as shown in FIG. 31, and the SRAM address buffer 116 has the same structure as that shown in FIG. o (except that the chip select CS is applied instead of the chip enable E). The structures of the K buffer and the CS buffer are the same as those shown in FIG. 7. As shown in FIGS. 71 and 72, when the chip select CS is at "H", the control circuit 1452 is rendered inactive, and therefore internal operation is not carried out. This state is not related to the states of signals of the clock mask CM. More specifically, the control circuit 1452 is rendered inactive when the chip select CS is at "H", no matter whether the master clock Ki is applied or not.

When the clock mask CM is at "L", the master clock Ki is not generated in the next cycle. As is apparent from the structure shown in FIG. 72, in the control circuit 1452, a new external control signal φE# is not taken. Therefore, when clock mask CM attains to "L", master clock Ki is not generated in the next cycle, and therefore in the control circuit 1452, the state of the previous cycle is maintained. More specifically, if the chip select CS is at "H" in the previous cycle, the control circuit 1452 is at an inactive state. At that time, even when the chip select CS changes to the active "L", the control circuit 1452 is kept at the state of the previous cycle, since the master clock Ki is not applied. Namely, the CDRAM enters the power down mode (both the DRAM portion and the SRAM portion).

If the chip select CS is at the active state of "L" in the previous cycle and the clock mask CM attains to "L" in the present cycle, then even when the chip select CS# is set to inactive "H" in the next clock cycle, the master clock Ki is not applied. Therefore, the data provided in the previous cycle is also provided in this cycle.

Figure 73:
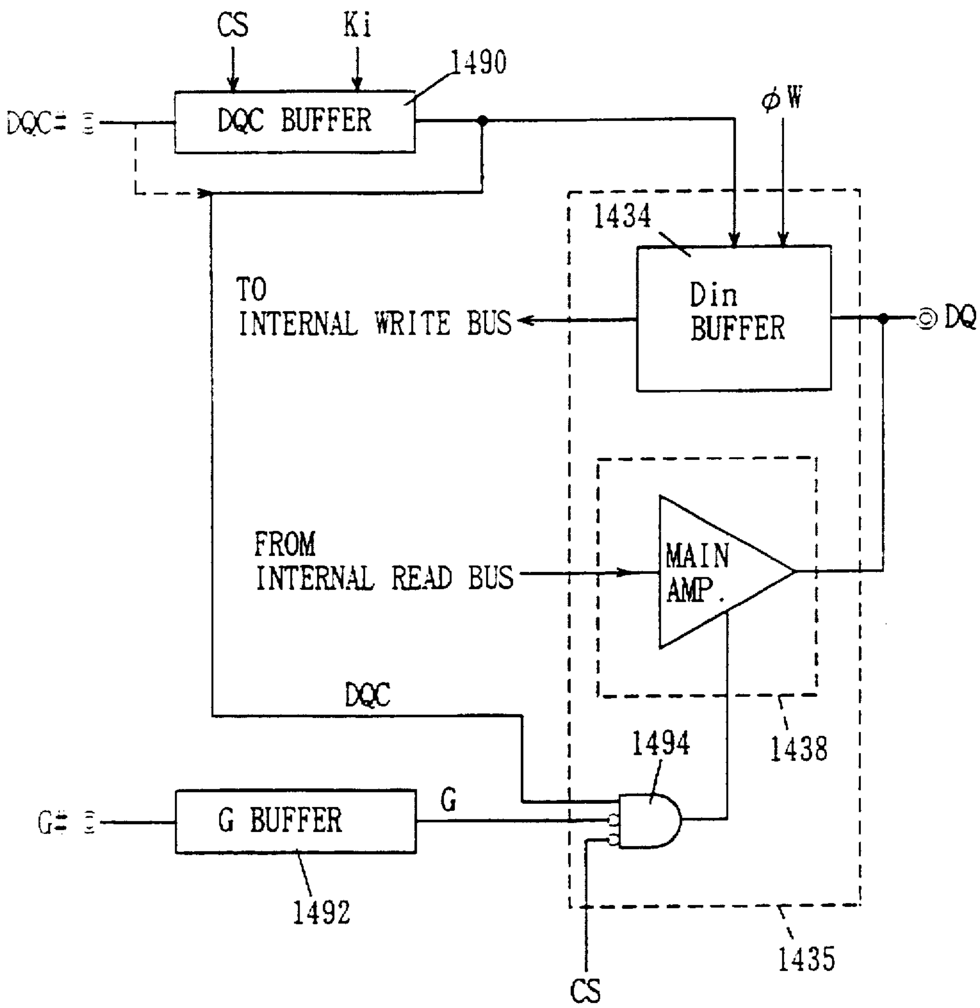
FIG. 73 shows a structure of a data input/output portion of the semiconductor memory device shown in FIG. 70.

FIG. 73 shows a structure for controlling the operation of the input/output circuit 1435 shown in FIG. 70. Referring to FIG. 73, the input/output control circuit includes a G buffer 1492 taking the output enable G# in non-synchronization with the clock K for generating an internal output enable, and a DQC buffer 1490 responsive to the chip select CS and the internal master clock Ki for taking the external DQ control DQC# for generating the internal DQ control DQC. A structure in which, similar to the output enable G#, DQ control DQC# is taken in non-synchronization with the master clock K for generating the internal DQ control may be used as the DQC buffer 1490.

The input/output circuit 1435 includes a Din buffer 1434 having its activation/inactivation controlled in response to an output from DQC buffer 1490, and a gate circuit 1494 receiving the internal DQ control DQC, the internal output enable G and the chip select CS for activating/inactivating the main amplifier circuit 1438. When DQ control DQC attains to 'H", the output enable G attains to 'L" and the chip select CS attains to "L", the gate circuits 1494 renders active the main amplifier circuit 1438. If the chip select CS is at "H", the main amplifier circuit 1438 is set to the output high impedance state. It is also set to the output high impedance state when the DQ control DQC is at "L".

The Din buffer 1434 is rendered active/inactive by the internal DQ control DQC from DQC buffer 1490. Whether the write data is to be generated or not is determined by the internal write designating signal φW. More specifically, when and only when the DQ control DQC is at "H" and the data write designation φW is activated, the Din buffer 1434 generates the internal write data.

Figure 74:
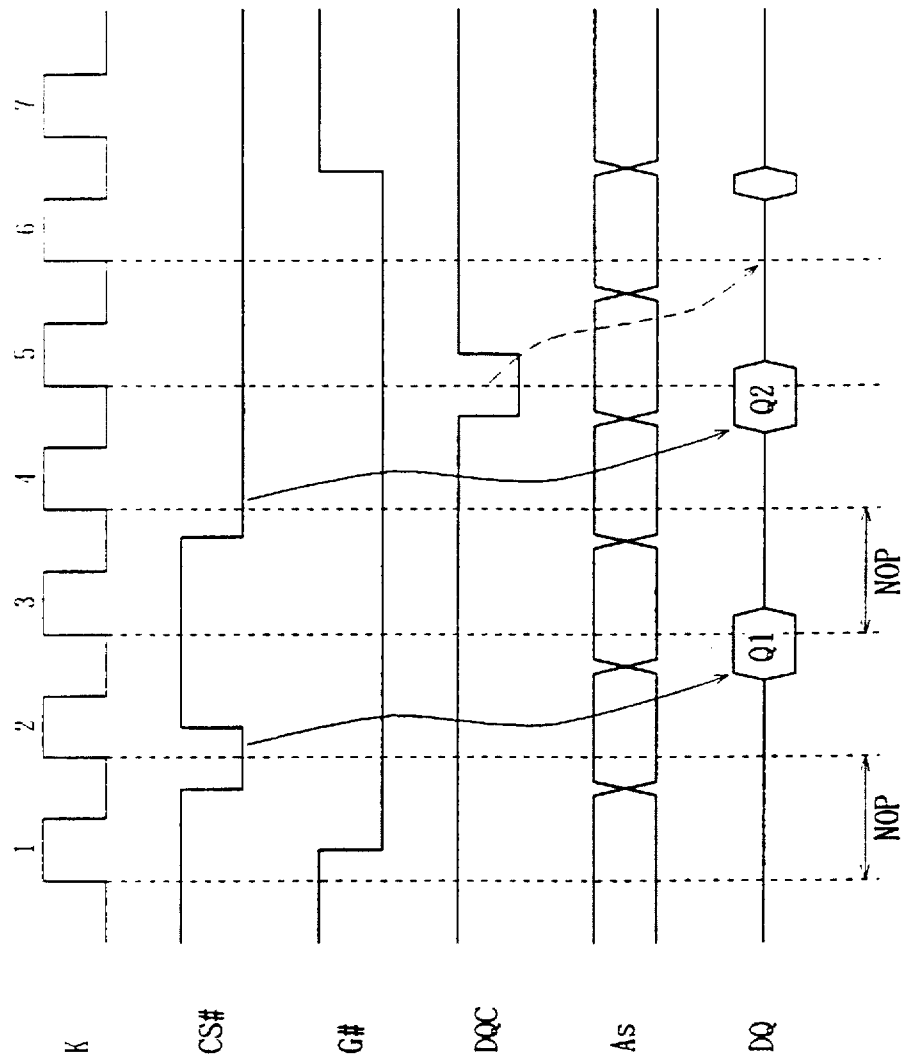
FIG. 74 shows an example of a data output operation sequence of the semiconductor memory device in accordance with another embodiment of the present invention.

FIG. 74 shows a control sequence of the output states by the output enable, the DQ control and the chip select. Referring to FIG. 74, in the first cycle of the master clock K, the chip select CS# is at "H", and the first cycle is the NOP (no operation) cycle. The DRAM control circuit and the SRAM control circuit do not operate, and the output is set to the high impedance state.

In the second cycle of the master clock K, when the chip select CS# falls to "L", the output enable G# is at "L" and the DQ control DQC is at "H", data reading operation is carried out (the operation which is carried out is determined by the combination of the states of other control signals. The operation thereof is not described here but described in detail later), and data Q1 is provided.

In the third cycle of the master clock K, when the chip select CS# again attains to "H", the NOP mode is designated, and the CDRAM does not operate. Therefore, it is again set to the output high impedance state.

In the fourth cycle of the master clock K, when the chip select CS# again attains to "L", data reading operation is carried out in accordance with the address As applied at that time, and read data Q2 is provided.

In the fifth cycle of the master clock K, even when the chip select CS# and the output enable G# are both at "L", the input/output circuit does not operate as the DQ control DQC is at "L", and therefore this cycle is at the output high impedance state.

In the sixth cycle, if the chip select CS# is set to "L", the DQ control DQC is set to "H", and the output enable G# is raised to "H" in this cycle. The output is set to the high impedance state in response to the rise of the output enable G#. In accordance with the timing of rise of the output enable G#, data which is not established or established is output for a short period.

As described above, since the chip select CS# and the DQ control DQC are provided separately, only the data input/output can be controlled by the DQ control DQC while the internal operation is being carried out in the CDRAM, memory extension and bank switching of the cache DRAM can be easily implemented, and the freedom degree of bank structure can be increased. This example will be described.

[The Change of Memory structure by the DQ Control]

FIG. 75 shows an example of a structure of a memory system for a CPU as an external processing unit requiring the data having the width of 32 bits. Referring to FIG. 75, CDRAMs CDR#0 to CDR#7 each effecting input/output of data on 4 bits by 4 bits basis are connected to a 32 bit data bus 1002. The CDRAMs CDR#0 and CDR#1 have their input/output controlled by the DQ control DQC-0. The CDRAMs CDR#2 and CDR#3 have their data input/output controlled by the DQ control DQC-1. The CDRAMs CDR#4 and CDR#5 have their data input/output controlled by the DQ control DQC-2. The CDRAMs CDR#6 and CDR#7 have their data input/output controlled by DQ control DQC-3.

Not only the chip select CS# but other control signals are commonly applied to CDRAMs CDR#0 to CDR#7. In FIG. 75, the chip select CS# only is shown, as a representative. In the memory system shown in FIG. 75, the memory is controlled on the byte by byte basis. This is because the data is configured by 8 bit unit when data includes 32 bits. Therefore, when the DQ control DQC-0 to DQC-3 are activated simultaneously, input/output of data of 32 bits is carried out, and if one DQ control DQC-i is activated, data of 8 bits can be obtained. Therefore, data including 8 bits, data including 16 bits and data including 32 bits can be easily provided as outputs. In this case, the chip select CS# is commonly applied to all the CDRAMs CDR#0 to CDR#7, and operations are carried out therein. Therefore, data input/output can be carried out at high speed by controlling only the DQ control DQC-0 to DQC-3. This structure enables easy change of the memory system structure when the data bus has 16 bits, 32 bits or further 64 bits.

Generally, when the width of the data bus is fixed, a bank structure is frequently used to increase the memory capacity. The switching of the bank structures can be readily carried out. The bank switching using the DQ control will be described in the following.

Figure 76:
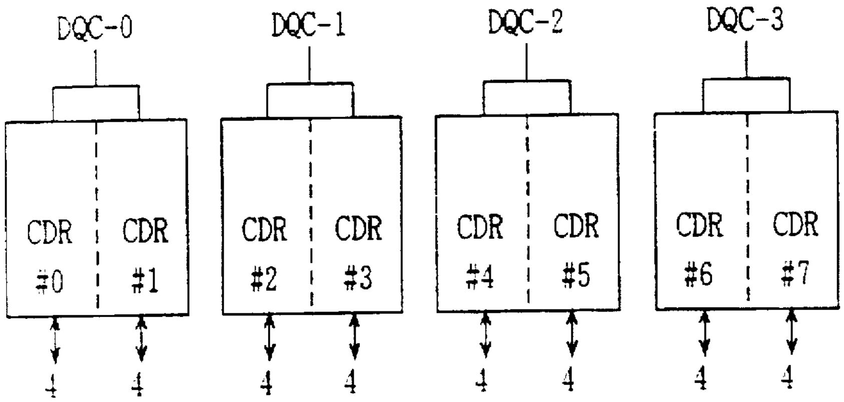
FIG. 76 shows advantages of the DQ control used in the semiconductor memory device in accordance with another embodiment of the present invention.
Figure 77:
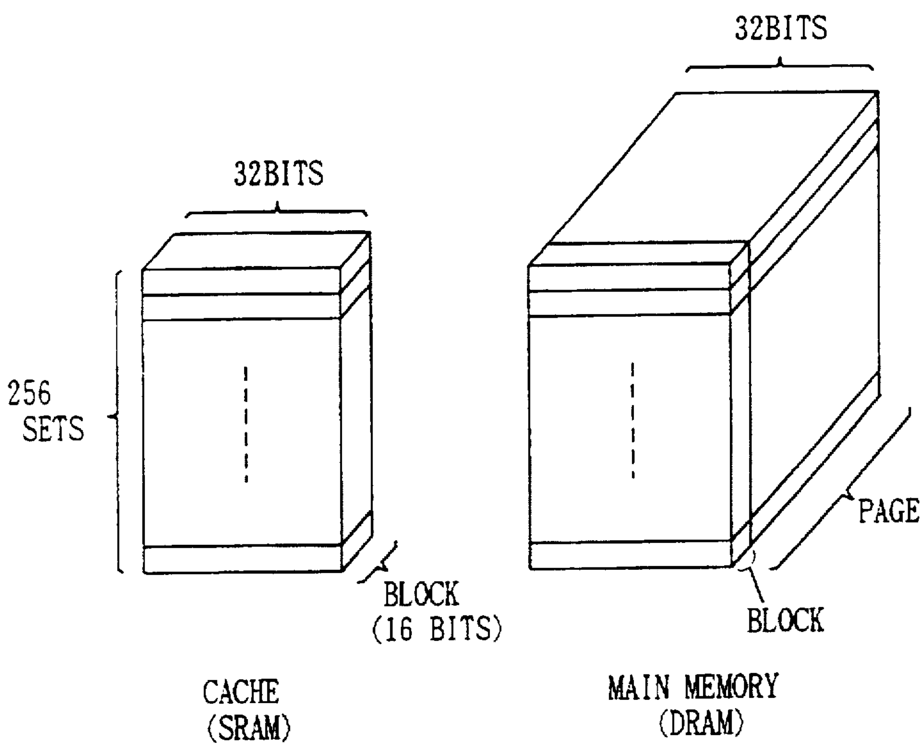
FIG. 77 shows correspondence between the cache and the main memory of the memory system shown in FIG. 76.

Now, referring to FIG. 76, assume that a memory system is formed by using 8 CDRAMs each of 4M×4 bits, or each having four memory planes each of the storage capacity of 4 megabits. As in the case of FIG. 75, two CDRAMs constitute one set, and input/output control is carried out on byte by byte basis.

In this case, shown in FIG. 75, 256 sets are stored in the cache (SRAM), each set including a block of 32 bits ×16 bits, as one CDRAM has a×4 bit structure, leading to, in total, 4 (bits)×8 (CDRAMs)=32 bits, and 16 bits of memory cells are connected to one row of the SRAM array. In this case, as for the structure of the main memory (DRAM array), blocks (16 bits) having the width of 32 bits are arranged for 1 page. The number of pages is 4K pages, as it correspond to the number of word lines. 1 page includes 64 blocks. Assume that a memory system having the double memory capacity, that is, 32 megabits is provided by using the memory system having the above described structure.

FIG. 78 shows an example of the memory system architecture. Referring to FIG. 78, CDRAMs CDR#0 to CDR#7 are selected by the chip select CS#0, and CDRAMs CDR#8 to CDR#15 are selected by the chip select CS#. Data input/output of CDRAMs CDR#0, CDR#1, CDR#8 and CDR#9 is controlled by the same DQ control DQC-0. Similarly, common DQ control DQC is applied to the CDRAMs arranged in the vertical direction of the drawing.

In the memory system architecture of FIG. 78, the CDRAMs CDR#0 to CDR#7 or CDRAMs CDR#8 to CDR#15 are selected and operate. Therefore, of the 16 CDRAMs, that is, CDRAMs CDR#0 to CDR#15, those which are operating are constantly 8 in number, which are one half of the whole CDRAMs provided in the memory system, and therefore power consumption can be reduced.

However, as shown in FIG. 79, while the number of sets of the cache is increased, the block size is not changed. More specifically, as shown in FIG. 79, the cache CAC#1 can carry out data transfer with the main memory MEM#1, and the cache CAC#2 can carry out data transfer with the main memory MEM#2 only. The reason for this is that the data transfer can be carried out only between the corresponding cache and the main memory.

Figure 80:
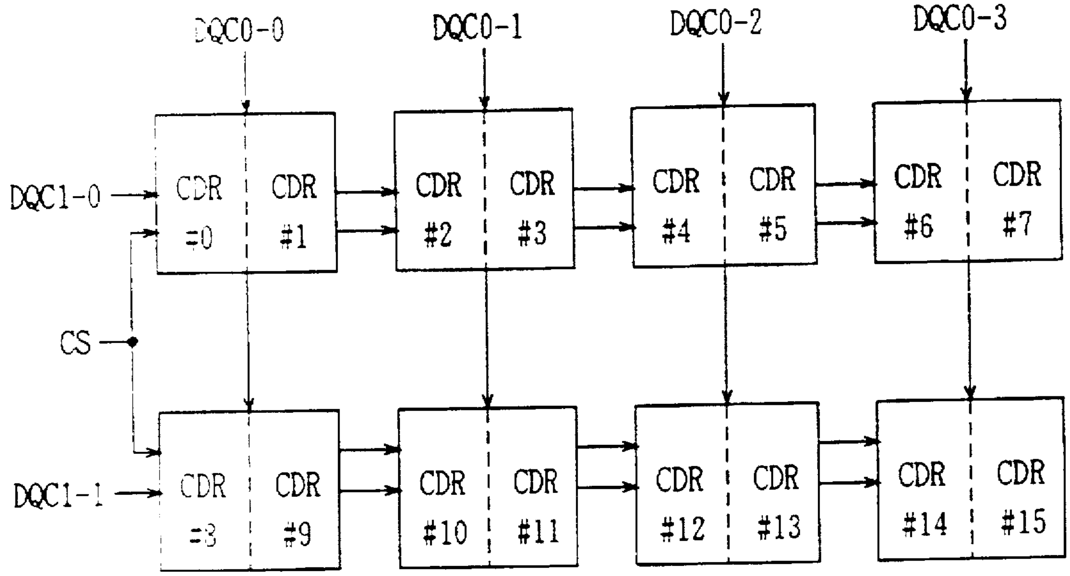
FIG. 80 shows another example of the structure of the memory system in the semiconductor memory device in accordance with another embodiment of the present invention.
Figure 81:
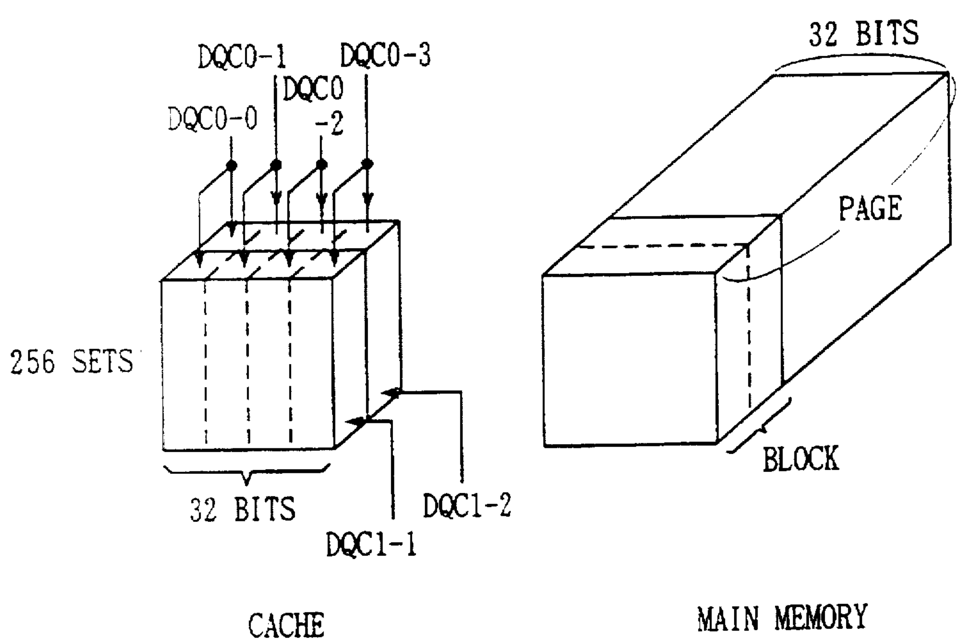
FIG. 81 shows correspondence between the cache and the main memory of the memory system shown in FIG. 80.

FIG. 80 shows another example of the memory system utilizing the DQ control. Referring to FIG. 80, the memory system includes 16 CDRAMs CDR#0 to CDR#15. In the memory system shown in FIG. 80, two types of DQ control DQC, that is, DQ0 and DQ1 are used. When these two DQ control DQC0 and DQC1 both are activated, the corresponding CDRAM is set to the input/output activated state. For the CDRAMs CDR#0 to CDR#7, the second DQ control DQC1-0 is commonly applied. For the CDRAMs CDR#8 to CDR#15, a second DQ control DQC1-1 is commonly applied.

For the CDRAMs CDR#0, CDR#1, CDR#8 and CDR#9, the first DQ control DQC0-0 is applied. For the CDRAMs CDR#2, CDR#3, CDR#10 and CDR#11, the first DQ control DQC0-1 is applied. Similarly, for the CDRAMs CDR#4, CDR#5, CDR#12 and CDR#13, the DQ control DQC0-2 is applied, and for the CDRAMs CDR#6, CDR#7, CDR#14 and CDR#15, the DQ control DQC0-3 is applied.

For the CDRAMs CDR#0 to CDR#15, the chip select CS# is applied commonly. Similarly, other control clocks are commonly applied to the CDRAMs CDR#0 to CDR#15 (not shown).

In the structure of the memory system shown in FIG. 80, activation/inactivation (selection/non-selection) of the CDRAMs CDR#0 to CDR#15 is commonly controlled by the chip select CS#. What is controlled by the DQ controls DQC0 and DQC is data input/output. When the chip select CS is activated, driving of the DRAM array, driving of the SRAM array and the internal data transfer are commonly carried out in the CDRAMs CDR#0 to CDR#15. Therefore, in this case, the block size of the cache is doubled that of the structure shown in FIG. 79. Half area of the doubled cache block is controlled by the second DQ control DQC1 (DQC1-0 and DQC1-1).

Since the data input/output only is controlled by DQ control as shown in FIGS. 78 to 81, the output high impedance state can be realized while the CDRAM is internally operated at the time of bank switching, and input of data can be inhibited, so that erroneous data input/output at the time of bank switching can be prevented.

When the bank switching is carried out by using two types of DQ controls as shown in FIG. 80, only the data input/output is controlled by the DQ control and internal operation of the CDRAM is carried out. Therefore, data input/output can be effected faster at the time of bank switching.

Figure 82:
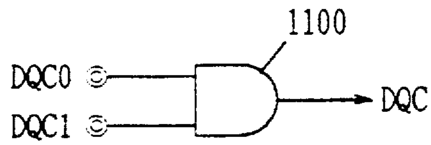
FIG. 82 shows a structure for generating the DQ control when the memory system shown in FIG. 80 is formed.

FIG. 82 shows a structure for realizing the memory system shown in FIG. 80. Referring to FIG. 82, a gate circuit 1100 receiving the first DQ control DQC0 and a second DQ control DQC1 is provided. The gate circuit 1100 may be provided in the succeeding stage of the DQC buffer in the structure of FIG. 73 or it may be provided in the preceding stage of the DQC buffer. When the first and second DQ controls DQC0 and DQC1 both attain to the active state "H", gate circuit 1100 renders active the DQ control DQC and applies it to the gate circuit 1494 shown in FIG. 73 and to the Din buffer 1494. By using the gate circuit shown in FIG. 82, switching of the buffer and the increase of memories can be easily realized.

[The General Functional Structure]

Figure 83:
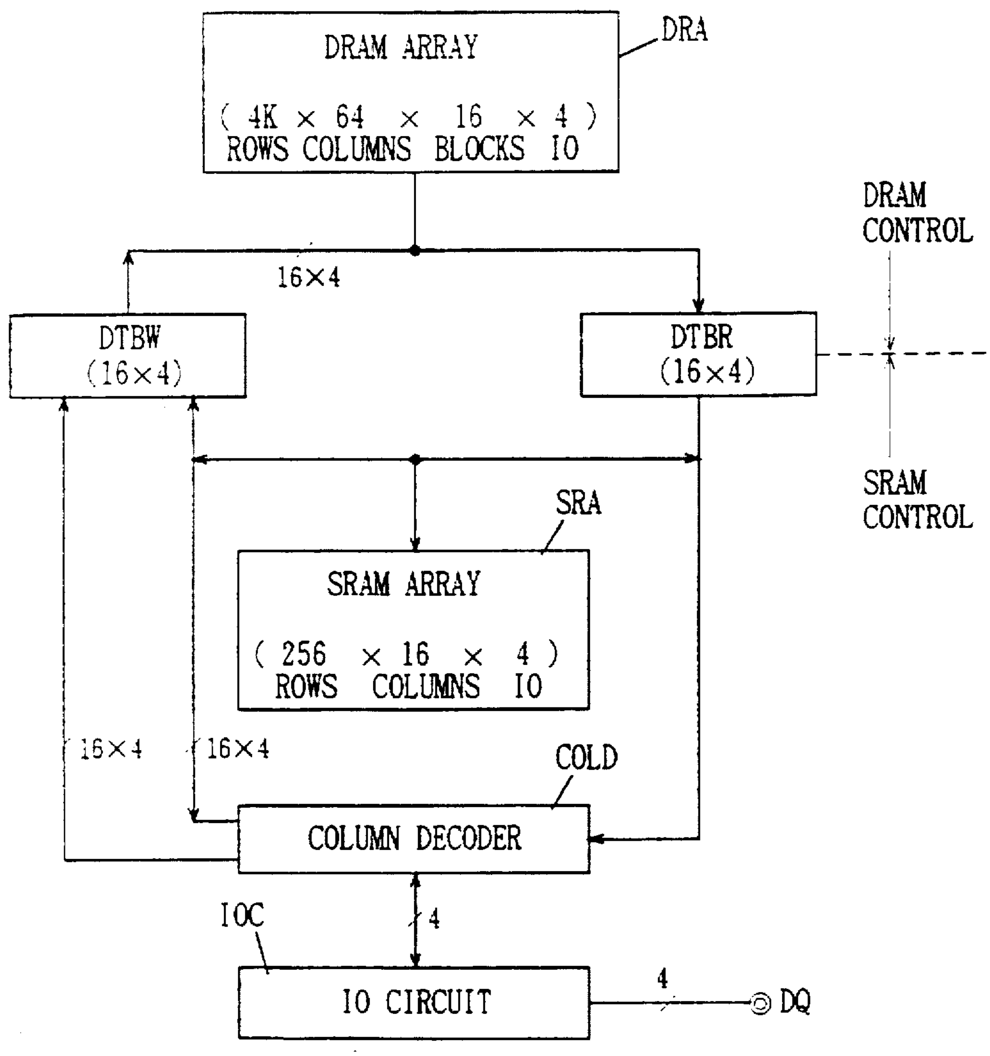
FIG. 83 shows functional structure of the semiconductor memory device in accordance with another embodiment of the present invention.

FIG. 83 shows the functional structure of the CDRAM in accordance with the second embodiment. Referring to FIG. 83, the DRAM array DRA includes the storage capacity of 4K rows×64 columns×16 blocks×4 (IO). In one block, 64 columns of DRAM bit line pairs are arranged, and one column is selected in one block.

The SRAM array SRA includes the storage capacity of 256 rows×16 columns×4 (IO). One row is selected in the SRAM array, and data transfer can be carried out between the selected one row of 16 bits, and 16 bits (1 bit from each block) selected in the DRAM array.

The column decoder COLD selects 4 bits from the read data transfer buffer DTBR (16 bits×4 (IO)), and transmits the read data to the data input/output pin DQ through the IO circuit IOC. The column decoder COLD further transmits the 4 bits of data applied from the IO circuit IOC to the corresponding 4 bits of the write data transfer buffer DTBW (16 bits×4 (IO)). The column decoder COLD further writes 4 bits of data from the IO circuit IOC to 4 bits of memory cells of the SRAM array SRA at the time of data writing. Further, as will be described later, the column decoder COLD has a function of transferring 16×4 bits of data stored in the read data transfer buffer DTBR to the write data transfer buffer DTBW (the structure will be described later). The DRAM control circuit 128 (see FIG. 70) controls data transfer from the DRAM array DRA to the read data transfer buffer DTBR and the data transfer operation from the write data transfer buffer DTBW to the DRAM array DRA. An operation mode in which at the time of data transfer from the write data transfer buffer DTBW to the DRAM array, data is simultaneously transferred to the read data transfer buffer DTBR is newly provided, as will be described later, and this data transfer is also controlled by the DRAM control circuit 128.

SRAM control circuit 1432 (see FIG. 70) controls data reading from the SRAM array SRA to the data input/output terminal DQ, data writing from the data input/output terminal DQ to the SRAM array SRA, data transfer from the read data transfer buffer DTBR to the SRAM array SRA, data transfer from the SRAM array SRAM to the write data transfer buffer DTBW, data writing from the input/output terminal DQ to the write data transfer buffer DTBW, data reading from the read data transfer buffer DTBR to the input/output terminal DQ, data writing from the data input/output terminal DQ to the SRAM array SRA and to the write data transfer buffer DTBW, and reading data from the read data transfer buffer DTBR to the data input/output terminal DQ as well as the data transfer to the SRAM array SRA.

FIG. 84 shows a more specific structure of the data transfer portion. Referring to FIG. 84, portions related to a pair of global IO lines GIO and a pair of SRAM bit lines SBL are shown. The Din buffer 1634 and a main amplifier 1638 carries out input/output of 1 bit of data.

Referring to FIG. 84, a path for data transfer to the DRAM array includes a write data transfer circuit 1620 including a write data transfer buffer for latching and transferring data to be transferred to the DRAM array and a mask register for masking this transfer operation; and a selector 1615 for selecting either the write data from the Din buffer 1634 or the data from the first sense amplifier 1612, which will be described later, in accordance with the operation mode for applying the selected data to the write data transfer circuit 1620.

Selector 1615 is activated in response to the signal $\phi$BW in the buffer write mode (an operation mode in which external write data is written to the write data transfer circuit 1620), and in response to the selection signal from the column decoder 1616, transmits the write data from the Din buffer 1634 to the write data transfer circuit 1620.

In the data transfer operation from the SRAM array to the write data transfer buffer or in the operation mode for storing data from the read data transfer buffer DTBR, which will be described later, selector 1615 transmits the applied to the write data transfer circuit 1620 in response to the signal $\phi$DW. Write data transfer circuit 1620 latches the applied data in response to the signals $\phi$DW and $\phi$BW, and transmits the applied data to the global IO line pair GIO in response to the transfer designating signal $\phi$DWT.

The path for transferring data from the DRAM array includes a read data transfer circuit 1610 for latching and outputting the data on the global IO line pair GIO, and a SBL drive circuit 1611 receiving the data from the read data transfer circuit 1610 for transmitting the same to the SRAM bit line pair SBL in response to the signal $\phi$BR. Read data transfer circuit 1610 latches and then transfers the data applied, in response to the signal $\phi$BR. Therefore, the signal $\phi$DR includes the latch designating signal and the transfer designating signal, and the latching operation is carried out under the control of the DRAM control circuit while the transfer designating signal is generated under the control of the SRAM control circuit. In FIG. 84, both signals, that is, latch designation and transfer designation are generically referred to as one control signal $\phi$DR.

The path for reading data includes a selector 1613 for selecting either data from the read data transfer circuit 1610 or the data on the SRAM bit line pair SBL, a first sense amplifier 1612 for amplifying the data from selector 1613, and a second sense amplifier 1614 for further amplifying the output from sense amplifier 1612. The second sense amplifier 1614 is activated only when a selection signal from the column decoder 1616 is applied, and carries out the amplifying operation. In the nonselected state, the output of the amplifier 1614 is at the high impedance state. When data is applied from the selector 1613, the first sense amplifier 1612 always carries out the amplifying operation.

Selector 1613 selects the data on the SRAM bit line SBL in response to the signal φBWT in the buffer write transfer mode (data transfer operation from the SRAM array to the write data transfer circuit 1624). Selector 1613 selects data from the read data transfer circuit 1610 in response to the signal φDX in the buffer read mode (for reading data stored in the read data transfer circuit 1610 (DTBR) to the outside of the device) and in the second transfer mode (an operation mode for transferring data stored in the read data transfer circuit 1610 to the write data transfer circuit 1620, which will be described later).

In the SRAM read mode for reading data on the SRAM bit line SBL, selector 1613 selects the data on the SRAM bit line SBL in response to the signal φR.

Write drive circuit 1618 amplifies and transmits the applied write data from the Din buffer 1634 to the SRAM bit line pair SBL, in response to the output from column decoder 1616. The column decoder 1616 is activated when 1 bit is selected from the column block (a block of memory cells of 16 bits selected simultaneously, which is the column block selected by the column block decoder shown In FIG. 70.

In FIG. 84, the write drive 1618 and the second sense amplifier 1614 are both driven by the output from column decoder 1616. The write drive circuit 1618 is rendered operable in the operation mode for writing data to the SRAM array, while the second sense amplifier 1614 is rendered operable in the data reading operation. Whether or not these are actually activated in respective operation mode is determined by the output of column decoder 1616. The operation of the CDRAM in the second embodiment will be described.

FIG. 85 shows, in a table, states of external control signals for realizing operations to which the SRAM control circuit of the CDRAM of the second embodiment are related, and the operations realized at that time. The realized operations are the same as those of the first embodiment. The difference is that in the second embodiment external control clocks CC0# and CC1# are used and that the logic of the clock mask CMs# is inverted, so that the SRAM power down mode and the data suspended state (continuous input/output of the same data) are carried out in the next cycle when the mask CMs is "L".

An additional difference is that the chip select CS# and the DQ control DQC are added. When the chip select CS# is at "H", the output is set to the high impedance (Hi-Z) state, and both the DRAM portion and the SRAM portion of the CDRAM are inoperable.

When the SRAM clock mask CMs# is at "L", "SRAM power down mode" is designated, transmission of clock is inhibited, and internal cycle state is maintained, resulting in the data suspended state.

When chip select CS# is at "L" and the SRAM clock mask CMs# is at "H", the CDRAM is at a selected state, and the master clock is applied to the SRAM control circuit. In the following description, it is assumed that the chip select CS# and the clock mask CMs# are at "L" and "H", respectively.

When the control clocks CC0# and CC1# are both "H", "deselect SRAM mode" is designated, and the output is set to the high impedance state. Internal operation is being carried out. In this case, the DQ control DQC may be at any state.

[Specific Operation Modes]

[SRAM Read]

When the control clock CC1# is set to "L" and control clock CC0# and the write enable WE# are set to "H", the SRAM read mode is designated. Data is selected in the SRAM array. At this time, when DQ control DQC is set to "H", data read from the SRAM array is provided as output.

Figure 86:
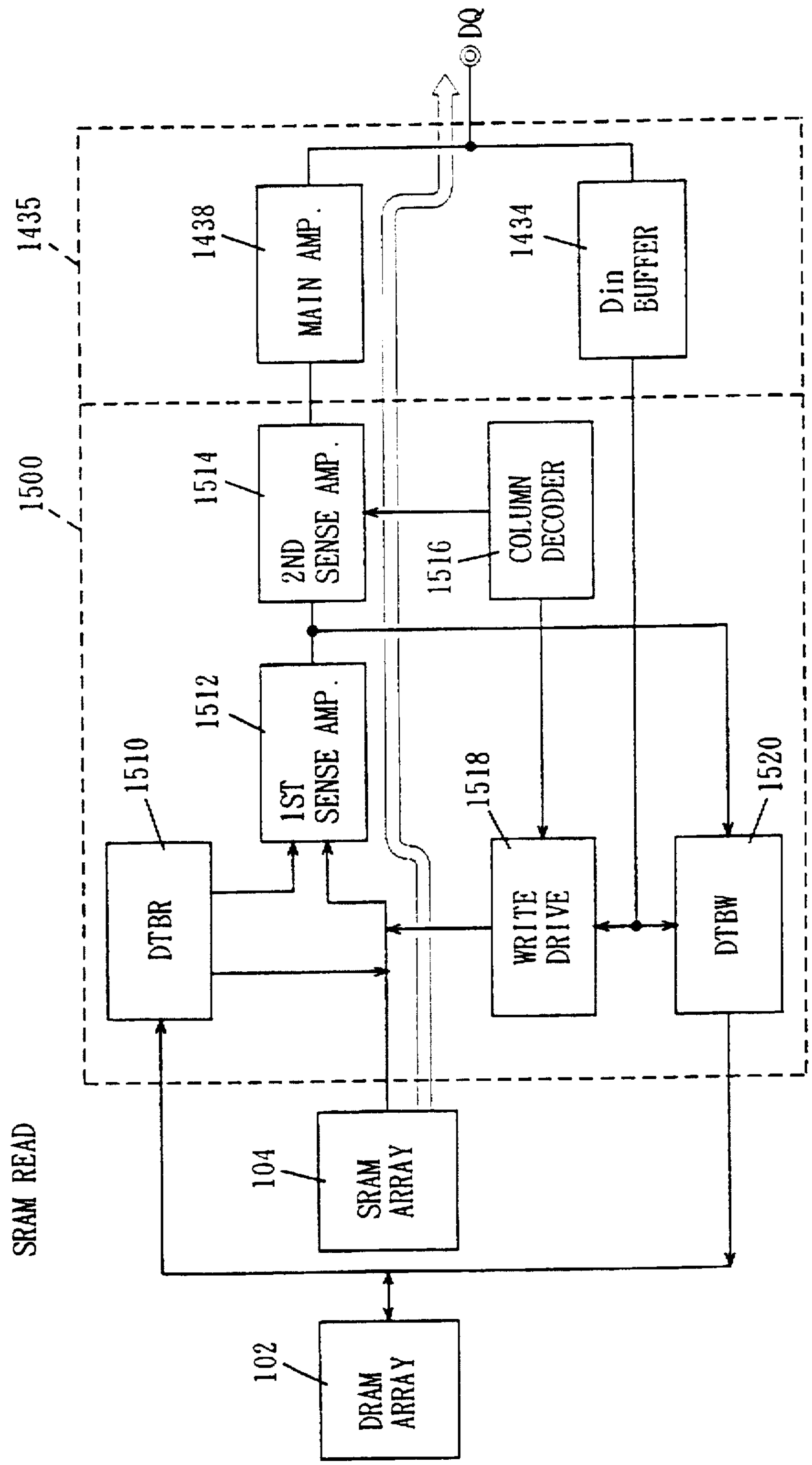
FIG. 86 shows the flow of data in the SRAM read mode operation.

FIG. 86 shows the flow of data in the SRAM read mode operation. Referring to FIG. 86, in the SRAM read mode operation, a row is selected in the SRAM array 104, the data of the memory cells connected to this row are amplified by the first sense amplifier 1512 and then transmitted to the second sense amplifier 1514. The column decoder 1516 selects one of the 16 bits (when there are 4 IOs), and activates the corresponding second sense amplifier 1514. The selected 4 bits (when the IO has 4 bit structure: the same applies to the following description) are amplified by the second sense amplifier 1514 and transmitted to the main amplifier circuit 1438. When the DQ control DQC is at "H", the main amplifier circuit 1438 is activated, and the read data are transmitted to the input/output terminal DQ (FIG. 86 shows a state in which the common DQ arrangement is selected as the data input/output structure. The same applies to the following description).

If the DQ control DQC is at "L" in this state, the main amplifier circuit 1438 does not operate and it is similar to the deselect SRAM mode.

[SRAM Write Mode]

When the control clock CC0# is set to "H" and the control clock CC1# and the write enable WE# are set to "L", "SRAM write Model", is designated. When the DQ control DQC is at "H", the external data applied at that time is taken and internal write data is generated. The generated internal write data is written to the selected memory cells in accordance with the SRAM address bits As0 to As11 applied at that time.

Figure 87:
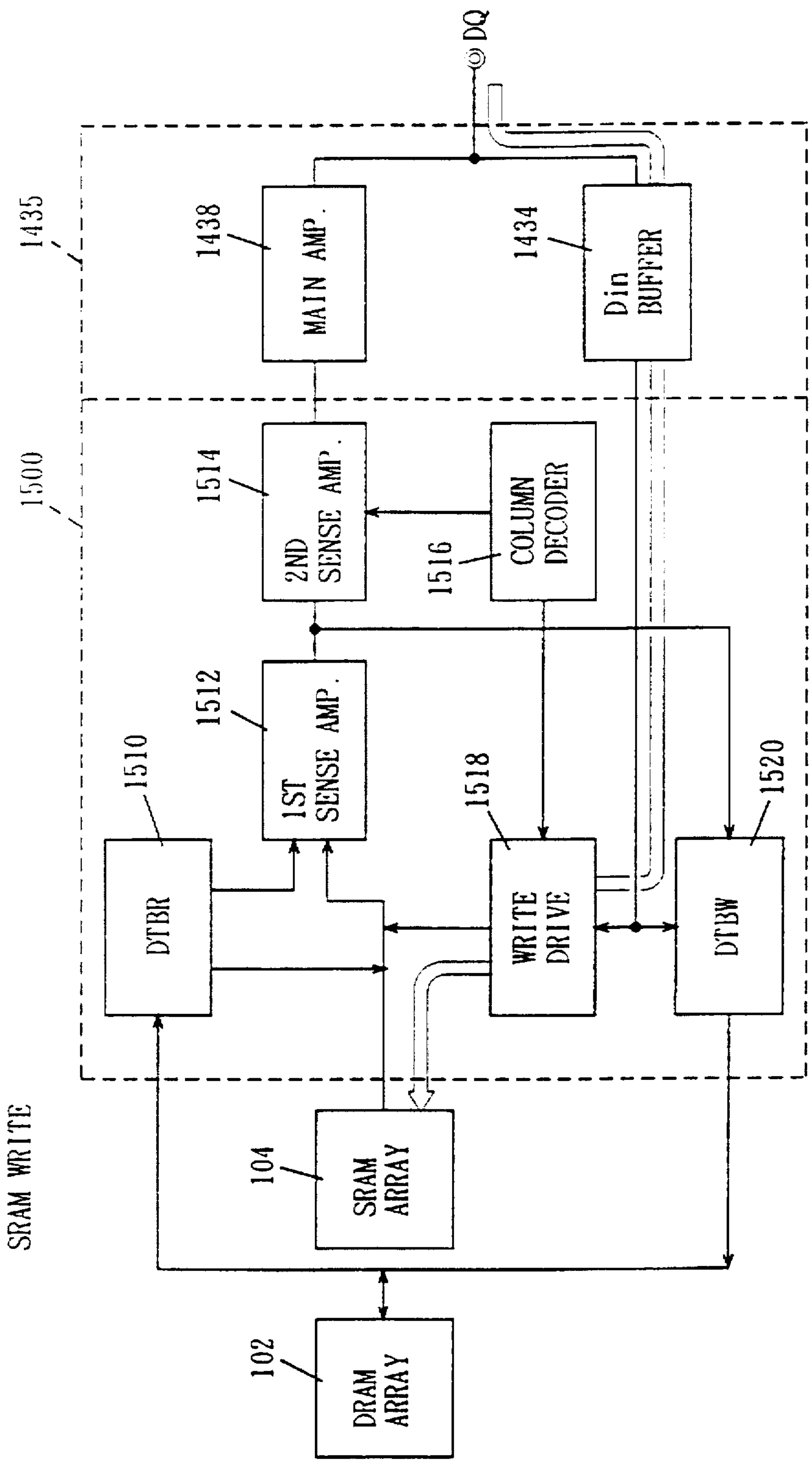
FIG. 87 shows the flow of data in the SRAM write mode operation.

Referring to FIG. 87, the data applied to the DQ output terminal in the SRAM write mode operation is applied through the Din buffer 1434 to the write drive circuit 1518. The write drive circuit 1518 writes in response to the column selecting signal from column decoder 1516, the applied data to the corresponding memory cell of the SRAM array 104.

[Buffer Read Transfer Mode]

When the control clock CC0# and DQ control DQC are both set to "L" and control clock CC1# and the write enable WE# are set to "H", the buffer read transfer mode is designated. The DQ control DQC set to "L" so as to realize the output high impedance state is to prevent erroneous output of the data transferred from the read transfer buffer circuit.

As for the data, the data which has been latched in the read data transfer buffer (DTBR) is transferred at the same time to the SRAM array. In that case, SRAM address bits As4 to As11 are used as the SRAM row address, and the row selecting operation is carried out.

As shown in FIG. 88, in the buffer read transfer mode operation, 16 bits of data of the read data transfer buffer circuit (DTBR) are transmitted at the same time to the selected row of the SRAM array 104. In FIG. 85, the indication "used" means that the data latched therein is used. The indication "load/use" means that the data is latched and used.

[Buffer Write Transfer Mode]

When the control clock CC1# is set to "H" and the control clock CC0#, the write enable WE# and the DQ control DQC are set to "L", the buffer write transfer mode is designated. In this case, data is transmitted from the SRAM array to the read data transfer buffer circuit. As will be described in detail later, the write data transfer buffer circuit and the mask register circuit both include a temporary latch circuit and has a two-stage latch circuit structure. In the buffer write transfer mode, data from the SRAM array is stored in the temporary latch included in the write data transfer buffer circuit. Similarly, in the mask register circuit, mask data of the temporary mask register are all reset. The SRAM address bits As4 to As11 are taken as the SRAM row address, row selecting operation in the SRAM array is carried out, and the data of memory cells of selected row are transferred to the write data transfer buffer circuit.

Figure 89:
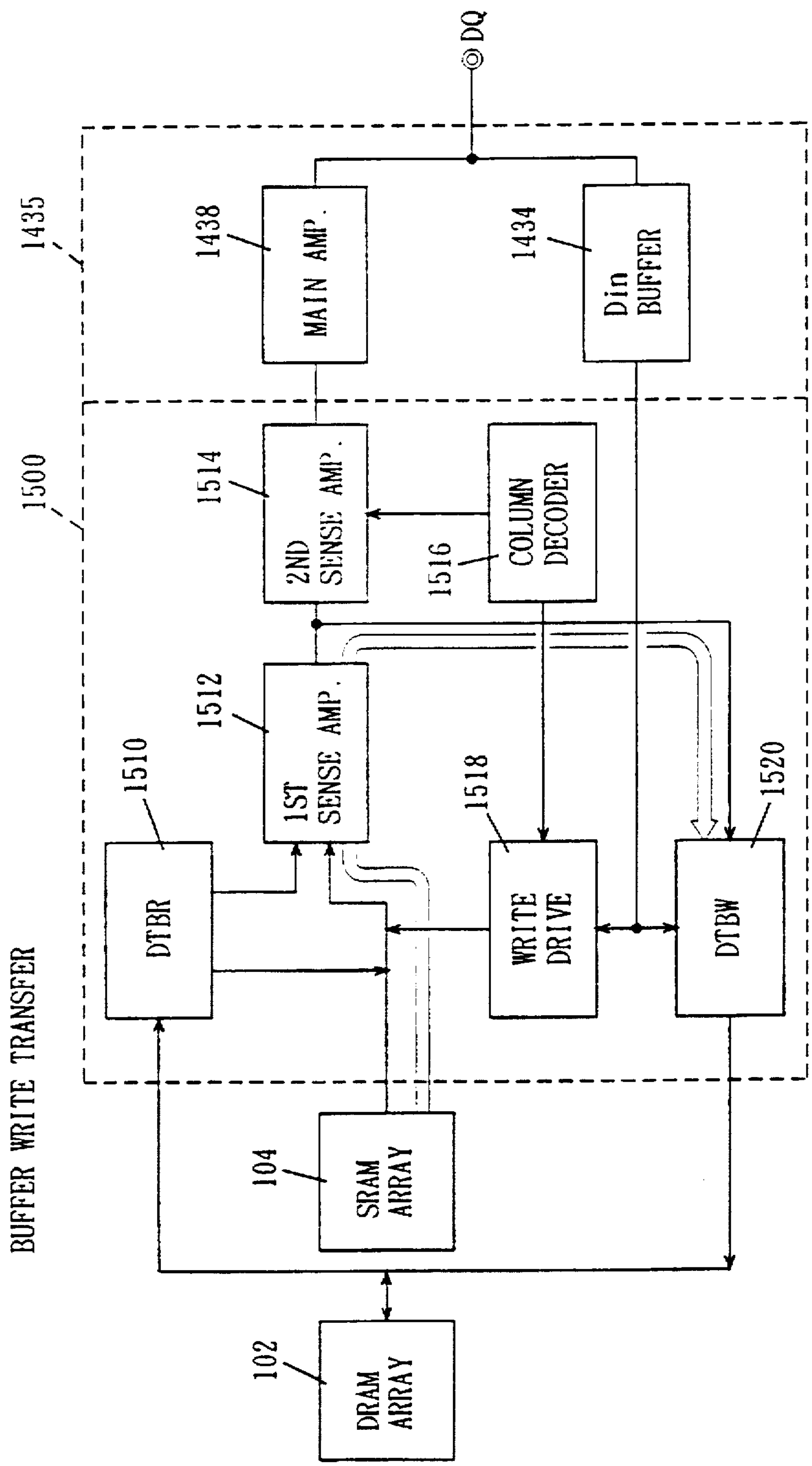
FIG. 89 shows the flow of data in the buffer write transfer mode operation.

As shown in FIG. 89, in the buffer write transfer mode operation, the data of the memory cells connected to the selected row of the SRAM array 104 are amplified by the first sense amplifier 1512 and then stored in the write data transfer buffer circuit 1520 (more particularly, in the temporary register included therein).

[Buffer Read Transfer and Read Mode]

When control clock CC0# is set to "L" and the control clock CC1#, the write enable WE# and the DQ control DQC are set to "H", the buffer read transfer and read mode is designated. In this case, data which have been stored in the read data transfer buffer are transferred to the SRAM array, and data are externally transmitted. In this case, SRAM address bits As0 to As11 are all used. As is apparent from FIG. 85, the buffer read transfer mode is the same as the buffer read transfer and read mode except that the state of the DQ control DQC is different. At this time, not only the input/output circuit but also activation/inactivation of the column decoder may be controlled by the DQ control DQC.

Figure 90:
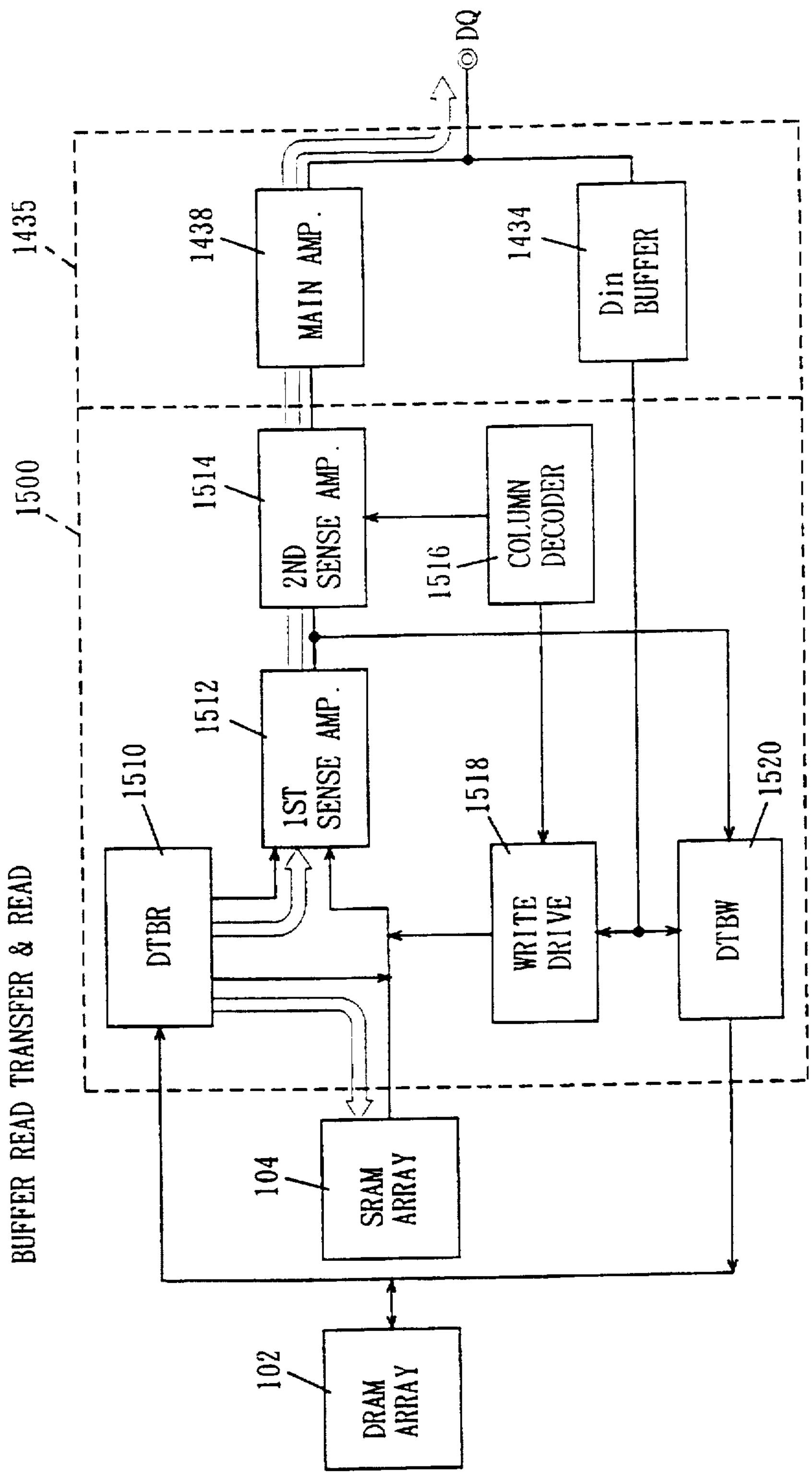
FIG. 90 shows the flow of data in the buffer read transfer and read mode operation.

As shown in FIG. 90, in the buffer read transfer and read mode operation, 16 bits of data are transmitted from the read data transfer buffer circuit 1510 to the selected row of the SRAM array 104, and 1 bit of data (more exactly, 4 bits, as there are 4 IOs) selected by column decoder 1516 is transmitted to data input/output terminal DQ through the first and second sense amplifiers 1512 and 1514.

[Buffer Write Transfer and Write Mode]

When the control clock CC0# and the write enable WE# are set to "L" and the control clock CC1# and the DQ control DQC are set to "H", the buffer write transfer and write mode is designated. In this mode, externally applied write data is written to corresponding memory cell of the SRAM array, and the written data is also written to the corresponding register included in the write data transfer buffer circuit. In this case also, in the write data transfer buffer circuit, data of a row to which the memory cells subjected to this data writing are connected are transferred to the temporary register. At that time, mask data of the mask register are all reset.

More specifically, referring to FIG. 91, data which has been applied to data input terminal DQ is applied to Din buffer 1434 to write drive circuit 1518, the write drive circuit 1518 is activated in accordance with a column selecting signal from column decoder 1516, and it writes the data to a corresponding memory cell of the SRAM array. Data of one row of memory cells of the selected row including that memory cell which has been subjected to data writing are transmitted to write data transfer buffer circuit 1520 through the first sense amplifier 1512. FIG. 91 shows the write data as written through write drive circuit 1518 to the corresponding memory cell of the SRAM array and then data of one row of memory cells are transmitted through the first sense amplifier 1512 to the write data transfer buffer circuit 1520.

However, parallel to the data writing to the memory cell of the SRAM array 104 by the write drive circuit 1518, the data of the memory cells of the selected row in the SRAM array 104 may be transferred to the write data transfer buffer circuit 1520 through the first sense amplifier 1520, and in this write data transfer buffer circuit 1520, data writing to the corresponding register may be carried out at the same timing as the write drive circuit 1518.

In this structure, the column decoder 1516 is shown to drive the write drive circuit 1518 and the second sense amplifier 1514 only. However, column decoder 1516 also has a function of selecting registers included in the latch data transfer buffer circuit 1520.

In the buffer write transfer and write mode operation, only the buffer write transfer operation is carried out if the DQ control DQC is set to "L".

[Buffer Read Mode]

When the control clocks CC0# and CC1# are both set to "L" and the write enable WE# and DQ control DQC are set to "H", the buffer read mode is designated. In the buffer read mode operation, data are selected in the read data transfer buffer circuit in accordance with the SRAM address bits (block address) As0 to As3, and the selected data are provided. In this case, when DQ control DQC is set to "L", data reading is not carried out and the deselect SRAM mode operation is carried out.

Figure 92:
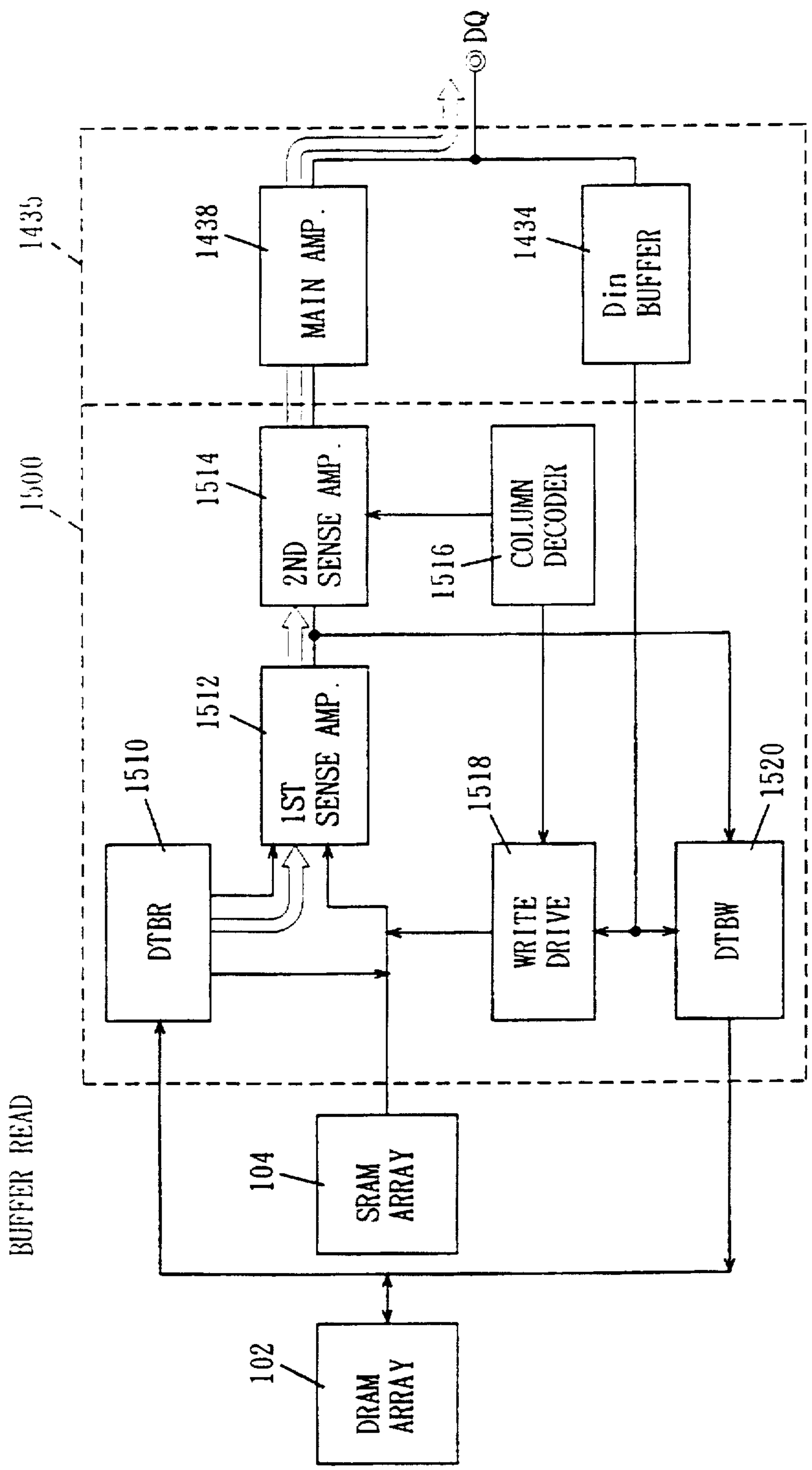
FIG. 92 shows the flow of data in the buffer read mode operation.

In the buffer read mode operation, data from the read data transfer buffer circuit 1510 is amplified by the first sense amplifier 1512, and then a corresponding second sense amplifier only is activated in accordance with the column selecting signal from column decoder 1516, the output of the activated second sense amplifier is transmitted to the main amplifier circuit 1438, and then read data is transmitted from the main amplifier circuit 1438 to data input/output terminal DQ, as shown in FIG. 92.

[Buffer Write Mode]

When the control clocks CC0# and CC1# and the write enable WE# are set to "L" and the DQ control DQC is set to "H", the buffer write mode is designated. In this case, corresponding registers are selected in the write data transfer buffer circuit in accordance with the block address bits As0 to As3, and an external data is written to the selected register. In this case, in the write data transfer buffer circuit, only the mask data which corresponds to the register subjected to data writing is re-set.

Figure 93:
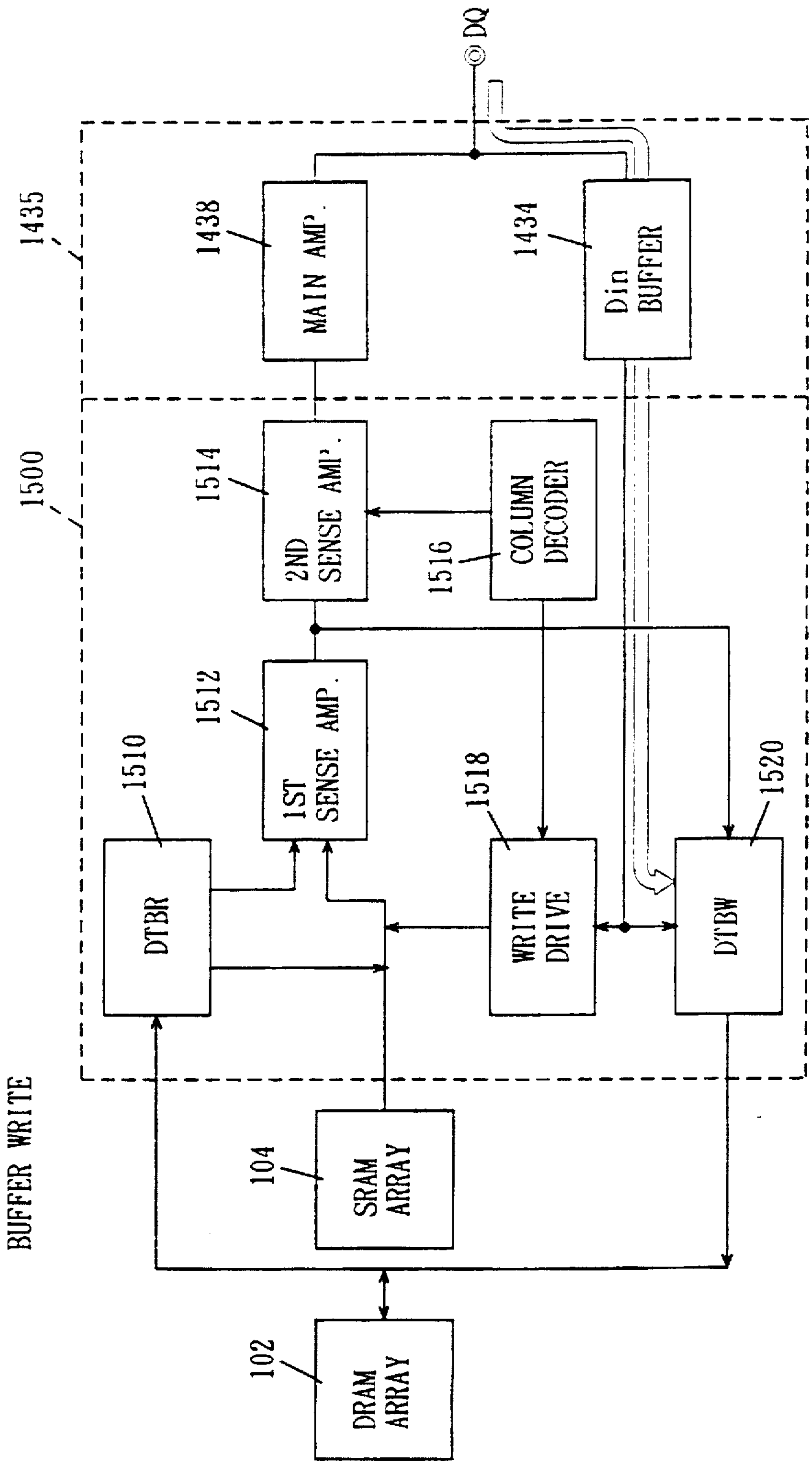
FIG. 93 shows the flow of data in the buffer write mode operation.

More specifically as shown in FIG. 93, in the buffer write mode operation, by a column selecting signal from column decoder 1516, (the path of which is not shown), a corresponding register is selected in the write data transfer buffer circuit 1520, and write data from Din buffer 1434 is written to the selected register.

In the table of FIG. 85, the control signals related to the operation of the DRAM array and the state of the DRAM address thereof are not shown. The SRAM array and the DRAM array are driven independent from each other. Therefore, in the table of FIG. 85, the states of control signals related to the operation of the DRAM and the state of the SRAM addresses are set arbitrarily.

FIG. 94 shows, in a table, operation modes of the DRAM array, states of control signals and the states of data transfer buffers at that time. Referring to FIG. 94, the operation of the DRAM array portion is not related to the operation of the SRAM portion and not related to data input/output. Therefore, the states of control signals CC0#, CC1#, WE# and DQC related to the SRAM may be at any state. Therefore, the states of these control signals are not shown..

[DRAM Power Down Mode]

If the DRAM clock mask CMd# is at "L" in the previous cycle, the DRAM array enters the DRAM power down mode, and maintains the state which has been designated in the previous cycle. The chip select CS# is used for preventing the SRAM portion and the DRAM portion from entering a new operation state.

In the first embodiment, the chip enable E# is applied only to the SRAM control portion, and not used in the DRAM portion. In the second embodiment, the chip select CS# is also applied to the DRAM control portion. When the chip select CS# is set to the inactive state "H", the DRAM enters the no operation (NOP) mode, in which no operation is carried out. Therefore, in the structure shown in FIG. 71, the internal chip select CS applied to the input ENA of the control circuit 1452 resets the control circuit 1452 and it is used for controlling the operable/inoperable state thereof.

A structure may be used in which the chip select CS# is applied to the K buffer 1424 (see FIG. 74) and if the chip select CS# is at "H", the master clock K may not be applied to the DRAM control circuit 128 and the SRAM control circuits 1432. In the control circuit, when the chip select CS is at "H", taking of a new control signal is inhibited.

[DRAM No Operation Mode]

When the chip select CS# is at "L" (in the following description of operations, it is assumed that this condition is satisfied), and the clock mask CMd# is at "H" in the previous cycle (this condition is the same for the following description) and the row address strobe RAS# and the column address strobe CAS# are both at "H", the no operation mode of the DRAM (DNOP Mode) is designated. In this case, in the DRAM array, the state of the previous cycle is maintained and the new operation is not carried out. This mode is used for preventing the DRAM portion from entering a new operation mode. If a certain operation mode has been designated in the previous cycle and the DRAM no operation mode is designated, the operation designated in the previous cycle is carried out internally at that state.

[DRAM Read Transfer Mode]

When the row address strobe RAS# and the data transfer designation DTD# are both set to "H" and the column address strobe CAS# is set to "L", the DRAM read transfer mode is designated. In the DRAM read transfer mode, in the DRAM array, address bits Ad4 to Ad9 are used as the column block address and a memory cell block (column block) is selected by the block decoder 112 shown in FIG. 70, and the data of the selected column block (memory cell block) is transferred to the read data transfer buffer circuit.

Figure 95:
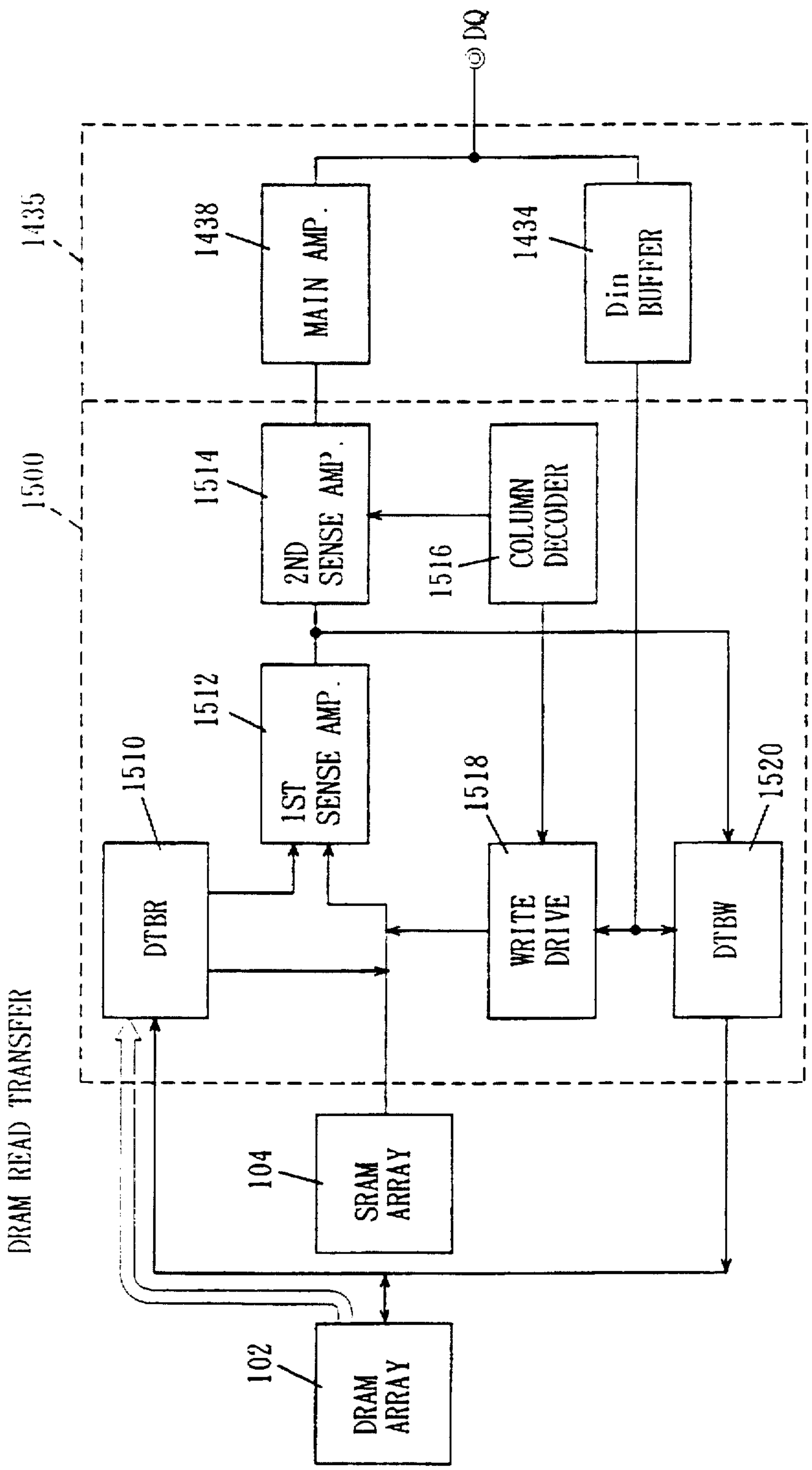
FIG. 95 shows the flow of data at the DRAM read transfer mode operation.

More specifically, referring to FIG. 95, the selected column block (a memory cell block or a data block) is selected in the DRAM array 102, and the selected column block is transferred to and latched in read data transfer buffer circuit 1510.

[DRAM Activate Mode]

When the row address strobe RAS# is set to "L" and the column address strobe CAS# and the data transfer designation DTD# are both set to "H", the DRAM activate mode is designated. In this mode, the address bits Ad0 to Ad11 applied at that time are taken in as the DRAM row address, and a row selecting operation is carried out in the DRAM array in accordance with the row address. The DRAM activate mode maintains the row selected state until the designation of DRAM precharge mode, which will be described in the following. By effectively utilizing the DRAM activate mode, the sense amplifier of the DRAM can be set to the data latch state, where data transfer utilizing the page mode can be implemented (as in the first embodiment).

[DRAM Precharge Mode]

When the row address strobe RAS# and the data transfer designation DTD# are both set to "L" and the column address strobe CAS# is set to "H", the DRAM precharge mode is designated. In this mode, a selected word line in the DRAM array is changed to the non-selected state, and the DRAM returns to the initial state (standby state). When a different row is to be selected in the DRAM array, it is necessary to carry out the DRAM precharge mode between the DRAM activate mode and the next DRAM activate mode.

[Auto Refresh Mode]

When the address strobes RAS# and CAS# are both set to "L" and the data transfer designation DTD# is set to "H", the auto refresh mode is designated in the DRAM portion. In this mode, a refresh address is generated from an address counter (not explicitly shown in FIG. 70) provided in the CDRAM, and the memory cell data is refreshed in accordance with the refresh address. As in the first embodiment, execution of the DRAM precharge mode is necessary to complete the auto refresh mode. The DRAM address applied at this time may be used as the refresh address.

[Data Transfer Operation Mode from the Write Data Transfer Buffer Circuit to the DRAM Array]

There are four different types of data transfer modes from the write data transfer buffer circuit to the DRAM array. The data transfer operation from the write data transfer buffer circuit to the DRAM array is designated by setting the row address strobe RAS# to "H" and by setting the column address strobe CAS# and the data transfer designation DTD# both to "L". In this state, the address bits Ad4 to Ad4 applied at this time are applied to the block decoder 112 (see FIG. 70), and data transfer with respect to the column block (memory cell block or data block) selected in the DRAM array is carried out. There are four different data transfer modes. These four data transfer mode operations will be described in the following.

Figure 96:
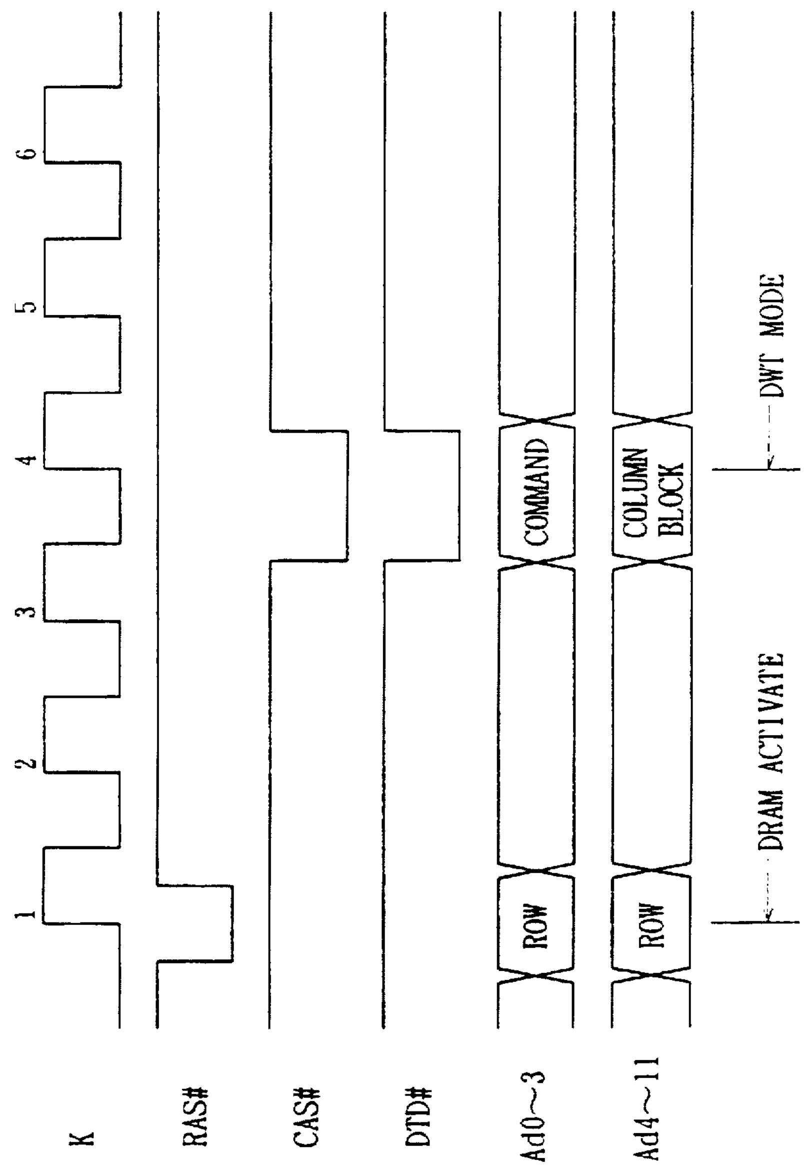
FIG. 96 is a diagram of waveforms showing the operation at the time of DRAM write transfer mode designation.

FIG. 96 shows states of control signals in the DRAM write transfer mode (which generically refers to the four data transfer modes). In the first cycle of the master clock K, the row address strobe RAS# is set to "L" at a rising edge, and the DRAM activate mode is designated. The address bits Ad0 to Ad11 applied at this time are taken in as the DRAM row address, and the row selecting operation in the DRAM array is carried out. After the lapse of a predetermined latency (the number of clocks necessary to allow fall of the column address strobe CAS#), in the fourth cycle of the master clock K, the column address strobe CAS# and the data transfer designation DTD# are both set to "L". Consequently, the DRAM write transfer mode (DWT mode) is designated. In the write transfer mode, an operation for selecting a column block (a block of memory cells or a data block) in the DRAM array is carried out. Ad4 to Ad11 are used as the address. The remaining least significant address bits Ad0 to Ad3 are used as commands for designating the types of the write transfer mode.

In the table of FIG. 94, a state in which the lower address bits of Ad0 to Ad1 only are used is shown. The remaining address bits Ad2 and Ad3 are reserved for future extension. By a structure in which a command data for designating the DRAM write transfer mode is applied simultaneously with the DRAM column block address applied at the fall of the column address strobe CAS#, it becomes unnecessary to provide extra pin terminal for data transfer mode designation, whereby the chip area can be reduced.

The external control devices can also generate data which are required at the time of the write transfer mode designation easily and apply the same to the CDRAM, so that the control of the entire system is facilitated, which will be described prior to the detailed description of the write transfer mode.

Figure 97:
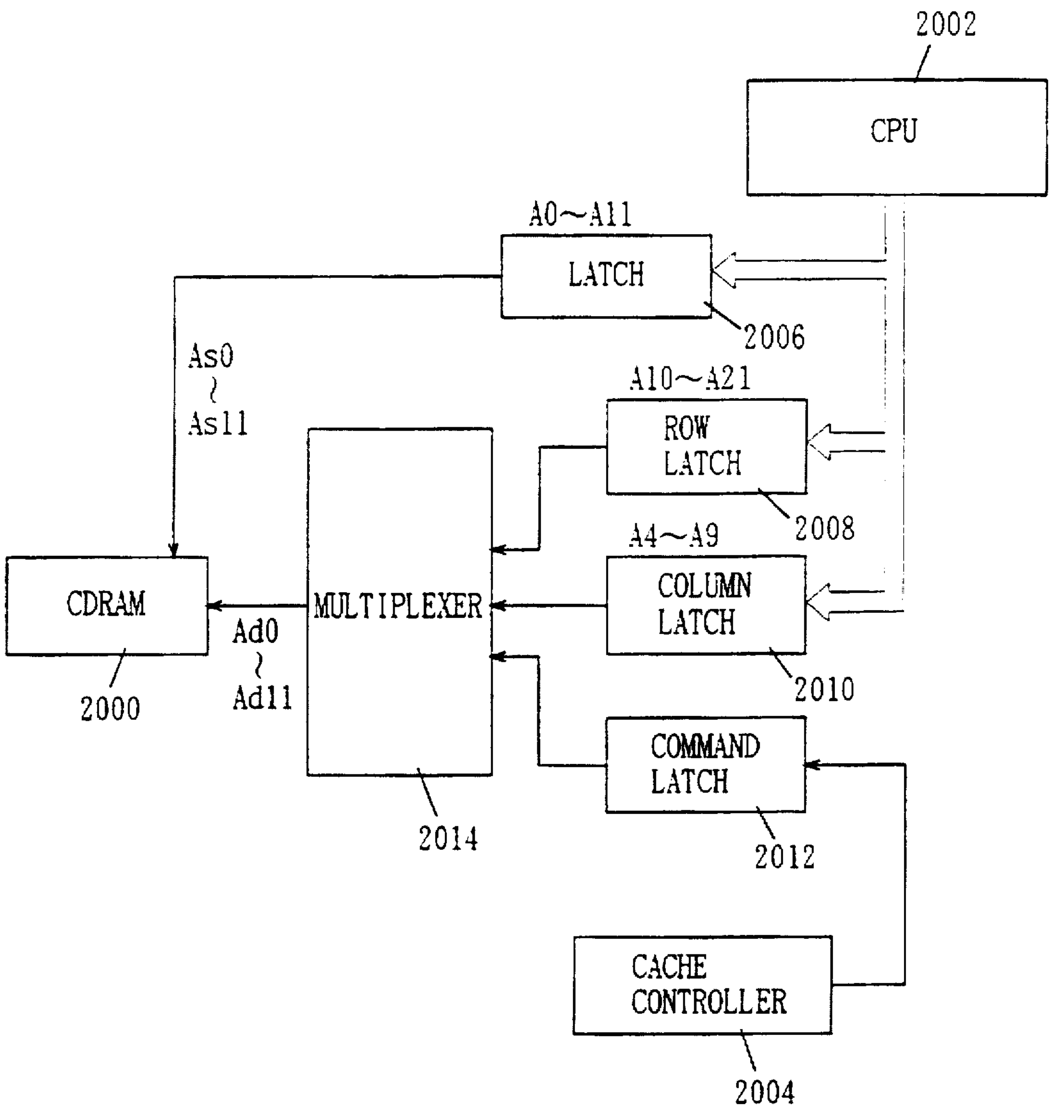
FIG. 97 shows an example of a structure of a data processing system utilizing the semiconductor memory device in accordance with another embodiment of the present invention.

FIG. 97 shows an example of a data processing system structure using a CDRAM. Referring to FIG. 97, the data processing system includes a CPU 2002 as an external processing unit for carrying out necessary data processing, a CDRAM 2000 functioning as a main memory and cache memory, a cache controller 2004 determining the operation mode and the like of the CDRAM 2000, an SRAM address latch 2006 latching the SRAM address A0 to A11 from CPU 2002, a row latch 2008 latching address A10 to A21 from CPU 2002 as the DRAM row address, a column latch 2010 for latching address A4 to A9 from the CPU 2002 as the DRAM column block address, and a multiplexer 2014 for multiplexing the addresses from the row latch 2008 and the column latch 2010 for applying the result to CDRAM 2000. Multiplexer 2014 applies the address from column latch 2010 and the command data from command latch 2012 at the same time to the CDRAM.

Cache controller 2004 includes a circuit portion for determining cache miss/cache hit in accordance with the cache address A0 to All from CPU 2002 for generating a control signal in accordance with the result of determination. SRAM address bits A0 to As11 of the CDRAM 2000 are generated from latch 2006. DRAM address bits Ad0 to Ad11 of CDRAM 2000 are generated from multiplexer 2014.

In the address structure shown in FIG. 97, address bits A12 to A21 applied from CPU 2002 are used as the tag address of the cache. The CPU address bits A10 and All are used as the way address. The CPU address bits A4 to A9 are used as the set address. The CPU address bits A0 to A3 are used as the block address. The CPU address bits A22 to A31 (in case that the address includes 32 bits) are used as the chip select address. Namely, the address arrangement shown in FIG. 97 shows a structure in which 4 way set associative mapping is implemented between the cache and the main memory.

Cache controller 2004 decodes a chip select address, not shown, and generates a chip select signal (or a chip enable (in the case of the first embodiment)).

In the structure shown in FIG. 97, the multiplexer 2014 can generate the DRAM column address and the command data for the write data transfer mode at the same timing. Therefore, the type of the write transfer mode can be determined without affecting the speed of operation. Further, this method of control is readily used as a method of generating the command data for identifying the type of the write transfer mode.

Operations of the respective write transfer modes will be described.

[DRAM Write Transfer 1 Mode]

This mode is designated by setting the address bits Ad0 and Ad1 applied simultaneously with the DRAM column address to "0". In this mode, data from the temporary register is loaded in the write data transfer buffer DTBW, and the loaded data is transferred to the DRAM array. In synchronization with the data transfer to the data transfer buffer DTBW from the temporary register of the write data transfer buffer circuit, mask data of the temporary register is transferred to the mask register in the transfer mask circuit, and this data transfer is masked. In this mode, the mask data of the temporary register is set after the completion of data transfer.

Here, the temporary register 142 of the write data transfer buffer circuit and the write data transfer DTBW are respectively denoted by the reference characters 142 and 144 in FIG. 70. The temporary register is not shown for the mask register circuit. The detailed structure will be described later. The structure is simplified in this description for the purpose of easier understanding of the data transfer operation.

Figure 98:
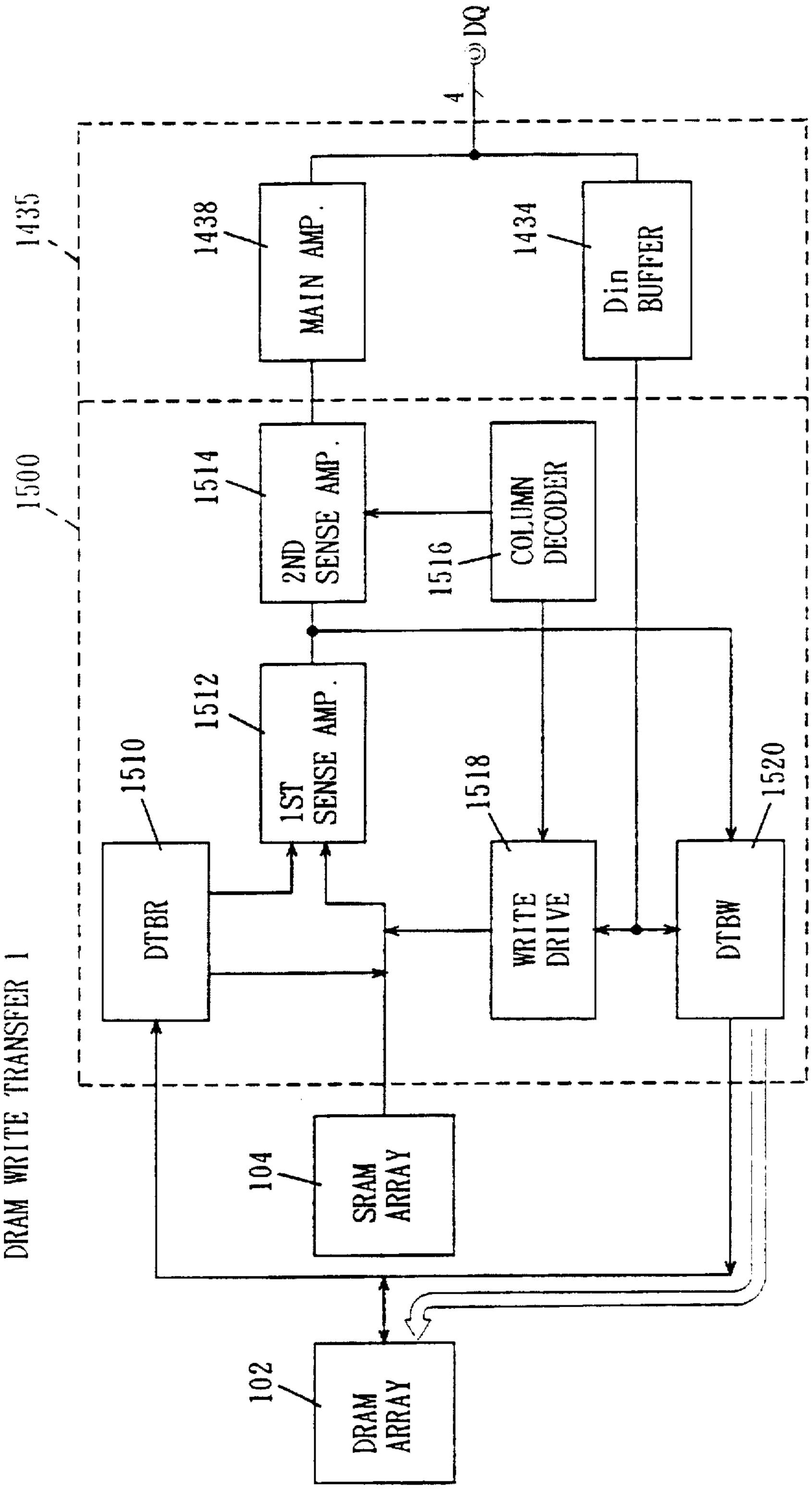
FIG. 98 shows the flow of data in the DRAM write transfer 1 mode operation.

Referring to FIG. 98, in the DRAM write transfer 1 mode, data is transmitted from the write data transfer buffer (DTBW) 1520 to DRAM array 102. In the DRAM array 102, a column block (a memory cell block or a data block) has been selected, and the data are written at one time to the selected column block.

[DRAM Write Transfer Read Mode]

This mode is designated by setting the address bits Ad0 and Ad1 to "1" and "0", respectively. In this mode, data of the write transfer buffer circuit (DTBW) is transmitted to the selected column block of the DRAM array as well as to the read data transfer buffer circuit. The data from the column block including that memory cell which have been subjected to data writing are transferred to the read data transfer buffer circuit (DTBR). Consequently, in the cache miss write operation, reading of data when the same block is designated in the next cycle can be carried out from this read data transfer buffer circuit, and as the data can be written from the read data transfer buffer circuit (DTBR) to the SRAM array 104, the content of the SRAM array 104 which has been unsuccessfully accessed can be rewritten, whereby the penalty at the time of a cache miss can be reduced and the CDRAM can be provided which operates at high speed.

More specifically, referring to FIG. 99, in the DRAM write transfer 1/read mode operation, data is transferred from the write data transfer buffer circuit (DTBW) 1520 to the selected column block of the DRAM array 102 (mask operation in accordance with the mask data in the mask register is carried out) and the data of this selected column block of the DRAM array 102 is transmitted to the read data transfer buffer circuit (DTBR) 1510.

[DRAM Write Transfer 2 Mode]

This mode is designated by setting the column block address bits Ad0 and Ad1 to "0", and "1", respectively. In this operation mode, data transfer from the write data transfer buffer circuit (DTBW) to the selected column block of the DRAM array is carried out. In this case, data transfer from the temporary register to the write data transfer buffer (DTBW) is not carried out in the write transfer buffer circuit. The same applies to the mask register.

In the write data transfer buffer circuit, the temporary register is separated from the buffer register portion which actually transfers the data to the DRAM array. When the DRAM write transfer 2 mode is carried out repeatedly, the same data are transmitted to the DRAM array. When the column block is selected in the DRAM array in the page mode, the data in the DRAM array can be rewritten by the same data at a high speed. Therefore, a so called "fill" (painting out in one color) in the graphic processing application can be implemented at high speed. The data transfer operation is essentially the same as that shown in FIG. 98. The only difference is whether the same data is transferred or not.

[DRAM Write Transfer 2/Read Mode]

This mode is designated by setting the address bits Ad0 and Ad1 to "1". In the operation mode, in addition to the DRAM write transfer 2 mode operation, an operation of transferring data of the selected column block of the DRAM array to the read data transfer buffer circuit (DTBR) is carried out. In this operation mode also, "filling" can be realized at high speed, and accordingly, a CDRAM which is very effective for graphic data processing applications can be obtained.

[General Data Transfer Operation]

Figure 100:
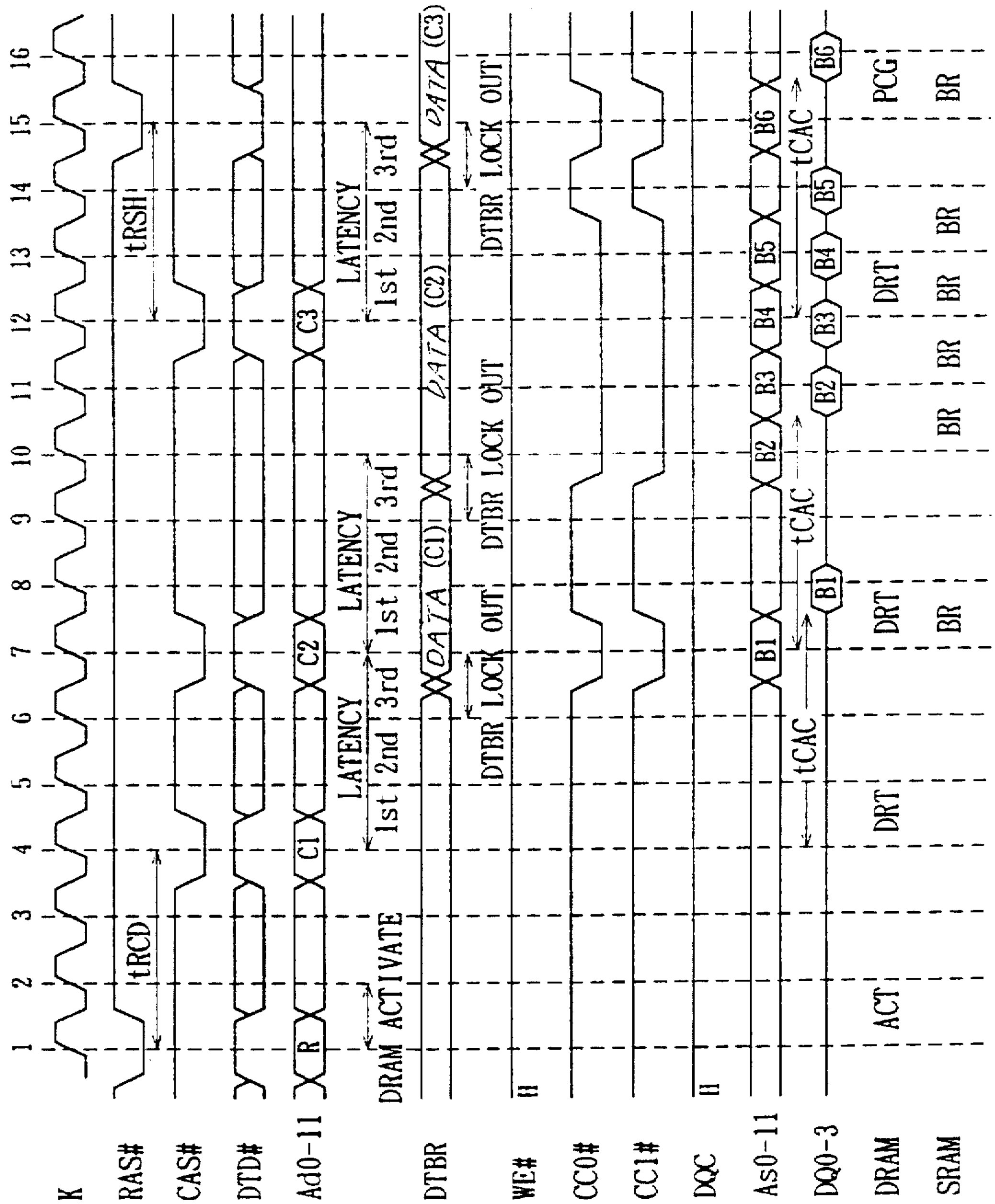
FIG. 100 is a diagram of waveform showing the DRAM read transfer mode operation.

FIG. 100 is a diagram of signal waveforms showing data transfer operation sequence from the DRAM array to the read data transfer buffer circuit. The data transfer operation from the DRAM array to the read data transfer buffer circuit will be described with reference to FIG. 100.

In the first cycle of the master clock K, when the row address strobe RAS# is set to "L" and the column address strobe CAS# and the data transfer designation DTD# are set to "H", the DRAM activate mode ACT is designated. In the DRAM portion, the address Ad0 to Ad11 applied at that time are used as the row address and the row selecting operation is carried out.

In a cycle after the lapse of the RAS-CAS delay time tRCD, that is, in the fourth cycle of the master clock K, when the column address strobe CAS# is set to "L and the row address strobe RAS# and the data transfer designation DTD# are set to "H", the DRAM read transfer mode (DRT) is designated. In the DRAM array, a column block (a memory cell block or a data block) of the selected row is selected by using the address applied as the column block address (C1), and the data of the selected column block is transmitted to the read data transfer buffer circuit. Here, a latency of 3 clock cycles is assumed.

The latency means the number of clocks required for the new data to be transmitted to the read data transfer buffer circuit to the SRAM array and/or the data input/output pin DQ as already described in the first embodiment, and it can be considered as the access time of the read data transfer buffer circuit. If the latency is n clock cycles, the (n−1)th cycle is set to the "DTBR locked out" state. More specifically, data transfer from the read data transfer buffer circuit is inhibited (in this cycle, the operation mode for accessing the read data transfer buffer circuit is inhibited).

In the seventh cycle of the master clock K, the data of the read data transfer buffer circuit is established and in this cycle, the DRAM read transfer mode is again designated in the DRAM portion. In that row which has been designated in the first cycle of the master clock K, another column block is selected in accordance with the column block address (C2), and after the lapse of the CAS latency, the data of the newly selected column block (a memory cell block or a data block) is transferred to the read data transfer buffer circuit.

In the SRAM portion, in the seventh cycle of the master clock K, the control clocks CC0# and CC1# are both set to "L" and the write enable WE# is set to "H". The DQ control DQC is at "H", and data input/output is enabled. In this state, the buffer read mode is designated, and the column decoder carries out the selecting operation in accordance with the address bits As0 to As3 applied at that time, and reads the corresponding data from the data stored in the read data transfer buffer circuit. More specifically, in the eighth cycle of the master clock K, data B1 is read. Namely, by carrying out the DRAM read transfer mode operation and by carrying out the buffer read mode (BR) operation in a cycle after the lapse of the latency, read data can be obtained after the lapse of time tCAC from the designation of the buffer read transfer mode operation.

In the tenth cycle of the master clock K, the data selected by the column block address (C2) is stored in the read data transfer buffer circuit. In this cycle, the buffer read mode operation (BR) is again carried out, and at every clock cycle, the data stored in the read data transfer buffer circuit are read successively (B2, B3, B4 and B5).

In parallel to the buffer read mode operation, in the 12th cycle of the master clock K, the DRAM read transfer mode is designated again, and after the lapse of 3 clock cycles, the data of the read data transfer buffer circuit is set to the established state. In the SRAM array portion, access to the read data transfer buffer circuit is inhibited in this 14th cycle, and therefore the SRAM address applied at that time is neglected (since it is DTBR lock out period).

In the 15th cycle of the master clock K, the buffer read mode operation is again designated, and the data stored in the read data transfer buffer circuit (B6) is read.

In the 15th cycle of the master clock K, the row address strobe RAS# and the data transfer designation DTD# are set to "L" and the column address strobe CAS# is set to "H", and thus the DRAM precharge mode (PCG) is designated. Thus the row which has been selected in the DRAM array is changed to the non-selected state.

As described above, by using the DRAM read transfer mode and the buffer read mode in combination, the data of the DRAM array can be read through the read data transfer buffer circuit without affecting the SRAM array at all. Since this operation mode can be carried out by utilizing the page mode of the DRAM (the DRAM activate mode operation is continued until the execution of the DRAM precharge mode operation), data can be read at high speed.

Figure 101:
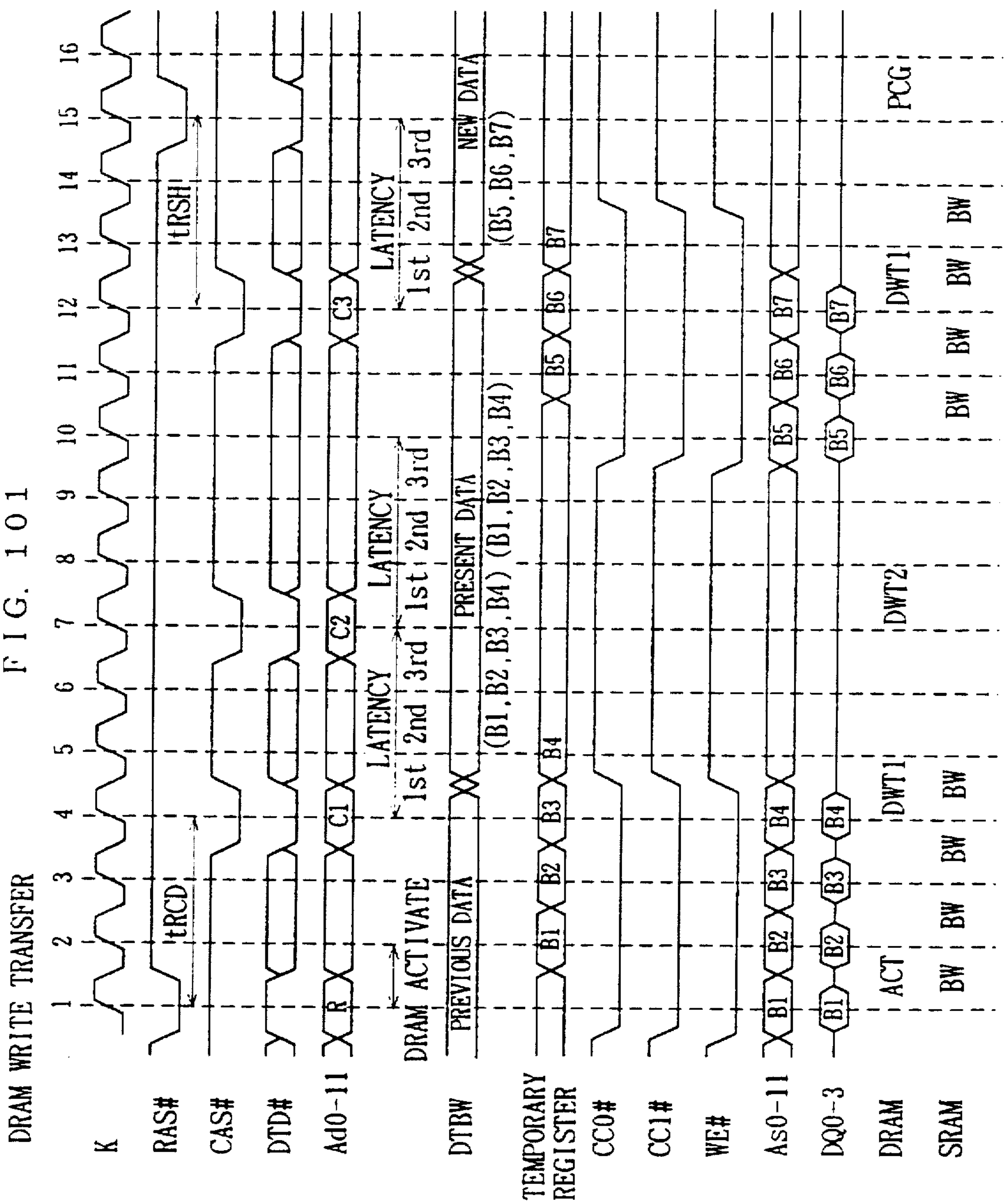
FIG. 101 is a diagram of waveform showing the DRAM write transfer mode operation.

FIG. 101 is a diagram of waveforms showing the data transfer operation sequence from the write data transfer buffer circuit to the DRAM array. The DRAM write transfer mode operation for transferring data from the write data transfer buffer circuit to the DRAM array will be described with reference to FIG. 101.

In the first cycle of the master clock K, the row address strobe RAS# is set to "L", the column address strobe CAS# and the data transfer designation DTD# are both set to "H", the DRAM activate mode (ACT) is designated, and the row selecting operation is carried out in the DRAM array.

In the SRAM portion, in the first to fourth cycles of the master clock K, the buffer write mode (BW) operation is carried out, and data B1 to B4 are stored in the temporary register included in the write data transfer buffer circuit successively in the second to fourth cycles of the master clock K. Designation of the buffer write mode (DBW) is done by setting the clocks CC0# and CC1# as well as the write enable WE# to "L" and by setting the DQ control DQC to "H".

In the fourth cycle of the master clock K, by setting the row address strobe RAS# to "H" and by setting the column address strobe CAS# and the data transfer designation DTD# to "L", the DRAM write transfer 1 mode (DWT1) operation is designated. When the DRAM write transfer 1 mode is designated, data (B1 to B4) stored in the temporary register are transferred to the write data transfer buffer (DTBW). The data transferred to the write transfer buffer (DTBW) are stored in the column block (a memory cell block or a data block) selected in the DRAM array after the lapse of the latency (3 clock cycles).

When the latency has passed, that is, in the seventh cycle of the master clock K, the column address strobe CAS# and data transfer designation DTD# are again set to "L", and the row address strobe RAS# is set to "H". In this mode, by setting the SRAM address As0 to As3 applied at that time as the command data, the DRAM write transfer 2 (DWT 2) mode is designated. When the DRAM write transfer 2 mode is designated, the temporary register is separated from the write data transfer buffer (DTBW), and data transfer from the temporary register to the write data transfer buffer (DTBW) is not carried out. The data stored in the write data transfer buffer (DTBW) are transmitted to the selected column block of the DRAM array after the lapse of the latency.

Referring to FIG. 101, in the DRAM write transfer mode, mode designation is carried out in accordance with the DRAM address bits Ad0 to Ad3 at the time of the DRAM write transfer mode designation. Therefore, the DRAM write transfer mode can be designated without affecting the operation in the SRAM portion.

In the tenth cycle of the master clock K, the buffer write mode (BW) is again designated, data B5, B7 are stored in the write data register (temporary register) in the tenth to 12th cycle of the master clock K.

In the 12th cycle of the master clock K, the DRAM write transfer 1 mode is again designated, and the data B5 to B7 stored in the temporary register are transferred to the write data transfer buffer. After the lapse of a prescribed latency period, the new data B5 to B7 are stored in the selected column block of the DRAM. In the 13th cycle of the master clock K, in the SRAM portion, the buffer write mode (BW) has been designated. However, since data stored in the temporary register is transferred to the write data transfer buffer in this cycle, access to the temporary register is inhibited. Therefore, the buffer write mode operation designated in the 13th cycle of the master clock K is not carried out.

In the 15th cycle of the master clock K, the DRAM precharge mode (PCC) operation is designated, and the DRAM array returns to the precharge state.

More specifically, in the DRAM write transfer mode, since there are a temporary register and a write data transfer buffer, data transfer of the DRAM array can be carried out in the pipeline fashion or independently from the operation of the SRAM portion. In the write transfer 1 mode, in the first cycle thereof, the temporary register is connected to the write data transfer buffer, and the temporary register and the write data transfer buffer are separated from each other by the start of the next cycle. At the time of this separation, the mask data in the mask register circuits corresponding to the temporary registers are all set to the set state.

After the separation of the temporary register and the write data transfer buffer, data can be written to the temporary register from the SRAM array or from the outside.

In the DRAM write transfer 2 mode operation, the temporary buffer and the write data transfer buffer are kept separated from each other. Therefore, data transfer from the temporary register to the write data transfer buffer is not carried out, and the data stored in the write data transfer buffer in the previous cycle is transferred to the selected column of the DRAM array.

In the DRAM write transfer mode, a mode for transferring operation to the read data transfer buffer circuit is provided in addition to the data transfer to the DRAM array. This is useful when it is used as a cache memory.

[Write Transfer Operation Controlling System]

Figure 102:
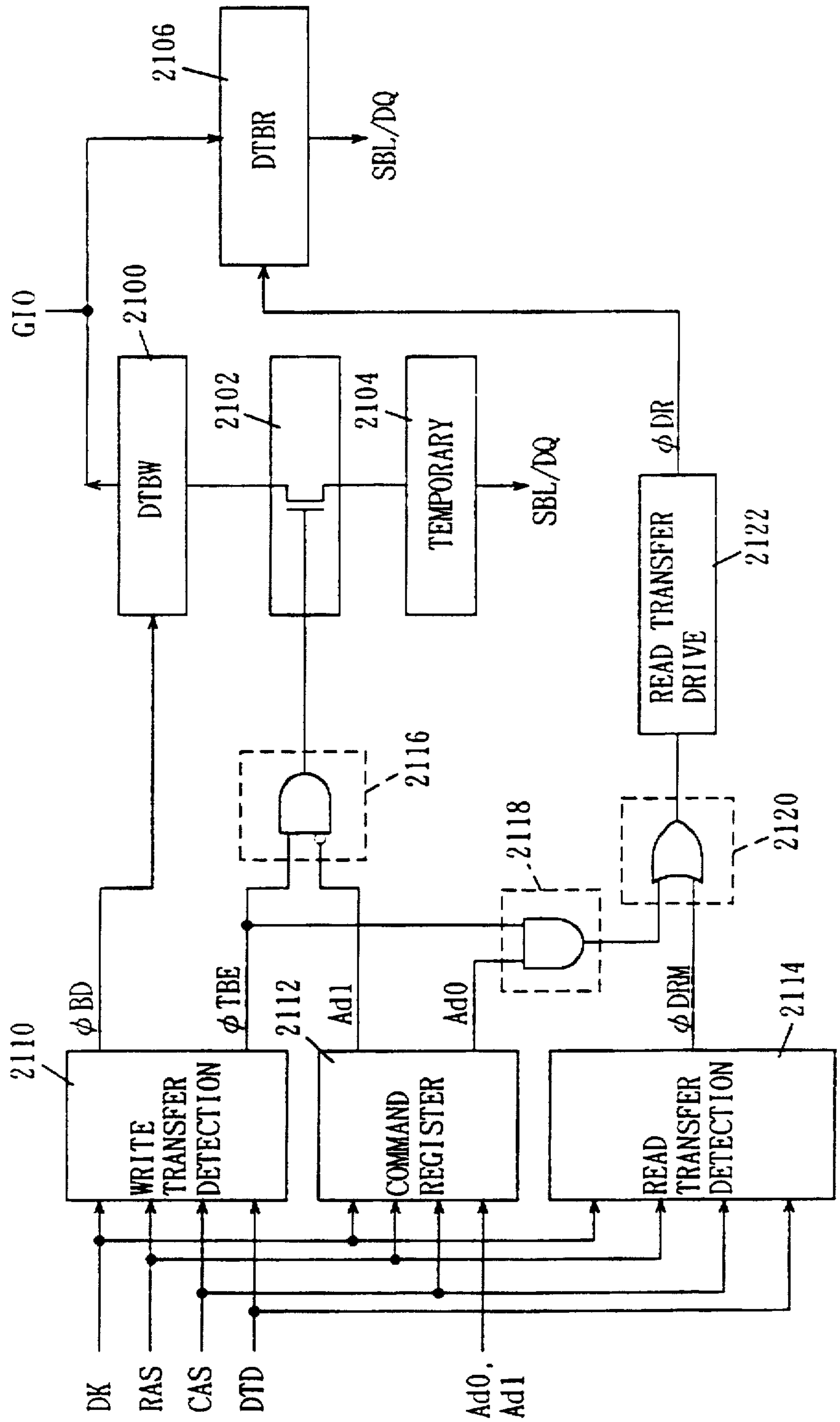
FIG. 102 shows an example of a circuit structure for generating a control signal for controlling operation of a bi-directional data transfer circuit in a semiconductor memory device in accordance with another embodiment of the present invention.

FIG. 102 shows a structure for controlling the DRAM write transfer operation. Referring to FIG. 102, the write transfer control system includes a write transfer detecting circuit 2110 responsive to an internal DRAM master clock DK, an internal row address strobe RAS, an internal column address strobe CAS and an internal data transfer designation DTD for detecting designation of the DRAM write transfer mode; a command register 2110, when DRAM write transfer mode is designated in accordance with the signals DK, RAS, CAS and DTD, storing lower 2 bits Ad0 and Ad1 of the DRAM column address applied at that time; and a read transfer detecting circuit 2114 responsive to the signals DK, RAS, CAS and DTD for detecting designation of data transfer from the DRAM array to the read data transfer buffer circuit 2106. The write transfer detecting circuit 2110, command register 2112 and read transfer detecting circuit 2114 are included in the DRAM control circuit 128 of FIG. 70. The command register 2110 is shown to receive only the lower bit address Ad0 and Ad1. Address bits Ad0 to Ad3 may be used (for extending function).

When the DRAM write transfer mode is designated, read transfer detecting circuit 2110 generates a signal $\phi$BD for designating data transfer from the write data transfer buffer (DTBW) 2100 to the DRAM array (indicating global IO line pair Gio in FIG. 102), and a transfer signal $\phi$TBE for carrying data transfer from the temporary register 2104 to the write data transfer buffer (DTBW) 2100 when the DRAM write transfer mode is designated.

The control system further includes a gate circuit 2116 receiving the signal $\phi$TBE from the write transfer detecting circuit 2110 and the address bit Ad1 from the command register 2112 and generating a transfer designating signal when the DRAM write transfer 1 mode (in which data transfer from the temporary register to the write data transfer buffer is carried out) is designated, a gate circuit 2118 receiving the address bit Ad0 from the command register 2112 and the signal $\phi$TBE for generating, when the write transfer mode is designated including data transfer to the read data transfer buffer (DTBR) 2106, the mode detecting signal, a gate circuit 2120 responsive to the read transfer mode detecting signal $\phi$DRM from the read transfer detecting circuit 2114 and to the output from gate circuit 2118 for generating a signal for designating data transfer from DRAM array to the read data transfer buffer, and a read transfer drive circuit 2112 responsive to the output from gate circuit 2120 for generating a drive signal $\phi$DR for driving data transfer to the read data transfer buffer (DTBR) 206. When the output of the gate circuit 2118 or the read transfer mode detecting signal $\phi$DRM is activated, the read transfer drive circuit 2112 generates the signal $\phi$DR for driving the data transfer to the read data transfer buffer (DTBR) 2106.

A transfer gate 2102 is provided between the write data transfer buffer (DTBW) 2100 and the temporary register 2104. The transfer gate 2102 transfers, in response to the output of gate circuit 2116, the output from temporary register 2104 to the write data transfer buffer (DTBW) 2100.

By utilizing the above described structure, the type of the DRAM write transfer mode can be detected, and data transfer operation can be carried out precisely in accordance with the detected operation mode.

The operation of the DRAM write transfer 2 mode (including a mode in which data transfer to the read data transfer buffer circuit is carried out) will be described.

[DRAM Write Transfer 2 Mode]

Now, referring to FIG. 103, assume that the data is written to the write data transfer buffer circuit in accordance with the buffer write (BW) mode, then the write transfer 1 (DWT1) mode is carried out and thereafter, the DRAM write transfer 2 (DWT2) mode is repeated for a plural times. The designation of the type of the DRAM write transfer mode is carried out by designating the value of the lower 2 bits A0 and A1 (corresponding to Ad0 and Ad1) of the DRAM address Ad in each mode.

Figure 104A:
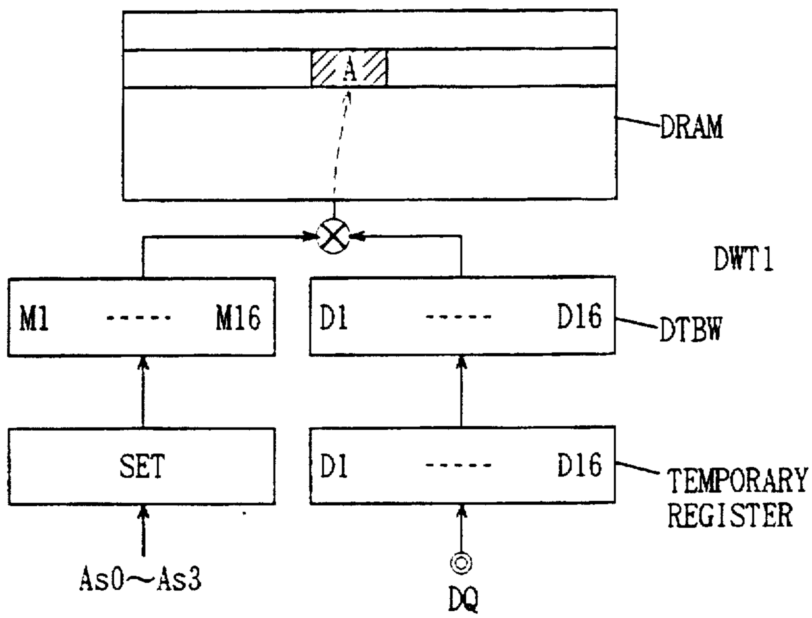
FIGS. 104A and 104B schematically show the flow of data in the DWT1 mode operation and in DWT2 mode operation shown in FIG. 102.

FIG. 104A shows data flow in the DWT1 mode. Referring to FIG. 104A, in the DRAM write transfer 1 mode, 16 bits of data D1 to D16 stored in the temporary register are transferred to the write data transfer buffer circuit (DTBW). At this time, since the mask register has similar hierarchical structure as the temporary register, the mask data of the temporary mask register are stored in the mask register. The data D1 to D16 stored in the write data transfer buffer circuit (DTBW) are masked in accordance with the mask data M1 to M16 stored in the mask register, and transferred to the column block (hatch region A) selected in the DRAM array. The mask data of the temporary mask register are all to the set state after the transfer of the mask data to the mask register, in order to reset the corresponding mask data when data is written to the temporary register in the buffer write (BW) mode successively.

Figure 104B:
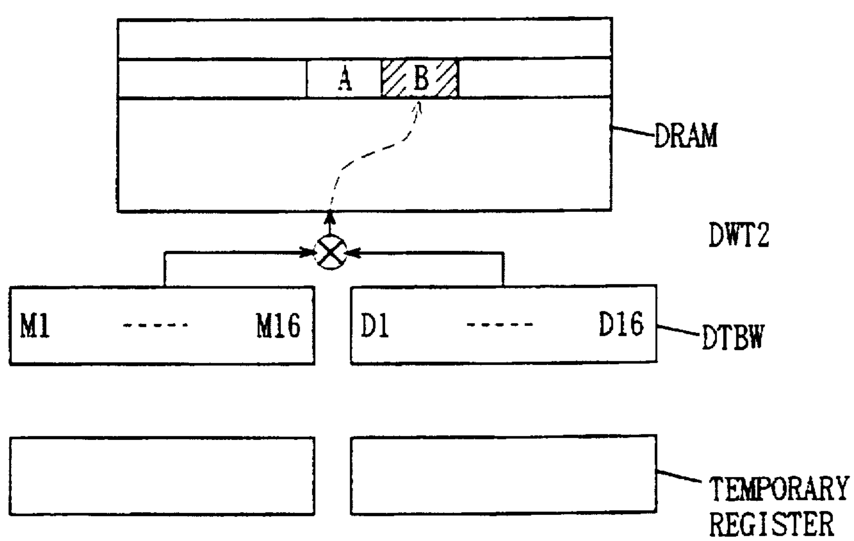

FIG. 104B shows the data flow in the DRAM write transfer 2 mode. In the DRAM write transfer 2 mode, data transfer from the temporary register to the write data transfer buffer circuit (DTBW) is not carried out, as shown in FIG. 104B. Therefore, the data stored in the write data transfer buffer circuit (DTBW) is the data transferred from the temporary register in the previous cycle. In the mask register, the transfer of the mask data from the temporary mask register is not carried out, either. Therefore, the same data as the previous cycle is transferred to a different column block of the selected row in the DRAM array. In the DRAM array, the same data is written on the column block by column block basis.

Figure 105:
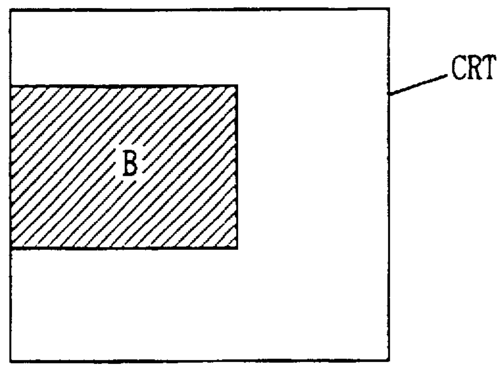
FIG. 105 is a diagram illustrating the effect of DWT2 mode shown in FIG. 104.

By carrying out the operation shown in FIG. 104B repeatedly, a prescribed area B of the display screen CRT of the display unit can be changed at high speed by the same data, as shown in FIG. 105. Thus the so called "filling" operation in the graphic processing can be carried out at high speed. The structure of the mask register will be described in detail later.

In the DRAM write transfer mode, the data transfer to the DRAM array can be masked by the mask data of the mask register. Therefore, when the data of the DRAM array is to be re-written by external write data, it is not necessary to carry out the read modify write mode, and therefore the content of the DRAM array can be changed at high speed.

Figure 106:
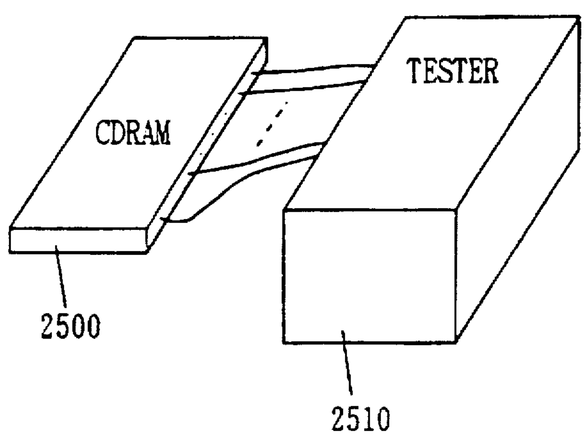
FIG. 106 shows state of connection to a tester at the time of function test of the semiconductor memory device.
Figure 107:
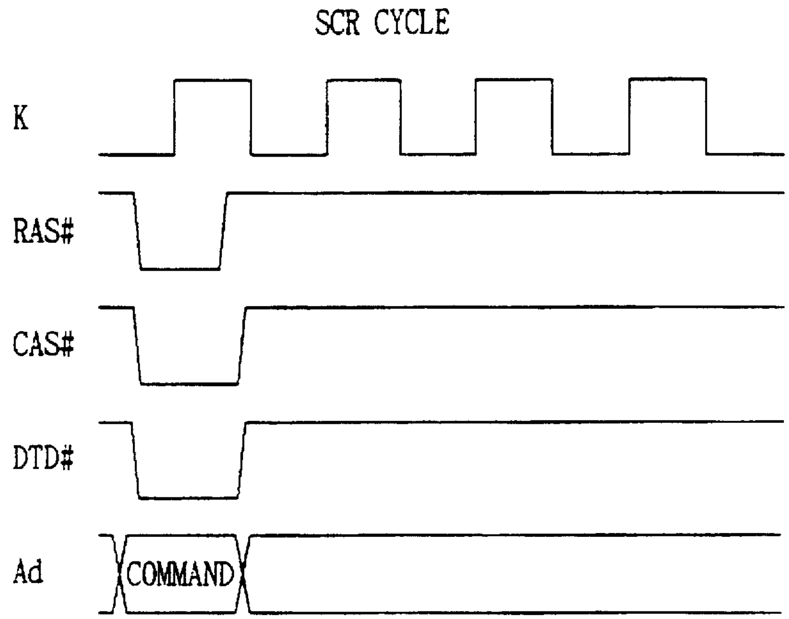
FIG. 107 shows states of external control signals in a set command register cycle in the semiconductor memory device in accordance with another embodiment of the present invention.

After manufacturing, the CDRAM is tested so as to determine whether it operates correctly, as a single chip or when incorporated in circuitry. More specifically, as shown in FIG. 106, a test pattern including various patterns is applied from a tester 2510 to the CDRAM 2500, and it is necessary to determine whether the CDRAM 2500 operates normally by identifying the operation states of the CDRAM 2500 in accordance with the test pattern. In this case, from the view point of test reliability and time necessary for the test, the test of the CDRAM should preferably be effected easily. A structure for facilitating the test will be described in the following.

[Set Command Register Mode]

The set command register mode (SCR cycle) is designated by setting the row address strobe RAS#, the column address strobe CAS# and the data transfer designation DTD# to "L" at the rising edge of the master clock K. At this time, the DRAM address is used as the command data. The command data is stored in the command register, and setting of the latency and the output modes (transparent, registered and latched) and CDRAM pin arrangement (IO structure) is effected. Preferably, the command data should be easily generated from the tester.

Figure 108:
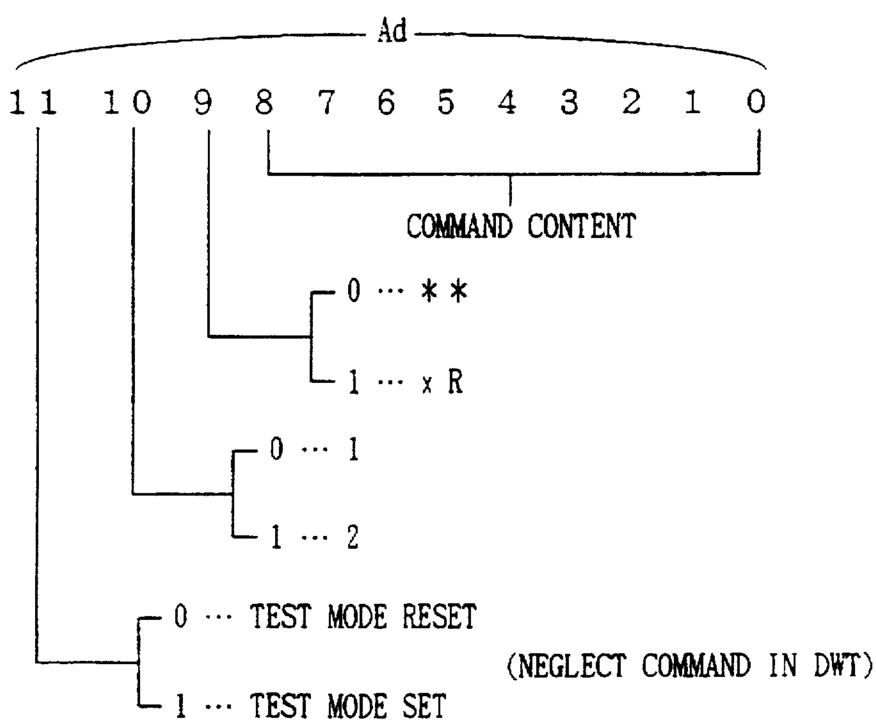
FIG. 108 shows a structure of the command data shown in FIG. 107.

FIG. 108 shows a structure of the command register in the set command register cycle. Among the DRAM address Ad, lower 9 bits Ad0 to Ad8 are regarded as the content of the command and stored in the command register. The address bit Ad9 is used as a bit indicative of presence/absence of data transfer to the read data transfer buffer circuit in the DRAM write transfer mode.

The address bit Ad10 is used for indicating whether the DRAM write transfer mode includes the DWT1 mode or the DWT2 mode. The address bit Ad11 is used for setting/resetting the test mode. When the test mode is designated, the command data Ad0 to Ad3 are set in the DRAM write transfer mode, but these command data at that time are neglected.

By this structure, the tester can generate only the command data by using the DRAM address bits Ad0 to Ad11. It is not necessary to simultaneously apply the DRAM column block address and the command data indicative of the type of the DRAM write transfer mode. Therefore, the tester structure can be simplified, setting of the command data can be carried out easily, and the test can be carried out with high reliability.

Figures 109, 110:
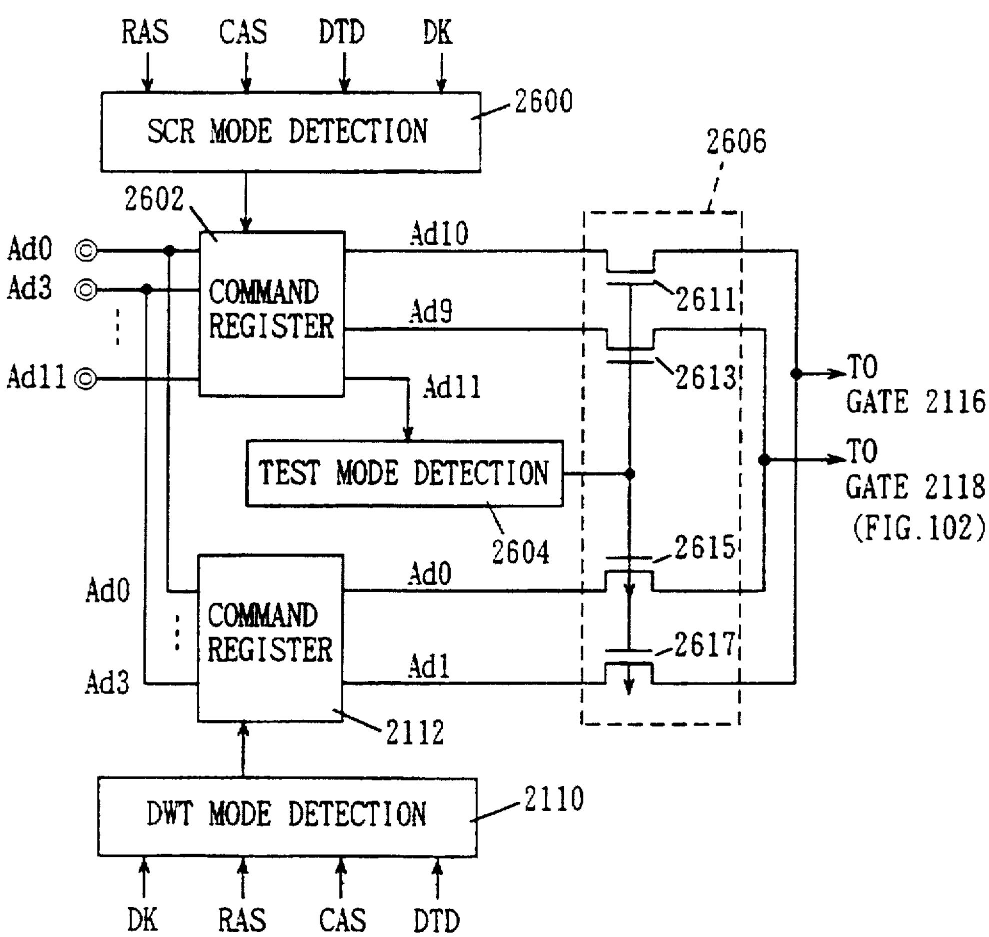
FIG. 109 shows, in a table, correspondence between the command data shown in FIG. 108 and the operation modes designated at that time.
FIG. 110 shows a structure of a circuit system controlling internal operation of the semiconductor memory device in accordance with the command data shown in FIG. 108.

FIG. 109 shows the correspondence between the command data and the DRAM write transfer mode in the test mode. Referring to FIG. 109, when the address bit Ad11 is "1" ("H") in the set command register mode, the test mode is set, while if it is "0", the test mode is reset. When the test mode is set and the address bits Ad10 and Ad9 are both "0", the DWT1 mode is designated. If the address bits Ad10 and Ad9 are at "0" and "1", respectively, the DWT1R mode is designated.

When the address bits Ad10 and Ad9 are at "1" and "0", respectively, the DWT2 mode is designated. If the address bits Ad10 and Ad9 are both at "1", the DWT2R mode is designated.

In the test mode, the test mode state is continued until the auto refresh mode is carried out or the test mode reset is carried out in accordance with the set command register mode. In the test mode state, auto refresh of the DRAM array is carried out. Alternatively, only the setting of the command register may be carried out in the set command register cycle.

FIG. 110 shows an example of a circuit structure for designating the DRAM write transfer mode in accordance with the setting/resetting of the test mode. Referring to FIG. 110, the test mode control system includes an SCR mode detector 2600 receiving internal control signals RAS, CAS, DTD and the DRAM master clock DK for determining whether or not the set command register (SCR) mode has been designated, a command register 2602 responsive to the detection of the SCR mode from the SCR mode detecting circuit 2600 for latching the DRAM address Ad0 to Ad11 as the command data, and a test mode detecting circuit 2604 receiving the data corresponding to the address Ad11 from the command register 2602 for determining whether or not the test mode has been designated.

The SCR mode detecting circuit 2600 determines that the SCR mode is designated, when the signals RAS, CAS and DTD all attain to "L" at a rising edge of the master clock DK. In response to the SCR mode detection from the SCR mode detecting circuit 2600, the command register 2602 latches the DRAM address bits Ad0 to Ad11 applied at that time. The command register 2602 is shown as a simple latch circuit in FIG. 110. The DWT mode detecting circuit 2110 and the command register 2112 are the same as those shown in FIG. 101, and they are the circuitry for detecting the type of the DRAM write transfer mode. The command register 2112 latches, in response to the detection of the DWT mode from the DWT mode detecting circuit 2110, the command data indicative of the type of the DRAM write transfer mode.

The test mode control system further includes a selecting gate circuit 2606 responsive to the output from test mode detecting circuit 2604 for passing either the address bits Ad9 and Ad10 from command register 2602 or the address bits Ad0 and Ad1 from command register 2112 (here the internal signals, designated by the same reference characters as addresses, are the command data). In the selecting gate circuit 2606, when test mode detecting circuit 2604 detects the test mode, the transfer gates 2611 and 2613 are turned on and the transfer gates 2615 and 2617 are turned off. Therefore, to the gate circuits 2116 and 2118 shown in FIG. 102, address bits Ad10 and Ad9 are transmitted. When the test mode is reset, the output from test mode detecting circuit 2604 attains to "L", the transfer gates 2611 and 2613 are turned off and the transfer gates 2615 and 2617 are turned on.

When the test mode operation is designated by SCR mode, the test mode is maintained until the auto refresh mode (ARF mode) is designated or the test mode reset (setting of the bit Ad11 to "0") is carried out by using the SCR mode again. In the test mode operation, therefore, the output from test mode detecting circuit 2604 is kept at "H", the command data from command data register 2112 is neglected when the DRAM write transfer mode is designated, and the address bits Ad10 and Ad9 designated at the setting of the SCR mode are transmitted as the type identifying bits of the DRAM write transfer mode.

In the structure shown in FIG. 110, external address bits Ad0 to Ad11 are applied to the command registers 2602 and 2112. Since auto refreshing is carried out in the DRAM array when the SCR mode is designated, there may be a case that the refresh address is generated as the internal address, and the above signals are applied to prevent this state. Since the external addresses are taken as the command data, the command data can be set in the command register without affecting the operation of the DRAM in the active state of the DRAM array (in which the DRAM activate mode is carried out).

[Cache Operation]

Figure 111:
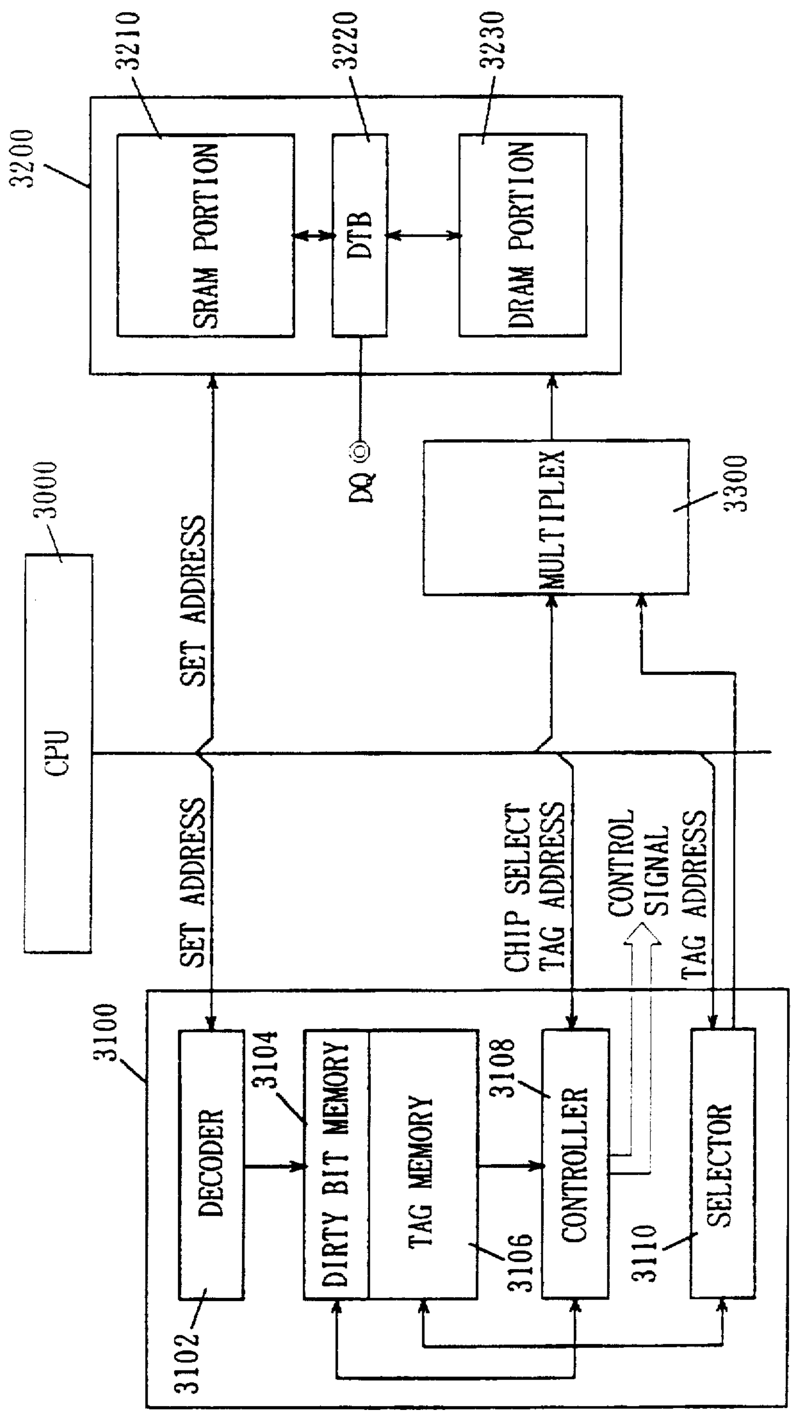
FIG. 111 shows an example of a structure of a data processing system utilizing the semiconductor memory device in accordance with another embodiment of the present invention.

FIG. 111 shows an example of the cache system structure. Referring to FIG. 111, the cache system includes a CPU3000 as an external processing unit, a CDRAM 3200 serving as a main memory and a cache memory, and a cache control circuit 3100 for controlling access to the CDRAM 3200. CDRAM 3200 includes a SRAM portion 3210 and a DRAM portion 3230 which are driven independent from each other and a bidirectional data transfer circuit (DTB) 3220 for carrying out data transfer between the SRAM portion 3210 and the DRAM portion 3230 as well as data output to the outside.

Cache control circuit 3110 includes a decoder 3102 for decoding a set address applied from CPU 3000 for generating a signal for selecting a corresponding set, a tag memory 3106 for storing a tag address for each set, a dirty bit memory 3104 for storing whether or not the content of the SRAM portion 3120 and DRAM portion 3230 corresponding to the tag address stored in the tag memory are different from each other, a controller 3108 receiving the chip select and tag address from CPU 3000 for reading the tag address of the set designated by the decoder 3102 in the tag memory 3106 for determining whether or not the tag addresses match with each other and for determining whether or not the chip select address designates the CDRAM 3200 and for generating a control signal in accordance with the result of determination, and a (copyback operation) selector 3100 for storing the tag address from the CPU 3000 to the corresponding sets of the tag memory 3106 at a time of a cache miss (when the tag address does not match) and for applying the internal address read from the tag memory 3106 to the CDRAM 3200.

In the CDRAM 3200, one row in the SRAM portion 3210 allows data transfer with an arbitrary column block of the DRAM portion 3230. Therefore, a desired type of mapping (direct mapping, set associative and full associative mapping) can be carried out.

Referring to FIG. 111, multiplex circuit 3300 time sequentially multiplexes and applies the row address and the column address at the time of an access to the DRAM portion 3230, and selects one of the address from CPU 3000 and the address from selector 3110 in cache control circuit 3110. The operation will be described.

In CDRAM 3200, in the DRAM array, one row can be maintained at the selected state by the DRAM activate mode (ACT mode). The data of the memory cells connected to this one row are amplified and latched by the DRAM sense amplifier. The DRAM sense amplifier is used as a cache in the present invention.

[Write Back Type Cache System]

In the write back system, the content of the cache memory is transferred to the main memory at the time of a cache miss. More specifically, data is transferred from the SRAM portion 3210 to the DRAM portion 3230 (copy back operation). There are two different methods of accessing to the CDRAM 3200 in the write back type cache memory. More specifically, (a) no allocation at the time of data writing (data is not written to the SRAM portion), and (b) data is written to the SRAM array at the time of a cache miss both in the reading and in writing operation (allocation).

(i) No allocation mode

Figure 112:
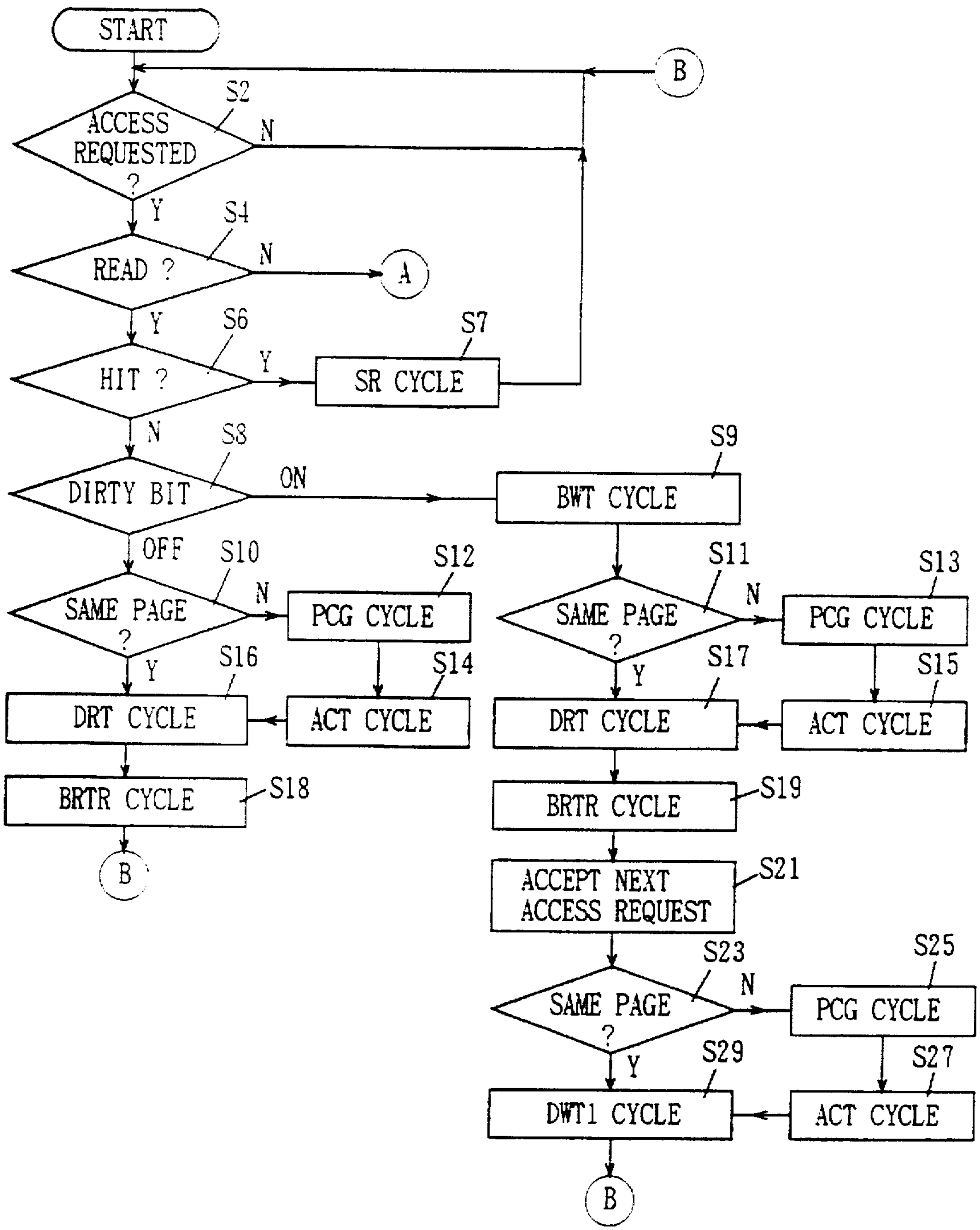
FIG. 112 is a flow chart showing a data reading sequence under the condition of no allocation in the write back mode operation of the semiconductor memory device in accordance with another embodiment of the present invention.

The access to the CDRAM without allocation will be described with reference to the operation flow of FIGS. 112 and 113.

When there is an access request from the CPU 3000 (step S2), then whether the operation is a data reading operation or a data writing operation is determined (step S4). Determination as to whether there is an access request is carried out by the controller 3108 shown in FIG. 111 (chip select terminal).

When it is determined in steps S4 that it is the data reading operation, then whether or not the data requested by the CPU 3000 is stored in the SRAM array or not is determined (step S6). When it is determined that the data required by the CPU 3000 is in the SRAM array (which is determined dependent on match/mismatch between the tag address stored in the external memory of the cache control circuit 3100 and the tag address applied from CPU 3000), the SRAM read mode (SR cycle) is designated (step S7). Consequently, in the SRAM array, selection of the memory cell is carried out in accordance with the block address and the set from the CPU address, and the data of the selected SRAM memory cell is read. After the step S7, the process returns to the step S2.

In step S6, when it is determined that the data required by the CPU 3000 is not in the SRAM array (cache miss), first whether or not the dirty bit is on or off is determined (step S8). If the dirty bit is off, it means that the content of the cache matches with the content of the maim memory. Namely, the change of data in the SRAM array has already been reflected to the data of the memory cell of the DRAM array. In that case, whether or not the same page is accessed is determined. More specifically, whether the CPU designates the row which has been selected in the DRAM array or not is identified (step S10).

Now, in the DRAM array, the row which has been selected in the previous cycle is always kept at the selected state. Since a portion of a set address and a tag address from the CPU or a CPU address corresponds to a DRAM row address, whether or not it is the same page is determined by comparing the address portions. This operation is carried out in the controller 3108 shown in FIG. 111. The row of the DRAM which is presently at the selected state is the row selected in accordance with the tag address stored in the tag memory at the time of cache miss in a previous cycle, or the row which has been designated by the CPU address. After the copy back operation, a new row may be selected in accordance with the CPU address. Alternatively, the row selected in accordance with the tag address may be set to the selected state. Either structure may be used.

In step S10, when it is determined that it is not the same page, that is, when it is determined that another row of the DRAM array is designated, the DRAM precharge mode (PCG cycle) is executed (step S12). Consequently, the row which has been at the selected state is set to the non-selected state in the DRAM array.

Thereafter, the DRAM activate mode (ACT cycle) operation is carried out (step S14). Consequently, one row of the DRAM array is set to the selected state in accordance with the CPU address applied at present, and data of the memory cells connected to the selected one row is sensed, amplified and latched by the DRAM sense amplifier.

When it is determined in step S10 that it is the same page, or when the DRAM activate mode operation is carried out in step S14, the DRAM read transfer mode (DRT cycle) is carried out (step S16). Consequently, data of those memory cells connected to the selected row of the DRAM array which are in the column block designated by the column block address are transferred to the read data transfer buffer circuit.

Then, the buffer read transfer/read mode (BRTR cycle) operation is carried out (step S18). In this operation mode, data stored in the read data transfer buffer are transmitted to the selected row in accordance with the CPU address in the SRAM array, and data is read parallel to the data transfer operation to the SRAM array in accordance with the CPU address (data may be directly read from the read data transfer buffer circuit).

In step S8, when the dirty bit is on, it shows that the content of the SRAM array and the corresponding set of the DRAM array differ from each other. In that case, the SRAM buffer write transfer mode (BWT cycle) is carried out (step 9). Consequently, the data of the memory cells of the row selected by the CPU address in the SRAM array are transmitted to the write data transfer buffer circuit. Then, as in step S10, whether or not the same page is accessed is determined (step S11).

In step S11, when it is determined that it is not the same page, the DRAM precharge mode (PCG cycle) and the DRAM activate mode (ACT cycle) operations are successively carried out (steps S13 and S15). Consequently, in the DRAM array, row selection is carried out in the DRAM array in accordance with the address applied at present from the CPU, and the data of the memory cells connected to the selected row are sensed, amplified and latched by the sense amplifier. Then, the DRAM read transfer mode (DRT cycle) and the buffer read transfer/read mode (BRTR cycle) are carried out (steps S17 and S19). Consequently, data can be read at high speed even at a cache miss or a page miss.

Then, the control waits for the next access request (step S21). It is determined whether or not the next access request designates the same page is carried out (step S27). At this time, the determination as to whether the same page is accessed is carried out by determining whether or not the row to which the memory cells having data stored in the write data transfer buffer circuit in the buffer write transfer mode (BWT cycle) in step S9 belongs and the row which is selected at present in the DRAM array are the same row or not. This determination can be made by using the tag addresses. When it is determined in step S23 that they are the same page, the DRAM write transfer 1 mode (DWT1 cycle) is carried out (S29). Therefore, the data stored in the write data transfer buffer circuit is transferred to the corresponding position of the DRAM array.

When they are not the same page, again the DRAM precharge mode (PCG cycle) and the DRAM activate mode (ACT cycle) are successively carried out (steps S25 and S27), and a row of the DRAM array onto which the data stored in the write data transfer buffer circuit are to be stored is set to the selected state. After step S27, the process proceeds to step S29. Thus the content of the set in the SRAM array matches the content of the corresponding set of the DRAM array.

After the steps S18 and S29, the process again returns to step S2 to wait for the next access.

Figure 113:
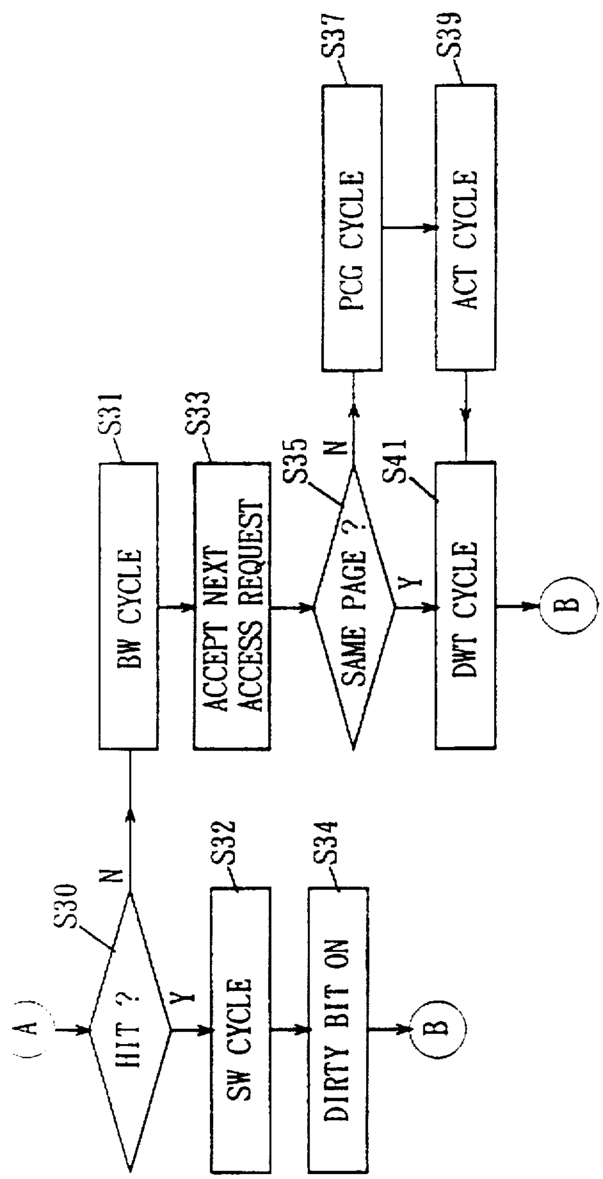
FIG. 113 is a flow chart showing a data writing sequence under the condition of no allocation in the write back mode of the semiconductor memory device in accordance with another embodiment of the present invention.

In step S4, when it is determined as a data writing operation, the data flow shown in FIG. 113 is carried out. When data writing operation is designated, first it is determined whether or not the memory cell to which access is requested by the CPU exists in the SRAM array (step S30). If it is determined that the memory cell to which writing is to be done exists in the SRAM array, that is, at the time of a cache hit, the SRAM write mode (SW cycle) is carried out (step S32), and data is written to the corresponding memory cell of the SRAM array in accordance with the CPU address. Thereafter, the corresponding dirty bit in the control circuit 3100 is turned on. Consequently, a state is indicated in which the content of the SRAM array and the content of the corresponding data block of the DRAM array are different from each other (step S34). After the completion of step S34, the process returns to the step S2 shown in FIG. 112.

If it is determined in step S30 that a cache miss occurs, the buffer write mode (BW cycle) is carried out (step S31). Consequently, in accordance with the CPU address of the SRAM, write data is written to the corresponding position of the write data transfer buffer circuit. Then, with this write data latched in the write data transfer buffer circuit, the process halts to wait for the next access request (step S33). When the next access request is applied, it is determined whether or not this access request designates a row which is at the selected state in the DRAM array at present (step S35).

When it is determined that the CPU requests an access to a row which is different from that row which is at the selected state in the DRAM array at present, steps S37 and S39 are carried out, the DRAM array is precharged and activated, and a row corresponding to the CPU address is set to the selected state. Thereafter, the DRAM write transfer mode (DWT cycle) is carried out, and the data which has been stored in the write data transfer buffer circuit is written to a corresponding position in that row which is at present selected in the DRAM array (step S41). Step S41 is also carried out when it is determined in step S35 that the same page is being accessed. After the completion of the step S41, the process returns to the step S2.

As described above, by using the sense amplifiers of the DRAM portion as a cache, when the data of the memory cell requested by the CPU is not stored in the SRAM portion but latched by the sense amplifier in the DRAM array, data writing/reading can be carried out at high speed.

In data transfer from the write data transfer buffer circuit to the DRAM array, as long as the CPU accesses the same row of the DRAM array, the command DWT (DWT1) is carried out continuously, enabling high speed data writing.

(ii) Allocate Operation Mode

Figure 114:
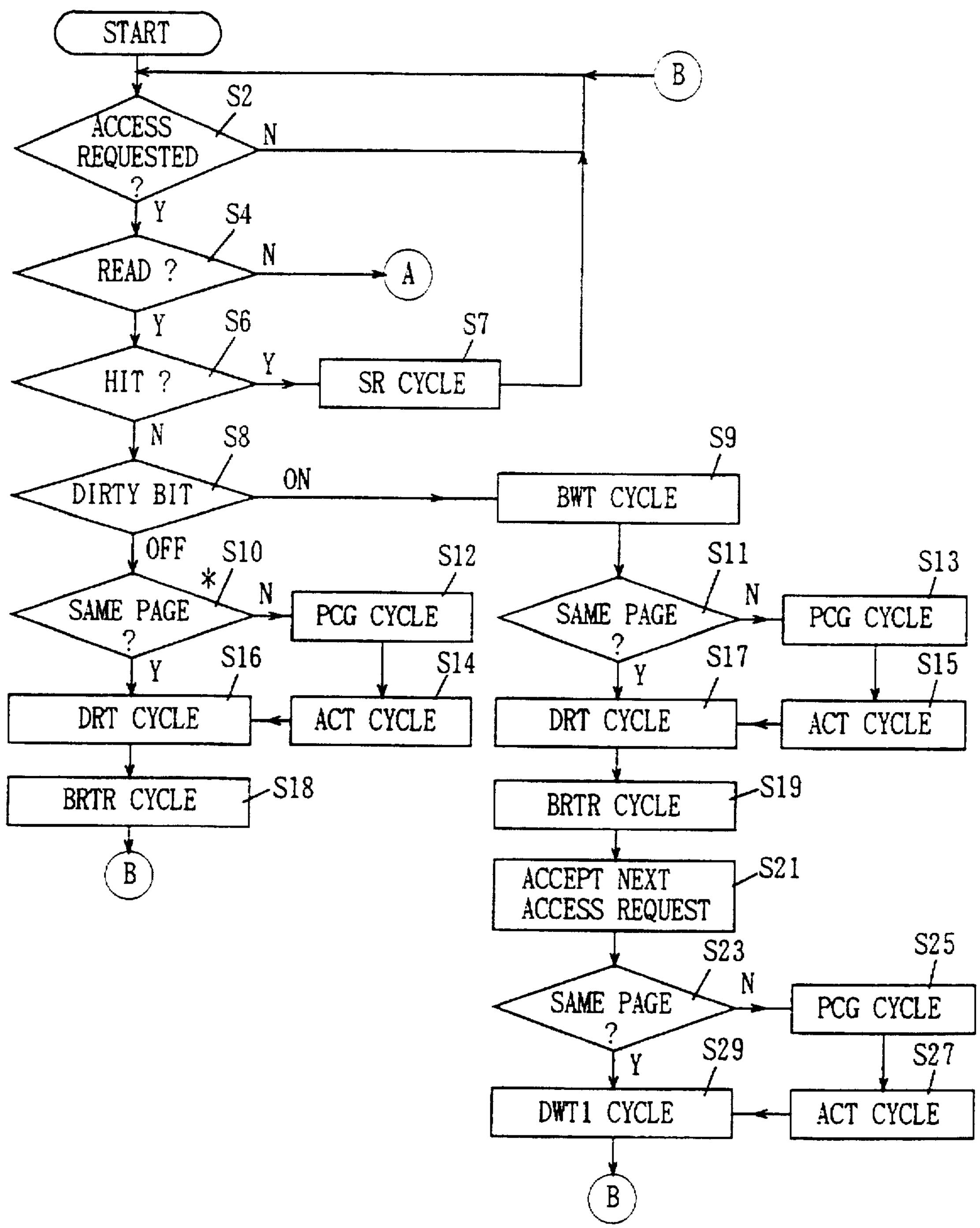
FIG. 114 is a flow chart showing data reading operation sequence under the condition of allocation in write back mode of the semiconductor memory device in accordance with another embodiment of the present invention.
Figure 115:
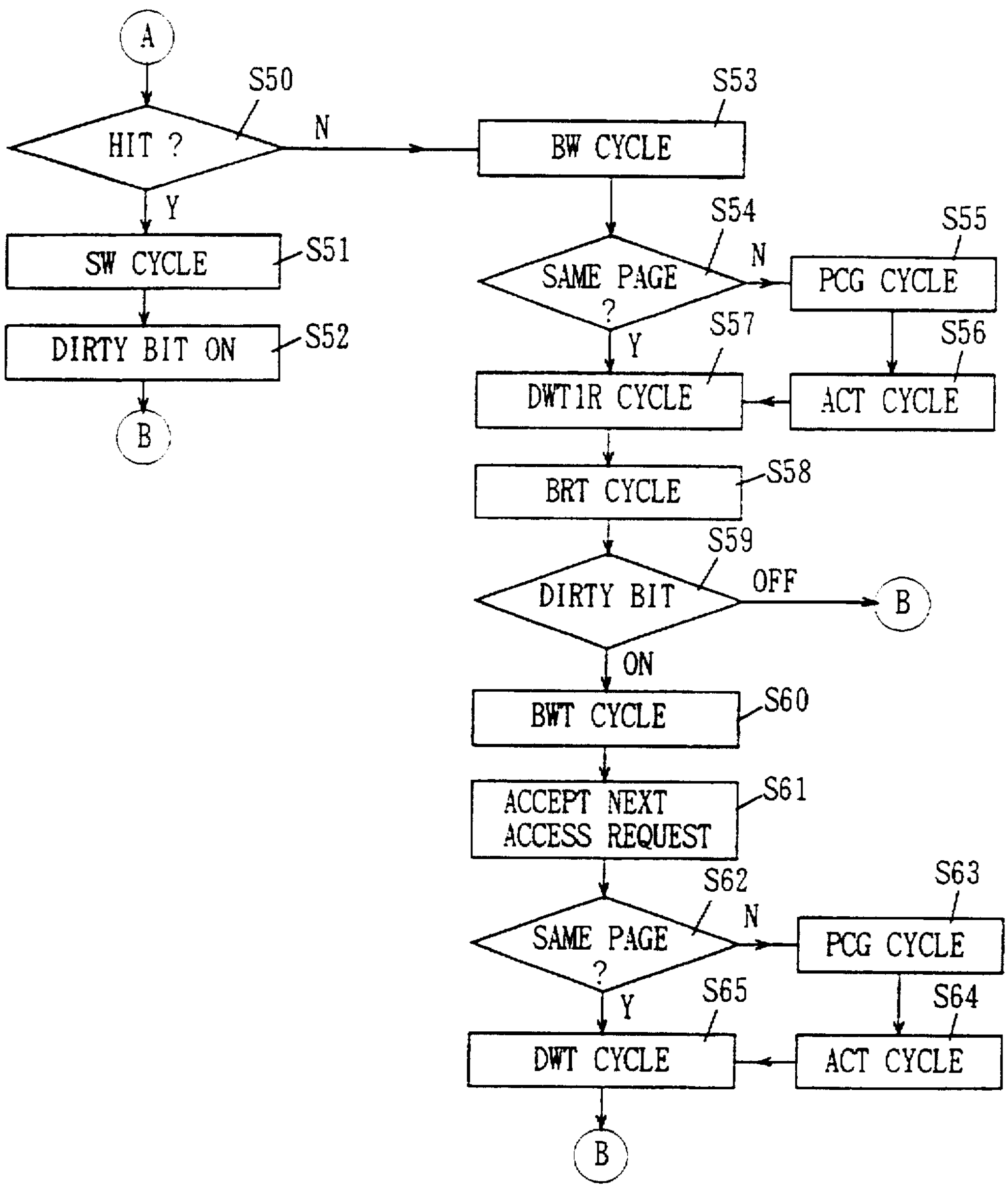
FIG. 115 is a flow chart showing data writing operation sequence with allocation in the write back mode of the semiconductor memory device in accordance with another embodiment of the preset invention.

FIGS. 114 and 115 are flow charts showing access to the cache memory when an allocation is effected at the time of a cache miss in a cache memory which carries out write back operation. The access operation of the CDRAM will be described with reference to FIGS. 114 and 115.

FIG. 114 is a flow chart showing the operation in data reading. The operation flow shown in FIG. 114 is the same as the previous flow of operation without allocation shown in FIG. 112, and therefore, corresponding steps are denoted by the same reference numerals and the detailed description is not repeated.

FIG. 115 is a flow chart showing data writing operation with allocation in the cache system implementing write back. In the data writing operation, first in step S50, whether or not a cache hit occurs is determined. If a cache hit is determined to occur, the SRAM write mode (SW cycle) is carried out (step S51). In accordance with the CPU address, data is written to the corresponding memory cell of the SRAM array. Thereafter, in the cache control circuit 3100, the dirty bit which corresponds to the set designated by the CPU address is set to the on state (step S52). Then, the process returns to step S2 shown in FIG. 114.

When it is determined in step S50 that the access is a cache miss, the buffer write mode (BW cycle) is carried out (step S53). Then, it is determined whether or not the access request of the CPU designates a memory cell on that row which is at the selected state in the DRAM array at present (step S54). If the CPU address does not match the row address of the row of the DRAM array which is at the selected state at present, the DRAM precharge mode (PCG cycle) is carried out (step S55), and then, in accordance with the CPU address, the DRAM array activate mode (ACT cycle) operation is carried out (step S56).

When it is determined in step S54 that the same page is accessed and after the step S56, the DRAM write transfer 1/read mode (DTW1R cycle) is carried out (step S57). Consequently, data stored in the write data transfer buffer circuit is written to the corresponding column block position in the selected row of the DRAM array. By the command DWT1R, the data of the selected column block are transferred to the read data transfer buffer circuit, together with the data writing to the DRAM array. Thereafter, the buffer read transfer mode (BRT cycle) is carried out (step S58). Consequently, the data transferred to the read data transfer buffer circuit is stored to the corresponding row of the SRAM array. Thus the write data is stored both in the DRAM array and the SRAM array.

Thereafter, whether or not the dirty bit is on or off is determined (step S59). If the dirty bit is off, the process returns to the steps S2. If the dirty bit is on, the buffer write transfer mode (BWT cycle) is carried out, and the memory cell data of the SRAM designated by the CPU address is transferred to the write data transfer buffer circuit (step S60). Then, when a next access request is applied (step S61), it is determined whether or not the data to which access is requested by the CPU at this time exist on that row which is at the selected state in the DRAM array at present (step S62). If it is determined that the access is not to the same page, the precharge mode (PCG cycle) and the DRAM activate cycle mode (ACT cycle) are carried out successively (steps S63 and S64), and the row selecting operation of the DRAM array is carried out in accordance with the CPU address. When it is determined in step S62 that the access is for the same page or after the completion of step S64, the DRAM write transfer mode (DWT cycle) is carried out. Consequently, the data which has been stored in the write data transfer buffer circuit is transferred to the corresponding position on the selected row of the DRAM array (step S65). By the above described operation mode, in the DRAM array, the row in accordance with the CPU address is constantly at the selected state, the DRAM sense amplifier can be used as a pseudo cache at the time of a cache miss, and thus the penalty of access time at the time of cache miss can be minimized.

[Write Through Mode]

In the write through mode, when data is written to the SRAM array, the written data is always written to the corresponding memory cell of the DRAM array. In that case, the flow of operation differs dependent on the presence/absence of allocation.

(a) Write Through Method with Allocation

Figure 116:
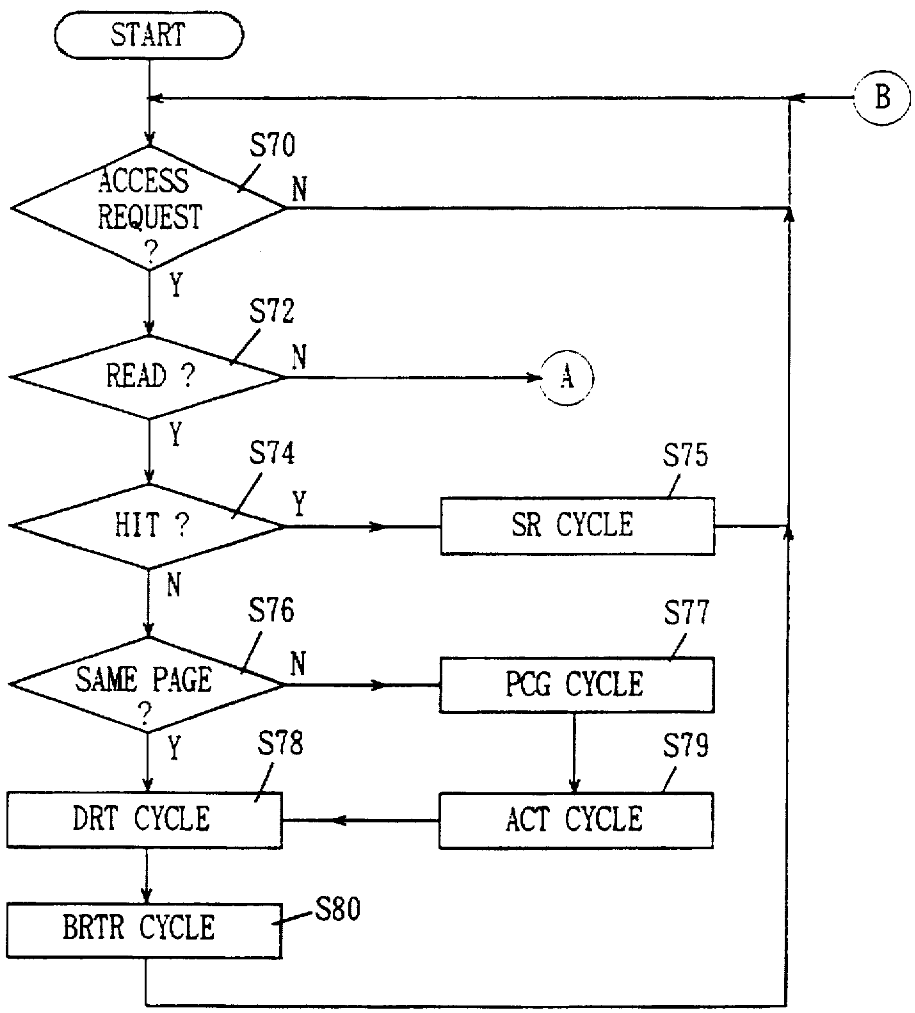
FIG. 116 is a flow chart showing the data reading operation sequence with allocation in the write through mode of the semiconductor memory device in accordance with another embodiment of the present invention.
Figure 117:
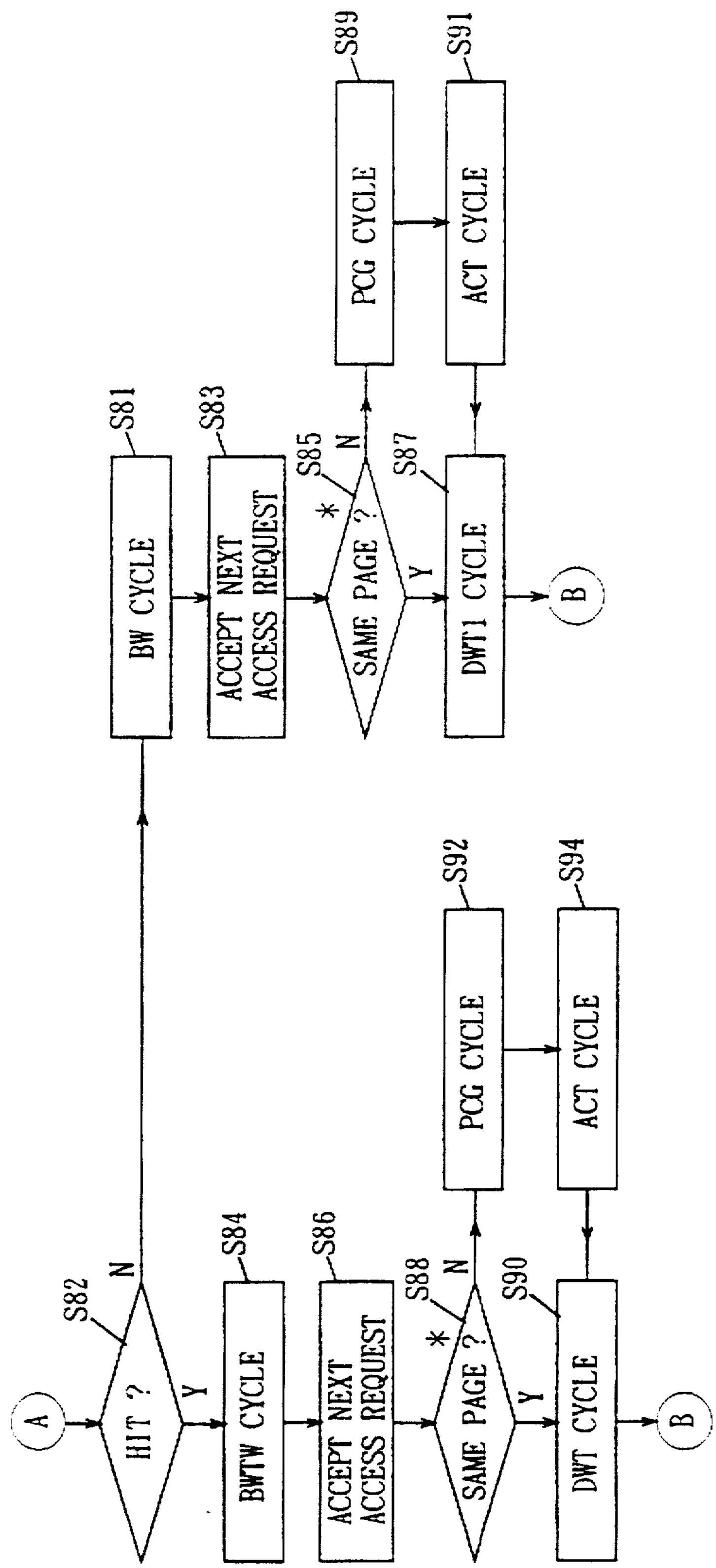
FIG. 117 is a flow chart showing data writing operation sequence with allocation in the write through mode of the semiconductor memory device in accordance with another embodiment of the present invention.

FIGS. 116 and 117 are flow charts of operation when allocation is effected in accordance with the write through method. The access to the CDRAM in the cache memory system will be described with reference to FIGS. 116 and 117.

First, referring to FIG. 116, data reading operation will be described.

When there is an access request from the CPU (step S70), whether the access requests the data reading operation or the data writing operation is determined (step S72). If it is determined to be the data reading operation, then cache hit/miss is determined (step S74). At the time of a cache hit, the SRAM read mode (SR cycle) operation is carried out, and the data of the memory cell designated by the CPU address in the SRAM array is read (step S75). After step S75, the control returns to the step S70.

At the time of a cache miss, first, whether or not the CPU address designates that row which is at the selected state in the DRAM array at present is determined (step S76). If it is determined that the CPU address designates that row of the DRAM array which is at present selected, then the DRAM read transfer mode (DRT cycle) operation is carried out (step S78). Therefore, data of the column block designated by the CPU address in the DRAM array is transferred to the read data transfer buffer circuit. In step S76, if it is determined that the CPU address designates a different row of the DRAM, the DRAM precharge mode (PCG cycle) and the DRAM activate mode (ACT cycle) are carried out (steps S77 and S79). In the DRAM array, the row designated by the CPU address is set to the selected state, and by the DRAM sense amplifiers, data of the memory cells connected to the selected row are latched. After the step S79, the step S78 is carried out, and the data block designated by the CPU address is transferred to the read data transfer buffer circuit.

Then, the buffer read transfer/read mode (BRTR cycle) is carried out (step S80), the data stored in the read data transfer buffer circuit is transferred to the corresponding position of the SRAM array, and the data requested by the CPU is read. After the completion of step S80, the process returns to the step S70.

In step S72 shown in FIG. 116, if it is determined that the write mode is designated, the operation shown in FIG. 117 is carried out. First, cache hit/miss is determined (step S82). If it is determined to be a cache hit, the buffer write transfer/write mode (BWTW cycle) operation is carried out. Consequently, external write data is written to the memory designated by the CPU address of the SRAM array, and to the corresponding register of the write data transfer buffer circuit. In this operation mode, in the write data transfer buffer circuit, the data of the row selected in the SRAM array as well as the write data are stored.

After step S84, when the next access request is applied (step S86), whether or not this access request designates that row of the DRAM array which is at the selected state is determined (step S88). If it is determined that the same row is designated, that is, when it is determined that the same page is designated, the DRAM write transfer mode (DWT cycle) is carried out (step S90). Consequently, data stored in the write data transfer buffer circuit is transferred to the selected column (designated by the CPU address) of the DRAM array.

In step S88, when a row different from the selected row of the DRAM array is designated, the DRAM precharge mode (PCG cycle) and the DRAM activate mode (ACT cycle) operations in accordance with the CPU address are successively carried out in order to set the row designated by the CPU address to the selected state (steps S92 and S94). By the step S94, the row in accordance with the CPU address is set to the selected state in the DRAM array, the data of the memory cells connected to the selected row are sensed, amplified and latched by the sense amplifier, the process returns to the step S90 and the DRAM write transfer mode operation is carried out.

If it is determined in step S82 that the access is a cache miss, the buffer write mode (BW cycle) operation is carried out (step S81). Consequently, external write data is written to the corresponding buffer of the write data transfer buffer circuit. The process halts to wait for the next access request at this state. When the next access request is applied (step S83), whether or not the same page is designated is determined in the similar manner as in step S88. If it is determined to be the same page, the DRAM write transfer 1 mode (DWT 1 cycle) operation is carried out (step S87). Consequently, write data which has been stored in the write data transfer buffer circuit is transmitted to the selected column of the DRAM array.

When it is determined in step S85 that a different page is designated, the DRAM precharge mode and the DRAM activate mode are carried out successively (steps S89 and S91), and the row designated by the CPU address is set to the selected state in the DRAM array. Thereafter, step S87 is carried out and data written in the write data transfer buffer circuit is transferred to the corresponding position of the DRAM array. After the steps S90 and S87, the control returns to the step S70.

(b) Write Through Without Allocation

Figure 119:
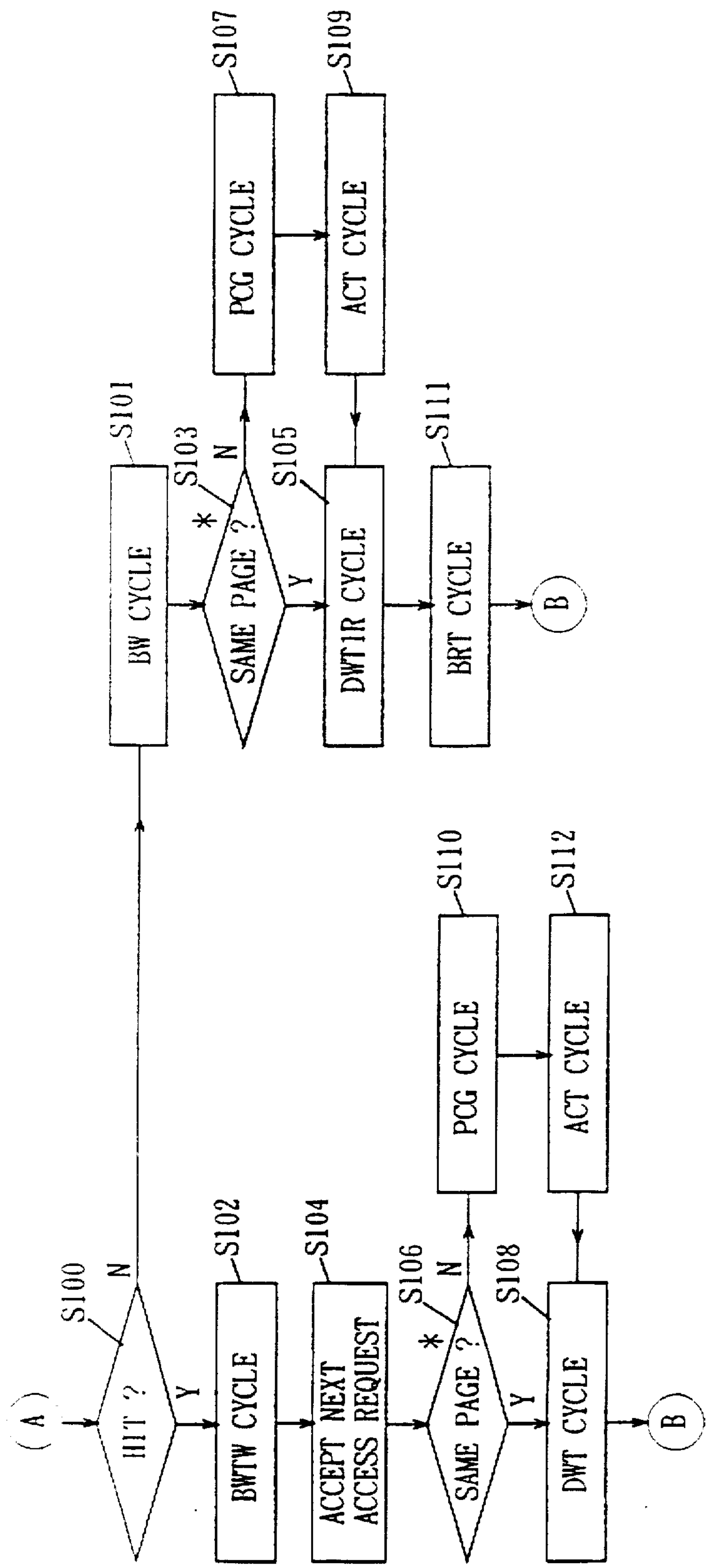
FIG. 119 is a flow chart showing the data writing operation sequence under the condition of no allocation in the write through mode of the semiconductor memory device in accordance with another embodiment of the present invention.

FIGS. 118 and 119 are flow charts showing an access operation of the CDRAM without allocation in the cache memory of the write through type. The flow of operation will be described with reference to FIGS. 118 and 119. FIG. 118 shows the flow in the data reading operation. This is the same operation as the write through with allocation shown in FIG. 116, and therefore the corresponding steps are denoted by the same reference numerals and the detailed description thereof is not repeated.

The data writing operation without allocation in accordance with the write through method will be described with reference to the flow chart of FIG. 119.

In step S100, cache hit/miss is determined. If it is determined to be a cache hit, the buffer write transfer mode (BWTW cycle) is carried out (step S102). By this cycle BWTW, external write data is written to the corresponding memory cell in the SRAM array, and the data block (one row) of the SRAM including the written data is written to the write data transfer buffer circuit. The control waits for the next access at this state.

When there is a next access request (step S104), whether or not the CPU address designates that row which is at the selected state at present in the DRAM array is determined (step S106). If the CPU address designates the selected row in the DRAM array, the DRAM write transfer mode (DWT cycle) is carried out (step S108). Consequently, data stored in the write data transfer buffer circuit is transmitted to the corresponding column block of the selected row in the DRAM array.

If it is identified in step S106 that the CPU address does not designate the selected row of the DRAM array, the DRAM precharge mode (PCG cycle) is carried out in the DRAM array, which in turn returns to the precharge state (step S110). Then, by using the CPU address, the DRAM activate mode (ACT cycle) is carried out, one row is selected in the DRAM array, and the data of the memory cells connected to the selected row are sensed, amplified and latched by the sense amplifier (step S112). Thereafter, step S108 is carried out, and the data which has been stored in the write data transfer buffer circuit is transmitted to the corresponding position of the selected row of the DRAM.

In step S100, when it is determined to be a cache miss, the buffer write mode (BW cycle) is carried out first, and external data is written to the write data transfer buffer circuit (step S101). Then, whether or not the CPU address designates that row which is selected in the DRAM array is determined (step S103), and if it is determined that the CPU address designates the selected row of the DRAM (that is, when it is determined that the same page is designated), the DRAM write transfer 1/read mode (DWT1R cycle) is carried out (step S105). Thus the data stored in the write data transfer buffer circuit is transmitted to the corresponding position of the selected row in the DRAM array, and also transferred to the read data transfer buffer circuit.

In step S103, when it is determined that the same page is not designated, then the DRAM precharge mode (PCG cycle) is carried out (step S107), and then the DRAM activate mode (ACT cycle) is carried out in accordance with the CPU address (step S109). Consequently, the page designated by the CPU address is selected in the DRAM array, and then the DWT1R cycle is carried out (step S105). Then, the buffer read transfer mode (BRT cycle) is carried out, and data which has been stored in the read data transfer buffer circuit is transmitted to that row which is designated by the CPU address in the SRAM array.

As described above, in the data writing operation, when data is written to the SRAM array or the write data transfer buffer circuit, the hit operation for another address can be carried out soon, allowing high speed access.

[Detailed Structure of the Bidirection Data Transfer Circuit]

Figure 120:
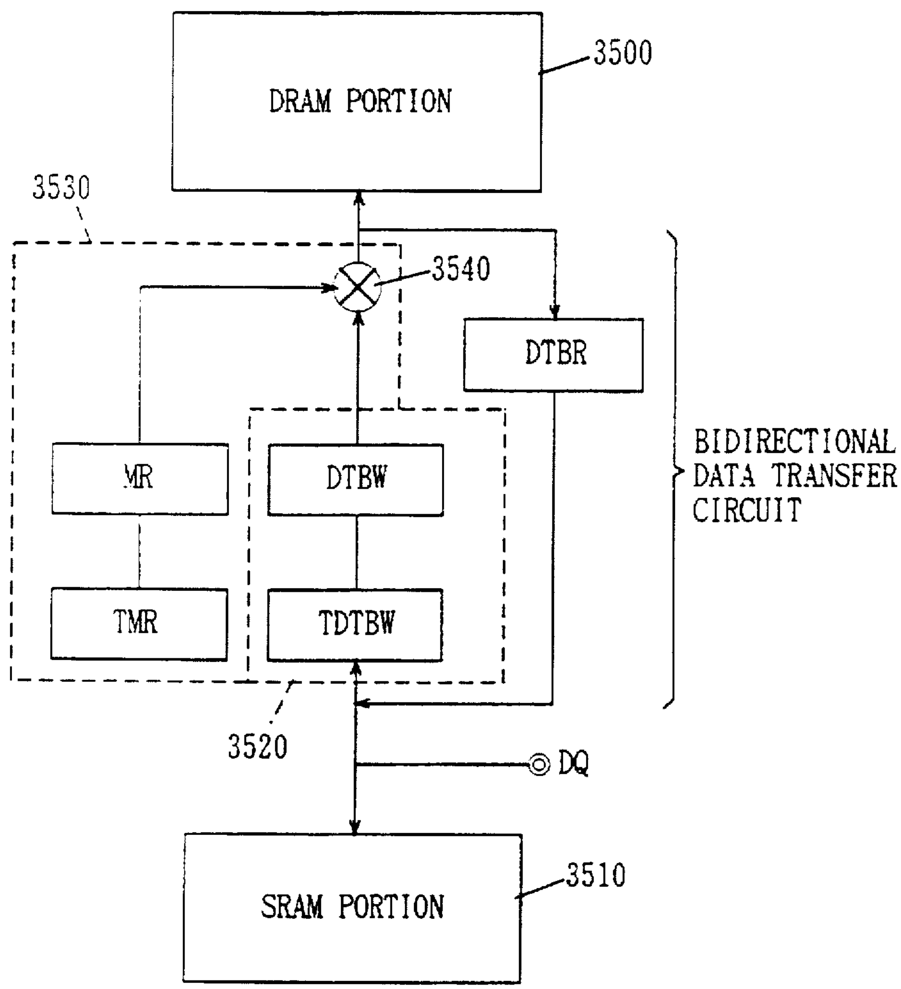

FIG. 120 shows the structure of the bidirectional data transfer circuit. Referring to FIG. 120, the bidirectional data transfer circuit includes a write data transfer circuit 3520 for transferring data to the DRAM portion 3500, and a mask circuit 3530 for masking transfer of write data to the write data transfer circuit 3520. The write data transfer circuit includes a temporary write data register TDTBW for temporarily storing data, and a write data transfer buffer TDBW receiving data from the temporary register TDTBW for transferring the data to the DRAM portion 3500. Sometimes the write data transfer buffer DTBW transfers data also to the read data transfer buffer DTBW.

The mask circuit 3530 includes a temporary mask register TMR, a master mask register MR receiving the mask data from temporary mask register TMR, and a mask gate circuit 3540 receiving the mask data from master mask register MR for masking the write data from the write data transfer buffer DTBW. The operation for masking the write data transfer will be described briefly.

Figure 121:
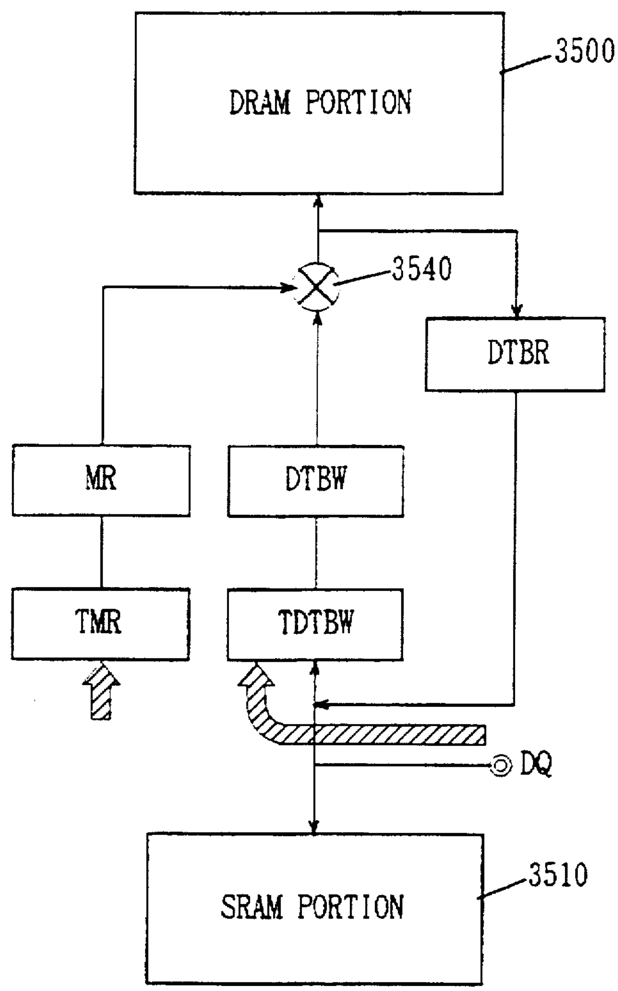

First, referring to FIG. 121, an operation when the burst write mode operation is carried out will be described.

In this case, externally applied data is written to a corresponding register of the temporary register TDTBW in accordance with the output from the column decoder. Parallel to the data writing to the temporary register TDTBW, the mask data of the corresponding register is reset in the temporary mask register TMR. The reset mask data permits passage of data. The mask data which is set inhibits passage of data.

Figure 122:
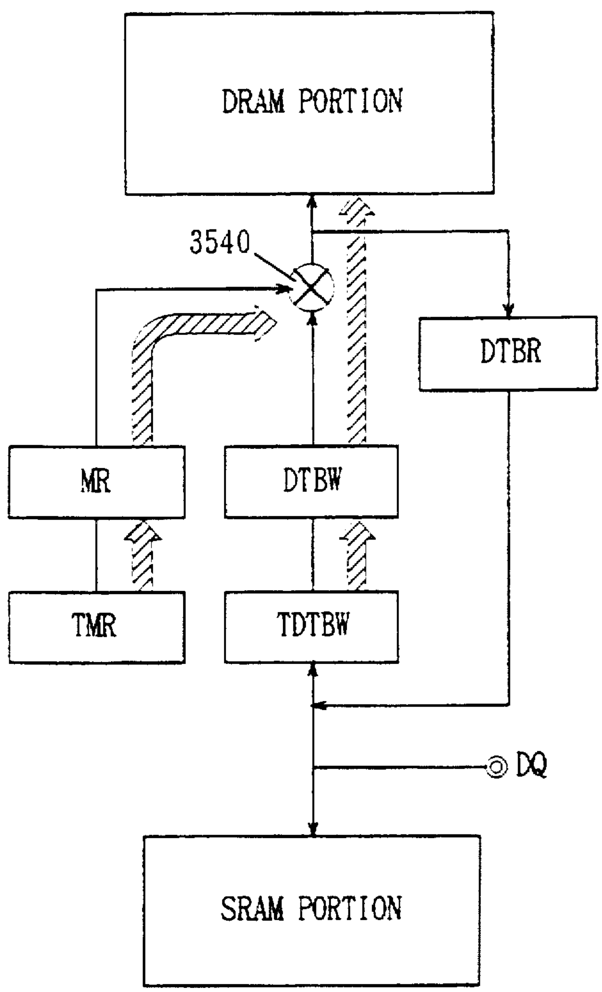

Referring to FIG. 122, the write data transfer operation to the DRAM array will be described. When the DRAM write transfer 1 mode is designated, the data stored in the temporary register TDTBW is transferred to the write data transfer buffer DTBW. In parallel to this transfer, the mask register of the temporary mask register TMR is transferred to the master mask register MR, and then transmitted to the mask gate circuit 3540. The mask gate circuit 3540 masks the write data from the write data transfer buffer DTBW in accordance with the applied mask data, and transfers the same to the DRAM array.

Data transfer from the temporary register TDTBW and TMR to the corresponding buffers DTBW and MR is carried out in the first cycle after the designation of data transfer. At the end of the first cycle, the mask data of the temporary mask register TMR are all set to the set state. It becomes possible from the next cycle to write data to the write data transfer circuit (temporary data register) in accordance with the buffer write mode. Since the mask register is provided, it becomes possible to write only the necessary data to the DRAM array. When data is transferred from the SRAM array, the mask data in the temporary mask register are all reset. In that case, the data of the write data transfer buffer are all transferred to the DRAM array portion. The transfer operation of the write data will be described with reference to the specific waveforms of operation.

Figure 123:
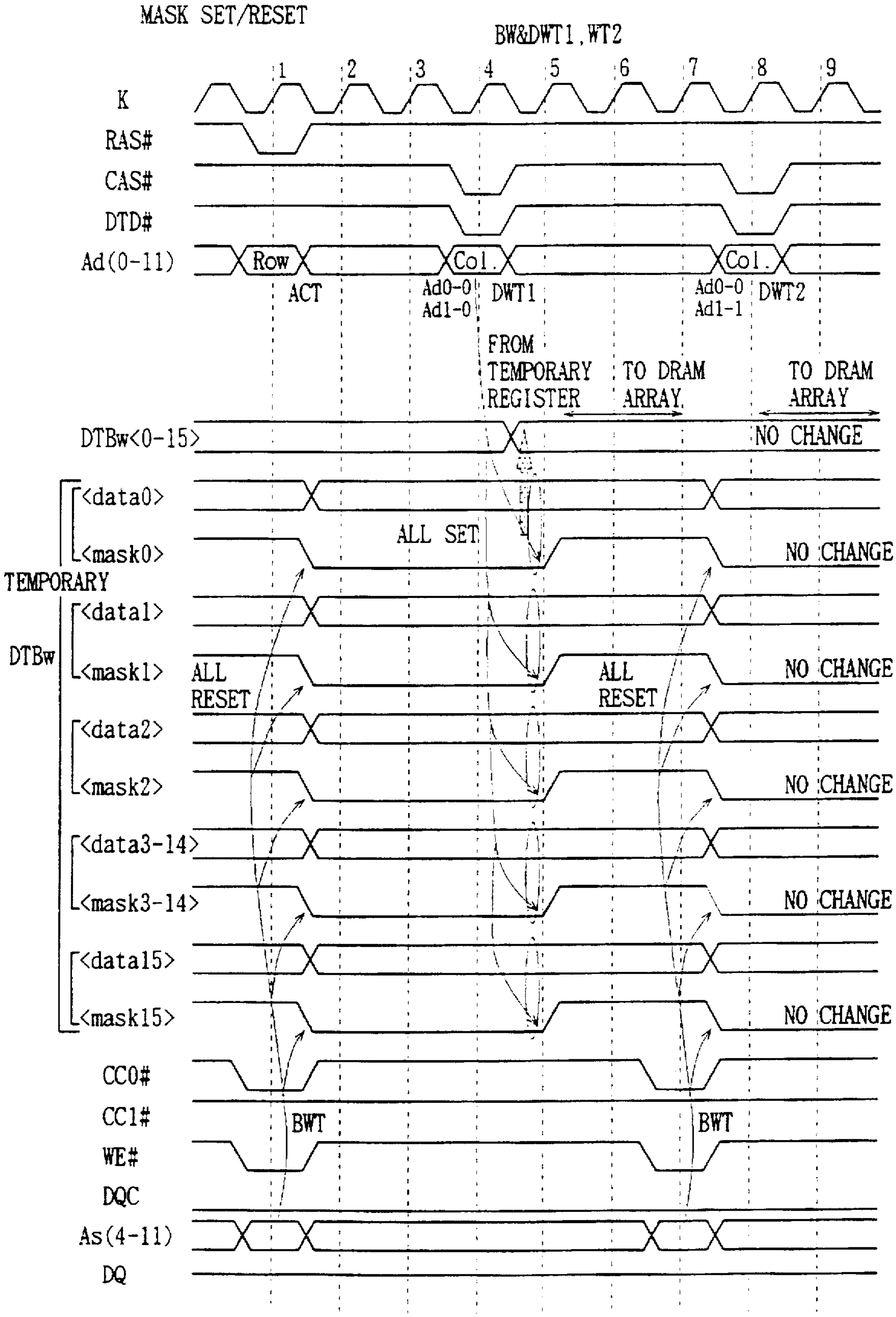

FIG. 123 is a diagram of waveforms showing the operation of the bidirectional data transfer circuit when data transferred from the SRAM array is written to the DRAM array. Referring to FIG. 123, in the first cycle of the master clock K, the DRAM activate mode (ACT cycle) operation is carried out in the DRAM portion. Consequently, row selecting operation is carried out in the DRAM array. In the SRAM array, the buffer write transfer mode (BWT cycle) is designated in accordance with the conditions of the control clocks CC0#, CC1# and the write enable WE#. Consequently, data of one row of memory cells (16 bits) selected in the SRAM array are transferred to the temporary data register (data 0 to data 15). In the data transfer cycle from the SRAM array to the temporary data register, the mask data, mask 1 to mask 15, of the temporary mask register are all reset.

In the fourth cycle of the master clock K, the DRAM write transfer 1 mode (DWT1 cycle) is designated by the column address strobe CAS# and the data transfer designation DTD#. In the DWT1 cycle, data, data 0 to data 15 stored in the temporary register are transferred to the write data transfer buffer DTBW <0–15> (DTBW0–DTBW15). At the end of the first cycle of the DWT1 cycle, the mask data in the temporary mask register are all set. From the fifth cycle of the master clock K, data transfer from the SRAM array to the temporary data register becomes possible.

After the lapse of the latency of the DWT1 cycle, the write data has already been transferred to the DRAM array from the write data transfer buffer DTBW in accordance with the mask data. In the seventh cycle of the master clock K, the BWT cycle is determined again, and the mask data of the temporary mask register are all reset. In the eighth cycle of the master clock K, the DRAM write transfer 2 (DWT2) mode operation is designated. In this case, the data transfer operation between the temporary data register and the write data transfer buffer is not carried out. The data stored in the write data transfer buffer is transmitted to the selected memory block of the DRAM array.

After the ninth cycle of the master clock K, NOP (No Operation) mode is designated, and the internal state of the CDRAM does not change.

At the time of write data transfer from the SRAM array, the mask data of the temporary mask register are all reset. Meanwhile, in data transfer from the write data transfer buffer to the DRAM array, that is, at the data transfer from the temporary data register to the write data transfer buffer, the mask data of the temporary mask register are all set at the completion of that cycle (clock cycle).

Figure 124:
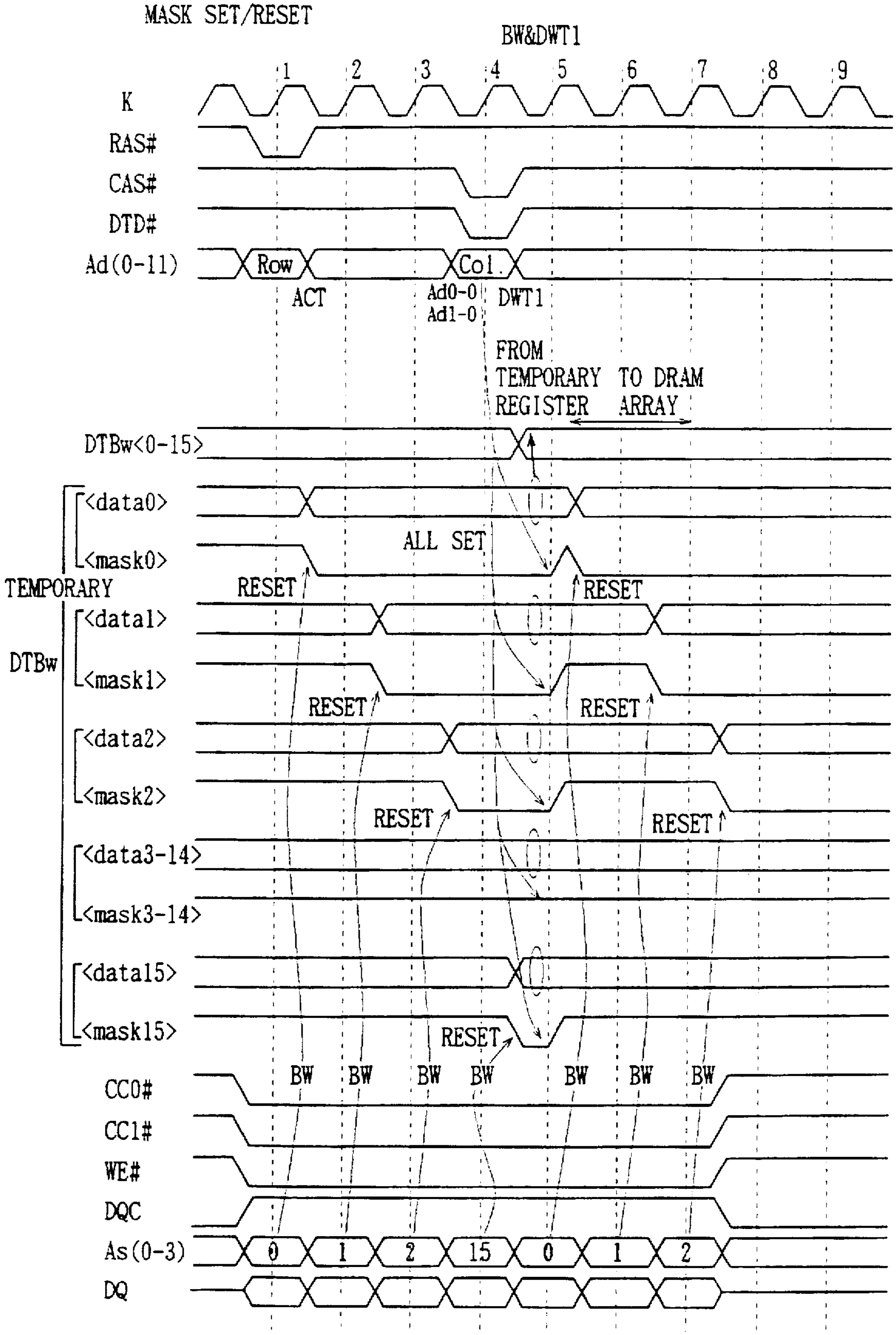

FIG. 124 is a diagram of signal waveforms showing the change of the mask data when the buffer write mode operation is carried out. Referring to FIG. 124, in the first clock cycle of the master clock K, the DRAM activate mode (ACT cycle) is carried out. Meanwhile, in the SRAM portion, the burst write mode (BW cycle) is carried out, and externally applied data (data 0) is written to the corresponding register of the temporary data register in accordance with the address bits As0 to As3. In parallel to the data writing, the mask data (mask 0) of the corresponding temporary mask register is reset. Thereafter, 16 bits of data at the most can be repeatedly written to the temporary data register (the temporary data register and the write data transfer buffer have the width of 16 bits). In writing of each data, the mask data of the corresponding temporary mask register is reset.

In the fourth cycle of the master clock K, in the DRAM portion, the DWT1 cycle is generated. When this operation mode is designated, in the first cycle (the fourth clock cycle of the master clock K), data transfer from the temporary data register to the write data transfer buffer is carried out. At the completion of the first cycle, the mask data of the temporary mask register are all set. The write data which has been transferred to the write data transfer buffer is then transmitted to the selected memory cell block of the DRAM array. After the data transfer from the temporary data register to the write data transfer buffer, that is, in the second cycle of the DWT1 cycle mode, it is possible to write data to the temporary data register. In FIG. 124, the buffer write (BW) operation is carried out again from the fifth cycle of the master clock K. In parallel with the data writing, the mask data of the corresponding temporary mask register is reset.

In carrying out the above described operation, the data transfer to the DRAM array can be surely masked by transferring the mask data. Since there is the two stage structure of the temporary register and the write data transfer buffer, it becomes possible to transfer write data from the outside or from the SRAM array even during data transfer to the DRAM array, which enables high speed access.

Figure 125:
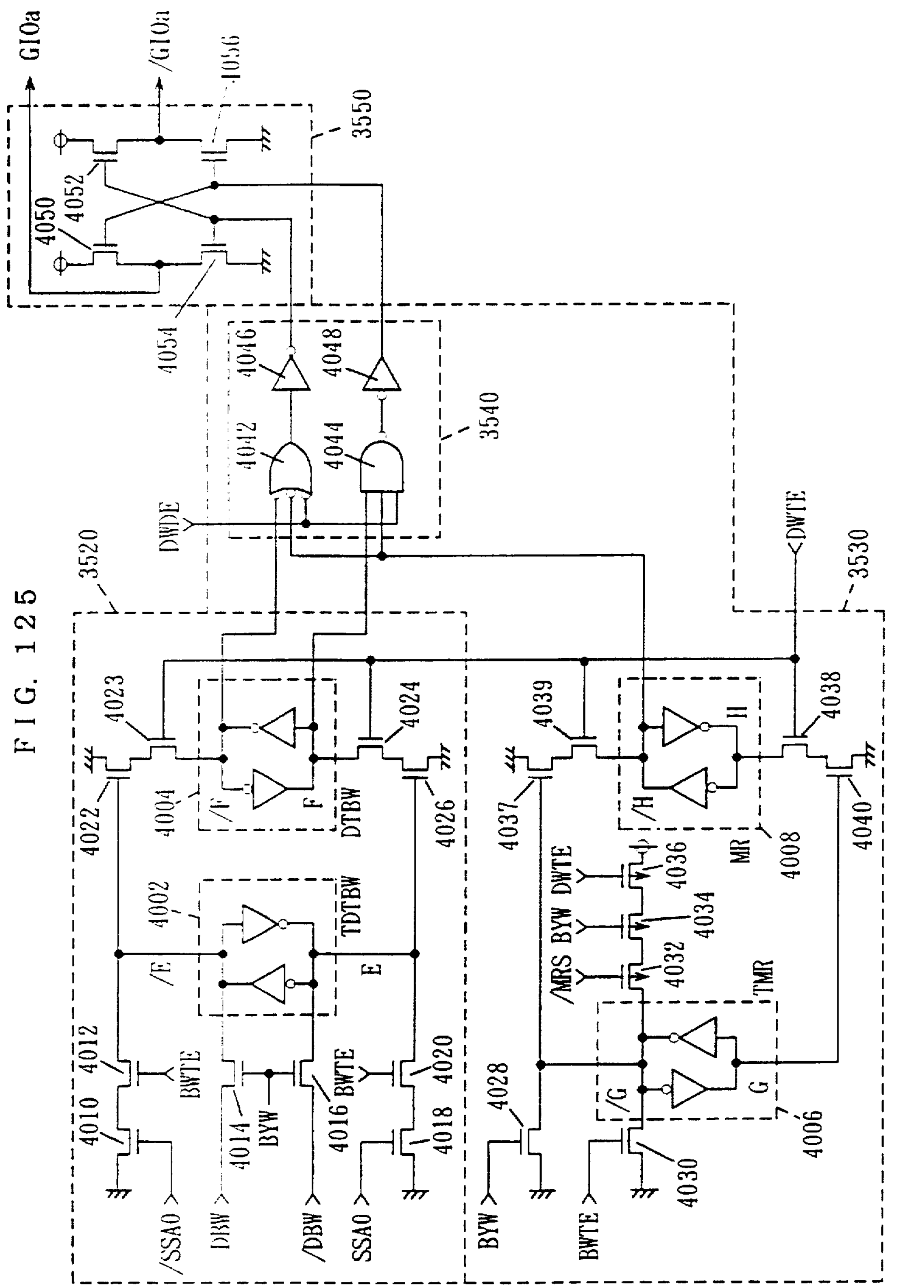

FIG. 125 shows the structure of the write data transfer system. Referring to FIG. 125, the write data transfer buffer circuit 3520 includes a temporary data register 4002 and a write data transfer buffer 4004. The temporary data register 4002 and the write data transfer buffer 4004 both have the structure of an inverter latch.

The write data transfer buffer circuit 3520 further includes a transfer gate 4010 receiving an output/SSA0 of the SRAM sense amplifier, a transfer gate 4012 which turns on in response to the buffer write transfer enable signal BWTE, a transfer gate 4018 which is turned on in response to the output SSA0 of the SRAM sense amplifier, a transfer gate 4020 which is turned on in response to the buffer write transfer enable signal BWTE, and transfer gates 4014 and 4016 which are turned on in response to the buffer gate write signal DYW which is generated only to the selected register in the buffer write mode operation. The buffer gate write signal DYW is generated only for that register which is subjected to data writing at the time of data writing. The outputs SSA0 and /SSA0 of the SRAM sense amplifier correspond to the output of the first sense amplifier 1612 shown in FIG. 84.

Transfer gates 4010 and 4012 are connected in series, and when both are turned on, they set the latch node /E of temporary data register 4002 to the ground potential level. Transfer gates 4018 and 4020 set the latch node G of temporary data register 4002 to the ground potential when the output SSA0 of the SR4 sense amplifier and the buffer write transfer enable signal BWTE both attain to "H". The outputs /SSA0 and SSA0 of the sense amplifier are complementary to each other. Therefore, when the buffer write transfer mode is designated, transfer gates 4012 and 4020 are both turned on, and complementary data are latched at the latch nodes /E and E of the temporary data register 4002.

When the buffer write mode is designated, the buffer gate write signal BYW is generated only for that data register which is subjected to data writing. Thus gates 4014 and 4016 are turned on, and data on the internal write data lines DBW and /DBW are latched by temporary data register 4002. Complementary data are transmitted to the internal write data lines DBW and /DBW.

Write data transfer buffer circuit 3520 further includes a transfer gate 4022 which is turned on in response to the output of latch node /E of temporary data register 4002, a transfer gate 4004 which is turned on in response to the DRAM write transfer enable signal DWTE, a transfer gate 4026 which is turned on in response to the output of latch node E of temporary data register 4002, and a transfer gate 4024 which is turned on in response to the DRAM write transfer enable signal DWTE. Transfer gates 4022 and 4023 are connected in series. They transmit the data which is an inversion of the data latched at the latch node /E of the temporary data register 4002 to the latch node /F of write data transfer buffer 4004 in response to the DRAM write transfer enable signal DWTE. Transfer gates 4024 and 4026 are connected in series, and transmits the data which is the inversion of the data at the latch node E of temporary data register 4002 to the latch node F of the write data transfer buffer 4004 in response to the DRAM write transfer enable signal DWTE.

Mask circuit 3530 includes a temporary mask register 4006, a master mask register 4008 and a mask gate circuit 3540. Registers 4006 and 4008 are both formed of inverter latches.

Mask circuit 3530 further includes a transfer gate 4028 responsive to the buffer gate write signal DYW for setting the latch node /G of temporary mask register 4006 to the ground potential, a transfer gate 4030 responsive to the buffer write transfer enable signal BWTE for setting the latch node /G of temporary mask register 4006 to the ground potential, a transfer gate 4032 which is turned on in response to the mask register set command /MRS generated from the command register, a transfer gate 4034 which is turned on in response to the buffer gate write signal BYW, and a transfer gate 4036 which is turned on in response to the DRAM write transfer enable signal DWTE.

Transfer gates 4032, 4034 and 4036 are connected in series and turned on when the signal applied to each gate attains to "L". When the gates 4032, 4034 and 4036 all turn on, a signal at the supply potential level is transmitted to the latch node /G of temporary mask register 4006.

Mask circuit 3530 further includes a transfer gate 4037 which is turned on in response to the data of the latch node /G of temporary mask register 4006, a transfer gate 4039 which is turned on in response to the DRAM write transfer enable signal DWTE, a transfer gate 4040 which is turned on in response to the output at latch node G of temporary mask register 4006, and a transfer gate 4030 which is turned on in response to the DRAM write transfer enable signal DWTE. Transfer gates 4037 and 4039 are connected in series and transmit a signal at the ground potential level to the latch node /H of master mask register 4008 when both are on.

Transfer gates 4038 and 4040 are connected in series and transmits a signal of "L (ground potential level)" to the latch node H of mask register 4008 when both are on. Temporary mask register 4006 is set when the mask node /G thereof is set to "H", and it is reset when the mask node /G is set to "L".

Mask gate circuit 3540 includes a 3-input gate circuit 4042 receiving the DRAM write data enable signal DWDE, the output of latch node /F of write data transfer buffer 4004 and the output of latch node /H of mask register 4008, an inverter circuit 4046 for inverting the output of gate circuit 4042, a 3-input gate 4044 receiving the DRAM write data enable signal DWDE, the latch data at the latch node S of write data transfer buffer 4004 and the latch data at latch node /H of mask register 4100, and an inverter circuit 4048 for inverting the output of gate circuit 4044.

Gate circuit 4042 sets its output to "L" only when the three input thereof attain to "H" (it is an NAND circuit). Gate circuit 4044 provides a signal of "L" only when the three input thereof all attain to "H".

A write amplifier 3550 is provided between the mask gate circuit 3540 and the global IO lines GIOa and /GIOa. Write amplifier 3550 includes n channel MOS transistors 4052 and 4054 receiving at their gates the output of inverter circuit 4046, and n channel MOS transistors 4050 and 4056 receiving at their gates the output of inverter circuit 4048. Transistors 4050 and 4054 are connected in series between the supply potential and the ground potential, while transistors 4052 and 4056 are connected in series between the supply and the ground potential. The connection between the transistors 4050 and 4054 is connected to the global IO line GIOa, while the connection between the transistors 4052 and 4056 is connected to the global IO line /GIOa.

The operation will be briefly described. When write data is to be transferred from the SRAM array, the buffer gate write signal DYW is not generated but kept at the "L" state. Data on the SRAM bit line pair SBL is amplified by the SRAM sense amplifier and transmitted to the gates of transfer gates 4010 and 4016. Assume that the sense amplifier output SSA0 is at "H". In this case, the transfer gate 4010 is turned off and the transfer gate 4018 is turned on.

When the output of SRAM sense amplifier is established, the buffer write transfer enable signal BWTE rises to 'H", and the transfer gates 4012 and 4020 are turned on. Now, since the transfer gate 4010 is off and the transfer gate 4018 is on, the potentials of "L" and "H" are transmitted to and latched at the latch nodes E and /E of temporary data register 4002, respectively.

In mask circuit 3530, transfer gate 4030 turns on in response to the rise of buffer write transfer enable signal BWTE, and potentials at latch nodes /G and G of temporary mask register 4006 attain to "L" and "H", respectively. Assume that the mask register set bit /MRS is set at "L". Transfer gates 4032, 4034 and 4036 are on. When transfer gate 4030 turns on in response to the buffer write transfer enable signal BWTE, the potential of latch node /G becomes little lower than the potential at latch node G. This lowering of the potential is amplified by the inverter in the temporary mask register 4006, and accordingly, the potentials at latch node G and /G attain to "H" and "L", respectively.

By the above described series of operations, in the data transfer from the SRAM array to the write data transfer buffer circuit, mask data in the temporary mask register 4006 is reset in synchronization with the data transfer to the temporary data register 4002.

In the buffer write mode, that is, when external data is to be written to the write data transfer buffer circuit, the buffer gate write signal BYW is generated only for the corresponding write data transfer buffer. In that case, external write data is transmitted to the temporary data register 4002 through transfer gates 4014 and 4016, while the corresponding temporary mask register 4006 is reset.

Then, the DRAM write transfer enable signal (DWTE) indicating data transfer from the write data transfer buffer to the DRAM array is generated (by the designation of the DRAM write transfer mode). Consequently, transfer gates 4023, 4024, 4039 and 4038 are turned on. Now, the potentials at latch nodes E and /E of the temporary data register are at "L" and "H" (SRAM sense amplifier output SSA0 is "H"). Consequently, transfer gate 4022 turns on, transfer gate 4026 turns off, and the latch nodes F and /F of data transfer buffer 4004 attain to "H" and "L", respectively.

In the master mask register 4008, the potential of latch node /G is at "L", transfer gate 4037 is off and transfer 4040 is on. Therefore, latch nodes H and /H are at "L" and "H", respectively.

While the DRAM write transfer enable signal WRTE is generated, transfer gate 4036 is kept off. Transfer gate 4030 is off. Though the latch node /G of temporary mask register 4006 has its potential latched by the inverter latch, it is set to the electrically floating state in this period. Then, when the DRAM write transfer enable signal DWTE falls to "L", transfer gate 4036 turns on, the signal of the supply potential level is transmitted to the latch node /G, and the mask data stored in the temporary mask register 4006 is set (the potential at latch node /G is at "H").

After the data transfer to the write data transfer buffer 4004 and the master mask register 4008, the DRAM write data enable signal DWDE is generated. Consequently, the data stored in the write data transfer buffer 4004 and the mask data stored in the master mask register 4008 are applied to mask gate circuit 3540. Now the potential at the latch node F of write data transfer buffer 4004 is at "H" and the potential at latch node F is at "L". The potential at the latch node /H of mask register 4008 is at "H". Consequently, the output of gate circuit 4042 attains to "H" and the output of gate circuit 4044 attains to "L". The outputs of gate circuits 4042 and 4044 are inverted by inverter circuits 4046 and 4048. Consequently, in the write driver (amplifier) 3550, transistors 4050 and 4056 are turned on and transistors 4052 and 4054 are turned off. The potential on global IO line GIOa attains to "H" and the potential of global IO line /GIOa attains to "L".

When the potential at the latch node /H of master mask register 4008 is at "L" so as to mask the data transfer, the outputs of gate circuits 4042 and 4044 both attain to "H" and the outputs from inverter circuits 4046 and 4048 attain to "L". Consequently, transistors 4050, 4052, 4054 and 5046 of write amplifier 3550 are all turned off, the potential on global IO lines GIOa and /GIOa do not change, and the data from the write data transfer buffer circuit is not transferred.

By effecting the above described series of operations, write data can be transferred surely at high speed. After the data transfer from the temporary register to the write data transfer buffer, the mask data of the temporary mask register is always kept at the set state. In the buffer write mode also, after the data transfer to the master mask register, that is, after the generation of the signal BWTE, the mask data of the temporary mask register 4006 is set to the set state. The waveforms of this series of operations are shown in FIG. 126.

Figure 126:
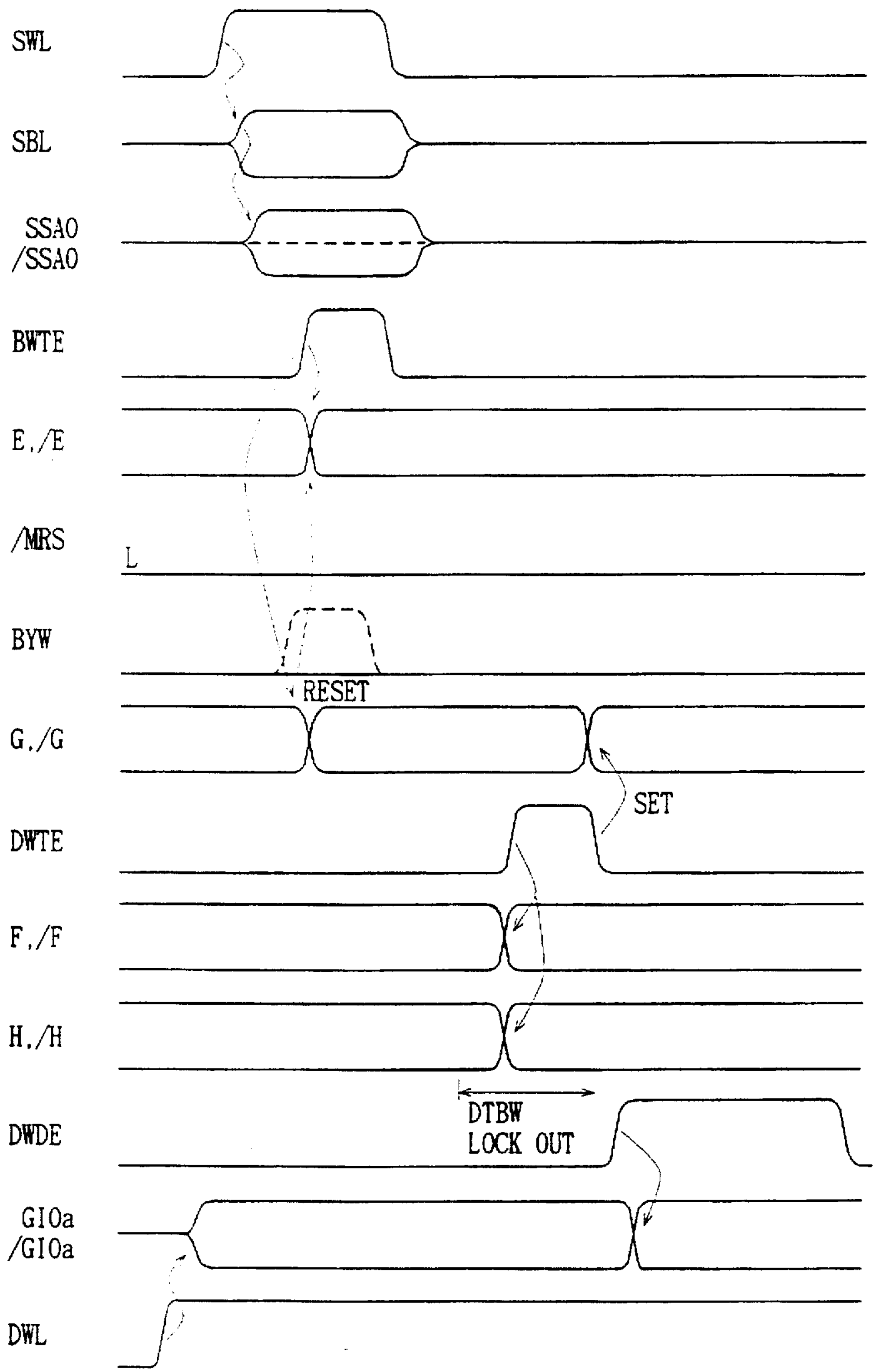

In FIG. 126, SWL denotes the SRAM word line, SBL denotes the SRAM bit line pair and DWL denotes the DRAM word line. The dotted lines show the operation waveforms at the time of buffer writing.

FIG. 127 shows a structure of the read data transfer buffer circuit. Referring to FIG. 127, the read data transfer buffer circuit includes read amplifiers 5004 and 5008 responsive to the DRAM preamplifier enable signal DPAE for amplifying the potential on the global IO lines GIOa and /GIOa, a preamplifier 5006 for further amplifying, in response to the DRAM preamplifier enable signal DPAE, the data which have been amplified by the read amplifiers 5004 and 5008, a slave data register 5000 for latching the data which have been amplified by the preamplifier 5006, and a master data register 5006 for receiving, in response to the DRAM read transfer enable signal DRTE, the data stored in the slave data register 5000.

Read amplifier 5004 includes p channel MOS transistor 5040 receiving at its gate the signal on global IO line GIOa, an n channel MOS transistor 5044 receiving at its gate the signal on global IO line GIOa, and an n channel MOS transistor 5040 which is rendered conductive in response to the DRAM preamplifier enable signal DPAE. Transistors 5040, 5052 and 5044 are connected in series between the supply potential and the ground potential. An amplified output is provided from the connection node between the transistors 5040 and 5042.

Read amplifier 5008 includes a p channel MOS transistor 5041 and an n channel MOS transistor 5045 which receive at their gates the signals on the global IO line /GIOa, and an n channel MOS transistor 5043 which is turned on in response to the DRAM preamplifier enable signal DPAE. Transistors 5041, 5043 and 5045 are connected in series between the supply potential and the ground potential. The signal on the global IO line /GIOa which is amplified is provided as an output from the connection node between the transistors 5041 and 5043.

Preamplifier 5006 includes p channel MOS transistors 5060 and 5062 connected in parallel between the supply potential and a node J, and p channel MOS transistors 5064 and 5066 connected in parallel between the supply potential and a node /J. Transistors 5060 and 5066 receive at their gates the DRAM preamplifier enable signal DPAE. The transistor 5062 has its gate connected to the node /J, while the transistor 5064 has its gate connected to the node J.

Slave data register 5000 has a structure of an inverter latch. p channel MOS transistors 5068 and 5070 are provided between the output nodes J and /J of preamplifier 5006 and the latch nodes N and /N of slave data register 5000, which are selectively turned on in response to the signal potential on the nodes J and /J for transmitting the supply potential to the nodes N and /N.

For the slave data register 5000, n channel MOS transistors 5072 and 5074 which are turned on in response to the DRAM preamplifier enable signal DPAE and n channel MOS transistors 5076 and 5078 receiving at their gates the signal on the nodes J and /J are provided. Transistors 5072 and 5076 are connected in series between the latch node N of the slave data register 5000 and the ground potential. Transistors 5074 and 5078 are connected in series between the latch node /N and the ground potential.

Mask data register 5002 has a structure of an inverter latch. For the mask data register 5002, n channel MOS transistors 5080 and 5082 which are turned on in response to the DRAM read transfer enable signal DRPE and n channel MOS transistors 5084 and 5086 receiving at their gates the signal on the latch nodes N and /N of slave data register 5000 are provided. Transistors 5080 and 5084 are connected in series between the latch node N of master data register 5002 and the ground potential. Transistors 5082 and 5086 are connected in series between the latch node /N and the ground potential.

Read data transfer buffer circuit further includes inverter circuits 5052 and 5054 for inverting and amplifying the potentials at latch nodes N and /N of mask data register 5002, respectively, and transfer gates 5058 and 5056 responsive to the buffer read transfer enable signal for transmitting the outputs of inverter circuits 5052 and 5054 to SRAM bit lines SBLa and /SBLa. The signals on the latch nodes N and /N of master data register 5002 are transmitted to the first sense amplifier through a selector (1013) shown in FIG. 84 through signal lines Buf and /Buf. The signal lines Buf and /Buf provides a path for reading data from the read data transfer buffer in the buffer read mode operation.

The operation will be described. When the DRAM read transfer mode is designated, a row and a memory cell block are selected in the DRAM array, and in accordance with the data read from the DRAM memory cell, the signal potentials on the global IO lines GIOa and /GIOa change correspondingly.

Thereafter, when the DRAM preamplifier enable signal DPAE is generated, read amplifiers 5004 and 5008 and preamplifier 5006 are activated. Assume that the signal potential on global IO line GIOa is at "H" while the signal potential on global IO line /GIOa is at "L". In that case, the potentials at nodes J and /J will be "L" and "H", respectively. The signal potential transmitted to the nodes J and /J are amplified at high speed by transistors 5062 and 5064. Transistors 5060 and 5066 have been turned off in response to the DRAM preamplifier enable signal DPAE. Transistors 5060 and 5066 are used for precharging the nodes J and /J to the supply potential. Transistors 5062 and 5064 have the function of maintaining the nodes J and /J at the same potential at the precharge state (when the DRAM preamplifier enable signal is at "L").

The signal transmitted to nodes J and /J is transmitted to slave data register 5000 through transistors 5068, 5070, 5076, 5078, 5072 and 5074. Transistors 5072 and 5074 have been turned on in response to the DRAM preamplifier enable signal DPAE.

Now, the potential of node J is at "L" and the potential at node /J is at "H". Therefore, transistors 5068 and 5078 are on and the transistors 5070 and 5076 are off. Therefore, the potentials at the latch nodes N and /N of slave data register 5000 are at "H" and "L", respectively. By the series of these operations, the data transfer operation to the slave data register in the read data transfer buffer circuit is completed.

Thereafter, the DRAM read transfer enable signal is generated. Consequently, transistors 5080 and 5082 are turned on, the data stored in the latch nodes N and /N of the slave data register 5000 are transmitted to latch nodes N and /N of master data register 5002. Since the potential at the latch node N is at "H", transistor 5084 turns on and transistor 5086 turns off. Consequently, the signal potentials on the latch nodes N and /N attain to "L" and "H", respectively. By the series of these operations, storing of data to the master data register 5002 in the read data transfer buffer circuit is completed. The signal potentials at the latch nodes N and /N can be read through signal lines Buf and /Buf. More specifically, after the lapse of the latency, the data stored in the read data transfer buffer can be read at high speed by the buffer read mode operation.

At the time of data transfer to the SRAM array, the buffer read transfer enable signal BRTE is generated. Consequently, the outputs of inverter circuits 5052 and 5054 are transmitted to the SRAM bit lines SBLa and /SBLa through gates 5058 and 5056. In the structure shown in FIG. 127, the inverter circuits 5052 and 5054 may have a structure of a tri-state inverter circuit which is rendered active in response to the buffer read transfer enable signal BRTE.

Figure 128:
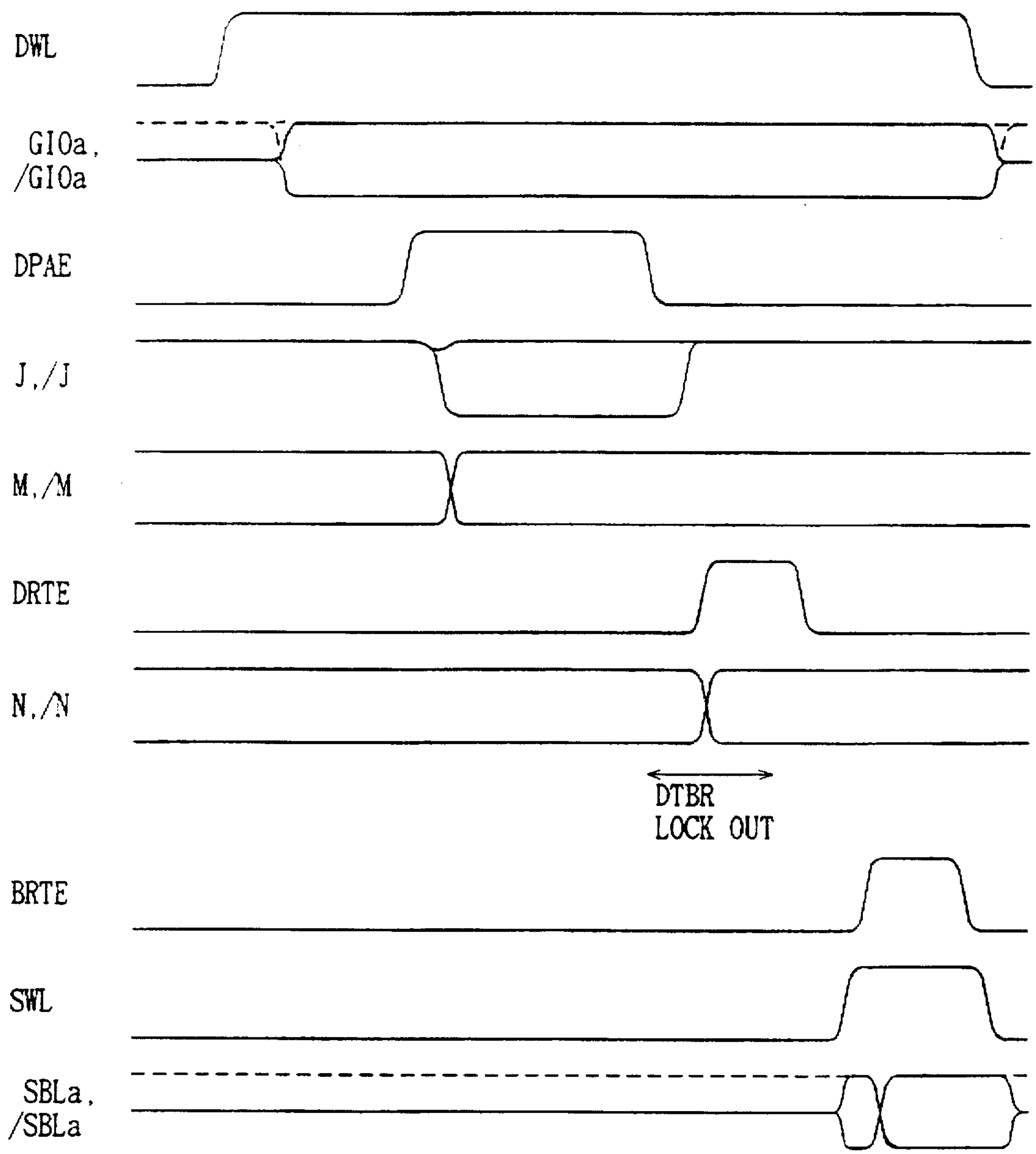

FIG. 128 is a diagram of operation waveforms of the read data transfer buffer circuit shown in FIG. 127. Referring to FIG. 128, the global IO lines GIOa and /GIOa are shown precharged to an intermediate potential (Vcc/2: Vcc is the supply voltage level), but these lines may be precharged to the supply potential level, as shown by the dotted line in FIG. 128. In FIG. 128, the precharge potential of the SRAM bit lines SBLa and /SBLa is shown as the intermediate potential. In this case also, the lines may be precharged to the supply voltage level by using a clamp circuit, as shown by the dotted line. The period in which the DRAM bit line is kept in the selected state may be determined by the latency. The timing of generation of the signal DWDE is determined bv the latency. The generation period of the signal DPAE may be determined by the master clock. The same applies to the operation waveforms of FIG. 126.

Since the read data transfer buffer circuit also has the two stage latch circuit structure including the slave data register and the master register, data transfer can be surely carried out and the latency control (control of time period necessary for the established data to appear to the SRAM array or the data input/output pin DQ) can be easily and surely effected.

Figure 129:
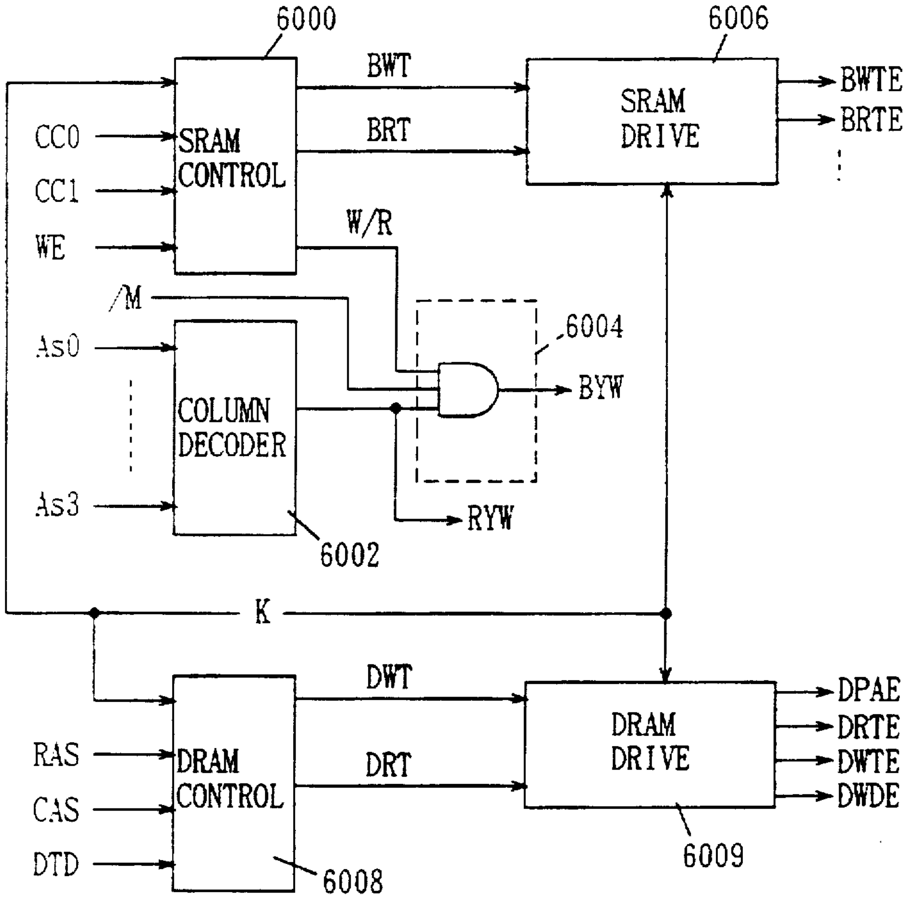

FIG. 129 shows a circuit structure for effecting control related to the data transfer. Referring to FIG. 129, the SRAM control circuit 6000 generates a signal BWT responsive to the internal control clocks CC0, CC1 and the write enable WE for designating the data writing operation mode to the write data transfer buffer circuit, a signal BRT indicating an operation for reading data from the read data transfer buffer circuit (to the data input/output pin or to the SRAM array) and a signal W/R indicating which of the data writing and data reading should be performed. The SRAM drive circuit 6006 generates necessary control signals of buffer write transfer enable BWTE, the buffer read transfer enable BRTE and the like in response to the signals BWT and BRT, and carries out the sense amplifier drive and the selection of a row in the SRAM array.

The column decoder 6002 decodes block address bits As0 to As3 and generates a signal for selecting a corresponding bit position. Gate circuit 6004 generates, in response to the signal W/R indicative of the data input/output operation from the SRAM control circuit 6000 and the inverted signal of mask enable M, the buffer gate write signal BYW, by selectively passing a bit selection signal generated from the column decoder 6002. Gate circuit 6004 passes the output of the column dec oder 6002 as the buffer gate write signal BYW only when data writing is designated (in the BW mode). The bit selection signal RYW of column decoder 6002 is also used for bit selection of the data output system.

A structure in which the column decoder 6002 is activated only when an operation mode for effecting data input/output with the outside, such as the SRAM read mode, SRAM write mode, the buffer read mode, the buffer write mode and so on under the control of the SRAM control circuit 6000 may be used. In SRAM drive circuit 6006, the master clock K is applied since a structure in which the transfer control signal is generated in response to the clock at the time of data transfer is employed. This structure effects latency control. The length of the latency is set in advance in the command register.

DRAM control circuit 6008 determines the designated mode in accordance with the master clock K, the row address strobe RAS, the column address strobe CAS and the data transfer designation DTD and generates a signal DWT indicative of the DRAM write transfer mode, a signal DRT indicative of the DRAM read transfer mode and so on. When the DWT1R mode and the DWT2R mode are designated, the signals DWT and DRT are both generated. In response to the signals DWT and DRT, the DRAM drive circuit 6009 generates necessary signals, that is, the DRAM preamplifier enable signal DPAE, the DRAM read transfer enable signal DRTE, the DRAM write transfer enable signal DWTE and the DRAM write data enable signal DWDE. The DRAM drive circuit 6009 also drives the row and column selecting operation of the DRAM array (namely, raises the potential of the selected word line, drives the DRAM sense amplifier, and so on).

The mask register set /MRS shown in FIG. 125 is set in the command register in the set command register cycle. The inverted mask enable /M shown in FIG. 129 is applied from mask enable pins M0 to M3 at the time of data writing.

Embodiment 3

[Pin Arrangement and Definition of Signals]

FIG. 130 shows pin arrangement of the CDRAM in accordance with the third embodiment. Referring to FIG. 130, the CDRAM is accommodated in a package of 70 pins and 400 mil TSOP (type II). The package has the lead pitch of 0.65 mm and the package length of 23.49 mm. The signal input/output can be interfaced with LVTTL which is lower than the normal TTL level. The CDRAM may be directly connected to a TTL compatible device. The CDRAM may be directly connected to an external data processing unit such as a CPU. More specifically, the CDRAM includes a controller for determining a cache hit/miss, as will be described later.

The master clock CLK is applied to the pin terminal of the number 27. The CDRAM takes the external signals in synchronization with the master clock CLK, and the clock frequencies of the internal operations are determined by the master clock. Terminals of the pin numbers 11, 13, 14, 16, 19, 21, 22, 24, 47, 49, 50, 52, 55, 57, 58 and 60 are used as data input/output terminals DQ0 to DQ15. As an example, the CDRAM includes a dynamic memory array having the storage capacity of $2^{20}$ words·16 bits, and a static RAM having the $2^{10}$ words·16 bits structure.

Address signal bits A0 to A21 are applied to the terminals of the pin numbers 2 to 5, 37 to 45 and 61 to 69. The address signal bits A0 to A21 include a memory address and a bank address for designating the SRAM array or the DRAM array. When the memory system is formed by using a plurality of CDRAMs, the memory system can be divided into, at the maximum, 4 banks. When it has a 1 bank structure, address signal bits A0 to A19 are used as a memory address and address signal bits A20 and A21 are not used.

When the bank number is 2, address signal bits A0 to A7 and A9 to A20 are used as a memory address, while address signal bit A8 is used as the bank address. In that case, the address signal bit A21 is not used. If the bank number is 4, address signal bits A0 to A7 and A10 to A21 are used as a memory address and address signal bits A8 and A9 are used as a bank address.

Byte enable signals BE0# and BE1# are respectively applied to the pin terminals of the numbers 28 and 29. The byte enable signal BE0# controls the lower bytes (DQ0 to DQ7) and the byte enable signal BE1# controls the higher bytes (DQ8 to DQ15) at the time of data writing. In data reading, the byte enable signals BE0# and BE1# are neglected and 16 bits of terminals DQ0 to DQ15 are all driven.

An address status signal ADS# is applied to the pin terminal of the pin number 6. The address status signal ADS# corresponds to the chip enable signal E# of the first embodiment. When this signal ADS# is at the active state (in the following embodiment, "L" level) at the rising edge of the master clock CLK, the external control signal and addresses are taken, and the CDRAM enters the data transfer cycle for transferring data between the SRAM array and the DRAM array therein.

A memory /IO signal M/IO# applied to the pin terminal of the number 8, the write/read signal W/R# applied to the pin terminal of the number 9, and the data/code signal D/C# applied to the pin terminal of the number 7 define the contents of operation in accordance with the combinations thereof. These signals M/IO#, D/C# and W/R# are taken when the address status signal ADS# is rendered active.

(i) M/IO#=D/C#=W/R#=0 (="L") No response and wait for the next address cycle.

(ii) M/IO#=D/C#=0 and W/R#=1 (="H") In this case also, no response and wait for the next address cycle.

(iii) M/IO#=W/R#=0 and D/C#=1

In this case, the content of the command register is read (to the data input/output terminal).

(iv) M/IO#=0 and D/C#=W/R#=1

In this case, prescribed data is written to the command register and a specific operation mode is designated.

(v) M/IO#=1 and D/C#=W/R#=0

In this case, code such as an instruction is read from the memory.

(vi) M/IO#=W/R#=1 and D/C#=0

In this case, no response is made and the cycle returns to the address cycle Ta to wait for an access request.

(vii) M/IO#=D/C#=1 and W/R#=0

In this case, data is read from the memory.

(viii) M/IO#=D/C#=W/R#=1

In this case, data is written to the memory.

The signal ADC1/CME# is applied to the pin terminal of the number 32. The signal CME# is a command register enable signal and when the command register read or command register write command is applied and this signal is activated in the next cycle, the reading or writing of the content in the command register is carried out. More specifically, when the command register read or write command is applied, the command register enable signal CME# is at "H" and it is set to the active state of "L" in the next cycle. The signal ADC1 is an address control signal and indicates a bank address.

A burst last signal BLAST# is applied to the pin terminal of the number 31. This burst last signal BLAST# indicates the last of the data transfer cycle of the CPU. Namely, it indicates that it is the last data in reading or writing data from and to the memory and at the time of data writing to the command register. When the signal BLAST# is rendered active, the next cycle will be the address cycle Ta to wait for the next address designation.

A data hold/sleep signal DH#/SP# is applied to the pin terminal of the pin number 30. In the data cycle Td, the data wait cycle Tdw or the data hold cycle Tdh (which cycles will be described later), the signal DH#/SP# is used as the data hold signal DH# and controls the output buffer. When the data hold signal DH# is rendered active, the CDRAM enters the data hold cycle Tdh, and maintains the output data until the end of the clock cycle.

In the address cycle Ta, this signal is used as the sleep signal SP# and controls the sleep mode operation. If the sleep signal SP# maintains the active state continuously in 32 clock cycles, the CDRAM enters a sleep cycle Ts. During the sleep cycle Ts, the sleep signal SP# is treated as a non-synchronous signal, which is not synchronized with the clock signal.

The reset signal RST# is applied to the pin terminal of the number 34. The reset signal RST# resets the CDRAM. In the reset operation, the CDRAM (i) sets the values stored in all the command registers to the default values, (ii) starts initialization of the DRAM array, and (iii) resets the valid bit of the tag memory. The reset signal RST# is taken in non-synchronization with the master clock CLK. When signals DS# and SP# are active, the reset signal RST# is neglected.

A signal ADC0/REF# is applied to the terminal of the pin number 33. The refresh signal REF# indicates the auto refresh cycle. The signal REF# serves as an input signal or an output signal (the structure will be described in detail later). Whether the signal REF# is used as the output signal or the input signal is determined by the command register. If the refresh signal REF# is set as the input, this signal is sampled at the rising edge of the master clock CLK, and the auto refresh operation starts from the next clock cycle. If the refresh signal REF# is set as the output signal, the signal REF# is controlled by an internal refresh timer and provided in synchronization with the master clock CLK. The refresh signal REF# at this output state controls other CDRAMs set to input refresh signal REF# in the memory system. Therefore, the CDRAM memory system can carry out the refreshing operation in synchronization with one CDRAM therein, and therefore self refresh can be carried out during the normal operation, as will be described later.

The signal ADC0 indicates the bank address. The signal ADC0 is sampled together with the address control signal ADC1 described above when the signal ADS# is activated.

The aforementioned signals are all input signals applied to the CDRAM (except the refresh signal REF# set to the output state). The CDRAM includes a controller therein and has an output signal for indicating the state of operation therein to an outside unit.

A burst ready signal BRDY is output to the pin terminal of the number 26. The burst ready signal BRDY# indicates that the data transfer cycle has been completed in the CDRAM and that the CDRAM can be accessed.

A signal LME#/KEN# is output from the pin terminal of the number 10. Cache enable signal KEN# indicates that the data transfer cycle is carried out in the CDRAM and data can be cached in CPU. More specifically, it is indicated that the external CPU can store the accessed data in the internal cache contained therein. When data in the cache unavailable area (the CDRAM includes an area which can not be used as the cache and an area which can be used as the cache, as will be described later) is to be read, at least one wait cycle is necessary to inactivate this signal.

A local memory enable signal LME# indicates that the CDRAM has been selected. The local memory enable signal is used as a hit signal and/or a bus direction control signal.

[Internal Structure]

FIG. 131 is a block diagram schematically showing the internal structure of the CDRAM in accordance with the third embodiment of the present invention. Referring to FIG. 131, a CDRAM 7000 includes an external control unit 3100 shown in FIG. 111. More specifically, the CDRAM 7000 includes a DRAM array 7001, an SRAM array 7002, a bidirectional data transfer circuit (DTB) 7003 for transferring data between DRAM array 7001 and SRAM array 7002, an address buffer/scramble circuit 7004 taking external address signal bits A0 to A21 and scrambling the same for generating internal address signals, a row address buffer 7006 receiving the internal address signal bits A8 to A19 from address buffer/scramble circuit 7004, a row decoder 7008 decoding the addresses output from row address buffer 7006 for selecting a row in DRAM array 7001, a column address buffer 7030 receiving address signal bits A0 to A7 from address buffer/scramble circuit 7004 for generating internal column addresses, a latch circuit 7032 for latching the internal column address signals from column address buffer 7030, and a column decoder 7034 decoding the address signals from the latch circuit 7032 for setting a corresponding column block in DRAM array 7001 to a selected state.

CDRAM 7000 further includes a tag memory (TG) 7036 for storing the address of data stored in the SRAM array 7002, that is, the tag address, a determining circuit 7038 for comparing the address signal bits A10 to A19 from address buffer/scramble circuit 7004 with the tag address of the tag memory 7036 for determining a cache hit/miss, a determining circuit 7020 for comparing the internal row address latched by row address buffer 7006 with the address signal bits A8 to A19 applied from address buffer/scramble circuit 7004 for determining a page hit/miss, a return address latch circuit 7024 for storing the tag address from tag memory 7036 at the time of a cache miss, and a DRAM control and cache/refresh control portion 7026 for effecting various necessary controls in response to the page hit/miss and cache hit/miss indication from various external control signals and from the determining circuits for generating external control signals LME#/KEN# and BRDY#.

The DRAM control and cache/refresh control portion 7026 controls the driving of the DRAM array 7001, the driving of the SRAM array 7002, the transfer operation of the bidirectional transfer circuit (DTB) 7003, and the operation of changing the latch data of latch circuits 7008 and 7032. At the time of a cache miss and a page hit, the address latched in latch circuit 7032 is changed to the address applied from column address buffer 7030. At a time of a cache miss and a page miss, the address latched in latch circuits 7008 and 7032 are changed. The address latched in latch circuit 7008 is changed to the return address applied from return address latch circuit 7024 at this time (for the purpose of copy back). Similarly, the data latched in latch circuit 7032 is replaced by the address signal latched by the return address latch circuit 7024 (at the time of copy back). The row decoder 7008 has a function of latching the applied address. Consequently, in DRAM array 7001, one row is always set to the selected state, enabling use of the sense amplifiers of DRAM array 7001 as a quasi cache and also allowing the page mode transfer. As the latch circuit 7032 is provided, in the page mode transfer, data transfer can be carried out by selecting the DRAM column block, and the fast copy back mode operation can also be carried out.

Though not described in detail with respect to the pin arrangement above, as for the supply voltage Vcc and the ground potential Vss, there are a supply voltage VccQ and ground potential VssQ input pins which are used only by the data input/output portion at the central portion of the chip. Referring to FIG. 131, the supply voltage supplying terminals VccQ (0–3) and ground potential supplying terminals VssQ (0–3) arranged between the data pins and the supply voltage Vcc and the ground potential Vss applied to other circuit portions are shown.

The DRAM control and cache/refresh control portion 7026 samples external control signals at the rising edge of the master clock CLK and carries out necessary operation control in accordance with the combination of the signal states. In addition, it carries out necessary data transfer operation and the change of latch addresses in accordance with the cache hit signal and the page hit signal from determining circuits 7038 and 7020.

Since a tag memory 7036 for storing the tag address is provided in the CDRAM and the circuits for determining cache hit/miss and page hit/miss are provided internally, a memory system having a desired bank structure can be easily provided, and the operation at the time of a hit/miss can be carried out at high speed.

[Types of Commands]

As described above, the CDRAM takes (samples) various external control signals at the rising edge of the master clock CLK and carries out necessary operation in accordance with the states of the external control signals. These external control signals are all applied from an external data processing unit such as a CPU. Therefore, the DRAM control and cache/refresh control portion 7026 shown in FIG. 131 has a function of decoding instructions (commands) applied from the external CPU and for controlling necessary operation.

FIGS. 132 and 133 show various commands and the states of external control signals at that time. In FIGS. 132 and 133, the reference character "V" denotes "valid", the reference character "X" denotes "don't care" state, the reference character "L" indicates "logic low level" and the reference character "H" denotes the "logic high level". Further, the reference character "Hi-Z" denotes the "high impedance state", "DIS" denotes "disable" state and "ENA" denotes the enable state. In the command register read CMRR and command register write CMRW in the data input/output portion DQ, data input/output terminals DQ0 to DQ7 are used, and other data input/output terminals DQ8 to DQ15 are set to the high impedance state. In the input/output terminal DQ, the reference character "RD" indicates the read data, while the reference character "WD" indicates "write data".

Further, a shadow RAM denotes an area which is available as a shadow table, for example, for forming an address conversion table for conversion from virtual memory address to real memory address. Thus a virtual memory space can be easily established.

Various operations will be described in the following.

[Read (Burst, Cachable) Mode]

The read (burst, cachable) command is designated when the signals M/IO# and D/C# are set to "H" and the signal W/R# to "L" at the fall of the address status ADS#. In this operation mode, as shown in FIG. 134, the output data DOUT is established and output successively in synchronization with the rise of the master clock CLK from the next clock cycle. When the signal BLAST# falls to "L" designating the completion of the burst read mode, the data input/output terminal DQ is set to the output high impedance state from the next clock cycle (if the next cycle is an address cycle). In this state, the local memory enable signal LME#, the cache enable signal KEN# and the burst ready signal BRDY# are set to "L" at the time of data output.

The cycle Ta shown in FIG. 134 is a preparation cycle for the data input/output cycle, and an external address is sampled at the rising edge of the master clock CLK in the data hold cycle or the next data cycle.

When address status signal ADS# is activated and the memory /IO signal M/IO# is at "H", the CDRAM enters the data cycle Td. In the data cycle Td, the CDRAM carries out data input/output. When the CDRAM enters the data cycle Td, the CDRAM maintains this state until the burst last signal BLAST# is rendered active. When the signal BLAST# is applied, the signals LME# and BRDY# are set at "H" and the signal KEN# is set at "L" in the next cycle to signal CPU of invalid data.

The local memory enable signal LME# and the burst ready signal BRDY# are set to the high impedance state after they are ones changed to "H" once when they are rendered inactive, while the cache enable signal KEN# changes from the active state to the high impedance state directly. The reason for this is that the external signal lines are pulled up to "H" for the local memory enable signal LME# and the burst ready signal BRDY#, and, as will be described later, it is necessary to maintain the "H" level by driving a number of signal lines at high speed. The cache enable signal KEN# is set to the high impedance state at the "L" level. Thus determination of the cache hit/miss is carried out at high speed. Cachable/noncachable data is determined in CPU with one cycle delay.

The burst mode means an operation mode in which continuous addresses are accessed successively and when one address is applied, memory cells of the address positions continuous thereto are successively accessed.

[Read (Burst, Non-cachable) Mode]

Referring to FIG. 135, in this operation mode, similar to the operation of FIG. 134, the read command is applied in clock cycle 1. However, since the data to which access is requested by the external CPU does not exist in the cache memory, data transferred from the DRAM array is read. Therefore, in cycle Tdw, the cache enable signal KEN# rises to "H" indicating a cache miss, so as to signal the external CPU that it should not be cached. Since the valid data is not transmitted at this time, the burst ready signal BRDY# also rises to "H". When necessary data are all prepared, that is, from clock cycle 3, data are provided successively as output. At this time, since the output data DOUT is the data which was not in the cache region, the cache enable signal KEN# falls to "L" from the next cycle, that is, from cycle 4. The burst ready signal BRDY# falls to "L" to show that the valid data is provided in the burst mode from the initial output data.

The cycle Tdw in clock cycle 1 indicates a data wait cycle, which means that the control should wait until all necessary data are obtained.

[Read (Non-burst, Cachable) Mode]

Referring to FIG. 136, data transfer (to the CPU) in the burst mode is not carried out in this operation mode. Similar to the operation modes shown in FIGS. 134 and 135, in response to the fall of the address status signal ADS#, an external address is taken in. In the next data cycle Td, the burst last signal BLAST# is set to "L". Consequently, it is shown that one word of data has been accessed. The data input/output terminal DQ enters to the address cycle Ta in the cycle next to the data cycle Td. At this time, in order to show that the output data DOUT is valid data, the local memory enable signal LME# and the burst ready signal BRDY# both fall to "L", and, since it was a cache hit, the cache enable signal KEN# falls to "L".

[Read (Non-burst, Cachable, Data Hold)]

Referring to FIG. 137, in this operation mode, the read command is applied in cycle 1. Since the read command is applied, valid data is output in the next clock cycle 2 (cache hit). Since it is non-burst access, the burst last signal BLAST# falls to "L" in cycle 2.

The data hold/sleep signal DH#/SP# is kept at "L" at least for 30T cycle periods. Thus the data hold mode is designated, and the data DOUT provided in cycle 2 is kept at that state. The output data is set to the high impedance state one clock cycle after the data hold/sleep signal DH#/SP# attains to the inactive state of "H".

[Read (Non-burst, Non-cachable)]

In this operation mode, referring to FIG. 138, the read command is applied in cycle 1. At this time, since it is an access to the non-cachable region, memory cell data is provided from the main memory, that is, the DRAM array. Therefore, in cycle 2, it enters the data wait cycle Tdw state, and the output data DQ is an invalid data. In cycle 3, the valid data DOUT is provided. Since the access is the non-burst, the burst last signal BLAST falls to "L", and thus reading of one word of data is completed.

In the next cycle 4, the burst last signal BLAST# is raised to "H" and a new read command is applied. At this time, valid data DOUT is output in cycle 6. Since the access is the non-burst at this time also, the burst last signal BLAST# is set to "L". At the access of each data, the local memory enable signal LME# attains to "L", and the burst ready signal BRDY# attains to "L" only in that cycle in which the valid data is output. Because of noncachable data reading operation, the cache enable signal KEN# attain to "H" for both the output data.

[Read (Non-burst, Non-cachable, Hold)]

Referring to FIG. 139, the read command is applied in this operation mode. In cycle 2, it enters data cycle Td from data wait cycle Tdw, and valid data is provided from cycle 3. At this time, the burst last signal BLAST# is set to "L" and one word of data is provided. At this time, by setting the data hold/sleep mode signal DH#/SP# at "L" for at most 30T (T is one clock cycle), the valid data is continuously provided as output. The cache enable signal KEN# attains to "H" when it enters the next clock cycle after the output of the valid data.

[Miss Read (Burst, Cachable)]

Referring to FIG. 140, first a read command is applied. At a time of a cache miss, the valid data is not output in the next clock cycle. After the lapse of prescribed clock cycles (which is determined by the latency, and will be described later), the valid data DOUT is provided. As the burst last signal BLAST# falls to "L", the output is set to the high impedance state after the output of the last output data. The cache enable signal KEN# is set to "L" so as to indicate that it is a cachable data.

[Miss Read (Non-burst, Cachable)]

Referring to FIG. 141, when a read command is applied and the access is a cache miss, valid data DOUT is provided after the lapse of a prescribed time period. By the burst last signal BLAST#, address cycle Ta is entered after one word is output. Since a cache miss occurs again, CDRAM enters the data wait cycle Tdw, and after a prescribed time period, valid data is provided.

[Miss Read (Non-burst, Cachable, Hold)]

Referring to FIG. 142, first a cachable read command is applied, and if a cache miss occurs, data transfer is performed. In this case, valid data is provided after the lapse of a prescribed time period. Since the data is cachable, the cache enable signal KEN# attains to "L" at the transition from the data wait cycle Tdw to the data cycle Td. The burst ready signal BRDY# attains to "L" only when the valid data is provided. When the signal DH#/SP# is kept "L" for the prescribed time period of 30T at the maximum, CDRAM enters the data hold mode, so that the valid data is held. When the signal DH#/SP# is raised to "H", the output data is set to the output high impedance state in the next clock cycle.

[Write (Burst)]

Referring to FIG. 143, in the address cycle Ta, the address status signal ADS# is set to "L" and the signals M/IO#, D/C# and W/R# are set to "H", so that the data write mode is designated. Here, whether the data writing is cachable or non-cachable does not matter. In either case, data is written to the SRAM array or the data transfer circuit, and therefore valid data DIN is taken at the same timing to be successively written. The cache enable signal KEN# attains to "L", indicating that the cache data in the CPU are successively written. When the burst last signal BLAST# attains to "L", the high impedance state is set after the local memory enable signal LME# and the burst ready signal BRDY# both rise to "H" at the rise of the next master clock CLK. The cache enable signal KEN# is set to the high impedance state from the state of "L". Referring to the figure, data are successively written from the address ADD applied in cycle 1 to adjacent addresses.

[Write (Non-burst)]

Referring to FIG. 144, a write command is applied in cycle 1. Since it is non-burst, when the valid data is taken in the next clock cycle, the burst last signal BLAST# rises to "L". Thus the local memory enable signal LME# and the burst ready signal BRDY# both rise to "H", and together with the cache enable signal KEN#, they are set to the high impedance state in the next clock cycle.

[Miss Write (Burst)]

Referring to FIG. 145, first, a write command is applied. Because of a cache miss, data writing does not start until the memory cell of the required address is placed in the cache. After the end of this wait time, data are successively written. In that case, the timing of the start of data writing is determined by the latency, which will be described later.

As the burst last signal BLAST# attains to "L", the burst write operation is completed.

[Miss Write (Non-burst)]

Referring to FIG. 146, in cycle 1, that is, in the address cycle Ta, a write command is applied. At a time of a cache miss, after the lapse of a prescribed time period (in the second clock cycle in FIG. 146), the required memory cell is set to the selected state, allowing data writing. At this time, when the valid data is written, the external control signal LME#, KEN# and BRDY# attain to "L".

[Initialization at the Time of Power On]

Referring to FIG. 147, at the time of power on, the reset signal RST# is set to "L". In FIG. 147, an operation sequence for setting the CDRAM to an operational state from the sleep cycle Ts is shown as an example. The sleep cycle Ts is an operation cycle in which every circuit except the internal cell refresh circuit and the internal voltage generating circuit has the operation thereof stopped. This allows reduction of power consumption. Internal master clock is not generated, and the input signals are not taken, that is, the input signals are not sampled.

Then an initialization cycle Ti is carried out. In this initialization cycle, the reset signal RST# is set to the active state of "L", and the signal DH#/SP# is set to the inactive state of "H". By keeping the signal DH#/SP# at inactive "H" at least for 15T period, initialization in the CDRAM is carried out. In this initializing operation, the contents of the command registers described above are initialized, the DRAM is initialized and the data held in the bidirectional transfer circuit are initialized. The first access is not allowed until the lapse of at least 100T period from the start of the initialization cycle Ti. This is to ensure that the internal circuits are returned to the initial state.

[CPU Reset (CDRAM is not Reset)]

Referring to FIG. 148, when initialization is carried out with the CPU being reset and the CDRAM being not reset, at the time of CPU reset, the reset signal RST# is kept at the active state of "L". In this state, the signal DH#/SP# is kept at "L" in order to surely prevent initialization. When the reset of the CPU is released, the reset signal RST# rises to "H". Thereafter, the signal DH#/SP# is raised to the inactive state of "H". At this time, in the initialization cycle Ti, that is, when the reset of the CPU is released, it is inhibited to toggle the signal DH#/SP#, that is, to set this signal once to "H" and then lower this signal to "L", when the reset signal RST# rises to "H". This is to prevent initialization of the CDRAM. The operation upon going out from the sleep mode is the same.

[Setting of Sleep Mode]

Referring to FIG. 149, in order to set the sleep mode, the reset signal RST# and the refresh signal REF# are both set to "H", and the data hold/sleep mode signal DH#/SP# is set to "L". When the signal DH#/SP# is kept for at least 32T period, the CDRAM enters the sleep mode. In this state, internal operation is not carried out, and only the self refresh operation is carried out.

[Cancel of the Sleep Mode]

In order to cancel the sleep mode, the reset signal RST# and the refresh signal REF# are both set to "L" and the signal DH#/SP# which is at "L" is raised to "H", as shown in FIG. 150. The toggling of the signal DH#/SP# at the time of rise thereof is inhibited. This is in order to prevent initialization of the CDRAM. The first access is not allowed until the lapse of at least 15T period after the signals DH#/SP#, RST# and REF# are all set to "H", in order to surely set the internal circuit to the operable state.

[Command Register Read/Write]

Operation mode for accessing the command register includes a "command register index set" command CMIS, a "command register read" command CMRR for reading data of the command register, and a "command register write" command CMR for writing data to the command register. The command index is to identify the plurality of command registers provided. The reading/writing of the command register will be described in detail later, together with the structure and operation of the command register.

Whether the data is to be accessed or an index is to be accessed is designated by an address bit A0 in FIG. 151. The address status signal ADS# and the signal M/IO# are both set to "L". Whether data reading or writing is to be carried out is determined by the signal W/R#. When the register index is to be set, the signal W/R# may be "H" or "L".

In the next cycle, the command register enable signal CME is set to "L". Consequently, access to the command register is carried out. After the command register enable signal CME is set to the active state of "L", data writing/reading to and from the command register is carried out.

FIG. 152 shows, in a table, the state transition of various cycles. The cycle Tc1 is a command cycle 1, which is set when the address status signal ADS# is activated and the signal M/IO# is at "L". After this cycle Tc1, the command register enable signal CME# is monitored. As a result of this monitor, if the signal CME# is activated, the CDRAM enters the Tc2 cycle. If the signal CME# is at the inactive state at this time, the CDRAM returns to the address cycle Ta.

The second command cycle Tc2 is carried out successive to the above described first command cycle Tc1. In this cycle, writing or reading to and from the command register is carried out. By this time, the command to be accessed has been designated by the command register index set command. For setting the command register index, an address is used. The signal conditions effected at respective state transitions are as follows.

A: (transition from address cycle Ta to data cycle Td): this is realized when the signal ADS# is at an active state, the signal M/IO# is at "H", the device is at the selected state, the reset signal RST# is at the inactive state and the burst ready signal BRDY# is at the active state.

B: this state shows a transition from the address cycle Ta to the data wait cycle Tdw. This is carried out when the signal ADS# is at the active state, the signal M/IO# is at "H", the device is at the selected state, the reset signal RST# is at the inactive state, and the signal BRDY# is at the inactive state.

C: this state transition shows the transition from the data wait cycle Tdw to the data cycle Td. This is carried out when the signal DH# is at the inactive state, the reset signal RST# is at the inactive state and the signal BRDY# is at the active state.

D: this state transition repeats the data cycle Td. This state is realized when the data hold signal DH# is at the inactive state, the burst last signal BLAST# is at the inactive state, the reset signal RST# is at the inactive state and the burst ready signal BRDY# is at the active state.

E: transition from the data cycle Td to the data wait cycle Tdw is carried out when the signal DH# is at the inactive state, the burst last signal BLAST# is at the inactive state, the reset signal RST# is at the inactive state and the signal BRDY# is at the inactive state.

F: continuation of the data wait cycle Tdw is realized when the signals DH#, RST# and BRDY# are all at the inactive state.

G: return from the data cycle Td to the address cycle Ta is carried out when the signals DH# and RST# are both at the inactive state and the burst last signal BLAST# attains to the active state.

H: the transition from the data cycle Tdw to the data hold cycle Tdh is carried out when the data hold signal DH# is activated and the reset signal RST# is at the inactive state.

I: transition from the data hold cycle Tdh to the data cycle Td is carried out when the signal DH#, BLAST# and RST# are all at the inactive state and the burst ready signal BRDY# is at the active state.

J: transition from the data hold cycle Tdh to the data wait cycle Tdw is carried out when the signals DH#, BLAST#, RST# and BRDY# are all at the inactive state.

K: transition from the data hold cycle Tdh to the address cycle Ta is carried out when the signals DH# and RST# are both at the inactive state and the burst last signal BLAST# is rendered active.

L: transition from the address cycle Ta to the first command cycle Tc1 is carried out by setting the address status signal ADS# to the active state, setting the memory/IO signal M/IO# to "L" and setting the reset signal RST# to the inactive state.

M: transition from the first command cycle Tc1 to the second command cycle Tc2 is realized by setting the command register enable signal CME# to the active state and setting the reset signal RST# to the inactive state.

N: transition from the first command cycle Tc1 to the address cycle Ta is carried out by inactivating the signals CME# and RST#. 0: transition from the second command cycle Tc2 to the address cycle Ta is carried out when the reset signal RST# is set to the inactive state.

P: the address cycle Ta is maintained when the address status signal ADS# and the reset signal RST# are both set to the inactive state.

Q: transition from various cycles to the initial cycle Ti is realized by setting the reset signal RST# to the active state.

R: transition from the initialization cycle Ti to the address cycle Ta is realized by setting the reset signal RST# to the inactive state.

S: transition from the address cycle Ta to the sleep cycle Ts is realized when the sleep mode signal SP# is activated and the reset signal RST# is inactivated. At this time, the signal SP# must be kept at the active state for at least 32T cycle period.

T: the sleep cycle Ts is kept when the sleep mode signal SP# is at the active state. The sleep mode signal SP# is sampled in non-synchronization with the clock.

U: return from the sleep cycle Ts to the address cycle Ta is realized when the sleep mode signal SP# is inactivated. If the sleep mode is to be canceled to allow access, at least 15T period is necessary from the time the sleep mode signal SP# is inactivated.

[Command Register]

FIGS. 153A and 153B show, in a table, truth values of control signals for carrying out reading/writing of data of the command register and operations of respective cycles.

Referring to FIG. 153A, the command register access cycle is realized by using the signals M/IO#, D/C#, W/R# and CME# as well as the address signal bit A0. This shows in detail the states of respective control signals shown in the timing chart of FIG. 151. When the command register is accessed, the signal D/C# is set to "1" and the signal M/IO# is set to "L". When the command register enable signal CME# is set to "L", the signal which has been applied in the previous clock cycle is taken, and the designated operation is carried out. When the address signal bit A0 is at 0, the command register index set CMIS cycle is designated. When the address signal bit A0 is 1 and the write/read signal A/R# is at 0, the command register read cycle CMRR is set. When the address signal bit A0 is 1 and the write/read signal W/R# is at "1", the command register write cycle CMRW is designated.

When the command enable signal CME# is at "1", the command register does not operate at all.

Referring to FIG. 153B, when data is to be written to the command register, that is, when a prescribed mode is to be set, the command register index set CMIS and the command register write cycle CMRW are successively carried out. By the command register index set cycle CMIS, one command register is selected from the command register indexes 00h–1Ch in accordance with the data at input/output terminals DQ0 to DQ7. The indexes 00h–1Ch appended to the command register are in hexadecimal notation.

In the command register write cycle CMRW, data applied to data input/output terminals DQ0 to DQ7 are written to the selected register index. By repeating the above described operation, data writing can be carried out for every required command register.

When data stored in the command register is to be read, the command register index set cycle CMIS and the command register read cycle CMRR are carried out. Consequently, the stored data of the selected command register index is read. If all the necessary contents of the command registers are to be read, the above operation is repeated.

[Command Register Index 00h]

Referring to FIG. 154, the command register of index 00h has the width of 8 bits. Bit 7 is used for setting the input pin or the output pin of the auto refresh control pin REF# which will be described later. When bit 7 is set to 0, the REF# terminal functions as a signal input pin. When bit 7 is 1, the REF# terminal is used as a signal output terminal. When this bit 7 is at " 1", the state of the REF# terminal is controlled by a built-in refresh timer. Namely, when the REF# terminal functions as an output terminal, a refresh request signal is generated from the internal refresh timer.

Bit 6 is used to designate the cache operation at the time of a hit write. Namely, it sets whether or not write back is to be carried out at the time of the hit write.

Bit 5 is used to designate the cache operation at the time of a miss write, designating whether or not allocation should be done.

Bits 3 and 4 are used for setting refresh interval. The refresh interval is set at an appropriate value in accordance with the frequency of the master clock and the operation mode (at the time of sleep mode and the like).

Bit 2 is used for designating the bus size. The bus size is used for determining a shadow RAM address, which will be described later. As for the bus size, a 32 bit bus and a 64 bit bus are prepared.

Bits 0 and 1 are used for designating the number of memory banks. Address architecture changes in accordance with the number of the memory banks.

[Index 01h]

FIG. 155 shows the structure of the command register of the index 01h. In the following description, it is assumed that every command register has the width of 8 bits. Bits 5 to 7 are used for setting the frequency of the master clock. 33 MHz, 40 MHz, 50 MHz and 66 MHz are available as the frequency.

Bits 2–4 are set for setting the number of wait cycles. Namely, it sets the wait period until the output of the valid data in the access cycle. If it is the no-wait operation, valid data is output in the next cycle, in the access cycle. Bits 2, 3 and 4 set the wait state for the burst cycle, the write cycle and the read cycle, respectively. Bits 0 and 1 set the burst length and the burst type, respectively. 4 is prepared as the burst length. The burst type includes an interleave type in which different data are applied alternately, and a sequential type in which the same processing apparatus accesses. The interleave fashion is used when the video processing apparatus and the CPU access alternately in the image processing system, which will be described later.

[Indexes 02–03h]

The structure of the command registers of the indexes 02–03h is shown in FIG. 156. The command registers of indexes 02 and 03h are used for setting the non-cachable area. The non-cachable area means a DRAM array area in which the data of the DRAM array are not stored in the SRAM array as a cache but the CPU directly accesses to the DRAM array.

Bit 7 of the command register of the index 02h is used for designating whether the CPU address area (0C0000–0C7FFFh) should be cachable or non-cachable. Bits 4 to 6 of the command register of index 02h is used for designating the size of the non-cachable memory block. 64K bits, 128K bits, 256K bits and 512K bits are available as the block size.

Bits 0–3 of the command register of the index 02h and data bits 0–7 of the command register of the index 03h are used for designating the start address of the non-cachable memory block. Here, in accordance with the bus size designated by bit 2 of index 00h shown in FIG. 154, the CDRAM address architecture is changed. The start address of the non-cachable memory address set by the command register of indexes 02 and 03h corresponds to the command register address described with respect to bit 2 of the command register of the index 00h.

[Indexes 04 to 05h]

The structure of the command registers of indexes 04 to 05h is shown in FIG. 157. The command registers of indexes 04 and 05h are used for setting the non-cachable area. In the command registers of the indexes 02 and 03h, the non-cachable area is determined by the address signal bits A21 to A14 (or A20 to A13), which area is set in any of the CPU address areas 0C000 to 0C7FFFh. The command registers of the indexes 04 and 05h shown in FIG. 157 can set the non-cachable area in an arbitrary area. Bits 4 to 6 of the command register of the index 04h are used for designating the size of the non-cachable memory block. Bits 0 to 3 of the command register of the index 04h and the bits 0 to 7 of the index 05h are used for designating the start address of the non-cachable memory block. In that case, the non-cachable area designated by the indexes 04 and 05h is determined by the address signal bits A14 to A21 (or A13 to A20).

[Indexes 06h to 07h]

The structure of indexes 06h to 07h are shown in FIG. 158. Referring to FIG. 158, the command registers of indexes 06h and 07h are used for designating the test mode. The test mode which can be supported includes a refresh counter test and a test mode in which all the address area are set to the non-cachable area. The refresh counter test is a test mode in which whether the counter for generating the refresh address used for the refreshing operation of the DRAM array operates normally is determined. The address area is entirely made noncachable in order to test whether the memory cells of the DRAM. array are defective or not. The command register of the index 07h is used for future extension of functions.

[Indexes 10h–1Ch]Command registers of indexes 10h to 1Ch are used for controlling read/write of the shadow RAM area as shown in FIGS. 159 and 160. The CPU address area 0DC00–0FFFFh are prepared for the shadow RAM area. The CPU address area is allotted to each index. Enabling/disabling of reading/writing of each CPU address area is set by the bit values of bits W and R in the command register index.

[Read/Write Latency]

The number of clocks necessary for reading or writing of a valid data after the access, that is, the latency is shown in FIG. 161. The frequency command is set by the bits 5 to 7 of the register of the index 01h described above with reference to FIG. 155. The length of the latency is set in accordance with each clock frequency. In reading operation, valid data is output in the clock cycle next to the accessing if it is a hit, and thereafter data is successively output in every clock cycle. At a time of a cache miss, a prescribed clock cycles are necessary until the valid data is provided. "Non-dirty" and "dirty" shows the off and on states of the dirty bit, respectively. Namely, whether or not the data stored in the SRAM cache differs from the data stored in the corresponding memory cell of the DRAM array is indicated. If the dirty bit is on indicating the dirty state, the content of the SRAM array must be written back to the DRAM array. Parallel to the external access, in the CDRAM, data transfer between the SRAM array and the DRAM array is being carried out (see the page mode transfer and the fast copy back mode described above). The number of cycles required for this data transfer is shown in brackets ( ) in FIG. 161. When miss operation continuous, it is necessary to wait for the completion of the previous miss operation.

In the writing operation, the latency is the same no matter whether the access is a cache hit or cache miss since data can be directly written to the data transfer gate.

[Set up/Hold Time]

In the CDRAM, data input/output is carried out in synchronization with the master clock CLK. Therefore, the setup time and hold time of the input signal are designated with respect to the rising edge of the master clock CLK.

FIG. 162 shows the setup time and the hold time of the input signals. FIG. 163 shows established states of the output signal. The output signal becomes valid after the lapse of a prescribed time period from the rise of the master clock CLK, and becomes invalid after a prescribed time period from the rise of the master clock CLK.

[Output Circuit]

As shown in FIG. 164, generally, a plurality of CDRAMs are used to form a memory system. Referring to FIG. 164, CDRAMs CR00 to CR33 arranged in four rows x four columns are shown forming four banks. The bank #0 is constituted by CDRAMs CR00 to CR03, the bank #1 is constituted by CDRAMs CR10 to CR13, the bank #2 is constituted by CDRAMs CR20 to CR23, and bank #3 is constituted by CDRAMs CR30 to CR33. Each of the CDRAMs includes a 8 bit bus 7501 (generically refers to the reference characters 7501*a* to 7501*d*). 8 bit data buses 7501*a* to 7501*d* are connected to a 32 bit data bus 7501*e*. The CDRAMs are respectively connected to control bus 7500 (generically refers to reference characters 7500*a* to 7500*e*). Control buses 7500*a* to 7500*d* are connected to the main control bus 7500*e*.

As described above, the CDRAM itself generates control signals. That is, it generates the burst ready signal BRDY#, the cache enable signal KEN#, the local memory enable signal LME# and the refresh designating signal REF# upon set to the output. Portions for providing these signals are structured to be wired OR connected to the signal lines. Let us take the burst ready signal BRDY# as an example. This signal becomes active when it is at "L", at that time the CPU is informed that a valid data is provided so that the CPU processes the applied signal, and stores the applied data to a cache portion in the CPU in accordance with the active state ("L" level) of the cache enable signal KEN#.

In such a case, when a CMOS inverter is used at the output portion, one transistor turns on so that current constantly flows through the signal line, increasing power consumption of the CDRAM. When a 3-state buffer including a clocked inverter is used for the signal output portion, clock control becomes necessary, which results in complicated circuit structure and larger scale of the device. Therefore, an open drain structure such as shown in FIG. 165A is used as the output portion for generating such control signals in which the signal line is pulled up to the supply potential Vcc by a pull up resistance R.

Referring to FIG. 165A, output transistors OTA and OTB parallel to each other are connected to a signal line 9010. Output transistors OTA and OTB turn on in response to output designating signals $\phi$1 and $\phi$2 in the CDRAMs CRA and CRB, respectively, to discharge the signal line 9010. A pull up resistance R is provided on the signal line 9010. Assumed that the CDRAMs CRA and CRB do not output signals simultaneously. Namely, transistors OTA and OTB do not turn on at the same time. These memories belong to different banks in the structure shown in FIG. 164. The operation of the circuit shown in FIG. 165A will be described with reference to the diagram of signal waveforms thereof in FIG. 165B.

Assume that a read designation is applied to the CDRAM CRA and valid data is provided. In that case, first the signal $\phi$1 rises to "H", rendering conductive the output transistor OTA. Consequently, the potential SigA of signal line 9010 which has been pulled up to the supply potential Vcc by the pull up resistance R is quickly discharged through the output transistor OTA. When the data output operation is completed, the signal $\phi$1 falls to "L". Consequently, the signal line 9010 is pulled up to the supply potential Vcc level by the pull up resistance R. The resistance value of resistance R is set relatively large and the current consumption thereof is small.

Thereafter, the CDRAM CRB is accessed and the signal $\phi$2 rises to "H". Consequently, the output transistor OTB turns on to discharge the signal line 9010 to the ground potential level. After the completion of prescribed processing, the signal $\phi$2 falls to "L" and the signal line 9010 is again charged to the supply potential level Vcc.

By using the above described output portion, necessary signals such as the signal BRDY# can be transmitted to the CPU by a simple circuit structure.

Though the signal line 9010 is charged by the pull up resistance R, there is a stray capacitance C on the signal line 9010. Therefore, the time defined by the RC time constant is required for the signal SigA on the signal line 9010 to rise from "L" to "H".

The CPU determines whether or not the next access is possible, and whether or not the valid data is applied in accordance with the state of the signal SigA on the signal line 9010. Therefore, if the rise of the signal SigA on signal line 9010 is moderate and if it is determined at the rising edge of the master clock CLK that it is "L", erroneous data may possibly be taken. Since the CPU determines whether or not the next access is possible in accordance with the state of the signal SigA, in this case it becomes impossible to access the memory of a different bank by switching the banks, which prevents high speed operation. If the resistance value of the pull up resistance R is made smaller, the signal line 9010 can be charged at high speed. However, in that case a large current flows through the signal line 9010, causing increase of the power consumption of the memory system.

FIG. 166 shows a structure of the CDRAM having an improved output portion in accordance with the present invention. Referring to FIG. 166, the output portion of the CDRAM includes an output transistor 9011 for discharging the signal line 9010 and a transistor 9012 for charging for a prescribed period, the signal line 9010. The output portion of the CDRAM CRA includes an output transistor 9011*a* which is rendered conductive in accordance with a signal ϕD, and a p channel MOS transistor 9012*a* which is rendered conductive in response to a signal ϕL. The signal ϕ1L is kept at "L" for a prescribed time period only in response to the fall of the signal ϕ1D. The CDRAM CRB similarly includes an output transistor 9011*b* which is rendered conductive in response to a signal ϕ2D for discharging the signal line 9010, and a p channel MOS transistor 9012*b* for charging the signal line 9010 for a prescribed time period only in response to a signal ϕ2L. The master clock CLK is applied to the CDRAMs CRA and CRB through a signal line 9009. The operation of the output portion shown in FIG. 166 will be described with reference to the diagram of waveforms shown in FIG. 167.

First, let us assume that the CDRAM CRA is set to the operable state and carries out a prescribed processing. At this time, a certain process (indicated by □ in the figure) is carried out from the rising edge of the master clock CLK, the signal ϕ1D rises to "H" after the lapse of a prescribed time period, so as to discharge the signal line 9010 to the ground potential level. Then, after the lapse of a prescribed time period (the length of this period changes dependent on the data hold period, burst length and the like), the signal ϕ1D falls to "L", with the rising edge of the master clock CLK used as a trigger. The fall of the signal ϕ1D is used as a trigger and the signal ϕ1L falls to and kept at "L" for a prescribed time period. Consequently, transistor 9011*a* turns off and the transistor 9012*a* turns on. Thus the signal line 9010 is charged at high speed through the transistor 9012*a*. After the lapse of a prescribed time period, the transistor 9012*a* is changed to off state.

At this time, as shown in FIG. 162, the output signal does not change for a prescribed time period from the rising of the master clock CLK. More specifically, the pull down transistor 9011 turns from off state to on state after the lapse of a prescribed time period from the rising edge of the master clock CLK. Therefore, during this period, even if the transistor 9012*a* is on, the transistor 9011*b* does not turn on. Therefore, there is no collision of signals, a through current does not flow from the transistor 9012*a* to the transistor 9011*b*, and the signal line 9010 is charged at high speed. Since the signal ϕ1L is generated using the signal ϕ1D as a trigger, the transistors 9011*a* and 9012*a* does not turn on simultaneously. Therefore, through current does not flow in the CDRAM CRA. Since the transistor 9012*a* changes to the off state after the lapse of a prescribed time period, the power consumption thereof is quite small.

Then, in accordance with the state of the signal Sig on the signal line 9010, the CDRAM CRB is accessed by the external CPU, transistor 9011*b* turns on similarly and discharges the signal line 9010. Then, transistor 9011*b* is turned off, thereafter the signal ϕ2L is generated, the transistor 9012*b* turns on and charges the signal line 9012 for a prescribed time period at high speed.

Every CDRAM operates using the rising edge of the master clock as a trigger. Parameters of various signals are set with the rising edge of the master clock CLK used as a reference. Therefore, the period in which the pull up transistors 9012*a* and 9012*b* are kept at the conductive state can be precisely set.

FIG. 168 shows a circuit structure for generating control signals ϕD and ϕL. Referring to FIG. 168, the control signal generating system includes a processing circuit 9020 for generating a set signal after the lapse of a prescribed time period in accordance with an applied command; a set/reset flipflop 9021 which is set in response to the set signal from processing circuit 9020 and reset at a rising edge of the clock signal CLK; an inverter circuit 9022 inverting the output of flipflop 9021; and a one shot pulse generating circuit 9023 responsive to an output from inverter circuit 9022 for generating a one shot pulse having a prescribed pulse width. The control signal ϕD is generated from set/reset flipflop 9021, which signal turns on the transistor 9011 for discharging the output line. The one shot pulse ϕL generated from one shot pulse generating circuit 9023 turns on the transistor 9012 for charging the output signal line.

In the structure shown in FIG. 168, the signal ϕD is reset at the rising edge of the master clock CLK. In response to the transition of the signal ϕD to the reset state, one shot pulse ϕL is generated for a prescribed period. The processing circuit 9020 has an operation changed in accordance with the content of the signal output from the output portion shown in FIG. 166. The set/reset flipflop 9021 is reset at every rising edge of the master clock CLK. However, a circuit structure in which a reset signal is generated from another processing circuit after the completion of a processing in response to the rising edge of the master clock CLK may be used. The set/reset flipflop 9021 has its setting capability made larger than its resetting capability.

FIG. 169 shows another structure of the control signal generating system. Referring to FIG. 169, the control signal generating system includes a flipflop 9025 which receives at its set input a signal applied from the inverter circuit 9022 shown in FIG. 168 and at its reset input the master clock CLK. Flipflop 9025 is reset in response to the fall of the master clock CLK. The control signal ϕL is generated from its complementary output/Q. The operation of the circuit shown in FIG. 169 will be described with reference to FIG. 170, which is the diagram of waveforms.

When the signal ϕD is at "H", the output of inverter circuit 9022 is at "L". At this state, the signal ϕL is kept at the reset state. In other words, it is kept at the state of "H". When the signal ϕD falls to "L", the output of inverter circuit 9022 rises and flipflop 9025 is set. In response, the signal ϕL is set and attains to "L". Then, when the master clock CLK falls, flipflop 9025 is reset and the signal ϕL rises to "H". An edge trigger type flipflop which is set in response to the rise of the set input and reset in response to the fall of the master clock may be used as the flipflop 9025. The flipflop 9025 may have its resetting capability made larger than the setting capability. If so, the flipflop 9025 is reset in response to the fall of the master clock CLK even if the signal applied to its set input S is at the active state of "H".

As described above, if the output of the circuit which is wired OR connected to the signal line 9010 is a signal output in synchronization with the mater clock signal CLK, the signal line can be charged at precise timing in accordance with the clock signal for synchronization, and therefore the signal line can be raised to the pull up potential at high speed with small current consumption.

In the above described structure, signal line 9010 is pulled up to the level of the supply potential Vcc. The signal line 9010 may be pulled down to the ground potential level. In that case, the structure is such that a wired OR connected signal line potential is charged to the supply by the driving transistor of the output, and the signal line is discharged for a short period through the driving transistor provided at the output to the round potential level. Namely, the polarities of the transistors in the above described example are changed.

[Method of Setting Test Modes]

Referring to FIG. 158, by using command registers of indexes 06h and 07h, test can be carried out by setting the test mode. For example, the refresh counter can be checked and the DRAM array can be directly accessed. In that case, there are some kinds of test modes which are not required by the user. For example, generally a reference voltage (Vcc/2) is applied to a cell plate which is one electrode of a storage capacitor of a dynamic type memory cell, and it is necessary to ensure the break down voltage characteristic of the storage capacitor by measuring the break down voltage characteristic thereof by varying the cell plate voltage. In that case, acceleration test is carried out with the cell plate voltage raised higher than the generally applied reference voltage (Vcc/2). It is desirable that the device does not enter such a test mode even if a user operates the memory at erroneous timing. A structure for such an operation will be described.

FIG. 171 shows a method of setting a test mode in the CDRAM in accordance with the present invention. Referring to FIG. 171, the test mode is set when the command register set cycle (Tc1 or Tc2) is repeated twice successively. At this time, in the second cycle, the command register enable signal CME# is set to the inactive state of "H". In that case, access to the command register is not carried out. The address applied at this time, that is, the address signal bit applied at the time of setting the test mode is used as a signal for designating the test mode. This enables entering of a desired test mode among a plurality of test modes, and it becomes possible to set the specific test mode only to the operable state.

For canceling the test mode, the same command register set command is applied again. In this case also, the first command cycle Tc1 or the second command cycle Tc2 is carried out. The signal CME# is held at "H".

As described above, test mode is entered in accordance with the signal timing only and a specific test mode is entered in accordance with the address key (a combination of the prescribed address signal bits). Therefore, as compared with the method of entering a test mode by applying a signal raised to be higher than the supply voltage Vcc, the test mode can be entered easily with higher reliability and the test mode can be readily utilized after the device is mounted on a chip.

Since the test mode is entered in accordance with the command register set mode, desired commands other than those for the command register setting operation can be applied during the testing operation, so that the CDRAM can carry out a desired circuit operation.

In a semiconductor memory device including a command register, the method of entering the test mode can utilize the command register set cycle. For example, in the CDRAM which has the truth stable of the signals such as shown in FIG. 94, the command register can be set by using the signals RAS#, CAS# and DTD#. In that case, the command for setting the command register is applied at the rising edge of the external clock signal K as shown in FIG. 172. In other words, the external control signals ext.CS#, ext.RAS#, ext-.CAS# and ext.DTD# are also set to "L". This command is successively applied for 2 clock cycles. By the command register set cycle of this second clock, test mode is entered and the specific test mode carried out at that time is set by the external address signal ext.Ad. A structure in which only a specific test mode is activated in accordance with a prescribed address key may be used, instead of a structure in which one test mode is selected from a plurality of test modes. A structure in which the remaining test modes are carried out in accordance with the test mode set in the command register may be used.

Generally, according to the specification of the product, when a command register set command is applied, input of other commands is inhibited for one to three cycles. Since the test mode is entered at such an operation timing that is inhibited according to the specification, erroneous entering of the test causing an erroneous operation of the CDRAM can be prevented.

FIG. 173 shows an example of the structure of the test mode setting circuit. Referring to FIG. 173, the test command mode setting circuit includes a command detecting circuit 9030 receiving an external control signal for detecting an input of a command register set command; a counter 9032 for counting the detecting signal from command detecting circuit 9030; an address key detecting circuit 9035 responsive to a 2 count signal from counter 9032 for comparing the address signal applied at that time with a prescribed key for determining coincidence/non-coincidence; and a test circuit 9034 which is activated in response to a coincidence detection signal from address key detecting circuit 9035 for setting a desired test mode. Test circuit 9034 is disabled in response to a 3 count up signal from counter 9034. Command register 9033 is rendered active in response to a command detecting signal from command detecting circuit 9030. Access to the command register 9033 is allowed only when the command enable signal CME# is activated, in this structure of the third embodiment.

When the command detecting signal is applied twice in continuous clock cycles, counter 9032 generates a count up signal and applies it to address key detecting circuit 9035. After it counts up, it disables test circuit 9034 in response to the next applied command detecting signal. Test circuit 9034 allows a prescribed testing operation in response to the key detection signal from address key detecting circuit 9035. When the cell plate bump test is to be carried out, for example, a reference voltage source connected to the cell plate, that is, a node connected to the reference potential generating source generating the potential of Vcc/2 is connected to an external power supply terminal. Thus, the cell plate voltage can be easily raised. A structure in which the connection of the node is switched to an internal voltage generating circuit for the test and the internal voltage generating circuit for the test generates a prescribed voltage under control of the test circuit 9034 may be employed. The test circuit 9034 may include such an internal voltage generating circuit for the test.

FIG. 174 shows another structure of the test mode setting circuit. Referring to FIG. 174, a counter 904 2 detects the command register setting command from a command detecting circuit 9040 and counts the number thereof. A test mode setting circuit 9044 is activated in response to a 2 count up signal from counter 9042 and sets a prescribed test mode in accordance with the address applied at that time. More specifically, the test mode setting circuit 9044 has a function of decoding the address signal and designating a prescribed test mode. A test circuit 904 6 sets its circuit structure so as to implement the test mode designated by the test mode setting circuit 9044. The test circuit 9044 is similar to the test circuit 9034 shown in FIG. 173.

In the structure shown in FIGS. 173 and 174, a structure in which a test mode designating signal of a prescribed command register 9033 is read in accordance with the 2 count up signal from counter 9032 and applied to the test circuit may be used. In that case, prescribed specific test mode is set in advance in the command register 9033.

FIG. 175 shows an example of the structure of the counter shown in FIGS. 173 and 174. Referring to FIG. 175, the counter 9032 (9042) includes a one shot pulse generating circuit 9050 responsive to the command detecting signal ϕ from the command detecting circuit for generating a pulse of a prescribed pulse width (2 clock cycles); a counter circuit 9054 for counting the command detecting signal ϕ; a set/reset flipflop 9056 receiving at its set input S the 2 count up signal C2 from counter circuit 9054 and at its reset input R the 3 count up signal C3 from counter circuit 9054; and a gate circuit 9052 receiving an output 9 from flipflop 9056 and an output from one shot pulse generating circuit 9050. As an example, the gate circuit 9052 is an OR gate. When the output from gate circuit 9052 is at "H", the counter circuit 9054 is set to the operable state. The operation of the counter circuit shown in FIG. 175 will be described with reference to FIG. 176 which is a diagram of waveforms.

When a command register set command is applied at a rise of the master clock CLK, the command detecting signal ϕ rises. In response to the command detecting signal ϕ, a one shot pulse is generated from one shot pulse generating circuit 9050 and the output from gate 9052 rises to "H". Consequently, counter circuit 9054 is set to the operable state and counts the command detecting signal ϕ applied at that time. Thus the count value reaches 1.

The output of the one shot pulse generating circuit 9052 has a pulse width of 2 clock cycle periods (indicated by the dotted line in FIG. 176). When a command detecting signal ϕ is applied successively in this period, the counter circuit 9054 generates the 2 count up signal C2. Thus flipflop 9056 is set and its output Q rises to "H". In response to the rise of the output Q of flipflop 9056, the pulse generating operation of one shot pulse generating circuit 9050 is inhibited. Namely, the output of one shot pulse generating circuit 9050 falls to "L". Meanwhile, the gate 9052 continuously outputs the signal of "H" in accordance with the output Q of flipflop 9056. Thus counter circuit 9054 is kept at the operable state.

When the third command detection signal ϕ is applied, the one shot generating circuit 9050 does not generate a pulse. In response to the third command detection signal ϕ, counter circuit 9054 raises the 3 count up signal C3 to "H". Consequently, the output Q of flipflop 9056 falls to "L", and the counter circuit 9054 is reset. In response to the fall of Q output of the flipflop 9056, the one shot pulse generating circuit 9050 is again set to the operable state.

When the command detection signal ϕ is not continuously applied twice, the output of one shot pulse generating circuit 9050 falls in response to the second clock signal from the first application of the command detecting signal ϕ, as shown by the dotted line in FIG. 176, and in response, the count value of the counter circuit 9054 is reset. Thus continuous twice application of the command detection signal, that is, application of the command register set command twice continuously can be surely detected.

|Refresh Control|

As shown in FIG. 154, the seventh bit of command register of index 00h can set the REF# terminal to an input terminal or an output terminal. The input/output structure of the REF# pin will be described.

Assume that the CDRAM is arranged in N banks, as shown in FIG. 177. Referring to FIG. 177, bank 0 to bank N each have a 4 byte word structure of byte 0 to byte 3, and in each bank terminals REF# of CDRAMs are commonly connected. In each bank, the terminal REF# of one CDRAM is set to be the output terminal and the terminals REF# of the remaining CDRAMs are set to be the input terminals. Consequently, refresh can be carried out under the control of one CDRAM in each bank.

FIG. 178 shows a structure of a portion related to refreshing of the CDRAM. In FIG. 178, for easier understanding of the refreshing operation, description will be given of an example in which the memory access is designated by the row address strobe signal ext.RAS# which is a commonly used external control signal in a standard DRAM. The CDRAM in the third embodiment has a controller provided therein, and carries out sampling of external control signals in accordance with an address status signal ADS#. The internal RAS signal is generated as needed in accordance with the result of sampling. This structure will be briefly described later. In the following, simply a state is shown in which the RAS buffer 6030 generates an internal RAS signal ϕRAS# in accordance with the external row address strobe signal ext.RAS# as the memory access signal (as this state is common in first to third embodiments). When the internal row address strobe signal (internal RAS signal) ϕRAS# is at the active state of "L", the DRAM array is active.

Referring to FIG. 178, the refresh control system includes a master circuit 8010 for generating a refresh request; a master/slave switching circuit 8040 for transmitting the refresh request from master circuit 8010 to a refresh terminal 8000 in accordance with a master/slave setting flag M/S# from the command register; and a slave circuit 8020 responsive to the refresh request applied to the terminal 8000 for carrying out the refreshing operation.

Master circuit 8010 includes a self refresh timer 8012 for generating the refresh request ϕREFs# at prescribed time intervals, and a first arbiter 8014 for arbitrating the refresh request ϕREFs# from self refresh timer 8012 and the internal RAS signal ϕRAS# from RAS buffer 8030. When the internal RAS signal ϕRAS# is active and a refresh request ϕREFs# is applied, the first arbiter 8014 outputs a refresh request ϕREF# when the internal RAS signal ϕRAS is inactivated. At this time, as will be described in detail later, the first arbiter 8014 outputs a refresh request ϕREFs# in synchronization with the master clock CLK.

Master/slave switching circuit 8040 transmits, when the master/slave flag M/S# indicates the master state, the refresh request applied from the first arbiter 8014 to the refresh terminal 8000. When the slave state is designated, the switching circuit 8040 is set to the output high impedance state, inhibiting transmission of the output from the first arbiter 8014.

The slave circuit 8020 includes a second arbiter 8022 for carrying out arbitration of the refresh request applied from terminal 8000 (from the outside or from the same chip) and a precharge completion signal φPR, and an auto refresh control circuit 8024 responsive to the refresh request φREFa# from the arbiter 8022 for carrying out necessary control for the refresh. Auto refresh control circuit 8024 includes an address counter for designating the row to be refreshed. When the refresh request φREFa# is applied, it carries out the row selecting operation of the DRAM and sense amplifier activating operation using the refresh address from the refresh address counter as the row address. The auto refresh control circuit 8024 generates the internal RAS signal φRASa# which has a prescribed time width (time width including at least the time necessary for the completion of the row selecting and sensing operations in the DRAM array), in response to the refresh request signal φREFa#. The RAS buffer 8030 carries out a logic operation on the external row address strobe signal ext.RAS# and the internal RAS signal φRASa# and generates the internal RAS signal φRAS#.

The second arbiter 8022 transmits the refresh request applied internally or from the outside of the chip through the terminal 8000 to the auto refresh control circuit, when the precharge completion signal φPR of the RAS buffer 8030 is rendered active indicating that the precharging of the DRAM array has been completed. The second arbiter 8022 provides a mask signal φMask# to the RAS buffer 8030 simultaneously with the transmission of the refresh request φREFa# to the auto refresh control circuit 8024.

In accordance with the mask signal φMask# generated from the second arbiter 8022, the RAS buffer 8030 masks the external row address strobe signal ext.RAS# and inhibits external access. The operations of the master circuit 8010 and of the slave circuit 8020 shown in FIG. 178 will be described with reference to FIGS. 179 and 180, which are the diagrams of signal waveforms showing these operations.

First, referring to FIG. 179, the operation of the master circuit 8010 will be described. When the internal RAS signal φRAS# is at the active state of "L", the DRAM array is being accessed from the outside, and the DRAM array is active. When a refresh request φREFs# is applied from the self refresh timer 8012, the first arbiter 8014 transmits, when the φRAS# attains to the inactive state of "H", the refresh request φREFs# in synchronization with the master clock CLK. The switching circuit 8040 has been set to the operable state in accordance with the flag M/S#, so that it transmits the refresh request applied from the first arbiter 8014 to the terminal 8000 and to the slave circuit 8020. Thus refresh request for other CDRAM is transmitted from the terminal 8000.

At this time, from the first arbiter 8014, an external refresh request is provided in response to (in synchronization with) the rise of the external master clock ext.CLK. The external refresh request REF# returns to the inactive state with the rise of the master clock CLK being used as a trigger, and the first arbiter 8014 changes the internal refresh request φREFs# to the inactive state. Thus the self refresh timer 8012 is again reset, starting a new counting operation. By this structure, the refresh request can be generated always in synchronization with the external master clock CLK. In the master chip (the chip in which the flag M/S# sets the terminal 8000 to the output terminal), the second arbiter 8022 carries out the arbitration of the refresh request applied from the switching circuit 8040. The second arbiter 8020 generates a mask signal φMask# in response to the refresh request applied from the switching circuit 8040. The first arbiter 8014 generates the refresh request in synchronization with the master clock CLK after the internal RAS signal φRAS# is inactivated. Therefore, mask signal φ Mask# has a function of masking a newly applied access request.

When a refresh request is applied, the second arbiter 8022 generates a refresh request φREFa# when the precharge completion signal φPR from the RAS buffer 8030 is inactivated and precharge is completed. The auto refresh control circuit 8024 carries out the refreshing operation in accordance with the refresh request φREFa#. More specifically, the count value from the address counter is selected by a multiplexer to be applied to the DRAM row decoder, so that the DRAM row decoder is activated and the sense amplifier is driven. The internal RAS signal φRAS generated at this time has a prescribed time width. Namely, the auto refresh control circuit 8024 generates a one shot pulse signal having a prescribed time width as the internal RAS signal φRASa# in response to the refresh request φREFa#.

When a prescribed time period has passed, the refresh operation is completed, the mask signal φMask# is inactivated which allows acceptance of the external accessing.

In the slave chip (a chip in which the terminal 8000 is set as an input terminal by the flag M/S#), refreshing operation is carried out in accordance with the refresh request applied externally through the terminal 8000. Therefore, refreshing operation can be carried out by the slave chip in synchronization, in accordance with the refresh request from the master chip. At this time, since the refresh request is applied in synchronization with the master clock, a plurality of CDRAMs are subjected to the refreshing operation simultaneously, not influence by the deviation of timings.

Since there are the first and second arbiter circuits 8014 and 8022, refreshing operation can be carried out with the activation of the DRAM array arbitrated. Thus self refresh can be carried out even in the normal operation mode. The structure of various portions will be described in the following.

FIG. 181 shows a circuit structure for generating the precharge completion signal φPR. This circuit is included in the RAS buffer 8030 shown in FIG. 178. Referring to FIG. 181, the precharge completion signal generating system includes a delay circuit 9060 which provides a delay of a prescribed time period to the rise of the internal RAS signal φRAS#. In the structure shown in FIG. 181, the precharge completion signal φPR rises to "H" after a prescribed time period from the rise of the internal RAS signal φRAS# to the inactive state of "H", indicating the completion of precharging, as shown in FIG. 182. The precharge completion signal φPR is set to the inactive "L" approximately at the same time when the internal RAS signal φRAS# changed to the active state of "L".

FIG. 183 shows another structure of the precharge completion signal generating system. Referring to FIG. 183, a counter 906 4 is activated in response to the rise of the internal RAS signal φRAS#, counts the master clock CLK for a prescribed time period and rises the precharge completion signal φPR to the active state of "H", indicating the completion of the precharging. In that case, the precharge completion signal may be generated in the form of a one shot pulse. A signal obtained by an AND operation of the internal RAS signal φRAS# and the precharge completion signal φPR may be generated as a precharge completion designating signal. When this AND operation is to be employed, the precharge completion signal φPR is kept at the inactive state of "L" when the internal RAS signal φRAS# is at the active state of "L", that is, when the DRAM array is at the active state.

The delay time provided by the rise delay circuit 9060 and counter 9064 may be as long as about the RAS precharge time.

FIG. 184 shows an example of the structure of the first arbiter shown in FIG. 178. Referring to FIG. 184, the first arbiter 8014 includes an inverter circuit 8068 for inverting the refresh request (ext.REF#) output from switching circuit 8040, a set/reset flipflop 8062 receiving at its set input S the output from inverter circuit 8061 and at its reset input RD output from inverter circuit 8068, a 2-input AND circuit 8063 receiving the output Q from flipflop 8062 and the internal RAS signal ϕRAS#, a latch circuit 8064 which takes and latches the output from AND circuit 8063 in response to the rise of the master clock CLK, and a flipflop 8066 receiving at its set input S the output Q of latch circuit 8064. The external refresh request ext.REF# is generated from flipflop 8066 (which is applied to refresh terminal 8000 through switching circuit 8040).

Flipflop 8066 is reset by an output of gate circuit 8067 which receives at its true input the master clock CLK and at its false input the output /Q of flipflop 8066. More specifically, after the external refresh request ext.REF# is generated (when it attains "L"), the flipflop 8066 is reset at the rise of the next clock signal CLK and the external refresh request ext.REF# is reset. The operation will be briefly described.

When the refresh request ϕREFs# is applied from self refresh timer 8012 (see FIG. 178), the flipflop 8062 is set (by that time, the external refresh request ext.REF# is still at the inactive state of "H"). When the internal RAS signal ϕRAS# attains to the inactive state of "H", gate circuit 8063 passes the output Q of flipflop 8062. Latch circuit 8064 takes and latches the output from gate circuit 8063 in synchronization with the rise of the master clock CLK. Therefore, the refresh request is taken in and latched by the latch circuit 8064 in synchronization with the rise of the next clock signal CLK when the internal RAS signal ϕRAS# is rendered inactive. Thus the output Q of latch circuit 8064 rises to "H", flipflop 8066 is set and its output /Q attains to "L". Thus the refresh request is generated. When the refresh request ext.REF# attains to the active state of "L", gate circuit 8067 resets the flipflop 8066 in response to the rise of the next master clock CLK. Thus the output /Q of flipflop 8066 is reset from "L" to "H".

By the above described structure, the external refresh request is generated only when the internal RAS signal ϕRAS# is inactive. When the external refresh request ext.REF# attains to the active state, the flipflop 8662 is reset by the inverter circuit 8068, and the output Q of flipflop 8062 falls to "L". Thereafter the output Q of latch circuit 8064 attains to "L". Flipflop 8066 is not set at all and kept at the reset state.

The refresh request ϕREFs# output from self refresh timer 8012 is a one shot pulse having a prescribed time width, and resetting thereof is not necessary.

FIG. 185 shows an example of the structure of the second arbiter shown in FIG. 178. Referring to FIG. 185, the second arbiter 8022 includes a latch circuit 8070 which takes and latches the external refresh request ext.REF# in synchronization with the rise of the master clock CLK, and a flipflop 8072 which is set in response to the complementary output /Q of latch circuit 8070. The mask signal ϕMask# is provided from the complementary output /Q of flipflop 8072.

Second arbiter 8022 further includes a gate circuit 8074 receiving the mask signal ϕMask# and the precharge completion signal ϕPR, and a counter 8076 which is activated in response to the refresh request signal ϕREFa# generated from gate circuit 8074 for counting, to a prescribed number the master clock CLK. After a prescribed number of master clocks CLK is counted, the counter 8076 resets the flipflop 8072. Counter 8076 determines the refresh operation period. The operation will be briefly described.

When the external refresh request ext.REF# falls to the active state of "L", latch circuit 8070 takes and latches the external refresh request ext.REF# in synchronization with the rise of the clock signal CLK. Consequently, the complementary output /Q of latch circuit 8070 rises to "H", setting the flipflop 8072. Thus the mask signal ϕMask# output from complementary output /Q of flipflop 8072 changes to the active state of "L".

After the mask signal ϕMask# attains to the active state of "L", when the precharge completion signal ϕPR attains to the active state of "H", gate circuit 8074 generates a refresh request ϕREFa#. Counter 8076 counts to a prescribed number the clocks CLK in response to the refresh request REFa#, and after the counting of the prescribed number, it resets the flipflop 8072. Consequently, mask signal ϕMask# is reset to "H", the output of gate circuit 8074 also attains to "H", and the refresh request ϕREFa# attains to the inactive state.

In the structure shown in FIG. 185, the refresh request ϕREFa# generated from the first arbiter is at the active state "L" during the refreshing operation period. A structure in which it is generated in the form of a one shot pulse may be used. More specifically, a structure in which a one shot pulse generating circuit is provided at the output portion of the gate circuit 8074 and the counter 8076 is activated in response to the output from the one shot pulse generating circuit may be used. Though not shown, the count value of the counter 8076 is reset to the initial value when a prescribed count value is counted up.

FIG. 186 shows an example of a specific structure of the RAS buffer and the refresh control circuit. Referring to FIG. 186, the RAS buffer 8030 includes a gate circuit 8080 receiving the external RAS signal ext.RAS# and the mask signal ϕMask#, and an NOR circuit 8082 receiving at its one input the output of gate circuit 8080. The NOR circuit 8082 receives at its other input the internal RAS signal ϕRASa# generated from the refresh control circuit 8024.

Refresh control circuit 8024 includes a refresh detecting circuit 8090 for detecting a refresh in response to the refresh request signal ϕREFa#; a pulse generating circuit 8094 responsive to the refresh detection signal ϕREFa# from refresh detecting circuit 8090 for generating a pulse signal ϕRASa# having a prescribed time width (refresh operating time); an address counter 8092 responsive to the rise (inactivation) of the internal RAS signal ϕRASa# from the pulse generating circuit 8094 for incrementing by one the count value; and a multiplexer 8096 for selecting either the count value of the address counter 8092 or an external address in accordance with the internal RAS signal ϕRASa# from pulse generating circuit 8094.

The output of multiplexer 8096 is applied to the DRAM row decoder. At this time, the output of multiplexer 8096 may be applied to the DRAM row decoder through an address buffer. The external RAS signal generated from gate circuit 8082 is applied to a DRAM RAS driving circuit 8096. The DRAM RAS system driving circuit 8096 carries out activation of the DRAM row decoder, selection of word lines, activation of sense amplifiers and so on.

In the structure shown in FIG. 186, when the refresh request signal ϕREFa# is kept at the active state during the refresh operation period as shown in FIG. 185, it is not necessary to provide the refresh detecting circuit and the pulse generating circuit 8094. The refresh detecting circuit 8090 and the pulse generating circuit 8094 are necessary when the refresh request signal φREFa# is generated in the form of a one shot pulse.

Address counter 8092 may be structured such that the count value is set to the output enabled state in response to the refresh detecting signal RA from the refresh detecting circuit 8090.

The circuit structure shown in FIG. 186 is included in the DRAM control and cache/refresh control portion 7026 shown in FIG. 131, in the CDRAM of the third embodiment. The control portion 7026 does not directly receive the external RAS signal ext.RAS#. In this case, a structure may be used in which a circuit for detecting a return to the address cycle Ta is provided in the control portion 7026 and arbitration is carried out in response to the detection of the return to the address cycle Ta instead of the external RAS# signal.

The control portion 7026 shown in FIG. 131 has a structure of external control apparatus 3100 shown in FIG. 111. Therefore, when an access is given to the DRAM array, an access control signal is generated from the controller 3108 (see FIG. 111) to the DRAM array. Therefore, the structure is such that the internal RAS signal applied from this control portion 7026 rather than the external control signal is applied to the gate circuit 8080 of FIG. 186.

In the structures of the first and second embodiments in which various operations are designated in accordance with the combinations of the states of external signals at the rise of the clock signal, an active command detecting signal is applied instead of the external address strobe signal ext.RAS#. The external control signals used at this time differs dependent on the control signals used in respective embodiments.

In the third embodiment, a structure in which the address status signal ADS# is masked at the time of refresh request instead of the signal RAS# may be used.

FIG. 187 shows another structure of the refresh control portion. As already described, in the sleep mode, that is, when the signal SP# is kept at the active state of "L" for a prescribed time period or longer, the CDRAM enters the sleep mode. In the sleep mode, the internal circuit does not operate. Therefore, the CPU does not access thereto. In this state, self refresh is carried out. The structure for this will be described in the following.

Referring to FIG. 187, refresh control portion includes inverter circuits 8702 and 8704 inverting the sleep designating signal Sleep, an AND circuit 8700 receiving the output from inverter circuit 8702 and the master/slave flag M/S#, a gate circuit 8708 receiving the output from inverter circuit 8704 and a refresh request applied either from the refresh terminal 8000 or from the selection switching circuit 8040, a gate circuit 8706 receiving the refresh request φREF# applied from the first arbiter 8014 and the sleep mode designating signal Sleep, and a gate circuit 8710 receiving the outputs from gate circuits 8706 and 8708. A refresh request signal is transmitted from the gate circuit 8710 to the second arbiter 8020.

The gate circuit 8706 provides an active signal when the refresh request φREF# is at the active state of "L" and the sleep mode designating signal Sleep is at the active state of "H". Gate circuit 8708 provides a signal at "H" when the external refresh request ext.REF# is at the active state and the signal applied from the inverter circuit 8704 attains to the inactive "H". Gate circuit 8710 provides a signal at "L" when either one of the outputs from gate circuits 8706 and 8708 attains to "H". Gate circuit 8700 controls the output state of the switching circuit 8040. The operation will be described briefly in the following.

In the normal operation mode, the sleep mode designating signal Sleep is inactive, and gate circuit 8700 passes the flag M/S#. Therefore, the switching circuit 8040 is set to the output high impedance state or the refresh request φREF# passing state in accordance with the flag M/S#. Since the sleep mode designating signal Sleep is at the inactive "L", the output of gate circuit 8706 is fixed at "L". Gate circuit 8708 receives the signal at "H" at its positive input through the inverter circuit 8704, and operates as a buffer. Therefore, in this case, a refresh request is generated from the gate circuit 8710 in accordance with the refresh request ext.REF# applied from the terminal 8000 or from the switching circuit 8410, and the second arbiter 8020 carries out arbitration necessary for refreshing. Therefore, refreshing operation is carried out in either the master or slave operation.

When the sleep mode is designated, the sleep mode designating signal Sleep rises to "H", the output of gate circuit 8700 attains to "L", and the switch circuit 8040 is set to the output high impedance state, no matter whether the chip is master or slave. Since the gate circuit 8708 receives at its positive input a signal at "L" through the inverter circuit 8704 , the output thereof is fixed at "L". The gate circuit 8706 operates as a buffer in response to the sleep mode designating signal Sleep which is at "H", and generates the refresh request in accordance with the refresh request φREF# generated from the first arbiter 8014. The refresh request generated from the gate circuit 8706 has its logic inverted by the gate circuit 8710, and it is applied as a refresh request of a negative logic to the second arbiter 8020.

Therefore, in the sleep mode operation, refresh is carried out in accordance with the refresh request generated from the self-refresh timer included in the chip. In the sleep mode, external access is not effected to any CDRAM. Therefore, it is not necessary to carry out the internal operations in synchronization. At this time, the terminal 8000 is set to the output high impedance state. It is not necessary to transmit other external refresh request ext.REF#, charge/discharge at this signal line can be eliminated, and therefore current consumption in the sleep mode can be reduced.

FIG. 188 shows another example of the memory system structure. In the example of the memory system described above (see FIG. 177), refreshing operation is carried out bank by bank. In the structure shown in FIG. 188, all refresh terminals are interconnected regardless of the banks. In this case, all CDRAMs CR00 to CRN4 of the memory system carries out the refreshing operation in synchronization. In this example also, the same effect as in the above embodiment can be obtained. The CDRAM has been described in the foregoing. However, a structure for realizing refreshing by using the master/slave structure can be applied to any synchronous type semiconductor memory devices in which external signals are taken in synchronously with the clock signal, not limited to the CDRAM.

[Data Transfer Method]

In the truth table of the control signals of the DRAM shown in FIG. 94, a command DWT1 for carrying out data transfer between the master register and the temporary register of the data transfer circuit DWTB and a command DWT2 inhibiting data transfer between the master register and the temporary register are included in the commands for data transfer from the write data transfer gate DTBW to the DRAM array. A new transfer instruction is provided here.

Command DRT1: This is to execute data transfer between the master register and the temporary register (hereinafter referred to as the slave register) in the write data transfer circuit simultaneously with the data transfer operation from the DRAM array to the read data transfer circuit DTBR.

Command DRT2: This is to inhibit data transfer between the master register and the slave register of the write data transfer circuit and to effect data transfer between the DRAM array to the read data transfer circuit DTBR.

By providing the above described two DRAM read transfer commands, the fast copy back and the data transfer in the page mode can be made compatible. The data transfer operation using these commands will be described.

The commands mentioned below are used in the same meaning as the commands shown in FIG. 94.

Referring to FIG. 189, first an active command ACT is applied to the DRAM and a row which corresponds to the CPU address is selected in the DRAM. Thereafter, a DRAM read transfer 1 command is applied to the DRAM. At this time, a buffer write transfer command BWT is simultaneously applied to the SRAM. In the DRAM array, row selecting operation is carried out in accordance with the active command ACT, and thereafter, in accordance with the DRAM read transfer 1 command DRT1, the data block B1 on the selected row is transferred to the read data transfer circuit DTBR. The command DRT1 designates data transfer from the slave register of the write data transfer circuit DTBW to the master register. Therefore, the SRAM data block A1 which has been transferred from the SRAM array to the slave register STW in accordance with the command BWT is successively transferred to the master register MTW. Here, it should be noted that the data transfer operation between the SRAM array and the data transfer circuits DTBW and DTBR is carried out by the SRAM driving portion, while the data transfer operation between the DRAM array and the data transfer circuits DTBW and DTBR is controlled by the DRAM driving portion.

For the simplicity of description, FIG. 189 shows a state in which data is transferred from the DRAM array to the slave register STR of the read data transfer circuit DTBR in accordance with the command DRT1. Whether data transfer is carried out immediately in accordance with this instruction depends on the frequency of the clock used (latency).

Referring to FIG. 190, the DRAM no operation command DNOP is applied, and a buffer write transfer command BWT is applied to the SRAM. In this cycle, the DRAM is continuously effecting the previous command, and the DRAM data block B1 is latched for the read data transfer circuit DTBR.

In the SRAM, another row is selected, and the corresponding data block A2 is transferred to and latched in the slave register STW of the write data transfer circuit DTBW.

Referring to FIG. 191, again the DRAM no operation command DNOP is applied to the DRAM, and a buffer read transfer read command BRTR is applied to the SRAM. The previous operation state is kept in the DRAM. In the SRAM, the data block B1 stored in the master register MTR of the read data transfer circuit DTBR is stored in the selected row of the SRAM array. At this time, in the SRAM array, the row in which the data block A1 has been stored previously is selected. Therefore, data block B1 is stored in place of the data block A1. Parallel to this storing operation, necessary data, that is, the data required by the CPU is provided.

By the above described series of operations, at a time of a cache miss, the data required by the CPU can be transferred at high speed to the SRAM array and it can be read immediately, so that the access delay at the time of a cache miss can be significantly reduced. This operation is used as the fast copy back mode, as described above. At this time, by selecting two data blocks A1 and A2, the block size of the cache can be made doubled, and thus the cache size can be enlarged.

Referring to FIG. 192, a DRAM read transfer 2 command DRT2 is applied to the DRAM, and a command* is applied to the SRAM. The command* may be any command except the buffer write transfer command BWT and the buffer write transfer write command BRTW. In the DRAM, a data block B2, which exists in the same row as the data block B1 but belongs to a different data block, is selected and transferred to the read data transfer circuit DTBR. A desired operation is carried out for the SRAM. However, the content of the write data transfer circuit DTBW is not changed by the command*.

Referring to FIG. 193, the DRAM no operation command DNOP is applied to the DRAM, and the command* is applied to the SRAM. Therefore, in the read data transfer circuit DTBR, the DRAM data block B2 is stored in the master register MTR.

Referring to FIG. 194, the DNOP is applied to the DRAM, and the buffer read transfer command BRT is applied to the SRAM. At this time, the row in which the data block A2 has been stored is set to the selected state in the SRAM. In accordance with the BRT, the data block B2 which has been stored in the master register MTR of the read data transfer circuit DTBR is transferred to the SRAM array. Consequently, in the SRAM array, data blocks A1 and A2 are replaced by the DRAM data blocks B1 and B2. Namely, the block size of the cache will be two rows (32 bits) of the SRAM.

Referring to FIG. 195, a precharge command PCG is applied to the DRAM. The command* is applied to the SRAM. By the precharge command PCG, the DRAM array returns to the precharge state. Then, referring to FIG. 196, the active command ACT is applied to the DRAM and the command* is applied to the SRAM. In the DRAM array, the row to which the SRAM data blocks A1 and A2 should be stored is selected in accordance with the tag address. To the SRAM, the command* is applied, and re-writing of data to the write data transfer circuit DTBW is not carried out.

Referring to FIG. 197, the DRAM write transfer 2 command DWT2 is applied to the DRAM. The command* is applied to the SRAM. By the command DWT2, data transfer between the slave register STW and the master register MTW is not carried out in the write data transfer circuit DTBW. Referring to FIG. 197, data transfer from the master register MTW to the DRAM column is not completed in that cycle in which the command DWT2 is applied, and therefore the transfer operation is represented by the dotted line.

Referring to FIG. 198, the command DNOP is applied to the DRAM, and the command* is applied to the SRAM. Consequently, the data block A1 which has been stored in the master register MTW of the write data transfer circuit DTBW is stored in the corresponding column of the DRAM.

Referring to FIG. 199, then the DRAM write transfer 1 command DWT1 is applied to the DRAM, and the command* is applied to the SRAM. The command DTW1 represents an operation mode for transferring the data of the slave register STW of the write data transfer circuit DTBW to the DRAM array through the master register MTW. Therefore, in this example, data block A2 is transmitted to the selected row of the DRAM array. At this time, in the DRAM array, the same row as the row selected by the previous command DWT2 is at the selected state, and therefore the data block A2 is stored at a different position of that row in which the data block A1 has been stored.

Referring to FIG. 200, the DRAM no operation command DNOP is applied to the DRAM. Consequently, the writing of the data block A2 for the selected row and the column of the DRAM is completed. At this time, the command for the SRAM is an arbitrary command (don't care). Thereafter, the precharge command PCG is applied to the DRAM. By this precharge command, the DRAM returns to the precharge state.

By the above described series of operations, the data blocks A1 and A2 of the SRAM array can be copied back in accordance with the page mode. Namely, the fast copy mode and the page mode can be both used.

A structure in which the row corresponding to the address required by the CPU is selected in the DRAM in accordance with cache hit/miss after the completion of precharging may be used.

A specific operation sequence at the time of a cache miss will be described.

FIG. 201 is a timing chart showing an operation at the time of a cache miss with the dirty bit being on. FIG. 201 shows an operation sequence when the clock cycle is 66 MHz. T1 cycle includes a cache miss occurrence in which the operation when the address sampled at the fall of the address status signal ADS# does not match the tag address. Since the dirty bit is on, the content of the cache differs from the content of the main memory. Therefore, when a cache miss occurs, the content of the cache must be written back to the main memory.

The following operation is carried out at the time of page hit reading. When there is an access request and it turns out to be a cache miss and page hit, commands DRT1 and BWT are generated in cycle 3. Consequently, data transfer operation from the SRAM array to the write data transfer circuit is carried out. Since the command DRT1 is applied, in the write data transfer circuit, data transfer from the slave register to the master register is also carried out. In accordance with the command DRT1, data is transferred from the DRAM array to the read data transfer circuit.

In cycle 5, commands DRT2 and BRTR are executed. The data stored in the read data transfer circuit which has been stored in accordance with the command DRT1 is transferred to the SRAM array, and the data requested by the CPU is read. At this time, data is transferred from the DRAM array to the read data transfer circuit in accordance with the command DRT2. Data transfer between the slave register and the master register in the write data transfer circuit is not carried out. In cycles 6 to 8, a command SR is applied to the SRAM, and data is successively read. In cycle 7, a precharge command is applied to the DRAM, so that the DRAM array returns to the precharge state.

In cycle 9, the command BWT is applied, and data is transferred from the SRAM array to the slave register of the write data transfer circuit. Consequently, two data blocks are stored in the write data transfer circuit.

In cycle 10, commands ACT and BRT are applied, row selecting operation is carried out in the DRAM array, while in accordance with the command BRT, the data block which has been stored in the read data transfer circuit in accordance with the command DRT2 in cycle 5 is stored in the corresponding row of the SRAM array.

In cycle 13, the command DWT2 is carried out, and the data which has been stored in the master register of the write data transfer circuit is stored in the corresponding position of the selected row of the DRAM array. In cycle 15, the command DWT1 is applied, and the data which has been stored in the slave register of the write data transfer circuit is stored in the corresponding position of the DRAM array. Thus the write back operation is completed. The DRAM array can be accessed from cycle 16, and in cycle 17, a command is generated to the DRAM array.

The following operation is carried out at the time of a page miss reading.

In response to a cache miss, commands PCG and BWT are applied. Consequently, the DRAM array returns to the precharge state. Meanwhile, data is transferred from the SRAM array to the slave register of the write data transfer circuit. Then, in cycle 6, the command ACT is applied and a row is selected in the DRAM. In cycle 8, the command DRT1 is applied, and the data of the corresponding position on the selected row of the DRAM is stored in the slave register of the read data transfer circuit through the master register. Data transfer between registers is carried out in the write data transfer circuit.

In cycle 10, commands DRT2 and BRTR are applied. In accordance with the command BRTR, the data transferred in accordance with the command DRT is stored in the corresponding position of the SRAM array. To the read data transfer circuit, data is transferred in accordance with the command DRT2. At this time, data transfer is not carried out between the master register and the slave register of the write data transfer circuit. Thereafter, the command SR is applied and data is read successively. In cycle 12, the precharge command PCG is applied. Consequently, the DRAM array returns to the precharge state.

In cycle 14, the command BWT is applied, and in cycle 15, commands ACT and BRT are applied. Thus the rows of the DRAM array and the SRAM array are selected, and the SRAM cell data is stored in the write data transfer circuit (slave register). In accordance with the command BRT, the data which has been stored in the read data transfer circuit in accordance with the command DRT2 of cycle 10 is transferred to the position of the row selected in accordance with the command DWT (cycle 14). In the DRAM, a row is selected, and in cycles 18 and following, the commands DWT2 and DWT1 are carried out, and the data which has been stored in the write data transfer circuit is successively stored.

The following operation is carried out at the time of a page miss writing. First, commands PCG and BW are applied, and data is written to the write data transfer circuit. The DRAM array returns to the precharge state. In cycle 6, a command ACT is applied and a row is selected in the DRAM. Then, in cycle 9, the command DWT1 is applied, and the data written in the write data transfer circuit is transmitted to the corresponding position of the selected row of the DRAM array.

At the time of a page hit writing, commands BW and DWT1 are applied. The data applied at that time is written to the master and slave registers of the write data transfer circuit.

FIG. 202 is a timing chart showing the operation sequence when the clock signal is 50 MHz. In FIG. 202 also operation sequence at the time of a miss write and a miss read under the same condition as the example of FIG. 201, that is, when the dirty bit is on, is shown. In the operation sequence shown in FIG. 202 , the DRAM no operation period is made shorter than the example of FIG. 201. The order of generation of the commands DRT1 and DRT2 differs from the timing chart of FIG. 201. When the buffer write transfer command BWT is applied once, the DRAM read transfer command is applied twice. Therefore, similar operation can be realized no matter which of the commands DRT1 and DRT2 is generated earlier. More specifically, when commands DRT2 and BRT are applied, data transfer from the DRAM array to the read data transfer circuit is carried out together with the data transfer from the SRAM array to the write data transfer circuit.

When the commands DRT1 and BRTR are applied, the data which has been stored in the read data transfer circuit is written to the corresponding position of the SRAM array, and successively the new DRAM cell data is transferred to the read data transfer circuit. At this time, in the write data transfer circuit, data transfer from the slave register to the master register is carried out. Thereafter, when the command BWT is applied (cycle 8), data is stored in the slave register of the write data transfer circuit. Therefore, in the write data transfer circuit, the SRAM data transferred in accordance with the command BWT in cycles 3 and 8 is stored. Therefore, similar operation as shown in FIG. 201 can be realized.

FIG. 203 shows an operation sequence when the master clock has the frequency of 40 MHz. The timing chart of FIG. 203 is similar to FIG. 201. Similar operation is realized except that the DRAM no operation period differs because of the difference of clock frequency.

FIG. 204 shows an operation sequence when the master clock CLK has the frequency of 33 MHz. The operation sequence shown in FIG. 204 is similar to the operation sequence of FIG. 202, and the only difference is the DRAM no operation period, which difference is derived from the different frequency of the master clock.

The DRAM no operation period differs dependent on the frequency of the master clock as described above, since internal data transfer period is determined by the latency, the period of which latency can be set in accordance with the frequency of the clock.

FIG. 205 is a truth stable of the control signals for setting the DRAM read transfer command. Referring to FIG. 205, for the DRAM no operation command, the signals RAS#, CAS# and DTD# are all set to "H". The signal CMd# is at "H". For the DRAM read transfer 1 command DWT1, the signals RAS# and DTD# are both set to "H" and the signal CAS# is set to "L". For the DRAM read transfer 2 command DRT2, the signals RAS# and CAS# are both set to "H" and the signal DTD# is set to "L". The method of generating these commands are merely an example and other combinations of signal states may be used.

The write data transfer circuit DTBW and the read data transfer circuit DTBR have similar structures as those shown in FIGS. 125 and 127, respectively.

The control signal generating system has a structure which is similar to the one shown in FIG. 129. In the write data transfer circuit shown in FIG. 125, the signal DWTE for controlling data transfer from the temporary register 4002 that is the slave register to the master register 4004 is activated/inactivated in accordance with the commands DRT1 and DRT2.

In the third embodiment of the CDRAM containing a controller, the controller 7026 generates a signal in accordance with the external control signal, the cache hit signal and the page hit signal. This can be realized when the signals applied to the internal DRAM driving portion and the SRAM driving portion are generated to satisfy similar signal logics as those shown in the first and second embodiments.

FIG. 206 shows another structure of the data transfer circuit. Referring to FIG. 206, the write data transfer circuit DTBW includes N stages of registers #1 to #N. In this example, registers #1 to #N have the shift register structure and carries out latch and shift operation of the applied data. In this structure, the block size of the cache can be increased to N times. This is because the N blocks of data can be transferred successively in accordance with the page mode between the DRAM array and the SRAM array. Data transfer in the write data transfer circuit DTBW is carried out by expanding the structure of the two stages of registers described above.

In the write data transfer circuit DTBW shown in FIG. 206, similar effect can be obtained not only by the shift register structure but by a register of the first in•first out type.

[Image Processing System]

FIG. 207 shows an example of the image processing system employing the CDRAM in accordance with the present invention. Referring to FIG. 207, the image processing system includes a CPU 9500 as an external processing unit for processing data, a CDRAM 9530, an image display unit 9520 for displaying applied data on a display, and a high speed video interface 9510 for controlling access to the CDRAM for image display and the access between the CPU and the CDRAM. CPU 9500 is connected to the high speed video interface 9510 through a data bus 9505.

DRAM 9530 includes an SRAM area 9540 for storing video data (data of one scanning line), and a DRAM area 9550.

The DRAM area 9550 includes a video area 9560 for storing video data. Data transfer is carried out between SRAM 9540 and video area 9560. CPU 9500 operates at the operation frequency of 33 MHz. High speed video interface 9510 operates at the operation speed of 66 MHz and adjusts accesses to the CDRAM 9530 of the CPU and of the image display unit 9520. By data transfer (according to commands DRT and BRT) from DRAM area 9550 to SRAM area 9540, video data is transferred from the DRAM area 9550 to SRAM area 9540. Under control of the high speed video interface 9510, the CPU 9500 directly accesses to the data transfer circuit provided in the CDRAM 9530 in accordance with the buffer read command BR and the buffer write command BW. Image display unit 9520 accesses to the SRAM area 9540. The high speed video interface 9510 carries out this access in the interleave manner.

FIG. 208 schematically shows the principle of operation of the image processing system shown in FIG. 207. In the blanking period of the video data (horizontal period and vertical blanking period), transfer of video data from the DRAM area 9550 to SRAM area 9540 is carried out. During this period, the CPU 9500 can not access the CDRAM 9530. Other than the blanking period, a so called "video refresh" in which video data is changed by the CPU accessing to the CDRAM 9530 can be carried out. Namely, the CDRAM 9530 can implement similar operation as a video RAM which has a random access port and a serial access port.

The control operation of the high speed video interface 9510 will be described.

FIG. 209 is a timing chart showing the operation of the video data processing system when the CDRAM is operated in the "transparent output mode". Referring to FIG. 209, CK33 represents the speed of operation of the CPU, and CK66 represents the speed of operation of the high speed video interface 9510 accessing the CDRAM 9530. To the image display unit 9520, video data is transmitted at the speed of 16.5 MHz. Access to the video data is carried out by using the command SR. Referring to FIG. 209, the cycle T1 denotes a video access cycle and T2 denotes a CPU access cycle.

Referring to FIG. 209, in the first cycle, a video address VIDEO0 is applied by the command SR, and in accordance with this address, the video data is applied on the CDRAM bus in response to the rise of the next clock signal CK66. This data is applied to the image display unit 9520 through the high speed video interface 9510.

Then access from the CPU is carried out. At this time, commands DWT and BW are applied, the DRAM write transfer operation and the buffer write operation are carried out, the data from the CPU is written to the data transfer circuit and the written data is transferred to the DRAM array. Then video access is carried out, and video data VIDEO01 is read from the SRAM area 9540 by the command SR. In the CDRAM 9530, data transfer is being carried out in accordance with the command from the CPU. In the next cycle, the command DRT is applied, data is transferred from the DRAM to the data transfer circuit, and the burst read operation is carried out. The output of the valid data by this burst read operation is carried out. The output of the valid data by this burst read operation is provided after the lapse of 3 clocks. Here, it should be noted that the access to the CDRAM 9530 is carried out in accordance with the clock CK66 while the CPU outputs an access request in accordance with the clock CK33. Thereafter, video data and the CPU data are provided successively in accordance with the commands BR and SR.

Since the CPU and the image display unit alternately access to the CDRAM in this interleave manner, the CPU can successively access to the CDRAM without any interruption of access (except the transfer period of the video data from the DRAM area 9550 to the SRAM area 9540), thereby enabling high speed data processing.

FIG. 210 is a timing chart showing the operation of the image processing system when the CDRAM provides data in the registered output mode. In the registered output mode, data is provided with a delay of 1 clock cycle as already described with reference to FIG. 66. In the transparent output mode, data is provided in the next cycle of the accessed cycle. Therefore, when the registered output mode is used, the next address can be applied while the previous data is being output, as shown in FIG. 210. Therefore, the CPU and the image display unit can access alternately at the same speed to the CDRAM. Namely, the CPU data and the video data can be input/output at the same speed.

In the transparent output mode, valid data is provided at the rise of the next clock signal when an address is applied. Therefore, when the CPU data and the video data are to be accessed alternately at the same speed, there will be a collision of data. Now, video data VIDEOO and the CPU data 486-0 are taken as examples in FIG. 210. When the CDRAM operates in the transparent output mode and an address VIDEO01 is applied, video data VIDEO01 is provided in the next clock cycle. At this time, write data 486-0 from the CPU is applied. Therefore, the CPU data collides against the video data. In the registered output mode, data is provided with a delay of 1 clock cycle, and therefore, even when the CPU write data to the CDRAM in this manner, data can be surely written without collision of data. Thus an image processing system operating at higher speed can be provided.

FIG. 211 shows comparison between speed of operations of the standard DRAM and the CDRAM. Assume that data arranged in 16 rows×16 columns is to be written as shown in FIG. 211(*a*). As shown in FIG. 211(*b*), in the standard DRAM it is necessary to successively write the data by toggling the signal CAS after the signal RAS is activated. When one row of data is written, the DRAM array is set to the precharge state, and the data must be written in accordance with the signals RAS and CAS again.

Referring to FIG. 211(*c*), in the CDRAM, when data is to be written, data is successively written to the data transfer circuit in accordance with the buffer write command BW, DRAM activate command ACT is applied to the DRAM, the written data are collectively transferred to the row of the DRAM array in accordance with the command DWT, and the data writing of the remaining rows are carried out. At this time, when the next row is to be accessed, the row selecting operation of the DRAM can be carried out at the same time of data writing to the data transfer circuit in accordance with the command BW. Therefore, the RAS precharge period is not necessary at all externally, and thus data can be written at high speed.

In the description of FIG. 211, 8 bits are treated as one cache block, that is, the transfer size.

FIG. 212 shows comparison of data writing operation when there is a page boundary in a rectangular area. At the page boundary, the rows of the DRAM array differ. In this case, referring to FIG. 212(*a*), there is the page boundary at the interface between the data D1 area and the data D2 area, and data D1 and data D2 are stored in different DRAM word lines. In that case, referring to FIG. 212(*b*), in the standard DRAM, at first data D1 is written by using signals RAS and CAS until the page boundary is reached. Then, the DRAM is precharged, and the remaining data D2 and D3 of the first row must be written in accordance with the signals RAS and CAS. In the area of the second row, similar operation must be carried out. Therefore, the DRAM array must be precharged at the page boundary as well as at the change of rows in the arrangement of 16 rows×16 columns, and therefore the high speed data processing is prevented by the RAS precharge period.

Referring to FIG. 212(*c*) in the CDRAM, after the data is written in accordance with the buffer write command BW, data is written in accordance with the commands DWT and BWTW, and in parallel thereto, the precharge command PCG of the DRAM array is applied and the data can be successively written in accordance with the buffer write command BW. In parallel with the data writing to the data transfer circuit in accordance with the buffer write command BW, a DRAM row to which data D2 and D3 are to be written can be selected, and by transferring in accordance with the commands DWT and BWTW at the end of this row section, data can be written to the desired DRAM row. Therefore, precharge must be carried out at the switching of rows in the arrangement of 16 rows×16 columns which requires a wait time, but in the arrangement of the 16 rows by 16 columns, there is no RAS precharge period at the page boundary, so that data can be written at high speed.

FIG. 213 is a timing chart showing the operation when data arranged in 16 rows×16 columns is to be read from the DRAM array. Assume that data groups D1 and D2 arranged as shown in FIG. 213(*a*) are to be read. Data D1 and D2 are blocks each constituting one unit of transfer.

FIG. 213(*b*) shows data reading sequence when a synchronous type semiconductor memory device (SDRAM) is used. The synchronous type semiconductor memory device SDRAM can read data at high speed in synchronization with the clock. The synchronous type semiconductor memory device includes a serial register at the data input/output portion and allows data input/output to and from the serial register in synchronization with the clock. At the time of data reading, the memory cell data selected internally are collectively stored in the serial register and then the data are read in synchronization with the clock signal successively from the serial register. When the number of serial registers is 8, it is necessary to store new data in the serial register every time 8 bits of data are read. Therefore, the signal CAS is generated for loading data to the serial register. When data are to be successively read from the serial register after data loading to the serial register, in the DRAM array, another row can be precharged to be set to the selected state. Therefore, when a synchronous type semiconductor memory device SDRAM is used, data can be read approximately continuously.

Referring to FIG. 213(*c*), in the CDRAM, necessary data are transferred to the data transfer circuit in accordance with the commands ACT and DRT, the data are transferred from the data transfer circuit to the SRAM array in accordance with the command BRTR, and then data can be successively read in accordance with the command SR. In this case also, when data is read from the SRAM array, precharging and activation can be carried out in the DRAM array. Therefore, data reading can be carried out at the same speed as in the synchronous type semiconductor memory device SDRAM.

FIG. 214 is a timing chart showing the operation of the SDRAM and the CDRAM at the time of data reading, when there is a page boundary. Referring to FIG. 214(*a*), assume that the wrap length (length of data which can be read continuously) in the synchronous type semiconductor memory device (hereinafter simply referred to as SDRAM) is 8. In the SDRAM, referring to FIG. 214(*b*), the RAS precharge state is entered at the page boundary, and then the DRAM array is activated again. Thus data are stored in the read register (serial register provided at data output), then data are successively read, and then it is necessary to read data successively by transferring new data to the serial register by toggling the signal CAS. Therefore, in that case, there are significant RAS precharge time and the RAS-CAS delay time at each page boundary.

Referring to FIG. 214(*c*), in the CDRAM, even if there is a page boundary amid the arrangement, it is possible to successively read data by transferring the data to the data transfer circuit and to precharge and activate the DRAM array in parallel therewith. There is not influence of pre-charge of the DRAM array, so that data can be read at higher speed than in the SDRAM.

FIG. 215 is a timing chart showing the operation at the time of the read modify write. Referring to FIG. 215(*a*), assume that the data arranged in 16 rows×16 columns are all re-written in accordance with read modify write mode. Referring to FIG. 215(*b*), in the SDRAM, the read command and the write command are provided in response to the fall of the signal CAS. Therefore, 2 clocks are necessary for the read command and the write command, respectively. Therefore, when the read modify write is to be carried out for the data of one row, there is a wait time from the writing operation to the execution of the reading operation, which prevents high speed change of the data.

Meanwhile, in the CDRAM, data can be changed by writing data from the DRAM array to the SRAM array through the transfer circuit and by carrying out alternately the data reading from the SRAM array and data writing to the transfer circuit. Necessary data are all written to the write data transfer circuit after the data are transferred to the read data transfer circuit in accordance with the command DRT, and then the data written in the write data transfer circuit are transferred to the DRAM array in accordance with the command DWT. Therefore, in the DRAM array, data can be re-written at high speed when there is no page boundary in one row.

FIG. 216 is a timing chart showing the operation when data occupying a triangular area are to be written. Assume that the video data including data D1 and D2 arranged in a triangular shape in the area of 16 rows×16 columns are to be written, as shown in FIG. 216(*a*). At this time, referring to FIG. 216(*b*), in the SDRAM and in the DRAM, data must be written by toggling the signals RAS and CAS corresponding to each row. Therefore, there are the RAS precharge time and the RAS-CAS delay time in every row.

On the contrary, in the CDRAM, since data can be written to the data transfer circuit in accordance with the command BW and the row selecting operation of the DRAM array can be carried out in parallel therewith as shown in FIG. 216(*c*), the RAS-CAS delay time can be reduced as compared with the SDRAM and the DRAM, though there is still the precharge time of the DRAM array. Therefore, data writing can be carried out at higher speed.

As described above, by using the CDRAM of the present invention, an image processing system which is capable of processing data at high speed can be implemented.

As described above, since the present invention is structured such that the operation control of the DRAM portion and the SRAM portion are carried out independently and that a bidirectional transfer circuit for transferring data between the SRAM array and the DRAM array can be directly accessed from the outside, a semiconductor memory device which can be utilized as a cache memory in a memory system or a video memory for graphic processing application with high performance and operating high speed can be implemented.

Effects provided by main features of the present invention are as follows.

(1) While the DRAM array is active, different DRAM column blocks can be successively selected. Therefore, it is possible to continuously latch one row of data (one page of data) by the sense amplifiers in the DRAM array, data transfer between the DRAM portion and the independently driven SRAM array can be carried out utilizing the page mode of the DRAM, thus data transfer can be carried out at high speed, and therefore access time at a cache miss can be significantly reduced.

(2) A data transfer circuit for data transfer between the SRAM array and the DRAM array is constituted by a latch circuit for temporary storing data. Therefore, it becomes possible to input/output data by directly accessing the data transfer circuit from the outside. Therefore, data input/output of the DRAM array can be carried out not affecting the data stored in the SRAM, and therefore a semiconductor memory device, which is useful not only as a cache system but also for the graphic application, can be obtained.

(3) The data transfer circuit includes a write buffer circuit for transferring data to the DRAM and a read data transfer buffer for receiving data from the DRAM array provided separately, each of which is constituted by a latch circuit. Therefore, data transfer between the DRAM array and the SRAM array can be carried out parallel to each other, which enables high speed data transfer.

(4) The bidirectional data transfer circuit includes a write transfer circuit including a plurality of latches for transferring data to the DRAM array, and mask circuit for masking data transfer is provided for each latch of the write transfer circuit. Therefore, only the necessary memory data of the DRAM array can be changed, so that data stored in the DRAM array can be re-written easily at high speed.

(5) The bidirectional data transfer circuit includes temporary register means for temporarily storing applied data, a buffer circuit for receiving the data applied from the temporary register and for transferring the data to the DRAM array, temporary mask register for storing mask data allowing independent masking of data transfer to the DRAM array for each data bit, and master mask register receiving the mask data from the temporary mask register in synchronization with data transfer from the temporary data register to the buffer register for masking data transfer from the buffer register to the DRAM array. Since mask data of the temporary mask register can be set selectively dependent on whether the data is applied from the outside or from the SRAM array, only the data to be transferred to the DRAM array can be transferred at high speed.

(6) The mask data of the temporary mask register are all reset when data is transferred from the SRAM array, while only the mask data corresponding to the temporary data register which is subjected to data writing of the data applied externally are reset in the temporary mask register, so that only the necessary data can be transferred to the DRAM array surely and easily.

(7) Since data transfer is carried out with the temporary data register and the temporary mask register being separated from the buffer register and the master mask register, respectively, the same data can be written to the memory cell blocks of the DRAM repeatedly, operation such as "filling" can be carried out at high speed, and therefore a semiconductor memory device which is effective in graphic processing can be obtained.

(8) Since a DRAM array, an SRAM array and a bidirectional data transfer circuit for data transfer between the SRAM array and the DRAM array are provided and the operation related to the DRAM array can be carried out independent from the operation related to the SRAM array and the data input/output by a separate control circuit, data input/output utilizing high speed mode such as the page mode of the DRAM can be carried out, and in addition, successive data writing such as the burst write mode can be carried out at high speed.

(9) Since a signal controlling selection/non-selection of the semiconductor memory device and a signal for inhibiting data input/output only are provided separately, a semiconductor memory device in which memory extension ability and high speed bank switching can be implemented can be obtained.

(10) Since two control signals are provided for the data input/output and enable/disable of the input/output circuit is controlled in accordance with the result of an AND of these two input/output control signals, bank switching can be readily implemented at high speed. When the semiconductor memory device includes both the DRAM portion and the SRAM portion, the cache size provided by the SRAM can be easily changed.

(11) The bidirectional data transfer circuit includes a read data transfer buffer including a latch circuit for temporarily storing and latching data from the DRAM array and a write data transfer buffer which can receive data directly from the SRAM array or the data input/output pin, so that a semiconductor memory device in which before storing read data from the DRAM array to the read data transfer buffer, data can be input/output at high speed and write through operation of the cache can be carried out at high speed is implemented.

(12) In the DRAM array, by using data latch function of the DRAM sense amplifier, data writing without writing to the DRAM array at the write through mode can be carried out, that is, data writing without allocation at a time of the cache miss can be carried out, so that data writing can be done at high speed in accordance with the burst write mode. In addition, immediately after data writing, hit operation for another address can be carried out, so that a semiconductor memory device containing a cache which operates at high speed is obtained.

(13) In a semiconductor memory device of a cache memory operating in the write through mode, high speed access is possible by using the latch data of the DRAM sense amplifier, and therefore a semiconductor memory device having small penalty even at a cache miss can be obtained.

(14) In the semiconductor memory device in the write back mode, it is not necessary to write data in the SRAM array at a time of a cache miss as the data latched in the DRAM sense amplifier can be used, so that high speed data writing is possible and data writing in accordance with the burst write mode is also possible.

(15) In the cache memory in the write back mode, latch data of the DRAM sense amplifier can be used, and therefore a semiconductor memory device containing a cache having small penalty at the time of a cache miss can be obtained.

(16) Since transmission/non-transmission of clocks to the control circuit driving the DRAM portion and to the second control circuit for controlling the SRAM portion and the input/output of data is carried out independent from each other, clock transfer to the DRAM portion can be stopped while the SRAM portion is operating, which can significantly reduce power consumption in the DRAM portion, and therefore a semiconductor memory device with low power consumption can be obtained.

(17) As the command data for the command register storing data for designating input/output pin arrangement of the semiconductor memory device, operation mode and the like, prescribed bits of the column selecting addresses of the DRAM are used, and therefore command data can be input without increasing the number of control pin terminals. At this time, command data for identifying the type of mode for data writing from the data transfer circuit to the DRAM array can be applied simultaneously in the operation mode designating cycle thereof, and therefore a desired operation mode can be set easily at high speed without increasing load to external devices.

(18) Since the address bits for selecting the DRAM array are all taken as the command data and a part of the command data is used for designating set/reset of the test mode and for setting the type of the data transfer mode to the DRAM array in a test mode of operation, command data can be easily set by using a memory tester, so that a semiconductor memory device in which test can be easily carried out with high reliability without increasing load to the memory test device can be implemented.

(19) Since auto refresh of the DRAM array is carried out simultaneously when the set command register mode is designated, the time necessary for determining mode can be reduced and a semiconductor memory device which allows high speed access can be implemented.

(20) In the command data setting mode, only the operation for storing command data in the command register is carried out which does not affect at all the operation of the DRAM array, the command data can be easily changed even when the DRAM is operating.

(21) Since mask data for masking data transfer to the DRAM array are set after power on, setting of the mask data is assured.

(22) Since the peripheral circuit is initialized by applying a prescribed number of master clocks in response to power on, the states of internal circuits can be surely set to the prescribed initial state.

(23) A first control portion for controlling the operation of the DRAM array and the data transfer operation between the DRAM array and the bidirection data transfer circuit, and a second control portion for controlling the operation of the SRAM array as well as data transfer operation between the SRAM array and the bidirection data transfer circuit or external access to the SRAM array are provided separately and the first and second control portions operate independently, a semiconductor memory device having multifunctions operating at high speed can be provided.

(24) Since a second transistor element is driven to drive the first node to a prescribed potential only for a prescribed time period when the first transistor element driving a wired the signal line is inactive, the external signal line can be driven to a prescribed potential level at high speed even in a structure in which the first transistor element is wired OR connected, so that high speed access is enabled with simple circuit structure.

(25) Since a special test mode is entered when a prescribed state of external signal is continuously applied twice or more in synchronization with the external clock signal, testing operation can be realized only by the timing condition, so that the test mode can be set easily and surely.

(26) Since a special test mode state is entered when external signals of a prescribed state combination is applied continuously for prescribed times in synchronization with the external clock signal and the test mode is canceled when the external signals of this prescribed state combination is applied, the test mode can be surely and easily entered, a desired instruction can be applied to the memory device during this period, and test can be carried out while the semiconductor memory device operates in a desired operation mode. Since cancel of the test can be carried out in synchronization with the clock signal, it can be set by the timing conditions, so that the test mode can be surely reset.

(27) Since the refresh control terminal is set to the input terminal or an output terminal by the mode setting means, a plurality of semiconductor memory devices can be refreshed under control of one memory device, so that self refresh mode can be carried out during normal operation.

(28) Since refresh is carried out in accordance with a contained self refresh timer in response to a sleep mode designating signal, it is not necessary to send a refresh request to other semiconductor memory devices, so that current consumption in charge/discharge of signal lines can be reduced.

(29) At the time of data transfer from the DRAM array to the first data transfer means, in the second transfer means for transferring data from the SRAM array to the DRAM array, data transfer between latches in the second transfer means can be selectively carried out, so that fast copy back can be carried out by using the page mode, which allows enlargement of the block size of the cache, the page mode and the fast copy back mode can be carried out simultaneously, and high speed access can be realized while reducing the cache miss penalty.

(30) Since a plurality of latches are provided in the transfer circuit for transferring data from the SRAM array to the DRAM array and transfer operation between latches is carried out selectively in the second transfer means when data is transferred from the DRAM array to the first transfer means, the cache block size can be enlarged and the cache hit rate can be improved. Further, data transfer between the SRAM array and the DRAM array can be carried out in accordance with the page mode and the fast copy back operation at the time of a cache miss can be also carried out in accordance with the page mode, which enables high speed data transfer.

(31) Since the second transfer means in the write data transfer circuit includes N stages of first in first out type storage means, the block size of the cache can be enlarged.

(32) Since the CDRAM is operated in the registered output mode and the access by the CPU and the video processing unit are interleaved for the access to the CDRAM, the access by the CPU and the access for the video display unit do not cried against each other, the CDRAM can be accessed at high speed and therefore an image processing system which enables high speed processing of image data can be realized.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:

a DRAM array including a plurality of dynamic memory cells arranged in a matrix of rows and columns;

first control means including row selecting means responsive to a first address for selecting a row in said DRAM array and a column block selecting means responsive to a second address for selecting a column block including a plurality of columns of said DRAM, responsive to an external control signal for driving said DRAM array, said column block selecting means being capable of selecting different column blocks repeatedly while said row selecting means is in an active state and selecting a row;

an SRAM array including a plurality of static memory cells arranged in a matrix of rows and columns;

second control means including memory cell selecting means responsive to a third address applied independent from said first and second addresses for selecting a plurality of memory cell blocks in said SRAM array, responsive to an externally applied second control signal for driving said SRAM array independent from said first control means; and data transfer means responsive to a one time asserting of a data transfer designation, for carrying out data transfer on block by block basis between the selected column blocks of said DRAM array and the selected memory cell blocks of said SRAM array.

2. A semiconductor memory device, comprising:

an DRAM array including a plurality of dynamic memory cells arranged in a matrix of rows and columns;

an SRAM array including a plurality of static memory cells arranged in a matrix of rows and columns;

first selecting means for simultaneously selecting a plurality of memory cells in said DRAM array;

second selecting means for simultaneously selecting a plurality of memory cells in said SRAM array;

data transfer means including a plurality of latch means for temporarily storing applied data for carrying out simultaneous data transfer between the plurality of selected memory cells of said DRAM and the plurality of selected memory cells of said SRAM array; and access means for directly accessing latch means in said data transfer means in accordance with an applied address for inputting/outputting data.

3. The semiconductor memory device according to claim 2, wherein said data transfer means includes read transfer means for receiving data transmitted from said DRAM array and write transfer means for transferring data to said DRAM array, each of said read transfer means and said write transfer means including a plurality of latch means for temporarily storing applied data.

4. The semiconductor memory device according to claim 2, wherein said data transfer means includes write transfer means including a plurality of latch means for temporarily storing applied data for transmitting the applied data to said DRAM array, and mask means provided corresponding to each of said latch means of said write transfer means for masking data transfer by each latch means to said DRAM array.

5. The semiconductor memory device according to claim 2, wherein said data transfer means includes:

a plurality of latch means for temporarily storing applied data;

buffer means receiving the data from said latch means for transferring the data to said DRAM array;

temporary mask register means provided corresponding to each of said plurality of latch means for storing mask data indicative of whether transfer of data stored in the corresponding latch means to said DRAM array should be masked;

mask register means receiving, in synchronization with the data transfer from said latch means to said buffer means, the mask data from said temporary mask register means for masking data transfer from said buffer means to said DRAM array; and control means responsive to an operation mode designation indicating whether said latch means received data from said SRAM array or received write data externally applied, for setting mask data of said temporary mask register means.

6. The semiconductor memory device according to claim 5, wherein said control means includes means for resetting, when said operation mode designation indicates data transfer from said SRAM array to said data transfer means, all the mask data of said temporary mask register, and means for resetting, when said operation mode designation indicates that external write data is applied to said data transfer means, only that mask data which corresponds to the latch means receiving the external write data.

7. The semiconductor memory device according to claim 5 or 6, wherein said control means further includes means responsive to an operation mode designation indicating that the same data should be transferred repeatedly to said DRAM array, for separating said latch means from said buffer means and for separating said temporary mask register means from said master mask register means.

8. The semiconductor memory device according to claim 2, wherein said data transfer means includes:

slave latch means for temporarily storing data supplied from said SRAM array or an external write data supplied from said access means;

master latch means for temporarily storing data supplied from said slave latch means;

slave mask register means for storing mask data indicating that data stored on said slave latch means should be masked or not in transfer to said DRAM array;

master mask register means for temporarily storing mask data from said slave mask register means; and drive means for transfer data from said master latch means to said DRAM array in accordance with the mask data from said master mask register means.

9. The semiconductor memory device according to claim 8, further comprising:

first control means for controlling data transfer from said SRAM array to said slave latch means; and second control means provided independently from said first control means for controlling (synchronous) data transfer from said slave latch means to said master latch means and from said slave mask register means to said master mask register means.

10. The semiconductor memory device according to claim 9, wherein said first control means includes means enabling writing of data to said slave latch means by said access means.

11. The semiconductor memory device according to claim 2, wherein said data transfer means includes slave latch means for temporarily storing data from selected memory cells on said DRAM array, and master latch means for temporarily storing data from said slave latch means for transmission to selected memory cells in said SRAM array or to said access means.

12. A semiconductor memory device, comprising:

a DRAM array including a plurality of dynamic memory cells arranged in a matrix of rows and columns;

an SRAM array including a plurality of static memory cells arranged in a matrix of rows and columns;

data transfer means including read transfer means for receiving data transmitted from said DRAM array and for temporarily storing the data, for transferring data between said DRAM array and said SRAM array;

first control means for selecting a memory cell in said DRAM array for transmitting the data of said selected memory cell to said read transfer means;

second control means operating parallel to and independent from said first control means for selecting a static memory cell in said SRAM array and for inputting and outputting data to and from said selected static memory cell; and third control means operating independent from said first control means for transferring data from said read transfer means to said SRAM array.

13. A semiconductor memory device, comprising:

a DRAM array including a plurality of dynamic memory cells arranged in a matrix of rows and columns;

an SRAM array including a plurality of static memory cells arranged in a matrix of rows and columns;

data transfer means for carrying out data transfer on plural bits by plural bits basis between said DRAM array and said SRAM array;

data input/output circuit means for transferring data between an external data/output node and a selected one of said SRAM array and said data transfer means first control means responsive to a first control signal for setting at least said DRAM array, said SRAM array, said data transfer means and said data input/output circuit means to a non-selected standby state; and second control means responsive to a second control signal for controlling enable and disable only of said data input/output circuit means.

14. The semiconductor memory device according to claim 13, wherein said second control signal includes a control signal of a first type and a control signal of a second type, and said second control means includes means for generating a control signal for controlling only said data input/output circuit means by a logical AND of the control signal of said first type and the control signal of said second type.

15. A method of driving a semiconductor memory device including a DRAM array having a plurality of dynamic memory cells arranged in a matrix of rows and columns; sense amplifier means sensing, amplifying and latching data of memory cells connected to a selected row of said DRAM array; an SRAM array including a plurality of static memory cells arranged in a matrix of rows and columns; read transfer means including means for latching applied data from said DRAM array; and write transfer means including latch means for temporarily storing applied data from a selected memory cell in said SRAM array or externally applied data, comprising the steps of:

(a) selecting a row in the DRAM array, and sensing, amplifying and latching by said sense amplifier means the data of the connected cells connected to the selected row; in data reading operation (b) determining whether or not data required by an external device is stored in said SRAM array;

(c) when result of said determination in said step (b) indicates that the required data is in said SRAM array, selecting a corresponding memory cell of said SRAM array in accordance with an applied address and reading the data of the selected memory cell;

(d) when the result of said determination in said step (b) indicates that the required data is not in the SRAM array determining, whether or not said applied address designates the selected row in said DRAM array;

(e) when the result of said determination in said step (d) indicates that said applied address designates said selected row of said DRAM array, selecting a plurality of columns in said DRAM array, transferring data of the selected plurality of columns to said read transfer means, then selecting corresponding memory cell in said SRAM array in accordance with said applied address, transferring data from said read transfer means to the selected memory cells in said SRAM array and further selecting a memory cell in said SRAM array designated by said applied address for reading data from the selected memory cell;

(f) when the result of said determination indicates that said applied address designates a row which is different from the selected row of said DRAM array, (g) initializing said DRAM array and said sense amplifier means and then selecting a corresponding row in said DRAM array in accordance with said applied address;

(h) after the corresponding row is selected in said DRAM array, selecting a plurality of columns in said DRAM array in accordance with said applied address, and transferring the data of said selected plurality of columns to said read transfer means; and (i) simultaneously with or parallel to data transfer to said read transfer means, selecting memory cells in said SRAM array in accordance with said applied address, transferring data from said read transfer means to said selected memory cells, further selecting, in parallel thereto, a memory cell in said SRAM array and reading the data of said selected memory cell.

16. A method of driving a semiconductor memory device including a DRAM array having a plurality of dynamic memory cells arranged in a matrix of rows and columns; sense amplifier means; sensing, amplifying and latching data of memory cells connected to a selected row of said DRAM array; an SRAM array including a plurality of static memory cells arranged in a matrix of rows and columns; read transfer means including means for latching applied data from said DRAM array; and write transfer means including latch means for temporarily storing applied data from a selected memory cell in said SRAM array or externally applied data, comprising the steps of:

selecting a row in the DRAM array, and sensing, amplifying and latching by said sense amplifier means the data of the memory cells connected to the selected row; and in data write operation mode, (i) when a memory cell of an address to which access is required by an external device exists in said SRAM array, (a) writing data to the corresponding memory cell of said SRAM array in accordance with an applied address and writing said data to said write transfer means;

(b) when said applied address designates said selected row in said DRAM array, selecting a column in said DRAM array and transferring data between said selected column and said write transfer means;

(c) when said applied address designates a row which is different from the selected row in said DRAM array, initializing said DRAM array and said sense amplifier means, then selecting a row and a column in said DRAM array in accordance with said applied address, and then transferring data between the selected column of the DRAM array and said write transfer means;

(ii) when a memory cell of an address to which access is required by said external device does not exists in said SRAM array, (d) writing data to said write transfer means in accordance with said applied address;

(e) when said applied address designates the selected row in said DRAM array, selecting a column in said DRAM array in accordance with said applied address and transferring data from said write transfer means to said selected row; and (f) when said applied address does not designate the selected row in said DRAM array, initializing said DRAM array and said sense amplifier means, thereafter selecting a column and a row in said DRAM array in accordance with said applied address, and transferring data from said write transfer means to said selected column.

17. The method according to claim 16, wherein determination whether the applied address designates the selected row in said DRAM array in said steps (e) and (f) is postponed until a next access is applied.

18. A method of driving a semiconductor memory device including a DRAM array including a plurality of dynamic memory cells arranged in a matrix of rows and columns; sense amplifier means for sensing, amplifying and latching data of memory cells connected to a selected row in said DRAM array; an SRAM array including a plurality of static memory cells arranged in a matrix of rows and columns; write transfer means including a plurality of latch means for transferring data to a block of a plurality of columns in said DRAM array; and read transfer means including a plurality of latch means for receiving data from the block of the plurality of columns selected in said DRAM array, comprising the steps of:

(a) selecting a row in said DRAM array and sensing, amplifying and latching by said sense amplifier means the data of memory cells connected to said selected row;

(A) in data read operation mode, (i) when data required by an external device does not exists in said SRAM array, (ii) determining that a dirty bit is ON indicating data stored in said SRAM array and data stored in said DRAM array designated by the same address differ from each other;

(iia) selecting a plurality of memory cells of said SRAM array in accordance with an applied address, transferring and storing the data of said selected memory cells to said write transfer means;

(iib) when said applied address indicates the selected row in said DRAM array, (iibi) selecting a block of a plurality of columns in accordance with said applied address from the selected row of said DRAM array and further transferring data of the block selected plurality of columns to said read transfer means;

(iib2) selecting a plurality of memory cells in said SRAM array in accordance with said applied address for transferring data which has been transferred to said read transfer means further to said selected memory cells;

(iib3) selecting and reading corresponding data out of data transferred to said read transfer means in accordance with said applied address;

(iic) when said applied address designates a row which is different from said selected row in said DRAM array, (iic1) initializing said DRAM array and said sense amplifier means, thereafter selecting a row and blocks of a plurality of columns in said DRAM array in accordance with said applied address and transferring data of said selected column block to said read transfer means;

(iic2) selecting a plurality of memory cells in said SRAM array in accordance with said applied address, transferring data from said read transfer means to said selected memory cells and selecting and reading data which have been transferred to said read transfer means in accordance with said applied address;

(iii) if said dirty bit is OFF, (iiia) if the applied address designates the selected row in said DRAM array, selecting a block of columns on the selected row, and transferring data of the block to the memory cells of the SRAM array selected by the applied address and further reading data to be stored in a memory cell in said SRAM array in accordance with said applied address, selecting a row and a plurality of columns in said DRAM array in accordance with said applied address, and transferring data from said plurality of columns to memory cells designated by said applied address in said SRAM array and reading data to be stored in a memory cell in the SRAM array designated by said applied address; and (B) in data writing operation (Ba) when a memory cell designated by said applied address exists in said SRAM array accessing said SRAM array in accordance with said applied address and writing data to the corresponding static memory cell;

(Bb) setting said dirty bit on;

(Bc) when the memory cell designated by the address applied from said external device does not exist in said SRAM array, (Bc1) writing data to said write transfer means in accordance with said applied address;

(Bc2) when said applied address designates said selected row in said DRAM array, selecting columns from said selected row in accordance with said applied address and transferring data from said write transfer means to said selected column;

(Bc3) when said applied address designates a row different from said selected row in said DRAM array, initializing said DRAM array and said sense amplifier means and selecting a row and columns in said DRAM array in accordance with said applied address; and (Bc4) transferring data from said write transfer means to said selected column.

19. A semiconductor memory device, comprising:

a DRAM array including a plurality of dynamic memory cells arranged in a matrix of rows and columns;

an SRAM array including a plurality of static memory cells arranged in a matrix of rows and columns;

write transfer means for temporarily storing applied data and for transmitting the stored data to a selected memory cell of said DRAM array;

mask data register means for storing mask data for masking data transfer from said write transfer means to the selected memory cell of said DRAM array; and control means responsive to power on for setting all the mask data of said mask data register means to a state for masking data transfer.

20. The semiconductor memory device according to claim 19, further comprising means responsive to said power on for repeating prescribed times resetting operation of a peripheral circuit and for activating said control means.

21. A semiconductor memory device, comprising:

a DRAM array including a plurality of dynamic memory cells arranged in a matrix of rows and columns;

an SRAM array including a plurality of static memory cells arranged in a matrix of rows and columns;

data transfer means for transferring data between a selected memory cell of said DRAM array and a selected memory cell of said SRAM array;

first control means responsive to a first address and a first control signal for controlling operation of said DRAM array and data transfer operation between said DRAM array and said data transfer means; and second control means provided separate from said first control means and operating independent from each other, responsive to a second control signal and a second address applied independent from said first address for controlling (i) driving of said SRAM array, (ii) data transfer operation between said SRAM array and said data transfer means, and (iii) data input/output operation between said data transfer means and an outside of the device.

22. A semiconductor memory device, comprising:

a DRAM array including a plurality of dynamic memory cells;

an SRAM array including a plurality of static memory cells;

first transfer means including at least two stages of serially connected latch means for transferring data from said DRAM array to said SRAM array;

second transfer means including at least two stages of serially connected latch means for transferring data from said SRAM array to said DRAM array;

first transfer control means responsive to a first transfer designation for carrying out data transfer from said DRAM array to said first transfer means and for carrying out data transfer between latch means of said second transfer means; and second transfer control means responsive to a second transfer designation for carrying out data transfer from said DRAM array to said first transfer means and inhibiting data transfer between the latch means of said second transfer means.

23. The semiconductor memory device according to claim 22, wherein said second transfer means includes N stages of first in first out type storing means where N is an integer not smaller than 2.

24. A semiconductor memory device, comprising a DRAM array including a plurality of dynamic memory cells;

an SRAM array including a plurality of static memory cells;

first transfer means including at least two stages of serially connected latch means for carrying out data transfer from said DRAM array to said SRAM array;

second transfer means including at least two stages of serially connected latch means for carrying out data from said SRAM array to said DRAM array;

first transfer control means responsive to a first transfer designation for carrying out data transfer from said SRAM array to only one latch means of said second transfer means; and second transfer control means responsive to a second transfer designation for transferring data from said SRAM array to a plurality of latch means of said second transfer means.

25. The semiconductor memory device according to claim 24, wherein said second transfer means includes N stages of first in first out type storing means where N is an integer not smaller than 2.

* * * * *